US011711973B2

(12) United States Patent
Park et al.

(10) Patent No.: US 11,711,973 B2
(45) Date of Patent: Jul. 25, 2023

(54) ORGANIC ELECTRONIC DEVICE

(71) Applicant: Duk San Neolux Co., Ltd., Cheonan-si (KR)

(72) Inventors: Hyoung Keun Park, Chuncheon-si (KR); Junggeun Lee, Cheonan-si (KR); Sun-Hee Lee, Cheonan-si (KR); Yong Wook Park, Cheonan-si (KR); Sung Yong Han, Cheonan-si (KR)

(73) Assignee: Duk San Neolux Co., Ltd., Cheonan-si (KR)

( * ) Notice: Subject to any disclaimer, the term of this patent is extended or adjusted under 35 U.S.C. 154(b) by 0 days.

(21) Appl. No.: 17/963,798

(22) Filed: Oct. 11, 2022

(65) Prior Publication Data

US 2023/0111469 A1 Apr. 13, 2023

Related U.S. Application Data

(63) Continuation-in-part of application No. 17/631,592, filed as application No. PCT/KR2020/010045 on Jul. 30, 2020.

(30) Foreign Application Priority Data

Aug. 2, 2019 (KR) ........................ 10-2019-0094551
Apr. 20, 2020 (KR) ........................ 10-2020-0047638
Jul. 3, 2020 (KR) ........................ 10-2020-0082278

(51) Int. Cl.

| | |
|---|---|
| ***H01L 51/50*** | (2006.01) |
| ***H10K 85/60*** | (2023.01) |
| *H10K 59/32* | (2023.01) |
| *H10K 50/155* | (2023.01) |

(52) U.S. Cl.

CPC ......... *H10K 85/636* (2023.02); *H10K 85/633* (2023.02); *H10K 85/6576* (2023.02); *H10K 50/155* (2023.02); *H10K 59/32* (2023.02); *H10K 85/6572* (2023.02); *H10K 85/6574* (2023.02)

(58) Field of Classification Search

CPC ........................... H10K 85/633; H10K 85/636

See application file for complete search history.

(56) References Cited

U.S. PATENT DOCUMENTS

| | | | |
|---|---|---|---|
| 9,871,201 | B2 | 1/2018 | Pflumm et al. |
| 9,917,272 | B2 | 3/2018 | Voges et al. |
| 10,270,052 | B2 | 4/2019 | Voges et al. |
| 2017/0237013 | A1 | 8/2017 | Park et al. |

(Continued)

FOREIGN PATENT DOCUMENTS

| | | | |
|---|---|---|---|
| CN | 110010783 | A | 7/2019 |
| EP | 3518304 | A1 | 7/2019 |

(Continued)

OTHER PUBLICATIONS

Springer, R. et al. "Cool white light-emitting three stack OLED structures for AMOLED display applications", Optics Express, 2016, vol. 24, No. 24, pp. 28131-28142.

(Continued)

*Primary Examiner* — Anthony Ho

(74) *Attorney, Agent, or Firm* — Harness, Dickey & Pierce, P.L.C.

(57) ABSTRACT

Embodiments of the present invention relate to an organic electronic device capable of ensuring high luminous efficiency, low driving voltage and high heat resistance, and improving color purity or lifespan.

20 Claims, 2 Drawing Sheets

(56) References Cited

U.S. PATENT DOCUMENTS

| | | | |
|---|---|---|---|
| 2018/0151806 | A2 | 5/2018 | Park et al. |
| 2019/0245148 | A1 | 8/2019 | Park et al. |
| 2019/0296244 | A1 | 9/2019 | Mun et al. |
| 2019/0296248 | A1 | 9/2019 | Mun et al. |

FOREIGN PATENT DOCUMENTS

| | | | |
|---|---|---|---|
| KR | 101668448 | B1 | 10/2016 |
| KR | 1020170080287 | A | 7/2017 |
| KR | 101789998 | B1 | 10/2017 |
| KR | 1020180034692 | A | 4/2018 |
| KR | 1020190003789 | A | 1/2019 |

OTHER PUBLICATIONS

International Search Report (English and Korean) and Written Opinion of the ISA (Korean) issued in PCT/KR2020/010045, dated Nov. 16, 2020; ISA/KR.

ORGANIC ELECTRONIC DEVICE

CROSS-REFERENCE TO RELATED APPLICATION

This application is a continuation-in-part of U.S. patent application Ser. No. 17/631,592 filed Jan. 31, 2022, which is a 371 National Phase application based on PCT/KR2020/010045 filed on Jul. 30, 2020 which claims under 35 U.S.C. § 119(a) the benefit of priority to Korean Patent Application No. 10-2019-0094551, filed on Aug. 2, 2019, Korean Patent Application No. 10-2020-0047638, filed on Apr. 20, 2020, and Korean Patent Application No. 10-2020-0082278, and filed on Jul. 3, 2020, respectively, all of which are hereby incorporated by reference

TECHNICAL FIELD

Embodiments of the present disclosure relate to an organic electronic device.

RELATED ART

In general, organic electroluminescence refers to a phenomenon in which electrical energy is converted into light energy using an organic material. An organic electronic device using organic electroluminescence has a structure generally including an anode, a cathode, and an organic material layer positioned between the anode and the cathode. The organic material layer has a multilayer structure comprised of a plurality of layers formed of different materials to improve the efficiency and stability of the organic electronic device.

Currently, in the portable display market, displays are increasing in size to be large-area displays. Since portable displays are provided with a battery serving as a limited power source, portable displays require more efficient power consumption than that required by conventional portable displays. In addition, in this situation, not only the challenge for efficient power consumption but also challenges related to luminous efficiency and lifespan need to be solved.

In order to overcome the problems related to the power consumption, luminous efficiency, and lifespan, research on a tandem organic electronic device in which the organic material layer includes two or more stacks (or emission units) each including an emission layer has been undertaken. In particular, research for improving the power consumption, luminous efficiency, and lifespan by improving the organic material included in the stacks has been undertaken.

Efficiency, lifespan, a driving voltage, and the like are related to each other. An increase in efficiency leads to a relative decrease in driving voltage, by which the crystallization of the organic material due to Joule heating during driving may be reduced, thereby increasing the lifespan. However, simply improving the organic material layer may not maximize efficiency. This is because, when the optimal combination of the energy level and T1 value between each organic material and the intrinsic properties (e.g., mobility, interfacial properties) of the material are achieved, both increased lifespan and high efficiency may be achieved. Therefore, it is necessary to develop a material that may efficiently achieve charge balance in an emission layer while having high thermal stability.

In particular, in a tandem organic electronic device, the efficiency, lifespan, and driving voltage of the organic electronic device may vary depending on which organic materials are combined and used in specific layers.

SUMMARY

Embodiments of the present disclosure may provide an organic electronic device having a low driving voltage, high efficiency, high color purity, and increased lifespan.

In one aspect, an organic electronic device according to embodiments of the present disclosure includes a first electrode, a second electrode, and an organic material layer.

The organic material layer is positioned between the first electrode and the second electrode, and includes a first stack, a second stack, and a third stack.

The first stack includes a first hole transport region, a first emission layer, and a first electron transport region.

The first hole transport region includes a first hole transport layer.

The first hole transport layer or the first auxiliary emission layer includes a first compound represented by the following Formula 20.

[Formula 20]

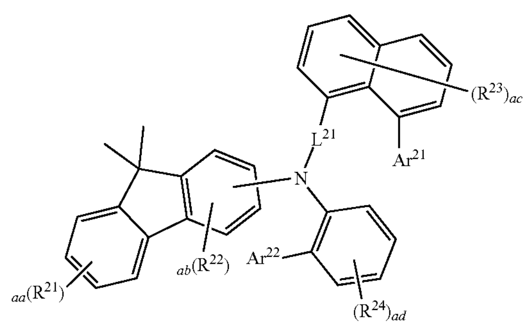

Embodiments of the present disclosure may provide an organic electronic device in which high luminous efficiency, a low driving voltage, high thermal resistance, significantly improved color purity, and significantly increased lifespan are realized.

DETAILED DESCRIPTION

Figure 1:
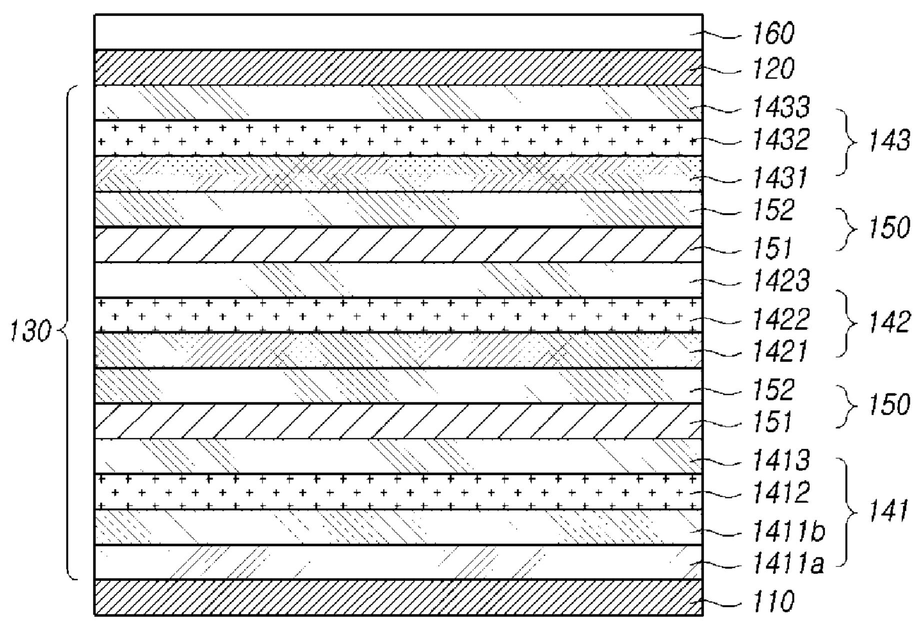
FIG. 1 is a diagram schematically illustrating an organic electronic device according to embodiments of the present disclosure.

Hereinafter, embodiments of the present disclosure will be described in detail with reference to the illustrative drawings.

In designating elements of the drawings by reference numerals, the same elements will be designated by the same reference numerals although they are shown in different drawings. Further, in the following description of the present disclosure, a detailed description of known functions and configurations incorporated herein will be omitted in the case in which the subject matter of the present disclosure may be rendered unclear thereby. It will be understood that the terms “comprise”, “have”, “consist of”, and any variations thereof used herein are intended to cover non-exclusive inclusions unless explicitly stated to the contrary. Descriptions of elements in the singular form used herein are intended to include descriptions of elements in the plural form, unless explicitly stated to the contrary.

In addition, terms, such as first, second, A, B, (a), or (b), may be used herein when describing elements of the present disclosure. Each of these terminologies is not used to define an essence, order, or sequence of a corresponding element but used merely to distinguish the corresponding element from other elements.

It will be understood that when an element is referred to as being "connected", "coupled", or "joined" to another element, not only can it be "directly connected, coupled, or joined" to the other element, but it can also be "indirectly connected, coupled, or joined" to the other element via an "intervening" element. Here, the intervening element may be included in one or more of the two elements "connected", "coupled", or "joined" to each other.

In addition, it will be understood that when an element, such as a layer, a film, or a region, or a plate, is referred to as being "above" or "on" another element, not only can it be "directly" above or on the other element, but it can also be "indirectly" above or on the other element or layer via an "intervening" element. In contrast, when an element is referred to as being "directly" above or on another element, it will be understood that no intervening element is interposed.

When time relative terms, such as "after", "subsequent to", "next", "before", and the like, are used to describe elements, operating or manufacturing methods, and the like, these terms may be used to describe non-consecutive or non-sequential processes or operations unless the term "directly" or "immediately" is used together.

In addition, when any numerical values for elements or corresponding information are mentioned, it should be considered that numerical values for elements or corresponding information include a tolerance or error range that may be caused by various factors (e.g., process factors, internal or external impact, noise, etc.) even when a relevant description is not specified.

Unless otherwise stated, the term "halo" or "halogen", as used herein, refers to fluorine (F), chlorine (Cl), bromine (Br), iodine (I), or the like.

Unless otherwise stated, the term "alkyl" or "alkyl group", as used herein, may have a single bond of 1 to 60 carbon atoms, and refer to saturated aliphatic functional radicals including a straight chain alkyl group, a branched chain alkyl group, a cycloalkyl (alicyclic) group, an alkyl-substituted cycloalkyl group, or a cycloalkyl-substituted alkyl group.

Unless otherwise stated, the term "haloalkyl" or "halogen alkyl", as used herein, may include a halogen-substituted alkyl group.

Unless otherwise stated, the term "alkenyl" or "alkynyl", as used herein, may have a double or triple bond of 2 to 60 carbon atoms and include a straight chain group or a branched chain group.

Unless otherwise stated, the term "cycloalkyl" as used herein may refer to alkyl forming a ring having 3 to 60 carbon atoms.

The term "alkoxy group" or "alkyloxy group", as used herein, refers to an alkyl group to which an oxygen radical is bonded and, unless otherwise stated, may have 1 to 60 carbon atoms.

The term "alkenoxyl group", "alkenoxy group", "alkenyloxyl group", or "alkenyloxy group" refers to an alkenyl group to which an oxygen radical is attached, and unless otherwise stated, may have 2 to 60 carbon atoms.

Unless otherwise stated, the term "aryl group" or "arylene group", as used herein, has, but is not limited thereto, 6 to 60 carbon atoms. Herein, the aryl group or the arylene group may include a monocyclic compound, a ring assembly, fused polycyclic systems, a spiro compound, or the like. For example, the aryl group includes, but is not limited to, a phenyl group, biphenyl, naphthyl, anthryl, indenyl, phenanthryl, triphenylenyl, pyrenyl, peryleneyl, chrysenyl, naphthacenyl, fluoranthenyl, and the like. Naphthyl may include 1-naphthyl and 2-naphthyl, and anthryl may include 1-anthryl, 2-anthryl, and 9-anthryl.

Unless stated otherwise, the term "fluorenyl group" or "fluorenylene group", as used herein, may refer to a monovalent or divalent functional group of fluorene. In addition, the "fluorenyl group" or "fluorenylene group" may refer to a substituted fluorenyl group or a substituted fluorenylene group. The "substituted fluorenyl group" or the "substituted fluorenylene group" may refer to a monovalent or divalent functional group of substituted fluorene. The term "substituted fluorene" may refer to a compound in which at least one of substituent R, R', R", or R'" below is a functional group other than hydrogen, and include a case in which R and R' are bonded to each other to form a spiro compound together with carbon atoms bonded thereto.

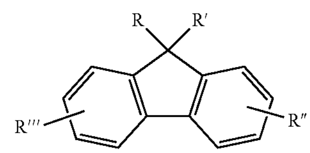

The term "spiro compound", as used herein, has "a spiro union", which refers to a union of two rings sharing only one atom. In this case, the atom shared by the two rings is referred to as a "spiro atom". Such spiro compounds are referred to, for example, as "monospiro", "dispiro", and "trispiro" compounds depending on the number of spiro atoms included in the compound.

The term "heterocyclic group", as used herein, includes not only aromatic rings, such as a "heteroaryl group" or a "heteroarylene group", but also non-aromatic rings, and unless stated otherwise, refers to, but is not limited to, monocyclic and multicyclic rings each including one or more heteroatoms and having 2 to 60 carbon atoms. The term "heteroatom", as used herein, refers to N, O, S, P, or Si, unless stated otherwise. The "heterocyclic group" may refer to monocyclic compounds, ring assemblies, fused polycyclic systems, spiro compounds, or the like including heteroatoms.

In addition, the "heterocyclic group", as used herein, may include rings having $SO_2$ in place of a ring-forming carbon atom. For example, the "heterocyclic group" may include the following compound.

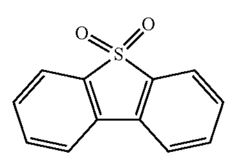 [SMILES: O=S1(=O)c2ccccc2-c2ccccc21]

The term "ring", as used herein, may refer to monocyclic rings and polycyclic rings, include not only hydrocarbon rings but also hetero rings including at least one heteroatom, and include aromatic rings and non-aromatic rings.

The term "polycyclic ring", as used herein, may include ring assemblies, fused polycyclic systems, and spiro compounds. The polycyclic ring may include not only aromatic compounds but also non-aromatic compounds, and include not only hydrocarbon rings but also hetero rings including at least one heteroatom.

The term "aliphatic cyclic group", as used herein, may refer to cyclic hydrocarbons except for aromatic hydrocarbons, include single rings, ring assemblies, fused ring systems, spiro compounds, and the like, and unless stated otherwise, mean rings each having 3 to 60 carbon atoms. For example, a fused system of benzene which is an aromatic ring and cyclohexane which is a non-aromatic ring corresponds to an aliphatic ring.

The term "ring assembly", as used herein, refers to a compound in which two or more rings (single rings or fused ring systems) are connected directly by a single or double bond. For example, in the aryl group, the ring assembly may be, but is not limited to, a biphenyl group, a terphenyl group, or the like.

The term "fused polycyclic system", as used herein, refers to a form of fused rings sharing at least two atoms. For example, in the aryl group, the fused polycyclic system may be, but is not limited to, naphthalenyl group, a phenanthrenyl group, a fluorenyl group, or the like.

In addition, in the case that prefixes are named consecutively, this means that substituents are listed in the order of the prefixes. For example, an aryl alkoxy group may refer to an alkoxy group substituted with an aryl group, an alkoxy carbonyl group may refer to a carbonyl group substituted with an alkoxy group, and an aryl carbonyl alkenyl group may refer to an alkenyl group substituted with an arylcarbonyl group. Here, the arylcarbonyl group may be a carbonyl group substituted with an aryl group.

Unless clearly stated otherwise, the term "substituted" in the term "substituted or non-substituted", as used herein, may refer to, but is not limited to, deuterium, a halogen, an amino group, a nitrile group, a nitro group, a $C_1$-$C_{20}$ alkyl group, a $C_1$-$C_{20}$ alkoxy group, a $C_1$-$C_{20}$ alkyl amine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynil group, a $C_3$-$C_{20}$ cycloalkyl group, a $C_6$-$C_{25}$ aryl group, a $C_6$-$C_{25}$ aryl group substituted with deuterium, a $C_8$-$C_{20}$ aryl alkenyl group, a silane group, a boron group, a germanium group, and a $C_2$-$C_{20}$ heterocyclic group including at least one heteroatom selected from the group consisting of O, N, S, Si, or P.

Herein, "the name of a functional group" corresponding to the aryl group, the arylene group, the heterocyclic group, or the like illustrated as each symbol and a substituent thereof may be written in "the name of the functional group on which the valence thereof is reflected" or may be written in "the name of the parent compound thereof". For example, phenanthrene, i.e., a type of aryl group, may be written in group names by distinguishing the valence. That is, a monovalent phenanthrene "group" may be written as "phenanthryl (group)", while a divalent phenanthrene "group" may be written as "phenanthrylene (group)". Alternatively, the phenanthrene groups may be written as "phenanthrene", i.e. the name of the parent compound, regardless of the valence. Similarly, pyrimidine may be written as "pyrimidine" regardless of the valence or may be written in group names each corresponding to the valence, in which a monovalent pyrimidine group is written as pyrimidinyl (group) and a divalent pyrimidine group is written as pyrimidinylen (group). Accordingly, when the type of a substituent is written in the name of the parent compound herein, the written name may refer to an n-valence "group" formed by the desorption of a carbon atom and/or a heteroatom-bonded hydrogen atom from the parent compound.

In addition, unless clearly stated otherwise, formulas used herein may be applied in the same manner as the definition of the substituent based on the exponential definition of the following Formula.

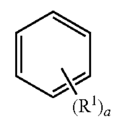

Here, when a is 0, the substituent $R^1$ is absent. This means that all hydrogens are bonded to carbons of the benzene ring. In this case, hydrogen bonded to carbon may not be shown, and the chemical Formula or compound may be described. When a is 1, one substituent $R^1$ is bonded to any one of carbon atoms of the benzene ring. When a is 2 or 3, substituents $R^1$ may respectively be combined as follows. When a is 4 to 6, substituents $R^1$ may be bonded to carbon atoms of the benzene ring. When a is an integer equal to or greater than 2, $R^1$s may be the same or different.

(a-2)

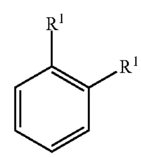

(a-3)

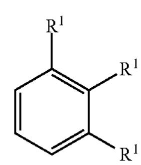

Herein, the substituents bonded to form rings, respectively, means that adjacent groups are bonded to each other to form a single ring or two or more fused rings. The single ring or the two or more fused rings formed in this manner may also include a hetero ring including at least one hetero atom, and include an aromatic ring and a non-aromatic ring.

Herein, the organic electronic device may refer to one or more compounds between an anode and a cathode, or an organic light-emitting diode (OLED) including the anode, the cathode, and the one or more compounds positioned between the anode and the cathode.

In addition, herein, in some cases, the organic electronic device may refer to an OLED and a panel on which the OLED is provided, or an electronic apparatus including the panel and a circuit. For example, the electronic apparatus may be, but is not limited to, a display device, an illumination device, a solar cell, a portable or mobile terminal (e.g., a smartphone, a tablet computer, a personal digital assistant (PDA), an electronic dictionary, or a portable media player (PMP)), a navigation terminal, a game machine, various TVs, and various computer monitors. The electronic apparatus may be any type of apparatus including the above-described component(s).

FIG. 1 is a diagram schematically illustrating an organic electronic device according to embodiments of the present disclosure.

An organic electronic device 100 according to embodiments includes a first electrode 110, a second electrode 120, and an organic material layer 130 positioned between the first electrode 110 and the second electrode 120 and including a first stack 141, a second stack 142, and a third stack 143.

Although FIG. 1 illustrates embodiments in which the second stack 142 is positioned above the first stack 141 and the third stack 143 is positioned above the second stack 142, embodiments of the present disclosure are not limited thereto.

For example, the first electrode 110 may be an anode, whereas the second electrode 120 may be a cathode. The organic material layer 130 is a layer positioned between the first electrode 110 and the second electrode 120 and including an organic material. The organic material layer 130 may be comprised of a plurality of layers.

In an example, the first electrode 110 may be a transparent electrode, whereas the second electrode 120 may be a reflecting electrode. In another example, the first electrode 110 may be a reflecting electrode, whereas the second electrode 120 may be a transparent electrode.

Since the organic material layer 130 includes at least three stacks, the organic electronic device according to embodiments may be, for example, a tandem organic electronic device including a plurality of stacks. The organic material layer may be realized by repeatedly stacking the same stack three or more times or stacking three or more different stacks.

The above-described three or more stacks may include the first stack 141, the second stack 142, and the third stack 143.

The first stack 141 includes a first hole transport region 1411, a first emission layer 1412, and a first electron transport region 1413.

The first emission layer 1412 is a layer emitting light energy generated by electron-hole recombination. For example, the first emission layer 1412 may include a host material and a dopant.

The first hole transport region 1411 may be, for example, a region positioned between the first electrode 110 serving as an anode and the first emission layer 1412 to transport holes from the first electrode 110 to the first emission layer 1412. The first electron transport region 1413 may be, for example, a region positioned between the second electrode 120 serving as a cathode and the first emission layer 1412 to transport electrons from the second electrode 120 to the emission layer.

The first hole transport region 1411 may include a P-type dopant, whereas the first electron transport region 1413 may include an N-type dopant. Here, a P-doped layer refers to a layer doped with a P-type dopant to have more positive properties (i.e., the properties of holes) than before. In contrast, an N-doped layer refers to a layer doped with an N-type dopant to have more negative properties (i.e., the properties of electrons) than before.

The thickness of the first hole transport region 1411 may be from 10 nm to 100 nm. The lower limit of the thickness of the first hole transport region 1411 may be, for example, 15 nm or more or 20 nm or more. The upper limit of the thickness of the first hole transport region 1411 may be, for example, 90 nm or less or 80 nm or less. When the thickness of the first hole transport region 1411 is within this range, the organic electronic device may have high luminous efficiency, a low driving voltage, and increased lifespan.

The organic material layer 130 may include one or more charge generation layers 150 positioned between the stacks. The charge generation layers 150 refer to layers generating holes and electrons when a voltage is applied thereto. When three or more stacks are provided, the charge generation layers 150 may be positioned between the stacks. Here, the plurality of charge generation layers 150 may be the same as or different from each other. Since the charge generation layers 150 are disposed between the stacks, the current efficiency of each of the stacks can be increased and electric charges can be properly distributed over the stacks.

Specifically, each of the charge generation layers 150 may be provided between two adjacent stacks and serve to drive a tandem organic light-emitting device using only a pair of an anode and a cathode without separate internal electrodes positioned between the stacks.

The charge generation layers 150 may include, for example, an N-type charge generation layer 151 and a P-type charge generation layer 152. For example, the N-type charge generation layer 151 may be positioned adjacent to the first electrode 110 serving as an anode, whereas the P-type charge generation layer 152 may be positioned adjacent to the second electrode 120 serving as a cathode.

A capping layer 160 may be positioned above the second electrode 120. When the capping layer 160 is formed, the optical efficiency of the organic electronic device may be improved.

In a top emission organic electronic device, the capping layer 160 may serve to reduce optical energy loss in the second electrode 120 caused by surface plasmon polaritons (SPPs). In a bottom emission organic electronic device, the capping layer 160 may serve to buffer the second electrode 120.

The first hole transport region 1411 includes a first hole transport layer **1411*a* and a first auxiliary emission layer 1411*b*. The first auxiliary emission layer 1411*b* may be positioned between, for example, the first emission layer 1412 and the first hole transport layer 1411*a***.

The first electron transport region 1413 may include an electron transport layer (not shown).

Figure 2:
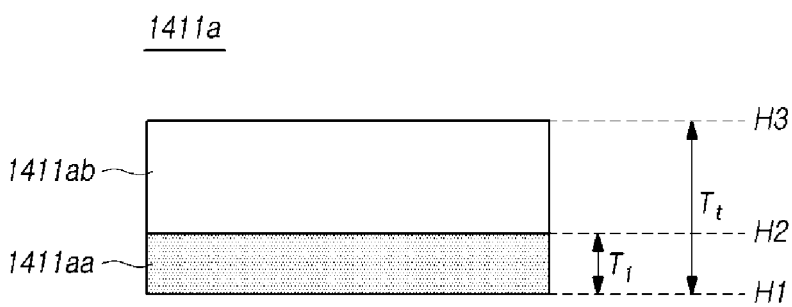
FIG. 2 is a diagram schematically illustrating the first hole transport layer of the organic electronic device according to embodiments of the present disclosure.

FIG. 2 is a diagram schematically illustrating the first hole transport layer **1411*a*** of the organic electronic device according to embodiments of the present disclosure.

Referring to FIG. 2, the thickness Tt of the first hole transport layer **1411*a* may be defined as the distance between H1 and H3. H1 may be a boundary between the first hole transport layer 1411*a* and any layer positioned below the first hole transport layer, for example, the first electrode. H3 may be a boundary between the first hole transport layer 1411*a* and any layer positioned above the first hole transport layer, for example, the first auxiliary emission layer 1411*b***.

The thickness Tt of the first hole transport layer **1411*a* may be from 250 Å to 700 Å. The lower limit of the thickness Tt of the first hole transport layer 1411*a* may be, for example, 260 Å or more or 270 Å or more. The upper limit of the thickness Tt of the first hole transport layer 1411*a*** may be, for example, 650 Å or less or 600 Å or less.

When the thickness of the first hole transport layer **1411*a* meets the above-described range, the first hole transport layer 1411*a*** may include a hole transport material in an amount sufficient to have superior hole injection and transport functions while preventing electric charges from being excessively injected, thereby providing an organic electronic device having a low thickness while being superior in terms of driving voltage, efficiency, or lifespan.

In the first hole transport layer 1411*a*, 10% to 50% of the thickness Tt of the first hole transport layer may be doped with a first doping material. The portion of the first hole transport layer 1411*a* doped with the first doping material may be referred to as a first doping material-doped layer 1411*aa*. The first hole transport layer 1411*a* may include the first doping material-doped layer 1411*aa* doped with the first doping material and a first doping material undoped layer 1411*ab* not doped with the first doping material. The first doping material undoped layer 1411*ab* may be positioned between the first doping material-doped layer 1411*aa* and the first emission layer.

For example, the first hole transport layer 1411*a* may include a hole transport material. The first doping material-doped layer 1411*aa* may be a layer including the first doping material in addition to the hole transport material. The hole transport material is not particularly limited as long as it is a material having hole transport properties. For example, the hole transport material may be at least one selected from a first compound or a fourth compound.

The thickness T1 of the first doping material-doped layer 1411*aa* may be 10% to 50% of the thickness of the first hole transport layer 1411*a*. The thickness T1 of the first doping material-doped layer 1411*aa* may be defined as the distance between H1 and H2. H2 may be a boundary between the first doping material-doped layer 1411*aa* and the first doping material undoped layer 1411*ab*.

The lower limit of the ratio of the thickness $T_1$ of the first doping material-doped layer 1411*aa* with respect to the thickness of the first hole transport layer 1411*a* may be, for example, 12% or more or 15% or more. The upper limit of the ratio of the thickness $T_1$ of the first doping material-doped layer with respect to the thickness Tt of the first hole transport layer 1411*a* may be, for example, 40% or less or 30% or less.

The thickness $T_1$ of the first doping material-doped layer 1411*aa* may be, for example, from 30 Å to 300 Å while meeting the above-described range of the ratio with respect to the thickness Tt of the first hole transport layer. The lower limit of the thickness $T_1$ of the first doping material-doped layer 1411*aa* may be, for example, 60 Å or more or 80 Å or more, whereas the upper limit of the thickness $T_1$ of the first doping material-doped layer 1411*aa* may be, for example, 200 Å or less or 150 Å or less.

When the thickness $T_1$ of the first doping material-doped layer 1411*aa* meets the above-described ranges of the ratio and the thickness, the generation of holes and electric charges in the first hole transport layer 1411*a* may be promoted to facilitate the injection of holes into the first emission layer 1412, thereby providing an organic electronic device superior in terms of lifespan or efficiency. It is thus possible to prevent the problem of short circuits in the device and prevent fabrication costs from being increased through excessive use of the doping material.

The first doping material-doped layer may include the first compound, and include 5 to 15 parts by weight of the first doping material with respect to 100 parts by weight of the first compound.

The first doping material-doped layer may include at least one of the first compound or the fourth compound, and include 5 to 15 parts by weight of the first doping material with respect to 100 parts by weight of a total amount of the first compound and the fourth compound. The lower limit of the doping ratio of the first doping material may be, for example, 7 parts by weight or more or 9 parts by weight or more. The upper limit of the doping ratio of the first doping material may be, for example, 13 parts by weight or less or 11 parts by weight or less.

When the doping ratio of the first doping material meets the above-described range, the generation of holes and electric charges in the first hole transport layer may be promoted to facilitate the injection of holes into the first emission layer, thereby providing an organic electronic device superior in terms of lifespan or efficiency. It is thus possible to prevent the problem of short circuits in the device and prevent fabrication costs from being increased by excessive use of the doping material.

For the second stack 142 and the third stack 143, what has been described above for the first stack 141 may equally be applied, unless clearly stated otherwise.

The second stack 142 may include a second hole transport region, a second emission layer, and a second electron transport region. Regarding the second hole transport region, the second emission layer, and the second electron transport region, what has been described above for the first hole transport region 1411, the first emission layer 1412, and the first electron transport region 1413 may equally be applied, unless clearly stated otherwise.

The second hole transport region may include a second hole transport layer and a second auxiliary emission layer. Regarding the second hole transport layer and the second auxiliary emission layer, what has been described above for the first hole transport layer 1411*a* and the first auxiliary emission layer 1411*b* may equally be applied, unless clearly stated otherwise.

Regarding the thickness and the doping of the second hole transport layer, what has been described above for the thickness and the doping of the first hole transport layer 1411*a* may equally be applied.

The thickness of the second hole transport layer may be from 250 Å to 700 Å. The lower limit of the thickness of the second hole transport layer may be, for example, 260 Å or more or 270 Å or more. The upper limit of the thickness of the second hole transport layer may be, for example, 650 Å or less or 600 Å or less.

When the thickness of the second hole transport layer meets the above-described range, the second hole transport layer may include a hole transport material in an amount sufficient to have superior hole injection and transport functions and prevent electric charges from being excessively injected, thereby providing an organic electronic device having a low thickness while being superior in terms of driving voltage, efficiency, or lifespan.

In the second hole transport layer, 10% to 50% of the thickness of the second hole transport layer may be doped with a second doping material. The portion of the second hole transport layer doped with the second doping material may be referred to as a second doping material-doped layer. The second hole transport layer may include the second doping material-doped layer doped with the second doping material and a second doping material undoped layer not doped with the second doping material. The second doping material undoped layer may be positioned between the second doping material-doped layer and the second emission layer.

For example, the second hole transport layer may include a hole transport material. The second doping material-doped layer may be a layer including the second doping material in addition to the hole transport material. The transport material is not particularly limited as long as it is a material having hole transport properties. For example, the hole transport material may be a second compound.

The thickness of the second doping material-doped layer may be 10% to 50% of the thickness of the second hole transport layer. The lower limit of the ratio of the thickness of the second doping material-doped layer with respect to the thickness of the second hole transport layer may be, for example, 12% or more or 15% or more. The upper limit of the ratio of the thickness of the second doping material-doped layer with respect to the thickness of the second hole transport layer may be, for example, 40% or less or 30% or less.

The thickness of the second doping material-doped layer may be, for example, from 30 Å to 300 Å while meeting the above-described range of the ratio with respect to the thickness of the second hole transport layer. The lower limit of the thickness of the second doping material-doped layer may be, for example, 60 Å or more or 80 Å or more, whereas the upper limit of the thickness of the second doping material-doped layer may be, for example, 200 Å or less or 150 Å or less.

When the thickness of the second doping material-doped layer meets the above-described ranges of the ratio and the thickness, the generation of holes and electric charges in the second hole transport layer may be promoted to facilitate the injection of holes into the second emission layer, thereby providing an organic electronic device superior in terms of lifespan or efficiency. It is possible to prevent the problem of short circuits in the device and prevent fabrication cost from being increased by excessive use of the doping material.

The second doping material-doped layer may include the second compound, and include 5 to 15 parts by weight of the second doping material with respect to 100 parts by weight of the second compound.

The second doping material-doped layer may include the second compound, and include 5 to 15 parts by weight of the second doping material with respect to 100 parts by weight of the second compound. The lower limit of the doping ratio of the second doping material may be, for example, 7 parts by weight or more or 9 parts by weight or more. The upper limit of the doping ratio of the second doping material may be, for example, 13 parts by weight or less or 11 parts by weight or less. The lower limit of the doping ratio of the second doping material may be, for example, 7 parts by weight or more or 9 parts by weight or more. The upper limit of the doping ratio of the second doping material may be, for example, 13 parts by weight or less or 11 parts by weight or less.

When the doping ratio of the second doping material meets the above-described range, the generation of holes and electric charges in the second hole transport layer may be promoted to facilitate the injection of holes into the second emission layer, thereby providing an organic electronic device superior in terms of lifespan or efficiency. It is possible to prevent the problem of short circuits in the device and prevent fabrication cost from being increased by excessive use of the doping material.

The third stack 143 may include a third hole transport region, a third emission layer, and a third electron transport region. Regarding the third hole transport region, the third emission layer, and the third electron transport region, what has been described above for the first hole transport region 1411, the first emission layer 1412, and the first electron transport region 1413 may equally be applied, unless clearly stated otherwise.

The third hole transport region may include a third hole transport layer and a third auxiliary emission layer. Regarding the third hole transport layer and the third auxiliary emission layer, what has been described above for the first hole transport layer 1411*a* and the first auxiliary emission layer 1411*b* may equally be applied, unless clearly stated otherwise.

Regarding the thickness and the doping of the third hole transport layer, what has been described above for the thickness and the doping of the first hole transport layer 1411*a* may equally be applied.

The thickness of the third hole transport layer may be from 250 Å to 700 Å. The lower limit of the thickness of the third hole transport layer may be, for example, 260 Å or more or 270 Å or more. The upper limit of the thickness of the third hole transport layer may be, for example, 650 Å or less or 600 Å or less.

When the thickness of the third hole transport layer meets the above-described range, the third hole transport layer may include a hole transport material in an amount sufficient to have superior hole injection and transport functions and prevent electric charges from being excessively injected, thereby providing an organic electronic device having a low thickness while being superior in terms of driving voltage, efficiency, or lifespan.

In the third hole transport layer, 10% to 50% of the thickness of the third hole transport layer may be doped with a third doping material. The portion of the third hole transport layer doped with the third doping material may be referred to as a third doping material-doped layer. The third hole transport layer may include the third doping material-doped layer doped with the third doping material and a third doping material undoped layer not doped with the third doping material. The third doping material undoped layer may be positioned between the third doping material-doped layer and the third emission layer.

For example, the third hole transport layer may include a hole transport material. The third doping material-doped layer may be a layer including the third doping material in addition to the hole transport material. The transport material is not particularly limited as long as it is a material having hole transport properties. For example, the hole transport material may be at least one of the first compound or the fourth compound.

The thickness of the third doping material-doped layer may be 10% to 50% of the thickness of the third hole transport layer. The lower limit of the ratio of the thickness of the third doping material-doped layer with respect to the thickness of the third hole transport layer may be, for example, 12% or more or 15% or more. The upper limit of the ratio of the thickness of the third doping material-doped layer with respect to the thickness of the third hole transport layer may be, for example, 40% or less or 30% or less.

The thickness of the third doping material-doped layer may be, for example, from 30 Å to 300 Å while meeting the above-described range of the ratio with respect to the thickness of the third hole transport layer. The lower limit of the thickness of the third doping material-doped layer may be, for example, 60 Å or more or 80 Å or more, whereas the upper limit of the thickness of the third doping material-doped layer may be, for example, 200 Å or less or 150 Å or less.

When the thickness of the third doping material-doped layer meets the above-described ranges of the ratio and the thickness, the generation of holes and electric charges in the third hole transport layer may be promoted to facilitate the injection of holes into the third emission layer, thereby providing an organic electronic device superior in terms of lifespan or efficiency. It is possible to prevent the problem of short circuits in the device and prevent fabrication cost from being increased by excessive use of the doping material.

The third doping material-doped layer may include the third compound, and include 5 to 15 parts by weight of the third doping material with respect to 100 parts by weight of the third compound.

The third doping material-doped layer may include the third compound, and include 5 to 15 parts by weight of the third doping material with respect to 100 parts by weight of the third compound. The lower limit of the doping ratio of the third doping material may be, for example, 7 parts by weight or more or 9 parts by weight or more. The upper limit of the doping ratio of the third doping material may be, for example, 13 parts by weight or less or 11 parts by weight or less. The lower limit of the doping ratio of the third doping material may be, for example, 7 parts by weight or more or 9 parts by weight or more. The upper limit of the doping ratio of the third doping material may be, for example, 13 parts by weight or less or 11 parts by weight or less.

When the doping ratio of the third doping material meets the above-described range, the generation of holes and electric charges in the third hole transport layer may be promoted to facilitate the injection of holes into the third emission layer, thereby providing an organic electronic device superior in terms of lifespan or efficiency. It is possible to prevent the problem of short circuits in the device and prevent fabrication cost from being increased by excessive use of the doping material.

The organic electronic device according to embodiments of the present disclosure may be a top emission organic electronic device, a bottom emission organic electronic device, or a dual emission organic electronic device depending on the material used.

A white organic light emitting device (WOLED) is advantageous in that high resolution may be easily realized and processability is superior. In addition, the WOLED may be fabricated using conventional color filter technologies of liquid crystal displays (LCDs). A variety of structures have been proposed and patented for a white organic electronic device mainly used as a backlight unit. Representatively, there are a side-by-side method in which red (R), green (G), and blue (B) emission units are disposed in a planar direction, a stacking method in which R, G, and B emission layers are stacked in the top-bottom direction, a color conversion material (CCM) method using photoluminescence of an inorganic fluorescence material using electroluminescence caused by the blue (B) organic emission layer and light from the electroluminescence, and the like. The present disclosure may also be applied to such WOLEDs.

The first hole transport layer 1411*a* may include the first compound represented by the following Formula 1. In another example, the first hole transport layer 1411*a* and the first auxiliary emission layer 1411*b* may include the first compound represented by the following Formula 1.

The first hole transport layer 1411*a* may include the first compound represented by the following Formula 20.

[Formula 20]

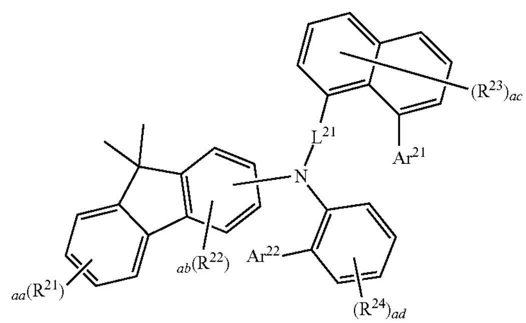

Hereinafter, Formula 20 will be described.

$R^{21}$ to $R^{24}$ are independently selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

When one of $R^{21}$ to $R^{24}$ is an aryl group, one of $R^{21}$ to $R^{24}$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^{21}$ to $R^{24}$ is a heterocyclic group, one of $R^{21}$ to $R^{24}$ may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

Each of $Ar^{21}$ and $Ar^{22}$ is selected from the group consisting of a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

When one of $Ar^{21}$ and $Ar^{22}$ is an aryl group, one of $Ar^1$ and $Ar^2$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $Ar^{21}$ and $Ar^{22}$ is a heterocyclic group, one of $Ar^1$ and $Ar^2$ may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

$L^{21}$ is independently selected from the group consisting of a single bond; a $C_6$-$C_{60}$ arylene group; and $C_2$-$C_{60}$ heterocyclic group including at least one hetero atom of O, N, S, Si, or P.

When $L^{21}$ is an arylene group, $L^{21}$ may be, for example, a $C_6$-$C_{60}$ arylene group, a $C_6$-$C_{40}$ arylene group, a $C_6$-$C_{25}$ arylene group, or a $C_6$-$C_{10}$ arylene group.

When $L^{21}$ is a heterocyclic group, $L^{21}$ may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

aa, ad may be 0~4; ab may be 0~3; ac may be 0~6.

In Formula 20, each of an aryl group, a fluorenyl group, a heterocyclic group, a fused ring group, an alkyl group, an alkenyl group, an alkynyl group, an alkoxyl group, an aryloxy group, and an arylene group may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group.

Each of the further substituted substituents may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group. These substituents may be bonded to form a ring.

$L^{21}$ of the Formula 20 may be represented by any one of Formulas L-1 to L-9 below.

[Formula L-1]

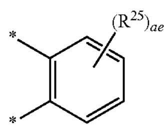

[Formula L-2]

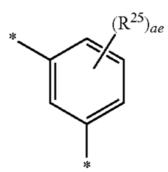

[Formula L-3]

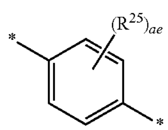

[Formula L-4]

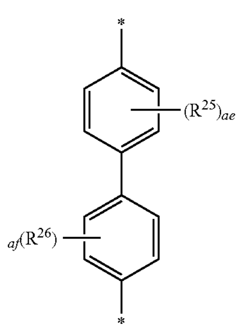

[Formula L-5]

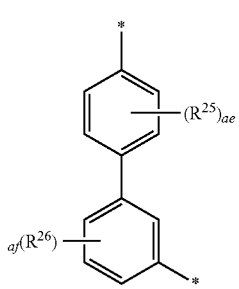

-continued

[Formula L-6]

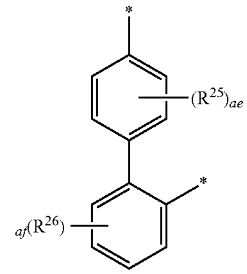

[Formula L-7]

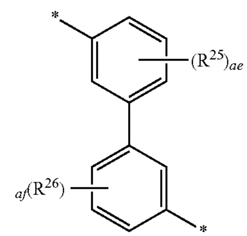

[Formula L-8]

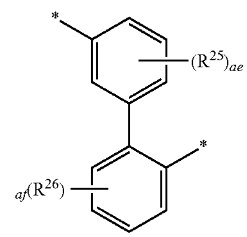

[Formula L-9]

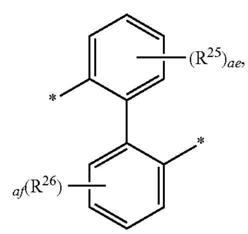

In the Formulas L-1 to L-9, $R^{25}$ and $R^{26}$ are independently selected from the group consisting of hydrogen; deuterium; a $C_1$-$C_{30}$ alkyl group; a $C_6$-$C_{30}$ aryl group; a $C_2$-$C_{30}$ heterocyclic group including at least one hetero atom of O, N, S, Si, or P, and $R^{25}$ and $R^{26}$ are bonded to form a ring.

When one of $R^{25}$ and $R^{26}$ is an aryl group, one of $R^{25}$ and $R^{26}$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^{25}$ and $R^{26}$ is a heterocyclic group, one of $R^{25}$ and $R^{26}$ may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

ae and af may be 0~4.

$Ar^{21}$ and $Ar^{22}$ in Formula 20 may be represented by one of the following Formula Ar-1 to Formula Ar-4.

[Formula Ar-1]

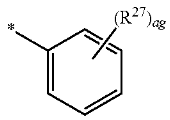

[Formula Ar-2]

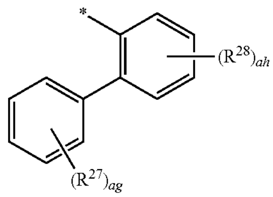

[Formula Ar-3]

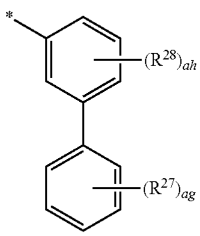

[Formula Ar-4]

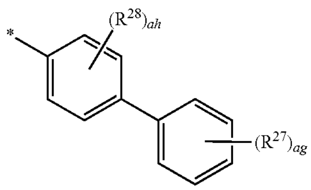

In Formula Ar-1 to Formula Ar-4, $R^{27}$ and $R^{28}$ are independently selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, $R^{27}$ and $R^{28}$ may be bonded to form a ring ag may be 0~5; and ah may be 0~4.

The first compound represented by the Formula 20 may be represented by one of the following Formula 20-1 to Formula 20-4.

[Formula 20-1]

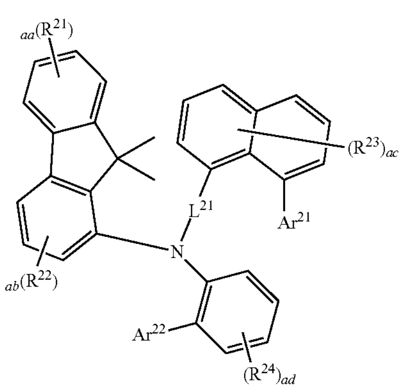

-continued

[Formula 20-2]

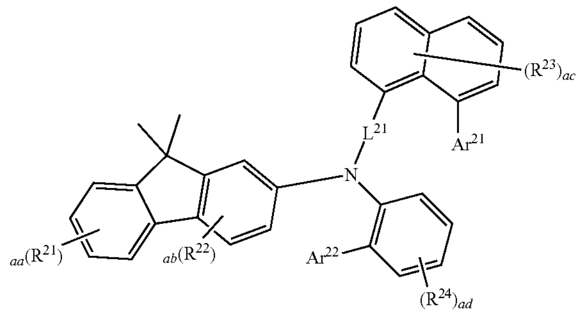

[Formula 20-3]

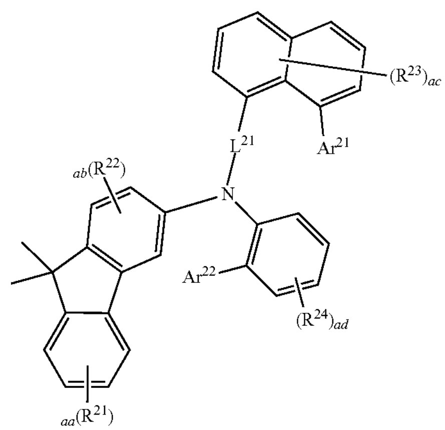

[Formula 20-4]

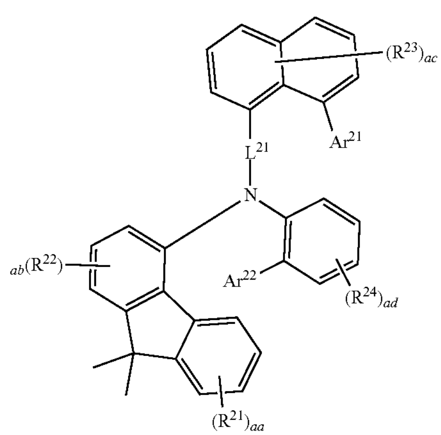

$R^{21}$ to $R^{24}$, $L^{21}$, $Ar^{21}$, $Ar^{22}$, aa to ad in the Formula 20-1 to Formula 20-4 are the same as $R^{21}$ to $R^{24}$, $L^{21}$, $Ar^{21}$, $Ar^{22}$, aa to ad defined above in the description of Formula 20.

The first compound may be one or more of the following compounds.

-continued
P20-1
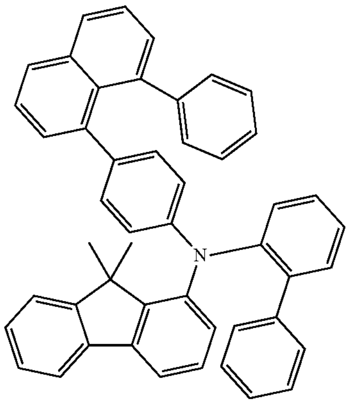
P20-2
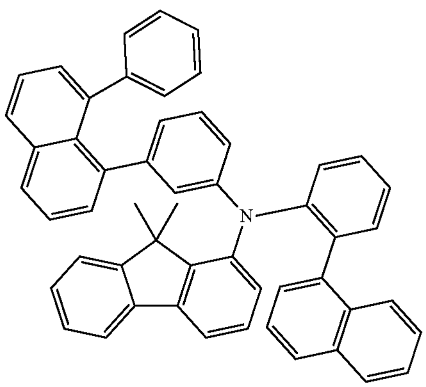
P20-3
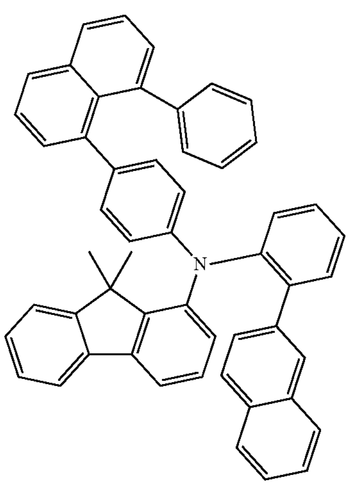
P20-4
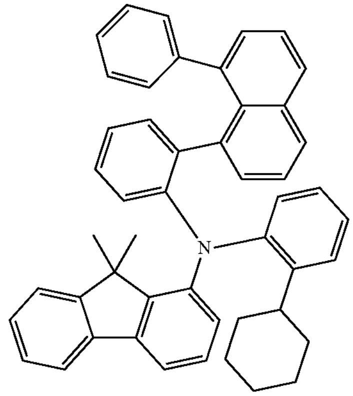
P20-5
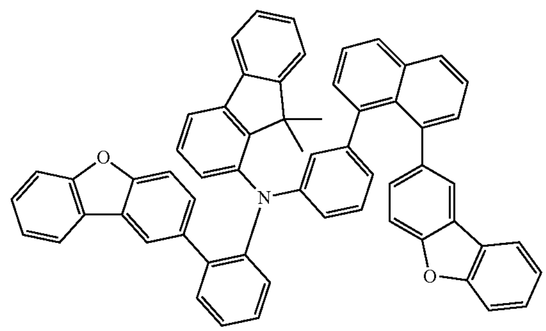
P20-6
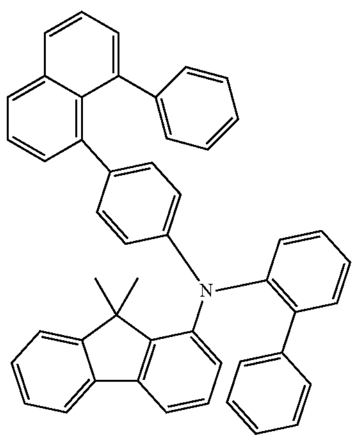
P20-7
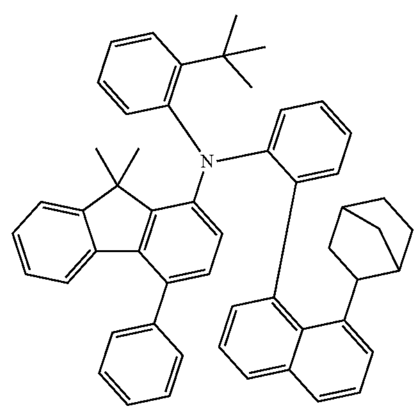

-continued
P20-8
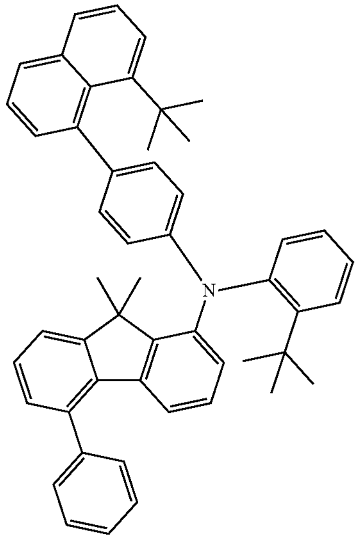
P20-9
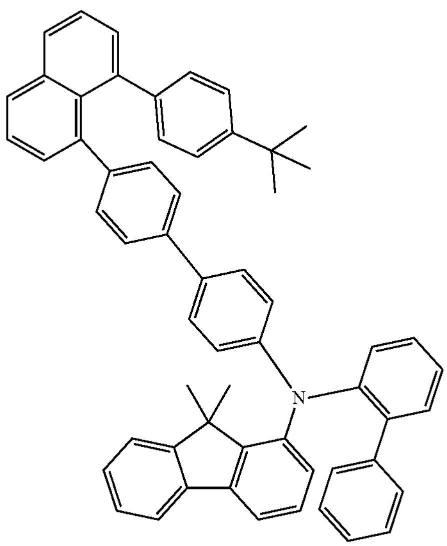
P20-10
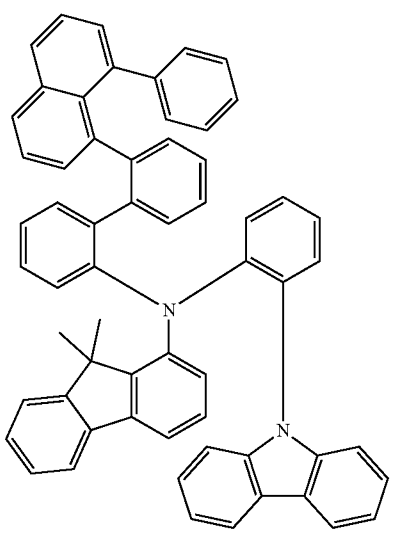
-continued
P20-11
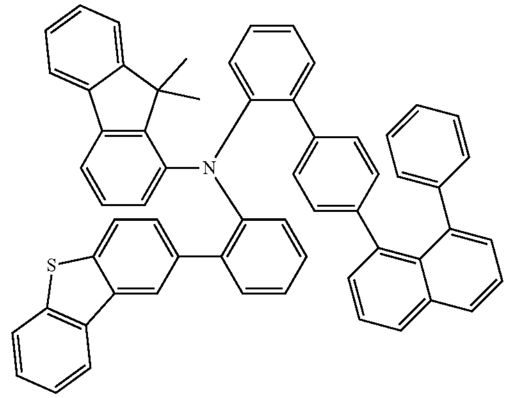
P20-12
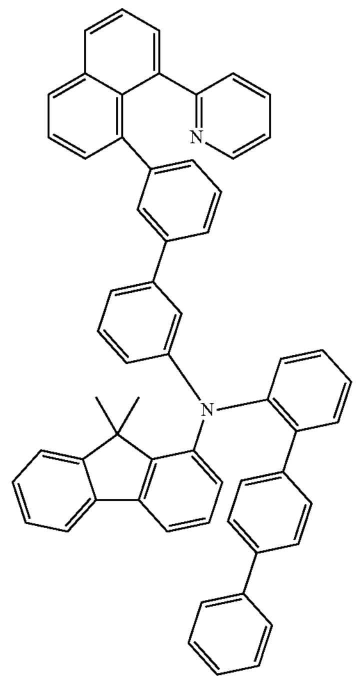
P20-13
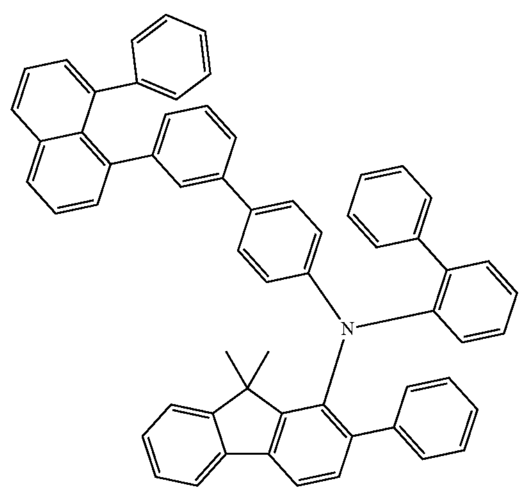

-continued
P20-14
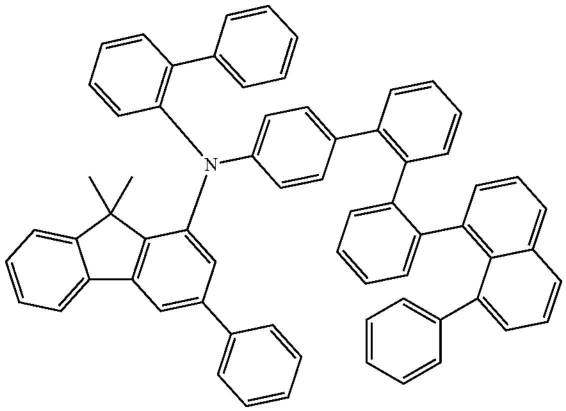
P20-15
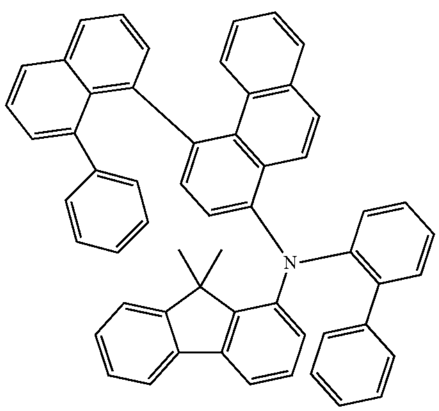
P20-16
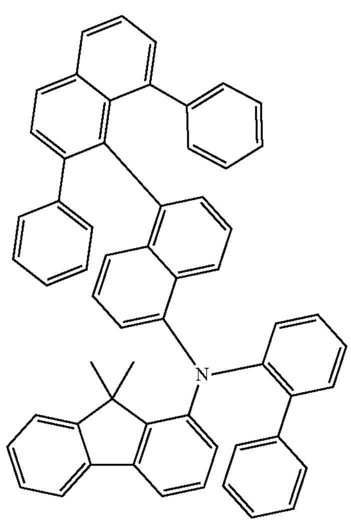
-continued
P20-17
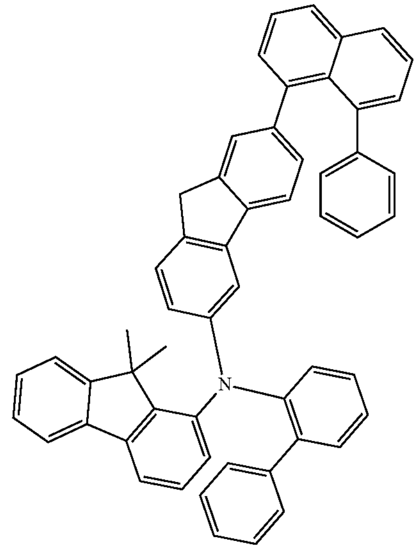
P20-18
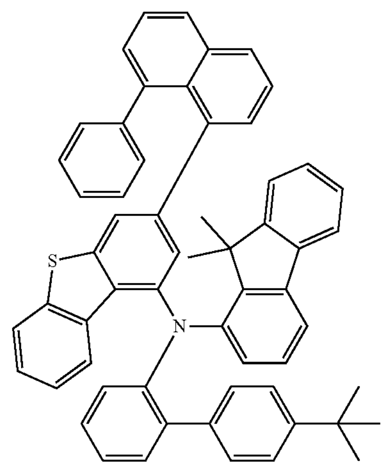
P20-19
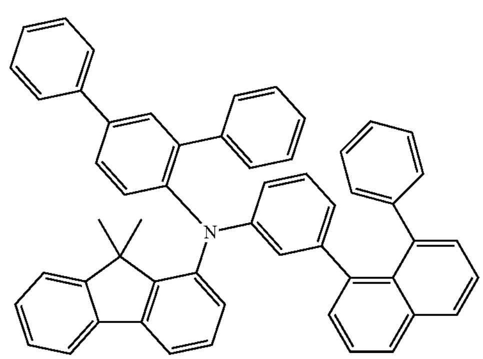

-continued
P20-20
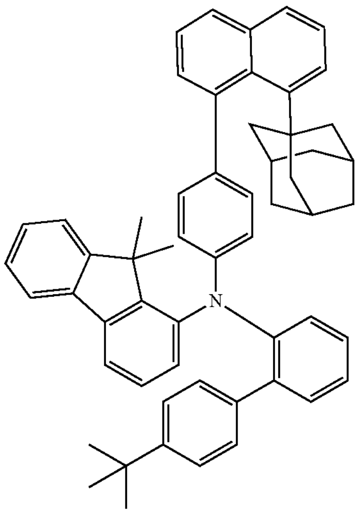
P20-21
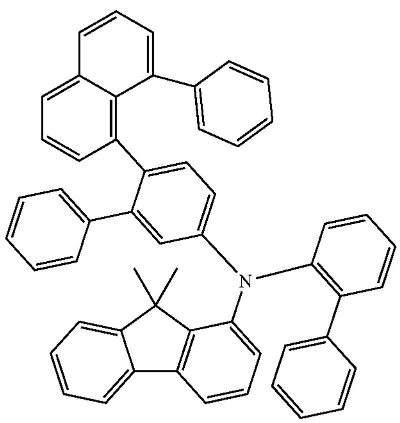
P20-22
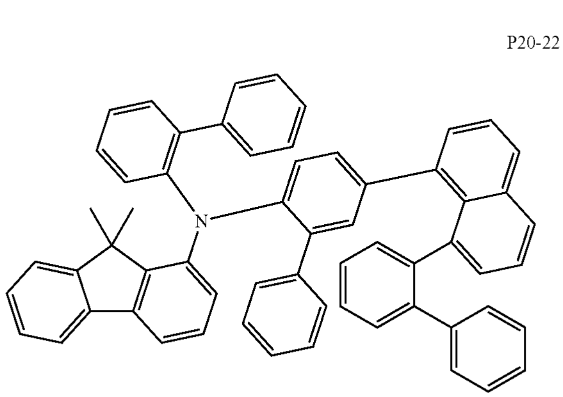
-continued
P20-23
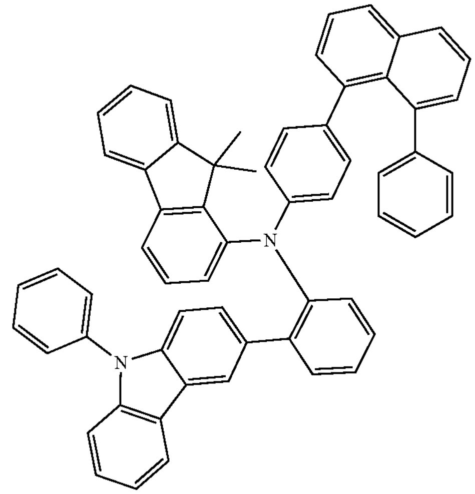
P20-24
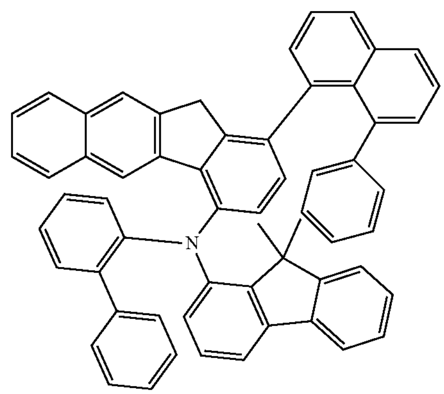
P20-25
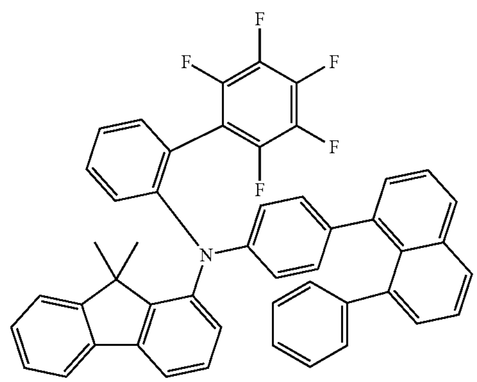

-continued
P20-26
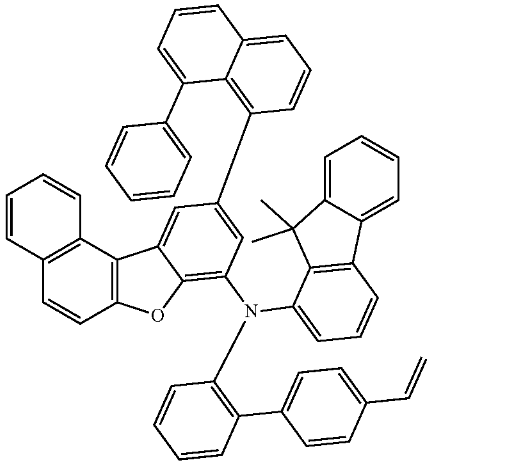
P20-27
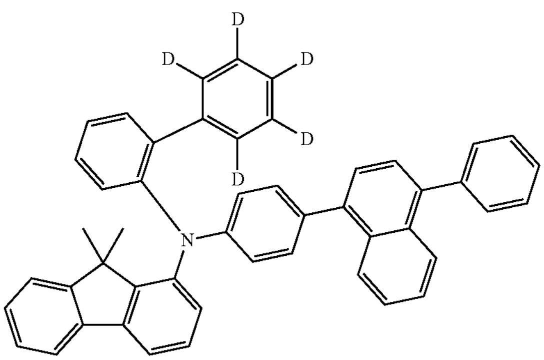
P20-28
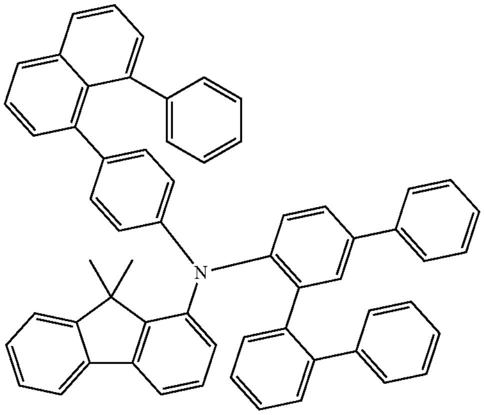
-continued
P20-29
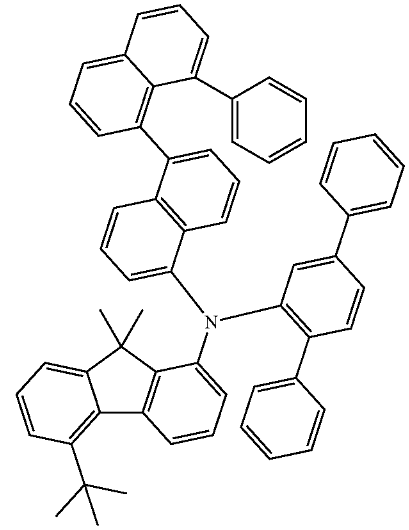
P20-30
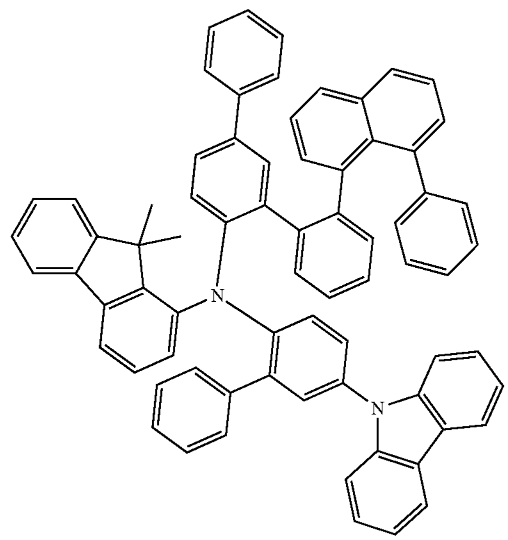
P20-31
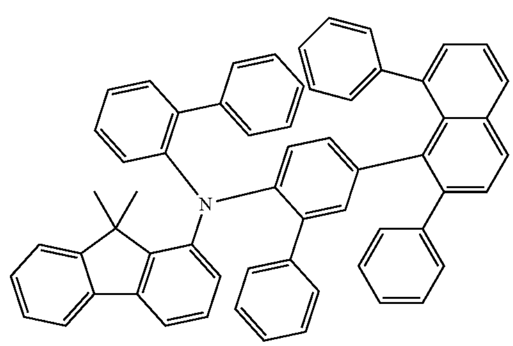

-continued
P20-32
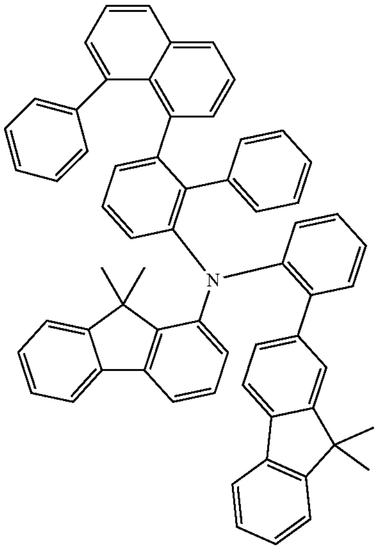
P20-33
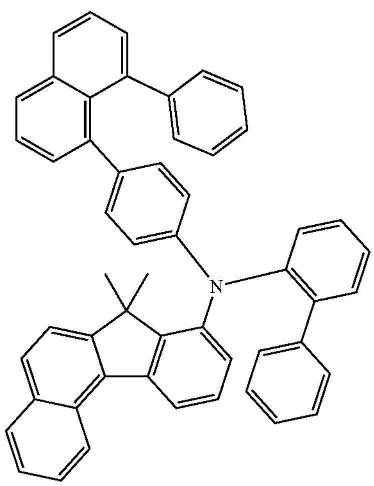
P20-34
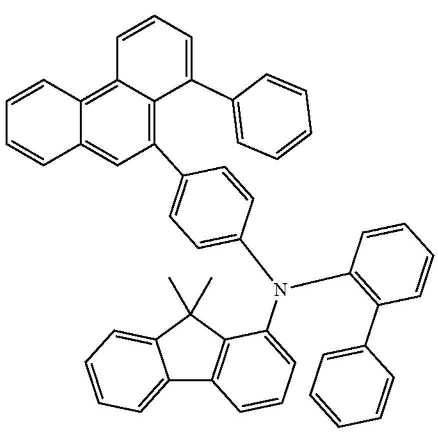
-continued
P20-35
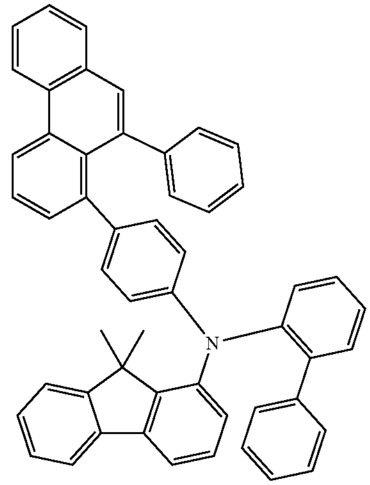
P20-36
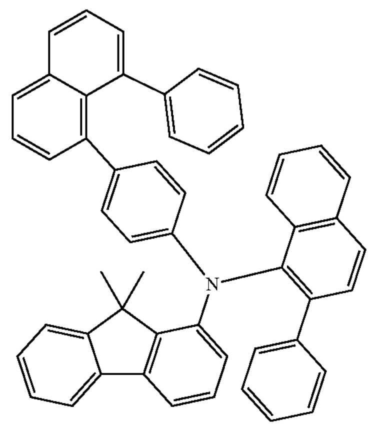
P21-1
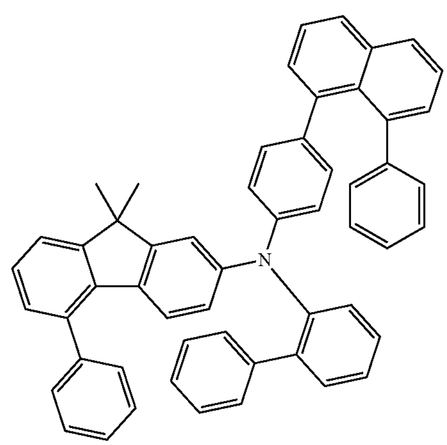

-continued
P21-2
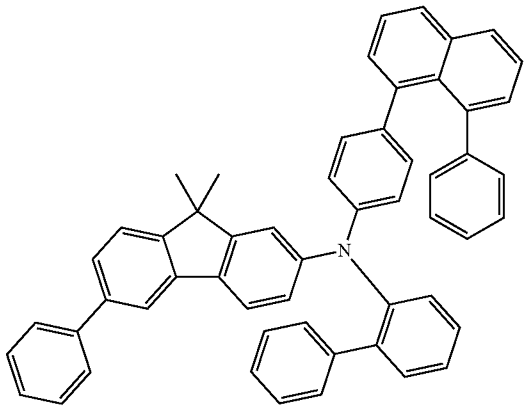
P21-3
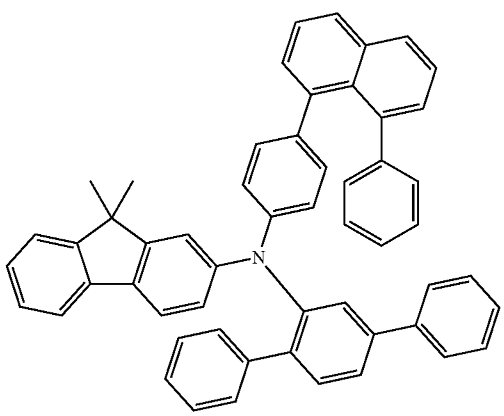
P21-4
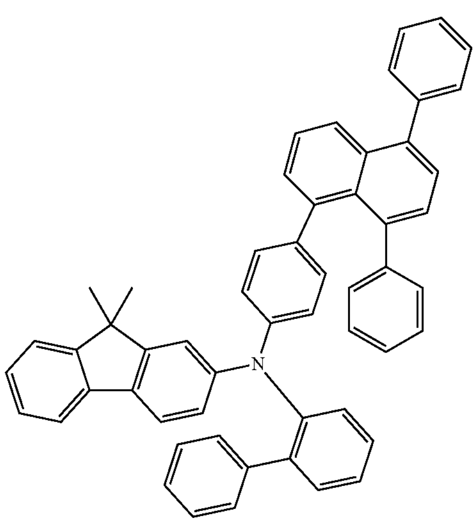
-continued
P21-5
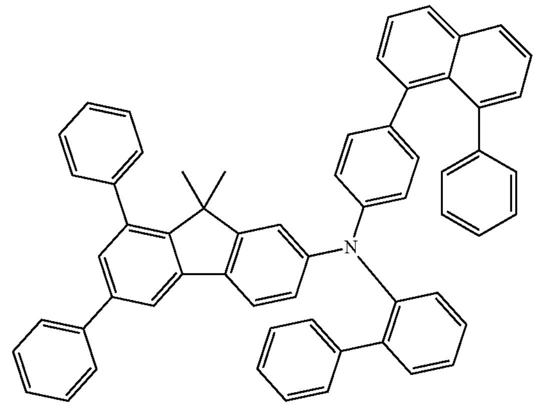
P21-6
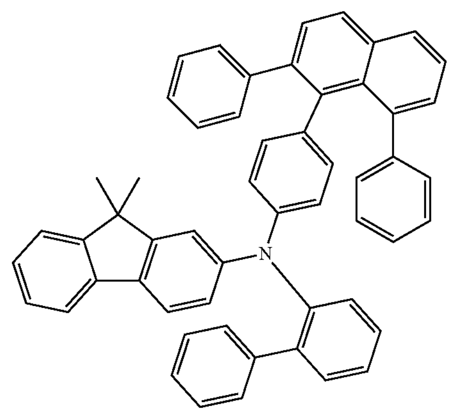
P21-7
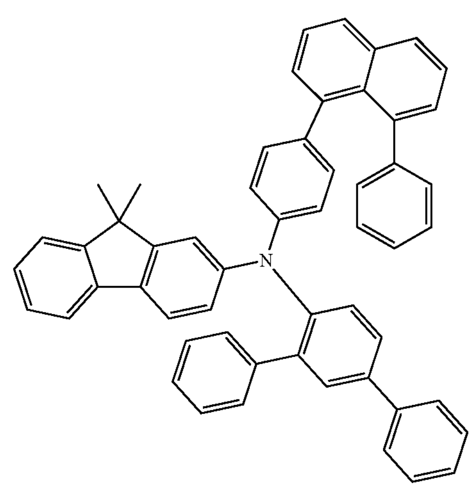

-continued
P21-8
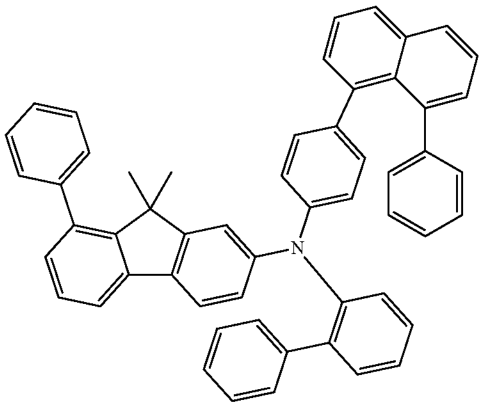
P21-9
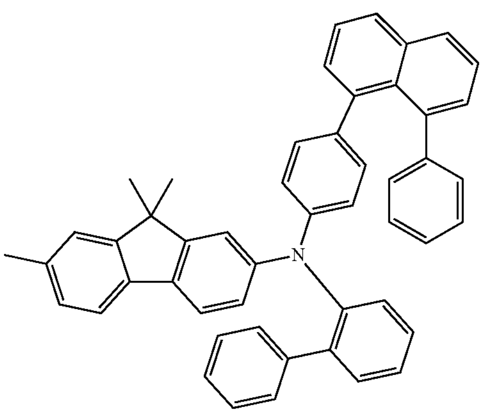
P21-10
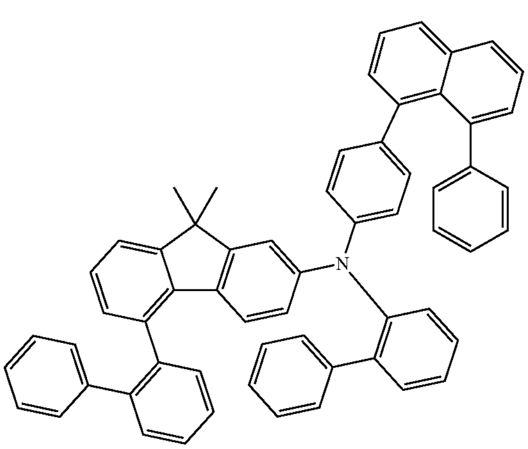
-continued
P21-11
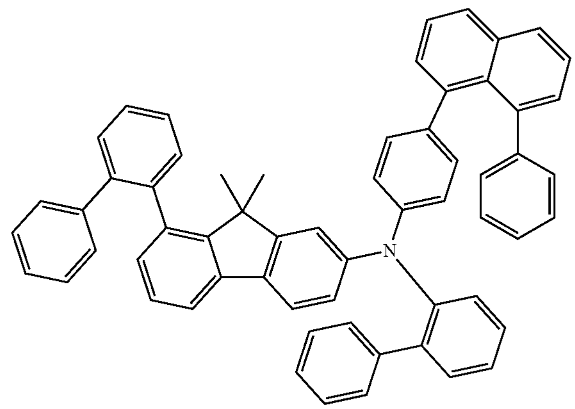
P21-12
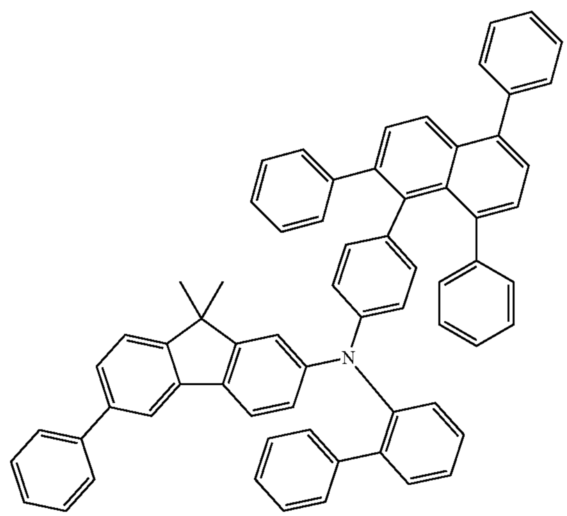
P21-13
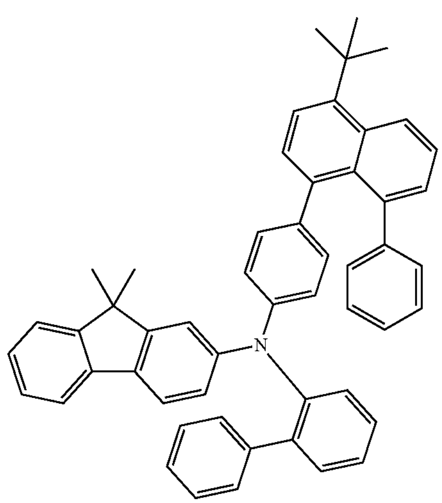

-continued
P21-14
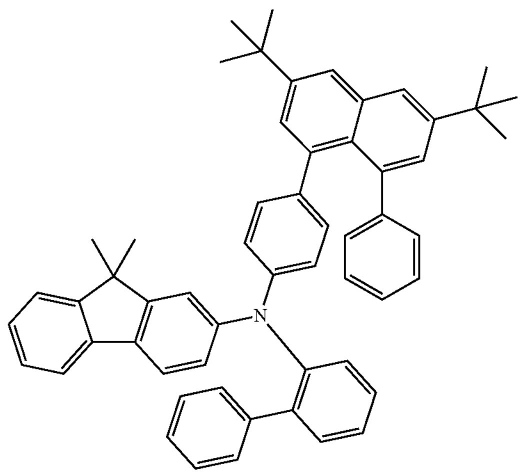
P21-15
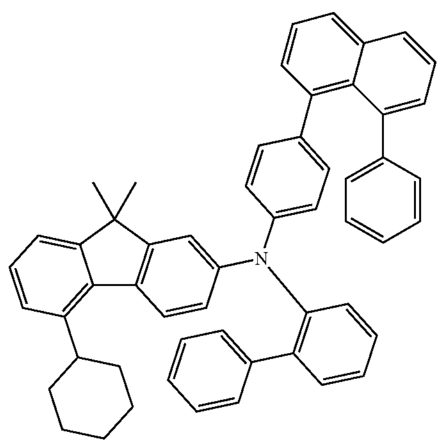
P21-16
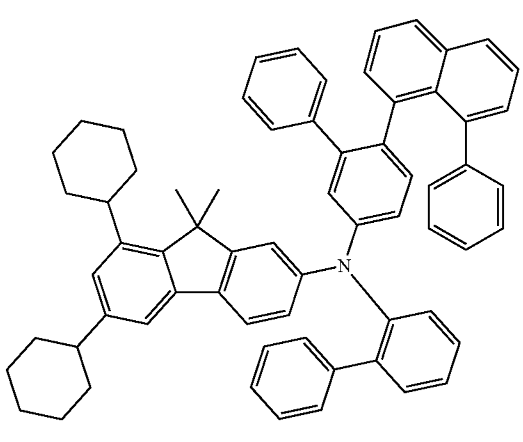
-continued
P21-17
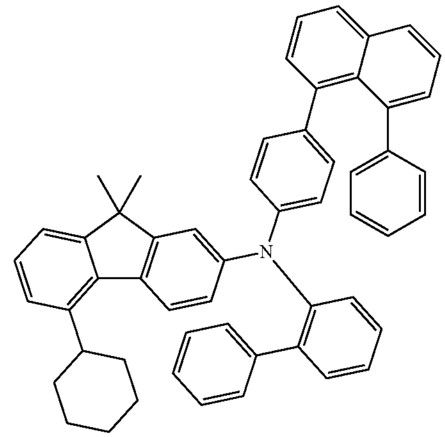
P21-18
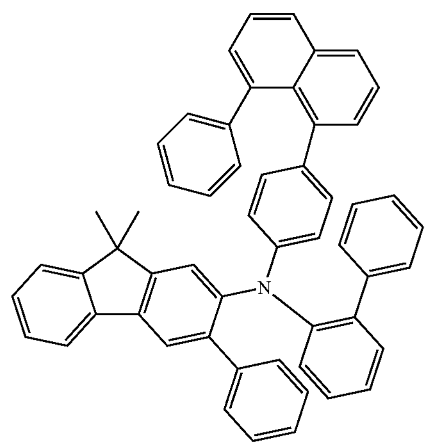
P21-19
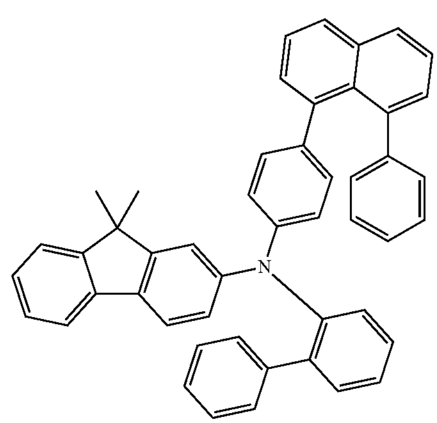

-continued
P21-20
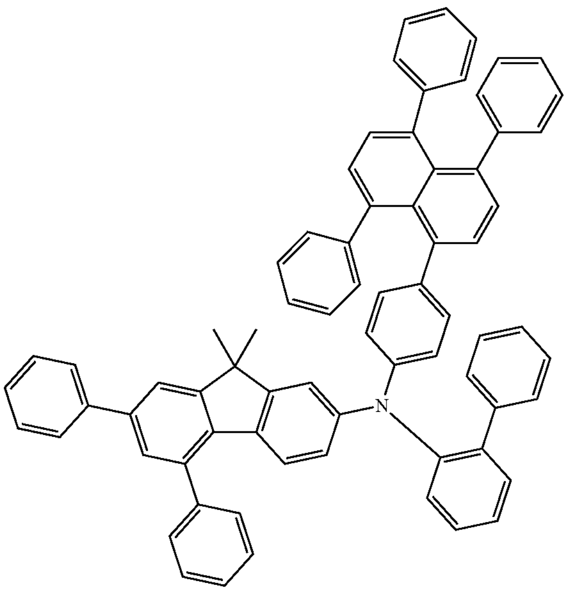
P21-21
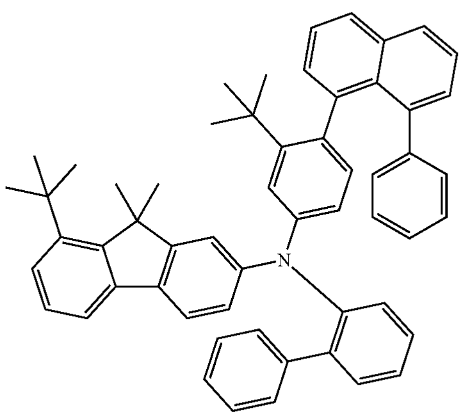
P21-22
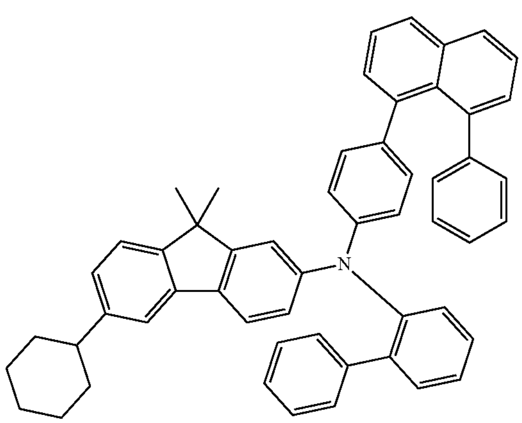
-continued
P21-23
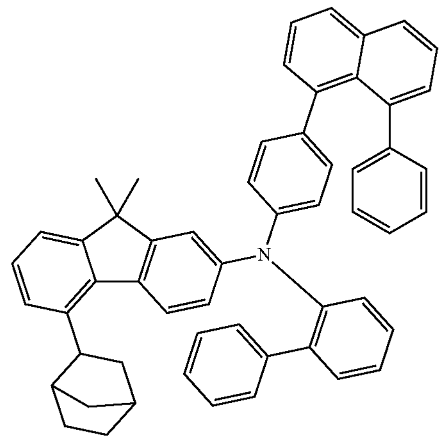
P21-24
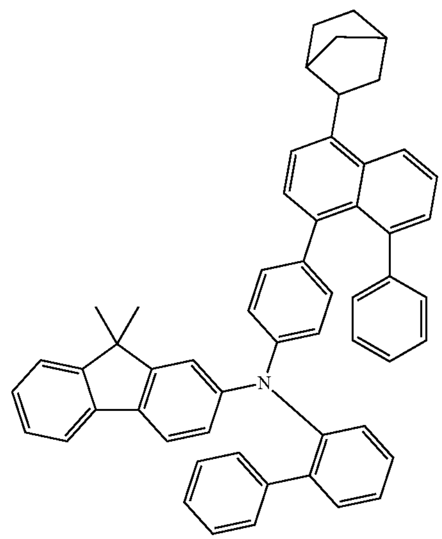
P21-25
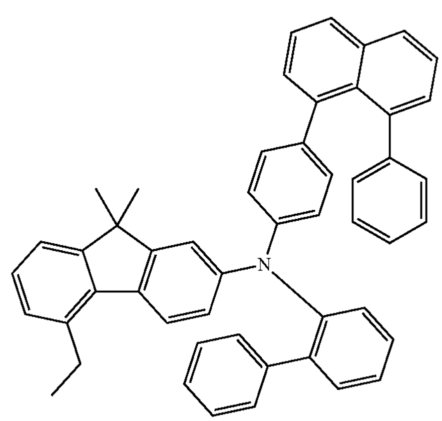

-continued
P21-26
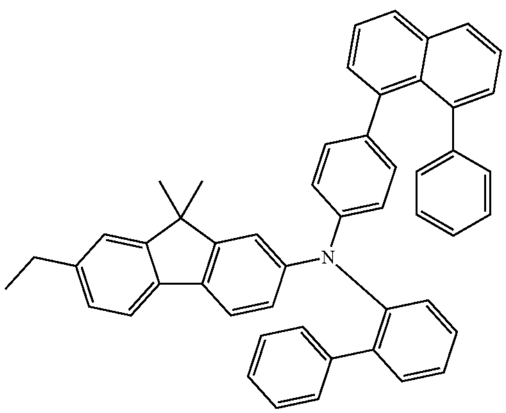
P21-27
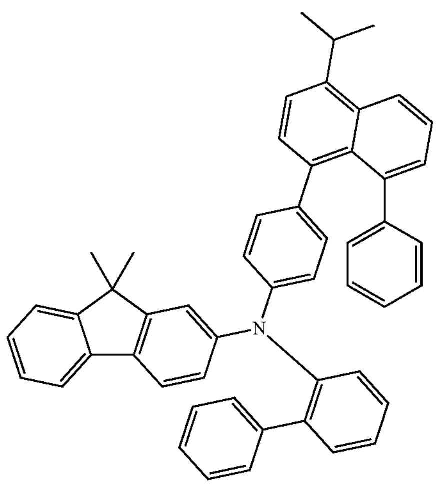
P21-28
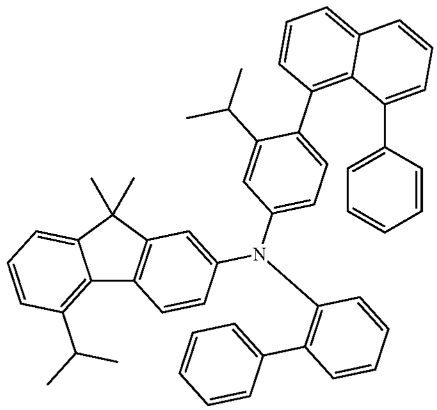
-continued
P21-29
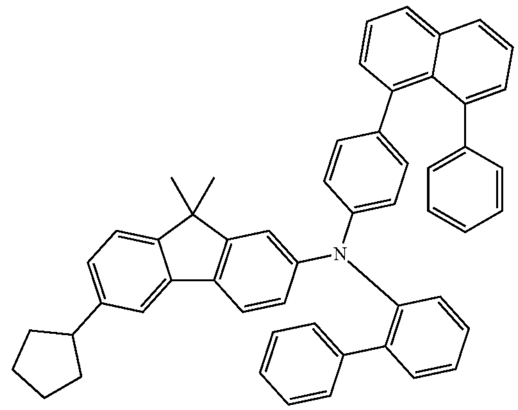
P21-30
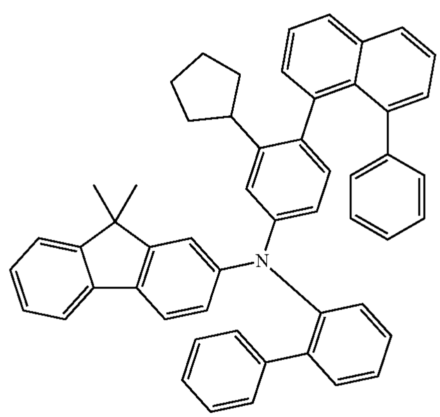
P21-31
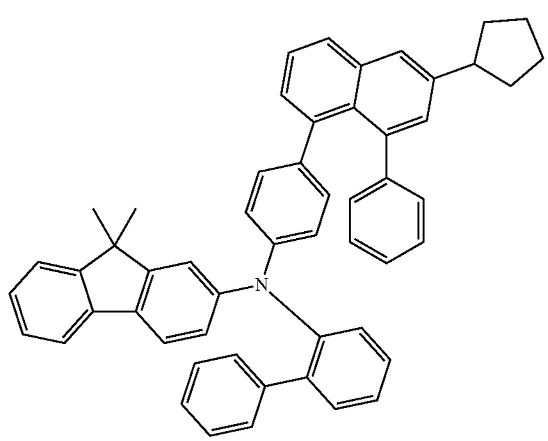

-continued
P21-32
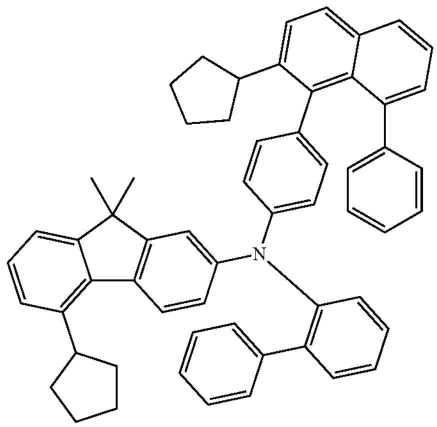
P21-33
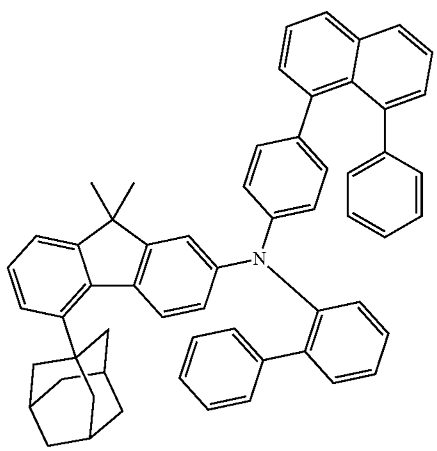
P21-34
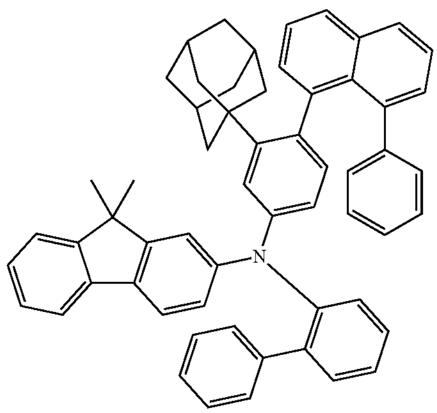
-continued
P21-35
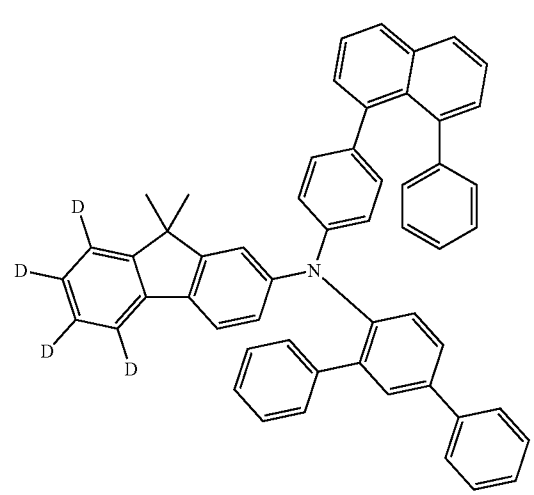
P21-36
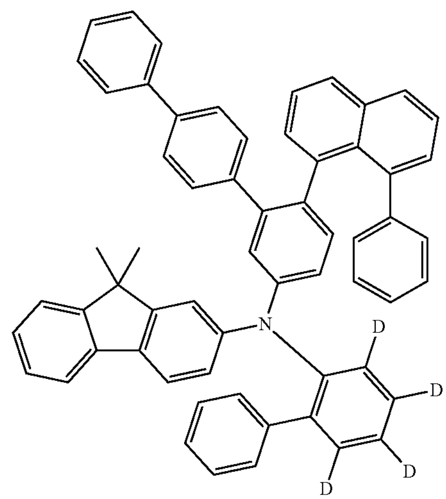
P21-37
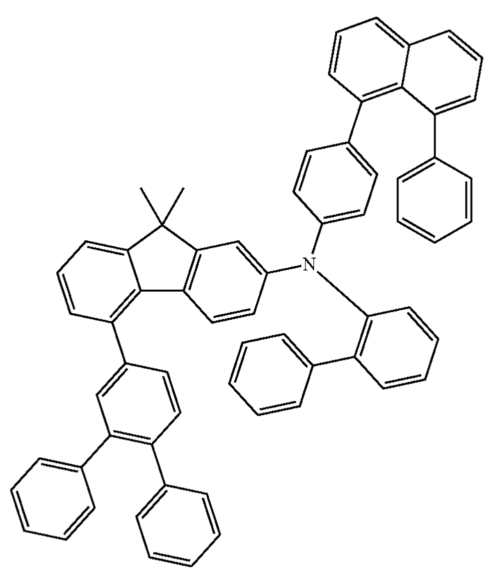

-continued
P21-38
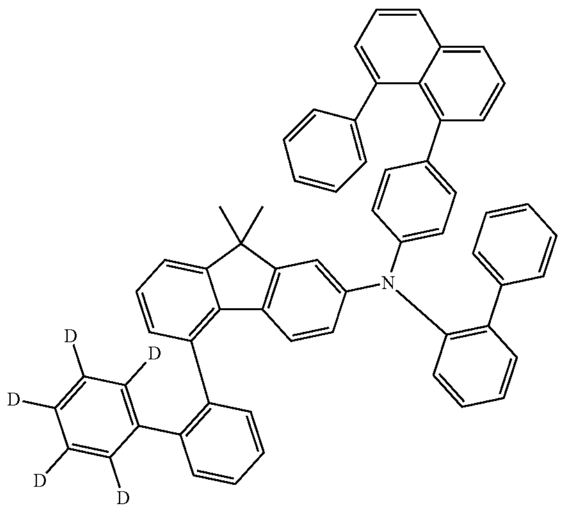
P21-39
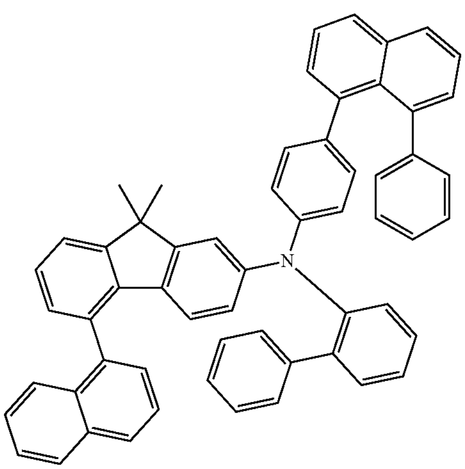
P21-40
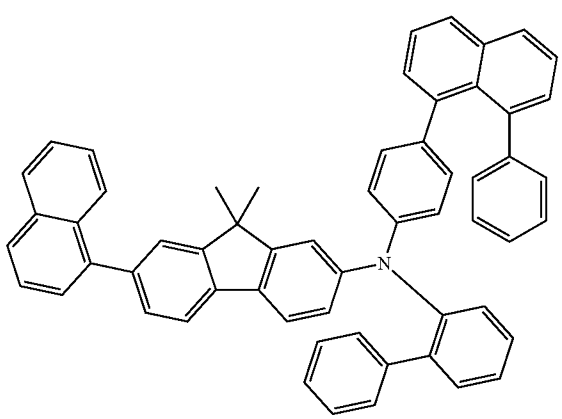
-continued
P21-41
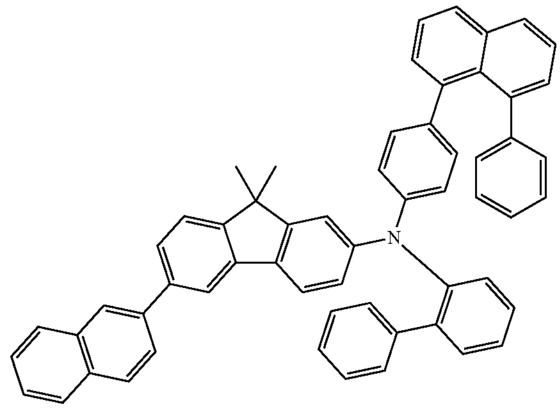
P21-42
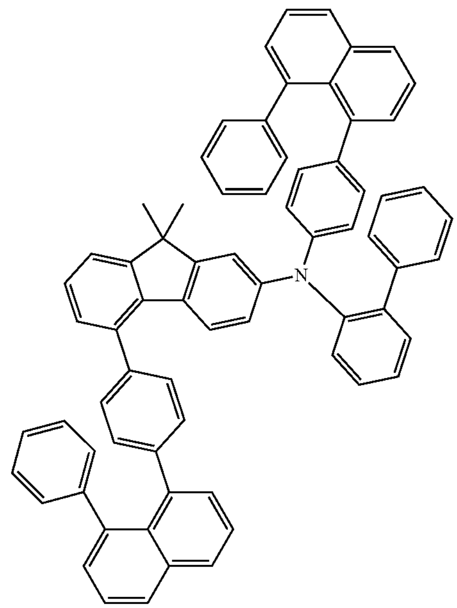
P21-43
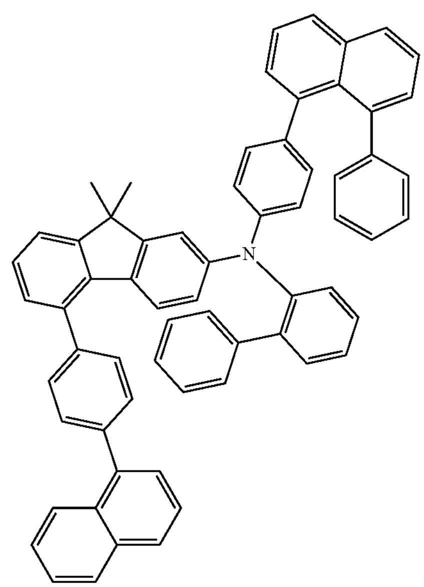

-continued
P21-44
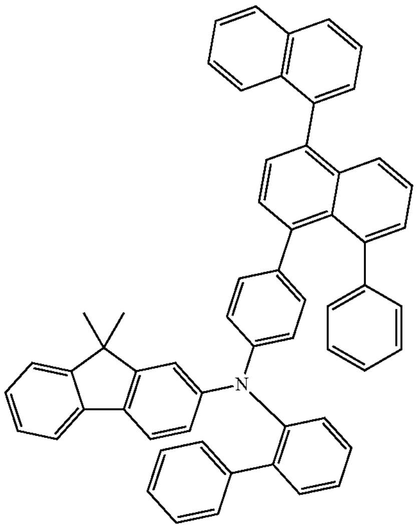
P21-45
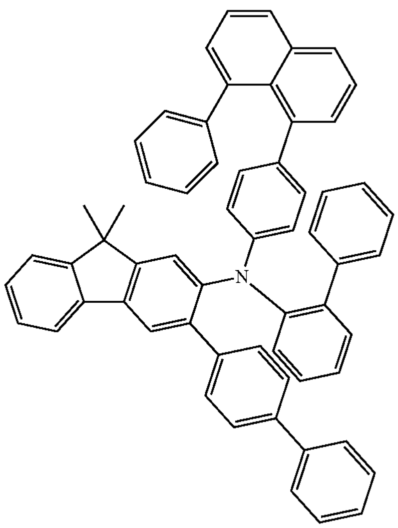
P21-46
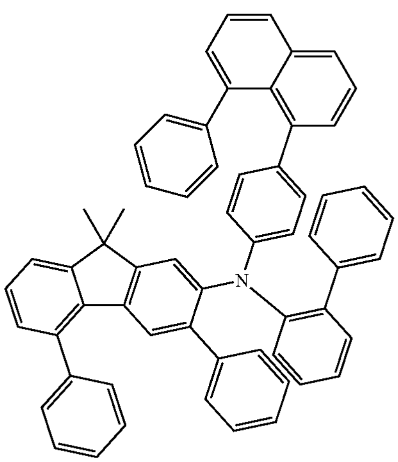
-continued
P21-47
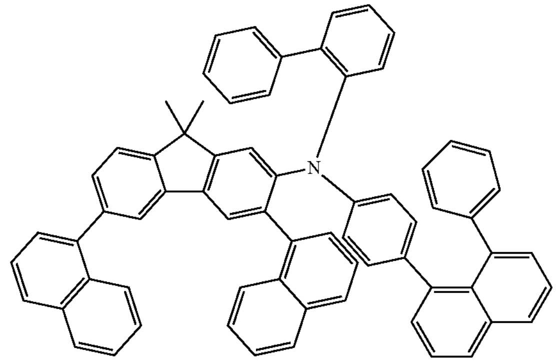
P21-48
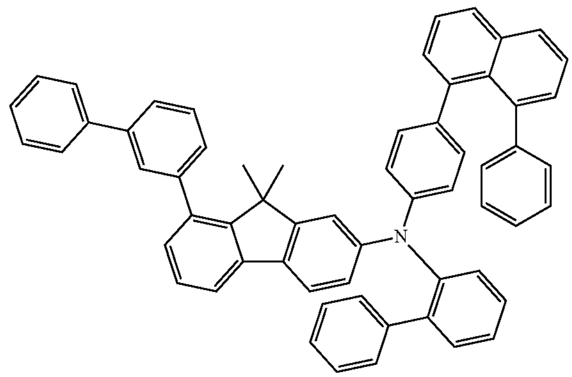
P21-49
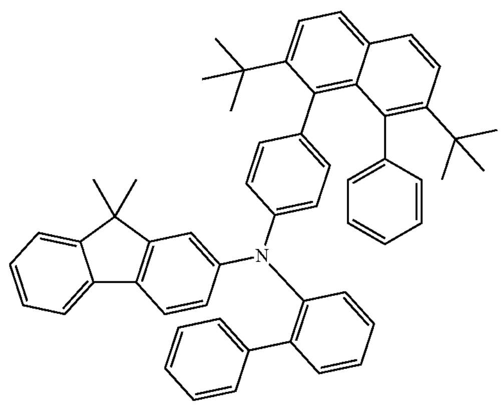
P21-50
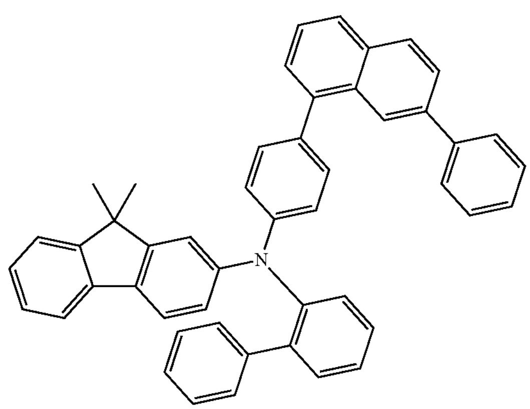

P21-51
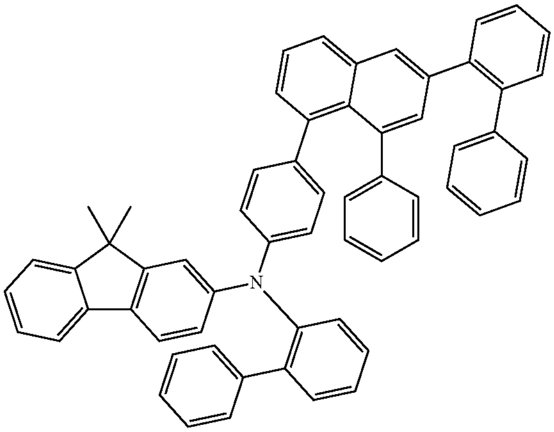
P21-52
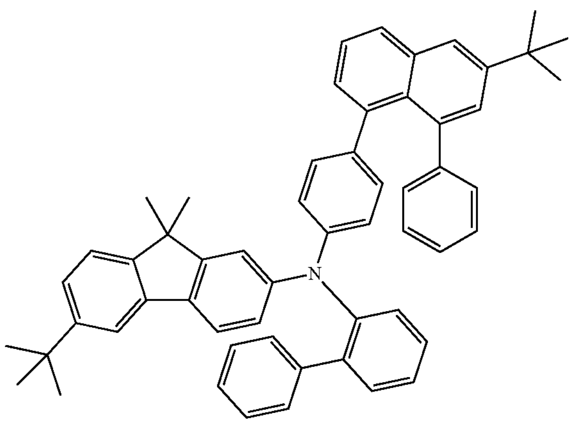
P21-53
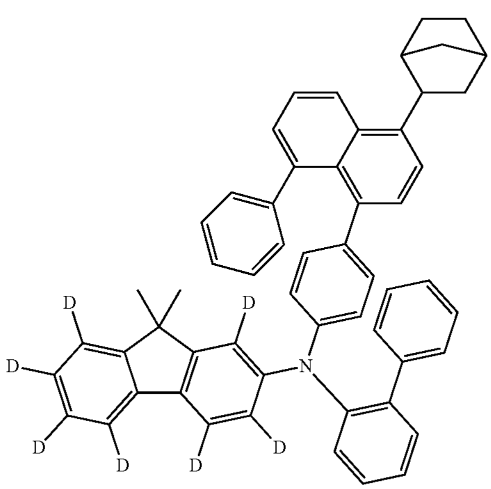
P21-54
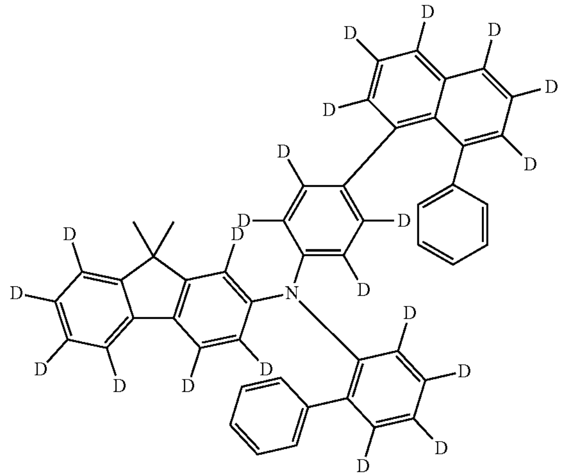
P21-55
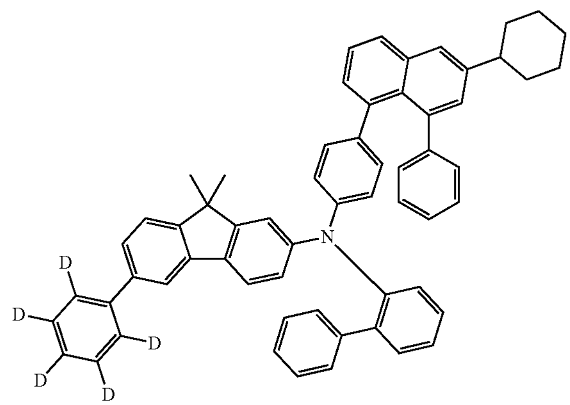
P21-56
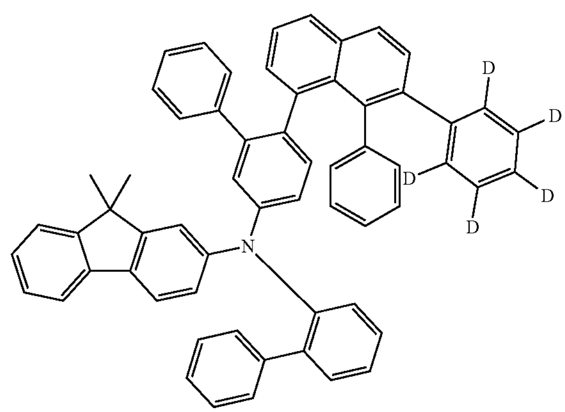

-continued
P21-57
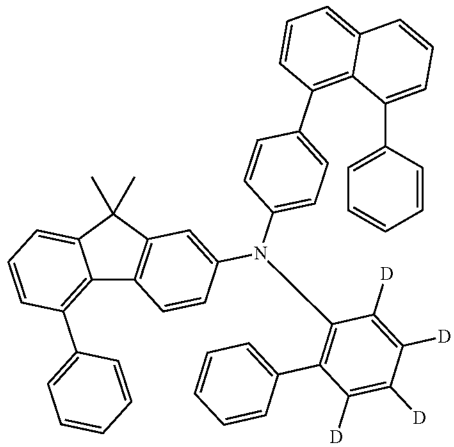
P21-58
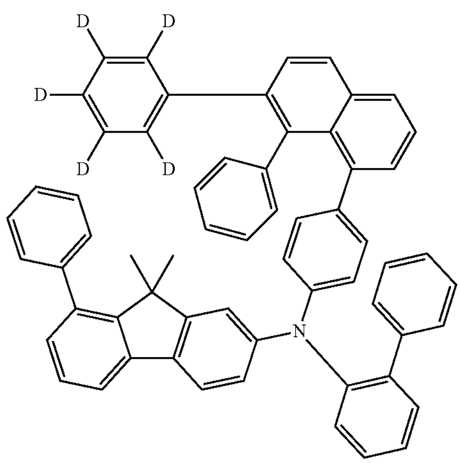
P21-59
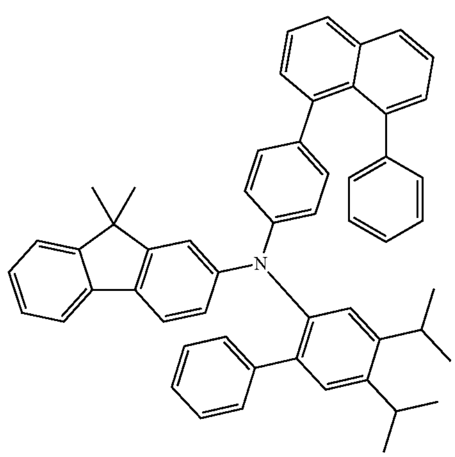
-continued
P21-60
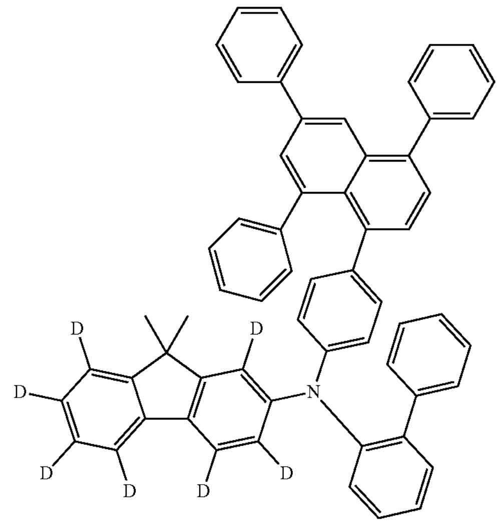
P21-61
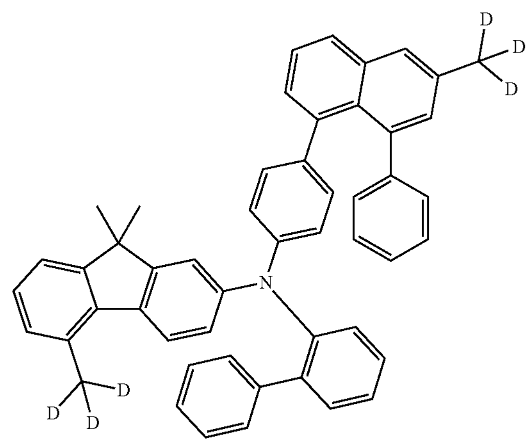
P21-62
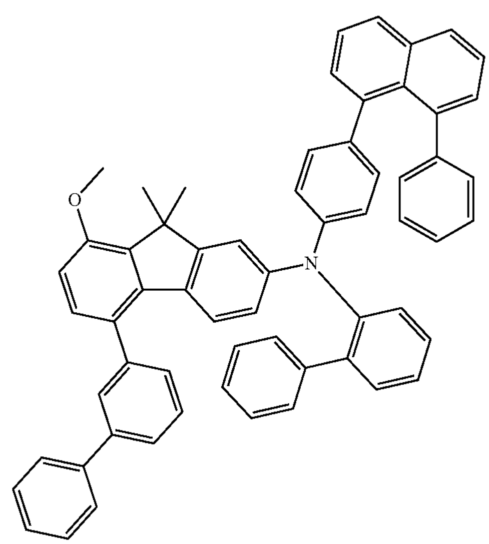

P21-63
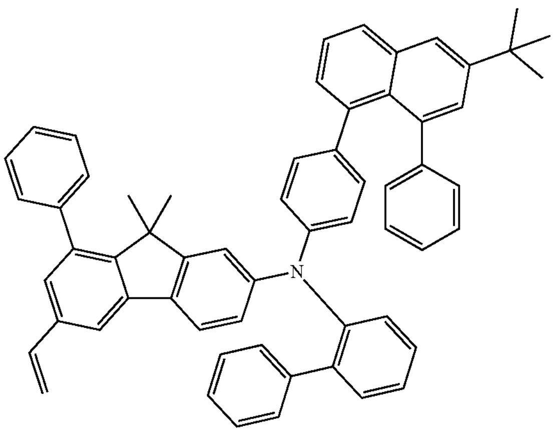
P21-64
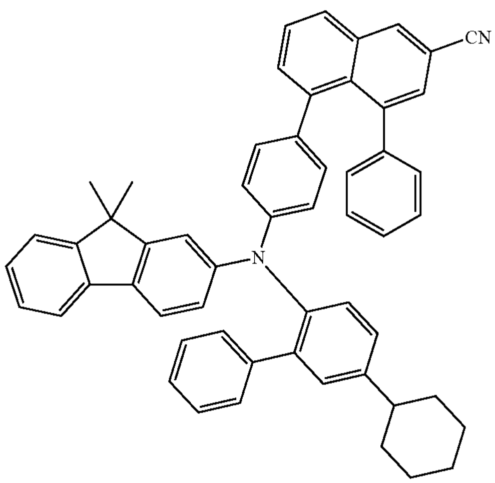
P21-65
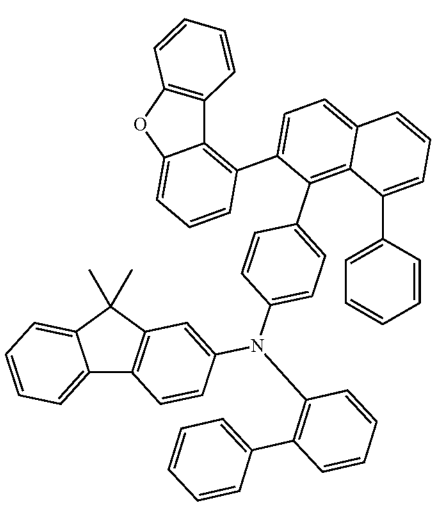
P21-66
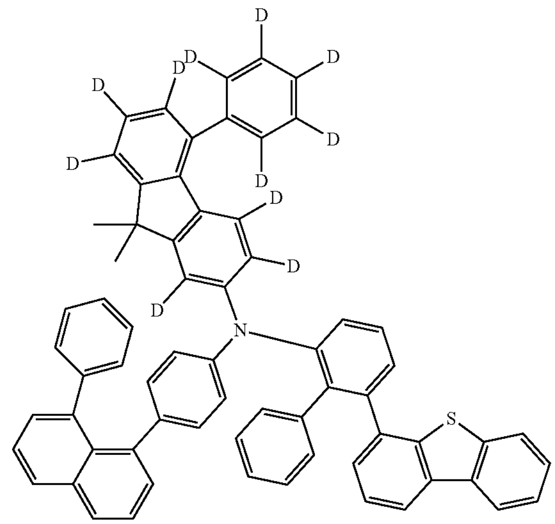
P21-67
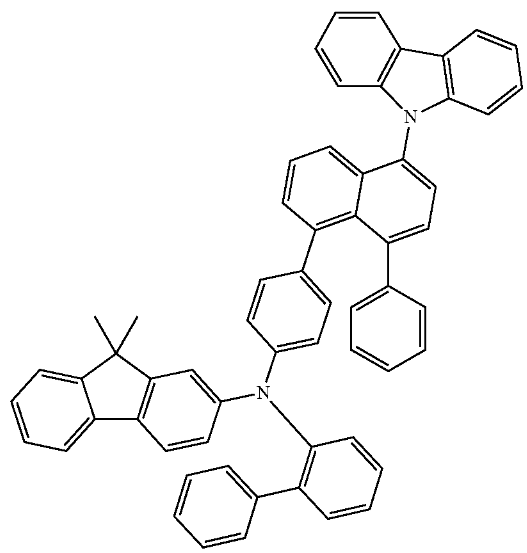
P21-68
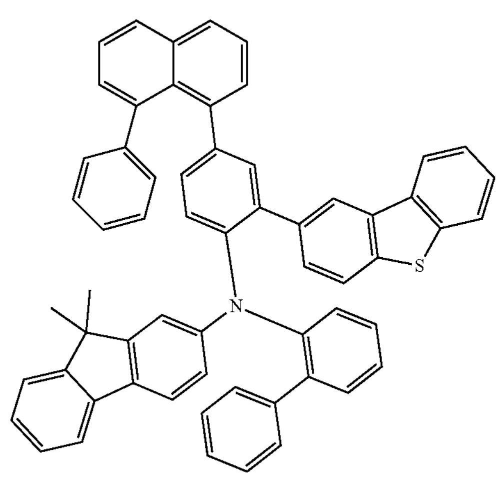

-continued
P21-69
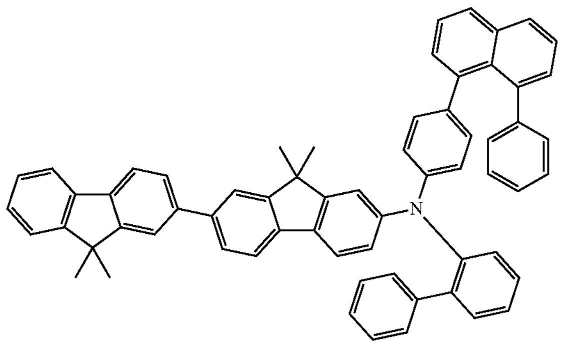
P21-70
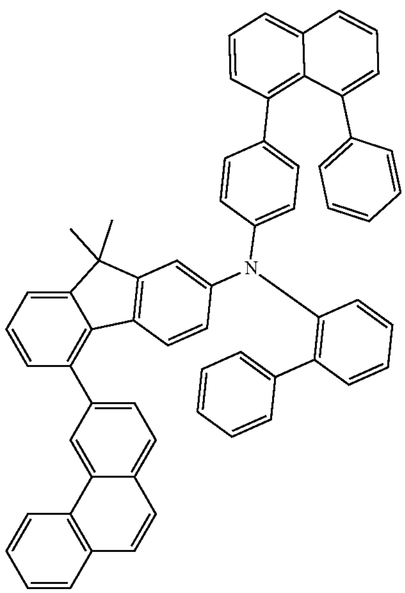
P21-71
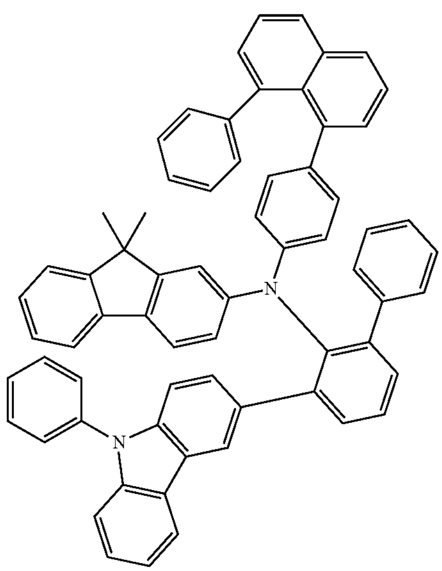
-continued
P21-72
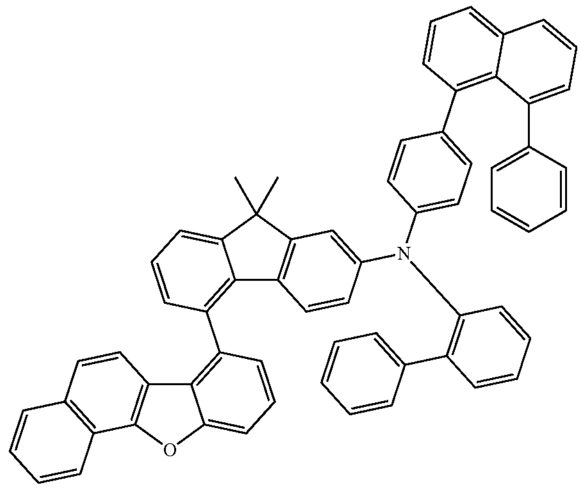
P21-73
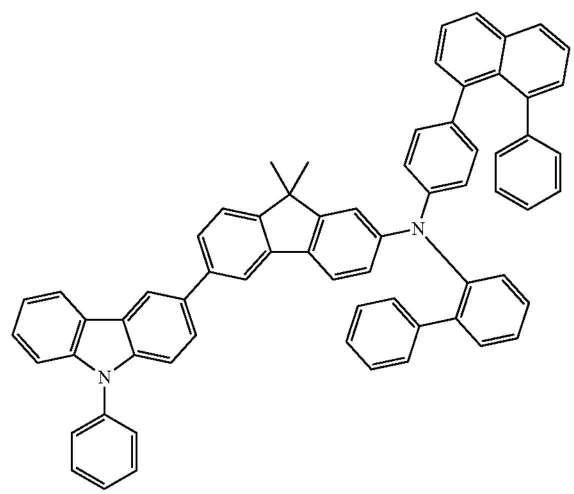
P21-74
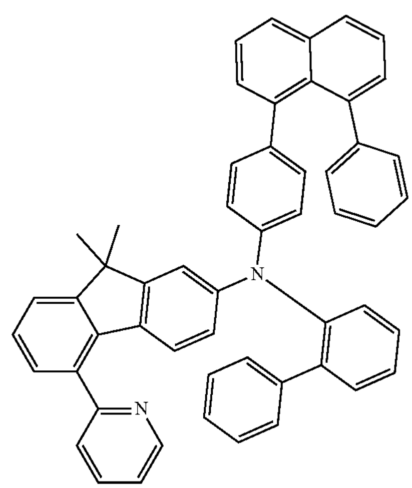

-continued
P21-75
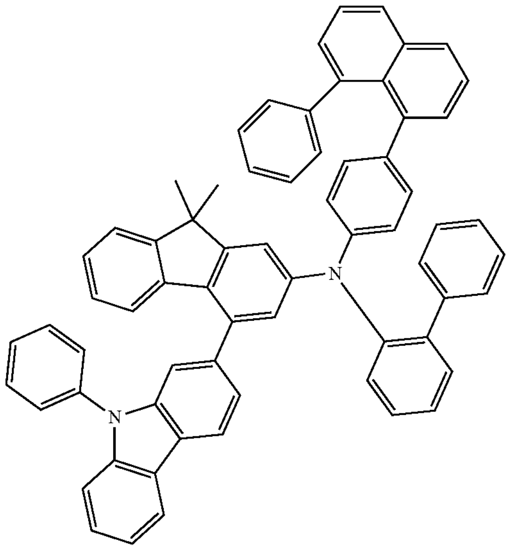
P21-76
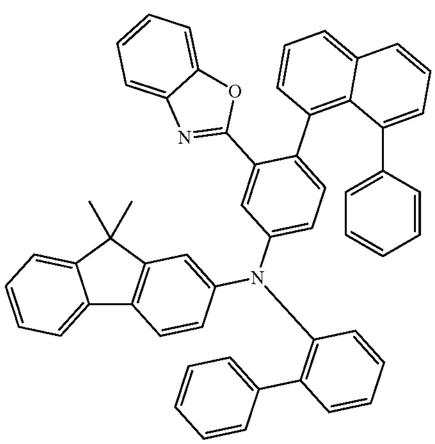
P21-77
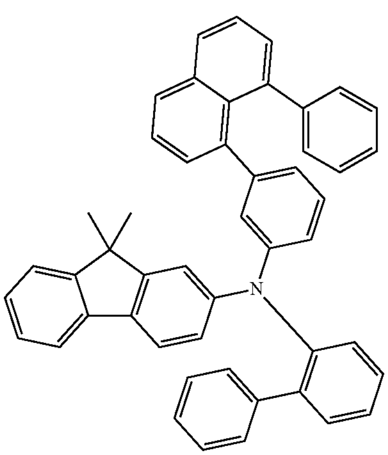
-continued
P21-78
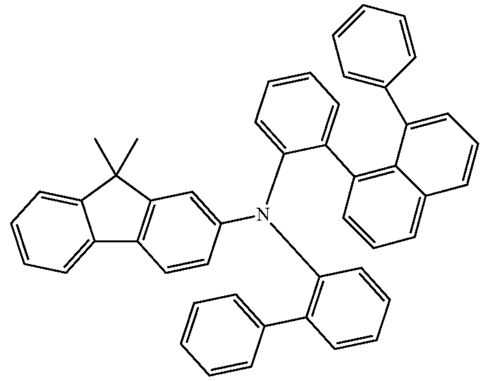
P21-79
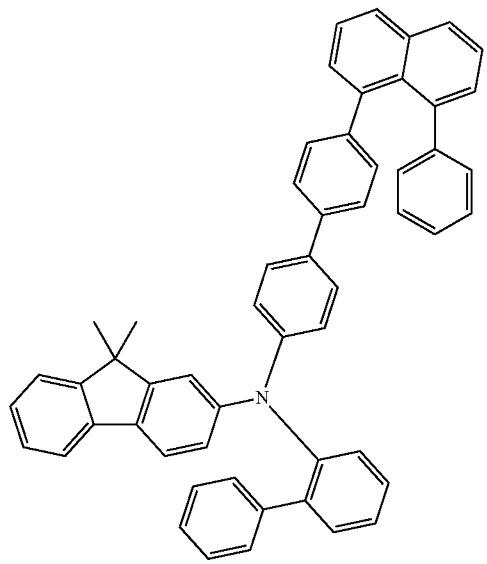
P21-80
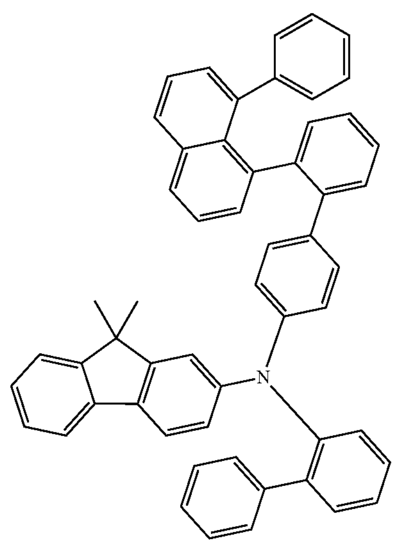

-continued
P21-81
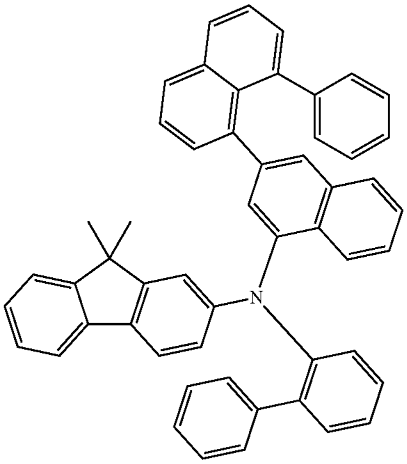
P21-82
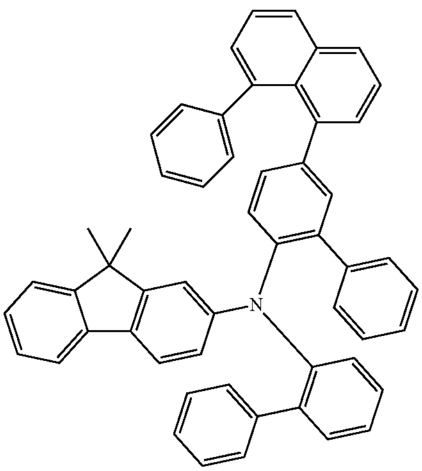
P21-83
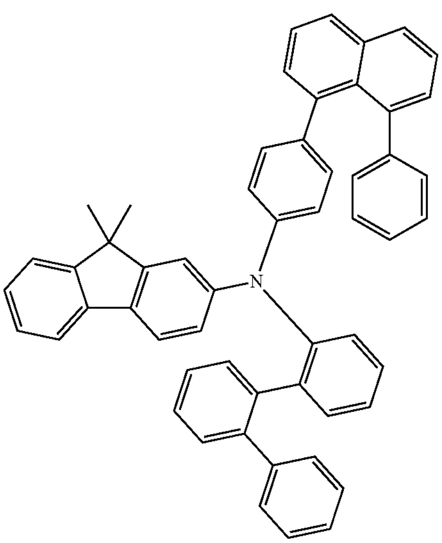
-continued
P21-84
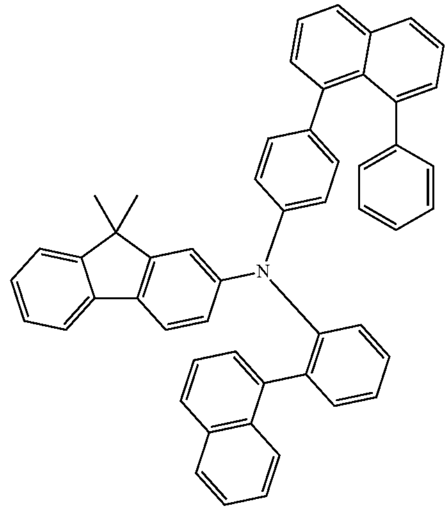
P21-85
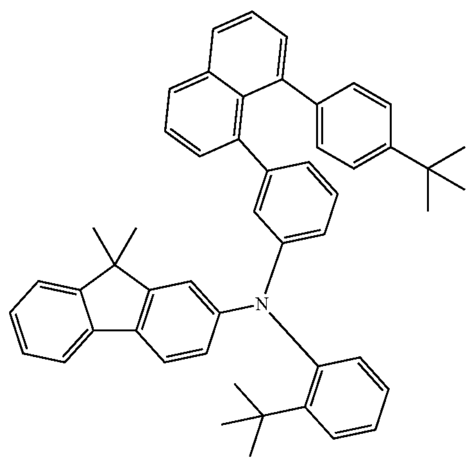
P21-86
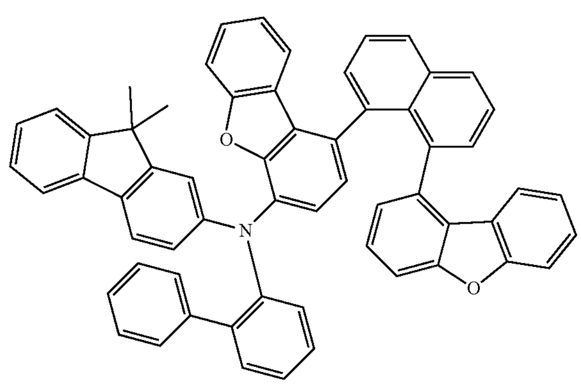

-continued
P21-87
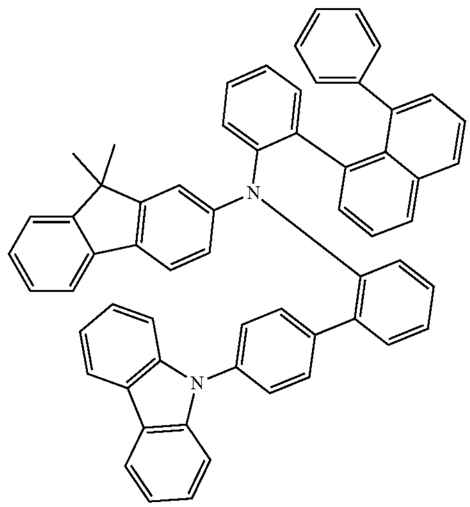
P21-88
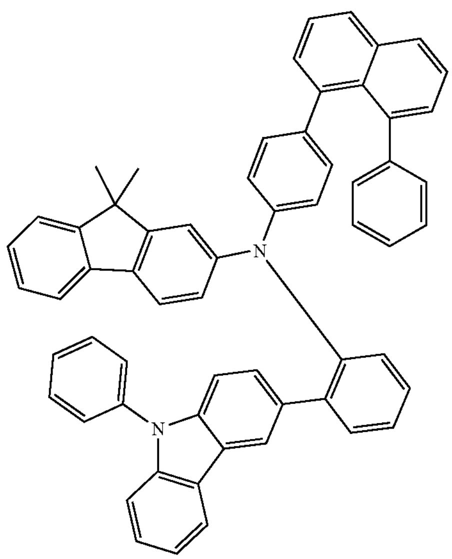
P21-89
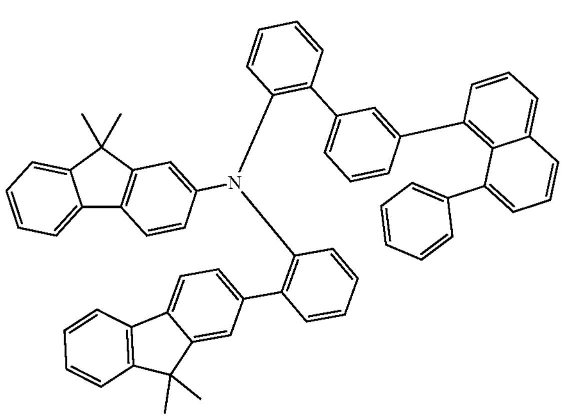
-continued
P21-90
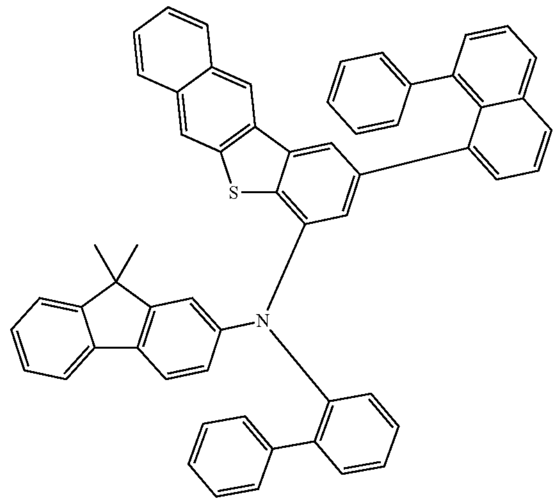
P21-91
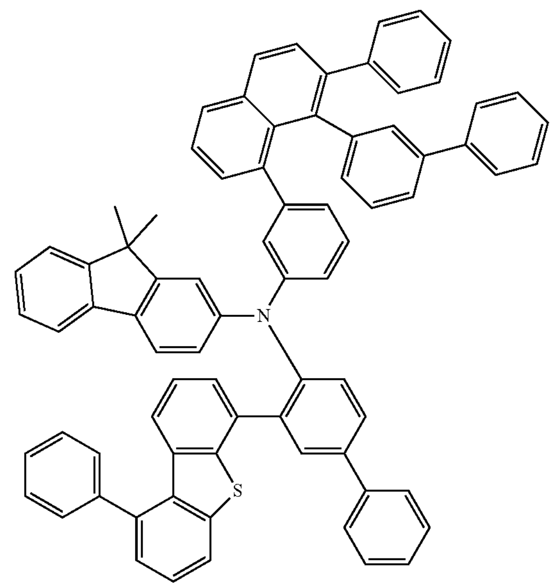
P21-92
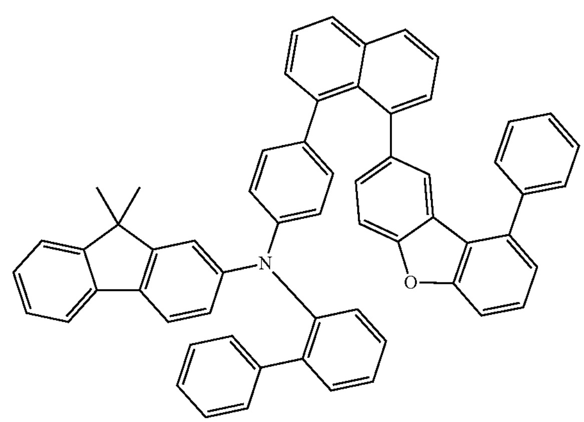

-continued
P21-93
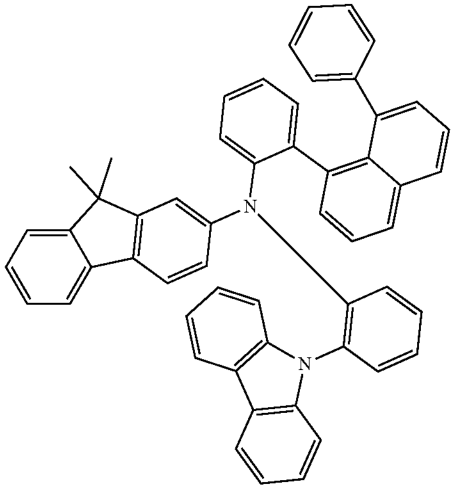
P21-94
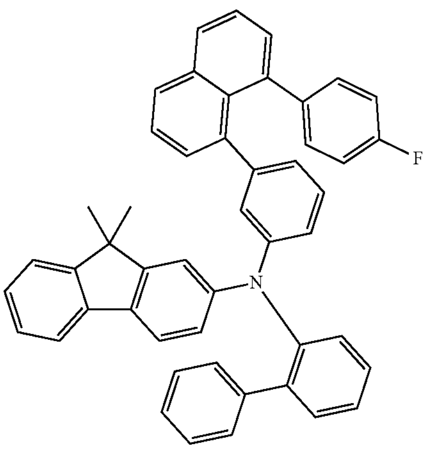
P21-95
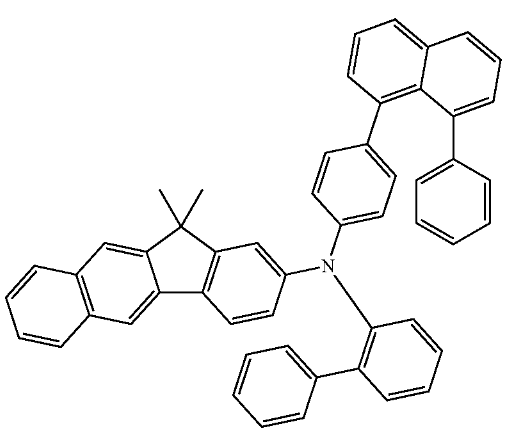
-continued
P21-96
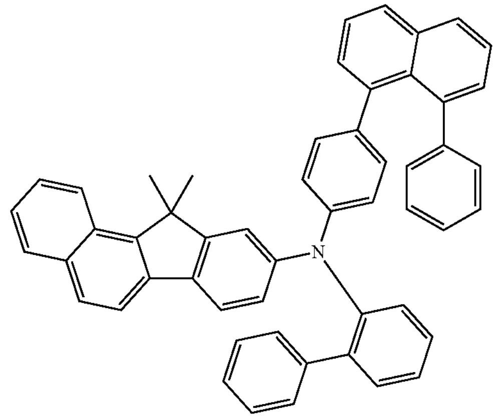
P21-97
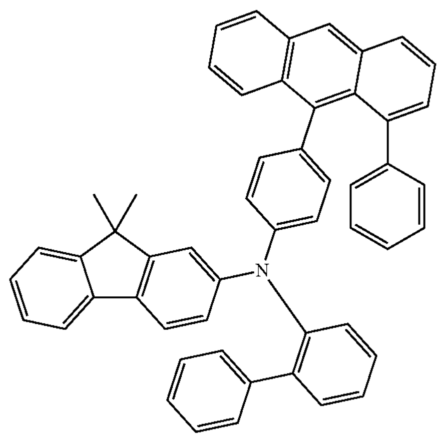
P21-98
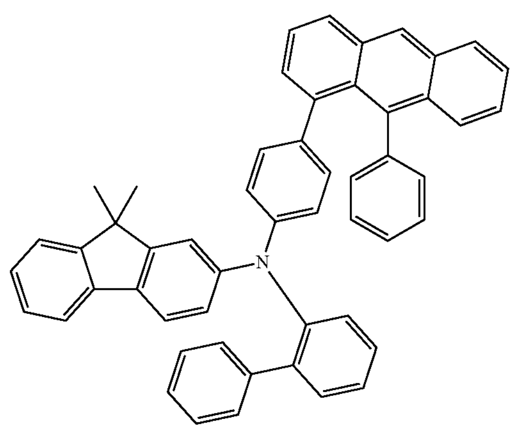

-continued
P21-99
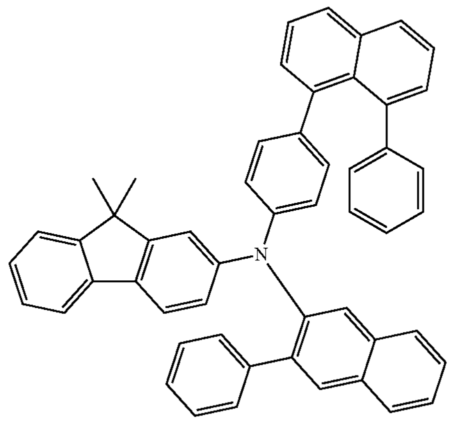
P21-100
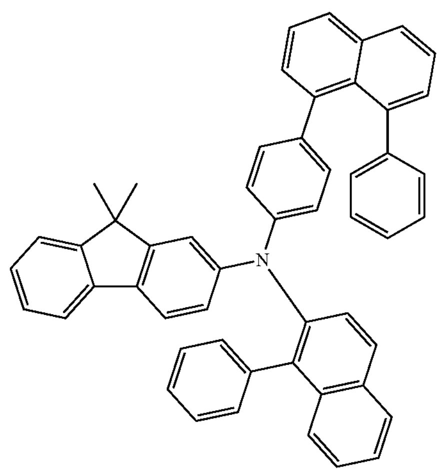
P22-1
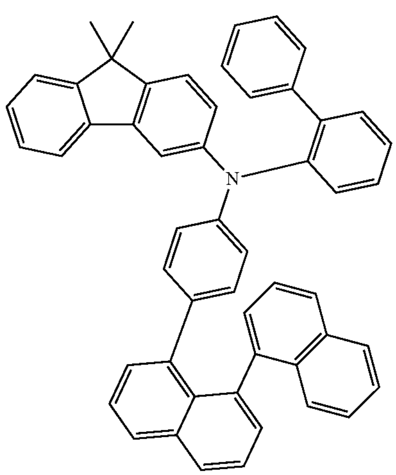
-continued
P22-2
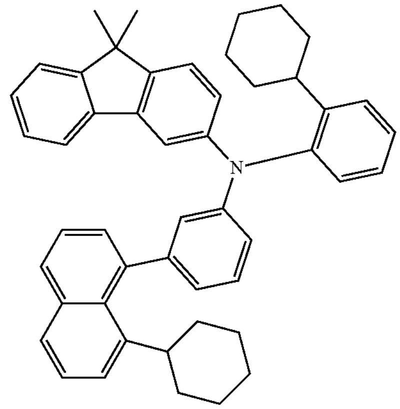
P22-3
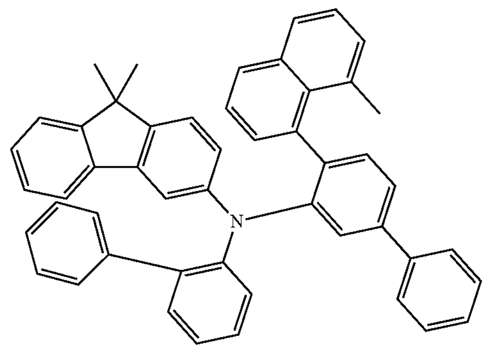
P22-4
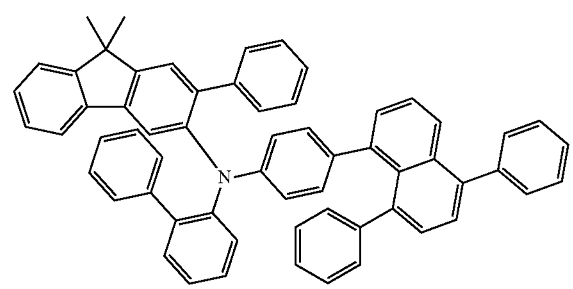
P22-5
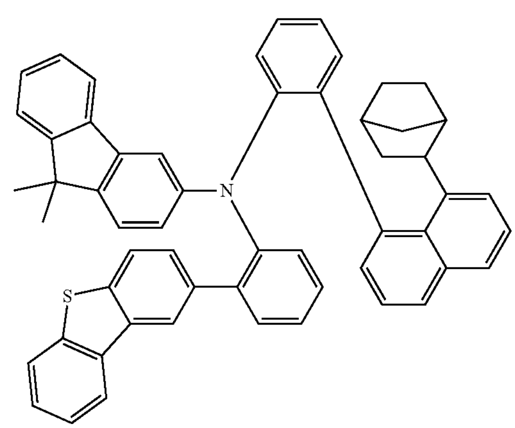

-continued
P22-6
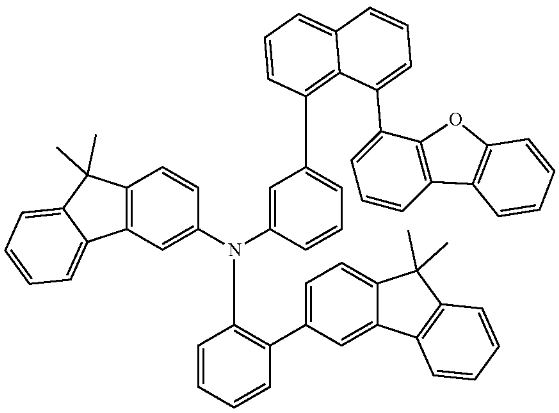
P22-7
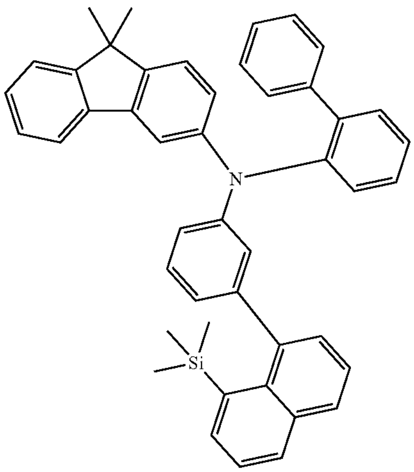
P22-8
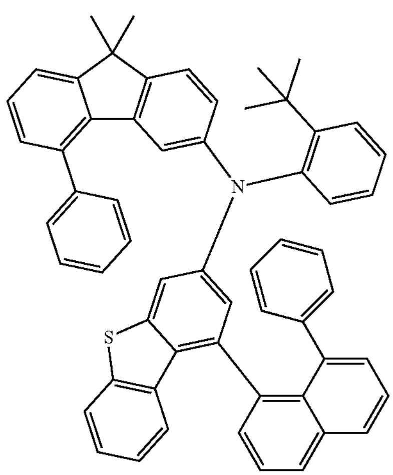
-continued
P22-9
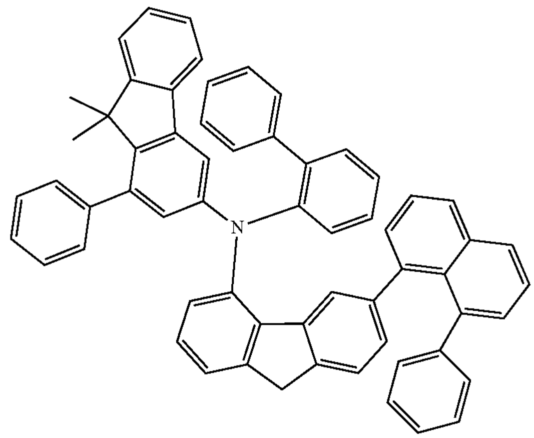
P22-10
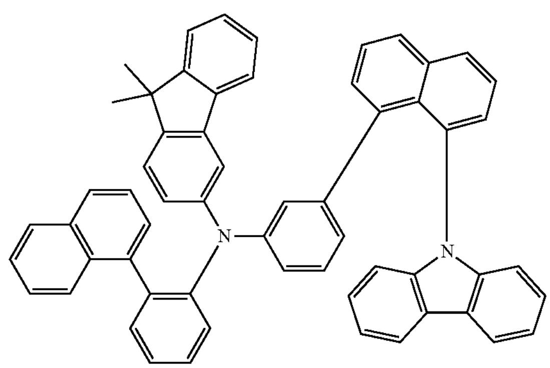
P22-11
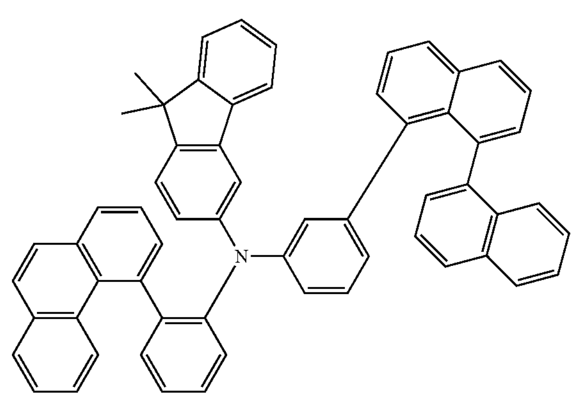

P22-12
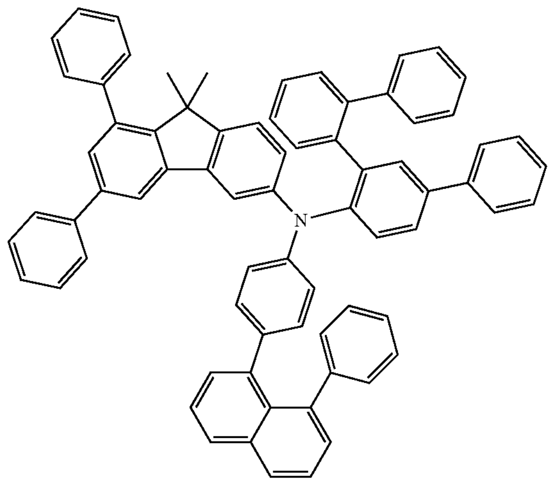
P22-13
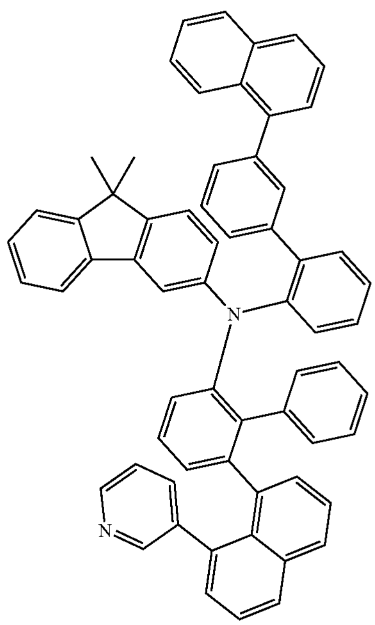
P22-14
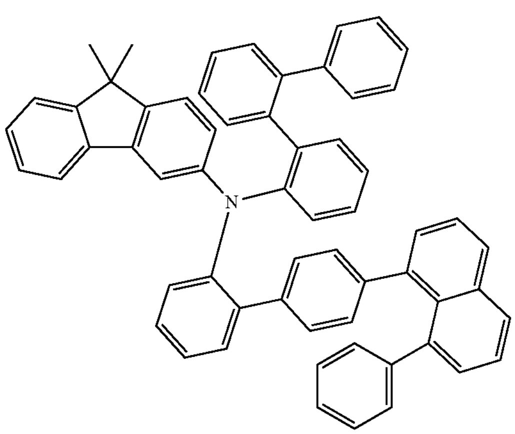
P22-15
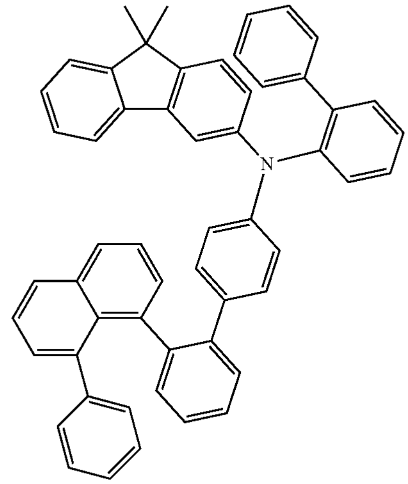
P22-16
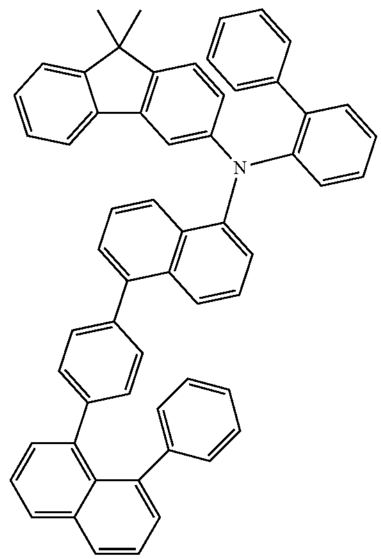
P22-17
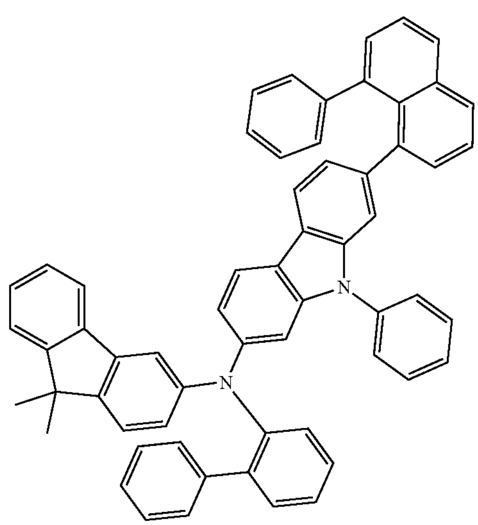

-continued
P22-18
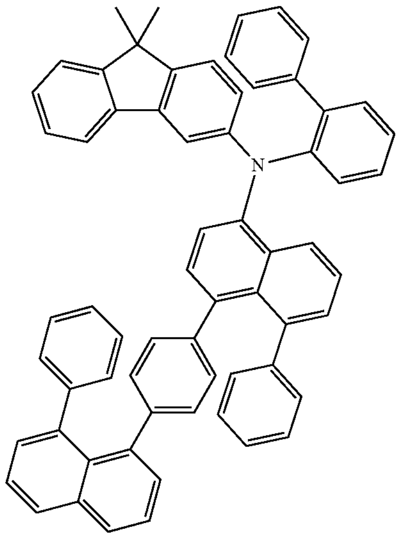
P22-19
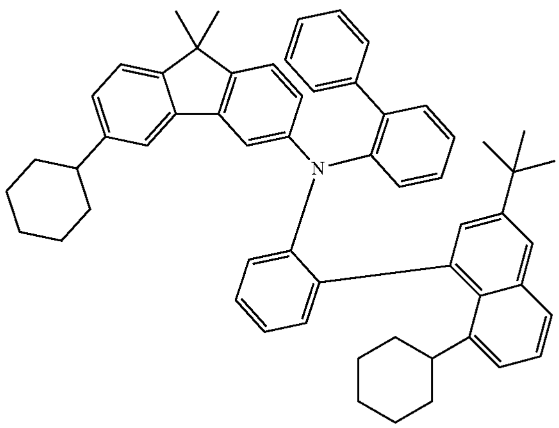
P22-20
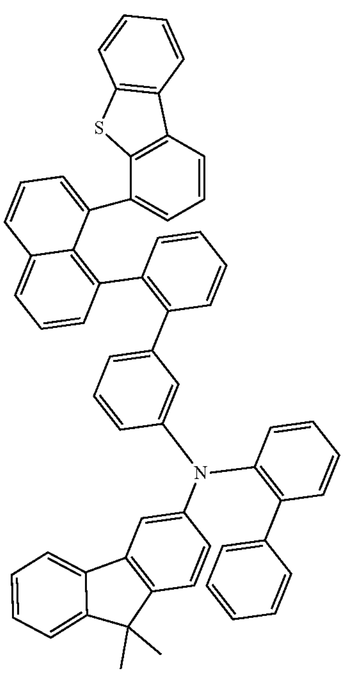
-continued
P22-21
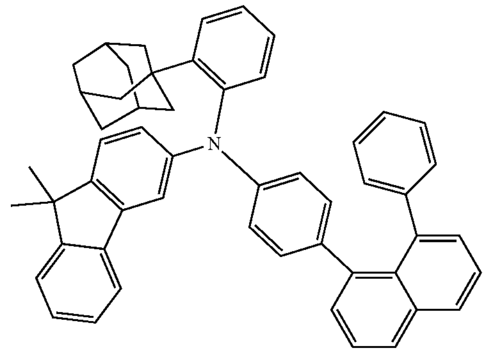
P22-22
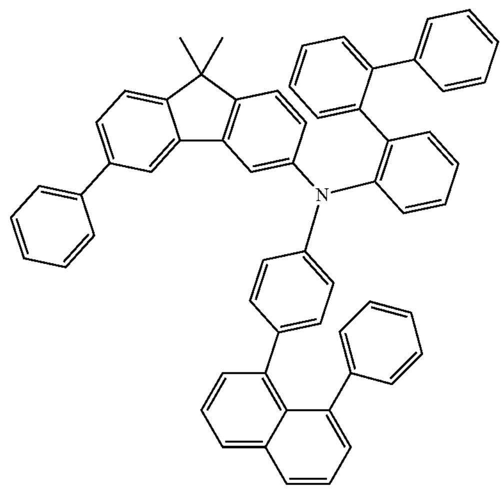
P22-23
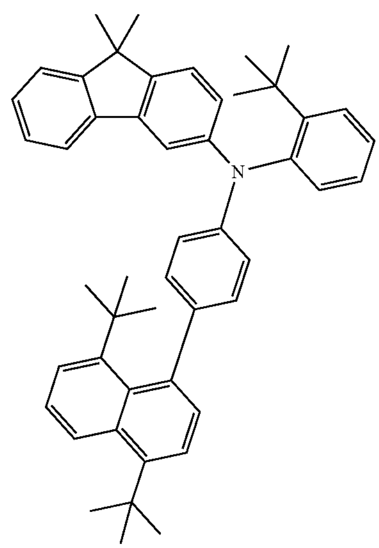

P22-24
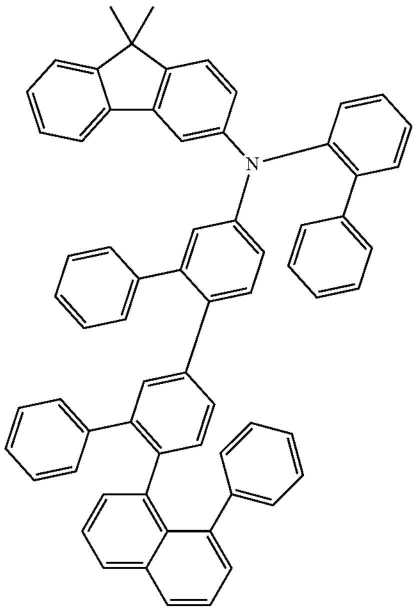
P22-25
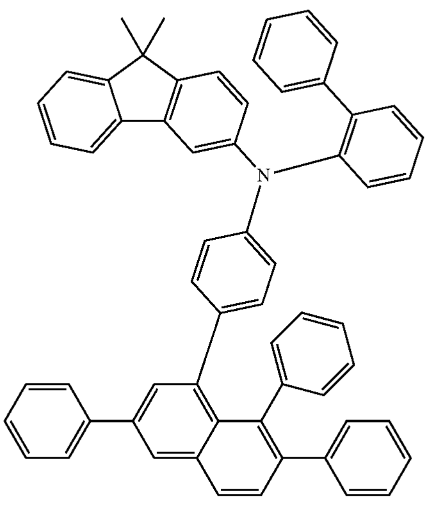
P22-26
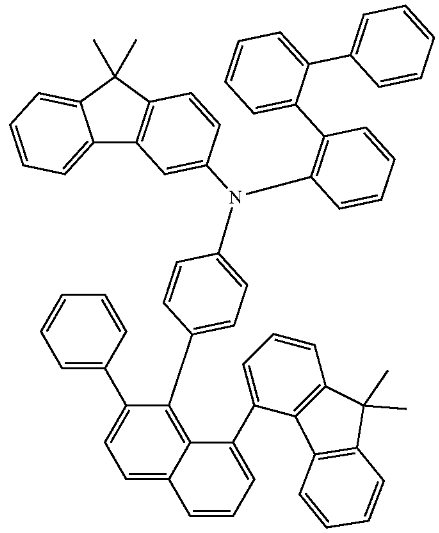
P22-27
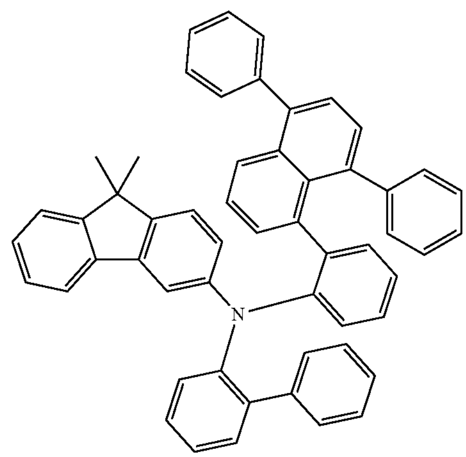
P22-28
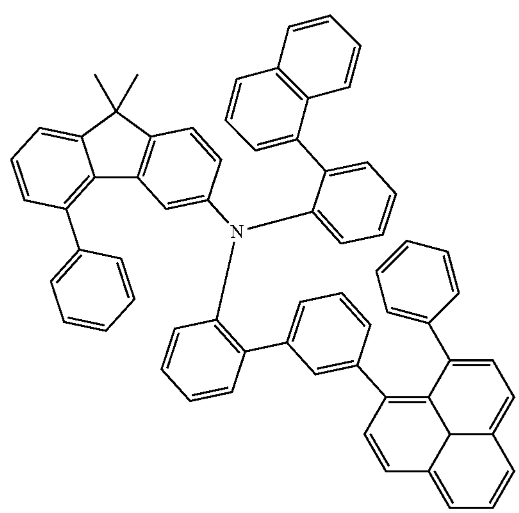

-continued
P22-29
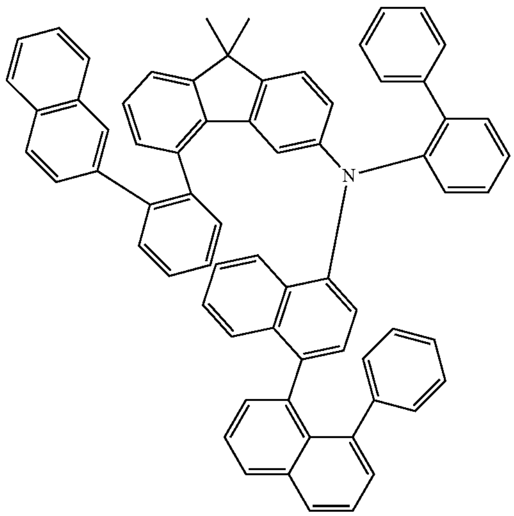
P22-30
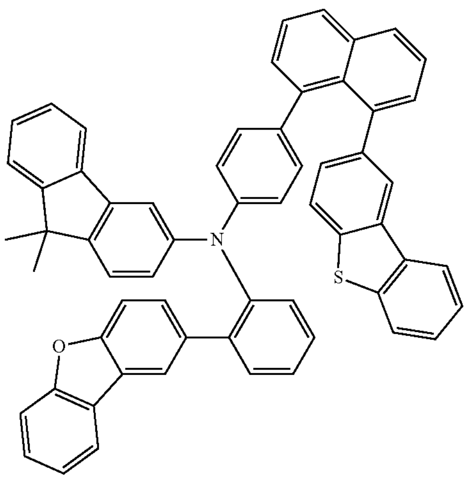
P22-31
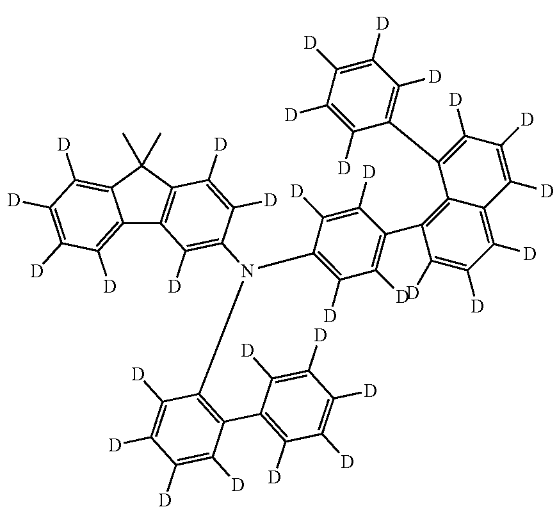
-continued
P22-32
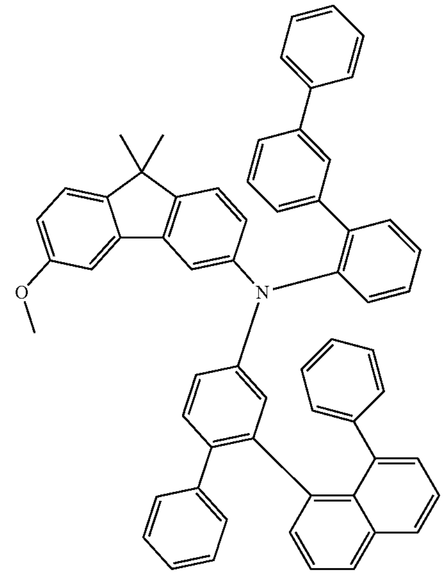
P22-33
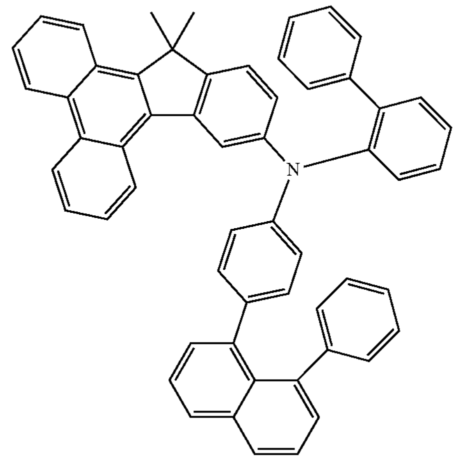
P22-34
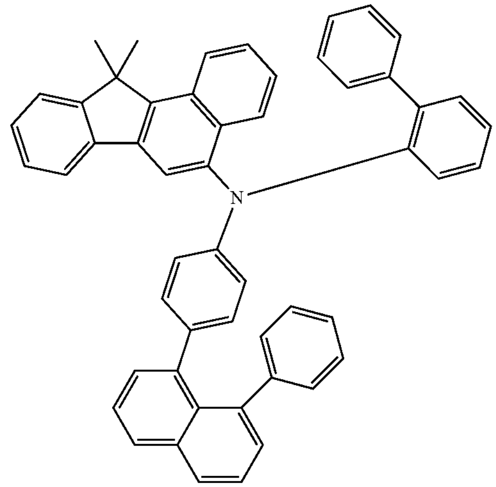

P22-35
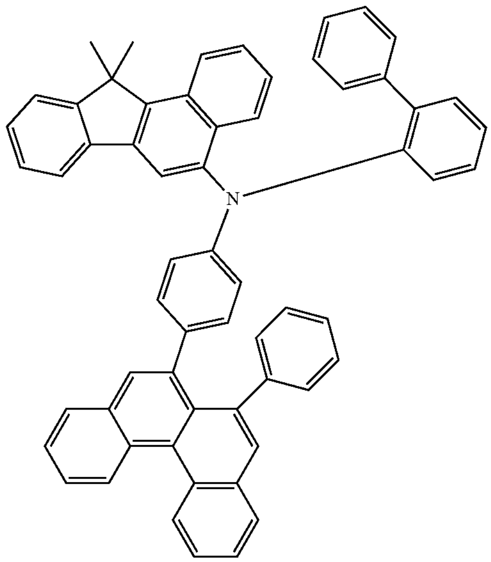
P22-36
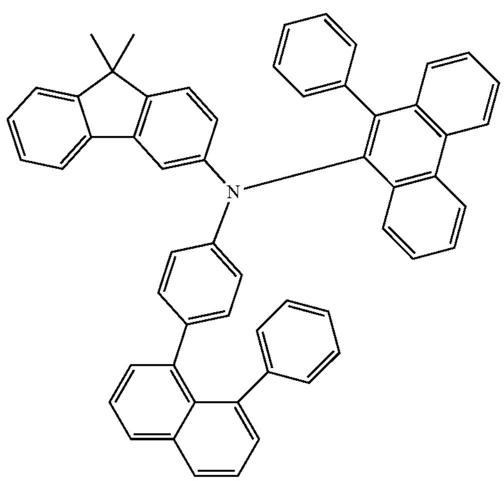
P23-1
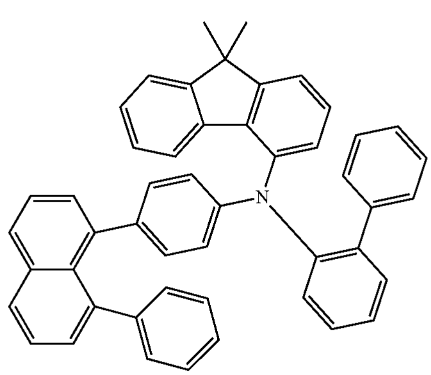
P23-2
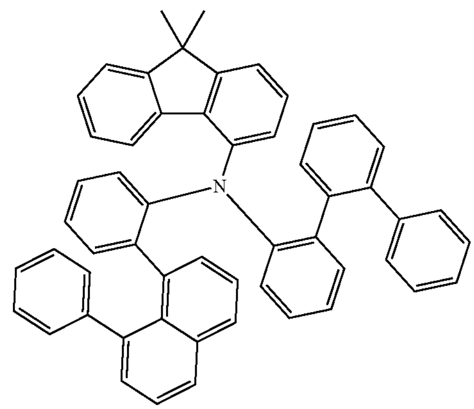
P23-3
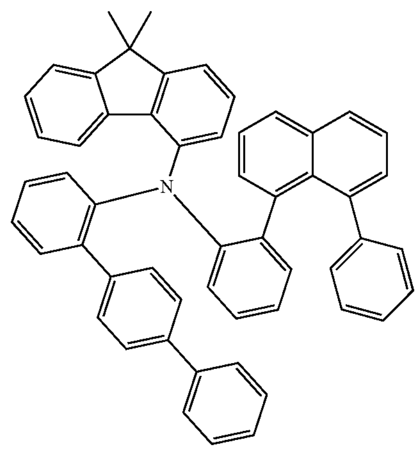
P23-4
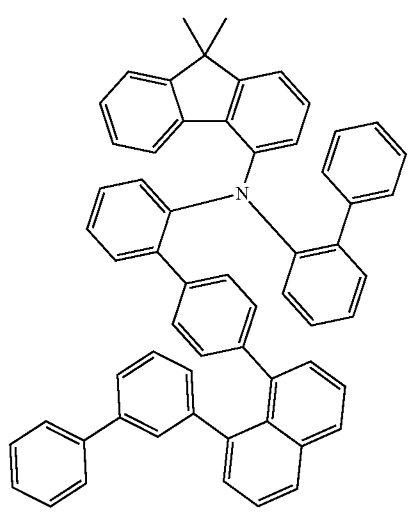

-continued
P23-5
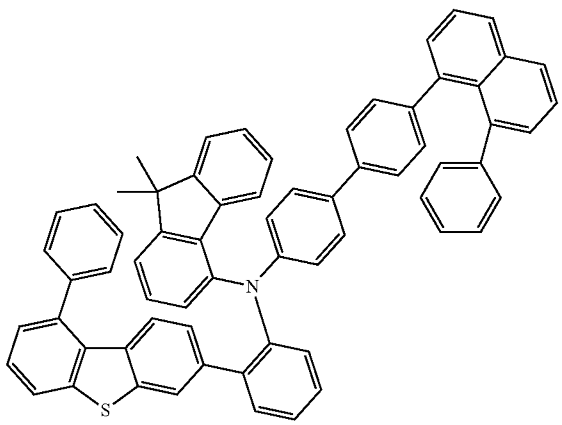
P23-6
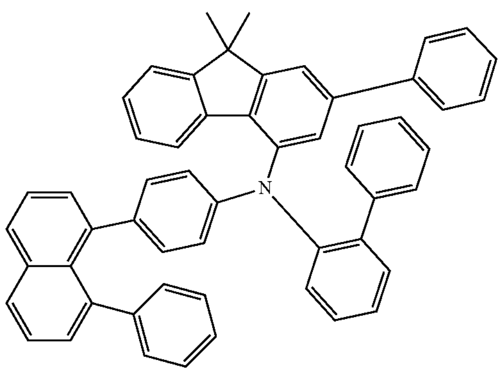
P23-7
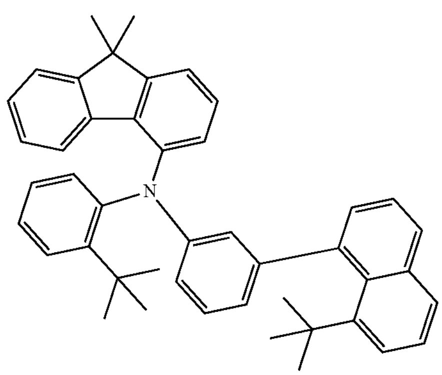
P23-8
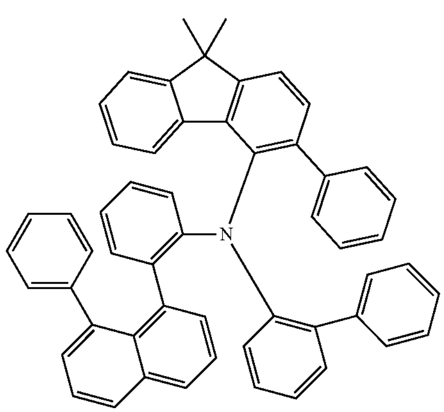
-continued
P23-9
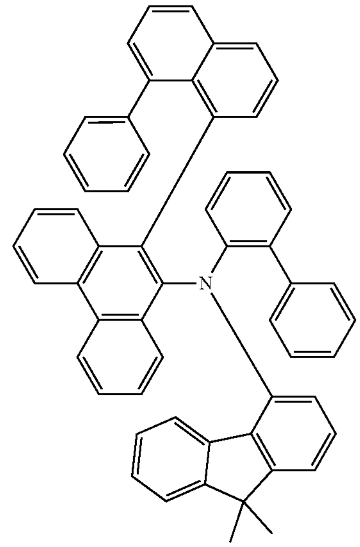
P23-10
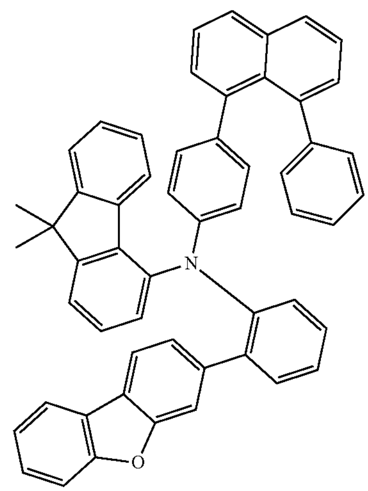
P23-11
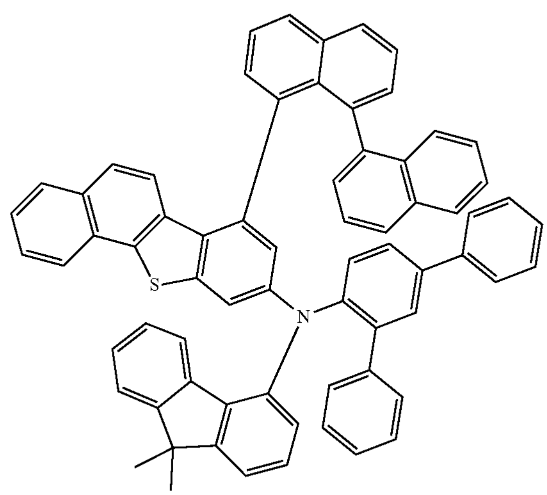

-continued
P23-12
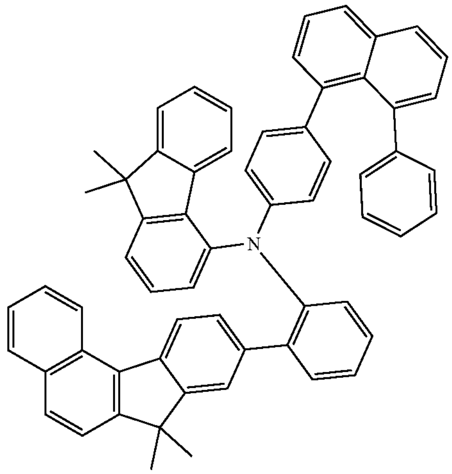
P23-13
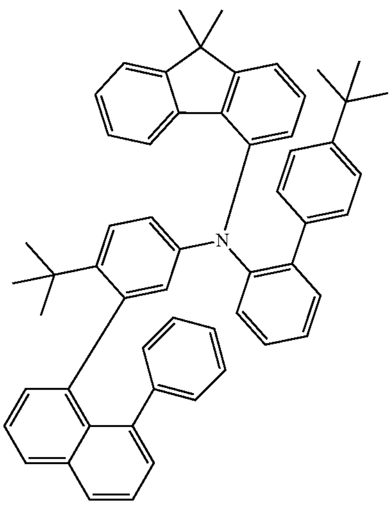
P23-14
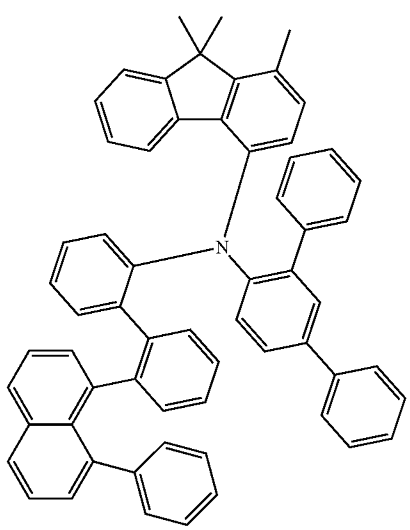
-continued
P23-15
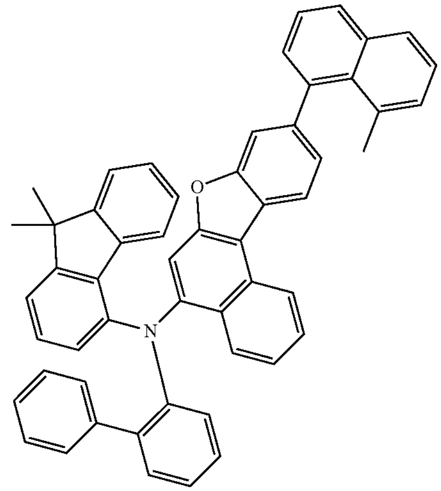
P23-16
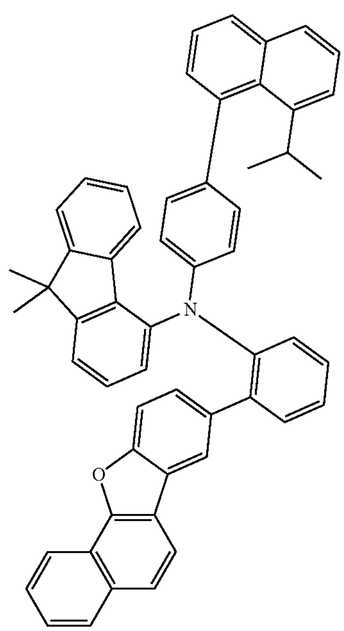

-continued
P23-17
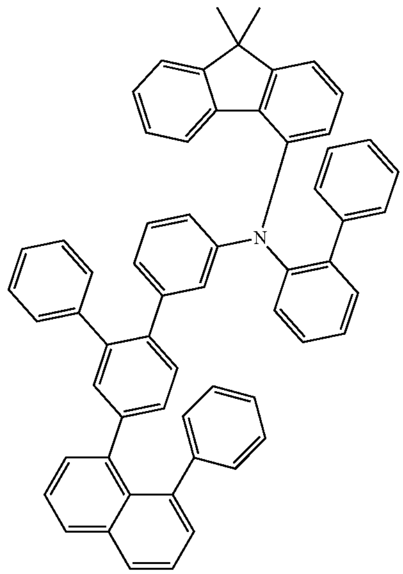
P23-18
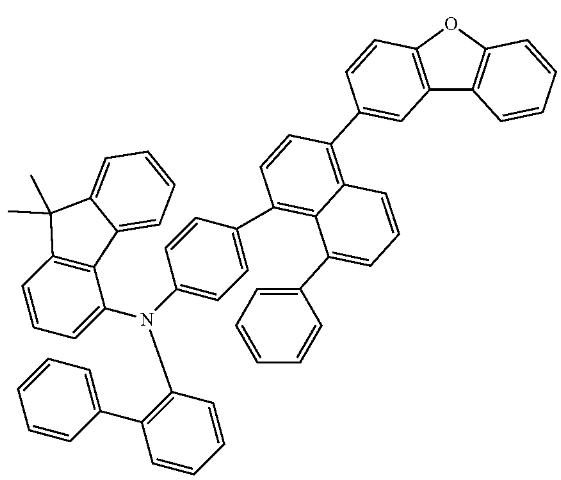
P23-19
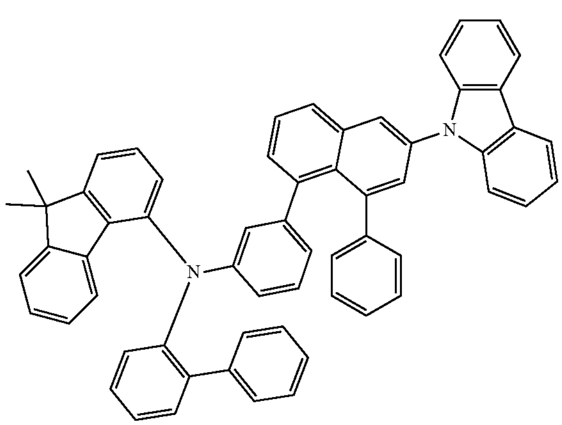
-continued
P23-20
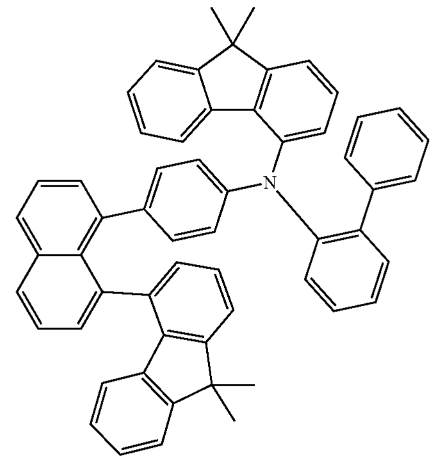
P23-21
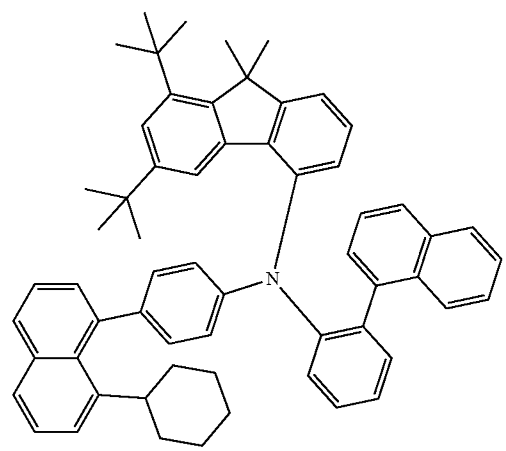
P23-22
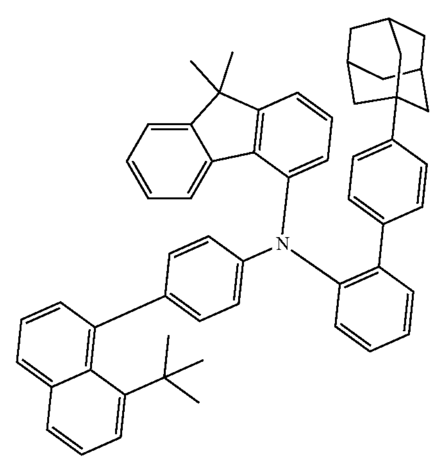

-continued
P23-23
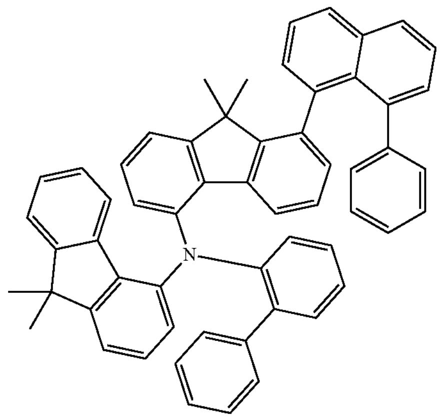
P23-24
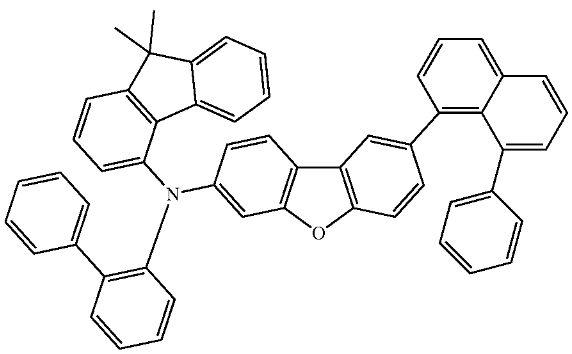
P23-25
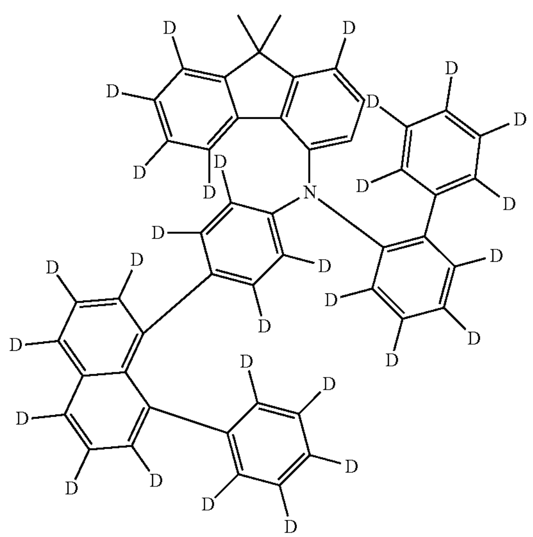
-continued
P23-26
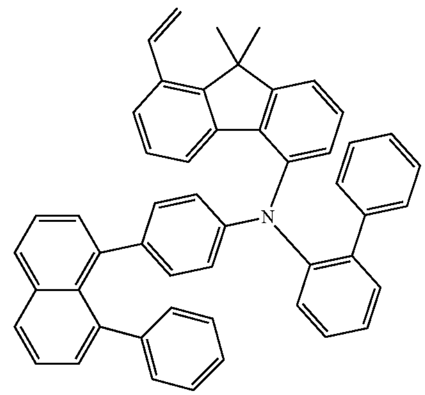
P23-27
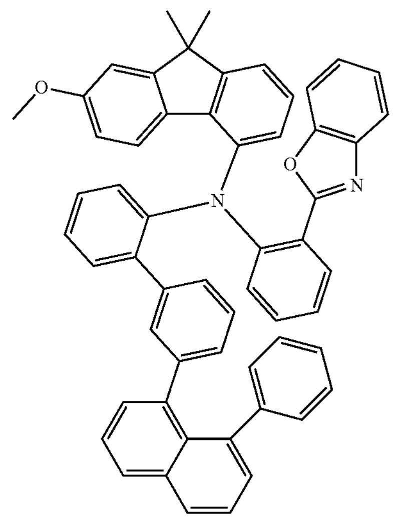
P23-28
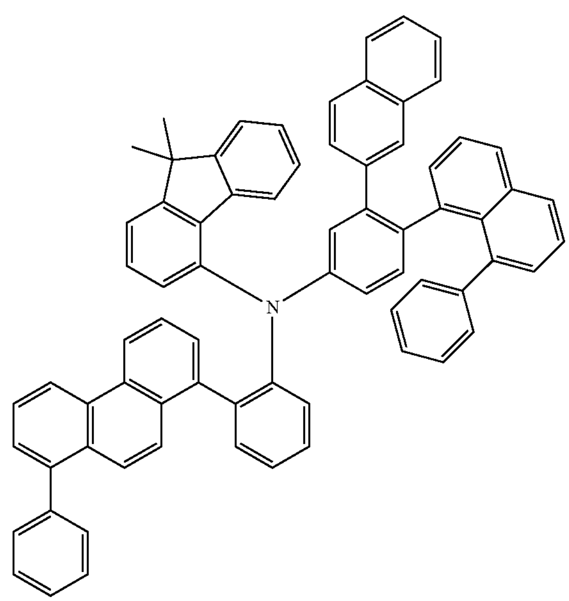

-continued
P23-29
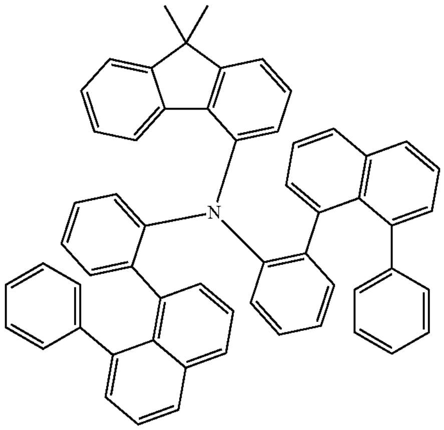
P23-30
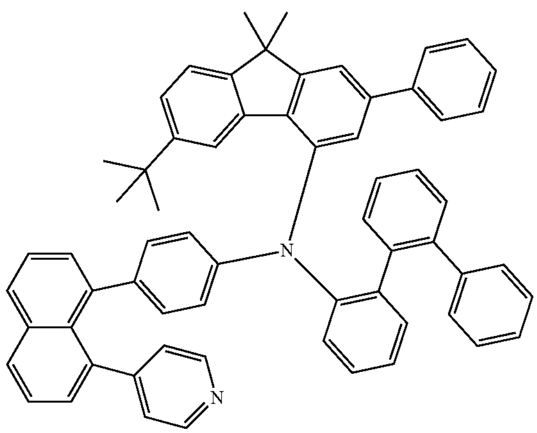
P23-31
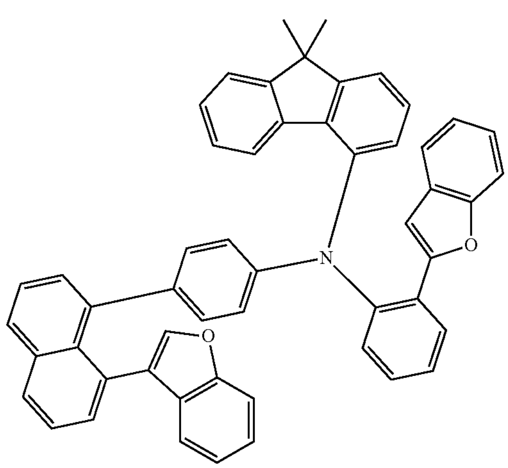
-continued
P23-32
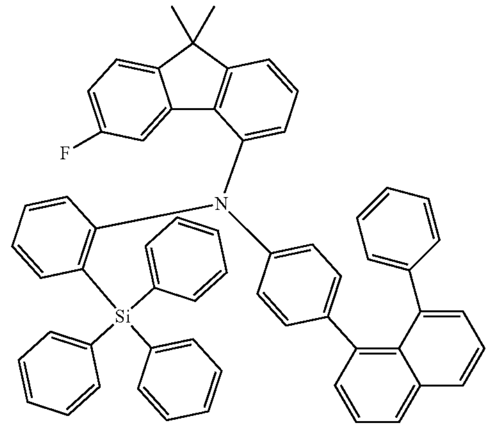
P23-33
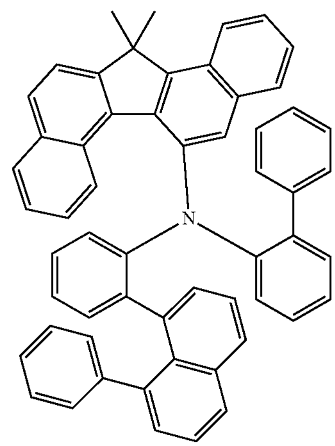
P23-34
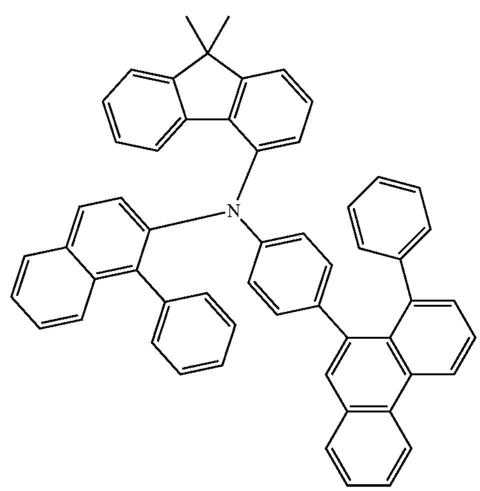

-continued

P23-35

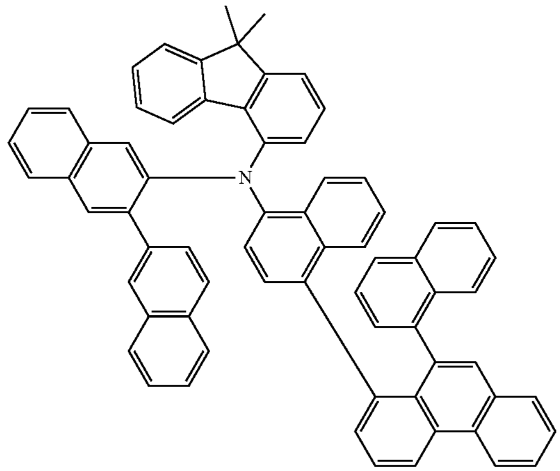

P23-36

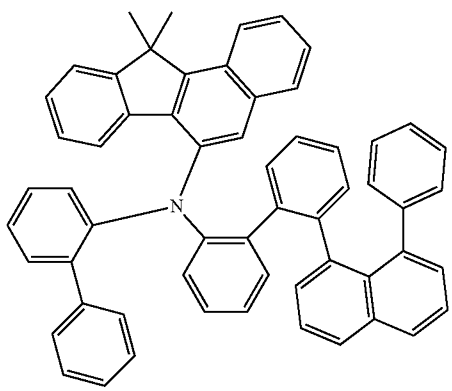

When the first hole transport layer 1411*a* includes the above-described first compound and the first hole transport layer 1411*a* meets the above-described thickness and doping conditions, an organic electronic device having superior efficiency or increased lifespan may be provided.

The second hole transport layer or the second auxiliary emission layer may include the second compound represented by Formula 20.

When the second hole transport layer or the second auxiliary emission layer includes the above-described second compound and the second hole transport layer meets the above-described thickness and doping conditions, an organic electronic device having superior efficiency or increased lifespan may be provided.

The third hole transport layer or the third auxiliary emission layer may include the third compound represented by Formula 20. In another example, each of the third hole transport layer and the third auxiliary emission layer may include the third compound represented by Formula 1.

When the third hole transport layer or the third auxiliary emission layer includes the third compound and the third hole transport layer meets the above-described thickness and doping conditions, an organic electronic device having superior efficiency or increased lifespan may be provided.

Regarding the second compound, and the third compound, what has been described above for the first compound may equally be applied, unless clearly stated otherwise.

In some embodiments of the present disclosure, the organic material layer 130 includes the first stack 141, the second stack 142, and the third stack 143. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* may include the first compound represented by Formula 20, the thickness of the first hole transport layer 1411*a* may be from 250 Å to 700 Å, and 10% to 50% of the thickness of the first hole transport layer 1411*a* may be doped with the first doping material.

In some embodiments of the present disclosure, the organic material layer 130 may include the first stack 141, the second stack 142, and the third stack 143. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* may include the first compound represented by Formula 20, the thickness of the first hole transport layer 1411*a* may be from 250 Å to 700 Å, and 10% to 50% of the thickness of the first hole transport layer 1411*a* may be doped with the first doping material.

In these embodiments, the second stack 142 may include a second hole transport region 1421, a second emission layer 1422, and a second electron transport region 1423. In these embodiments, the second hole transport region 1421 may include a second hole transport layer 1421*a* and a second auxiliary emission layer 1421*b*, the second hole transport layer 1421*a* or the second auxiliary emission layer 1421*b* may include the second compound represented by Formula 1, the thickness of the second hole transport layer 1421*a* may be from 250 Å to 700 Å, and 10% to 50% of the thickness of the second hole transport layer 1421*a* may be doped with the second doping material.

In these embodiments, the third stack 143 may include a third hole transport region 1431, a third emission layer 1432, and a third electron transport region 1433. In these embodiments, the third hole transport region 1431 may include a third hole transport layer 1431*a* and a third auxiliary emission layer 1431*b*, the third hole transport layer 1431*a* may include the third compound represented by Formula 20, the thickness of the third hole transport layer 1431*a* may be from 250 Å to 700 Å, and 10% to 50% of the thickness of the third hole transport layer 1431*a* may be doped with the third doping material.

In these embodiments, the thickness of the first hole transport layer 1411*a* may be from 400 Å to 500 Å, the thickness of the second hole transport layer 1421*a* may be from 500 Å to 650 Å, and the thickness of the third hole transport layer 1431*a* may be from 450 Å to 560 Å. For example, when the first electrode 110, the first stack 141, the second stack 142, the third stack 143, and the second electrode 120 are sequentially stacked, each of the first emission layer 1412, the second emission layer 1422, the first hole transport layer 1411*a*, the second hole transport layer 1421*a*, and the third hole transport layer 1431*a* meet the above-described thickness ranges, the third emission layer 1432 includes a blue host and a blue dopant, and the first hole transport layer 1411*a* or the first auxiliary emission layer 1411*b* includes the first compound, the second hole transport layer 1421*a* includes the second compound, and the third hole transport layer 1431*a* or the third auxiliary emission layer 1431*b* includes the third compound, an organic electronic device having superior efficiency or increased lifespan may be provided.

In these embodiments, the first hole transport layer 1411*a* may include the first doping material-doped layer 1411*aa* doped with the first doping material and the first doping material undoped layer 1411*ab* not doped with the first doping material. The first doping material-doped layer 1411*aa* may include the first compound and 5 to 15 parts by weight of the first doping material with respect to 100 parts by weight of the first compound. The second hole transport layer may include a second doping material-doped layer doped with a second doping material and a second doping material undoped layer not doped with the second doping material. The second doping material-doped layer may include the second compound and 5 to 15 parts by weight of the second doping material with respect to 100 parts by weight of the second compound. The third hole transport layer may include a third doping material-doped layer doped with the third doping material and a third doping material undoped layer not doped with the third doping material. The third doping material-doped layer may include the third compound and 5 to 15 parts by weight of the third doping material with respect to 100 parts by weight of the third compound.

In these embodiments, the first compound, the second compound, and the third compound may be the same compounds.

The first doping material-doped layer 1411*aa* and the first doping material undoped layer 1411*ab* may include the fourth compound represented by the following Formula 1.

[Formula 1]

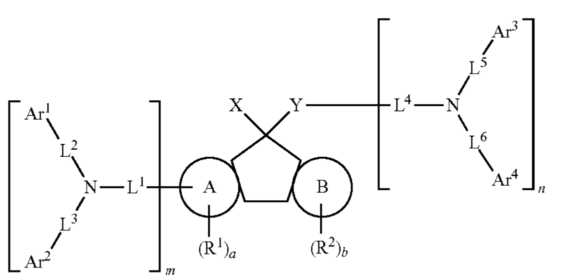

Hereinafter, Formula 1 will be described.

Each of m and n is independently 0 or 1, where m+n is 1.

Each of $Ar^1$ and $Ar^2$ is selected from the group consisting of a $C_6$-$C_{60}$ aryl group; a fluorenyl group; a $C_2$-$C_{60}$ heterocyclic group including at least one heteroatom of O, N, S, Si, or P; or a fused ring group of a $C_3$-$C_{60}$ aliphatic ring and a $C_6$-$C_{60}$ aromatic ring.

Each of $Ar^1$ and $Ar^2$ may be selected from the group consisting of a $C_6$-$C_{60}$ aryl group; a fluorenyl group; or a $C_2$-$C_{60}$ heterocyclic group including at least one heteroatom of O, N, S, Si, or P.

When one of $Ar^1$ and $Ar^2$ is an aryl group, one of $Ar^1$ and $Ar^2$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $Ar^1$ and $Ar^2$ is a heterocyclic group, one of $Ar^1$ and $Ar^2$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

Each of $Ar^3$ and $Ar^4$ is independently selected from the group consisting of a $C_6$-$C_{60}$ aryl group; a fluorenyl group; a $C_2$-$C_{60}$ heterocyclic group including at least one heteroatom of O, N, S, Si, or P; or a fused ring group of a $C_3$-$C_{60}$ aliphatic ring and a $C_6$-$C_{60}$ aromatic ring.

Each of $Ar^3$ and $Ar^4$ may independently be a $C_6$-$C_{60}$ aryl group.

When one of $Ar^3$ and $Ar^4$ is an aryl group, one of $Ar^3$ and $Ar^4$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

Each of $L^1$ to $L^6$ is independently selected from the group consisting of a single bond; a $C_6$-$C_{60}$ arylene group; a fluorenylene group; $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

Each of $L^1$ to $L^6$ may be independently selected from the group consisting of a single bond; a $C_6$-$C_{60}$ arylene group; or $C_2$-$C_{60}$ heterocyclic group including at least one hetero atom of O, N, S, Si, or P.

When one of $L^1$ to $L^6$ is an arylene group, one of $L^1$ to $L^6$ which is an arylene group may be, for example, a $C_6$-$C_{60}$ arylene group, a $C_6$-$C_{40}$ arylene group, a $C_6$-$C_{25}$ arylene group, or a $C_6$-$C_{10}$ arylene group.

When one of $L^1$ to $L^6$ is a heterocyclic group, one of $L^1$ to $L^6$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

X may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; $C_1$-$C_{30}$ alkyl group; $C_2$-$C_{20}$ alkenyl group; or $C_2$-$C_{20}$ alkynyl group.

X may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; or $C_1$-$C_{30}$ alkyl group.

When X is an aryl group, X which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When X is a heterocyclic group, X which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

Y is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; $C_1$-$C_{30}$ alkyl group; $C_2$-$C_{20}$ alkenyl group; or $C_2$-$C_{20}$ alkynyl group when n is 0, and is selected from the group consisting of a $C_6$-$C_{60}$ arylene group; a fluorenylene group; $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring when n is 1.

When n is 0, Y may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; or $C_1$-$C_{30}$ alkyl group.

When n is 1, Y may be selected from the group consisting of a $C_6$-$C_{60}$ arylene group; a fluorenylene group; or $C_2$-$C_{60}$ heterocyclic group including at least one hetero atom of O, N, S, Si, or P.

When Y is an aryl group, Y which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When Y is an arylene group which is an arylene group may be, for example, a $C_6$-$C_{60}$ arylene group, a $C_6$-$C_{40}$ arylene group, a $C_6$-$C_{25}$ arylene group, or a $C_6$-$C_{10}$ arylene group.

When Y is a heterocyclic group, Y which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, a $C_2$-$C_{10}$ heterocyclic group including at least one hetero atom of O, N, S, Si, or P.

X and Y may be bonded to form a spiro compound.

Each of ring A and ring B is independently a $C_6$-$C_{10}$ aryl group.

Each of $R^1$ and $R^2$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

Each of $R^1$ and $R^2$ may be independently selected from the group consisting of deuterium; a $C_6$-$C_{30}$ aryl group; a fluorenyl group; or a $C_2$-$C_{30}$ heterocyclic group including at least one hetero atom of O, N, S, Si, or P.

When one of $R^1$ and $R^2$ is an aryl group, one of $R^1$ and $R^2$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^1$ and $R^2$ is a heterocyclic group, one of $R^1$ and $R^2$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

a is an integer from 0 to 7, and b is an integer from 0 to 8.

In Formula 1, each of an aryl group, a fluorenyl group, a heterocyclic group, a fused ring group, an alkyl group, an alkenyl group, an alkynyl group, an alkoxyl group, an aryloxy group, an arylene group, and a fluorenylene group may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group.

Each of the further substituted substituents may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group. These substituents may be bonded to form a ring.

The first compound may be represented by one of the following Formula 2 to Formula 5.

[Formula 2]

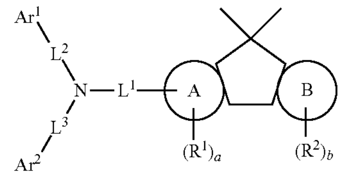

[Formula 3]

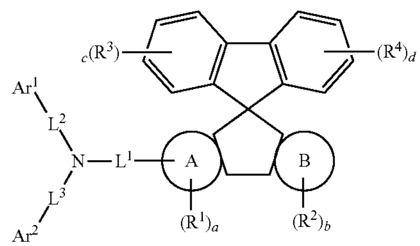

[Formula 4]

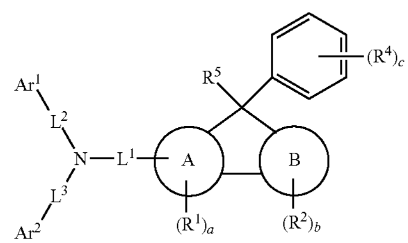

[Formula 5]

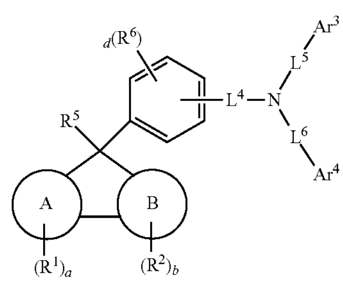

Hereinafter, Formula 2 to Formula 5 will be described.

Each of c and d is independently an integer from 0 to 4, and e is an integer from 0 to 5.

i) Each of $R^3$, $R^4$, and $R^6$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. Alternatively, ii) a plurality of $R^3$s, a plurality of $R^4$s, and a plurality of $R^6$s may be bonded to form rings, respectively.

Each of $R^3$, $R^4$, and $R^6$ may be independently selected from the group consisting of deuterium; a $C_6$-$C_{30}$ aryl group; or a $C_2$-$C_{30}$ heterocyclic group including at least one heteroatom of O, N, S, Si, or P.

$R^5$ may be selected from the group consisting of hydrogen; deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

$R^5$ may be selected from the group consisting of hydrogen; deuterium; a $C_6$-$C_{30}$ aryl group; or a $C_2$-$C_{30}$ heterocyclic group including at least one heteroatom of O, N, S, Si, or P.

When one of $R^3$, $R^4$, and $R^6$ is an aryl group, one of $R^3$, $R^4$, and $R^6$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^3$, $R^4$, and $R^6$ is a heterocyclic group, one of $R^3$, $R^4$, and $R^6$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

$Ar^1$ to $Ar^4$, $L^1$ to $L^6$, $R^1$, $R^2$, a, and b are the same as $Ar^1$ to $Ar^4$, $L^1$ to $L^6$, $R^1$, $R^2$, a, and b defined in the description of Formula 1.

The first compound may be represented by one of the following Formula 6 to Formula 9.

[Formula 6]

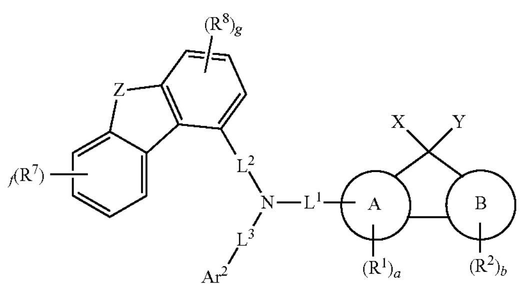

[Formula 7]

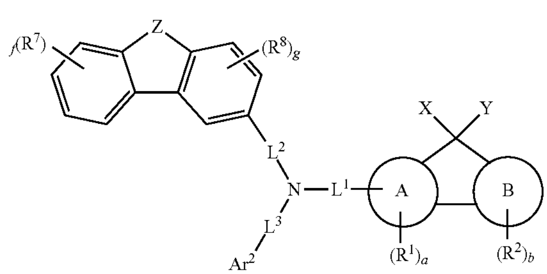

[Formula 8]

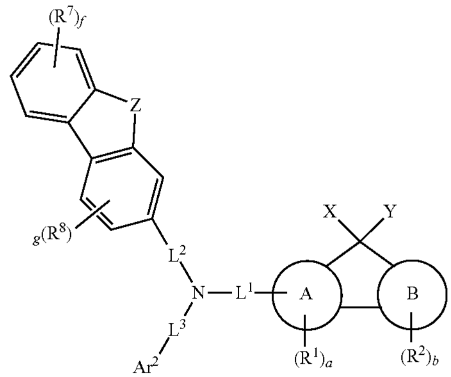

[Formula 9]

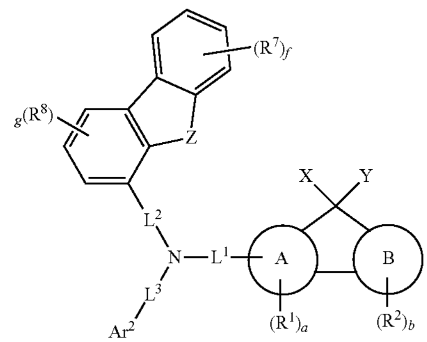

Hereinafter, Formula 6 to Formula 9 will be described.

Z is O, S, NR', or CR' R".

R' and R" may be respectively and independently selected from the group consisting of a $C_1$-$C_{30}$ alkyl group; a $C_6$-$C_{30}$ aryl group; or a $C_3$-$C_{30}$ heterocyclic group including at least one hetero atom of O, N, S, Si, or P, or bonded to form spiro compounds, respectively.

When one of R' and R" is an aryl group, one of R' and R" which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of R' and R" is a heterocyclic group, one of R' and R" which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, a $C_2$-$C_{10}$ heterocyclic group including at least one hetero atom of O, N, S, Si, or P.

i) Each of $R^7$ and $R^8$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. Alternatively, ii) a plurality of $R^7$s and a plurality of $R^8$s may be bonded to form rings, respectively.

i) Each of $R^7$ and $R^8$ may be independently selected from the group consisting of deuterium; a $C_6$-$C_{30}$ aryl group; a fluorenyl group; or a $C_2$-$C_{30}$ heterocyclic group including at least one heteroatom of O, N, S, Si, or P. and ii) a plurality of $R^7$s and a plurality of $R^8$s may be bonded to form rings, respectively.

When one of $R^7$ and $R^8$ is an aryl group, one of $R^7$ and $R^8$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^7$ and $R^8$ is a heterocyclic group, one of $R^7$ and $R^8$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

f is an integer from 0 to 4, and g is an integer from 0 to 3.

$Ar^2$, $L^1$ to $L^3$, ring A, ring B, X, Y, $R^1$, $R^2$, a, and b are the same as $Ar^2$, $L^1$ to $L^3$, ring A, ring B, X, Y, $R^1$, $R^2$, a, and b defined above in the description of Formula 1.

The first compound may be represented by one of the following Formula 10 to Formula 12.

[Formula 10]

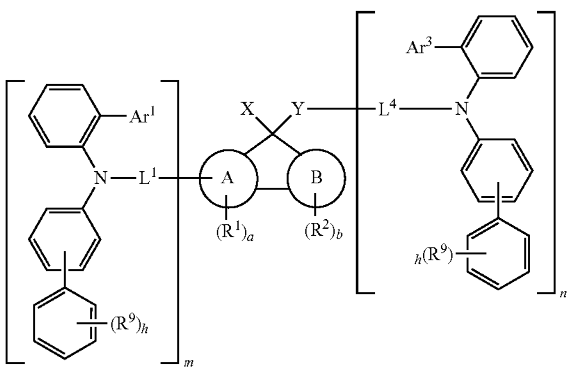

[Formula 11]

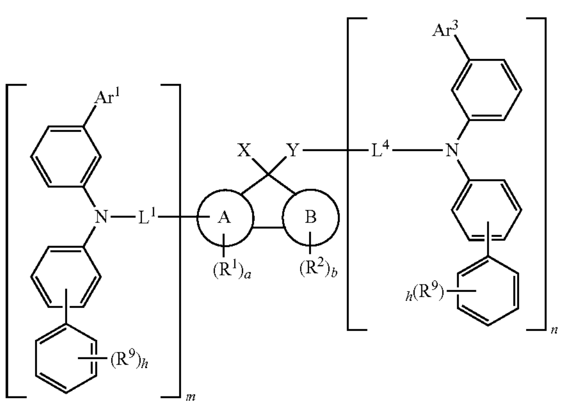

[Formula 12]

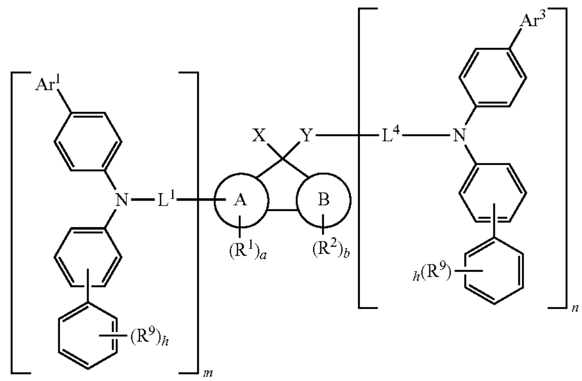

Hereinafter, Formula 10 to Formula 12 will be described.

i) $R^9$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and ii) a plurality of $R^9$s may be bonded to form a ring.

i) $R^9$ may be independently selected from the group consisting of deuterium; a halogen; a $C_6$-$C_{30}$ aryl group; a $C_2$-$C_{30}$ heterocyclic group including at least one heteroatom of O, N, S, Si, or P; or a $C_1$-$C_{30}$ alkyl group, and ii) a plurality of $R^{21}$s, a plurality of $R^{22}$s, a plurality of $R^{23}$s, a plurality of $R^9$s may be bonded to form a ring.

When $R^9$ is an aryl group, $R^9$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When $R^9$ is a heterocyclic group, $R^9$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

$Ar^1$, $Ar^3$, $L^1$, $L^4$, ring A, ring B, X, Y, $R^1$, $R^2$, a, and b are the same as $Ar^1$, $Ar^3$, $L^1$, $L^4$, ring A, ring B, X, Y, $R^1$, $R^2$, a, and b defined above in the description of Formula 1.

The fourth compound may be one of the following compounds
P1-1
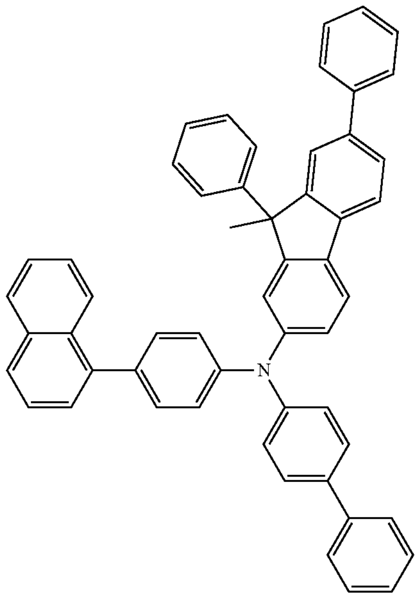
P1-2
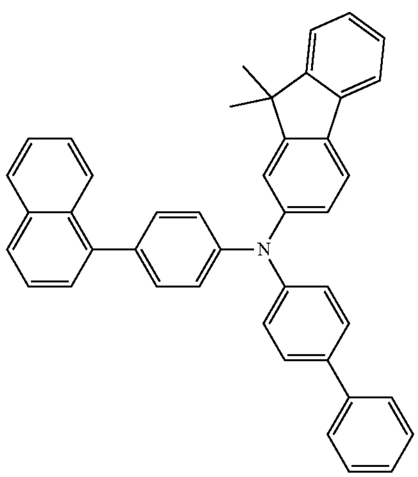
P1-3
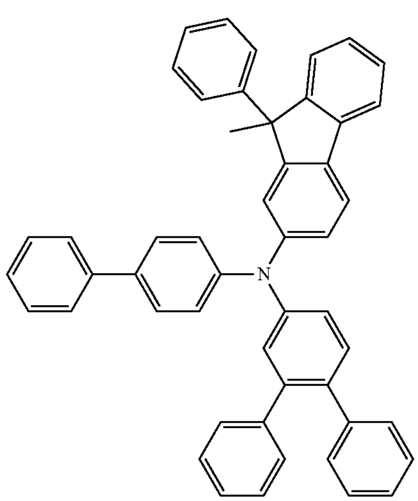
-continued
P1-4
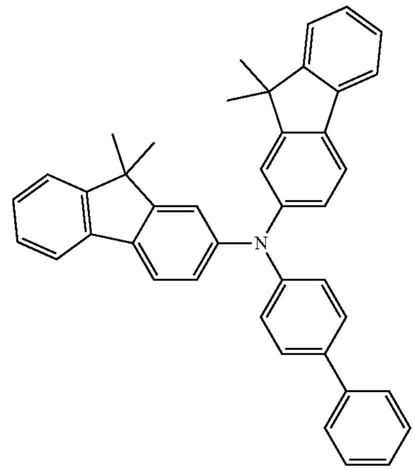
P1-5
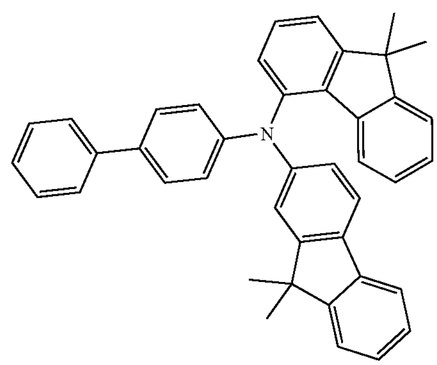
P1-6
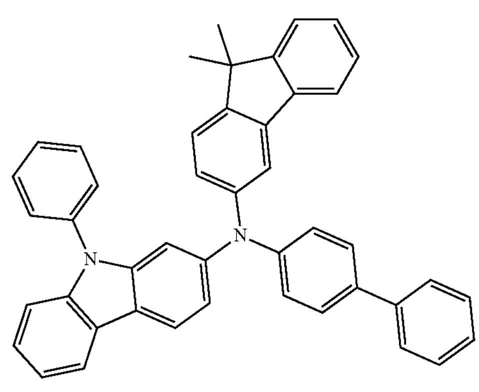

-continued
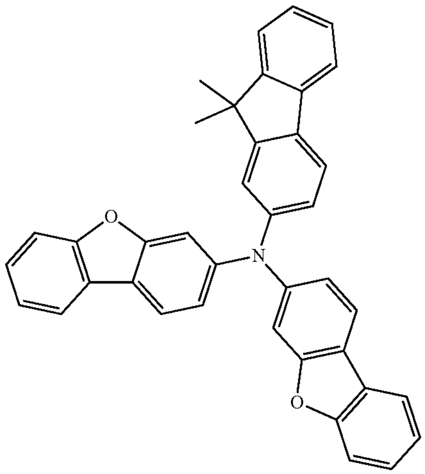
P1-7
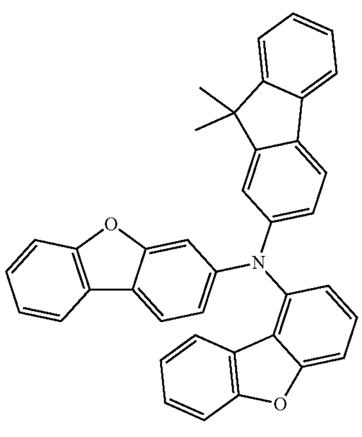
P1-8
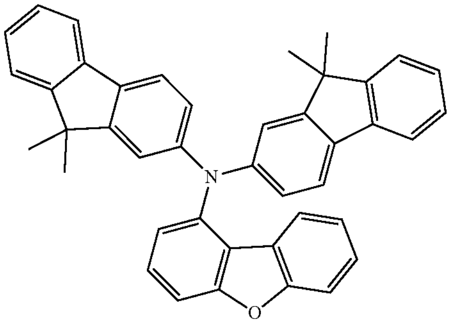
P1-9
-continued
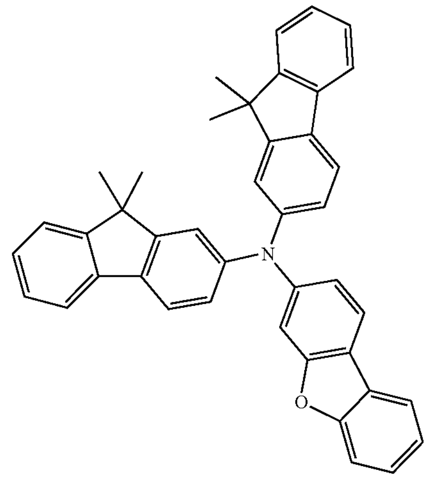
P1-10
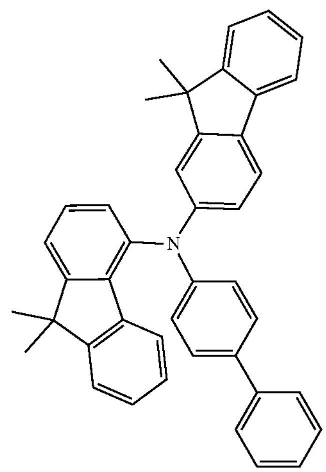
P1-11
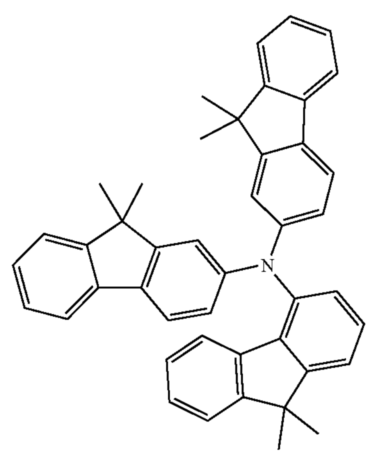
P1-12

-continued
P1-13
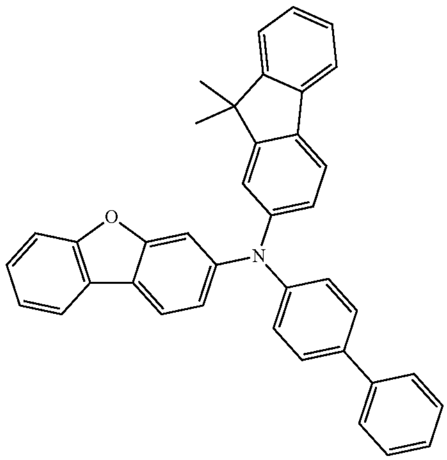
P1-14
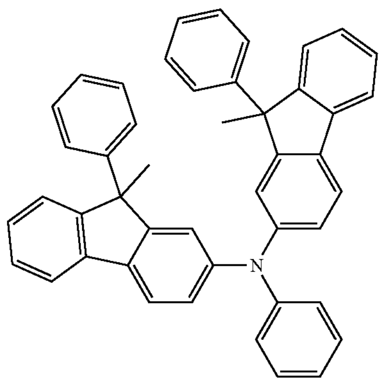
P1-15
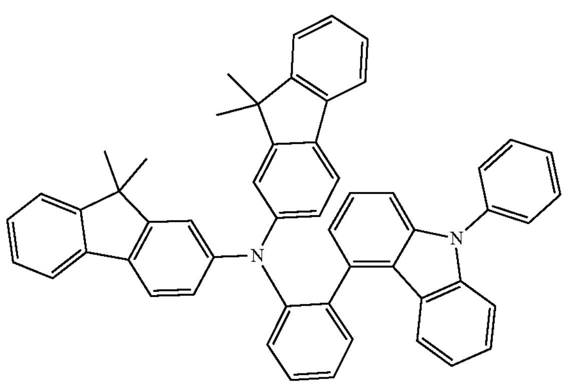
-continued
P1-16
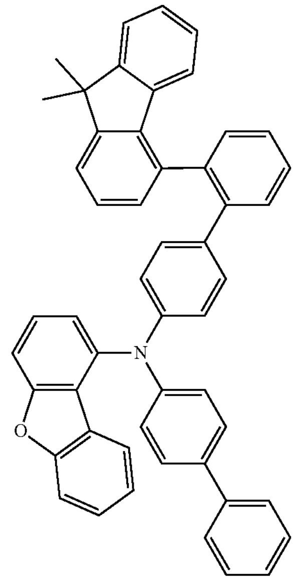
P1-17
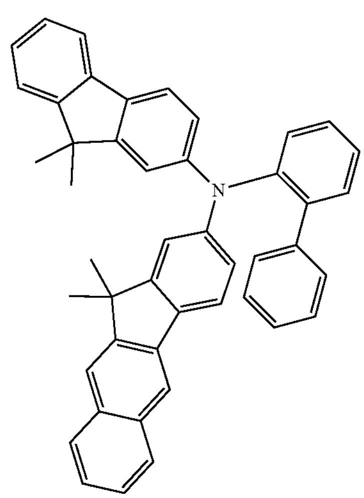

-continued
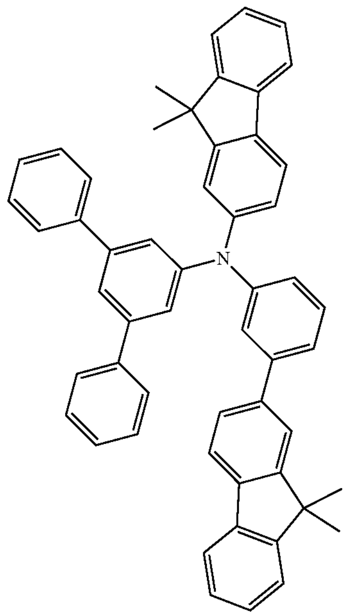
P1-18
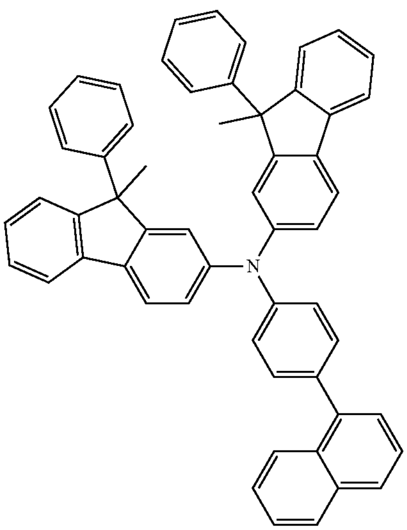
P1-19
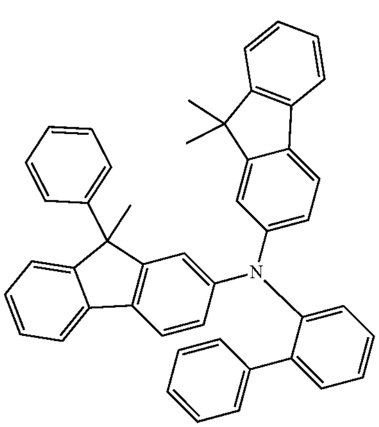
P1-20
-continued
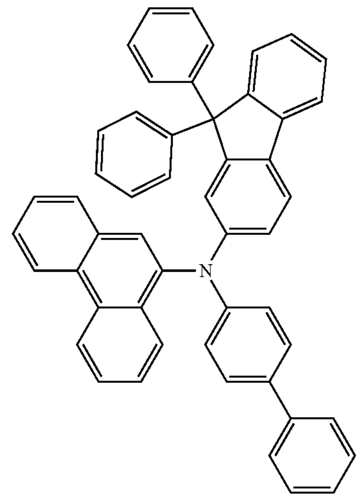
P2-1
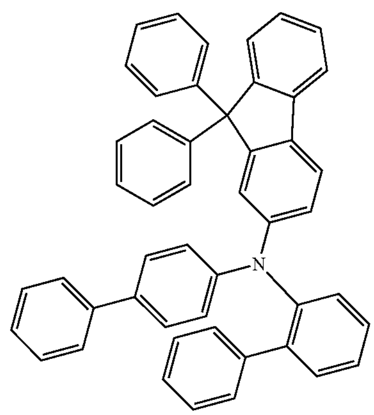
P2-2
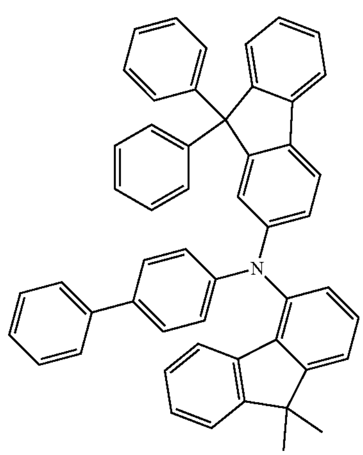
P2-3

P2-4
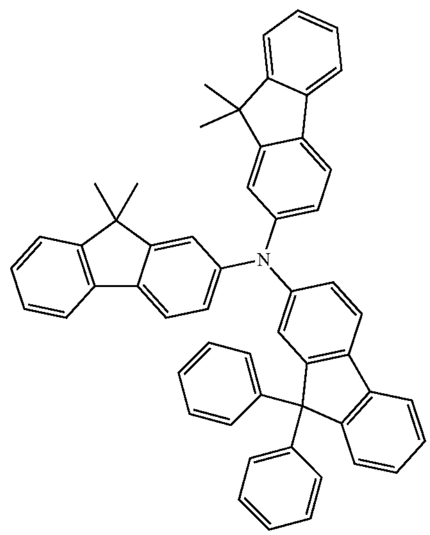
P2-5
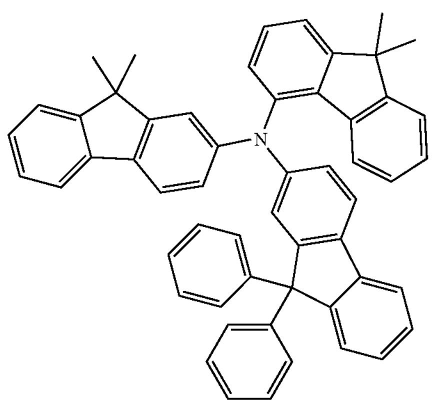
P2-6
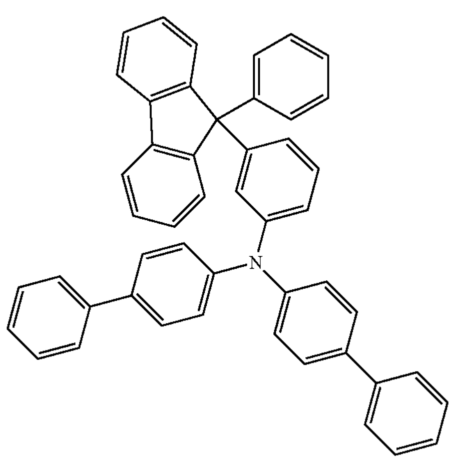
P2-7
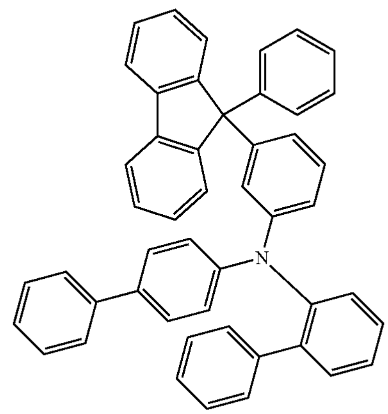
P2-8
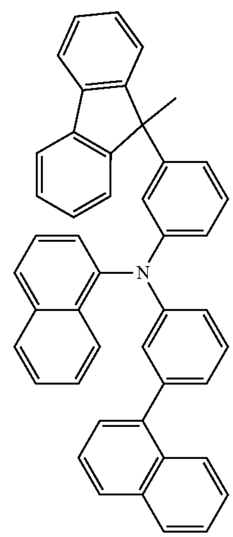
P2-9
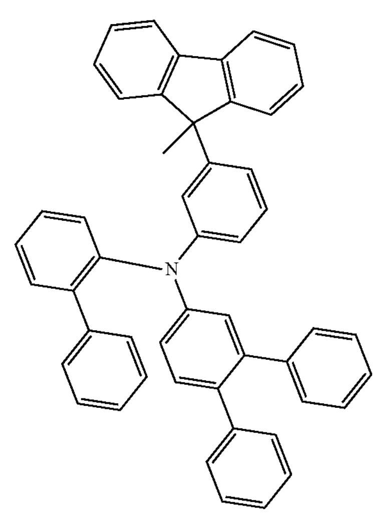

-continued
P2-10
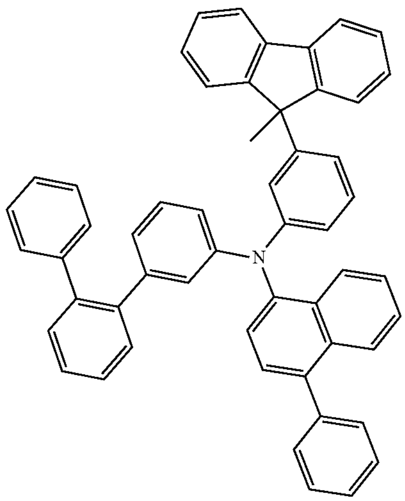
P2-11
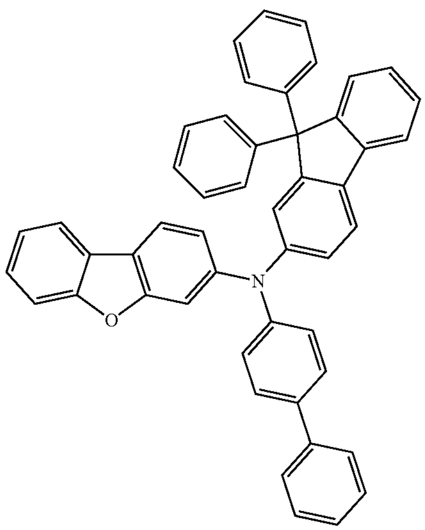
P2-12
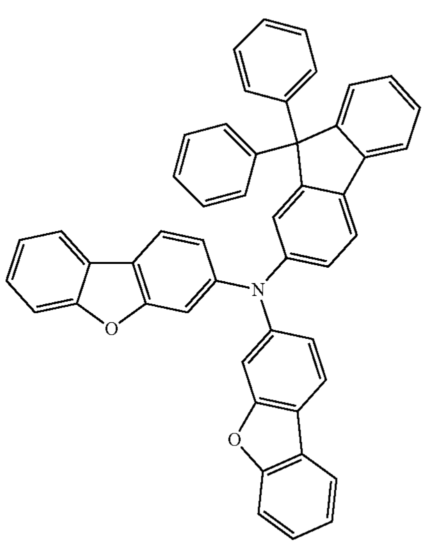
-continued
P2-13
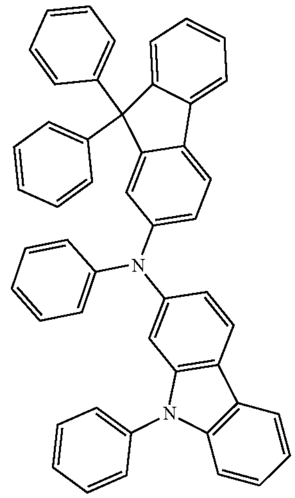
P2-14
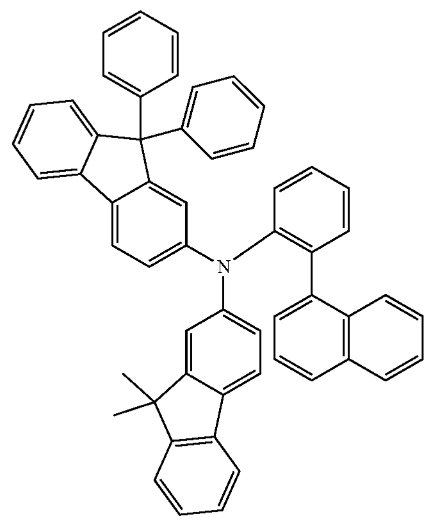
P2-15
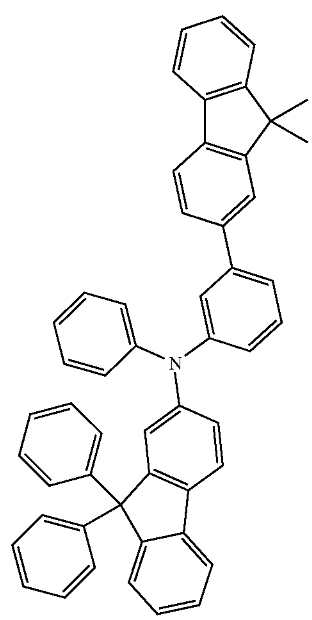

-continued
P2-16
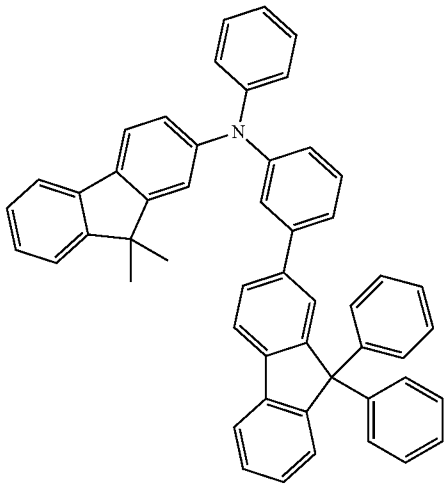
P2-17
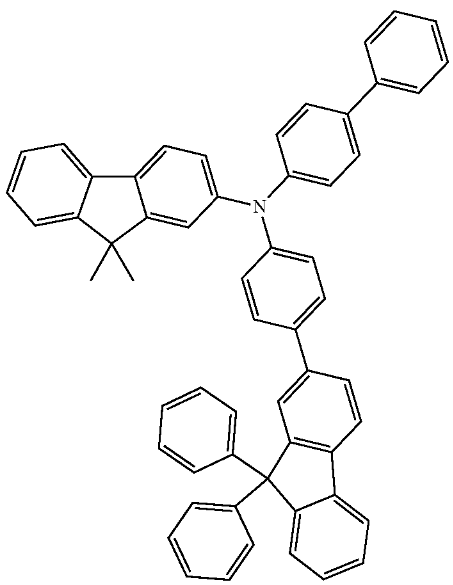
P2-18
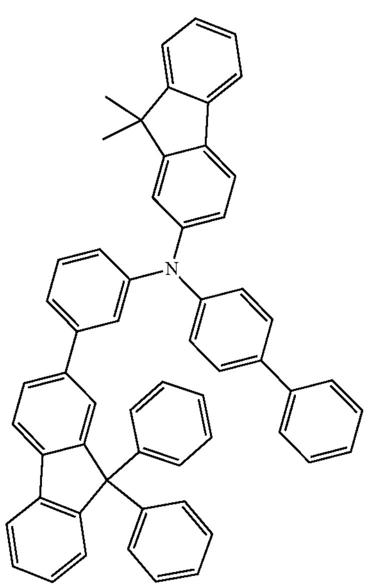
-continued
P-19
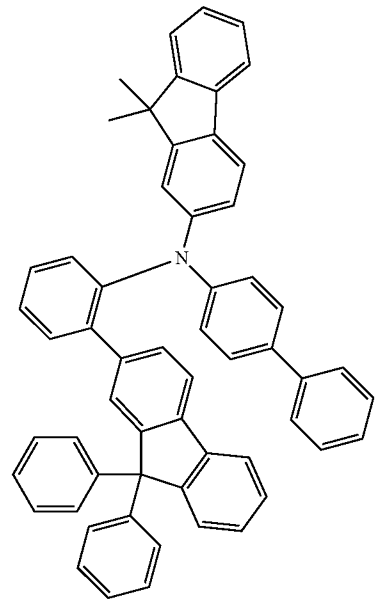
P2-20
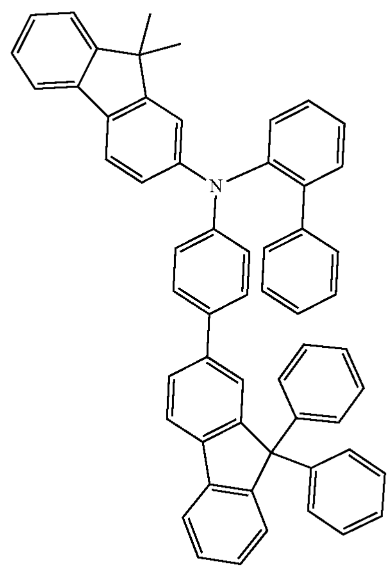
P2-21
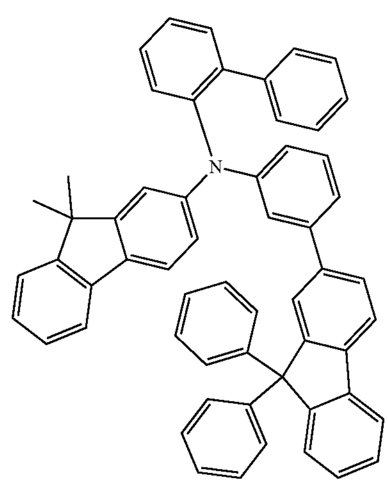

-continued
P2-22
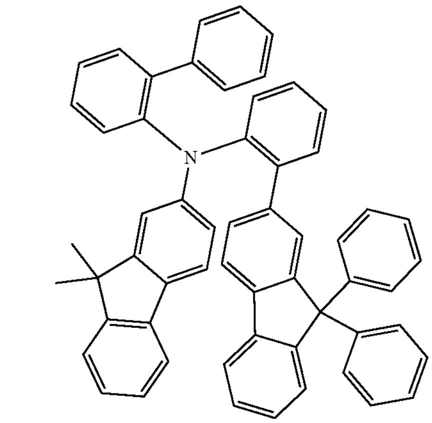
P2-23
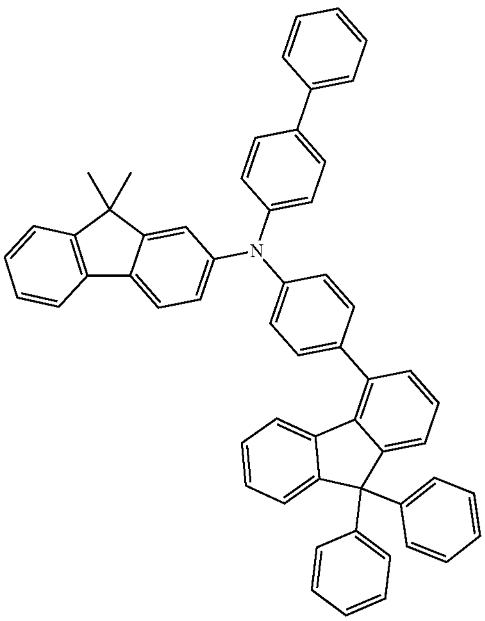
P2-24
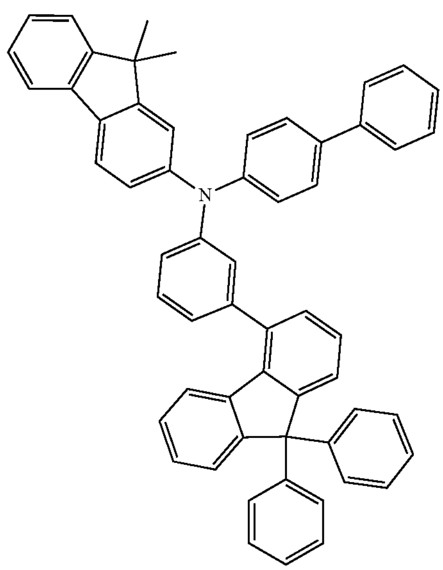
-continued
P2-25
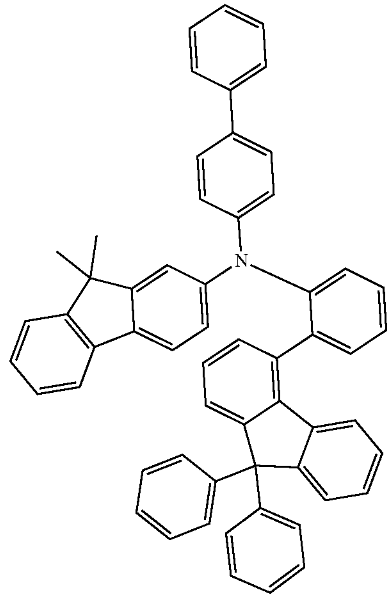
P2-26
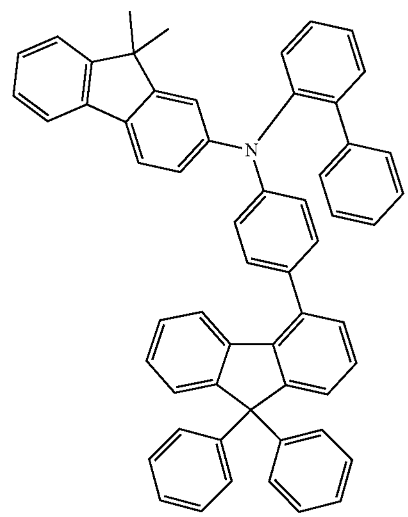
P2-27
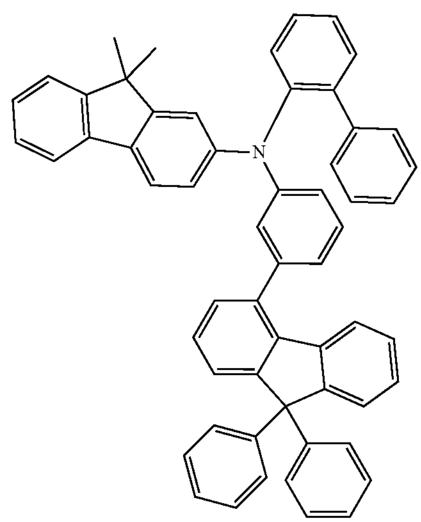

P2-28
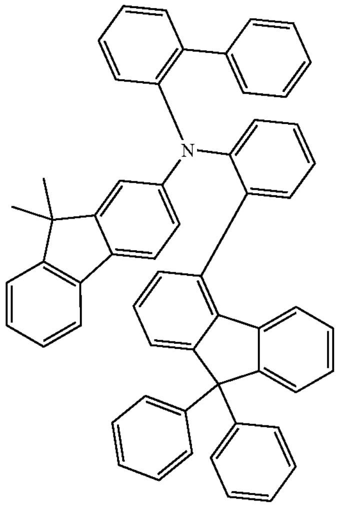
P2-30
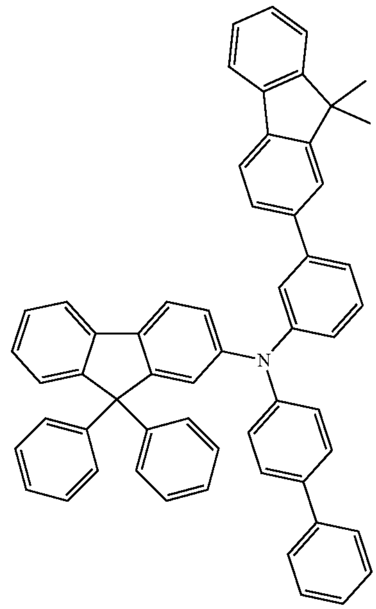
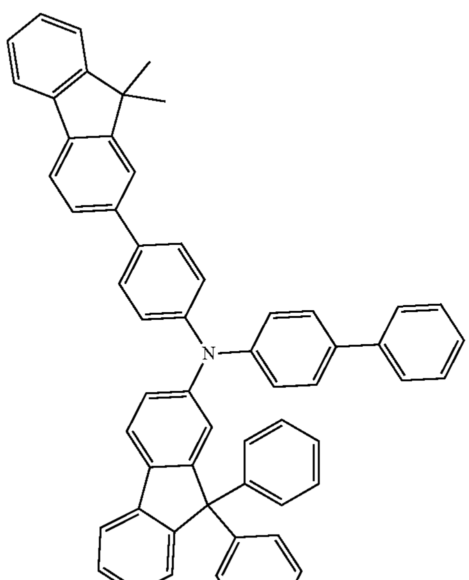
P2-31
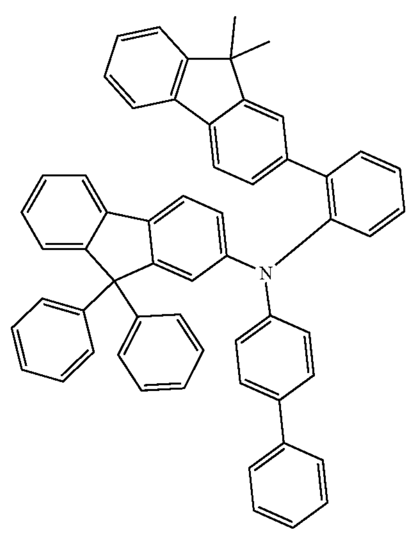

-continued
P2-32
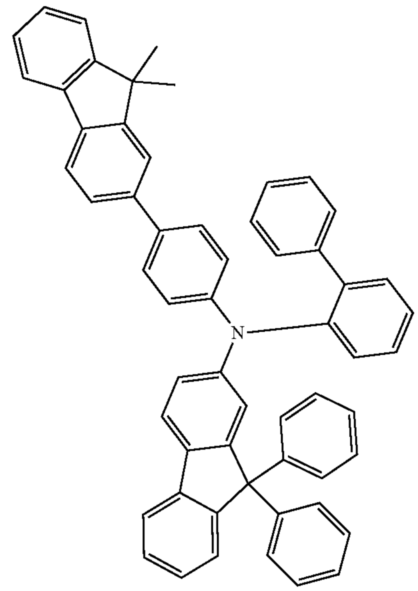
P2-33
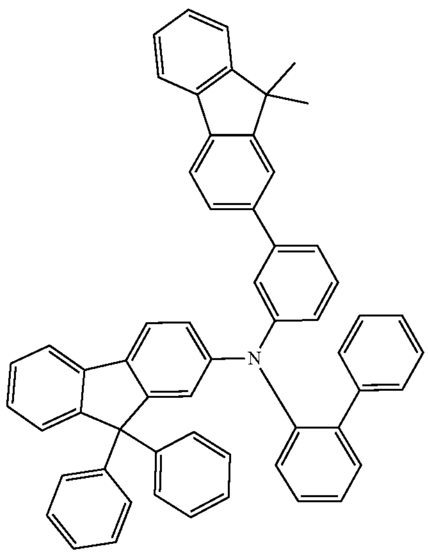
P2-34
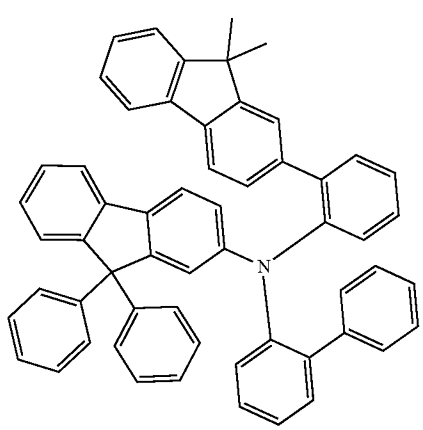
-continued
P2-35
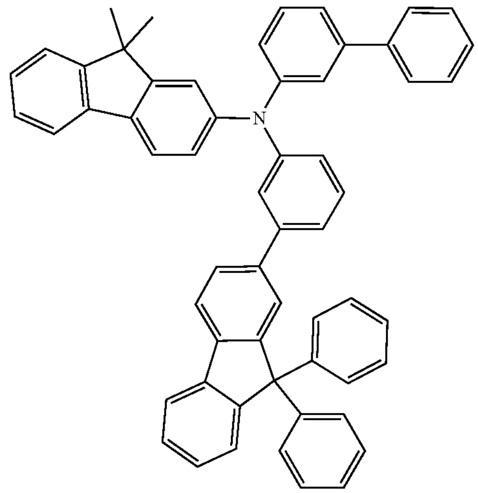
P2-36
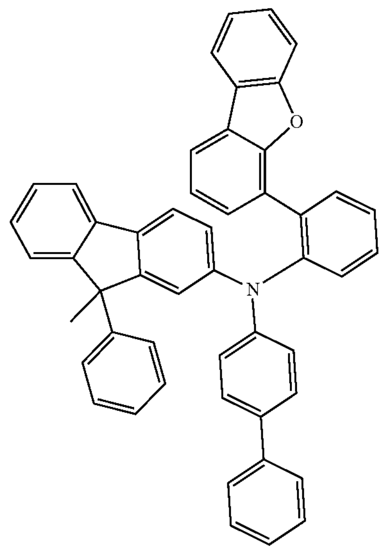
P2-37
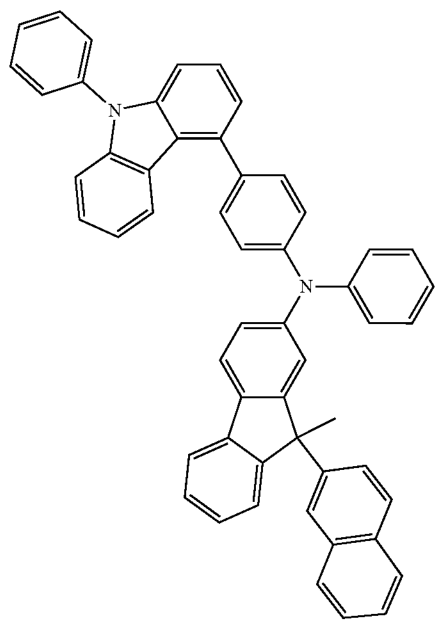

-continued
P2-38
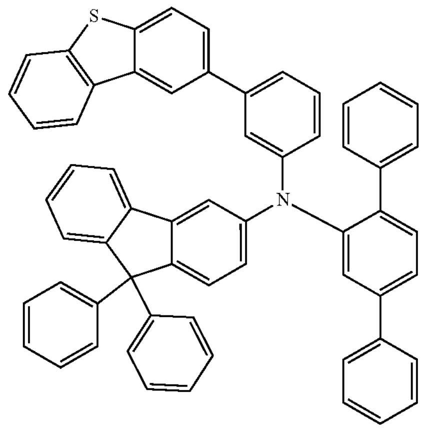
P2-39
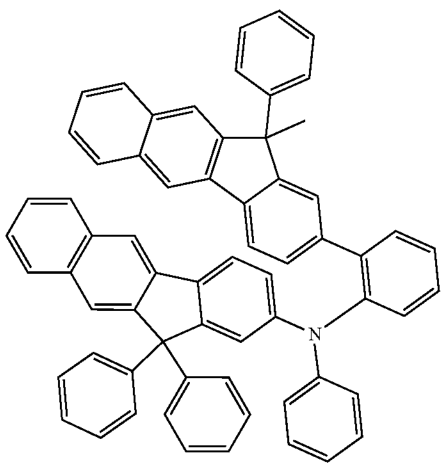
P2-40
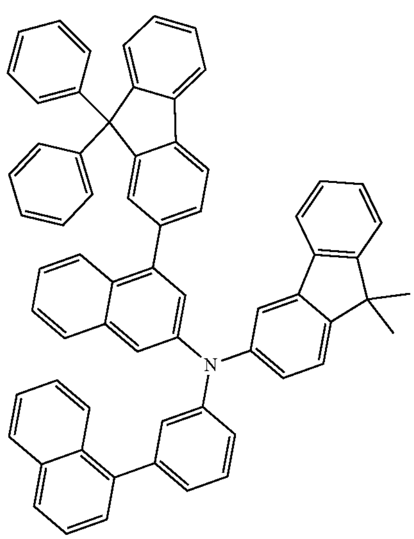
-continued
P3-1
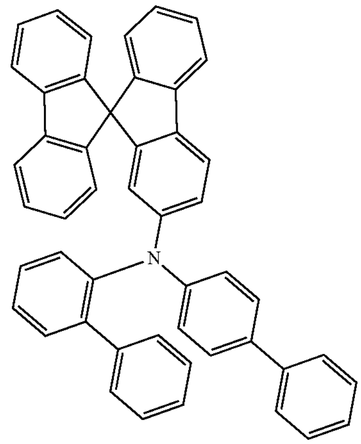
P3-2
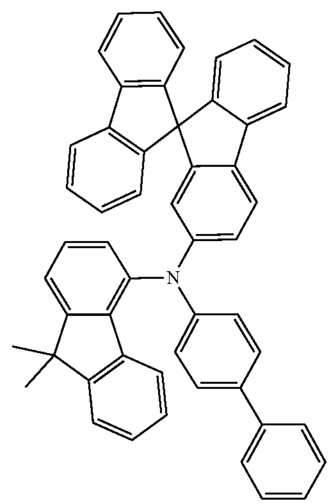
P3-3
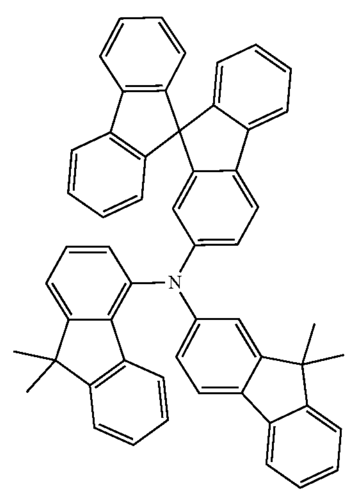

-continued
P3-4
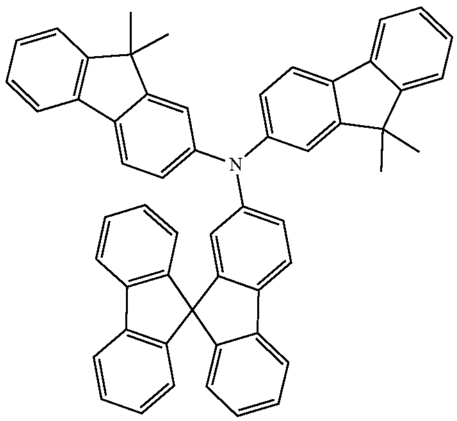
P3-5
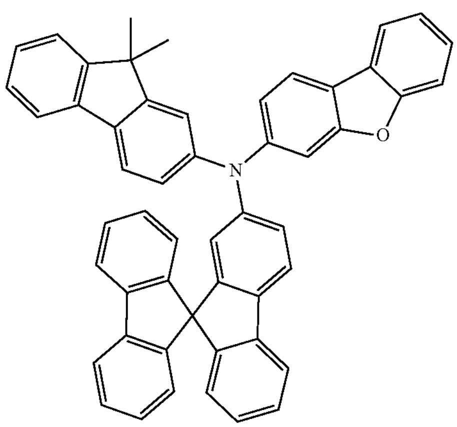
P3-6
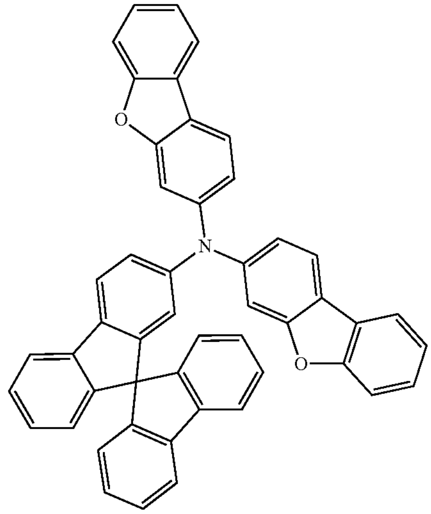
-continued
P3-7
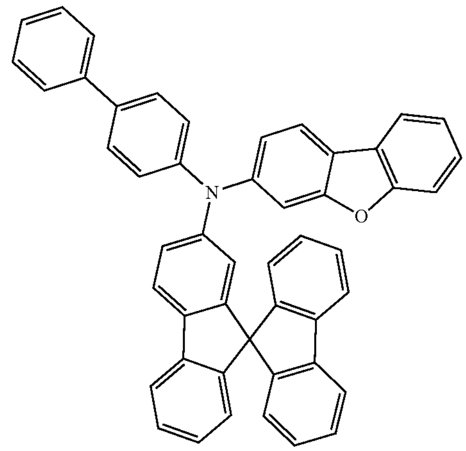
P3-8
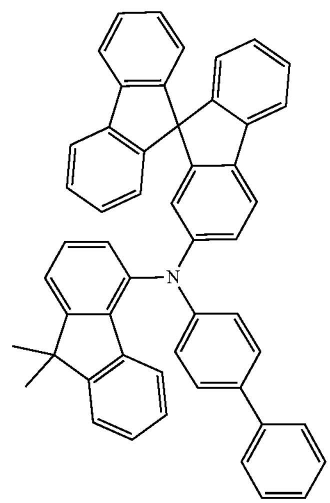
P3-9
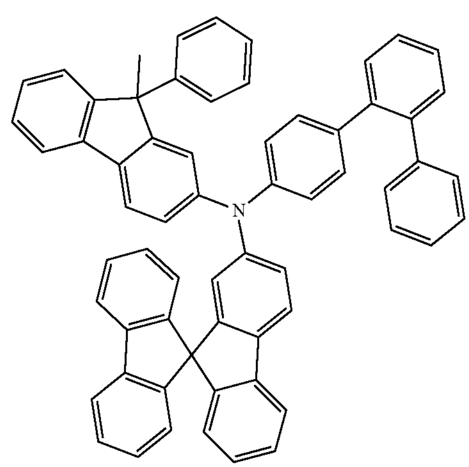

-continued
P3-10
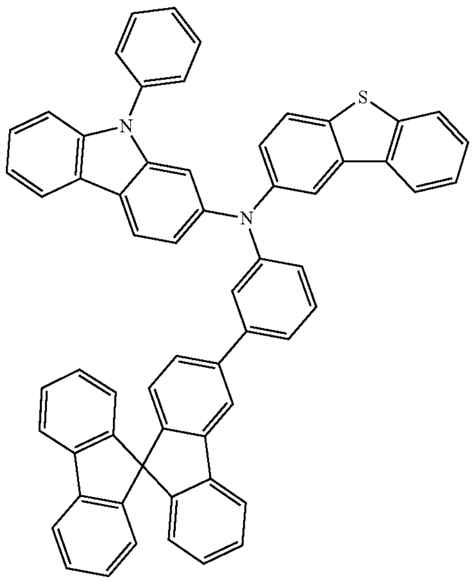
P3-11
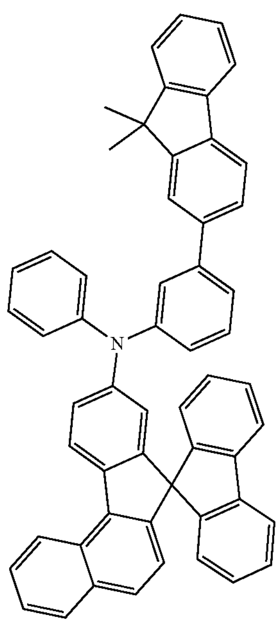
-continued
P3-12
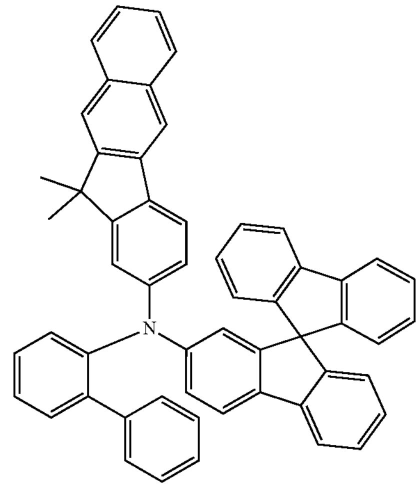
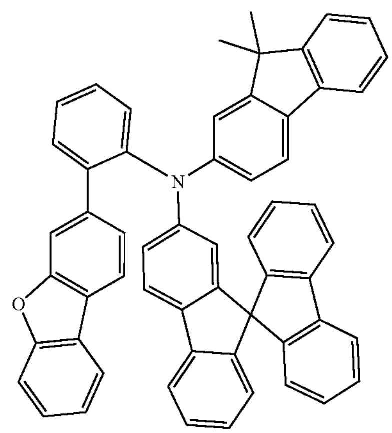
P3-14
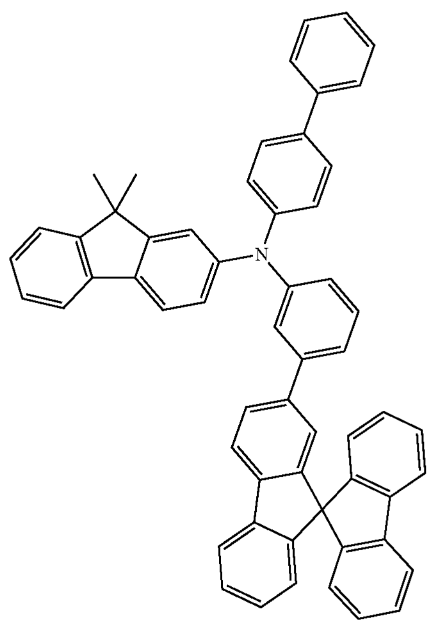

-continued
P3-15
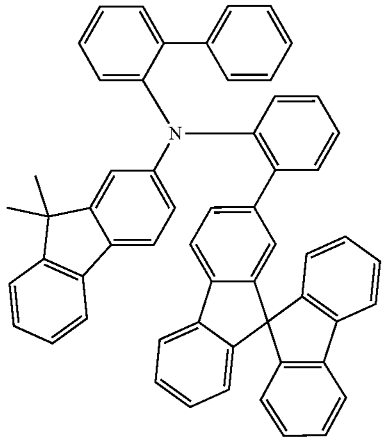
P3-16
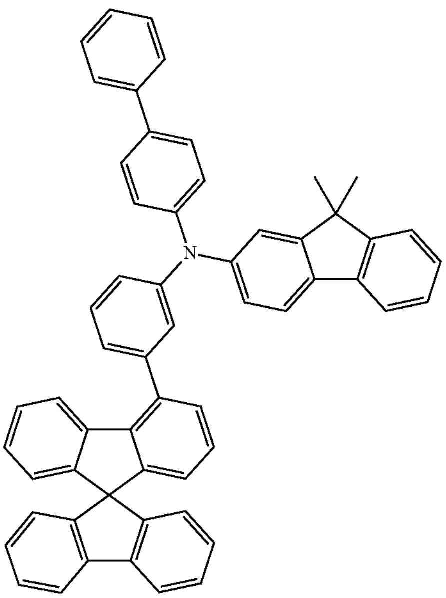
P3-17
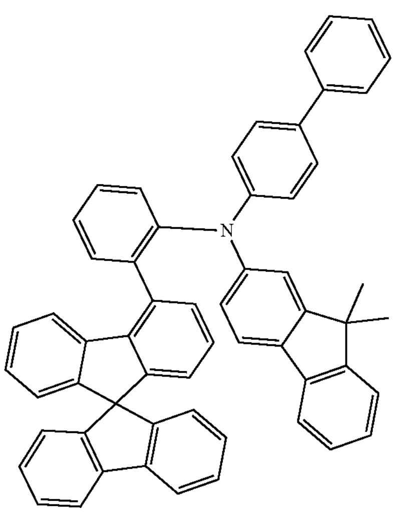
-continued
P3-18
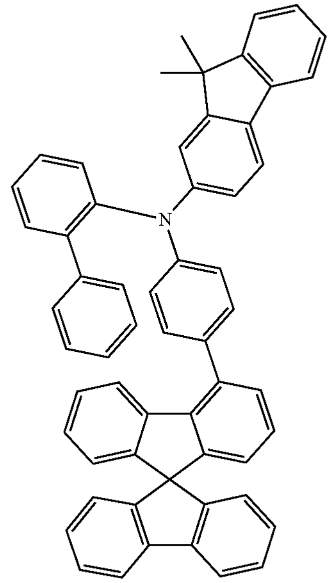
P3-19
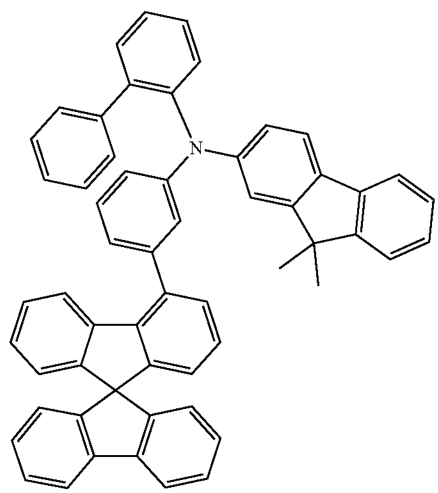
P3-20
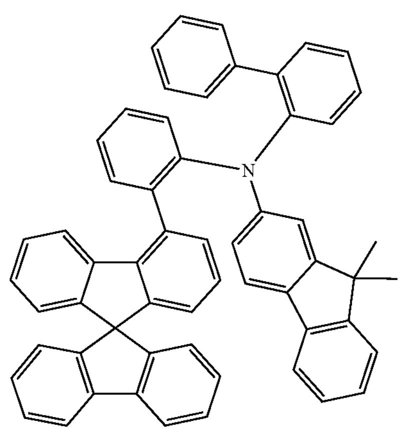

-continued
P3-21
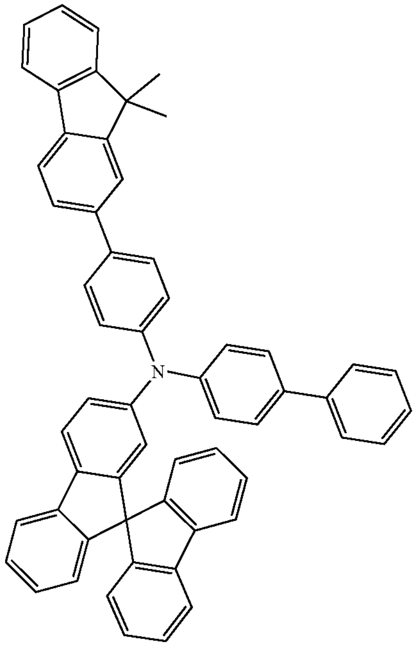
P3-22
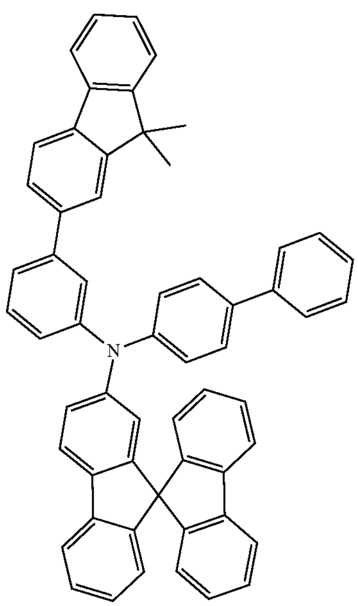
-continued
P3-23
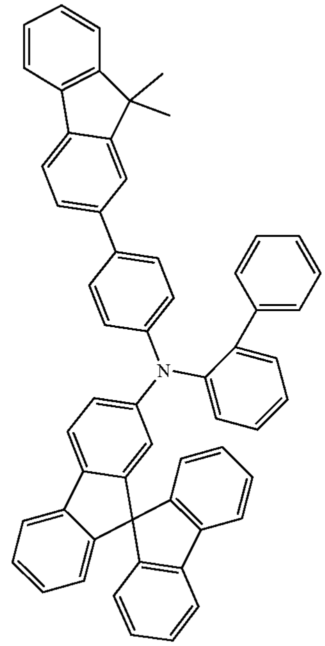
P3-24
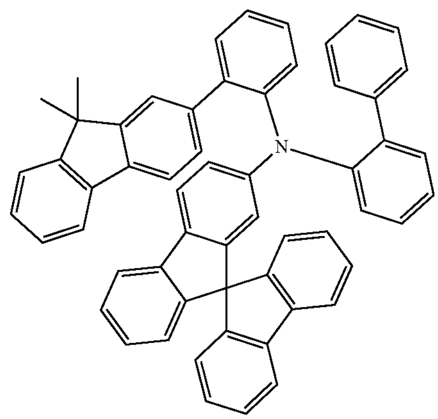
P3-25
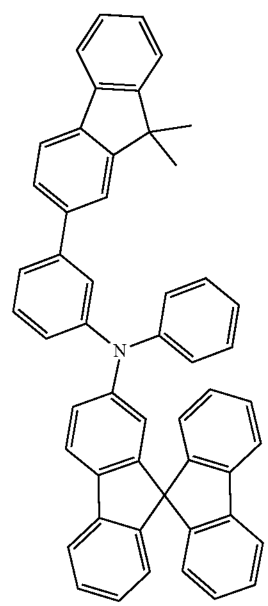

-continued
P3-26
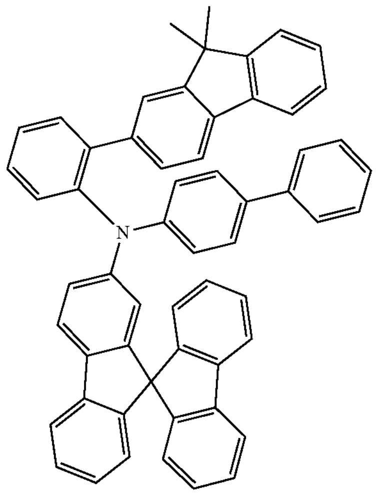
P3-27
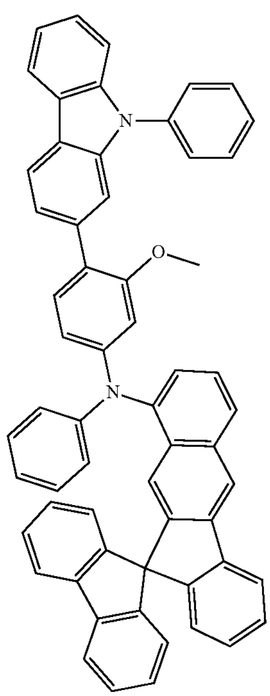
-continued
P3-28
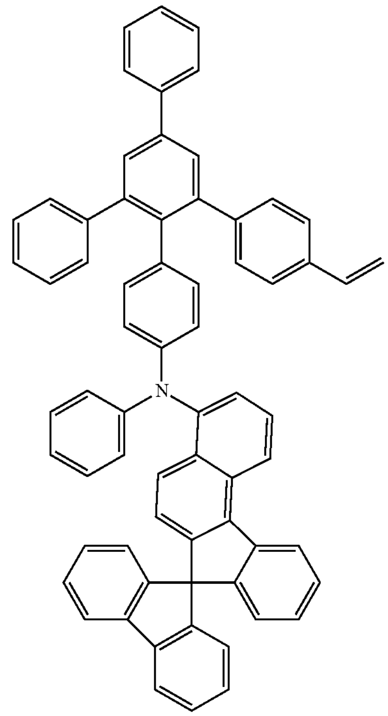
P3-29
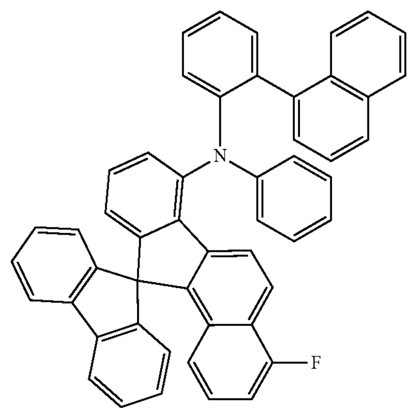
P3-30
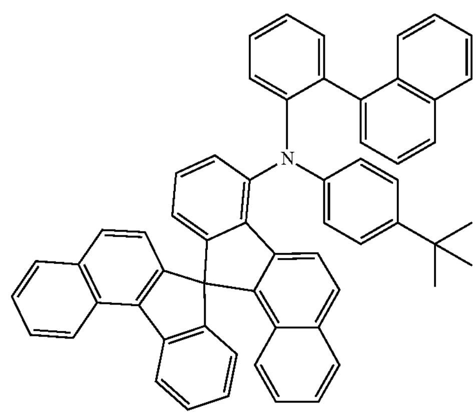

-continued
P4-1
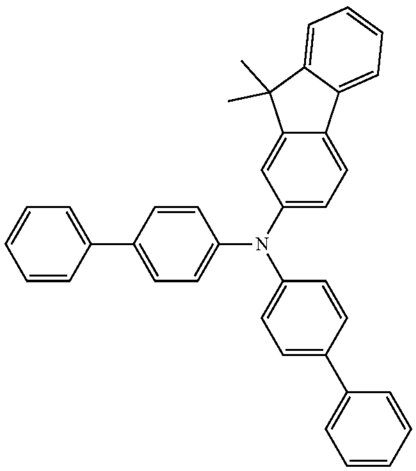
P4-2
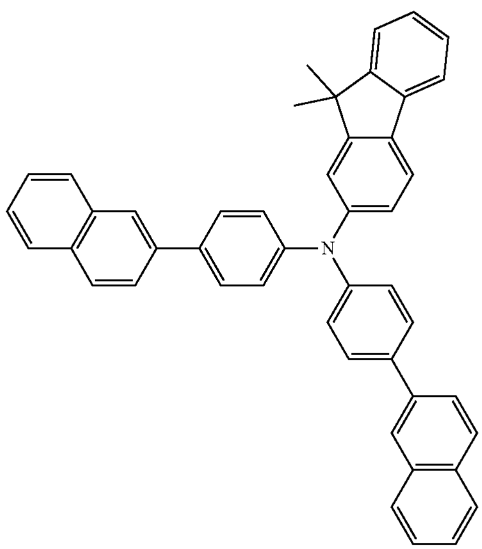
P4-3
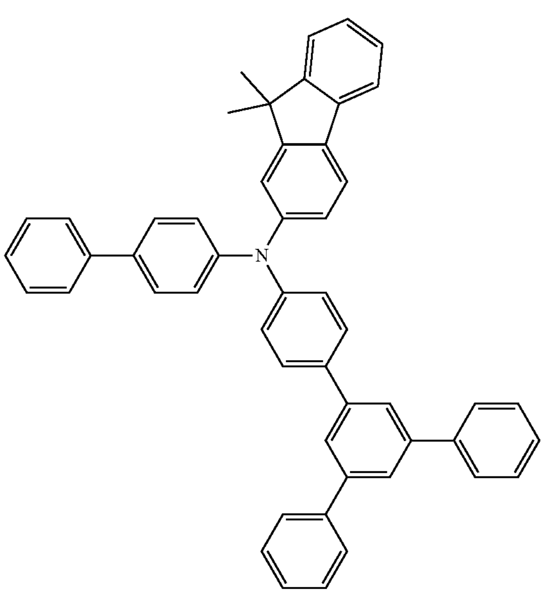
-continued
P4-4
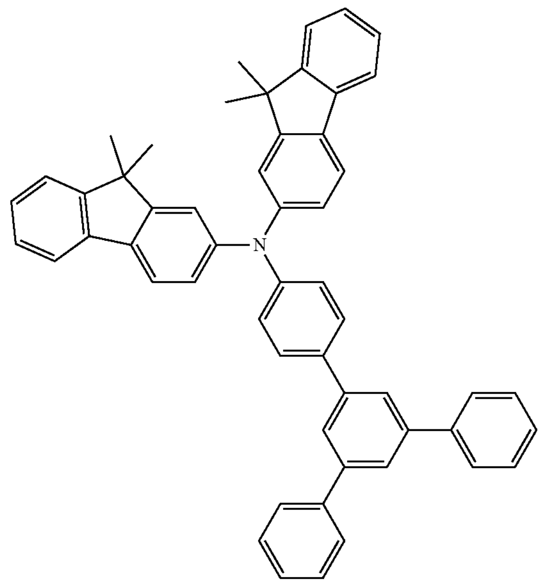
P4-5
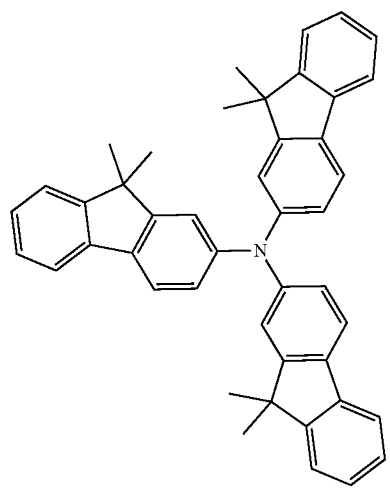
P4-6
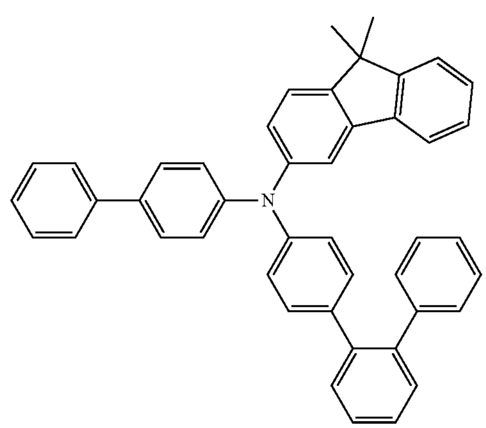

-continued
P4-7
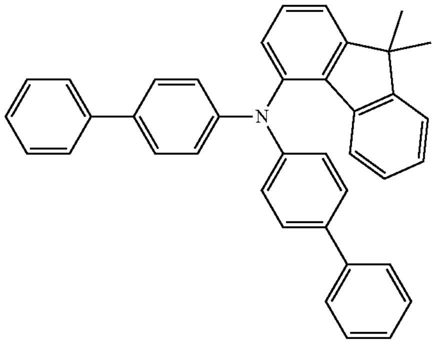
P4-8
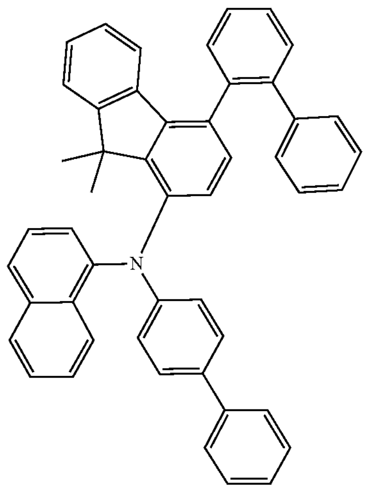
P4-9
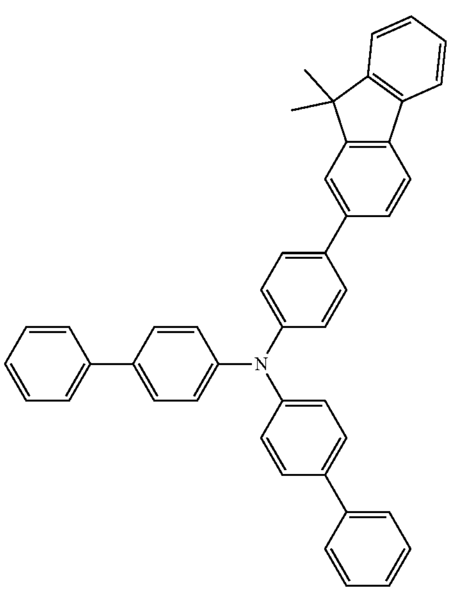
-continued
P4-10
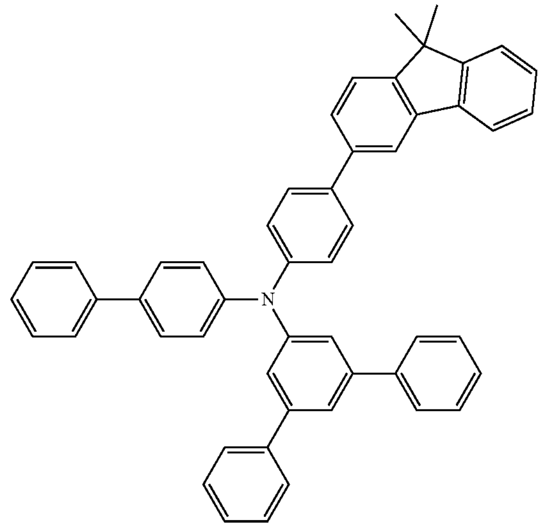
P4-11
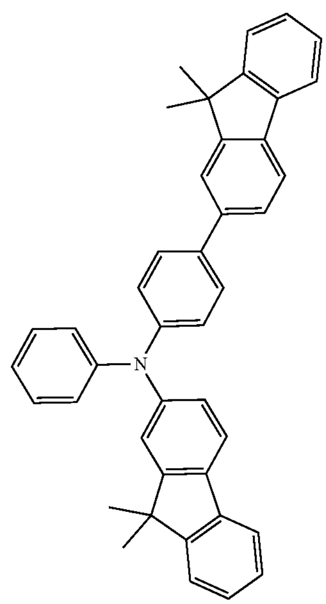

-continued
P4-12
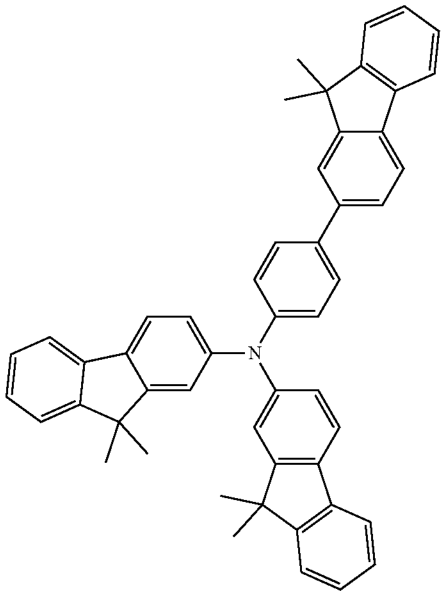
P4-13
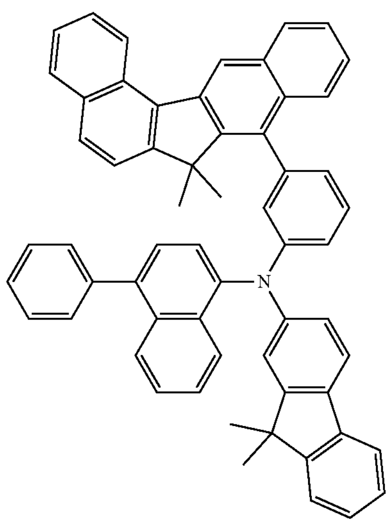
P4-14
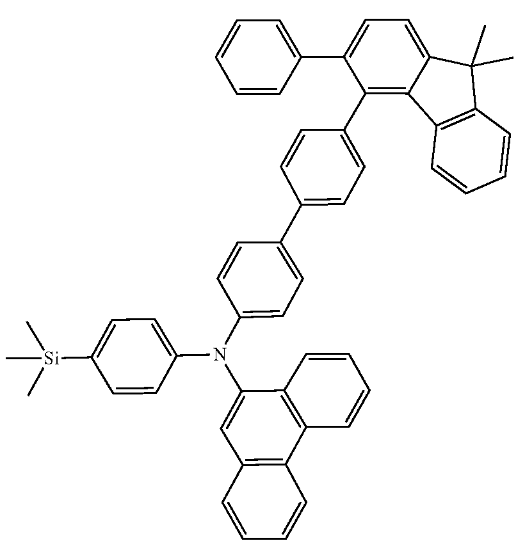
-continued
P4-15
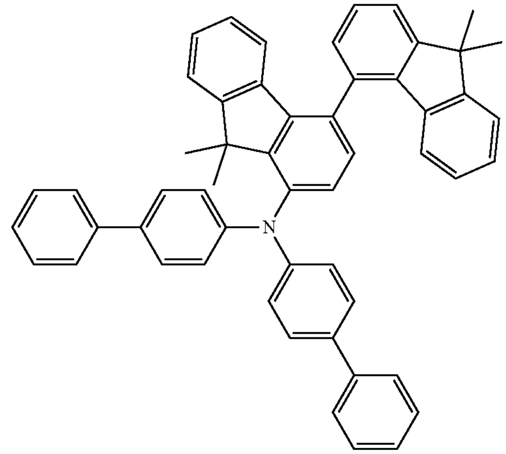
P4-16
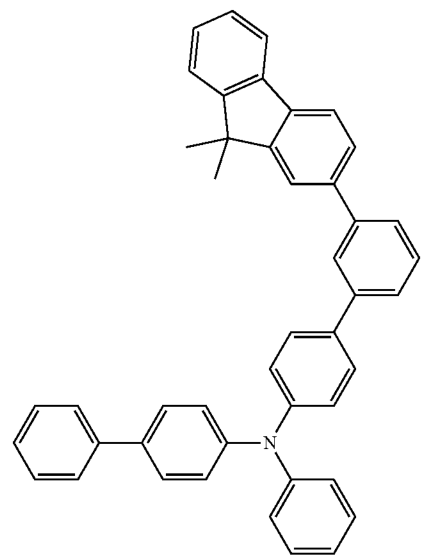
P4-17
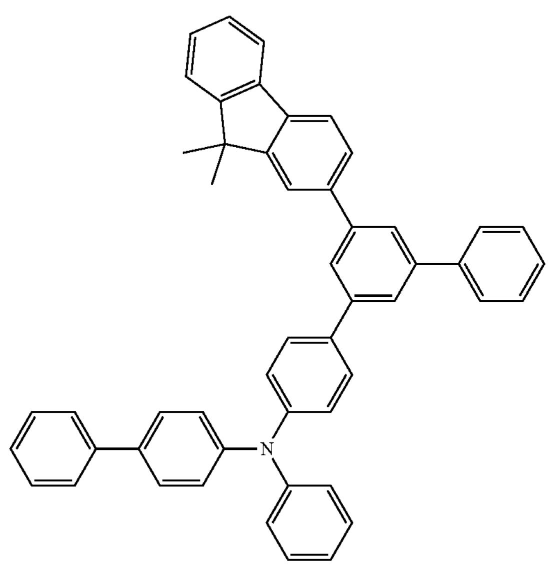

P4-18
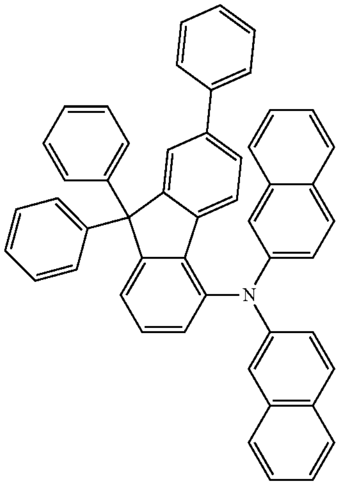
P4-19
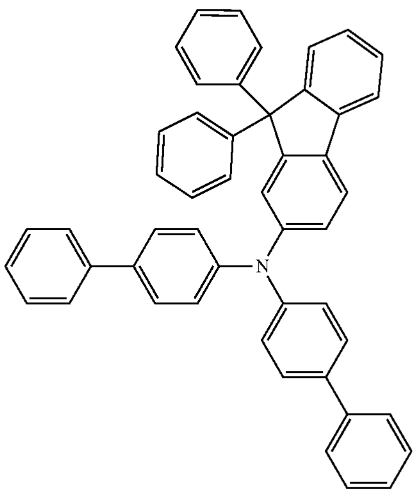
P4-20
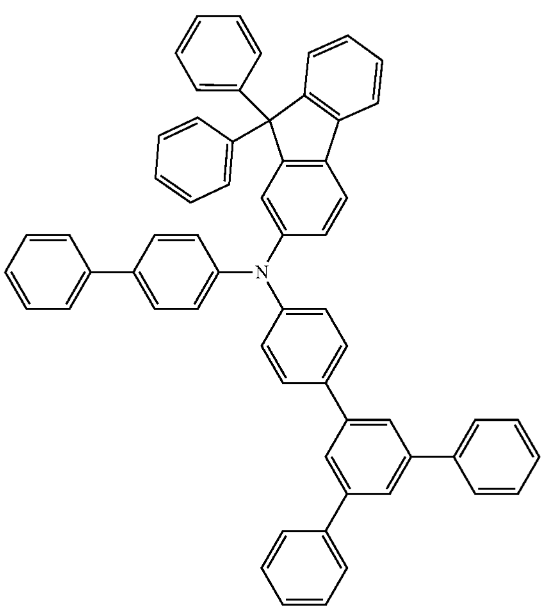
P4-21
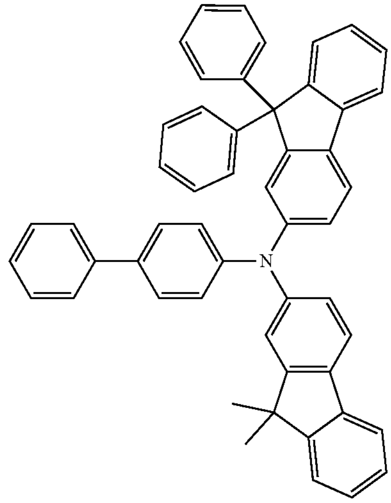
P4-22
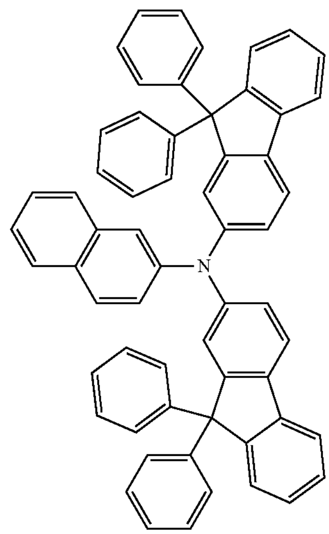
P4-23
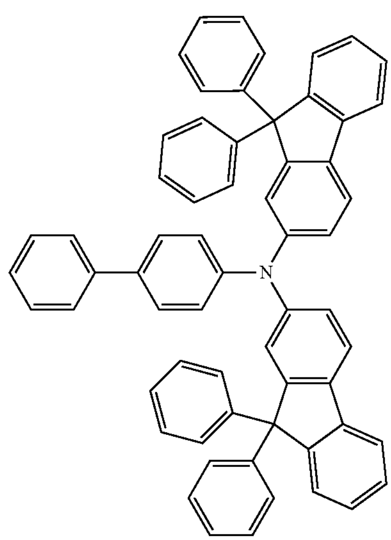

-continued
P4-24
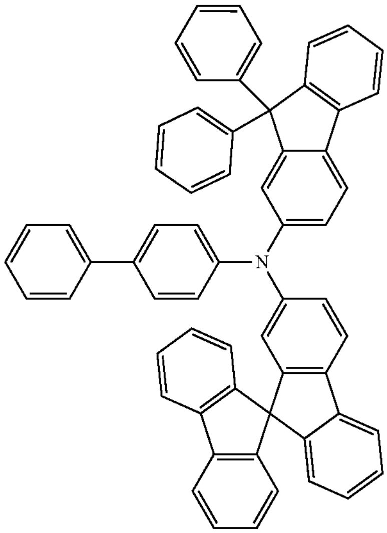
P4-25
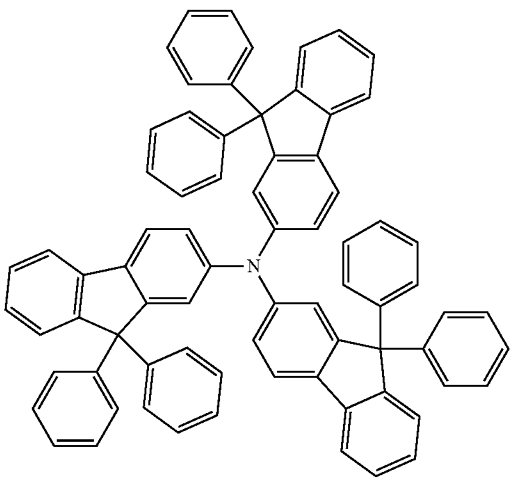
P4-26
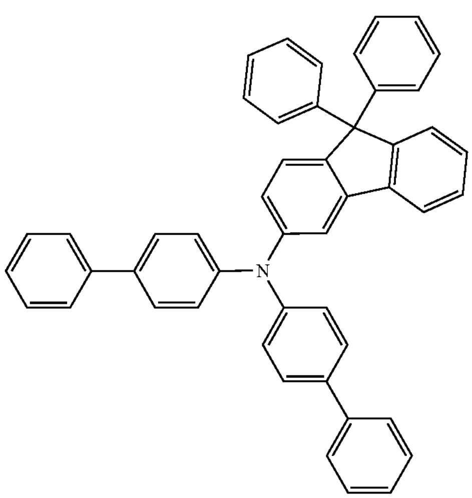
-continued
P4-27
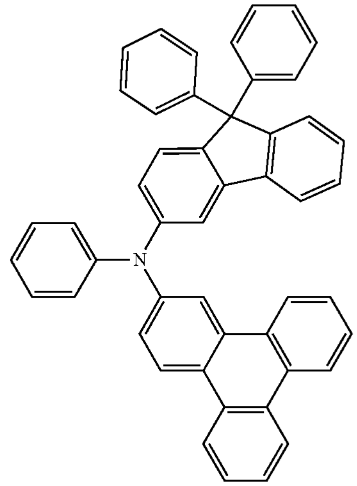
P4-28
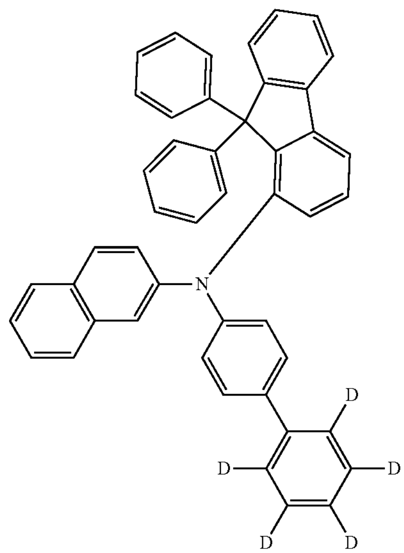
P4-29
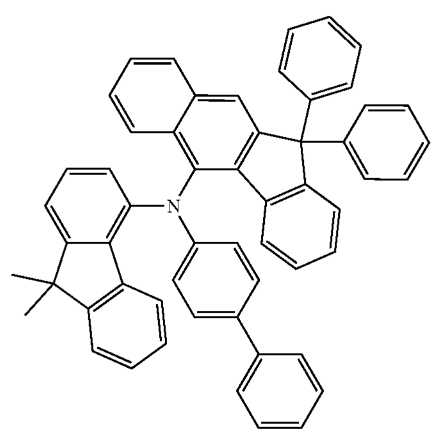

-continued
P4-30
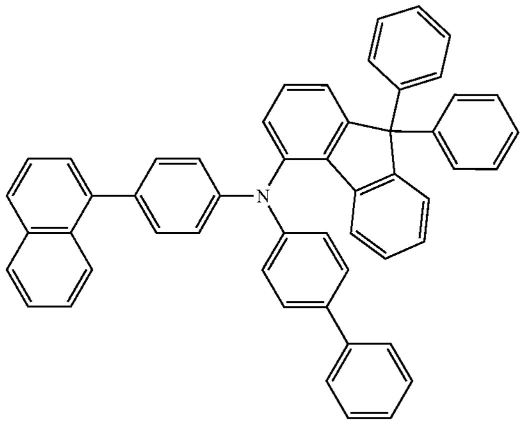
P4-31
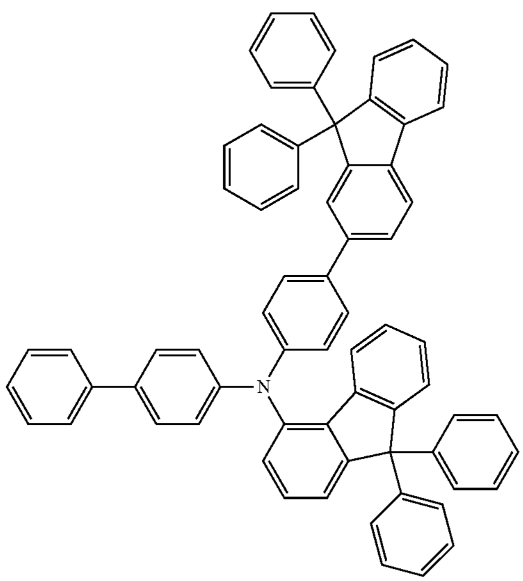
P4-32
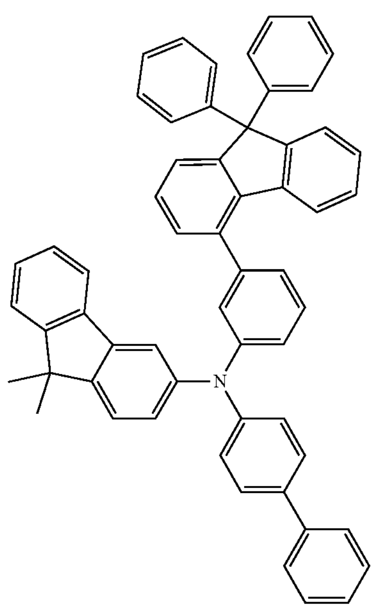
-continued
P4-33
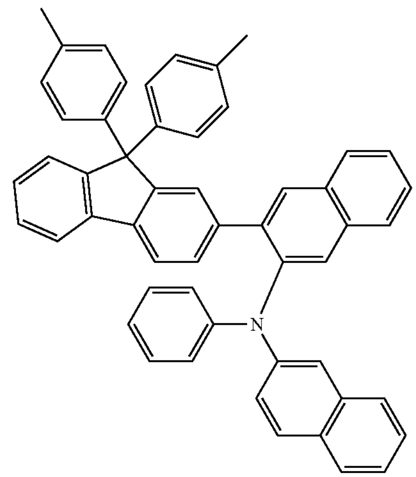
P4-34
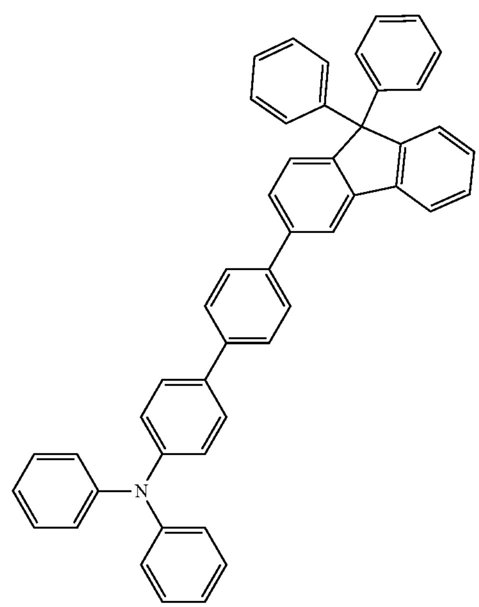

-continued
P4-35
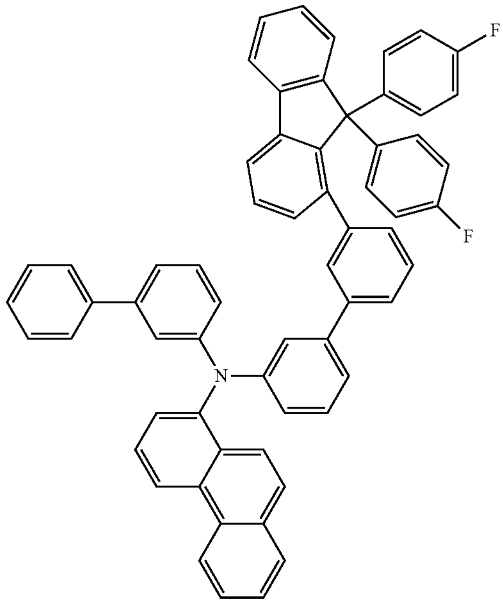
P4-36
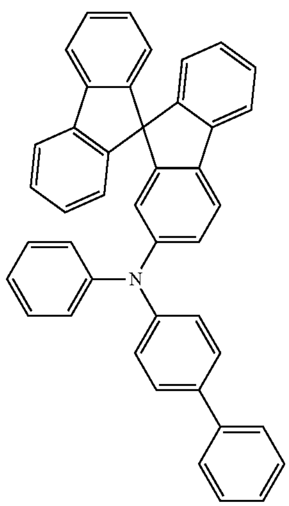
P4-37
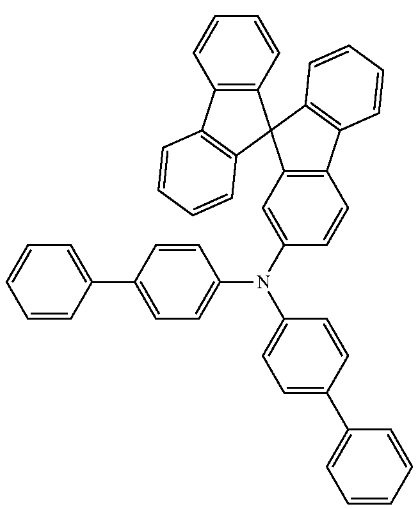
-continued
P4-38
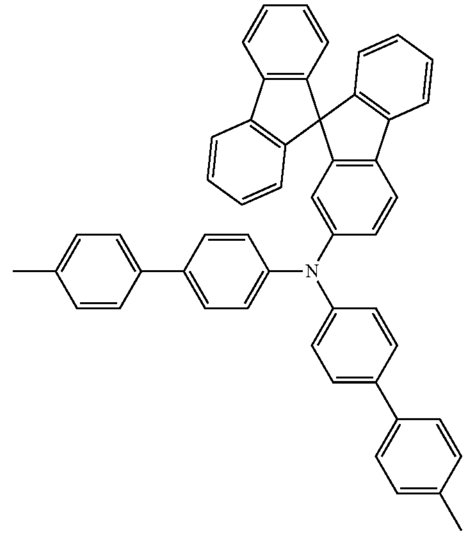
P4-39
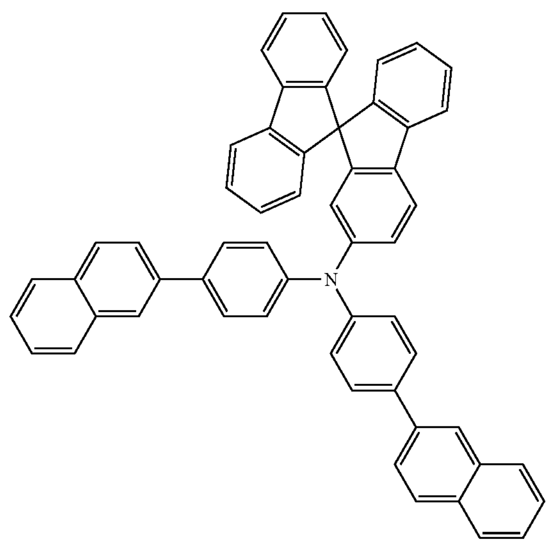
P4-40
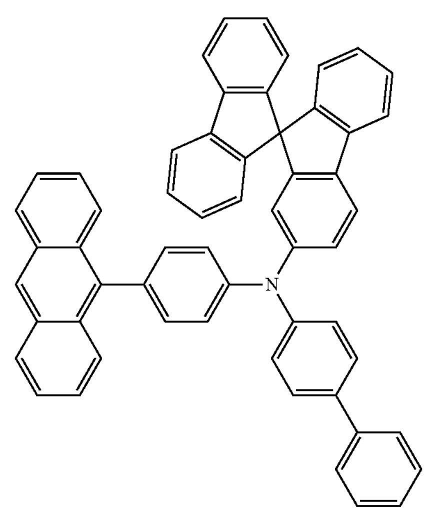

-continued
P4-41
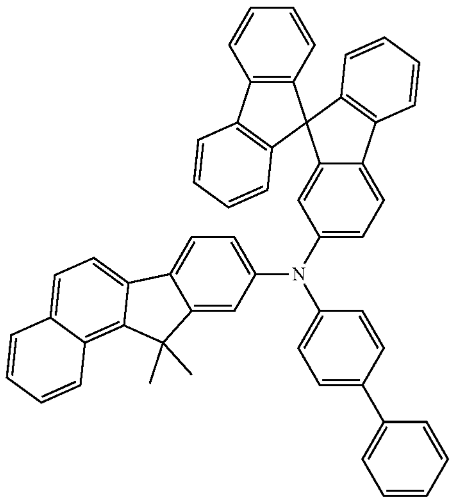
P4-42
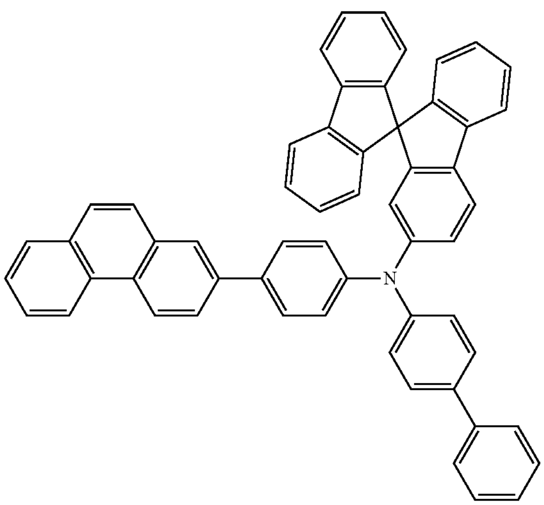
P4-43
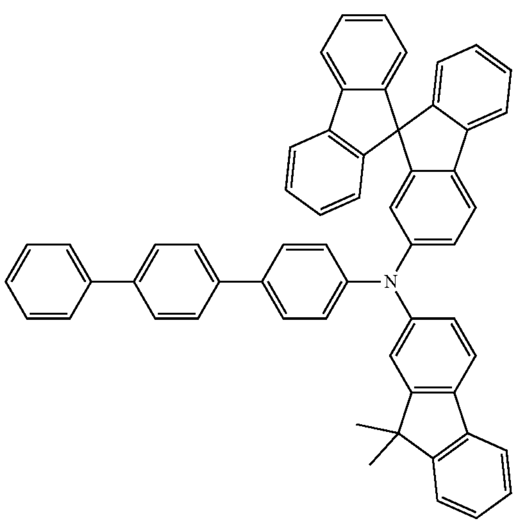
-continued
P4-44
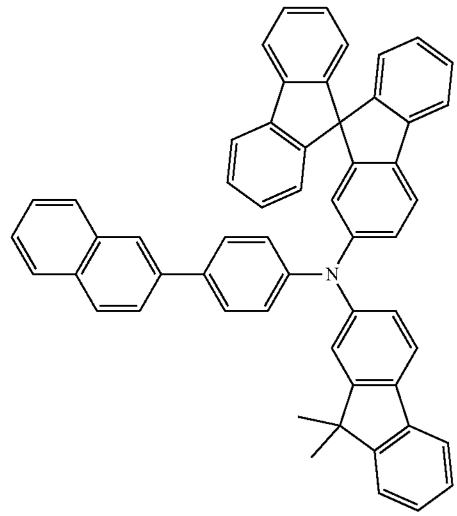
P4-45
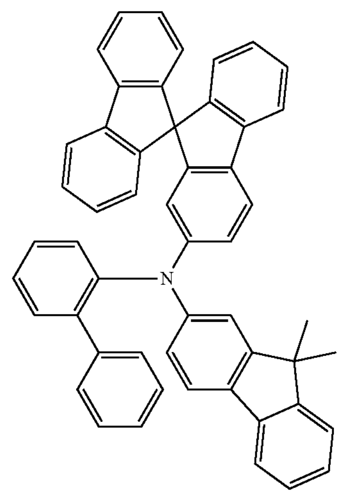
P4-46
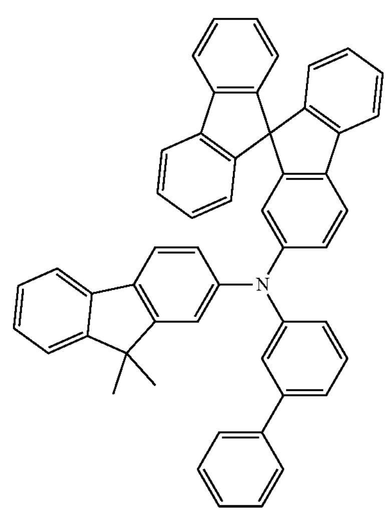

-continued
P4-47
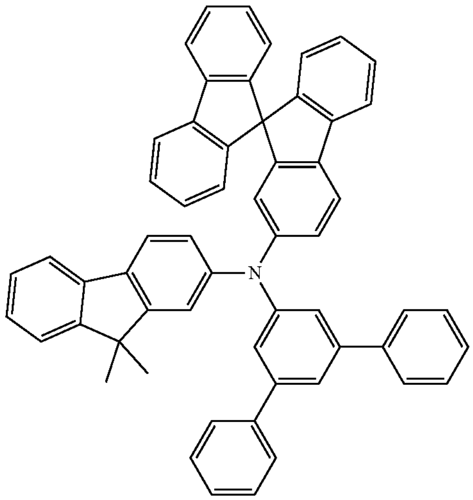
P4-48
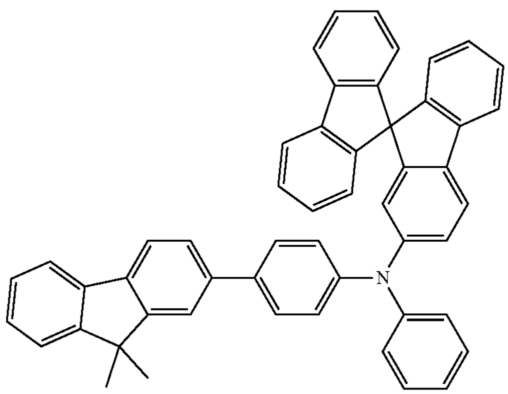
P4-49
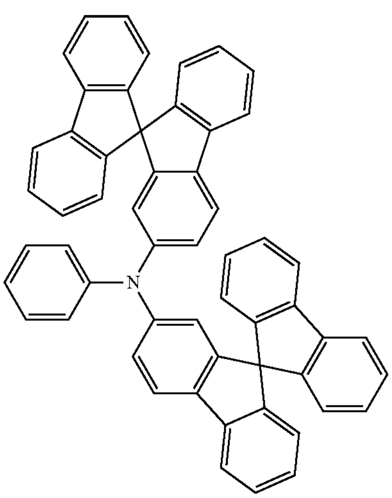
-continued
P4-50
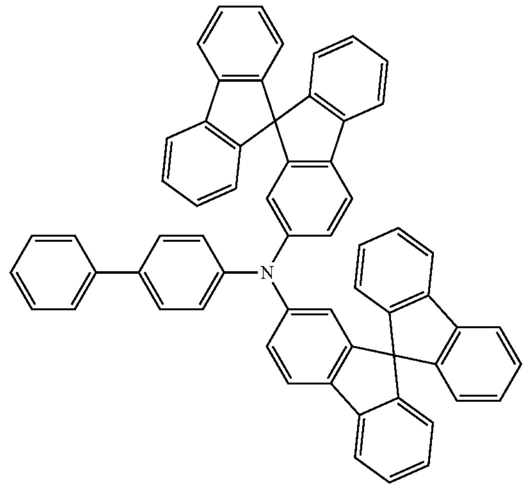
P4-51
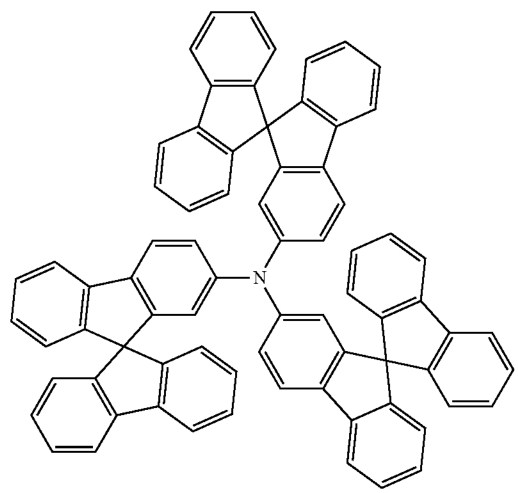
P4-52
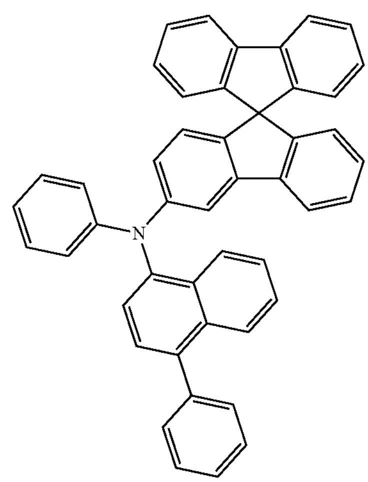

-continued
P4-53
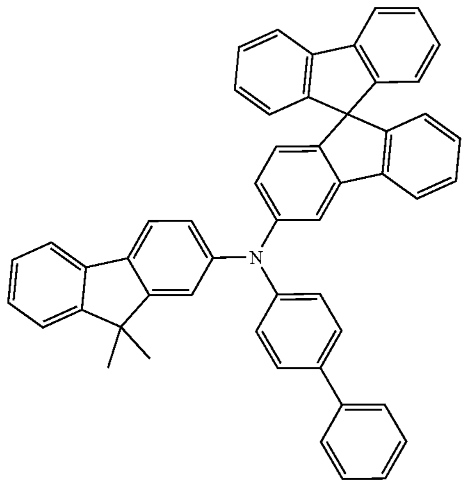
P4-54
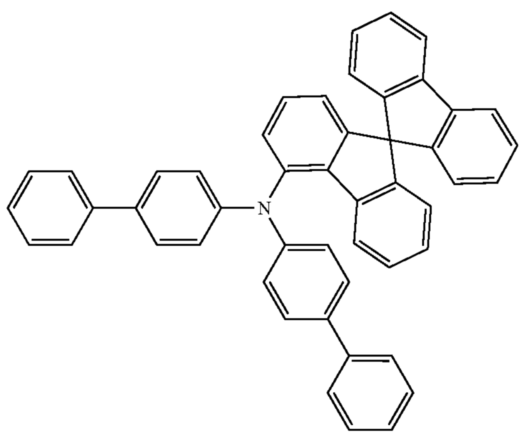
P4-55
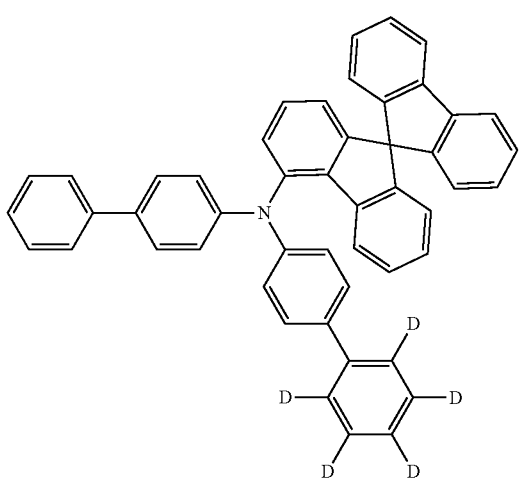
-continued
P4-56
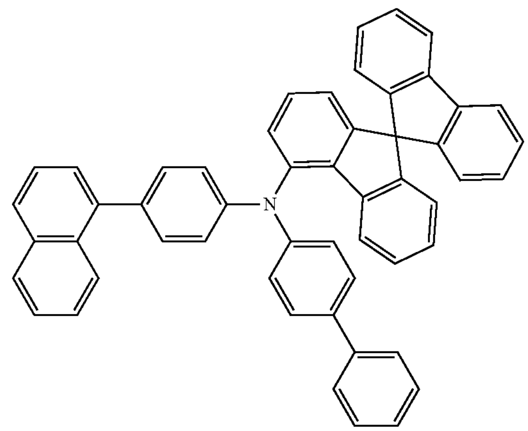
P4-57
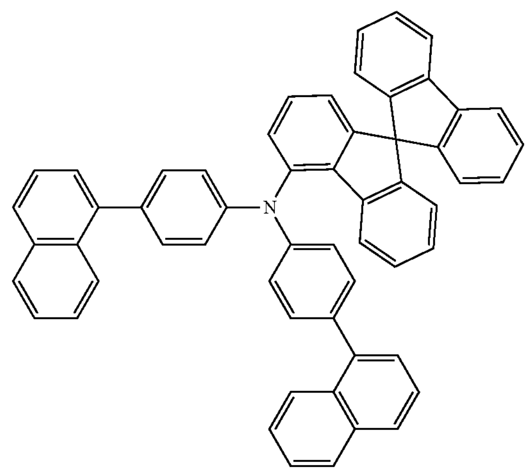
P4-58
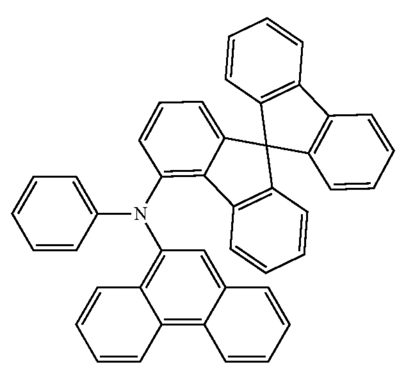

-continued
P4-59
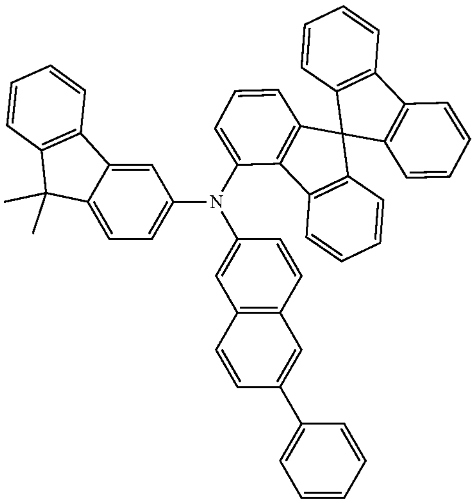
P4-60
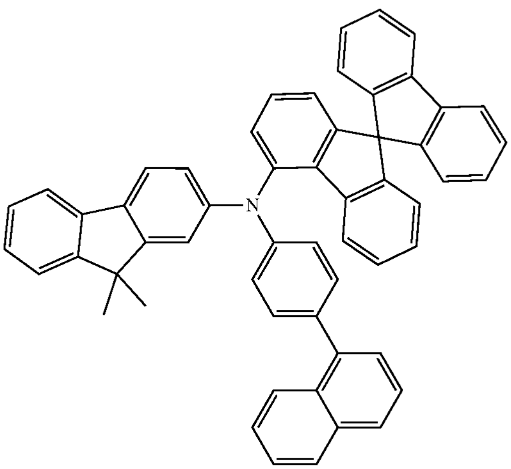
P4-61
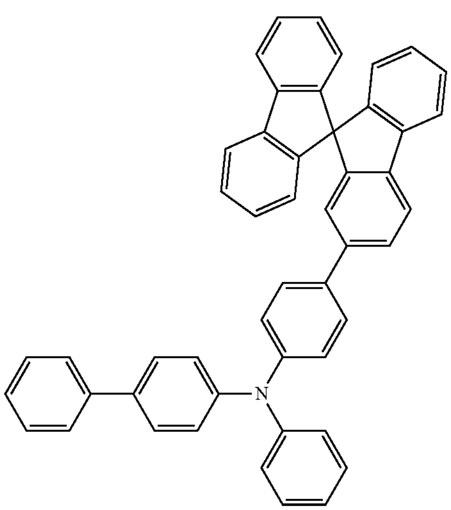
-continued
P4-62
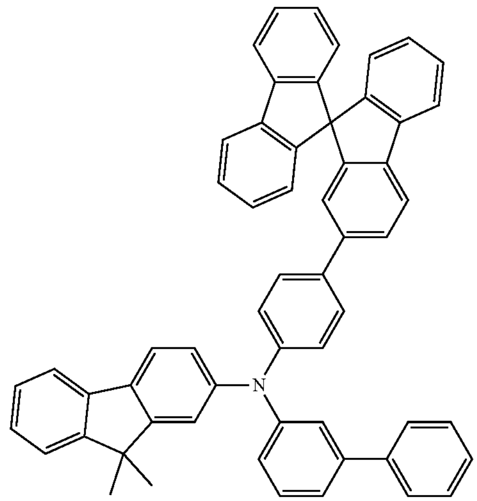
P4-63
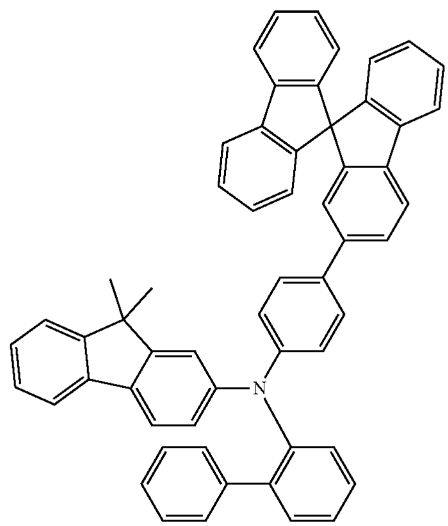
P4-64
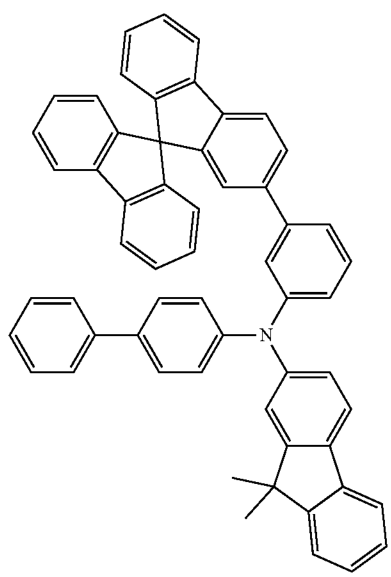

-continued
P4-65
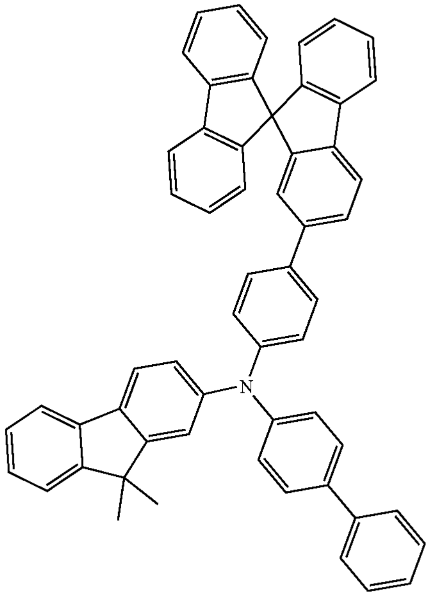
P4-66
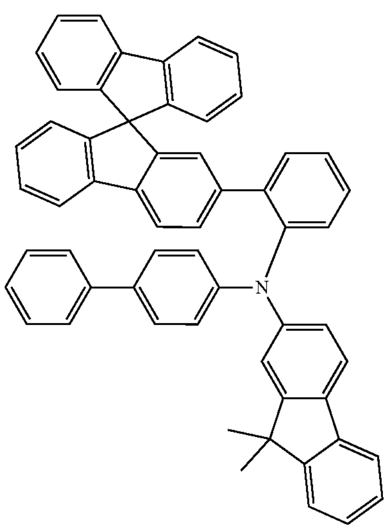
-continued
P4-67
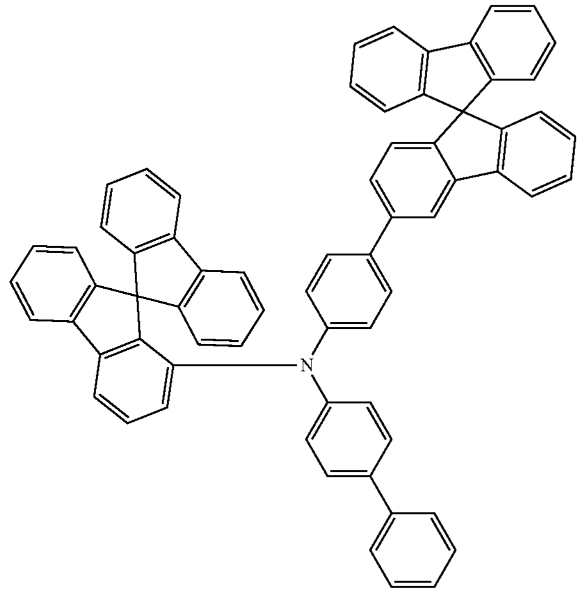
P4-68
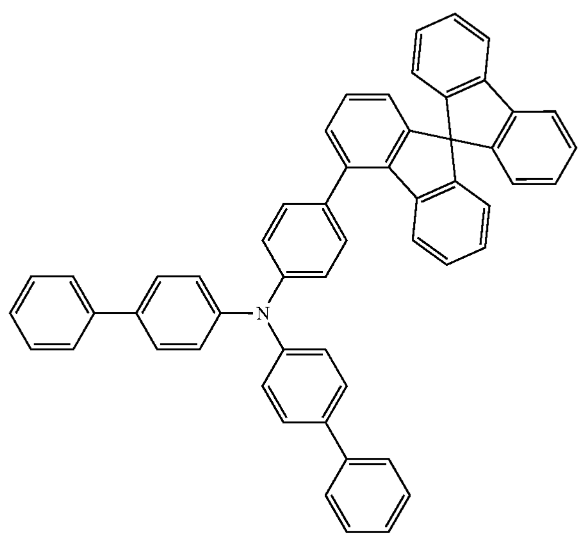

-continued
P4-69
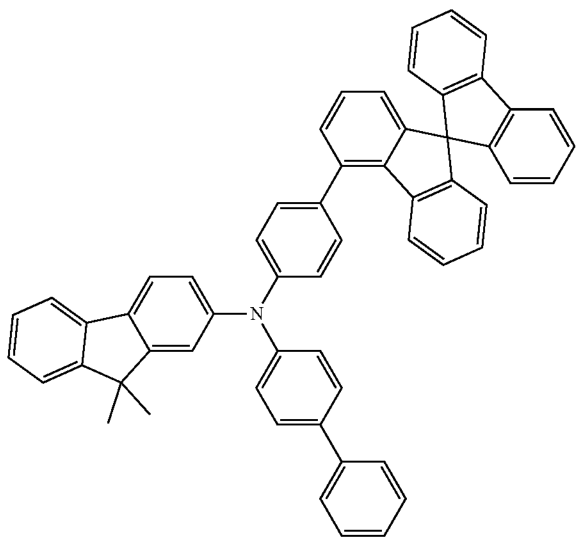
P4-70
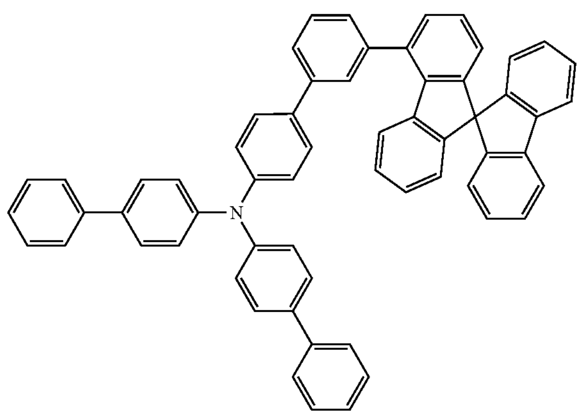
P4-71
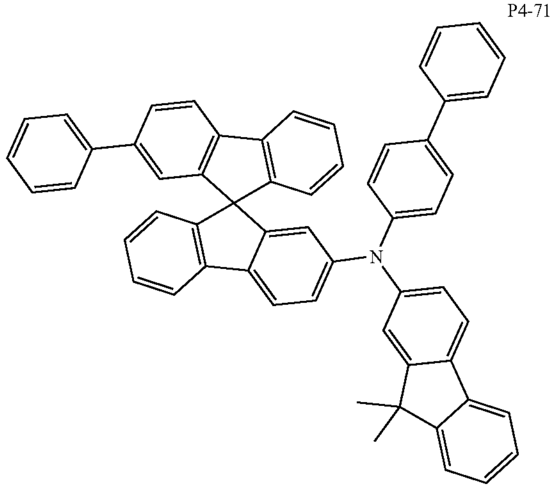
-continued
P4-72
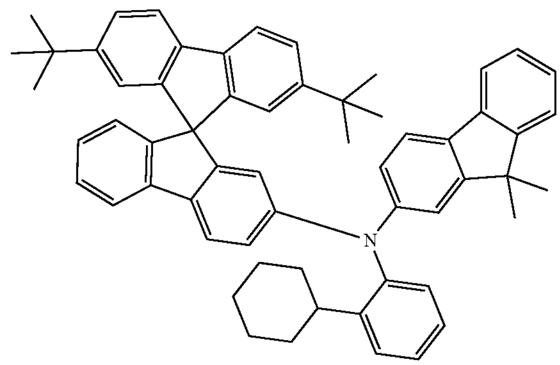
P4-73
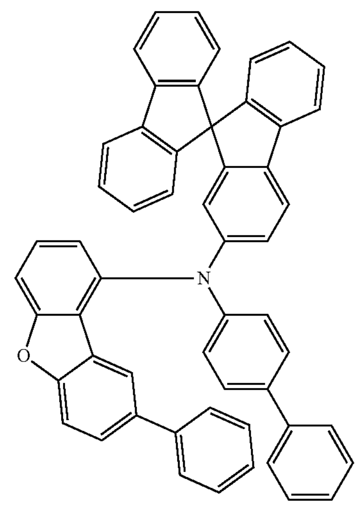
P4-74
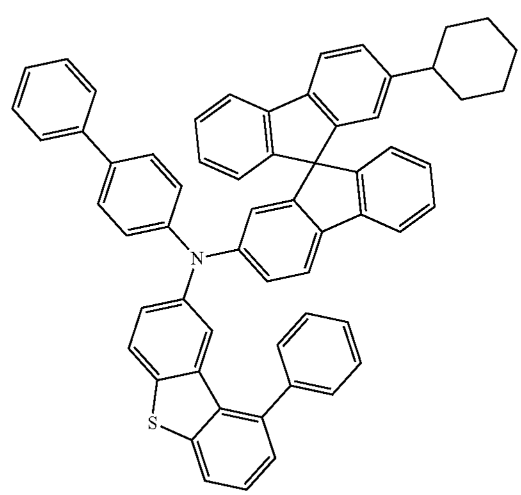

P4-75
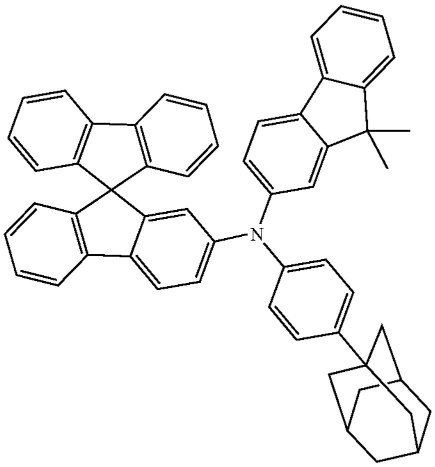
P4-76
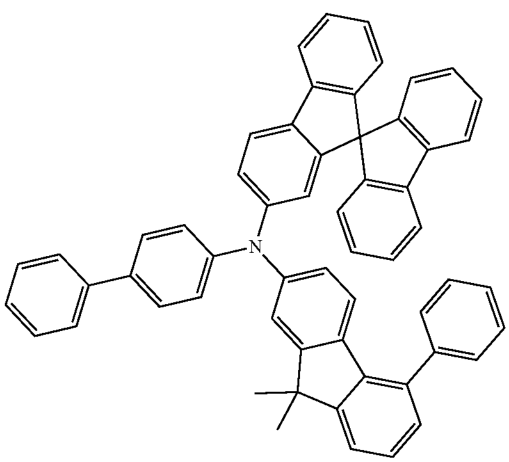
P4-77
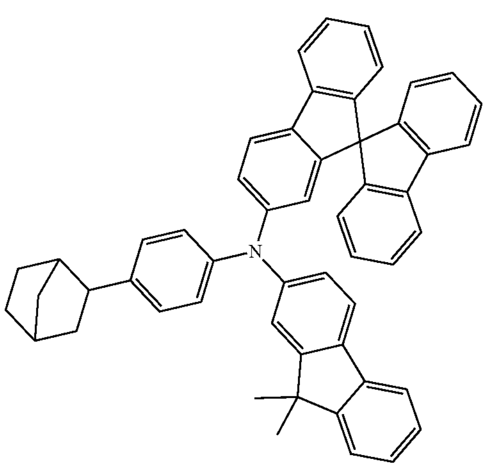
P4-78
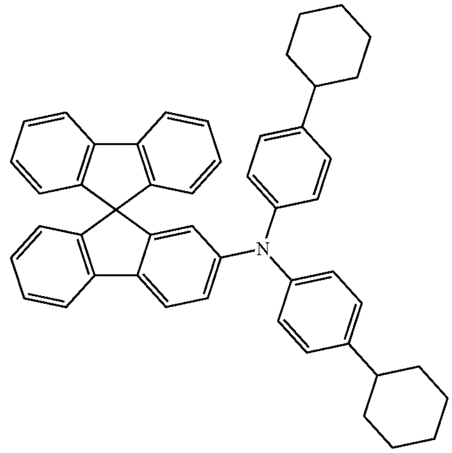
P5-1
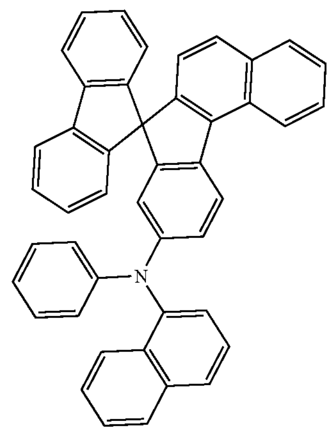
P5-2
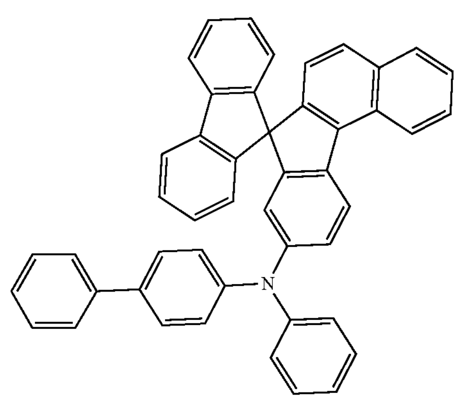

-continued
P5-3
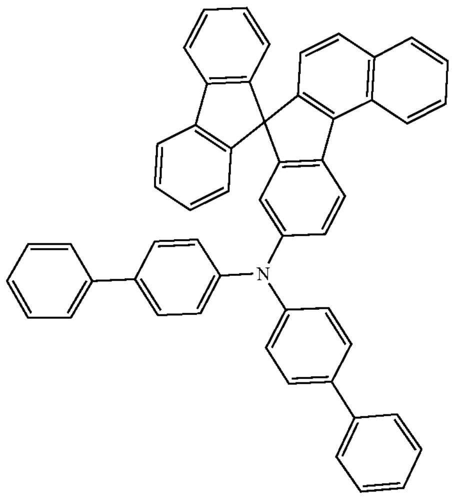
P5-4
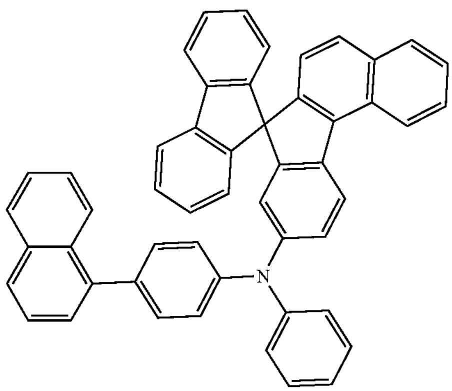
P5-5
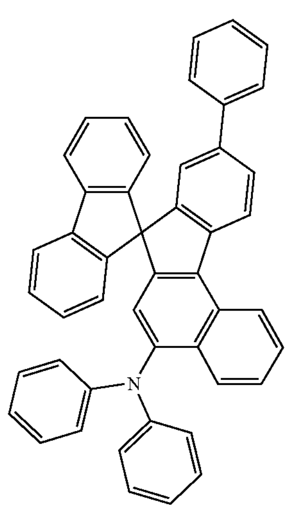
-continued
P5-6
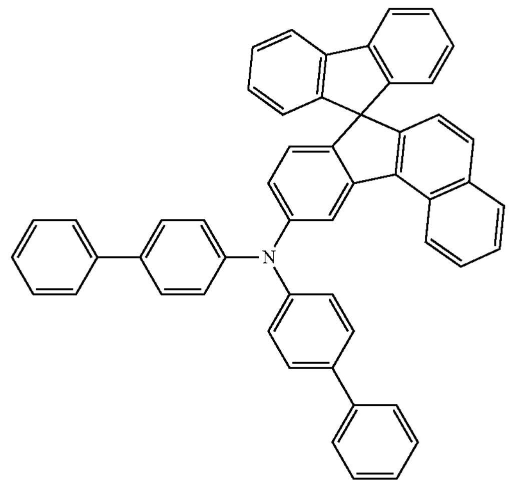
P5-7
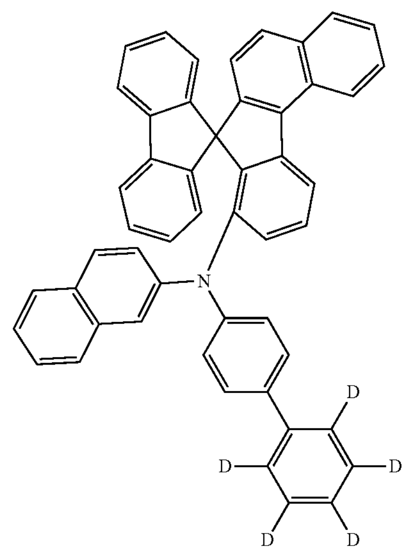
P5-8
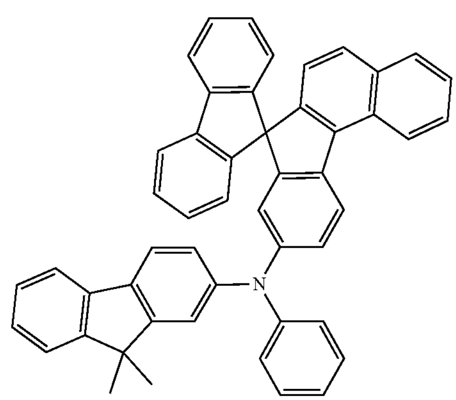

-continued
P5-9
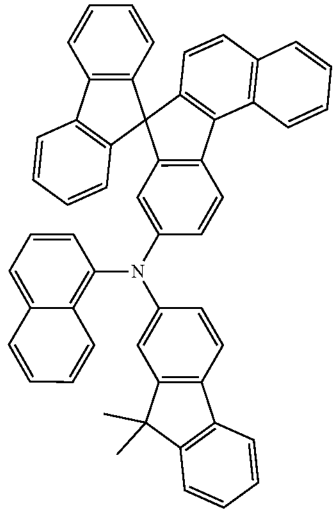
P5-10
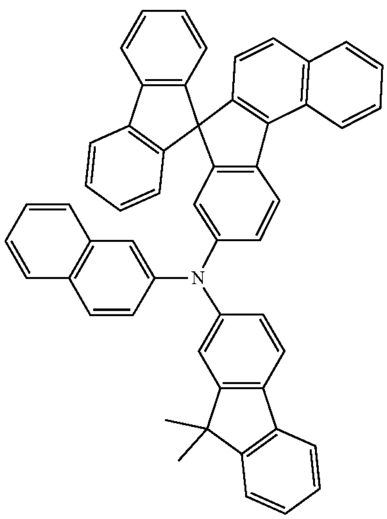
P5-11
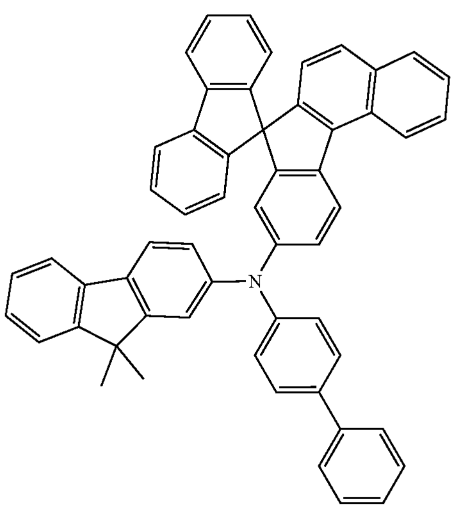
-continued
P5-12
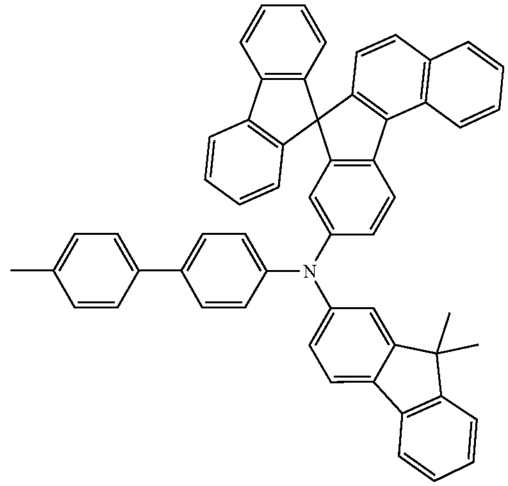
P5-13
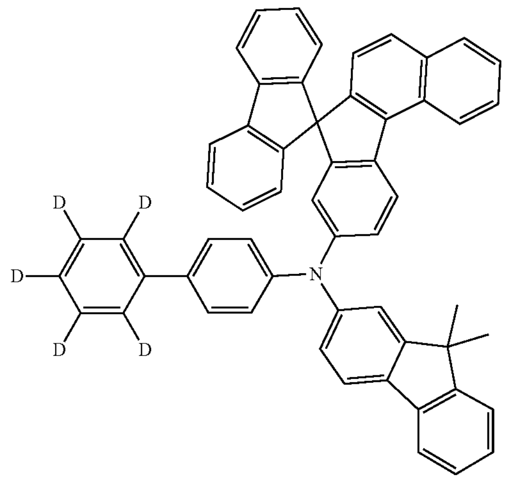
P5-14
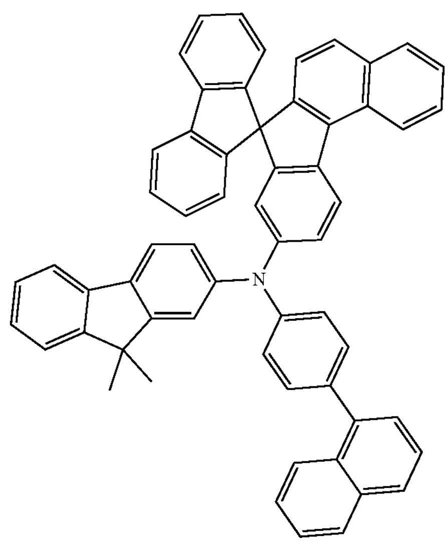

-continued
P5-15
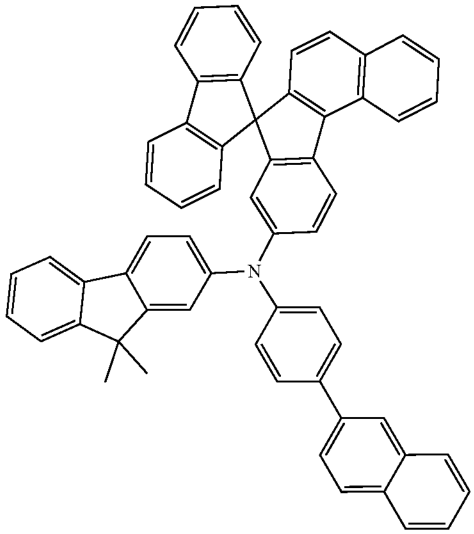
P5-16
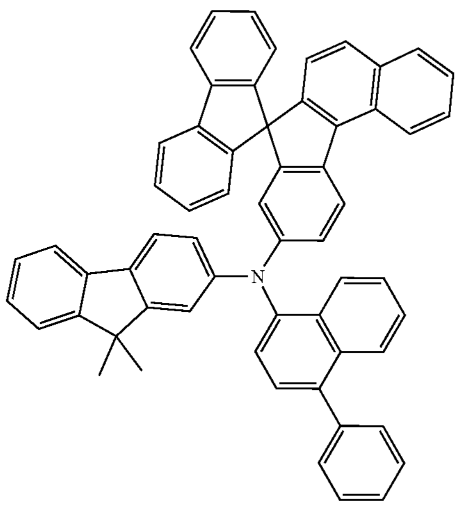
P5-17
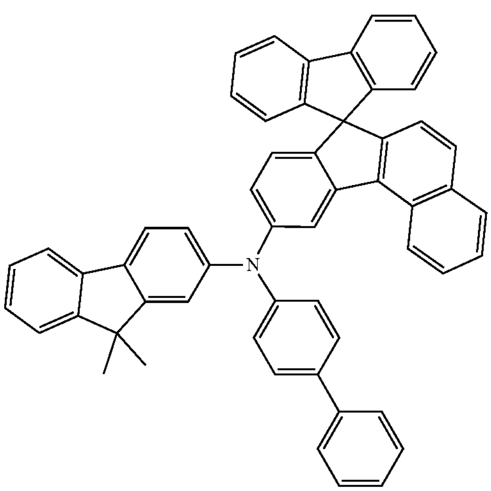
-continued
P5-18
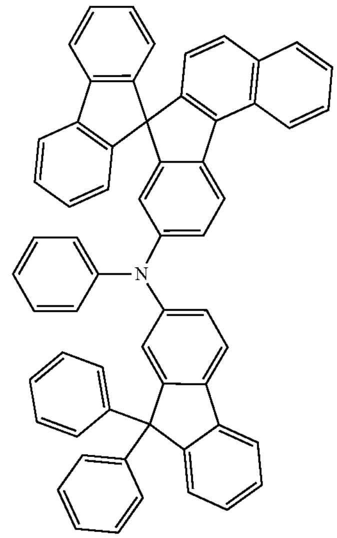
P5-19
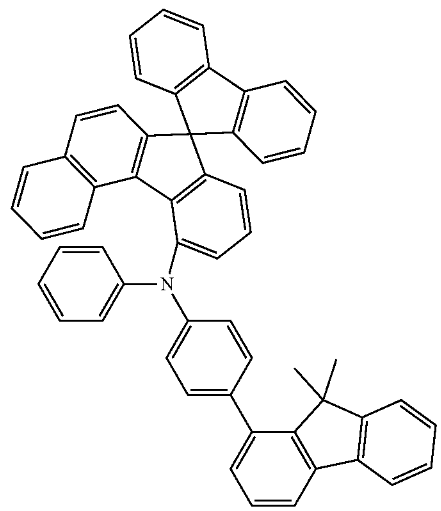
P5-20
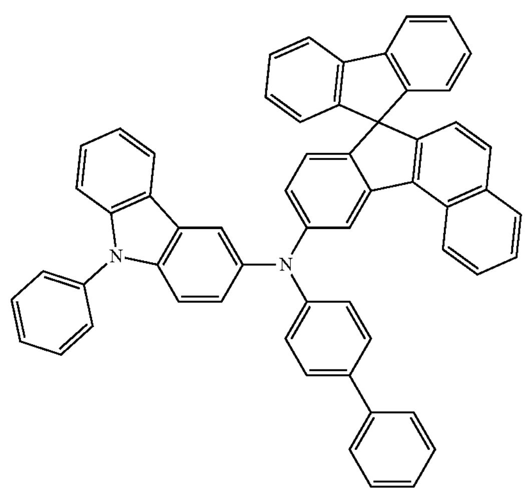

-continued
P5-21
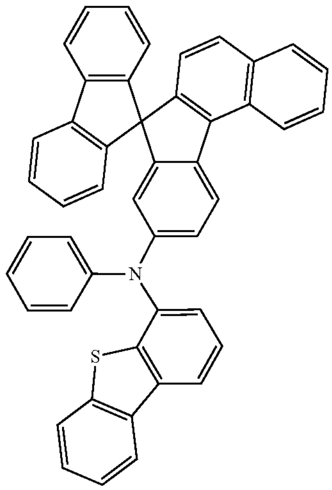
P5-22
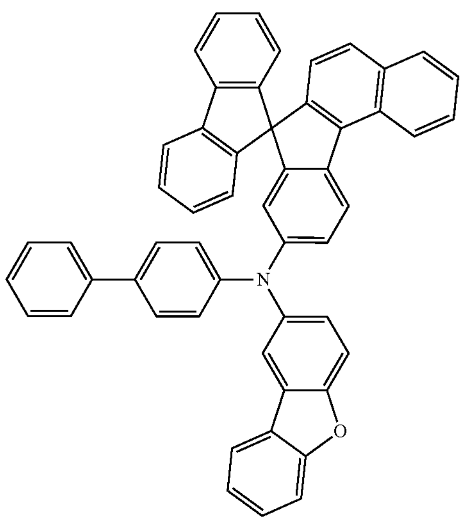
P5-23
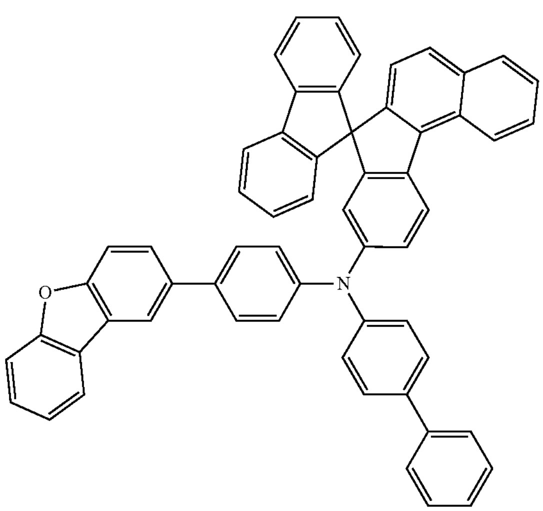
-continued
P5-24
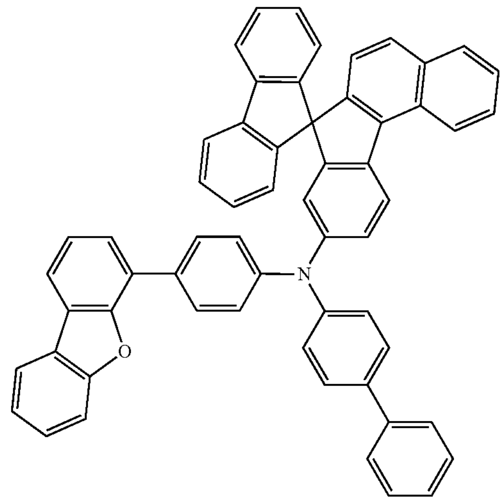
P5-25
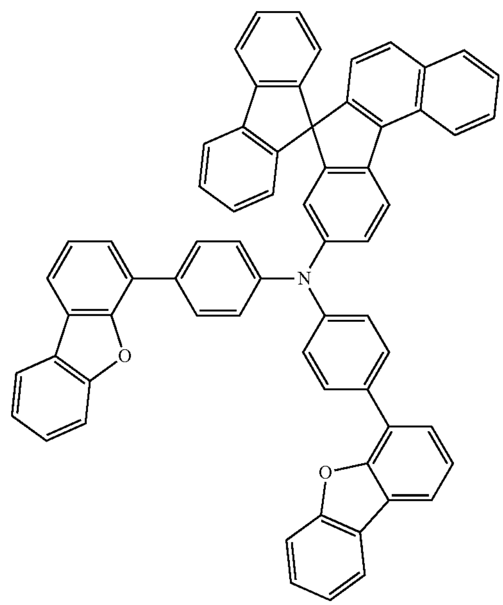
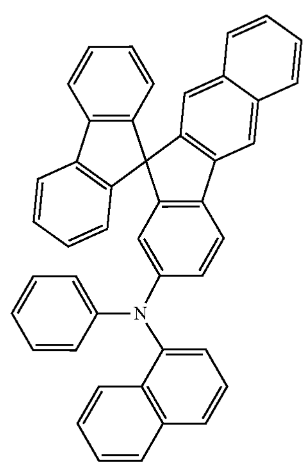

-continued
P5-27
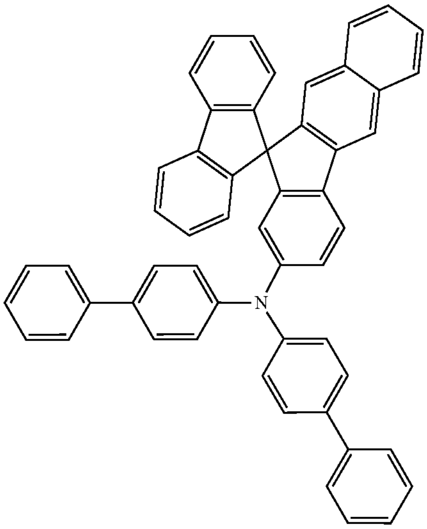
P5-28
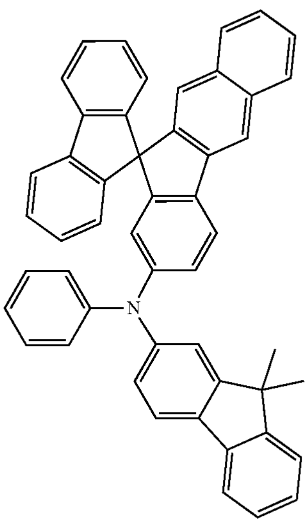
P5-29
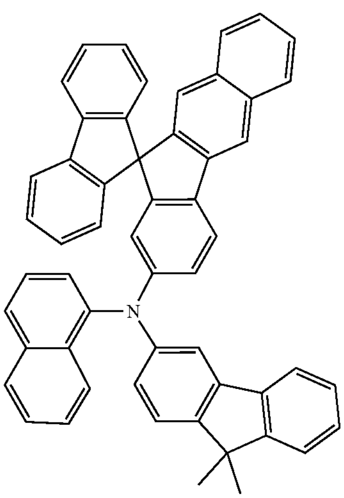
-continued
P5-30
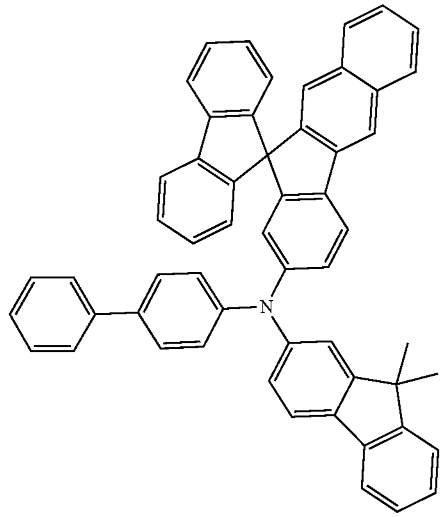
P5-31
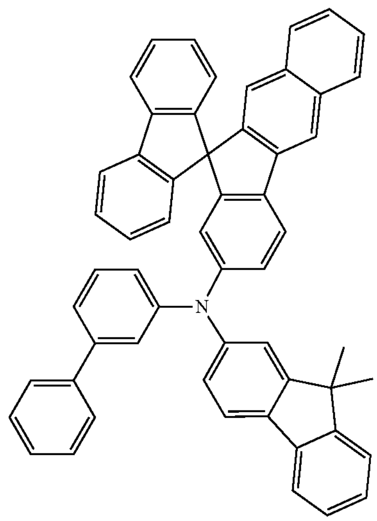
P5-32
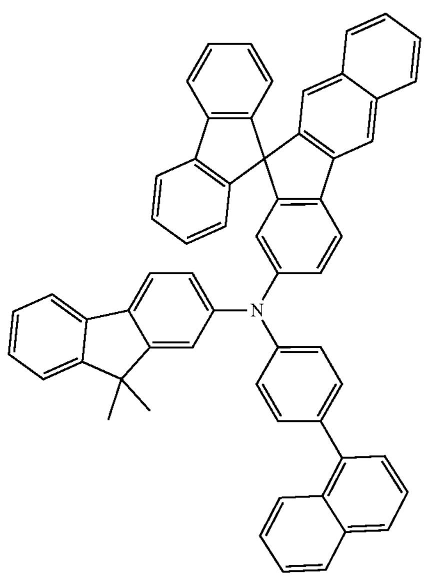

-continued
P5-33
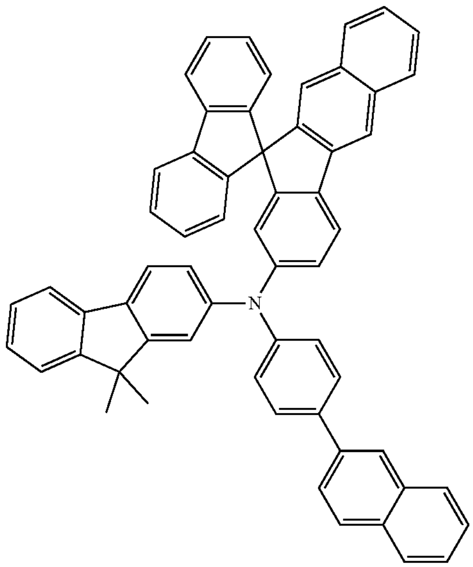
P5-34
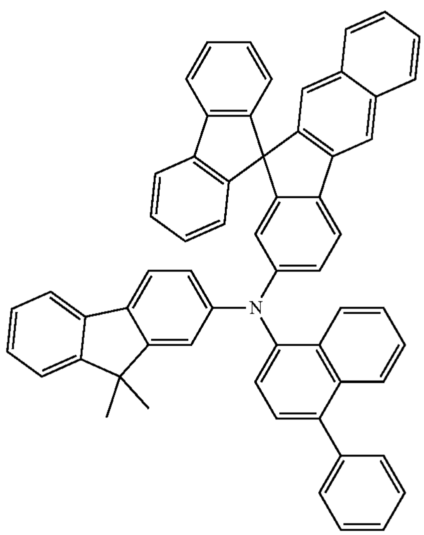
P-35
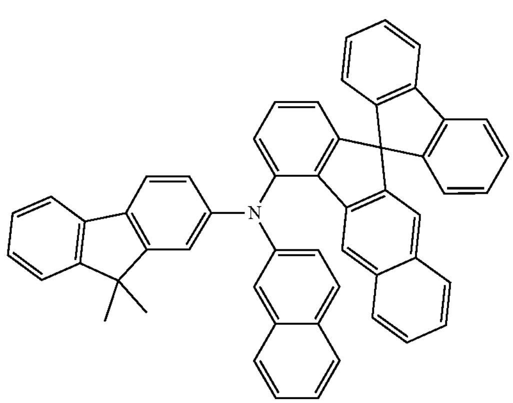
-continued
P5-36
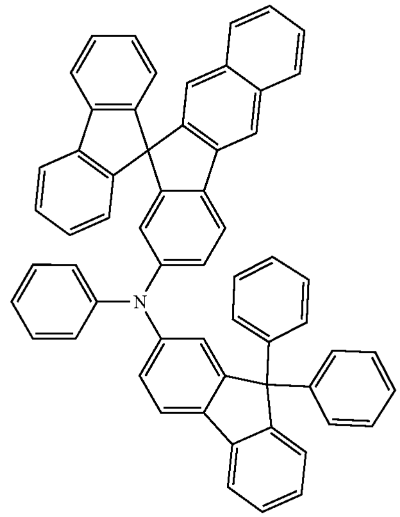
P5-37
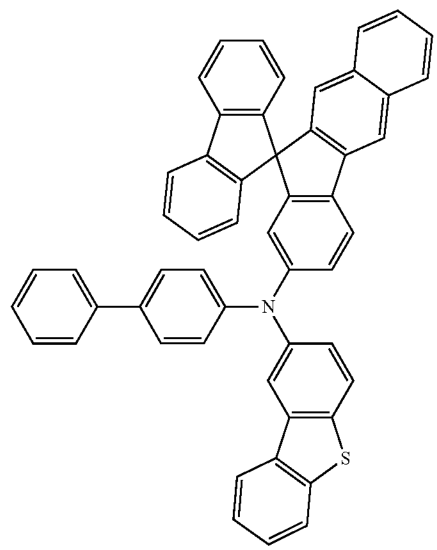
P5-38
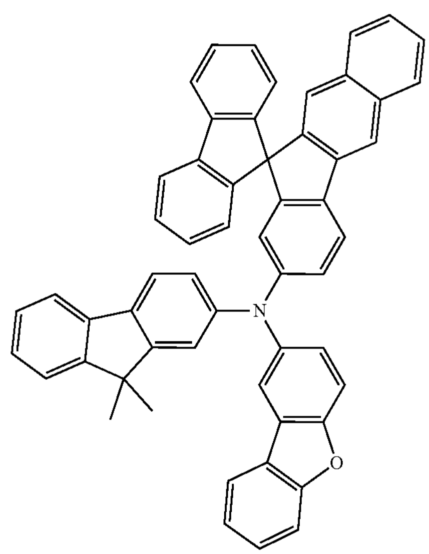

-continued
P5-39
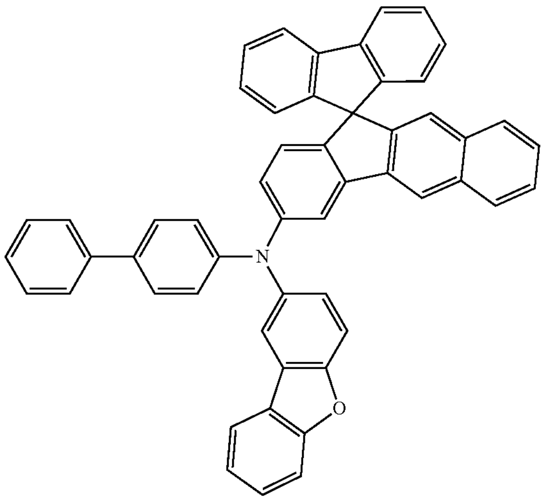
P5-40
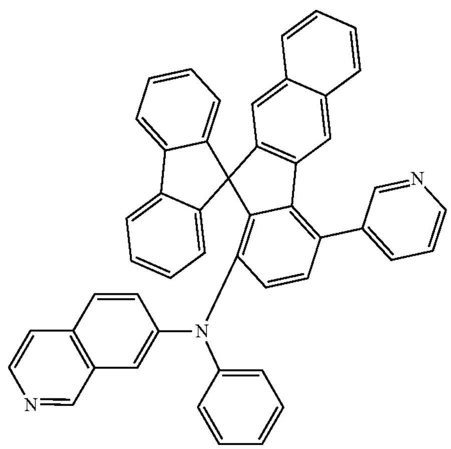
P5-41
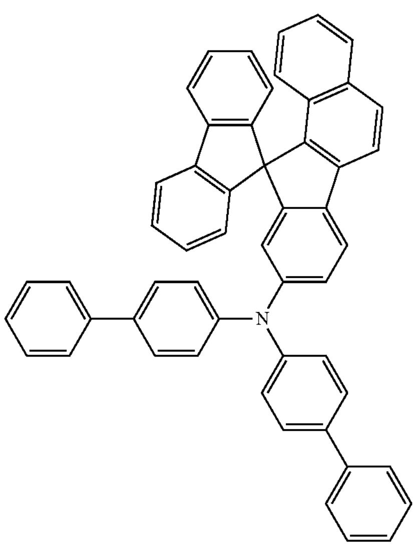
-continued
P5-42
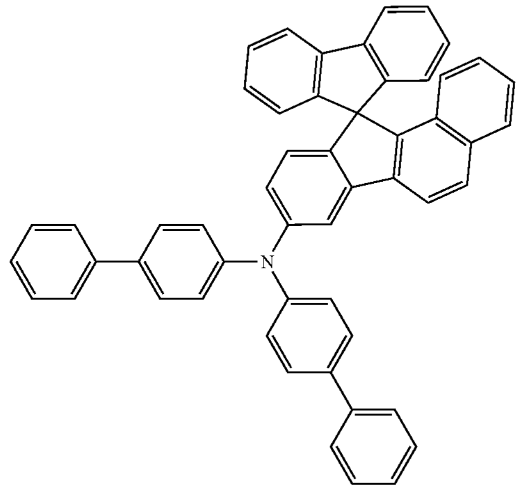
P5-43
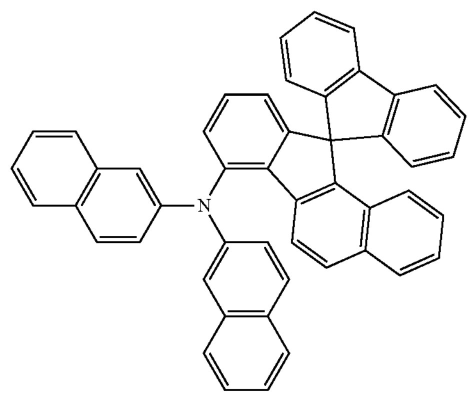
P5-44
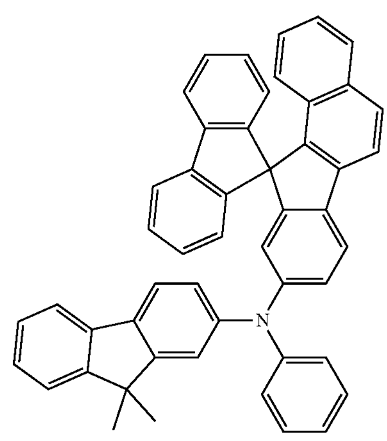

-continued
P5-45
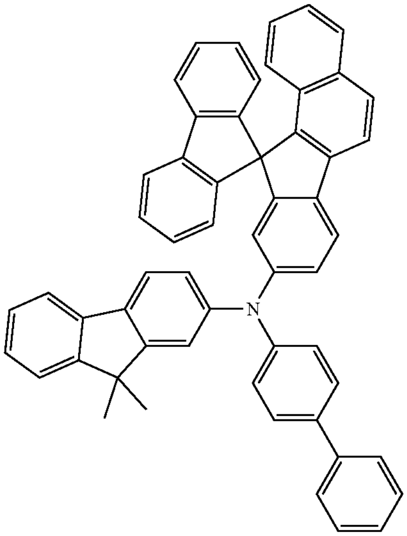
P5-46
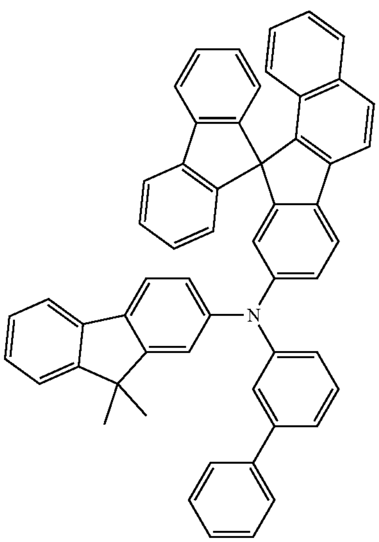
P5-47
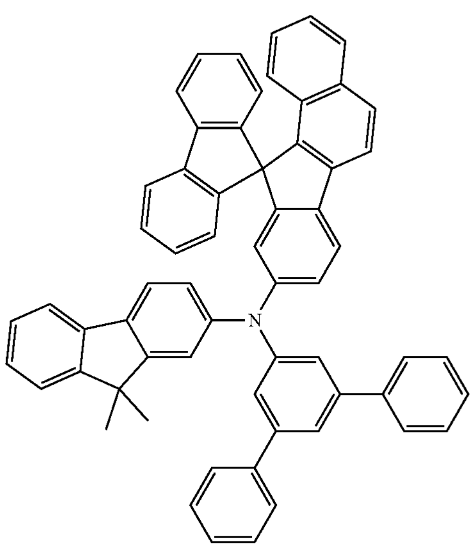
-continued
P5-48
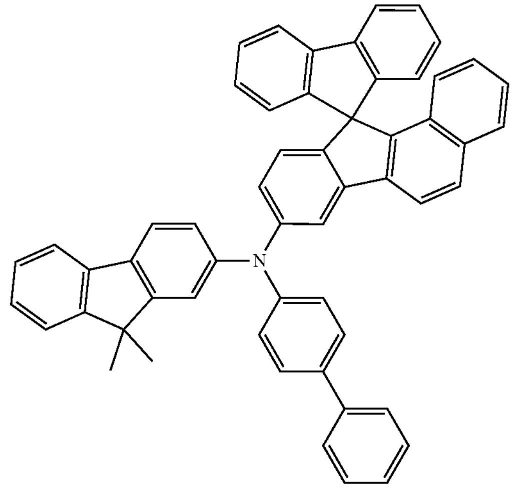
P5-49
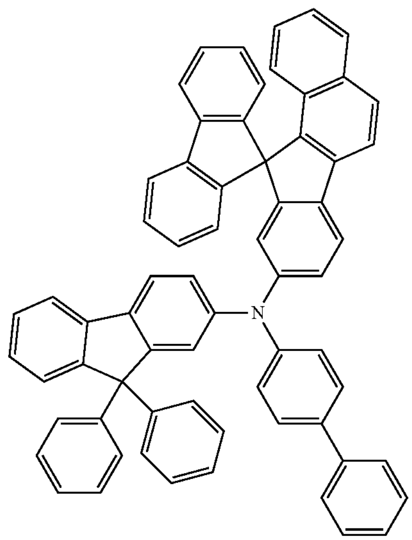
P5-50
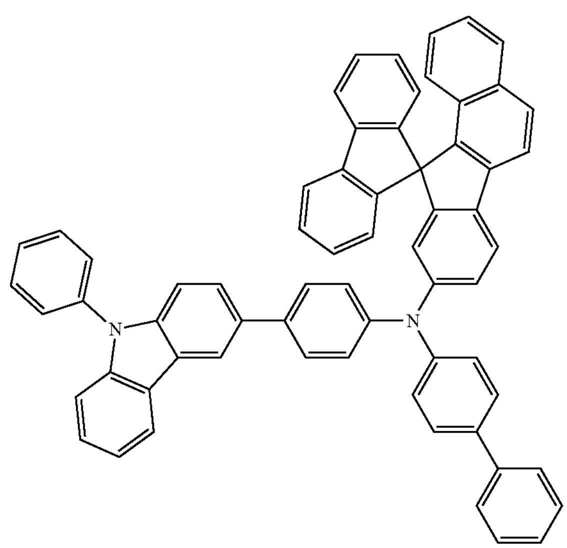

-continued
P5-51
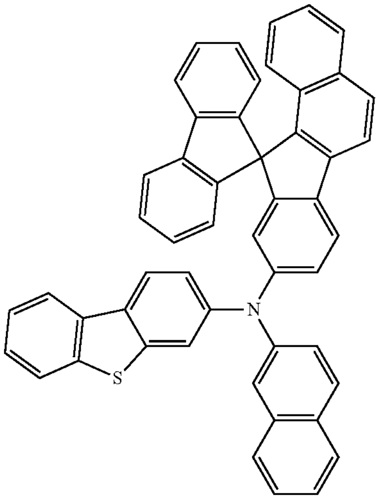
P5-52
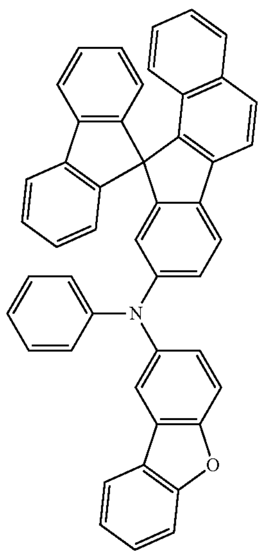
P5-53
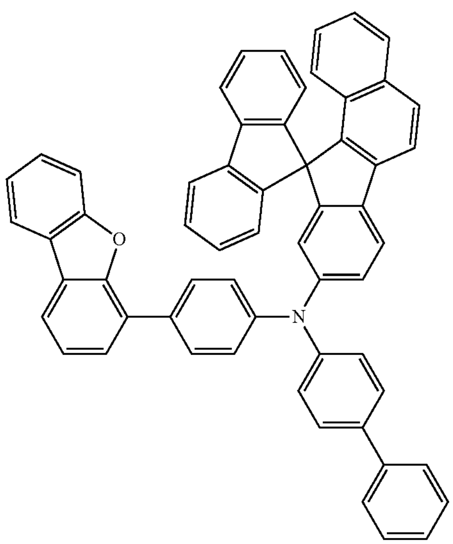
-continued
P5-54
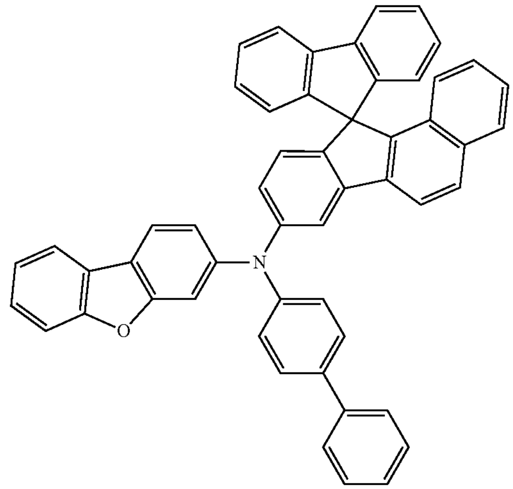
P5-55
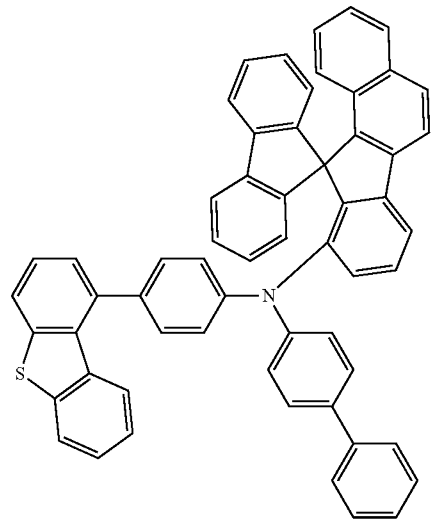
P5-56
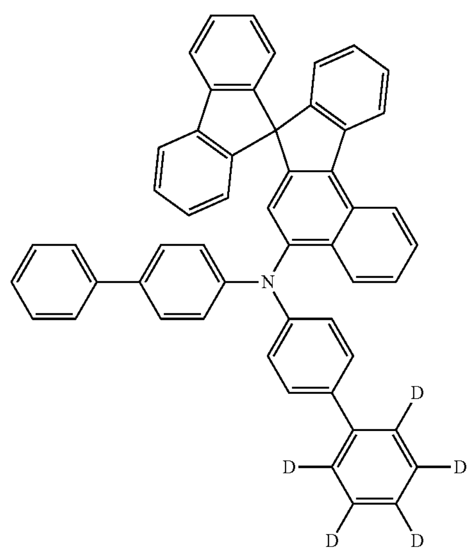

-continued
P5-57
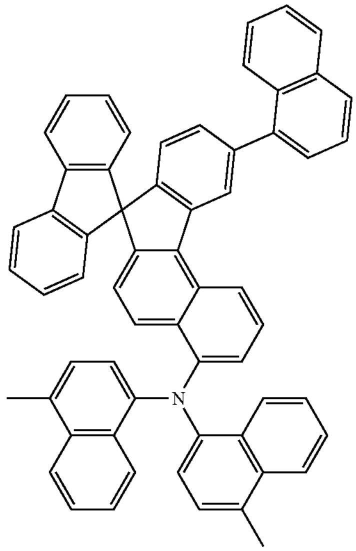
P5-58
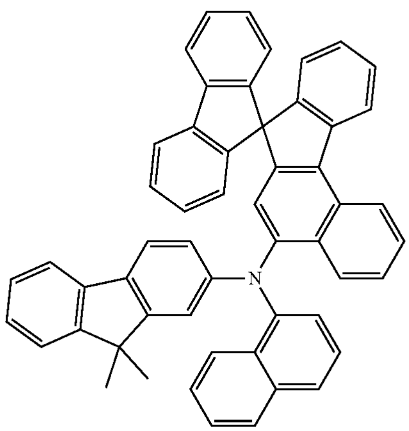
P5-59
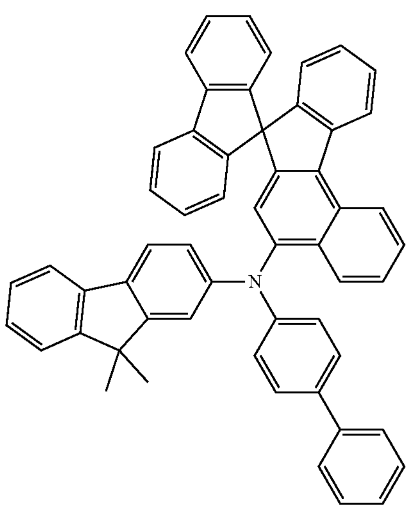
-continued
P5-60
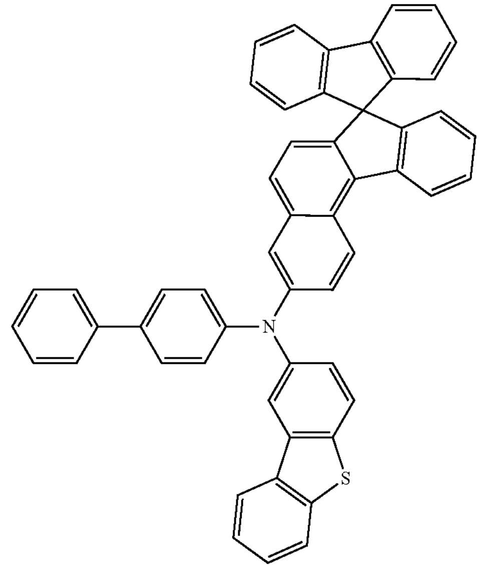
P5-61
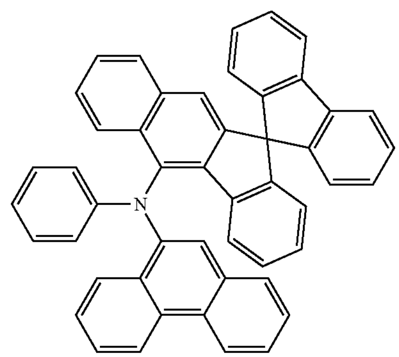
P5-62
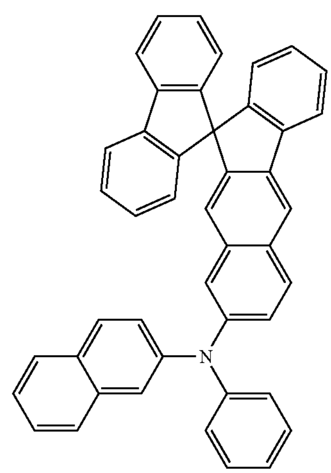

-continued
P5-63
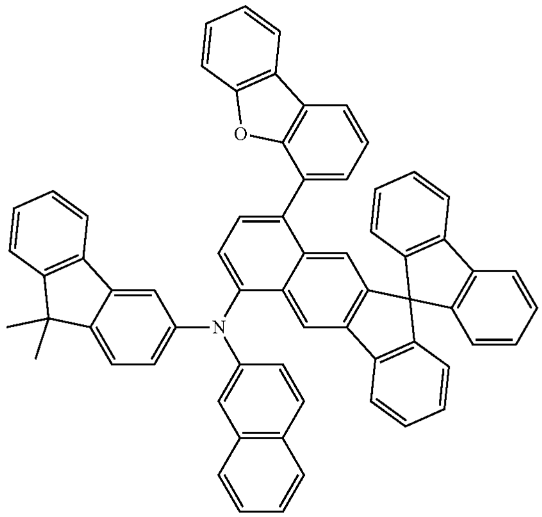
P5-64
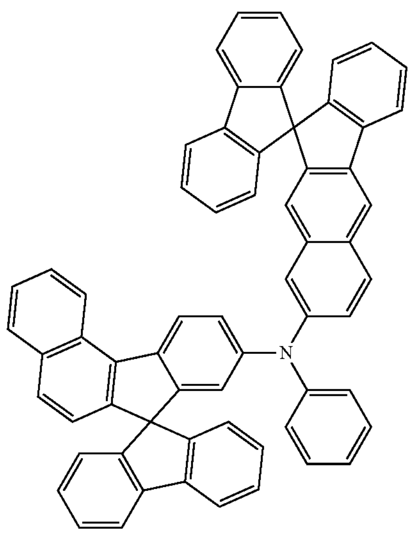
P5-65
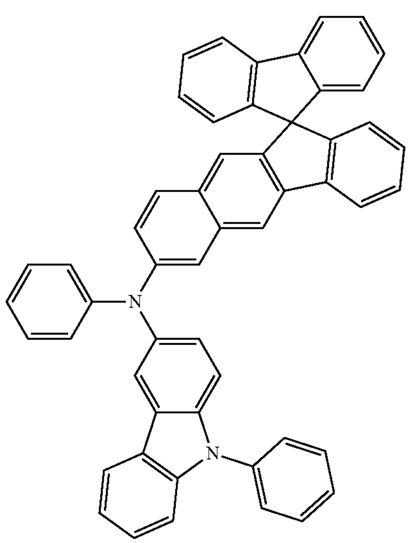
-continued
P5-66
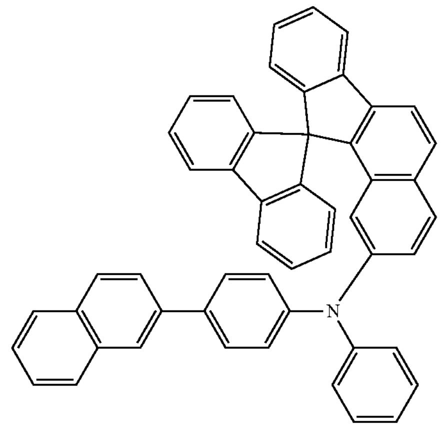
P5-67
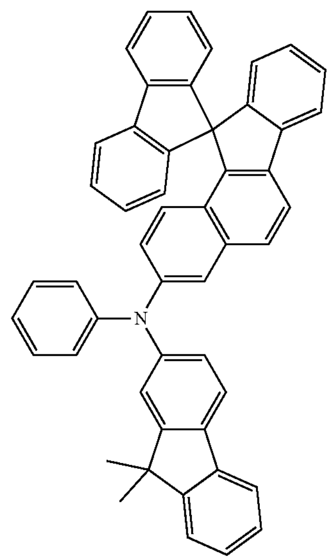
P5-68
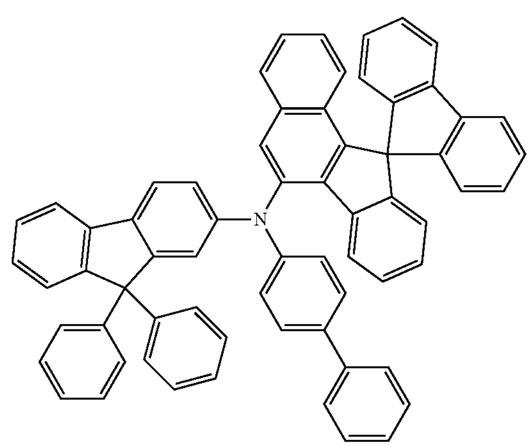

-continued
P5-69
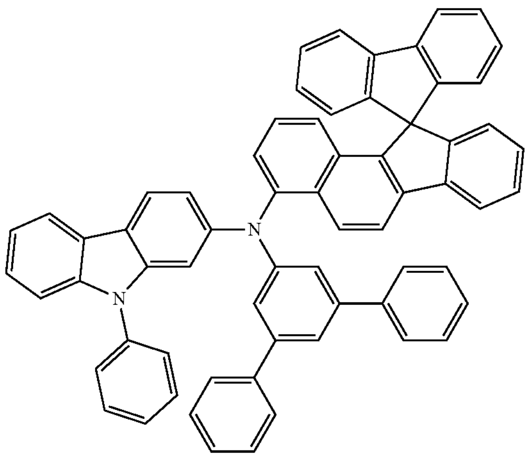
P5-70
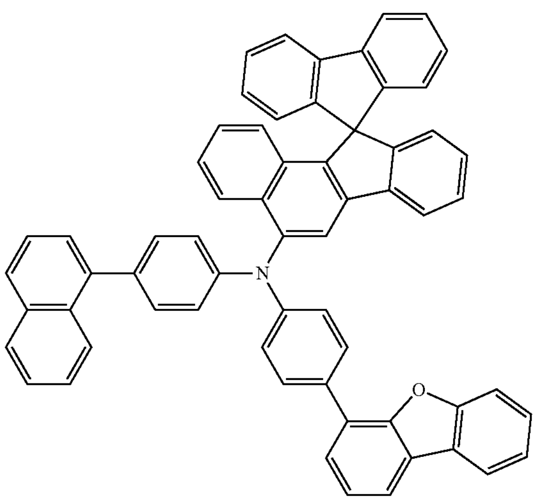
P5-71
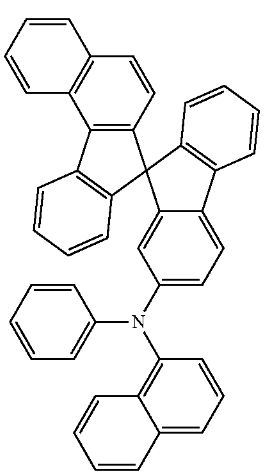
-continued
P5-72
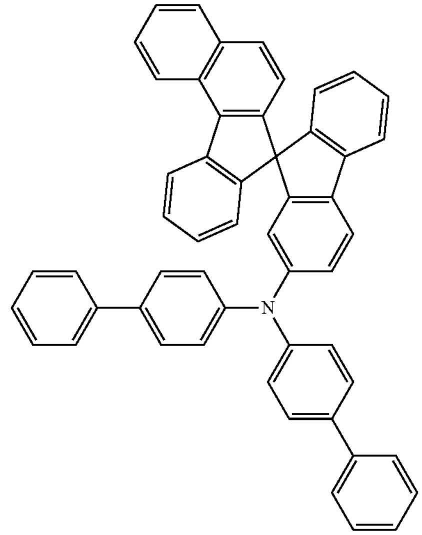
P5-73
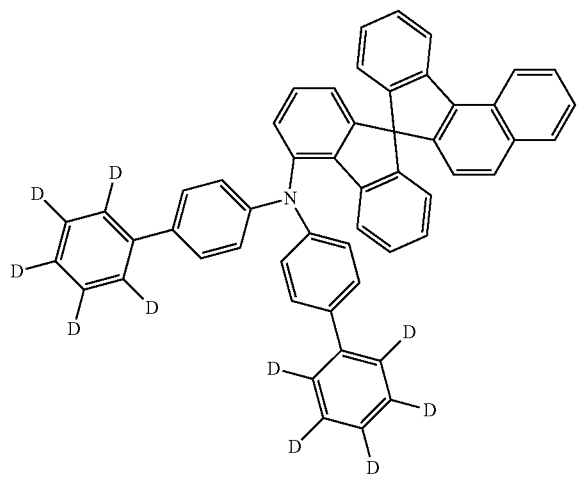
P5-74
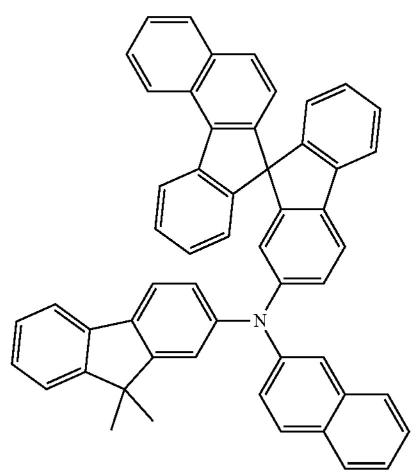

-continued
P5-75
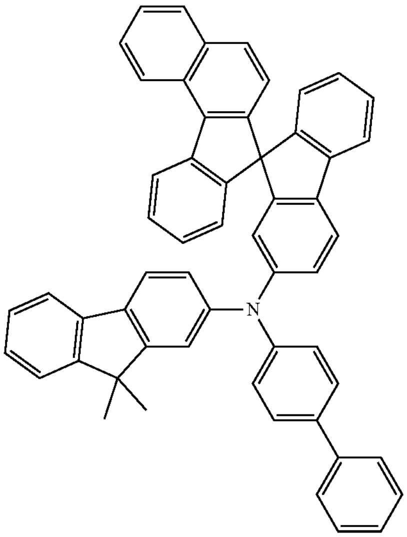
P5-76
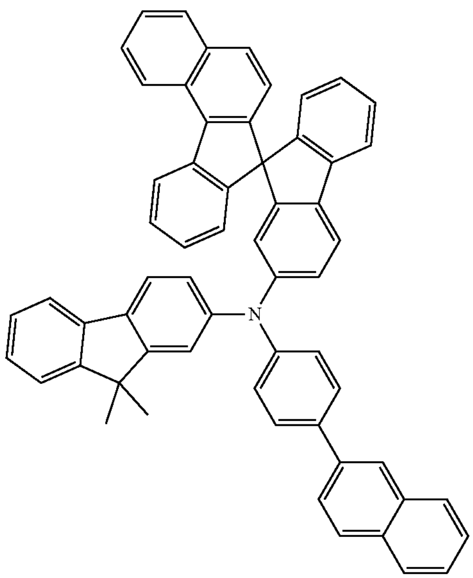
P5-77
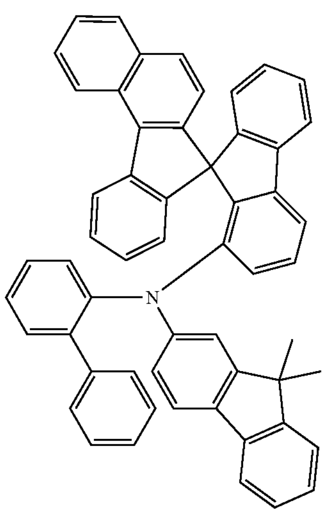
-continued
P5-78
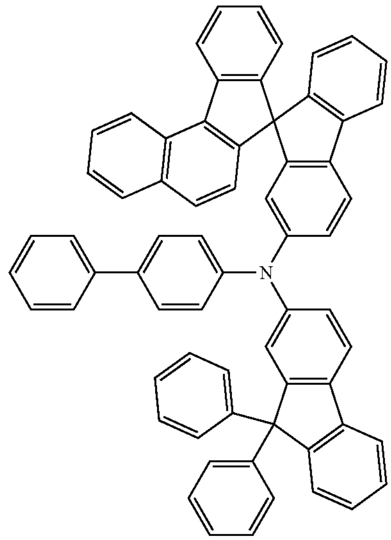
P5-79
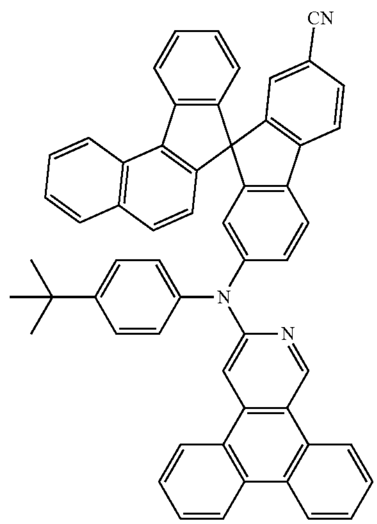
P5-80
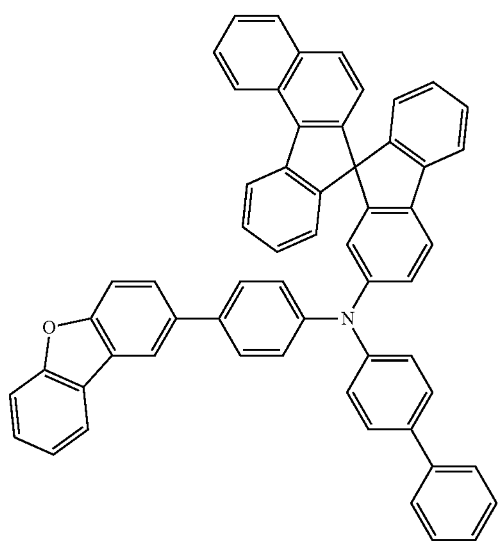

-continued
P5-81
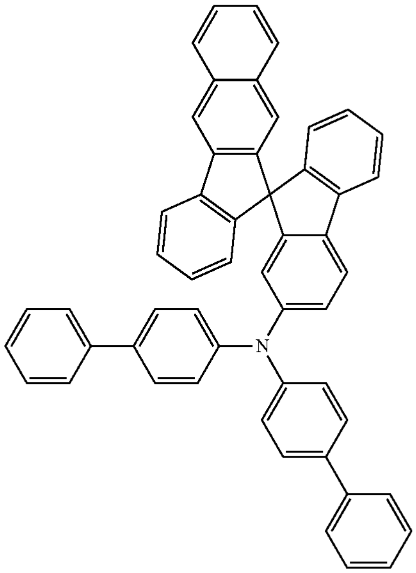
P5-82
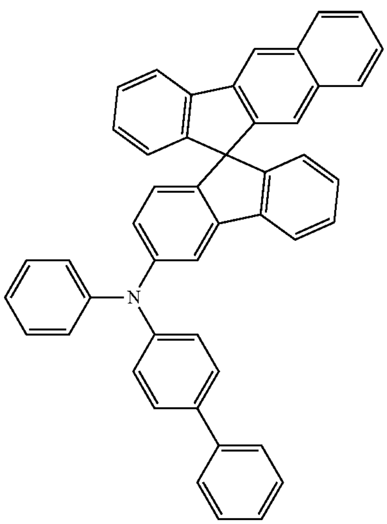
P5-83
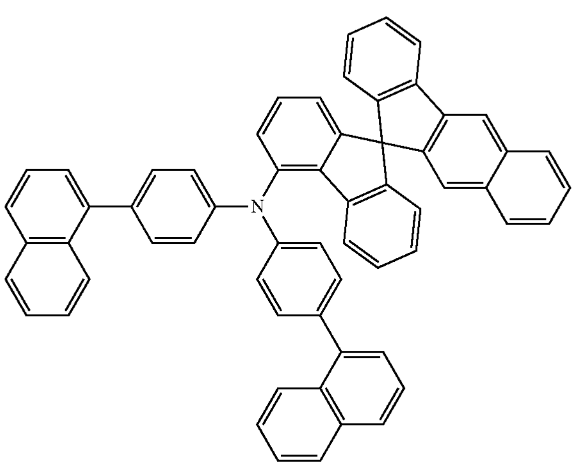
-continued
P5-84
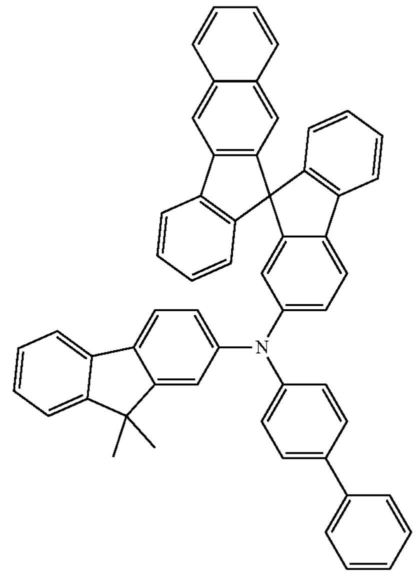
P5-85
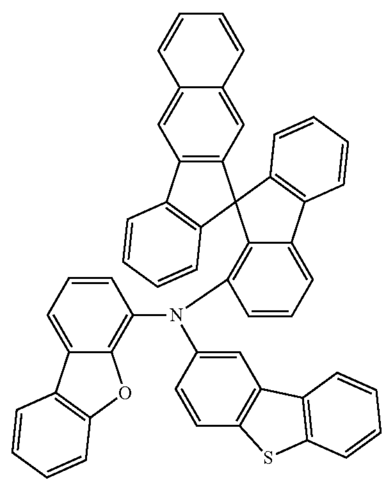
P5-86
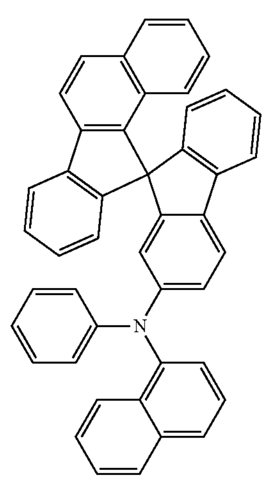

-continued
P5-87
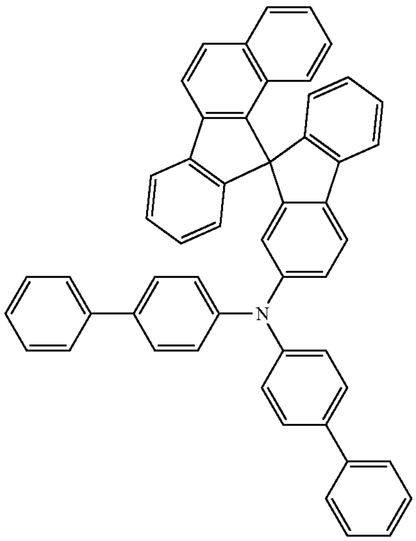
P5-88
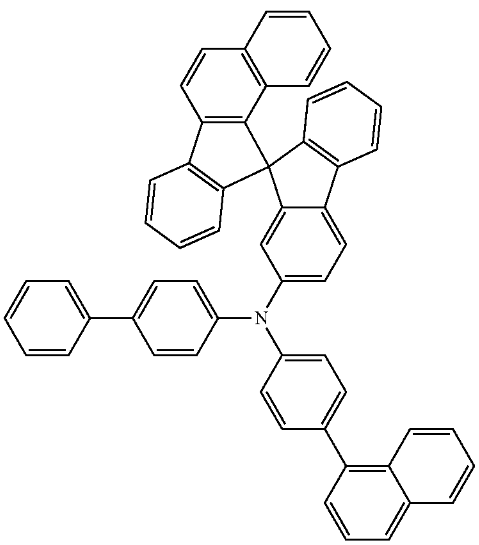
P5-89
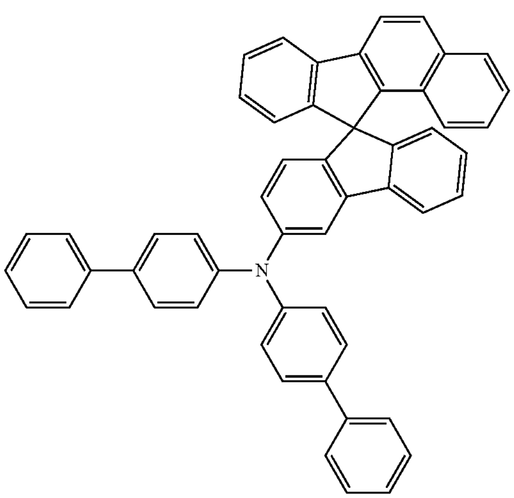
-continued
P5-90
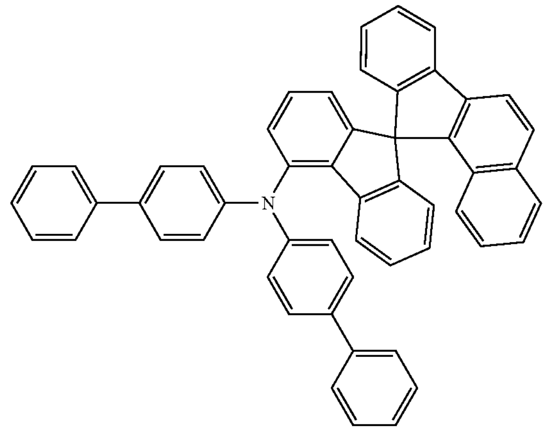
P5-91
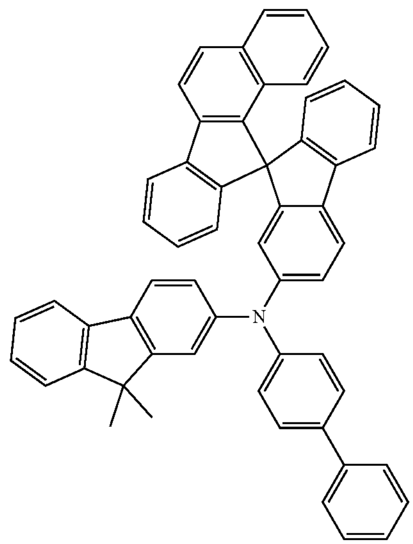
P5-92
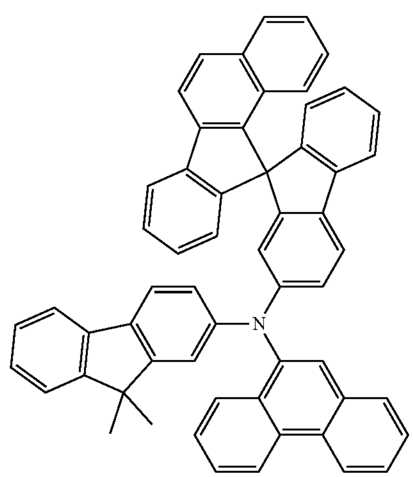

-continued
P5-93
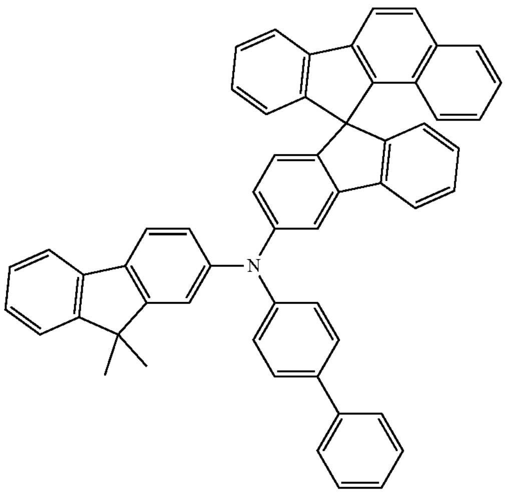
P5-94
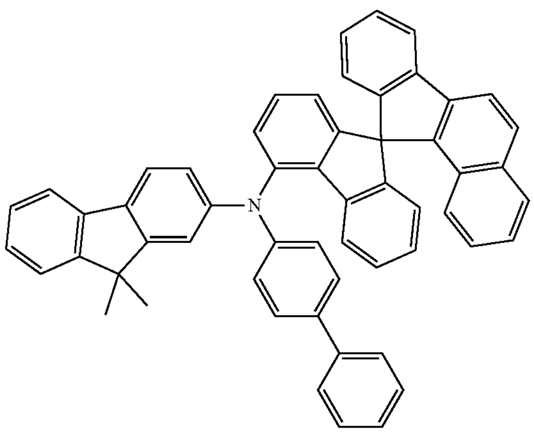
P5-95
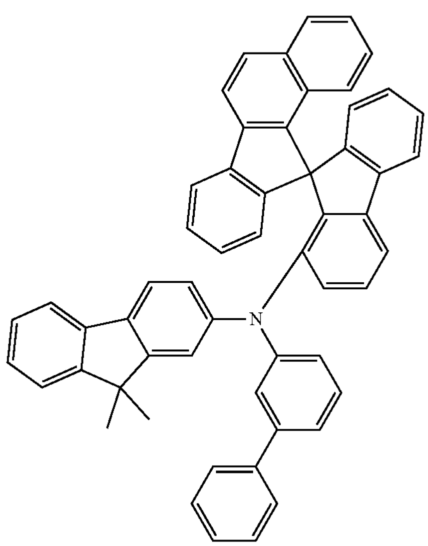
-continued
P5-96
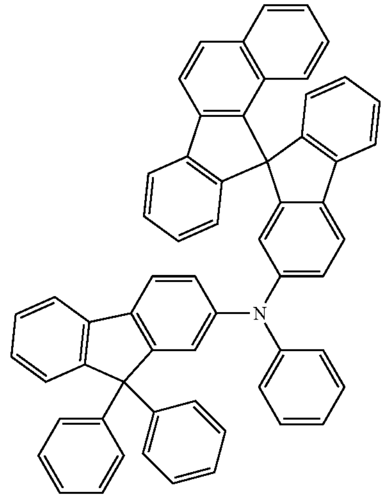
P5-97
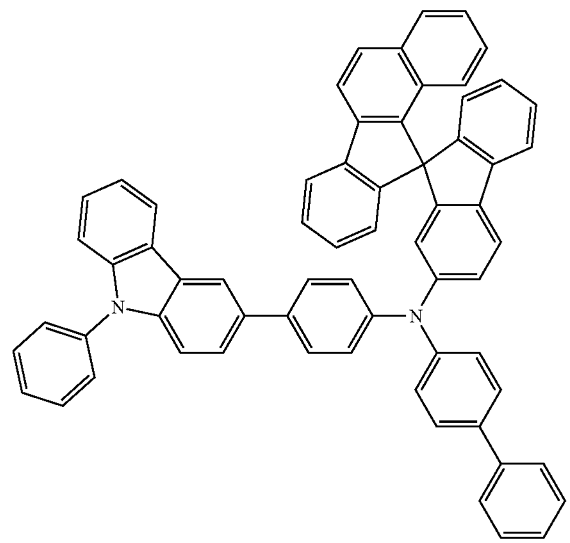
P5-98
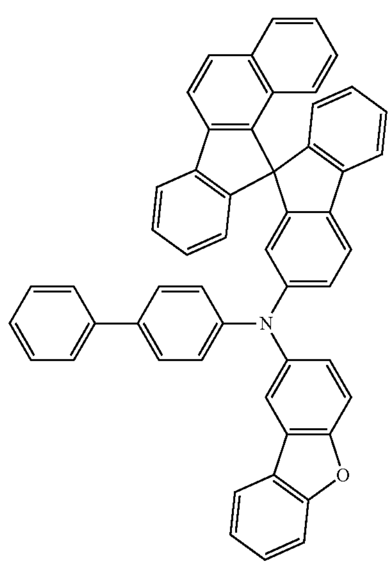

-continued
P5-99
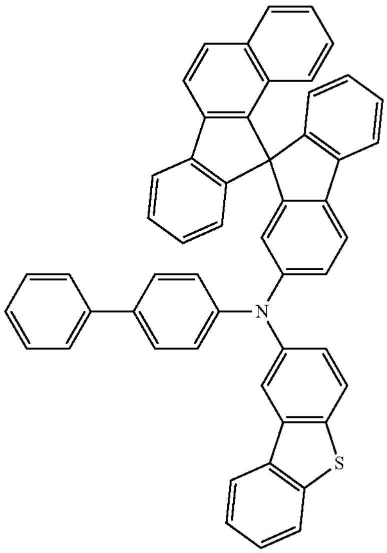
P5-100
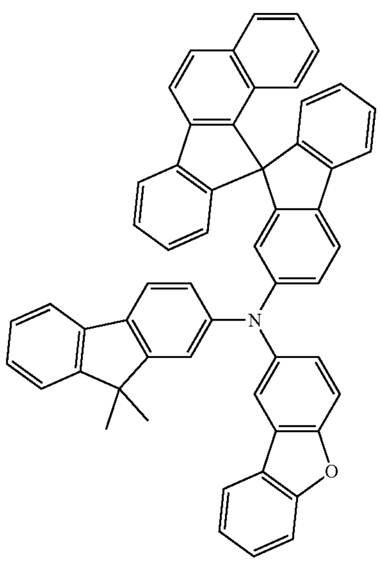
P5-101
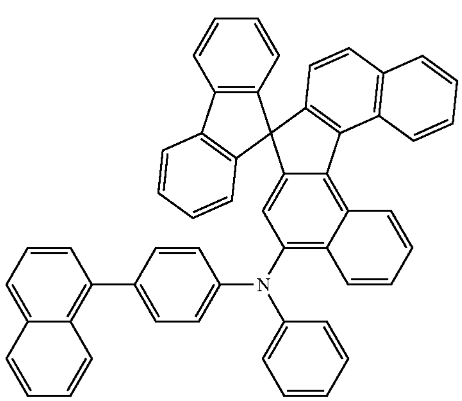
-continued
P5-102
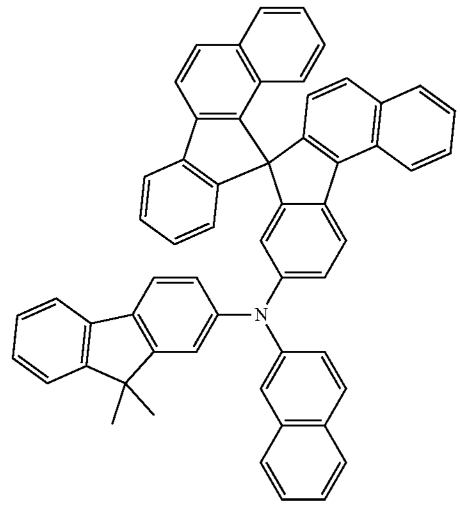
P5-103
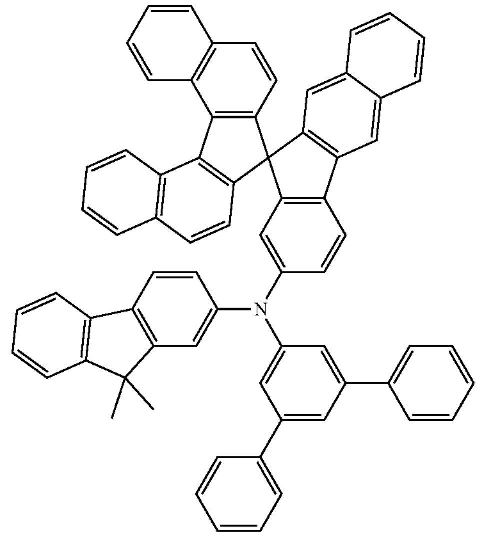
P5-104
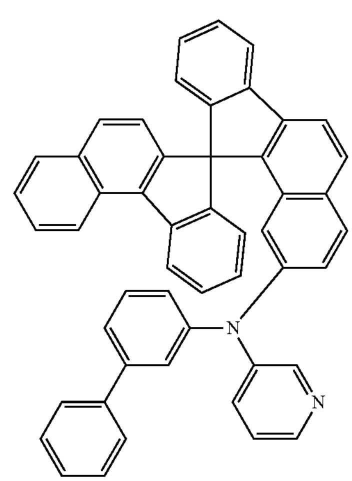

P5-105
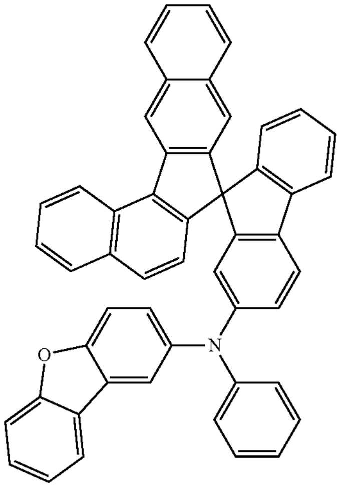
P5-106
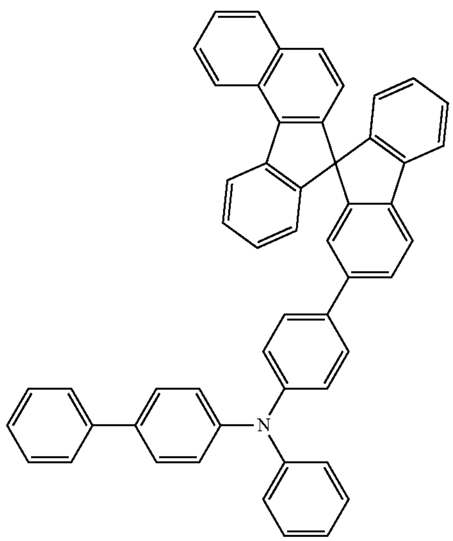
P5-107
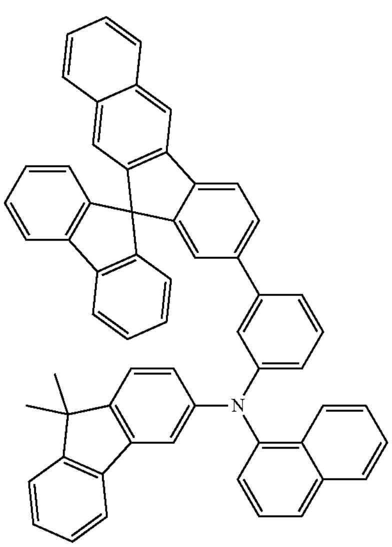
P5-108
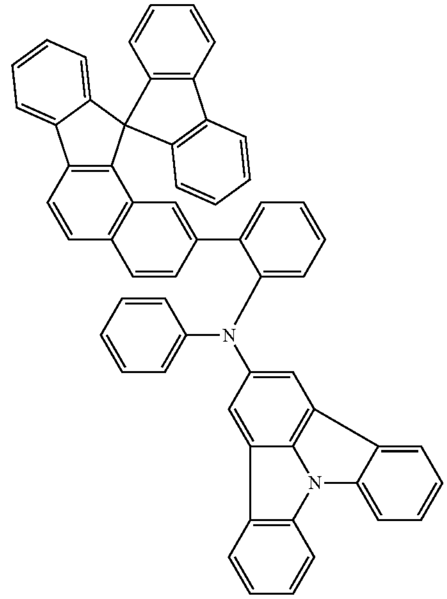
P5-109
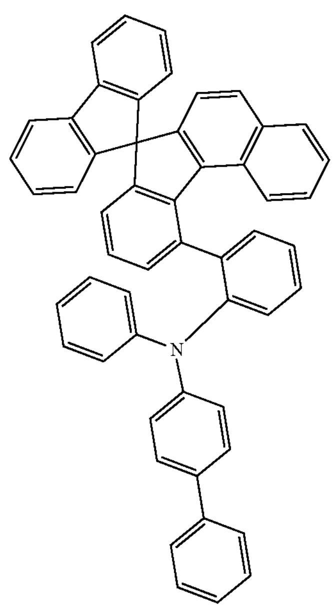

-continued
P5-110
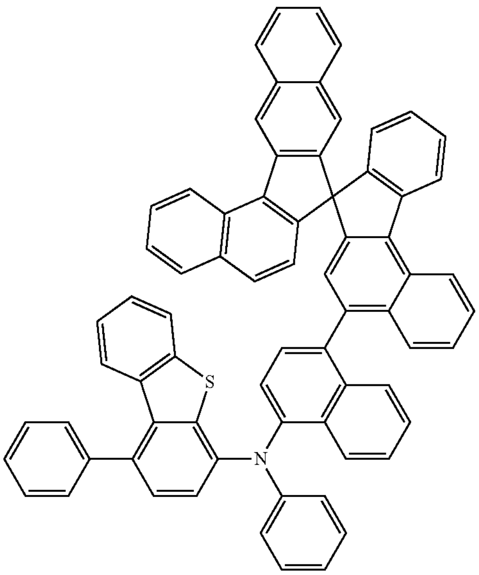
P5-111
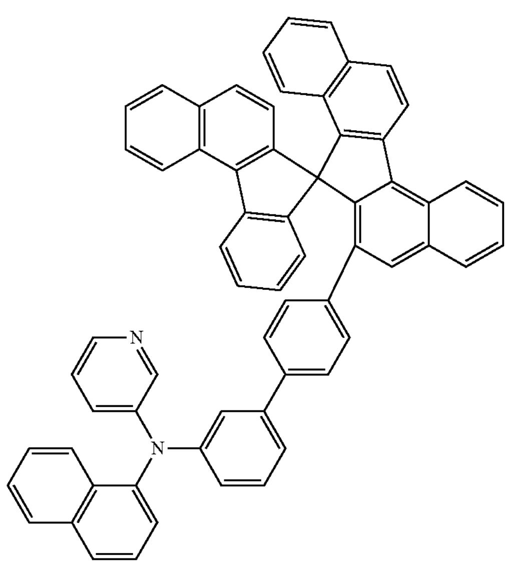
-continued
P5-112
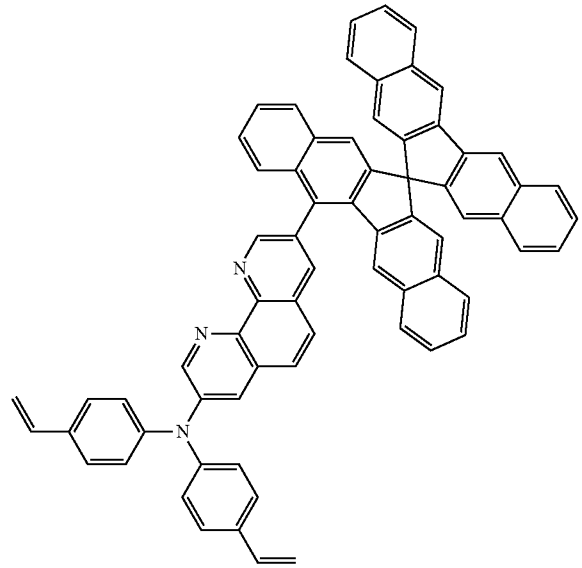
P5-113
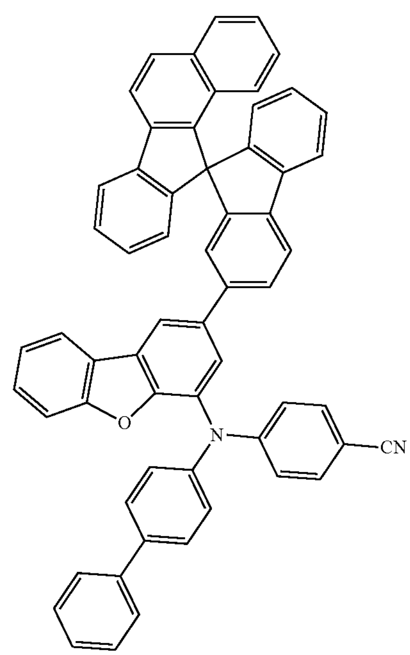

P5-114
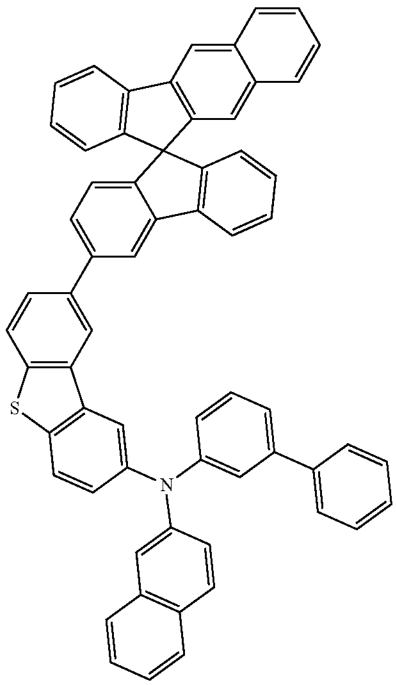
P5-115
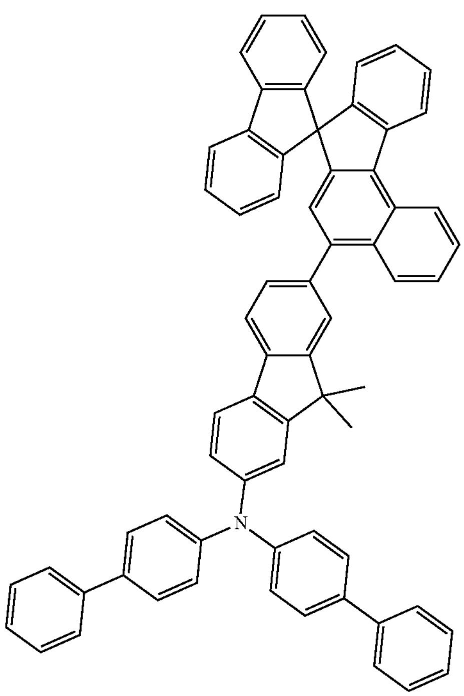
P6-1
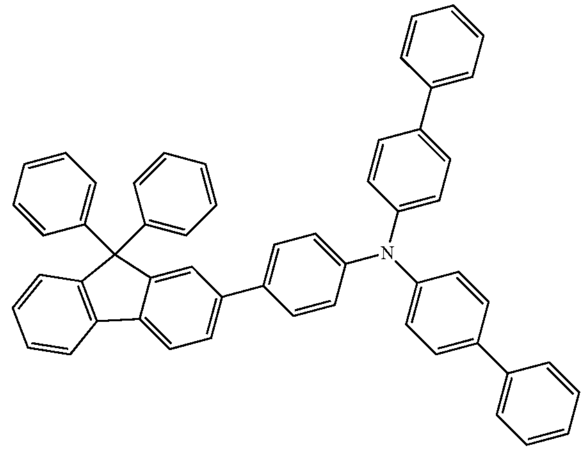
P6-2
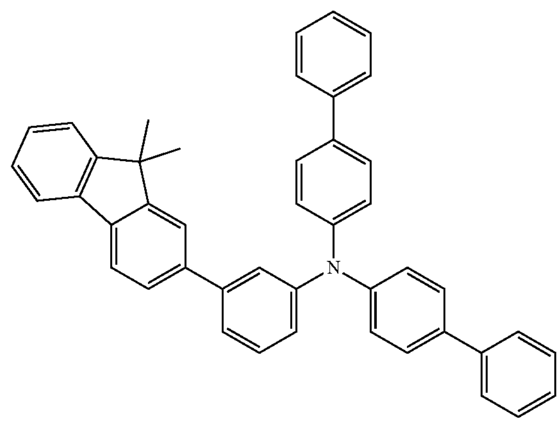
P6-3
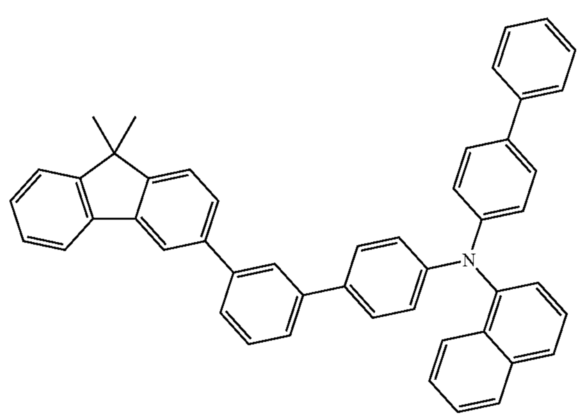

-continued
P6-4
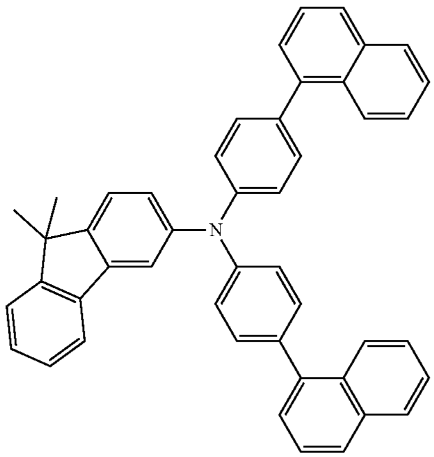
P6-5
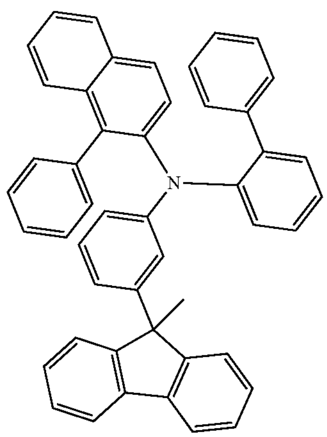
P6-6
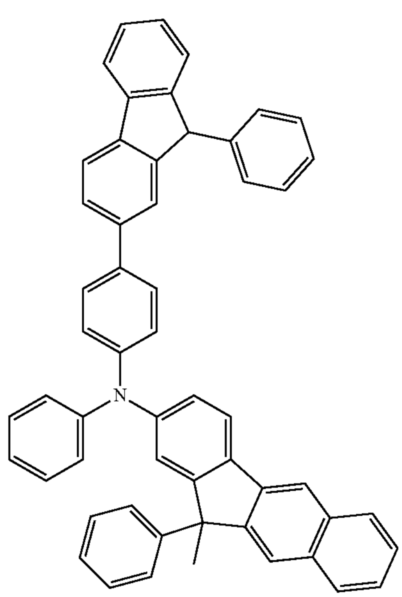
-continued
P6-7
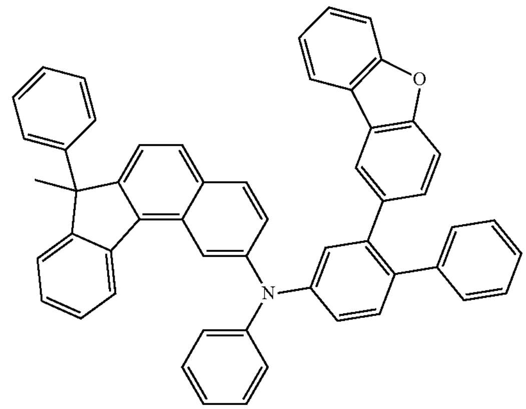
P6-8
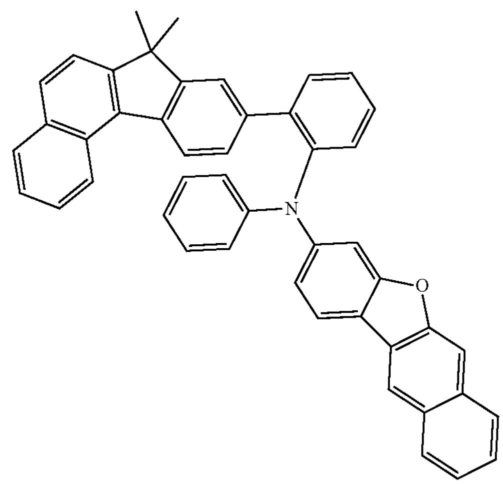
P6-9
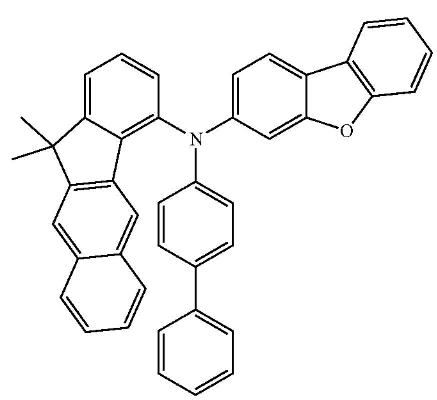

-continued
P6-10
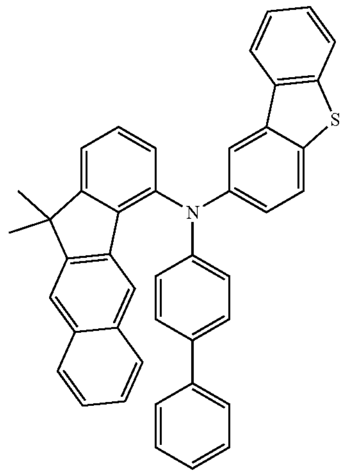
P6-11
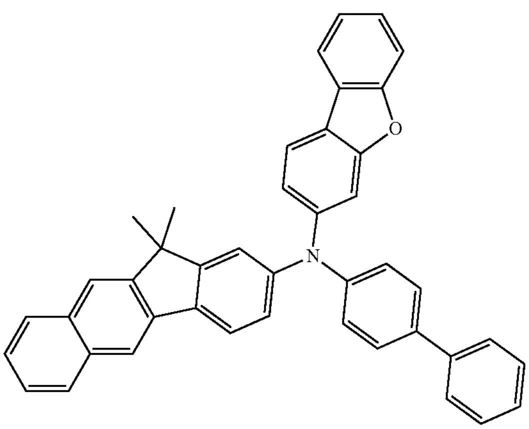
P6-12
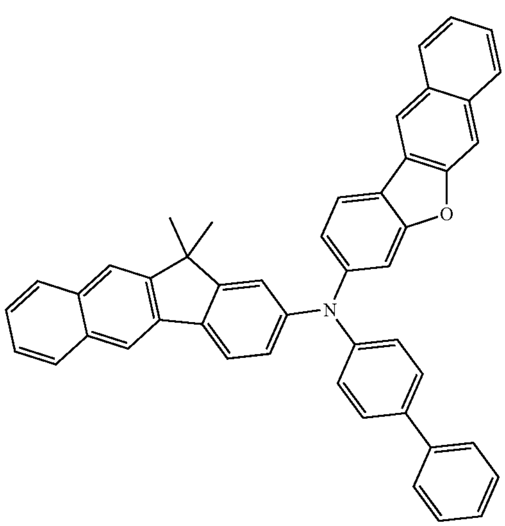
-continued
P6-13
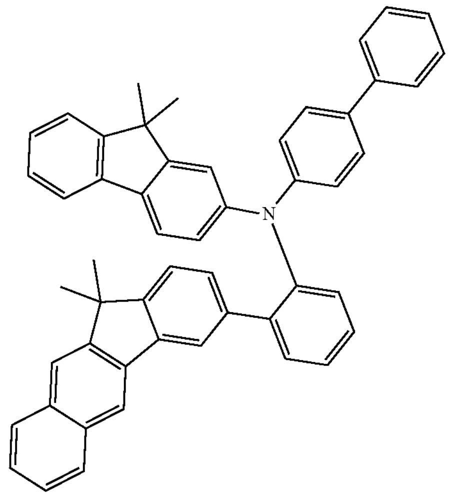
P6-14
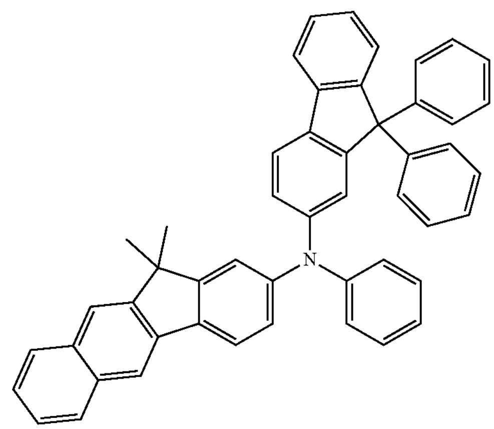
P6-15
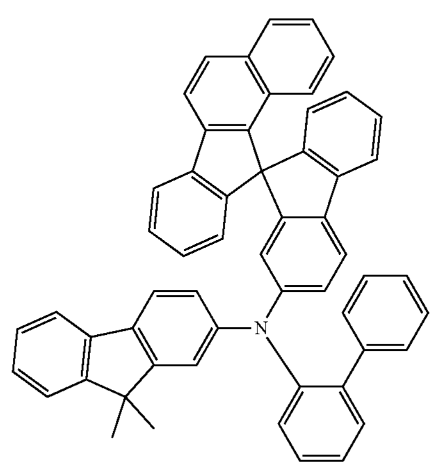

-continued
P6-16
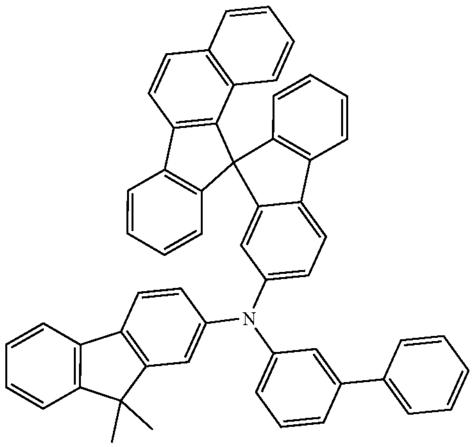
P6-17
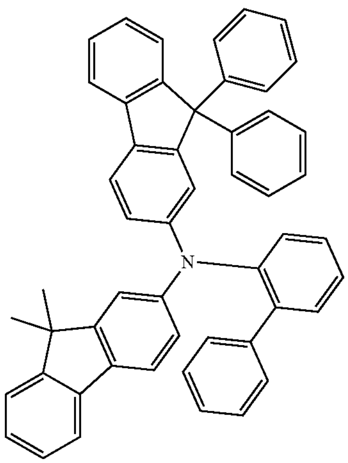
P6-18
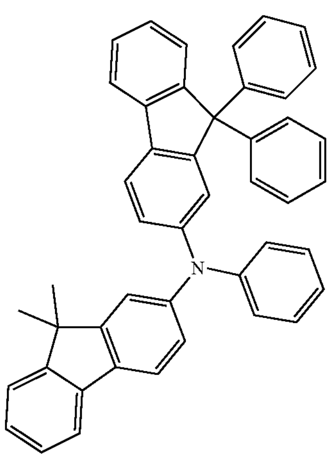
-continued
P6-19
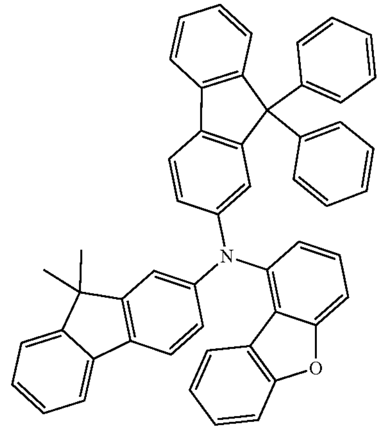
P6-20
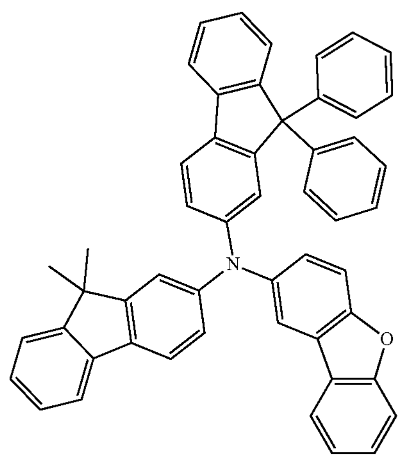
P6-21
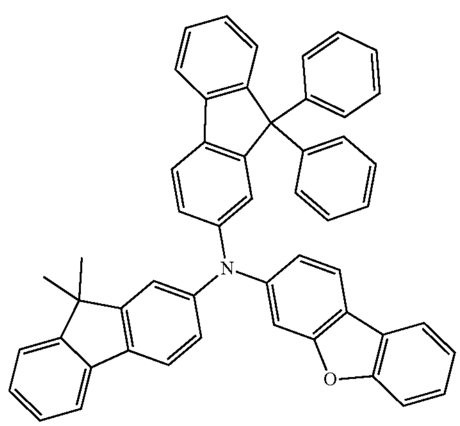

P6-22
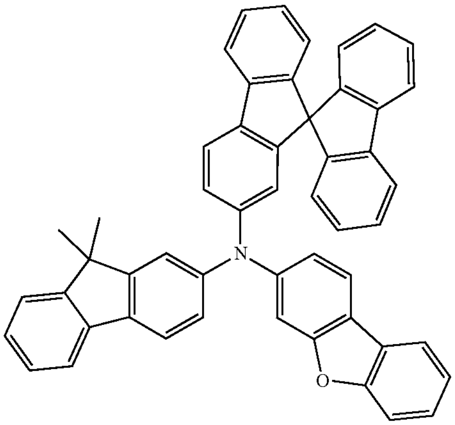
P6-23
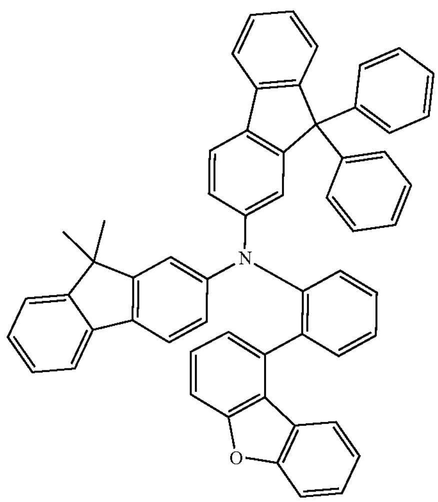
P6-24
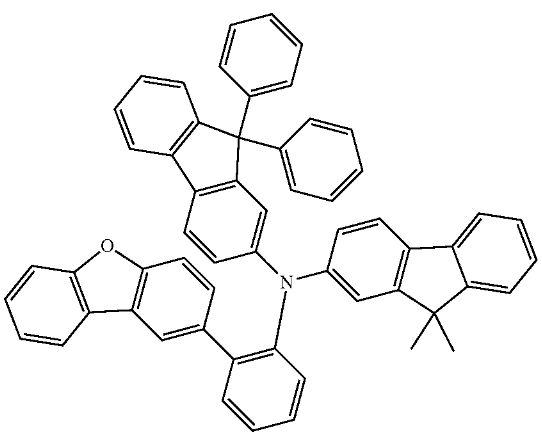
P6-25
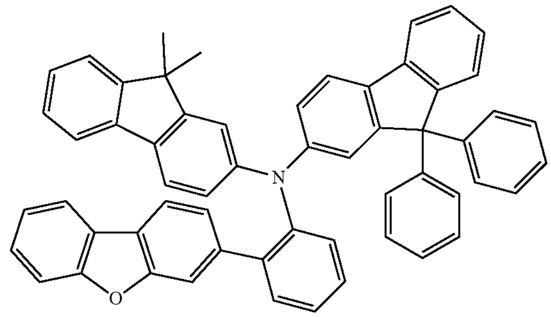
P6-26
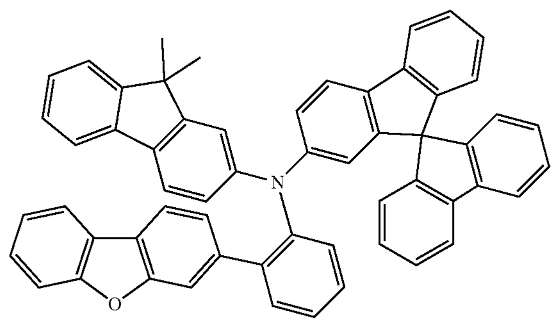
P6-27
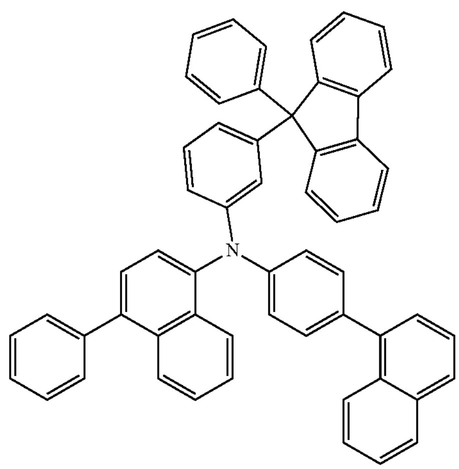
P6-28
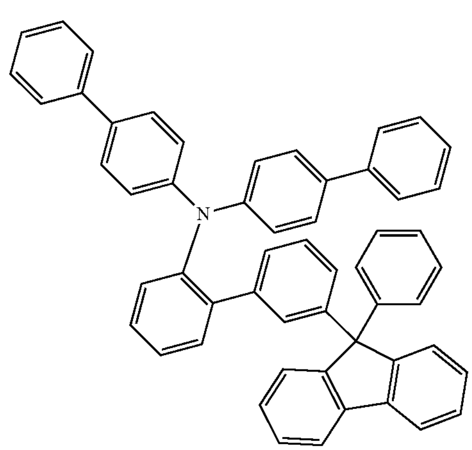

-continued
P6-29
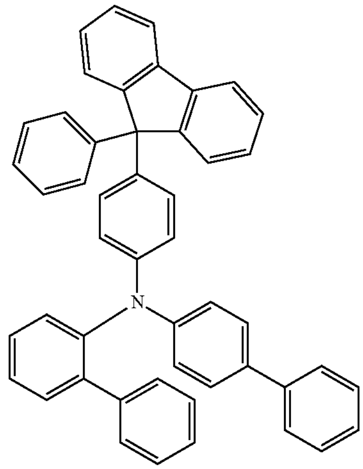
P6-30
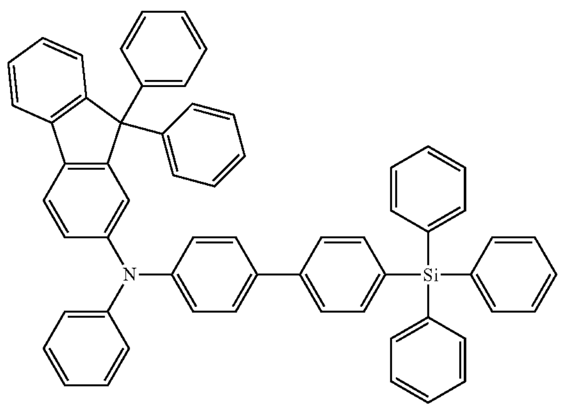
P6-31
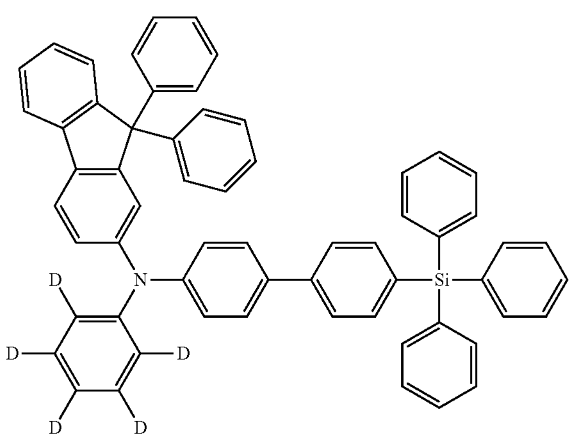
-continued
P6-32
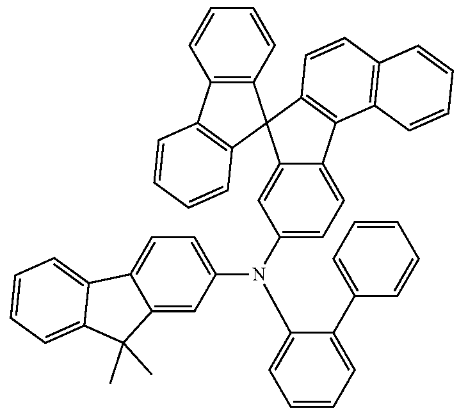
P6-33
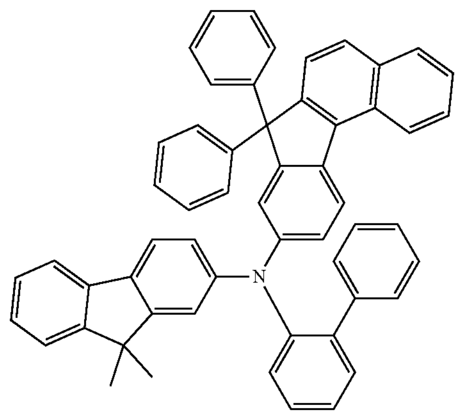
P6-34
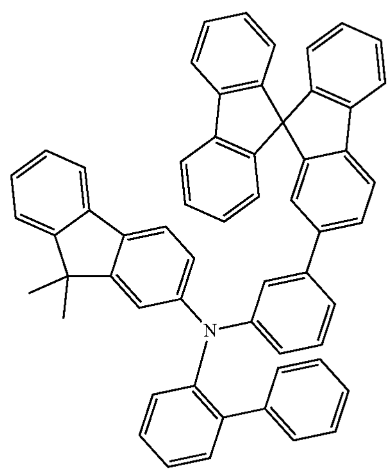
P6-35
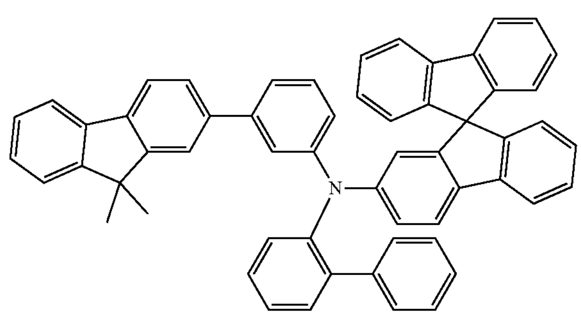

-continued

P6-36

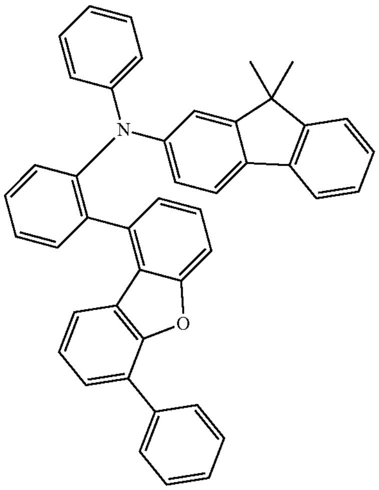

P6-37

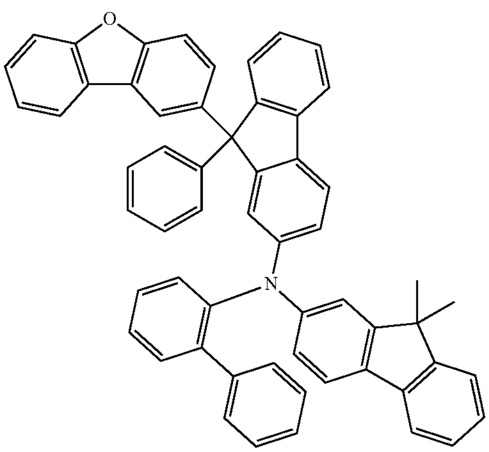

P6-38

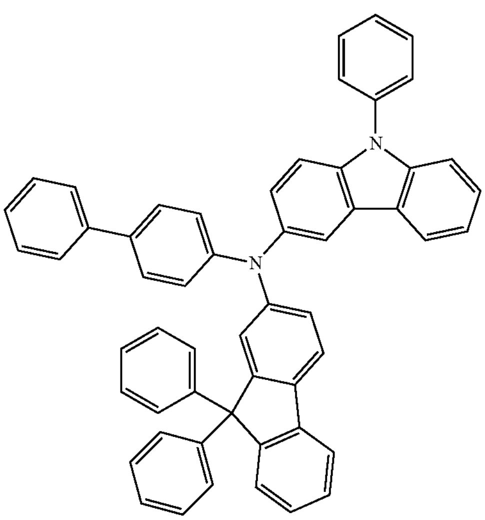

-continued

P6-39

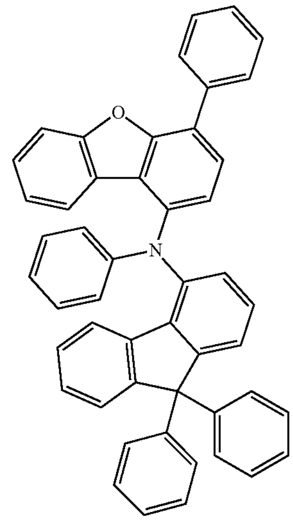

In these embodiments, the first hole transport layer 1411*a* may include the first doping material-doped layer 1411*aa* doped with the first doping material and the first doping material undoped layer 1411*ab* not doped with the first doping material.

At lease one of the first doping material-doped layer 1411*aa* and the first doping material undoped layer 1411*ab* may include the fourth compound. There is 5 to 15 parts by weight of the first doping material with respect to 100 parts by weight of the fourth compound.

In these embodiments, the first doping material-doped layer 1411*aa* may include the first compound represented by the Formula 20, and the first doping material undoped layer 1411*ab* may include the first compound represented by the Formula 1. There is 5 to 15 parts by weight of the first doping material with respect to 100 parts by weight of the first compound.

In these embodiments, the first doping material-doped layer 1411*aa* may include the fourth compound represented by the Formula 1, and the first doping material undoped layer 1411*ab* may include the fourth compound represented by the Formula 20. There is 5 to 15 parts by weight of the first doping material with respect to 100 parts by weight of the fourth compound.

In embodiments of the present disclosure, at least one of the first emission layer 1412, the second emission layer 1422, or the third emission layer 1432 may be a blue light emission layer. When at least one of the first to third emission layers is a blue light emission layer and the first hole transport layer 1411*a* meets the above-described thickness and doping conditions while including the first compound, an organic electronic device superior in terms of efficiency, lifespan, or color purity may be provided.

Herein, the blue light emission layer may refer to an emission layer that emits light having a wavelength ranging from about 450 nm to about 495 nm when excited by electron-hole recombination therein.

In embodiments of the present disclosure, the first emission layer 1412, the second emission layer 1422, and the third emission layer 1432 may emit blue light. When the first to third emission layers are blue light emission layers and the first hole transport layer 1411*a* meets the above-described thickness and doping conditions while including the first compound, an organic electronic device superior in efficiency, lifespan, or color purity may be provided.

In embodiments of the present disclosure, one or two of the first emission layer 1412, the second emission layer 1422, and the third emission layer 1432 may be blue light emission layers, and one or two of the first emission layer 1412, the second emission layer 1422, and the third emission layer 1432 may be green light emission layers. When one or two of the first emission layer 1412, the second emission layer 1422, and the third emission layer 1432 are blue light emission layers, one or two of the first emission layer 1412, the second emission layer 1422, and the third emission layer 1432 are green light emission layers, and the first hole transport layer 1411*a* meets the above-described thickness and doping conditions while including the first compound, an organic electronic device superior in efficiency, lifespan, or color purity may be provided.

Herein, the green light emission layers may refer to emission layers each of which emits light having a wavelength ranging from about 495 nm to about 570 nm when excited by electron-hole recombination therein.

In embodiments of the present disclosure, two emission layers of the first emission layer 1412, the second emission layer 1422, and the third emission layer 1432 may be blue light emission layers, and the remaining one emission layer of the first emission layer 1412, the second emission layer 1422, and the third emission layer 1432 may be a green light emission layer. When two emission layers of the first emission layer 1412, the second emission layer 1422, and the third emission layer 1432 are blue light emission layers, the remaining one emission layer of the first emission layer 1412, the second emission layer 1422, and the third emission layer 1432 is a green light emission layer, and the first hole transport layer 1411*a* or the first auxiliary emission layer 1411*b* meets the above-described thickness and doping conditions while including the first compound, an organic electronic device superior in efficiency, lifespan, or color purity may be provided.

In embodiments of the present disclosure, when two emission layers of the first emission layer 1412, the second emission layer 1422, and the third emission layer 1432 are blue light emission layers and the remaining emission layer is a green light emission layer, the green light emission layer may be positioned between the two blue light emission layers. When the first hole transport layer 1411*a* includes the first compound and meets the above-described thickness and doping conditions while the first to third emission layers meet the above-described conditions, an organic electronic device superior in efficiency, lifespan, or color purity may be provided.

In embodiments of the present disclosure, at least one of the first emission layer 1412, the second emission layer 1422, or the third emission layer 1432 may be a multi-emission layer emitting green light and blue light.

Herein, the multi-emission layer emitting green light and blue light may refer to an emission layer emitting light having a wavelength ranging from about 450 nm to about 570 nm when excited by electron-hole recombination therein.

When at least one of the first emission layer 1412, the second emission layer 1422, or the third emission layer 1432 is a multi-emission layer emitting green light and blue light and the first hole transport layer 1411*a* meets the above-described thickness and doping conditions while including the first compound, an organic electronic device superior in efficiency, lifespan, or color purity may be provided.

Hereinafter, the present disclosure will be described in detail with reference to, but is not limited to, examples of synthesis of the compound of the hole transport layer and examples of preparation of the organic electronic device.

SYNTHESIS EXAMPLES

Synthesis Example 1

The final product represented by Formula 20 according to the present disclosure may be synthesized by, but is not limited to, the following Reaction Formula 1.

[Reaction Formula 1]

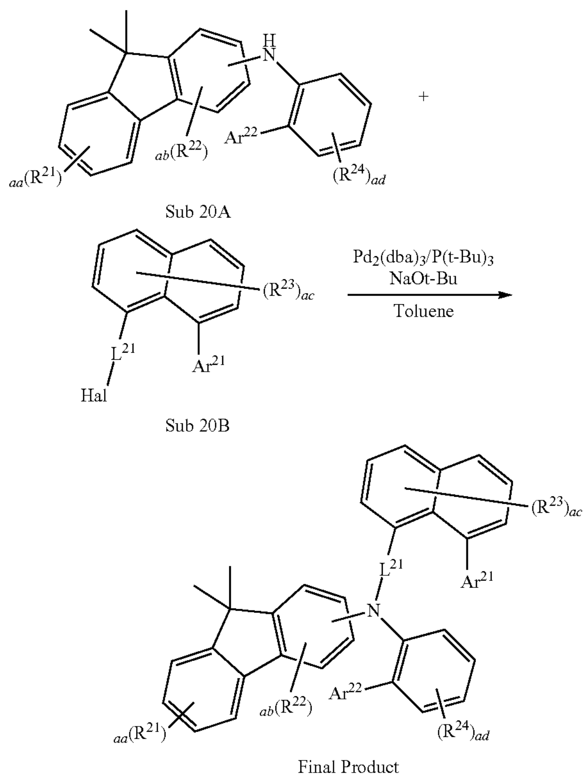

In the following Reaction Formula 1, Hal is I, Br, or Cl, $R^{21}$~$R^{24}$ and aa~ad, $L^{21}$, $Ar^{21}$, $Ar^{22}$ are the same as $R^{21}$~$R^{24}$ and aa~ad, $L^{21}$, $Ar^{21}$, $Ar^{22}$ defined above in the description of Formula 20.

I. Synthesis of Sub 20A

Sub 20A of Reaction Formula 1 is synthesized through, but not limited to, a reaction path of the following Reaction Formula 2. Hal is I, Br or Cl.

[Reaction Formula 2]

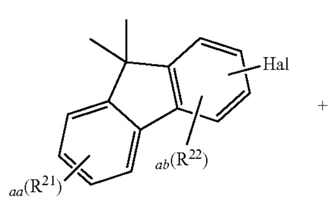

Sub 20a

-continued

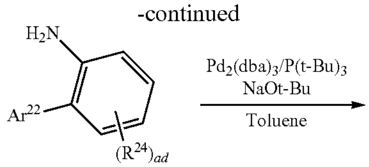

Sub 20aa

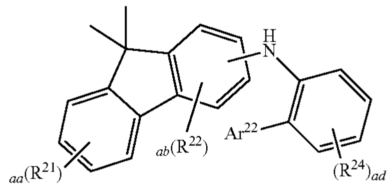

Sub 20A

1. Example of Synthesis of Sub 20A1

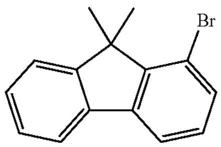

Sub 20A 1-5a

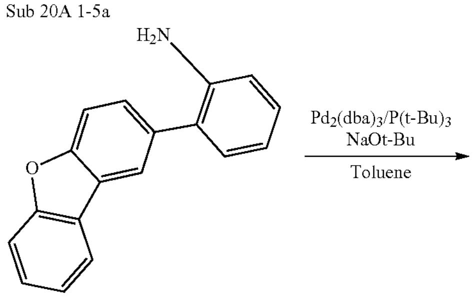

Sub 20A 1-5b

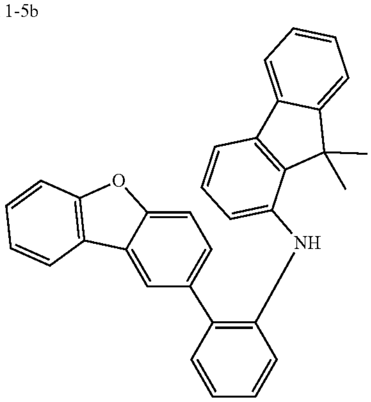

Sub 20A 1-5

After dissolving Sub 20A 1-5a (50.0 g, 183.0 mmol) with toluene (915 mL) in a round-bottom flask, Sub 20A 1-5b (45.9 g, 183.0 mmol), $Pd_2(dba)_3$(5.0 g, 5.5 mmol)), $P(t\text{-}Bu)_3$(2.2 g, 11.0 mmol), and NaOt-Bu (35.2 g, 366.1 mmol) were added and stirred at 120° C. When the reaction was completed, extraction was performed with $CH_2Cl_2$ and water, and then an organic layer was dried with $MgSO_4$ and concentrated. The resultant organic matter was subjected to silica gel column chromatography and recrystallization to create a product in an amount of 60.8 g. (Yield: 73.5%)

2. Example of Synthesis of Sub 20A 1-23

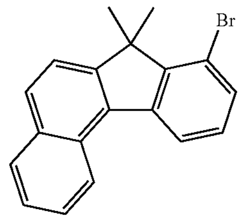

Sub 20A 1-23a

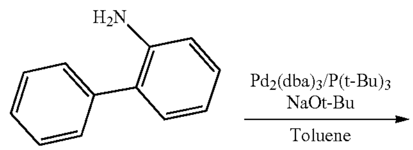

Sub 20A 1-23b

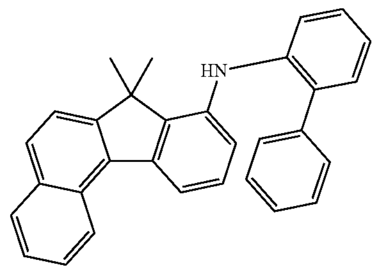

Sub 20A 1-23

After adding Sub 20A 1-23a (50.0 g, 154.7 mmol) and Sub 20A 1-23b (25.3 g, 154.7 mmol), $Pd_2(dba)_3$ (4.3 g, 4.6 mmol), $P(t\text{-}Bu)_3$ (1.9 g, 9.3 mmol), NaOt-Bu (29.7 g, 309.4 mmol), and toluene (773 mL) in a round-bottom flask, the same procedure as in Sub 20A 1-5 was performed to create a product in an amount of 46.0 g. (Yield: 72.2%)

3. Example of Synthesis of Sub 20A 2-4

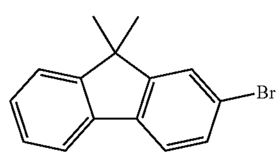

Sub 20A 2-4a

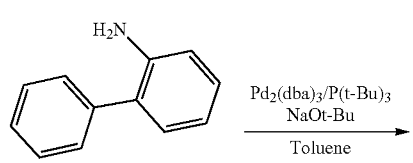

Sub 20A 1-23b

-continued

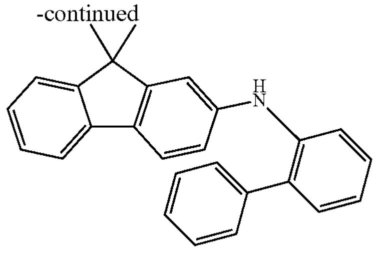

Sub 20A 2-4

After adding Sub 20A 2-4a (50.0 g, 183.0 mmol) and Sub 20A 1-23b (43.4 g, 183.0 mmol), $Pd_2(dba)_3$ (5.0 g, 5.5 mmol), $P(t\text{-}Bu)_3$(2.2 g, 11.0 mmol), NaOt-Bu (35.2 g, 366.1 mmol), and toluene (915 mL) in a round bottom flask, the same procedure as in Sub 20A 1-5 was performed to create a product in an amount of 57.3 g. (Yield: 71.5%)

4. Example of Synthesis of Sub 20A 2-13

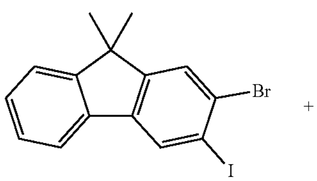

Sub 20A 2-13′

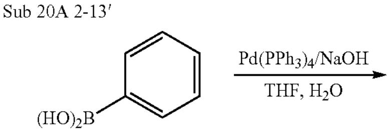

Sub 20A 2-13″

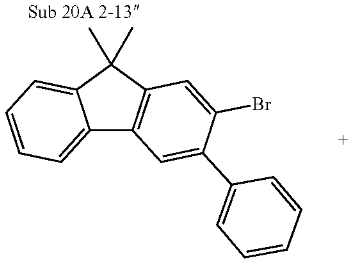

Sub 20A 2-13a

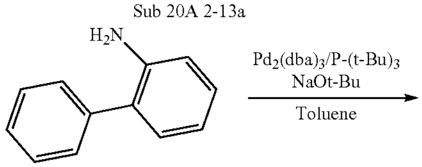

Sub 20A 1-23b

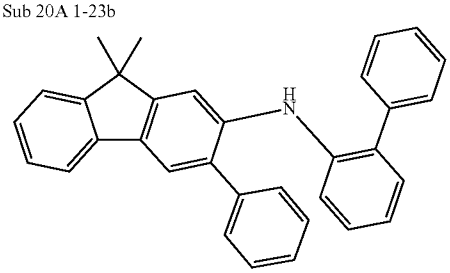

Sub 20A 2-13

1) Synthesis of Sub 20A 2-13a

After adding Sub 20A 2-13' (50.0 g, 125.3 mmol) in a round-bottom flask and dissolving it in THF (626 ml), then Sub 20A 2-13" (15.3 g, 125.33 mmol), $Pd(PPh_3)_4$ (8.7 g), 7.5 mmol), NaOH (15.0 g, 375.9 mmol), and water (313 ml) were added and the reaction was performed at 80° C. After the reaction was completed, the organic layer was extracted with $CH_2Cl_2$ and water, dried over MgSO4 and concentrated, the resultant organic material was recrystallized using silicagel column to create a product in an amount of 36.2 g. (Yield: 82.7%)

2) Synthesis of Sub 20A 2-13

After adding Sub 20A 2-13a (30.0 g, 85.9 mmol) and Sub 20A 1-23b (14.0 g, 85.9 mmol), $Pd_2(dba)_3$ (2.4 g, 2.6 mmol), $P(t\text{-}Bu)_3$ (1.0 g, 5.2 mmol), NaOt-Bu (16.5 g, 171.8 mmol), toluene (429 mL) in a round-bottom flask, the same procedure as in Sub 20A 1-5 was performed to create a product in an amount of 25.9 g. (Yield: 68.9%)

5. Example of Synthesis of Sub 20A 2-52

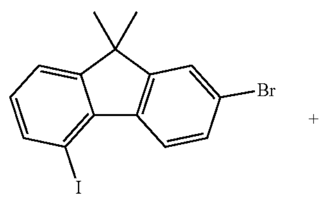

Sub 20A 2-52′

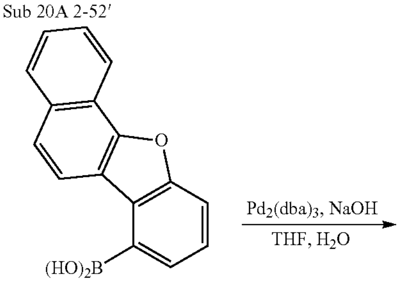

Sub 20A 2-52″

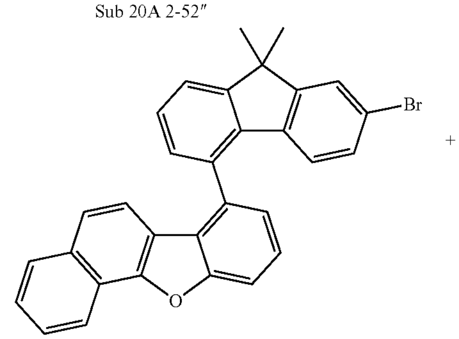

Sub 20A 2-52a

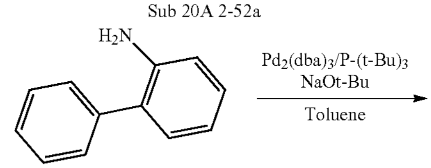

Sub 20A 1-23b

-continued

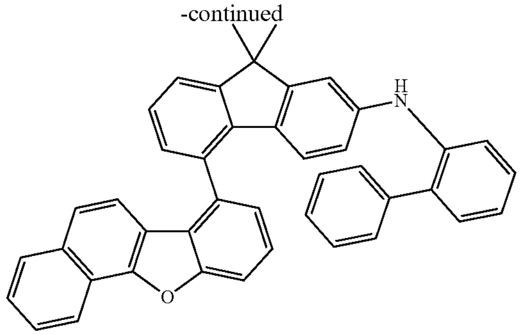

Sub 20A 2-52

1) Synthesis of Sub 20A 2-52a

After putting Sub 20A 2-52' (50.0 g, 125.3 mmol) in a round-bottom flask, dissolving it in THF (626 ml), and adding Sub 20A 2-52" (32.8 g, 125.3 mmol), $Pd(PPh_3)_4$ (8.7 g), 7.5 mmol), NaOH (15.0 g, 375.9 mmol), and water (313 ml), the same procedure as in Sub 20A 2-13a was performed to create a product in an amount of 48.1 g. (Yield: 78.5%)

2) Synthesis of Sub 20A 2-52

After adding Sub 20A 2-52a (30.0 g, 61.3 mmol) and Sub 20A 1-23b (15.5 g, 61.3 mmol), $Pd_2(dba)_3$ (1.7 g, 1.8 mmol), $P(t\text{-}Bu)_3$ (0.7 g, 3.7 mmol), NaOt-Bu (11.8 g, 122.6 mmol), toluene (306 mL) in a round-bottom flask, the same procedure as in Sub 20A 1-5 was performed to create a product in an amount of 24.2 g. (Yield: 68.3%)

6. Synthesis of Sub 20A 2-64

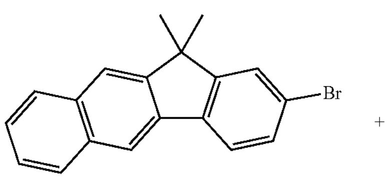

Sub 20A 2-64a

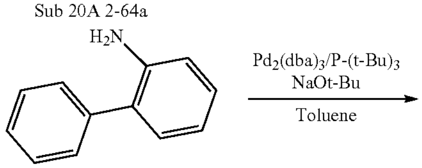

Sub 20A 1-23b

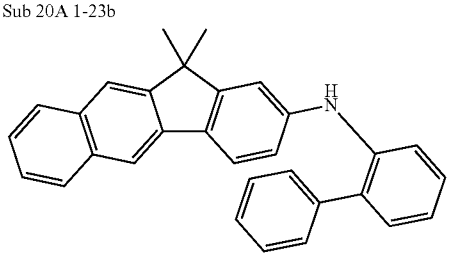

Sub 20A 2-64

After adding Sub 20A 2-64a (50.0 g, 154.7 mmol) and Sub 20A 1-23b (25.3 g, 154.7 mmol), $Pd_2(dba)_3$ (4.3 g, 4.6 mmol), $P(t\text{-}Bu)_3$ (1.9 g, 9.3 mmol), NaOt-Bu (29.7 g, 309.4 mmol), toluene (773 mL) in a round-bottom flask, the same procedure as in Sub 20A 1-5 was performed to create a product in an amount of 45.1 g. (Yield: 70.9%)

7. Example of Synthesis of Sub 20A 3-14

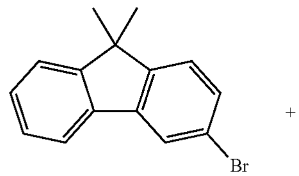

Sub 20A 3-14a

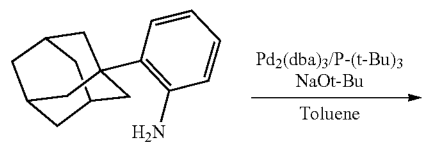

Sub 20A 3-14b

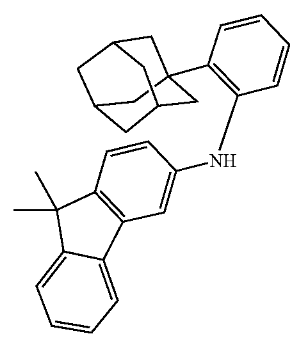

Sub 20A 3-14

After adding Sub 20A 3-14a (50.0 g, 183.0 mmol) and Sub 20A 3-14b (40.2 g, 183.0 mmol), $Pd_2(dba)_3$ (5.0 g, 5.5 mmol), $P(t\text{-}Bu)_3$ (2.2 g, 11.0 mmol), NaOt-Bu (35.2 g, 366.1 mmol), toluene (915 mL) in a round-bottom flask, the same procedure as in Sub 20A 1-5 was performed to create a product in an amount of 51.8 g. (Yield 67.4%)

8. Example of Synthesis of Sub 20A 3-23

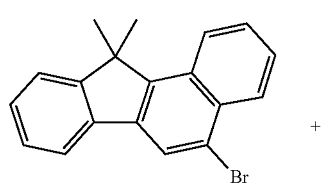

Sub 20A 3-23a

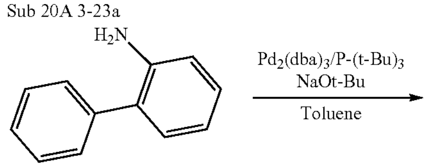

Sub 20A 1-23b

-continued

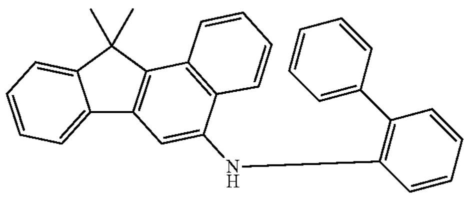

Sub 20A 3-23

After adding Sub 20A 3-23a (50.0 g, 154.7 mmol) and Sub 20A 1-23b (25.3 g, 154.7 mmol), $Pd_2(dba)_3$ (4.3 g, 4.6 mmol), $P(t-Bu)_3$ (1.9 g, 9.3 mmol), NaOt-Bu (29.7 g, 309.4 mmol), toluene (773 mL) in a round-bottom flask, the same procedure as in Sub 20A 1-5 was performed to create a product in an amount of 55.1 g. (Yield: 73.2%)

9. Example of Synthesis of Sub 20A 4-25

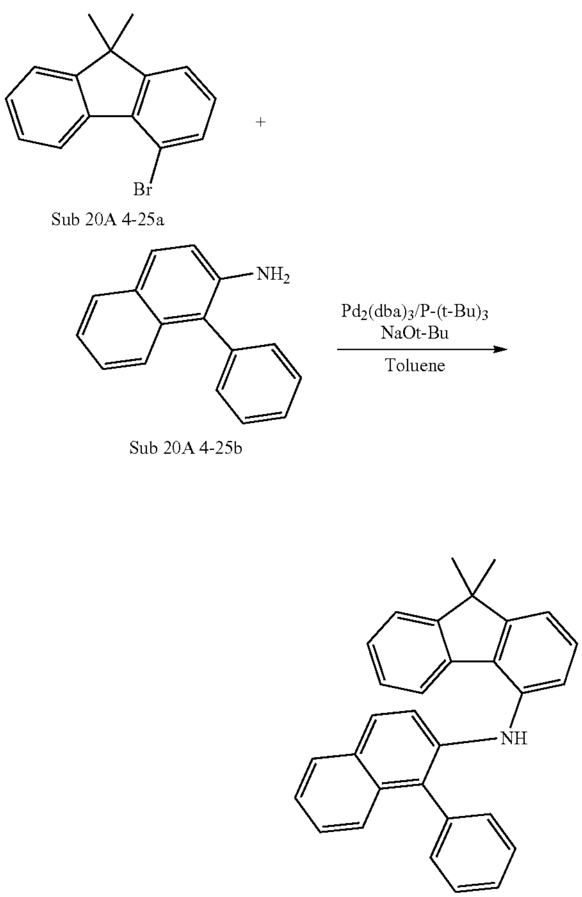

Sub 20A 4-25a

Sub 20A 4-25b

Sub 20A 4-25

After adding Sub 20A 4-25a (50.0 g, 183.0 mmol) and Sub 20A 4-25b (40.2 g, 183.0 mmol), $Pd_2(dba)_3$ (5.0 g, 5.5 mmol), $P(t-Bu)_3$ (2.2 g, 11.0 mmol), NaOt-Bu (35.2 g, 366.1 mmol), toluene (915 mL) in a round-bottom flask, the same procedure as in Sub 20A 1-5 was performed to create a product in an amount of 52.8 g. (Yield: 70.1%)

10. Example of Synthesis of Sub 20A 4-27

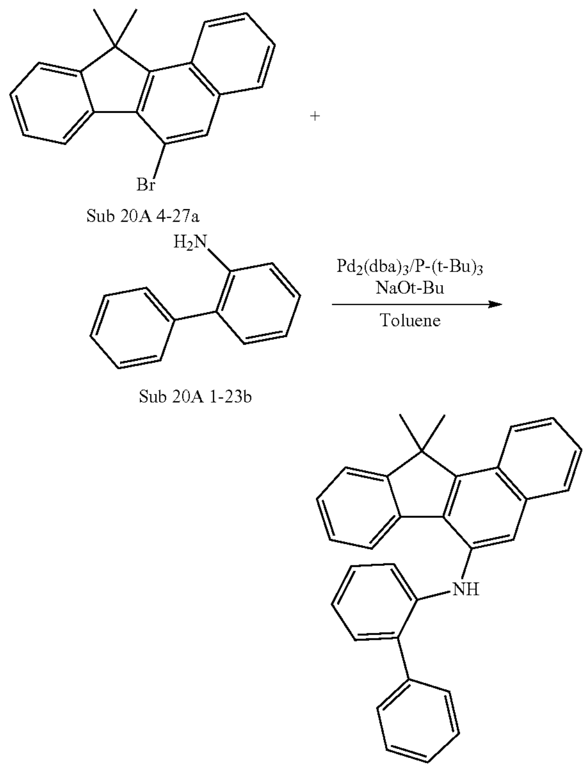

Sub 20A 4-27a

Sub 20A 1-23b

Sub 20A 4-27

After adding Sub 20A 4-27a (50.0 g, 154.7 mmol) and Sub 20A 1-23b (25.3 g, 154.7 mmol), $Pd_2(dba)_3$ (4.3 g, 4.6 mmol), $P(t-Bu)_3$ (1.9 g, 9.3 mmol), NaOt-Bu (29.7 g, 309.4 mmol), toluene (773 mL) in a round-bottom flask, the same procedure as in Sub 20A 1-5 was performed to create a product in an amount of 54.6 g. (Yield: 72.5%)

The compounds belonging to Sub 20A may be, but are not limited to, the following compounds, and Table 1 illustrates field desorption-mass spectrometry (FD-MS) values of the compounds belonging to Sub 20A.

Sub 20A 1-1

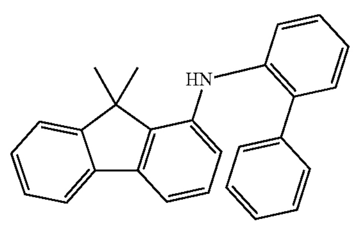

Sub 20A 1-2

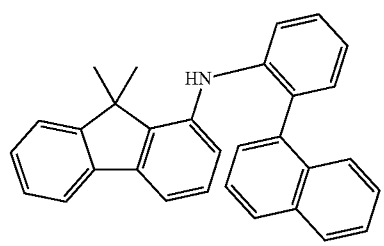

Sub 20A 1-3
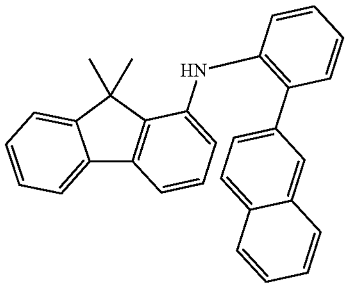
Sub 20A 1-4
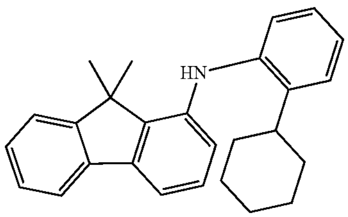
Sub 20A 1-5
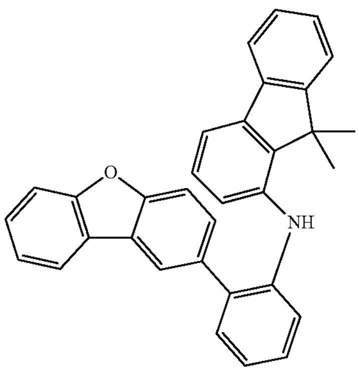
Sub 20A 1-6
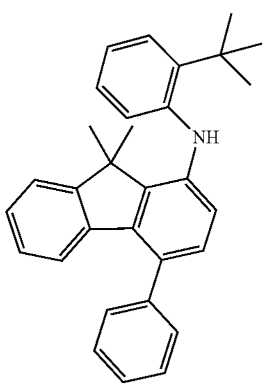
Sub 20A 1-7
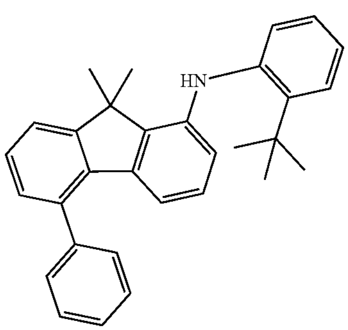
Sub 20A 1-8
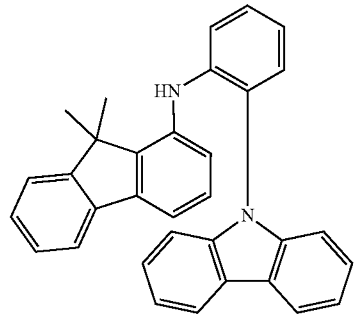
Sub 20A 1-9
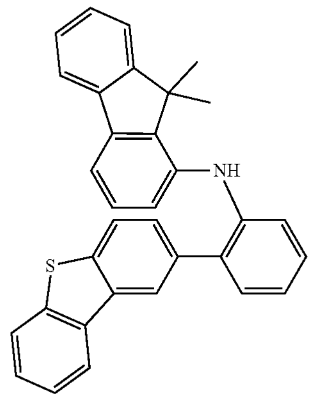
Sub 20A 1-10
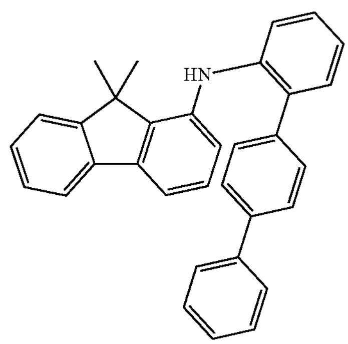
Sub 20A 1-11
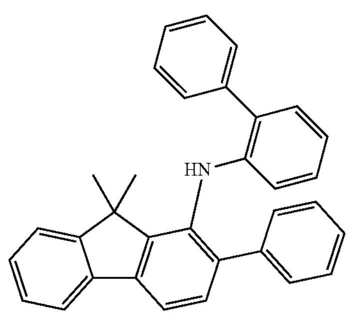

-continued
Sub 20A 1-12
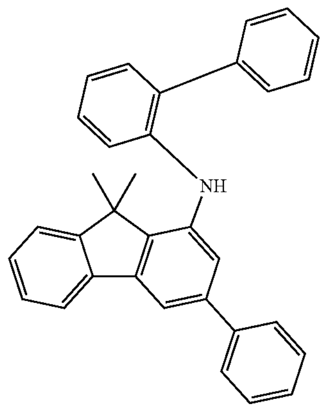
Sub 20A 1-13
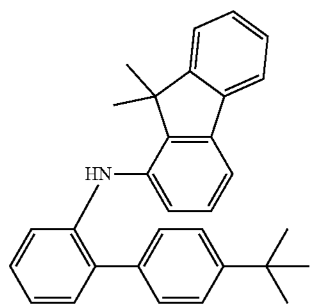
Sub 20A 1-14
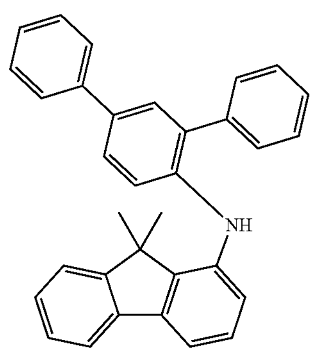
Sub 20A 1-15
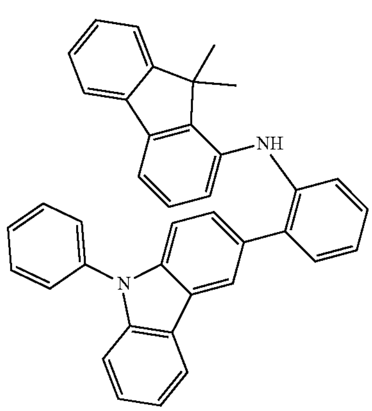
-continued
Sub 20A 1-16
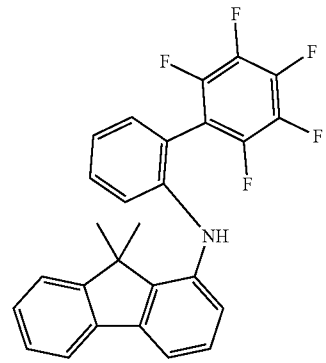
Sub 20A 1-17
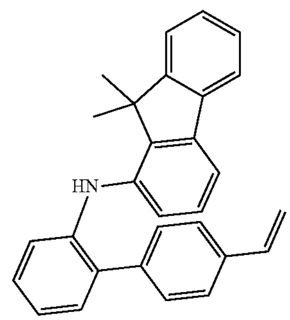
Sub 20A 1-18
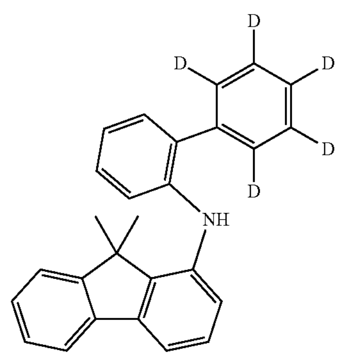
Sub 20A 1-19
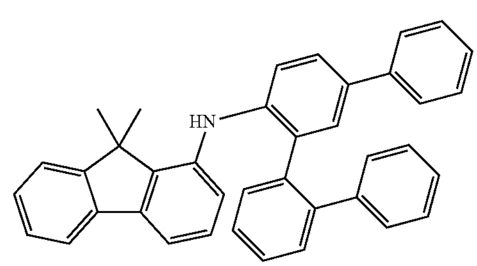

-continued
Sub 20A 1-20
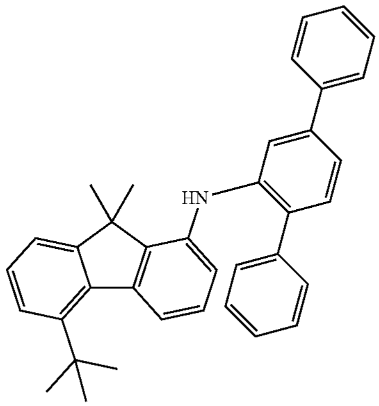
Sub 20A 1-21
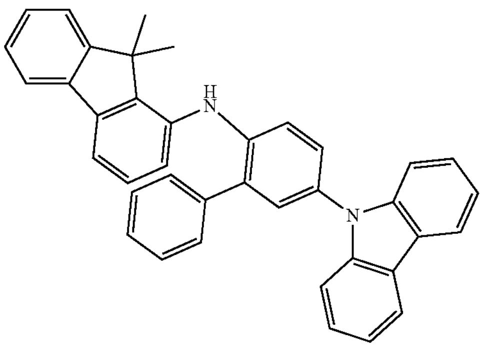
Sub 20A 1-22
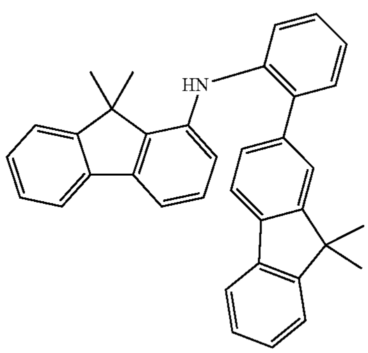
Sub 20A 1-23
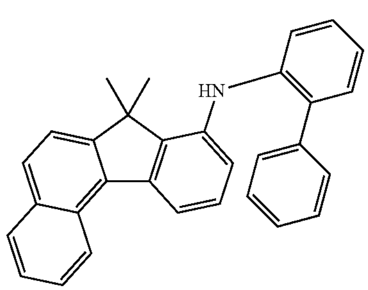
-continued
Sub 20A 2-1
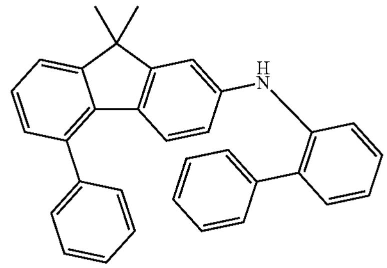
Sub 20A 2-2
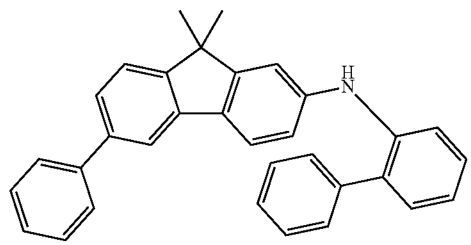
Sub 20A 2-3
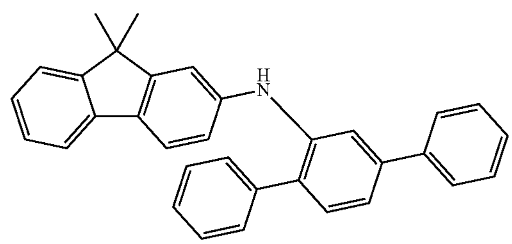
Sub 20A 2-4
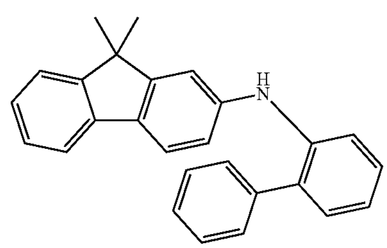
Sub 20A 2-5
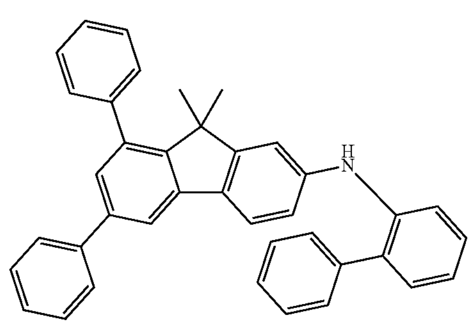

-continued
Sub 20A 2-6
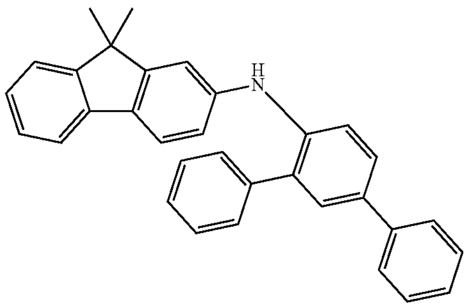
Sub 20A 2-7
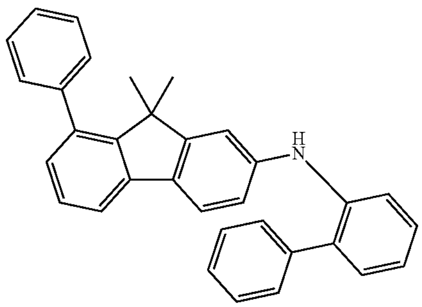
Sub 20A 2-8
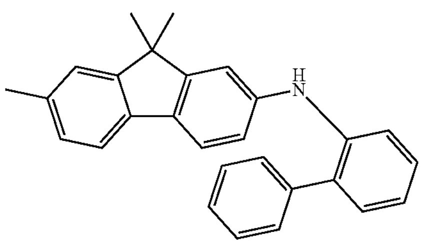
Sub 20A 2-9
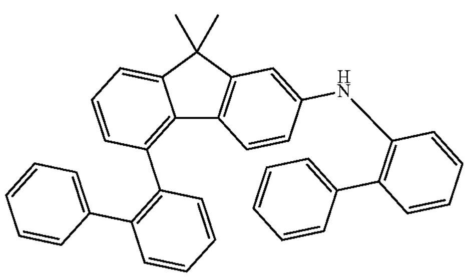
Sub 20A 2-10
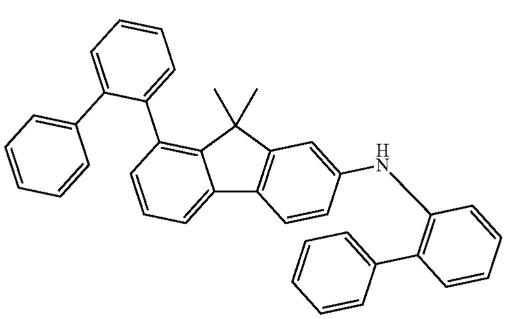
-continued
Sub 20A 2-11
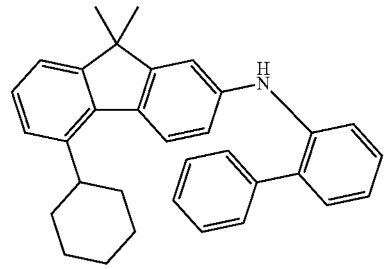
Sub 20A 2-12
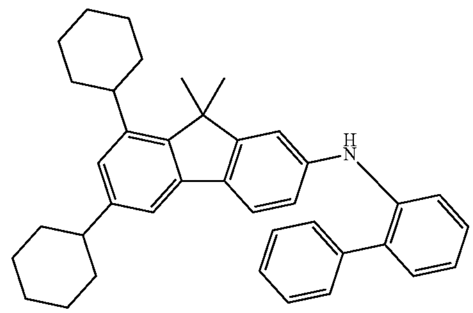
Sub 20A 2-13
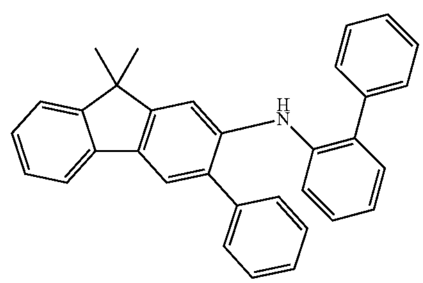
Sub 20A 2-14
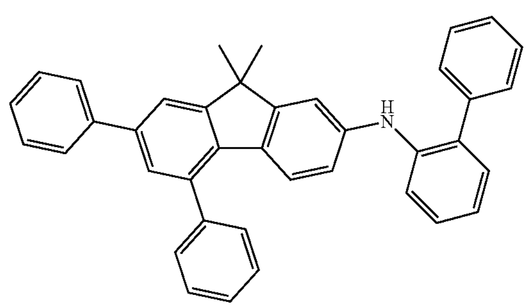
Sub 20A 2-15
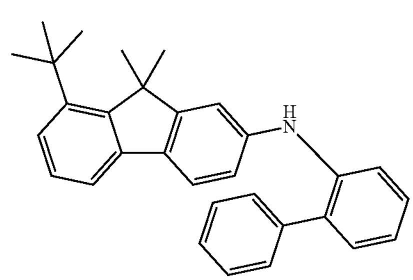

-continued
Sub 20A 2-16
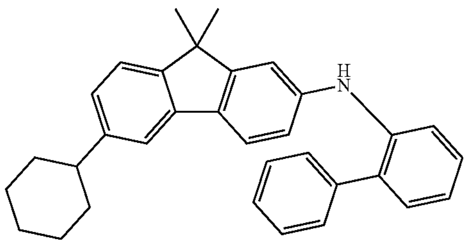
Sub 20A 2-17
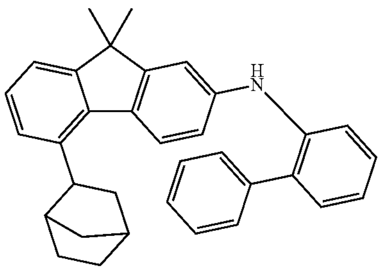
Sub 20A 2-18
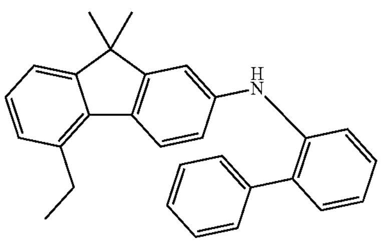
Sub 20A 2-19
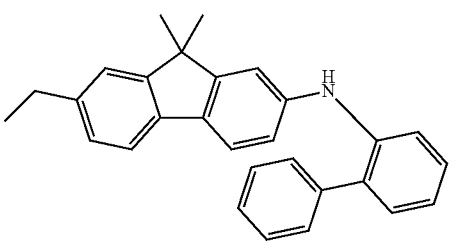
Sub 20A 2-20
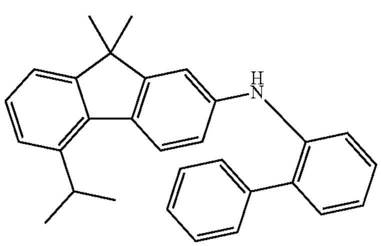
Sub 20A 2-21
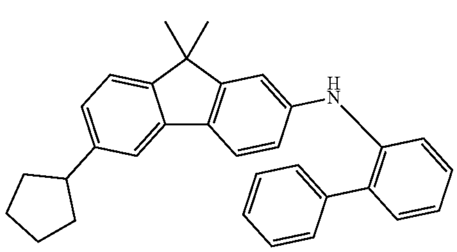
-continued
Sub 20A 2-22
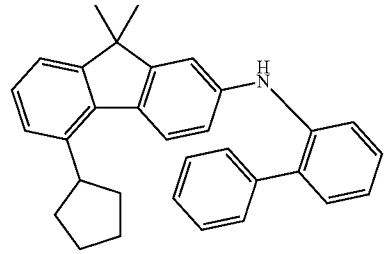
Sub 20A 2-23
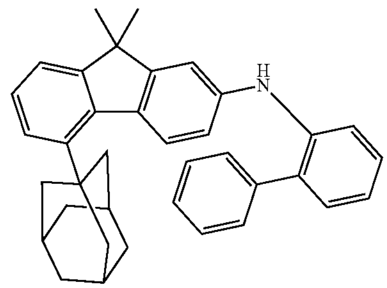
Sub 20A 2-24
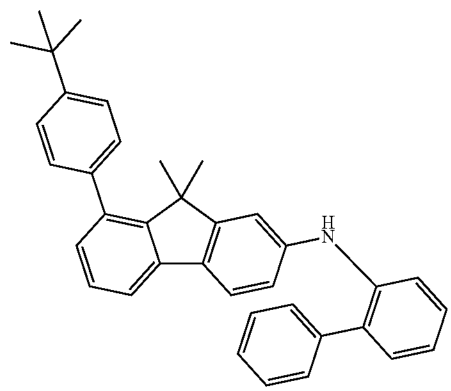
Sub 20A 2-25
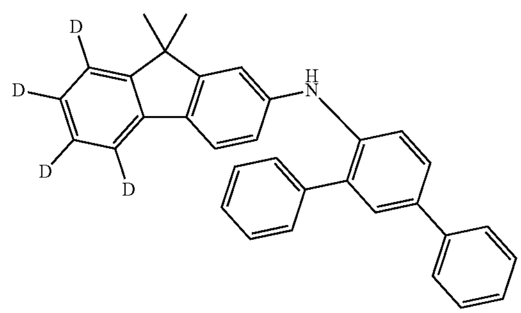
Sub 20A 2-26
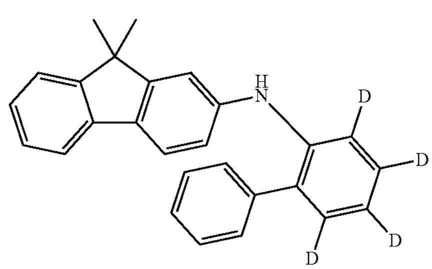

Sub 20A 2-27
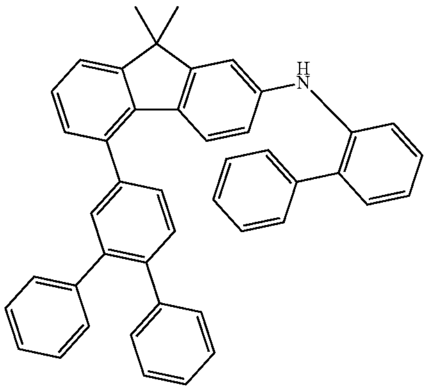
Sub 20A 2-28
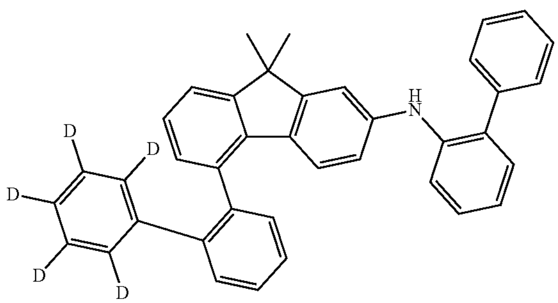
Sub 20A 2-29
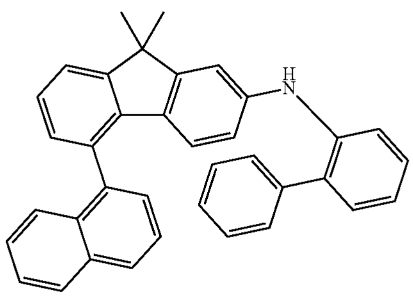
Sub 20A 2-30
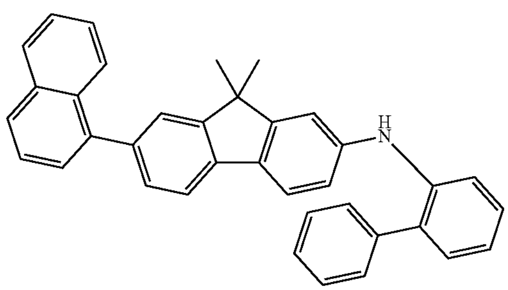
Sub 20A 2-31
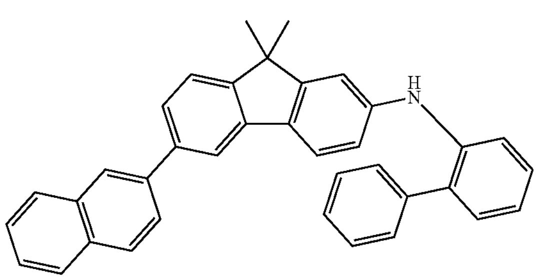
Sub 20A 2-32
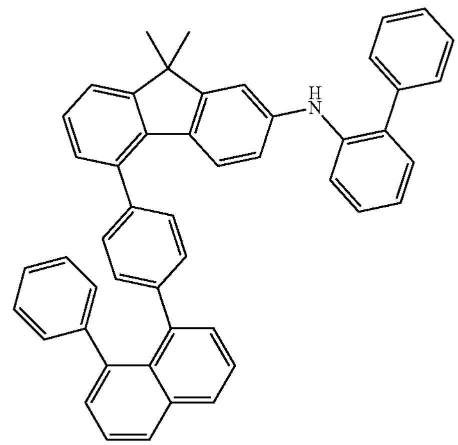
Sub 20A 2-33
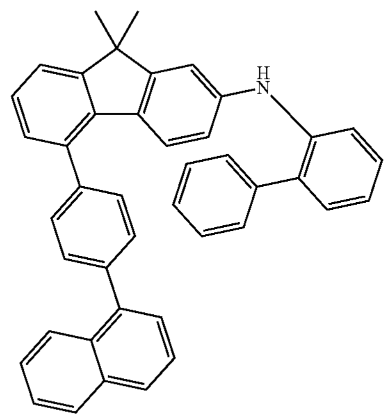
Sub 20A 2-34
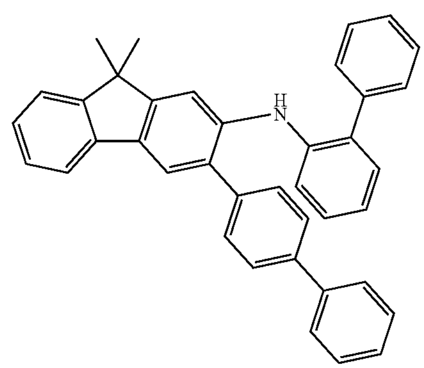
Sub 20A 2-35
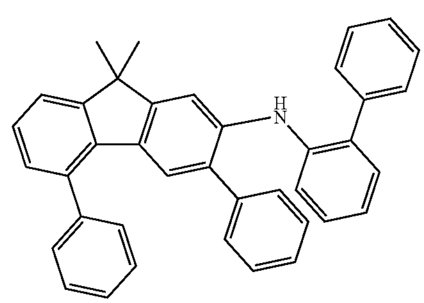

-continued
Sub 20A 2-36
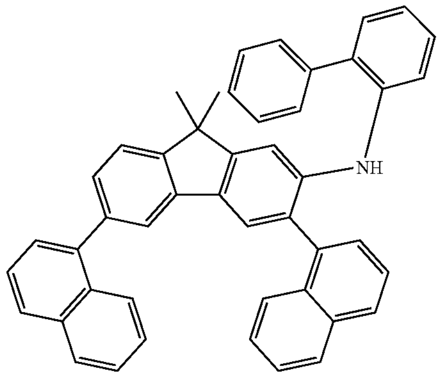
Sub 20A 2-37
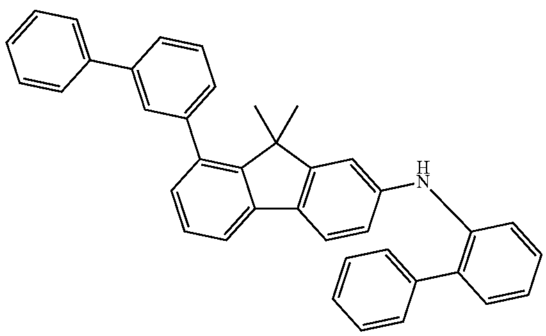
Sub 20A 2-38
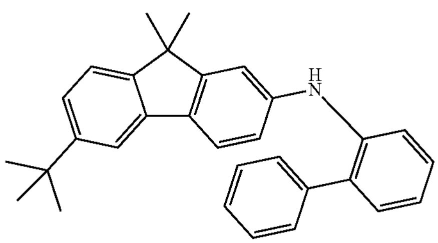
Sub 20A 2-39
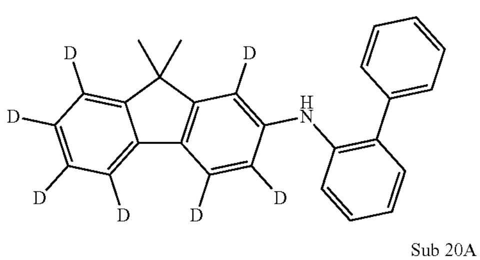
Sub 20A 2-40
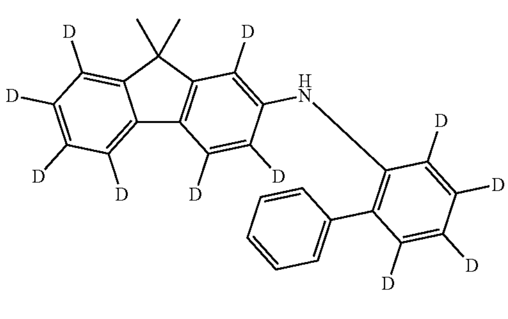
-continued
Sub 20A 2-41
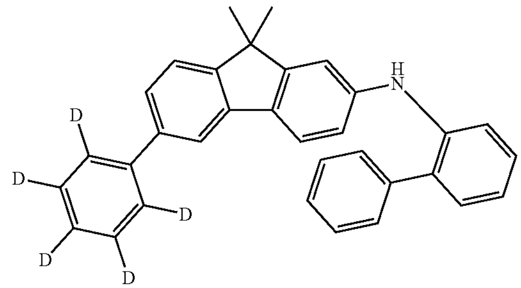
Sub 20A 2-42
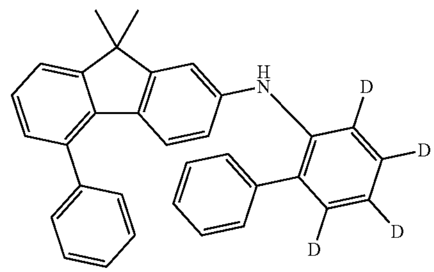
Sub 20A 2-43
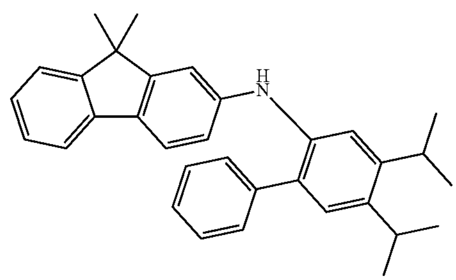
Sub 20A 2-44
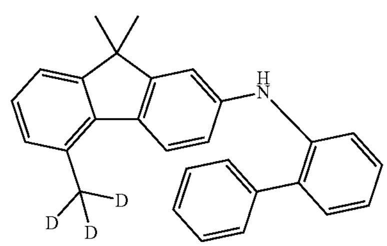
Sub 20A 2-45
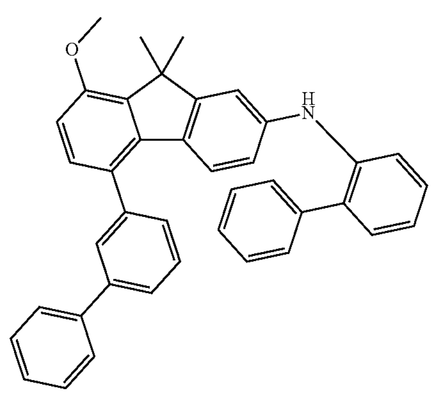

-continued
Sub 20A 2-46
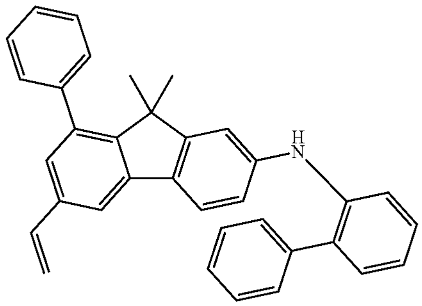
Sub 20A 2-47
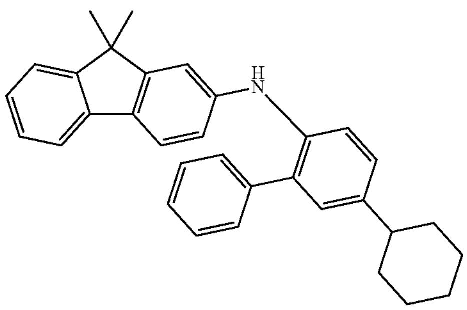
Sub 20A 2-48
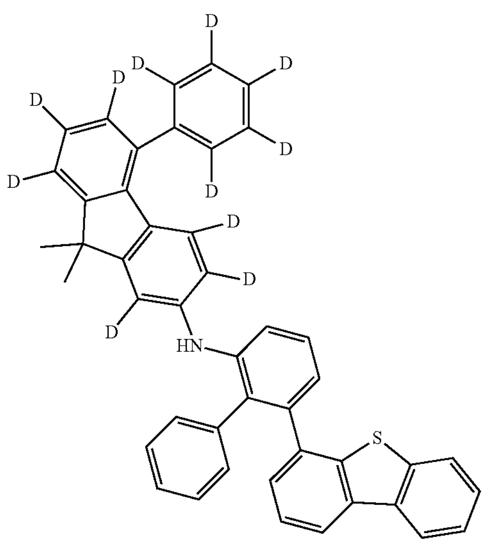
Sub 20A 2-49
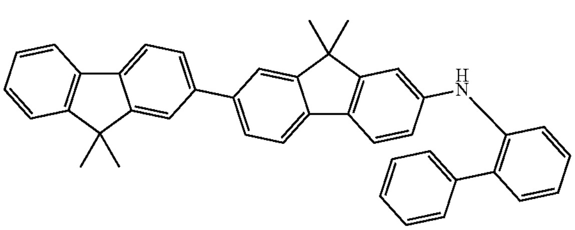
-continued
Sub 20A 2-50
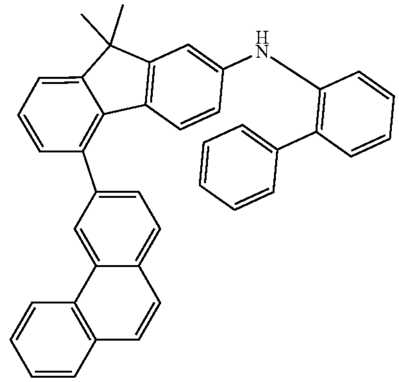
Sub 20A 2-51
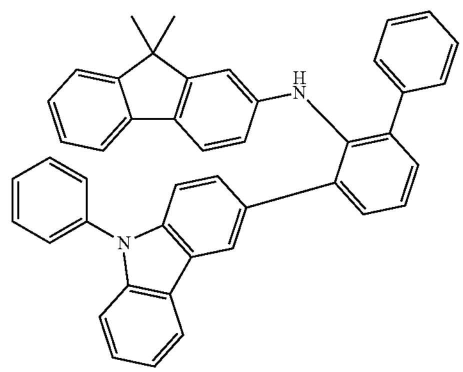
Sub 20A 2-52
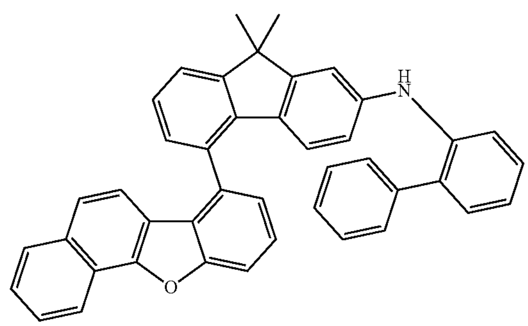
Sub 20A 2-53
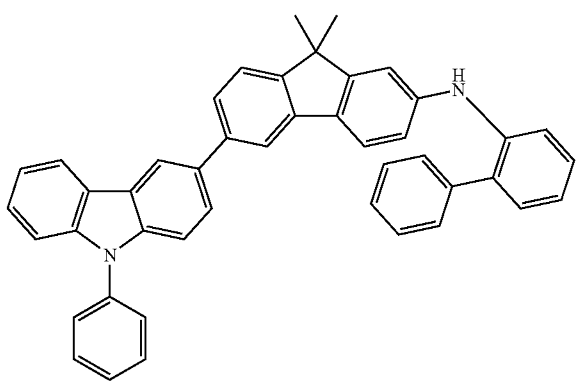

-continued
Sub 20A 2-54
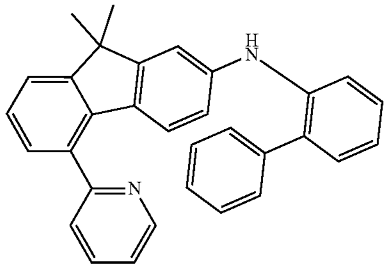
Sub 20A 2-55
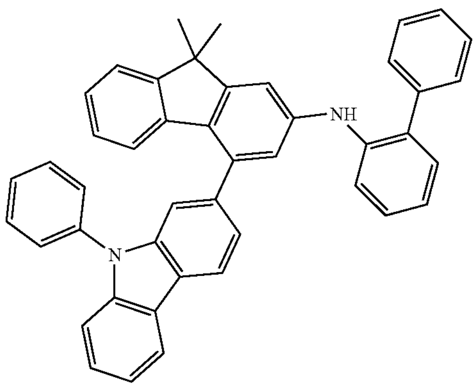
Sub 20A 2-56
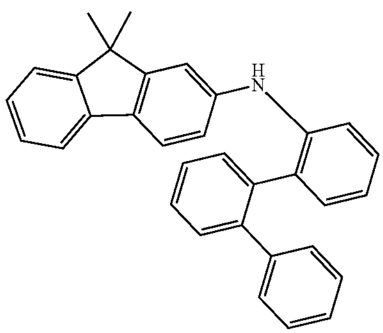
Sub 20A 2-57
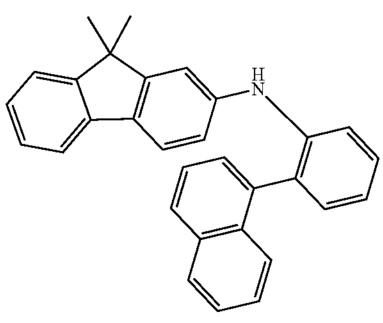
Sub 20A 2-58
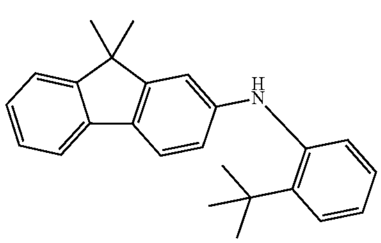
-continued
Sub 20A 2-59
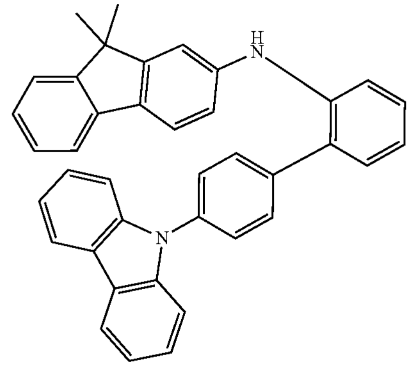
Sub 20A 2-60
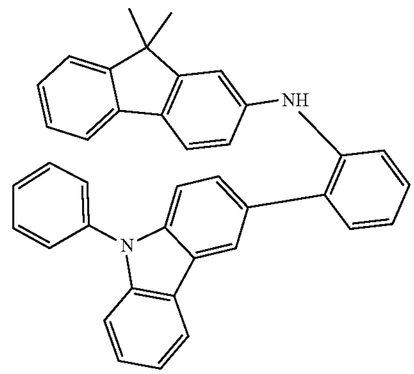
Sub 20A 2-61
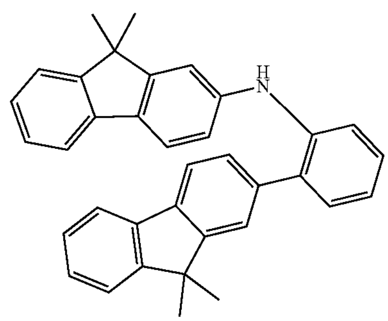
Sub 20A 2-62
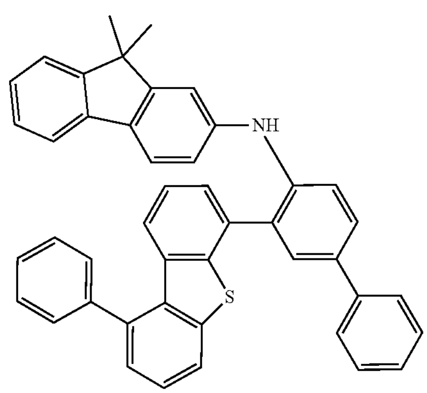

-continued
Sub 20A 2-63
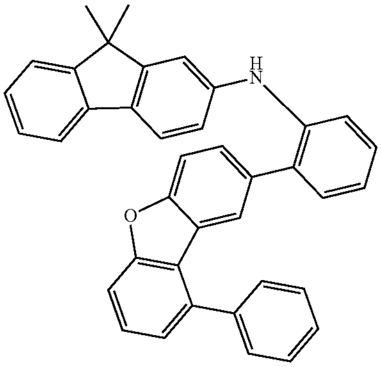
Sub 20A 2-64
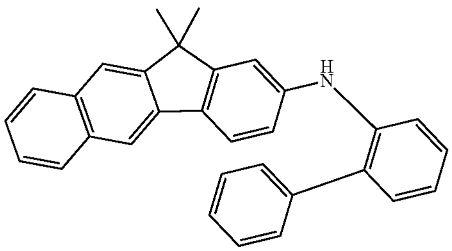
Sub 20A 2-65
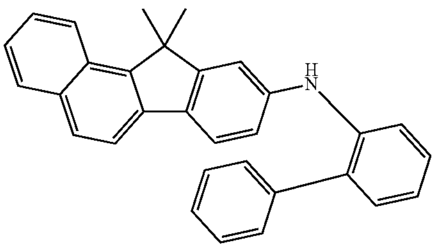
Sub 20A 2-66
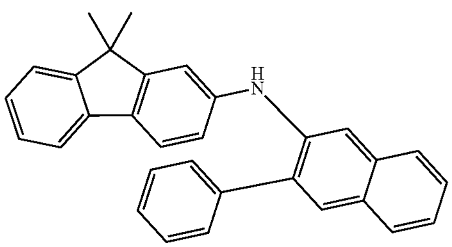
Sub 20A 2-67
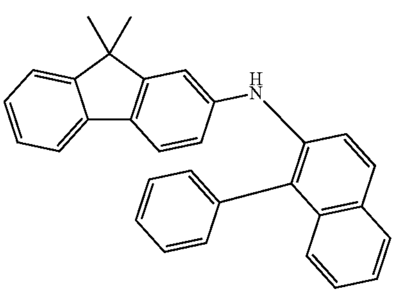
Sub 20A 3-1
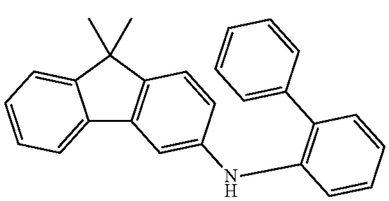
-continued
Sub 20A 3-2
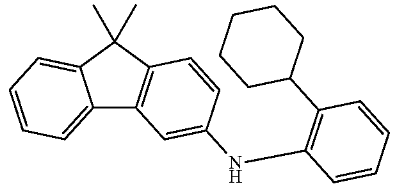
Sub 20A 3-3
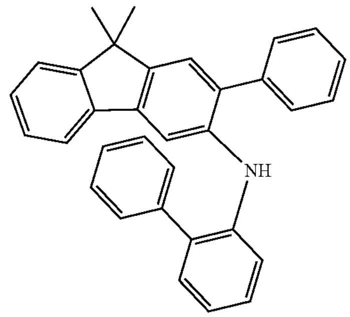
Sub 20A 3-4
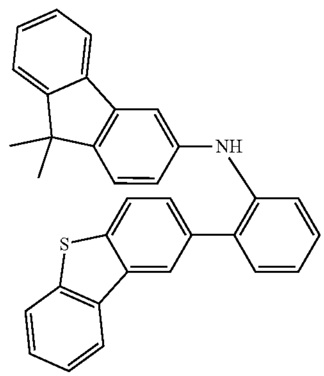
Sub 20A 3-5
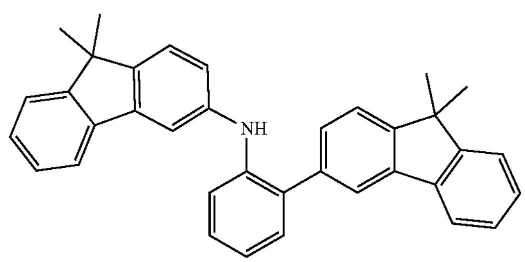
Sub 20A 3-6
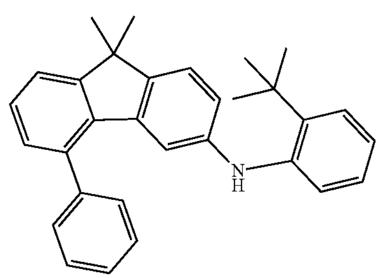

-continued
Sub 20A 3-7
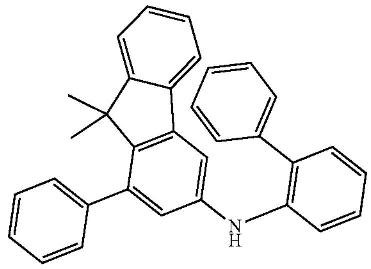
Sub 20A 3-8
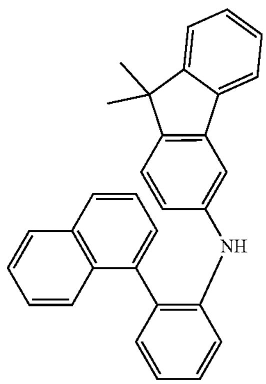
Sub 20A 3-9
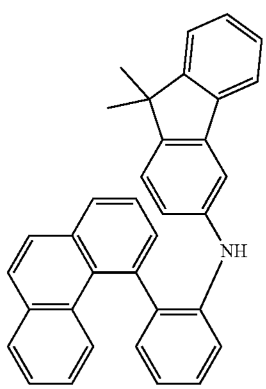
Sub 20A 3-10
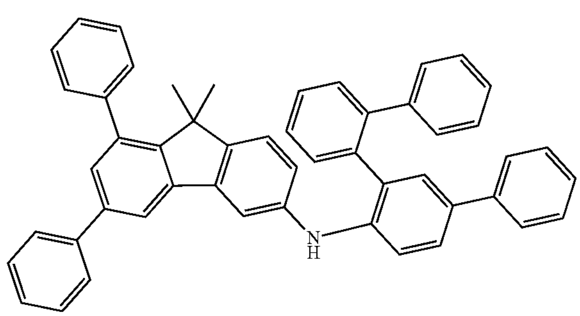
-continued
Sub 20A 3-11
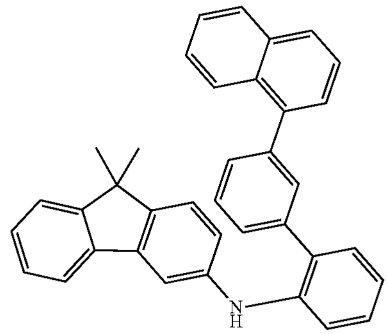
Sub 20A 3-12
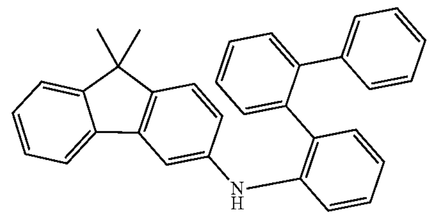
Sub 20A 3-13
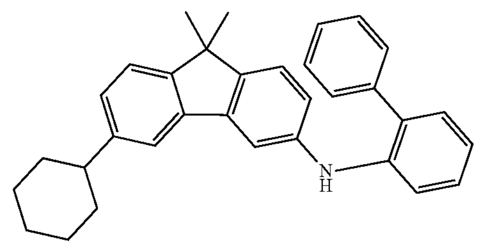
Sub 20A 3-14
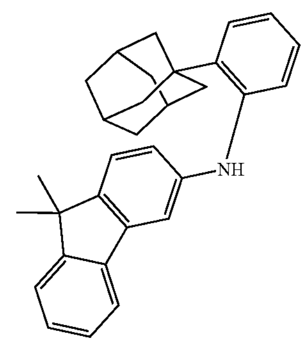
Sub 20A 3-15
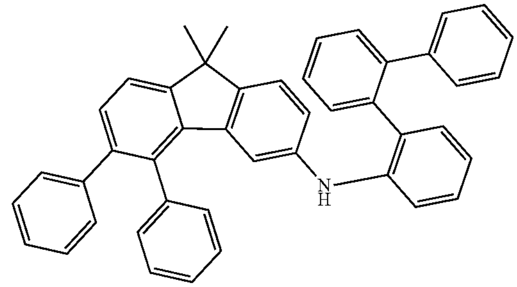

-continued
Sub 20A 3-16
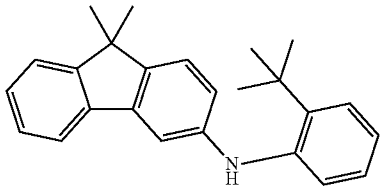
Sub 20A 3-17
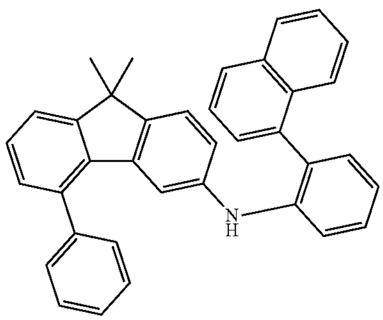
Sub 20A 3-18
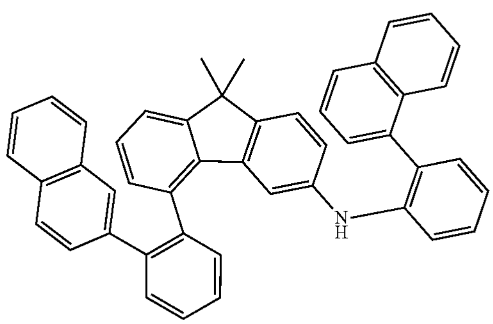
Sub 20A 3-19
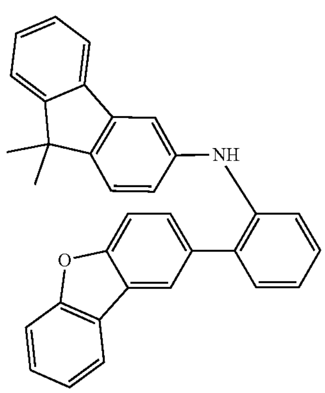
-continued
Sub 20A 3-20
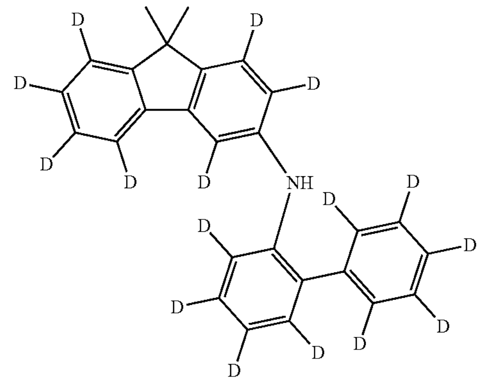
Sub 20A 3-21
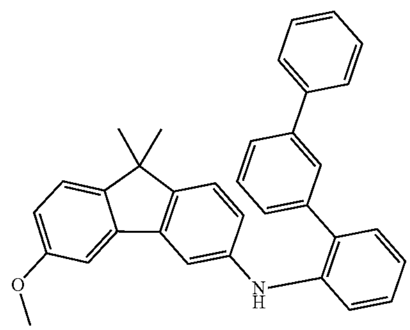
Sub 20A 3-22
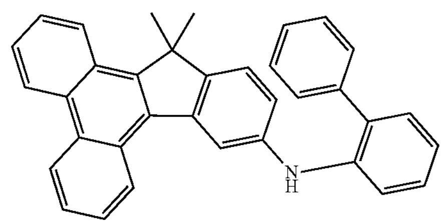
Sub 20A 3-23
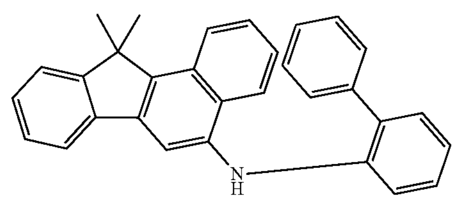
Sub 20A 3-24
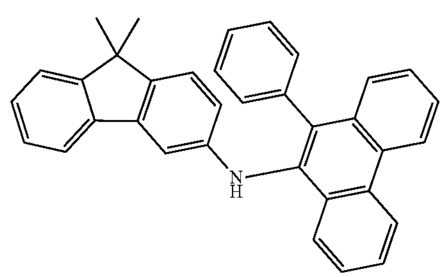

-continued
Sub 20A 4-1
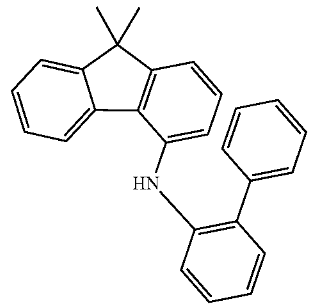
Sub 20A 4-2
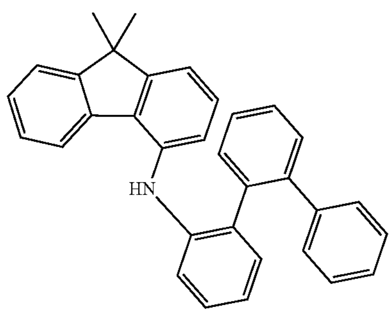
Sub 20A 4-3
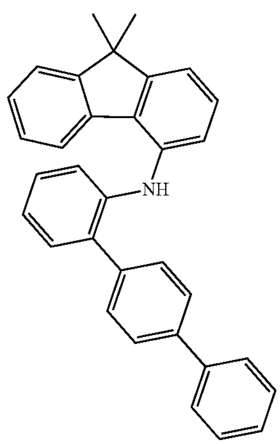
Sub 20A 4-4
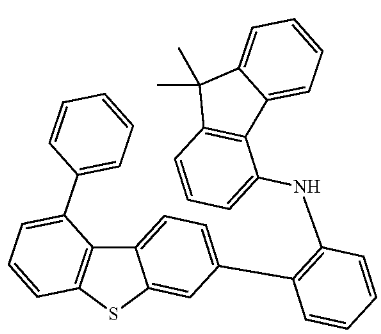
-continued
Sub 20A 4-5
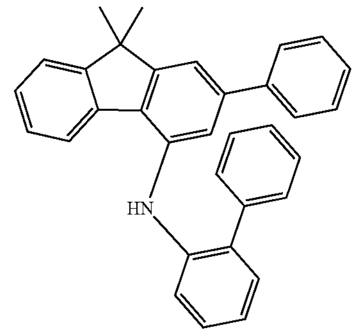
Sub 20A 4-6
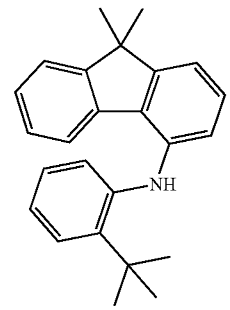
Sub 20A 4-7
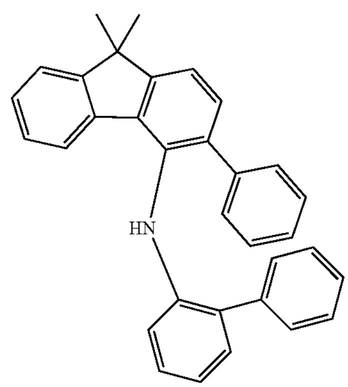
Sub 20A 4-8
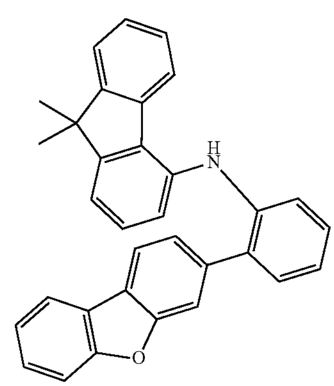

Sub 20A 4-9
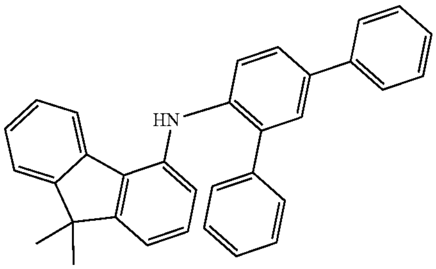
Sub 20A 4-10
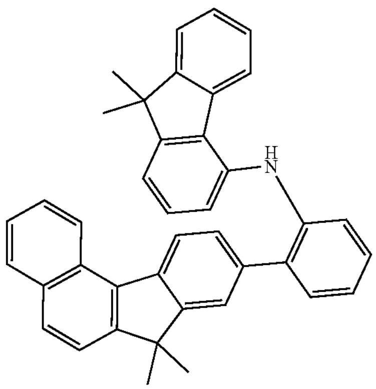
Sub 20A 4-11
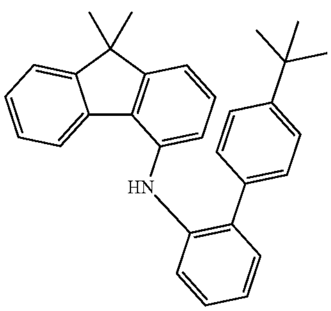
Sub 20A 4-12
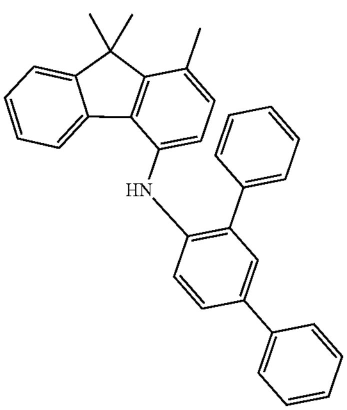
Sub 20A 4-13
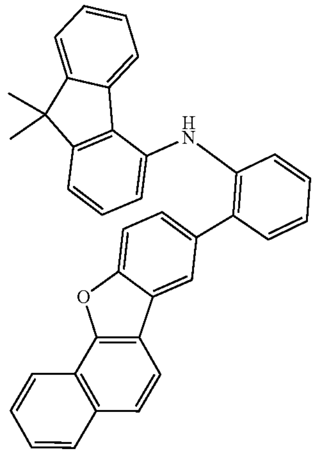
Sub 20A 4-14
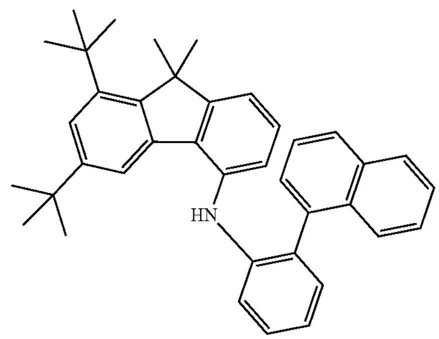
Sub 20A 4-15
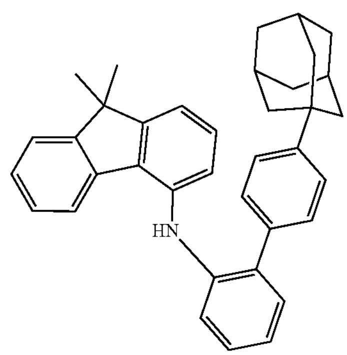
Sub 20A 4-16
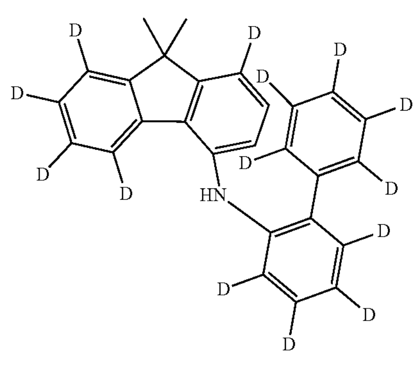

Sub 20A 4-17
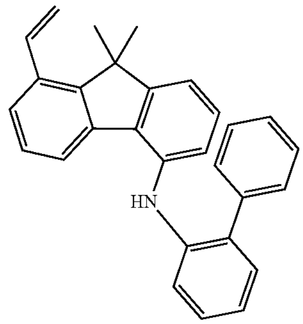
Sub 20A 4-18
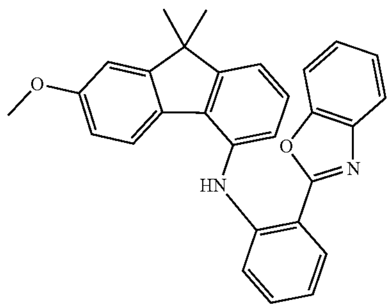
Sub 20A 4-19
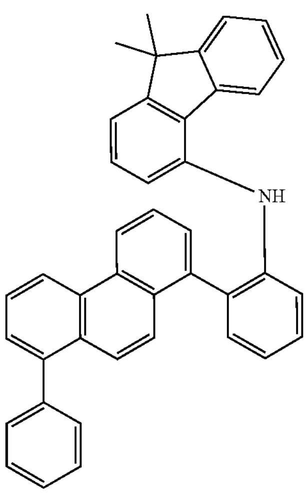
Sub 20A 4-20
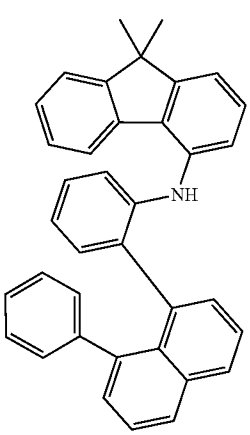
Sub 20A 4-21
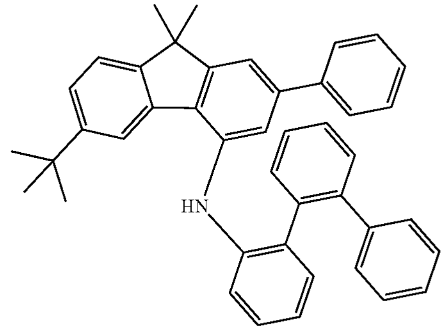
Sub 20A 4-22
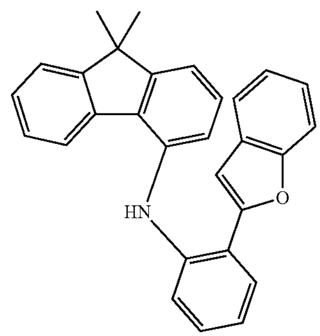
Sub 20A 4-23
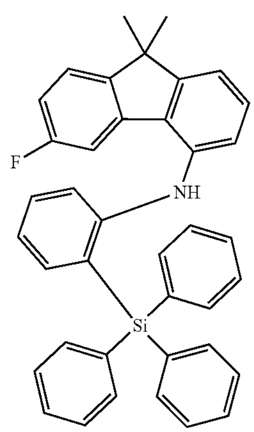

Sub 20A 4-24

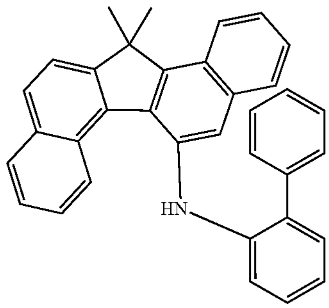

Sub 20A 4-25

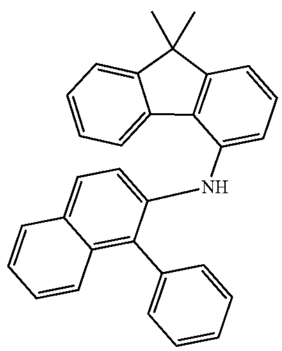

Sub 20A 4-26

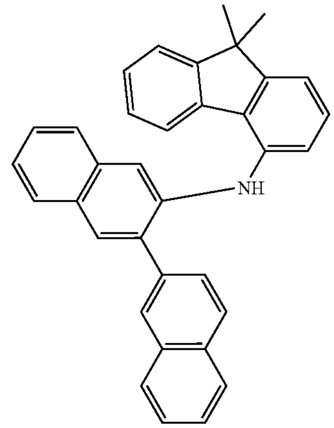

Sub 20A 4-27

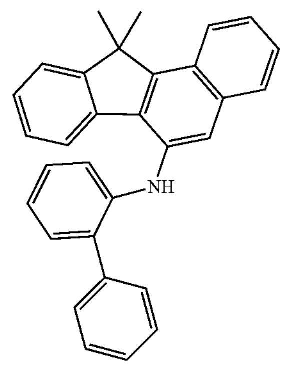

TABLE 1

| Compound | FD-MS | Compound | FD-MS |
|---|---|---|---|
| Sub 20A 1-1 | m/z = 361.18 ($C_{27}H_{23}N$ = 361.49) | Sub 20A 1-2 | m/z = 411.2 ($C_{31}H_{25}N$ = 411.55) |
| Sub 20A 1-3 | m/z = 411.2 ($C_{31}H_{25}N$ = 411.55) | Sub 20A 1-4 | m/z = 367.23 ($C_{27}H_{29}N$ = 367.54) |
| Sub 20A 1-5 | m/z = 451.19 ($C_{33}H_{25}NO$ = 451.57) | Sub 20A 1-6 | m/z = 417.25 ($C_{31}H_{31}N$ = 417.6) |
| Sub 20A 1-7 | m/z = 417.25 ($C_{31}H_{31}N$ = 417.6) | Sub 20A 1-8 | m/z = 450.21 ($C_{33}H_{26}N_2$ = 450.59) |
| Sub 20A 1-9 | m/z = 467.17 ($C_{33}H_{25}NS$ = 467.63) | Sub 20A 1-10 | m/z = 437.21 ($C_{33}H_{27}N$ = 437.59) |
| Sub 20A 1-11 | m/z = 437.21 ($C_{33}H_{27}N$ = 437.59) | Sub 20A 1-12 | m/z = 437.21 ($C_{33}H_{27}N$ = 437.59) |
| Sub 20A 1-13 | m/z = 417.25 ($C_{31}H_{31}N$ = 417.6) | Sub 20A 1-14 | m/z = 437.21 ($C_{33}H_{27}N$ = 437.59) |
| Sub 20A 1-15 | m/z = 526.24 ($C_{39}H_{30}N_2$ = 526.68) | Sub 20A 1-16 | m/z = 451.14 ($C_{27}H_{18}F_5N$ = 451.44) |
| Sub 20A 1-17 | m/z = 387.2 ($C_{29}H_{25}N$ = 387.53) | Sub 20A 1-18 | m/z = 366.21 ($C_{27}H_{18}D_5N$ = 366.52) |
| Sub 20A 1-19 | m/z = 513.25 ($C_{39}H_{31}N$ = 513.68) | Sub 20A 1-20 | m/z = 493.28 ($C_{37}H_{35}N$ = 493.69) |
| Sub 20A 1-21 | m/z = 526.24 ($C_{39}H_{30}N_2$ = 526.68) | Sub 20A 1-22 | m/z = 477.25 ($C_{36}H_{31}N$ = 477.65) |
| Sub 20A 1-23 | m/z = 411.2 ($C_{31}H_{25}N$ = 411.55) | | |
| Sub 20A 2-1 | m/z = 437.21 ($C_{33}H_{27}N$ = 437.59) | Sub 20A 2-2 | m/z = 437.21 ($C_{33}H_{27}N$ = 437.59) |
| Sub 20A 2-3 | m/z = 437.21 ($C_{33}H_{27}N$ = 437.59) | Sub 20A 2-4 | m/z = 361.18 ($C_{27}H_{23}N$ = 361.49) |
| Sub 20A 2-5 | m/z = 513.25 ($C_{39}H_{31}N$ = 513.68) | Sub 20A 2-6 | m/z = 437.21 ($C_{33}H_{27}N$ = 437.59) |
| Sub 20A 2-7 | m/z = 437.21 ($C_{33}H_{27}N$ = 437.59) | Sub 20A 2-8 | m/z = 375.2 ($C_{28}H_{25}N$ = 375.51) |
| Sub 20A 2-9 | m/z = 513.25 ($C_{39}H_{31}N$ = 513.68) | Sub 20A 2-10 | m/z = 513.25 ($C_{39}H_{31}N$ = 513.68) |

TABLE 1-continued

| Compound | FD-MS | Compound | FD-MS |
|---|---|---|---|
| Sub 20A 2-11 | m/z = 443.26 ($C_{33}H_{33}N$ = 443.63) | Sub 20A 2-12 | m/z = 525.34 ($C_{39}H_{43}N$ = 525.78) |
| Sub 20A 2-13 | m/z = 437.21 ($C_{33}H_{27}N$ = 437.59) | Sub 20A 2-14 | m/z = 513.25 ($C_{39}H_{31}N$ = 513.68) |
| Sub 20A 2-15 | m/z = 417.25 ($C_{31}H_{31}N$ = 417.6) | Sub 20A 2-16 | m/z = 443.26 ($C_{33}H_{33}N$ = 443.63) |
| Sub 20A 2-17 | m/z = 455.26 ($C_{34}H_{33}N$ = 455.64) | Sub 20A 2-18 | m/z = 389.21 ($C_{29}H_{27}N$ = 389.54) |
| Sub 20A 2-19 | m/z = 389.21 ($C_{29}H_{27}N$ = 389.54) | Sub 20A 2-20 | m/z = 403.23 ($C_{30}H_{29}N$ = 403.57) |
| Sub 20A 2-21 | m/z = 429.25 ($C_{32}H_{31}N$ = 429.61) | Sub 20A 2-22 | m/z = 429.25 ($C_{32}H_{31}N$ = 429.61) |
| Sub 20A 2-23 | m/z = 495.29 ($C_{37}H_{37}N$ = 495.71) | Sub 20A 2-24 | m/z = 493.28 ($C_{37}H_{35}N$ = 493.69) |
| Sub 20A 2-25 | m/z = 441.24 ($C_{33}H_{23}D_4N$ = 441.61) | Sub 20A 2-26 | m/z = 365.21 ($C_{27}H_{19}D_4N$ = 365.51) |
| Sub 20A 2-27 | m/z = 589.28 ($C_{45}H_{35}N$ = 589.78) | Sub 20A 2-28 | m/z = 518.28 ($C_{39}H_{26}D_5N$ = 518.71) |
| Sub 20A 2-29 | m/z = 487.23 ($C_{37}H_{29}N$ = 487.65) | Sub 20A 2-30 | m/z = 487.23 ($C_{37}H_{29}N$ = 487.65) |
| Sub 20A 2-31 | m/z = 487.23 ($C_{37}H_{29}N$ = 487.65) | Sub 20A 2-32 | m/z = 639.29 ($C_{49}H_{37}N$ = 639.84) |
| Sub 20A 2-33 | m/z = 563.26 ($C_{43}H_{33}N$ = 563.74) | Sub 20A 2-34 | m/z = 513.25 ($C_{39}H_{31}N$ = 513.68) |
| Sub 20A 2-35 | m/z = 513.25 ($C_{39}H_{31}N$ = 513.68) | Sub 20A 2-36 | m/z = 613.28 ($C_{47}H_{35}N$ = 613.8) |
| Sub 20A 2-37 | m/z = 513.25 ($C_{39}H_{31}N$ = 513.68) | Sub 20A 2-38 | m/z = 417.25 ($C_{31}H_{31}N$ = 417.6) |
| Sub 20A 2-39 | m/z = 368.23 ($C_{27}H_{16}D_7N$ = 368.53) | Sub 20A 2-40 | m/z = 372.25 ($C_{27}H_{12}D_{11}N$ = 372.56) |
| Sub 20A 2-41 | m/z = 442.25 ($C_{33}H_{22}D_5N$ = 442.62) | Sub 20A 2-42 | m/z = 441.24 ($C_{33}H_{23}D_4N$ = 441.61) |
| Sub 20A 2-43 | m/z = 445.28 ($C_{33}H_{35}N$ = 445.65) | Sub 20A 2-44 | m/z = 378.22 ($C_{28}H_{22}D_3N$ = 378.53) |
| Sub 20A 2-45 | m/z = 543.26 ($C_{40}H_{33}NO$ = 543.71) | Sub 20A 2-46 | m/z = 463.23 ($C_{35}H_{29}N$ = 463.62) |
| Sub 20A 2-47 | m/z = 443.26 ($C_{33}H_{33}N$ = 443.63) | Sub 20A 2-48 | m/z = 630.3 ($C_{45}H_{22}D_{11}NS$ = 630.89) |
| Sub 20A 2-49 | m/z = 553.28 ($C_{42}H_{35}N$ = 553.75) | Sub 20A 2-50 | m/z = 537.25 ($C_{41}H_{31}N$ = 537.71) |
| Sub 20A 2-51 | m/z = 602.27 ($C_{45}H_{34}N_2$ = 602.78) | Sub 20A 2-52 | m/z = 577.24 ($C_{43}H_{31}NO$ = 577.73) |
| Sub 20A 2-53 | m/z = 602.27 ($C_{45}H_{34}N_2$ = 602.78) | Sub 20A 2-54 | m/z = 438.21 ($C_{32}H_{26}N_2$ = 438.57) |
| Sub 20A 2-55 | m/z = 602.27 ($C_{45}H_{34}N_2$ = 602.78) | Sub 20A 2-56 | m/z = 437.21 ($C_{33}H_{27}N$ = 437.59) |
| Sub 20A 2-57 | m/z = 411.2 ($C_{31}H_{25}N$ = 411.55) | Sub 20A 2-58 | m/z = 341.21 ($C_{25}H_{27}N$ = 341.5) |
| Sub 20A 2-59 | m/z = 526.24 ($C_{39}H_{30}N_2$ = 526.68) | Sub 20A 2-60 | m/z = 526.24 ($C_{39}H_{30}N_2$ = 526.68) |
| Sub 20A 2-61 | m/z = 477.25 ($C_{36}H_{31}N$ = 477.65) | Sub 20A 2-62 | m/z = 619.23 ($C_{45}H_{33}NS$ = 619.83) |
| Sub 20A 2-63 | m/z = 527.22 ($C_{39}H_{29}NO$ = 527.67) | Sub 20A 2-64 | m/z = 411.2 ($C_{31}H_{25}N$ = 411.55) |
| Sub 20A 2-65 | m/z = 411.2 ($C_{31}H_{25}N$ = 411.55) | Sub 20A 2-66 | m/z = 411.2 ($C_{31}H_{25}N$ = 411.55) |
| Sub 20A 2-67 | m/z = 411.2 ($C_{31}H_{25}N$ = 411.55) | | |
| Sub 20A 3-1 | m/z = 361.18 ($C_{27}H_{23}N$ = 361.49) | Sub 20A 3-2 | m/z = 367.23 ($C_{27}H_{29}N$ = 367.54) |
| Sub 20A 3-3 | m/z = 437.21 ($C_{33}H_{27}N$ = 437.59) | Sub 20A 3-4 | m/z = 467.17 ($C_{33}H_{25}NS$ = 467.63) |
| Sub 20A 3-5 | m/z = 477.25 ($C_{36}H_{31}N$ = 477.65) | Sub 20A 3-6 | m/z = 417.25 ($C_{31}H_{31}N$ = 417.6) |
| Sub 20A 3-7 | m/z = 437.21 ($C_{33}H_{27}N$ = 437.59) | Sub 20A 3-8 | m/z = 411.2 ($C_{31}H_{25}N$ = 411.55) |
| Sub 20A 3-9 | m/z = 461.21 ($C_{35}H_{27}N$ = 461.61) | Sub 20A 3-10 | m/z = 665.31 ($C_{51}H_{39}N$ = 665.88) |
| Sub 20A 3-11 | m/z = 487.23 ($C_{37}H_{29}N$ = 487.65) | Sub 20A 3-12 | m/z = 437.21 ($C_{33}H_{27}N$ = 437.59) |
| Sub 20A 3-13 | m/z = 443.26 ($C_{33}H_{33}N$ = 443.63) | Sub 20A 3-14 | m/z = 419.26 ($C_{31}H_{33}N$ = 419.61) |
| Sub 20A 3-15 | m/z = 589.28 ($C_{45}H_{35}N$ = 589.78) | Sub 20A 3-16 | m/z = 341.21 ($C_{25}H_{27}N$ = 341.5) |
| Sub 20A 3-17 | m/z = 487.23 ($C_{37}H_{29}N$ = 487.65) | Sub 20A 3-18 | m/z = 563.26 ($C_{43}H_{33}N$ = 563.74) |
| Sub 20A 3-19 | m/z = 451.19 ($C_{33}H_{25}NO$ = 451.57) | Sub 20A 3-20 | m/z = 467.22 ($C_{34}H_{29}NO$ = 467.61) |

TABLE 1-continued

| Compound | FD-MS | Compound | FD-MS |
|---|---|---|---|
| Sub 20A 3-21 | m/z = 467.22 ($C_{34}H_{29}NO$ = 467.61) | Sub 20A 3-22 | m/z = 461.21 ($C_{35}H_{27}N$ = 461.61) |
| Sub 20A 3-23 | m/z = 411.2 ($C_{31}H_{25}N$ = 411.55) | Sub 20A 3-24 | m/z = 461.21 ($C_{35}H_{27}N$ = 461.61) |
| Sub 20A 4-1 | m/z = 361.18 ($C_{27}H_{23}N$ = 361.49) | Sub 20A 4-2 | m/z = 437.21 ($C_{33}H_{27}N$ = 437.59) |
| Sub 20A 4-3 | m/z = 437.21 ($C_{33}H_{27}N$ = 437.59) | Sub 20A 4-4 | m/z = 543.2 ($C_{39}H_{29}NS$ = 543.73) |
| Sub 2 0A 4-5 | m/z = 437.21 ($C_{33}H_{27}N$ = 437.59) | Sub 20A 4-6 | m/z = 341.21 ($C_{25}H_{27}N$ = 341.5) |
| Sub 20A 4-7 | m/z = 437.21 ($C_{33}H_{27}N$ = 437.59) | Sub 20A 4-8 | m/z = 451.19 ($C_{33}H_{25}NO$ = 451.57) |
| Sub 20A 4-9 | m/z = 437.21 ($C_{33}H_{27}N$ = 437.59) | Sub 20A 4-10 | m/z = 527.26 ($C_{49}H_{33}N$ = 527.71) |
| Sub 20A 4-11 | m/z = 417.25 ($C_{31}H_{31}N$ = 417.6) | Sub 20A 4-12 | m/z = 451.23 ($C_{34}H_{29}N$ = 451.61) |
| Sub 20A 4-13 | m/z = 501.21 ($C_{37}H_{27}NO$ = 501.63) | Sub 20A 4-14 | m/z = 523.32 ($C_{39}H_{41}N$ = 523.76) |
| Sub 20A 4-15 | m/z = 495.29 ($C_{37}H_{37}N$ = 495.71) | Sub 20A 4-16 | m/z = 375.27 ($C_{27}H_{9}D_{14}N$ = 375.57) |
| Sub 20A 4-17 | m/z = 387.2 ($C_{29}H_{25}N$ = 387.53) | Sub 20A 4-18 | m/z = 432.18 ($C_{29}H_{24}N_{2}O_{2}$ = 432.52) |
| Sub 20A 4-19 | m/z = 537.25 ($C_{41}H_{31}N$ = 537.71) | Sub 20A 4-20 | m/z = 487.23 ($C_{37}H_{29}N$ = 487.65) |
| Sub 20A 4-21 | m/z = 569.31 ($C_{43}H_{39}N$ = 569.79) | Sub 20A 4-22 | m/z = 401.18 ($C_{29}H_{23}NO$ = 401.51) |
| Sub 20A 4-23 | m/z = 561.23 ($C_{39}H_{32}FNSi$ = 561.78) | Sub 20A 4-24 | m/z = 461.21 ($C_{35}H_{27}N$ = 461.61) |
| Sub 20A 4-25 | m/z = 411.2 ($C_{31}H_{25}N$ = 411.55) | Sub 20A 4-26 | m/z = 461.21 ($C_{35}H_{27}N$ = 461.61) |
| Sub 20A 4-27 | m/z = 411.2 ($C_{31}H_{25}N$ = 411.55) | | |

II. Synthesis of Sub 20B

Sub 20B of Reaction Formula 1 is synthesized through, but not limited to, a reaction path of the following Reaction Formula 3. Hal is I, Br or Cl.

[Reaction Formula 3]

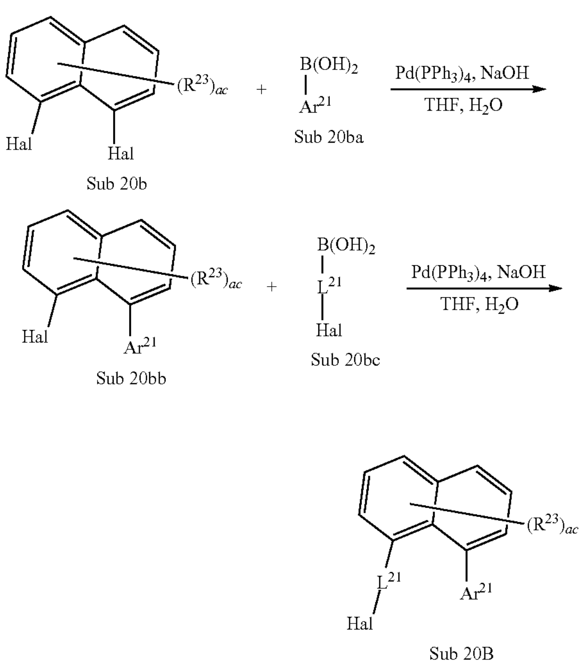

1. Example of Synthesis of Sub 20B-6

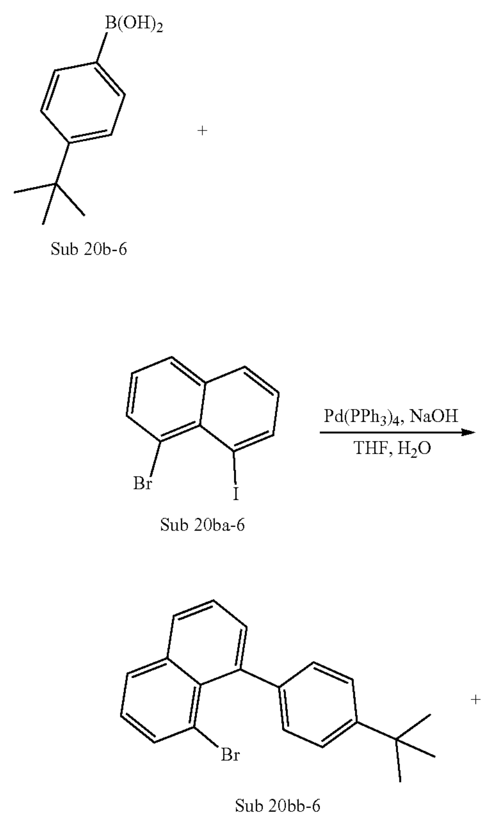

-continued

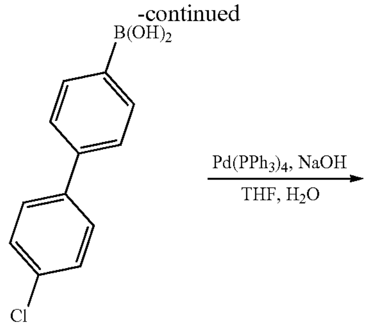

Sub 20bc-6

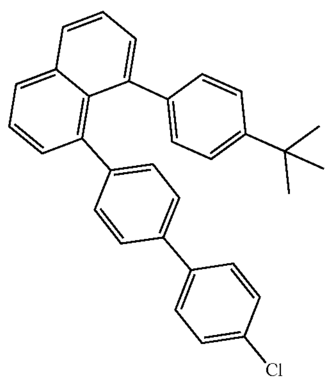

Sub 20B-6

1) Synthesis of Sub 20bb-6

After putting Sub 20ba-6 (50.0 g, 150.2 mmol) in a round-bottom flask, dissolving it in THF (751 ml), and adding Sub 20b-6 (26.7 g, 150.2 mmol), $Pd(PPh_3)_4$ (10.4 g, 9.0 mmol), NaOH (18.0 g, 450.5 mmol), and water (375 ml), the same procedure as in Sub 20A 2-13a was performed to create a product in an amount of 41.1 g. (Yield: 80.6%)

2) Synthesis of Sub 20B-6

After putting Sub 20bb-6 (30.0 g, 88.4 mmol) in a round-bottom flask, dissolving it in THF (442 ml), and adding Sub 20bc-6 (20.6 g, 88.4 mmol), $Pd(PPh_3)_4$ (6.1 g, 5.3 mmol), NaOH (10.6 g, 265.3 mmol), and water (221 ml), the same procedure as in Sub 20A 2-13a was performed to create a product in an amount of 31.1 g. (Yield: 78.6%)

2. Example of Synthesis of Sub 20B-19

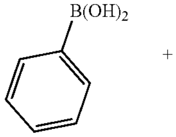

Sub 20b-19

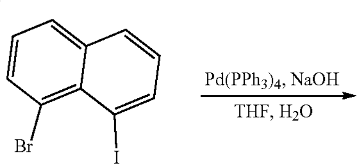

Sub 20ba-6

-continued

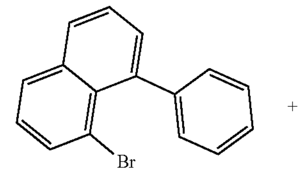

Sub 20bb-6

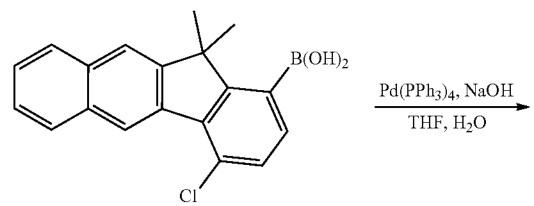

Sub 20bc-19

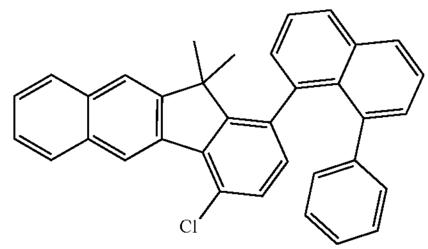

Sub 20B-19

1) Synthesis of Sub 20bb-19

After putting Sub 20bb-6 (30.0 g, 88.4 mmol) in a round-bottom flask, dissolving it in THF (442 ml), and adding Sub 20bc-6 (20.6 g, 88.4 mmol), $Pd(PPh_3)_4$ (6.1 g, 5.3 mmol), NaOH (10.6 g, 265.3 mmol), and water (221 ml), the same procedure as in Sub 20A 2-13a was performed to create a product in an amount of 31.1 g. (Yield: 78.6%)

2) Synthesis of Sub 20B-19

After putting Sub 20bb-19 (30.0 g, 105.9 mmol) in a round-bottom flask, dissolving it in THF (530 ml), and adding Sub 20bc-19 (34.2 g, 105.9 mmol), $Pd(PPh_3)_4$ (7.4 g, 6.4 mmol), NaOH (12.7 g, 317.8 mmol), and water (265 ml), the same procedure as in Sub 20A 2-13a was performed to create a product in an amount of 39.6 g. (Yield: 77.7%)

3. Example of Synthesis of Sub 20B-41

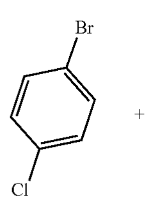

Sub 20b-41

-continued

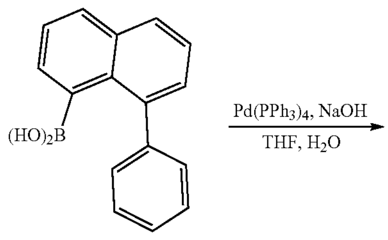

Sub 20ba-41

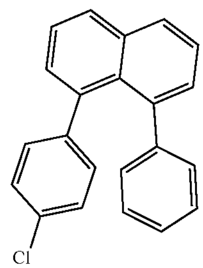

Sub 20B-41

After putting Sub 20b-41 (50.0 g, 261.2 mmol) in a round-bottom flask, dissolving it in THF (1306 ml), and adding Sub 20ba-41 (64.8 g, 261.2 mmol), $Pd(PPh_3)_4$ (18.1 g, 15.7 mmol), NaOH (31.3 g, 783.5 mmol), and water (653 ml), the same procedure as in Sub 20A 2-13a was performed to create a product in an amount of 66.8 g. (Yield: 81.2%)

4. Example of Synthesis of Sub 20B-46

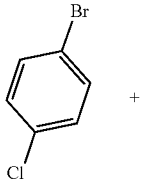

Sub 20b-41

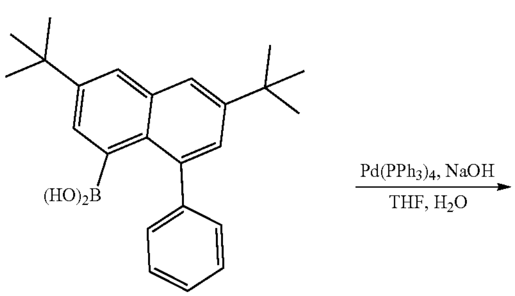

Sub 20ba-46

-continued

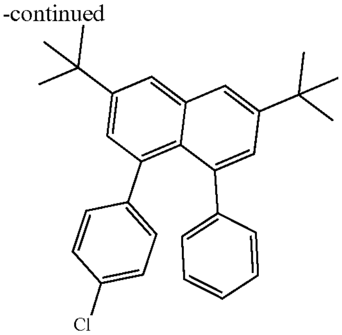

Sub 20B-46

After putting Sub 20b-41 (50.0 g, 261.2 mmol) in a round-bottom flask, dissolving it in THF (1306 ml), and adding Sub 20ba-46 (94.1 g, 261.2 mmol), $Pd(PPh_3)_4$ (18.1 g, 15.7 mmol), NaOH (31.3 g, 783.5 mmol), and water (653 ml), the same procedure as in Sub 20A 2-13a was performed to create a product in an amount of 87.4 g. (Yield: 78.4%)

5. Example of Synthesis of Sub 20B-57

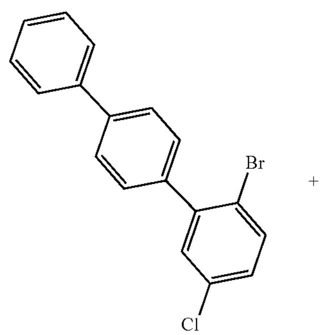

Sub 20b-57

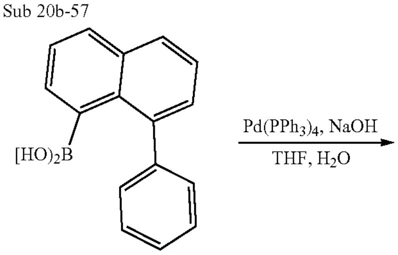

Sub 20ba-57

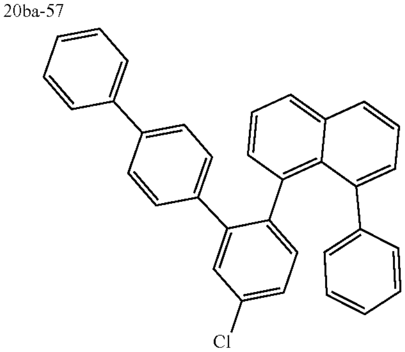

Sub 20B-57

After putting Sub 20b-57 (50.0 g, 145.5 mmol) in a round-bottom flask, dissolving it in THF (727 ml), and adding Sub 20ba-57 (36.1 g, 145.5 mmol), $Pd(PPh_3)_4$ (10.1 g, 8.7 mmol), NaOH (17.5 g, 436.5 mmol), and water (364 ml), the same procedure as in Sub 20A 2-13a was performed to create a product in an amount of 54.6 g. (Yield: 80.3%)

6. Example of Synthesis of Sub 20B-84

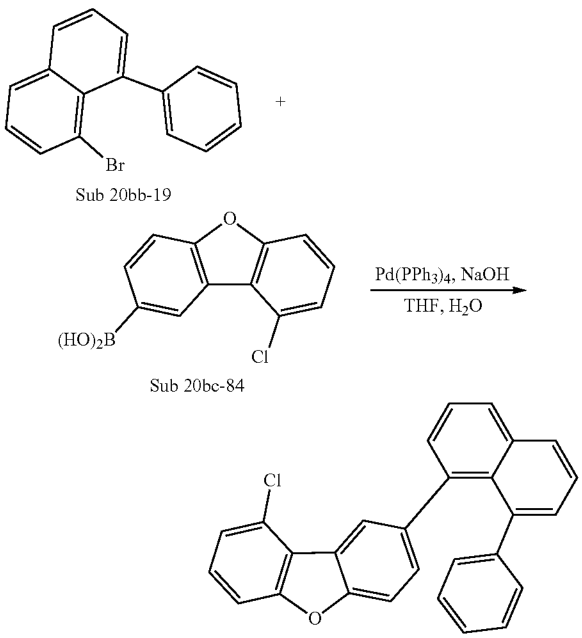

Sub 20bb-19
Sub 20bc-84
Sub 20B-84

After putting Sub 20bb-19 (30.0 g, 105.9 mmol) in a round-bottom flask, dissolving it in THF (530 ml), and adding Sub 20bc-84 (26.1 g, 105.9 mmol), $Pd(PPh_3)_4$ (7.4 g, 6.4 mmol), NaOH (12.7 g, 317.8 mmol), and water (265 ml), the same procedure as in Sub 20A 2-13a was performed to create a product in an amount of 33.9 g. (Yield: 79.1%)

7. Example of Synthesis of Sub 20B-100

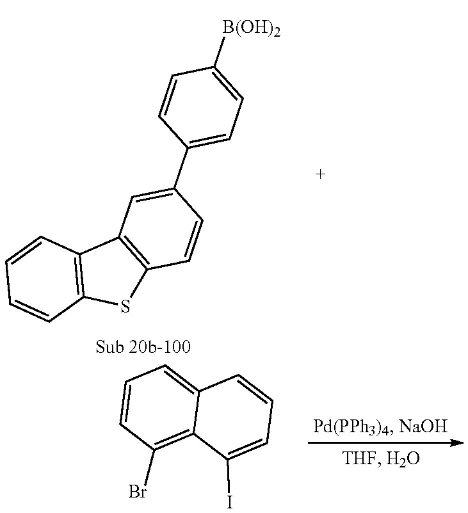

Sub 20b-100
Sub 20ba-6

-continued

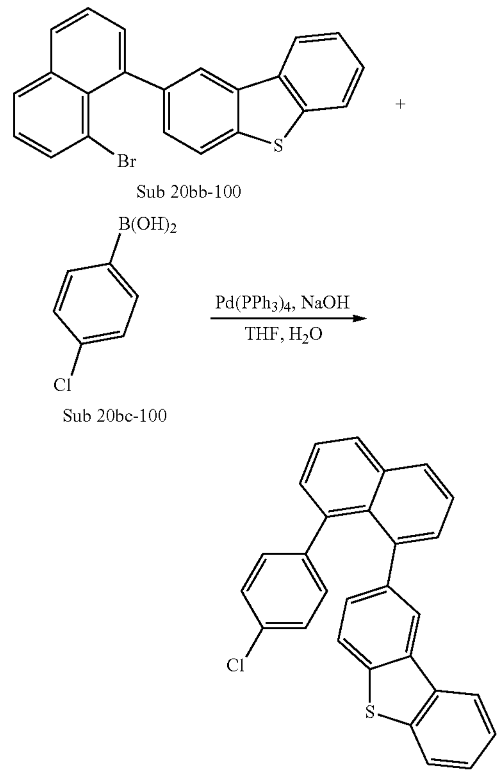

Sub 20bb-100
Sub 20bc-100
Sub 20B-100

1) Synthesis of Sub 20bb-100

After putting Sub 20ba-6 (50.0 g, 150.2 mmol) in a round-bottom flask, dissolving it in THF (751 ml), and adding Sub 20b-100 (45.7 g, 150.2 mmol), $Pd(PPh_3)_4$ (10.4 g, 9.0 mmol), NaOH (18.0 g, 450.5 mmol), and water (375 ml), the same procedure as in Sub 20A 2-13a was performed to create a product in an amount of 47.8 g. (Yield: 81.8%)

2) Synthesis of Sub 20B-100

After putting Sub 20bb-100 (30.0 g, 77.1 mmol) in a round-bottom flask, dissolving it in THF (530 ml), and adding Sub 20bc-100 (12.0 g, 156.37 mmol), $Pd(PPh_3)_4$ (5.3 g, 4.6 mmol), NaOH (9.2 g, 231.2 mmol), and water (193 ml), the same procedure as in Sub 20A 2-13a was performed to create a product in an amount of 26.0 g. (Yield: 80.0%)

8. Example of Synthesis of Sub 20B-111

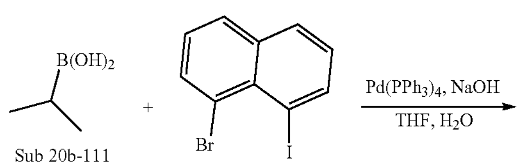

Sub 20b-111
Sub 20ba-6

-continued

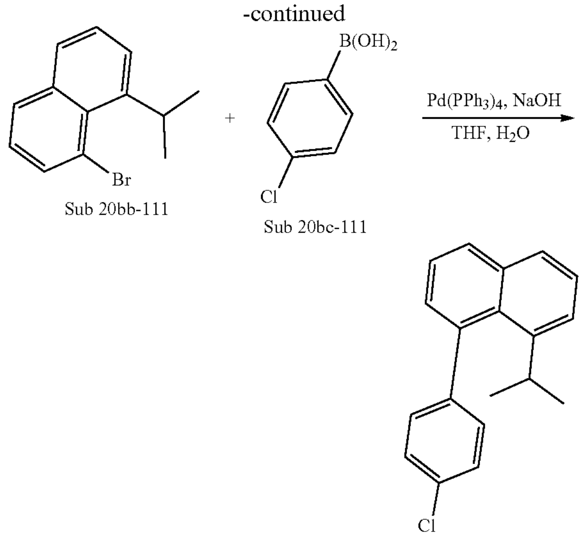

Sub 20B-111

1) Synthesis of Sub 20bb-111

After putting Sub 20ba-6 (50.0 g, 150.2 mmol) in a round-bottom flask, dissolving it in THF (751 ml), and adding Sub 20b-111 (13.2 g, 150.2 mmol), $Pd(PPh_3)_4$ (10.4 g, 9.0 mmol), NaOH (18.0 g, 450.5 mmol), and water (375 ml), the same procedure as in Sub 20A 2-13a was performed to create a product in an amount of 31.9 g. (Yield: 85.3%)

2) Synthesis of Sub 20B-111

After putting Sub 20bb-111 (30.0 g, 105.9 mmol) in a round-bottom flask, dissolving it in THF (602 ml), and adding Sub 20bc-111 (18.8 g, 120.4 mmol), $Pd(PPh_3)_4$ (8.4 g, 7.2 mmol), NaOH (14.4 g, 361.2 mmol), and water (301 ml), the same procedure as in Sub 20A 2-13a was performed to create a product in an amount of 26.8 g. (Yield: 79.4%)

The compounds belonging to Sub 20B may be, but are not limited to, the following compounds, and Table 2 illustrates field desorption-mass spectrometry (FD-MS) values of the compounds belonging to Sub 20B.

Sub 20B-1

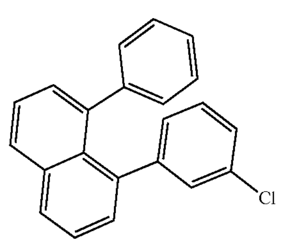

Sub 20B-2

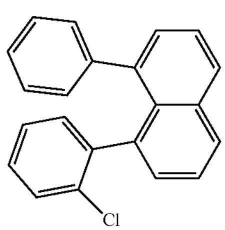

-continued

Sub 20B-3

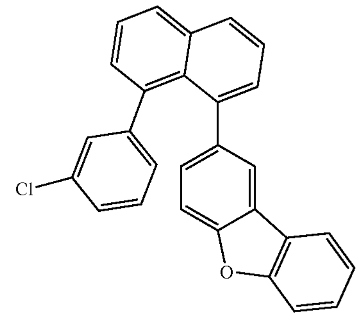

Sub 20B-4

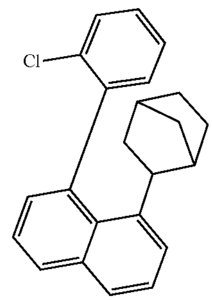

Sub 20B-5

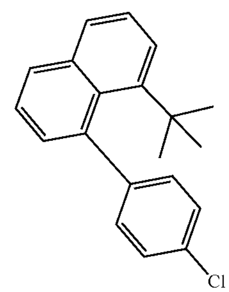

Sub 20B-6

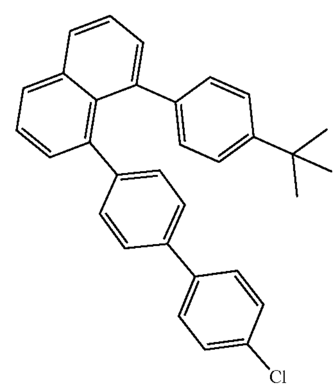

Sub 20B-7

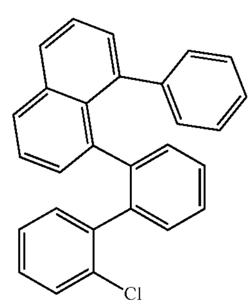

-continued
Sub 20B-8
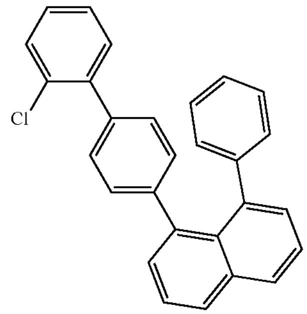
Sub 20B-9
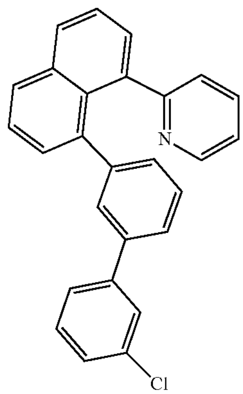
Sub 20B-10
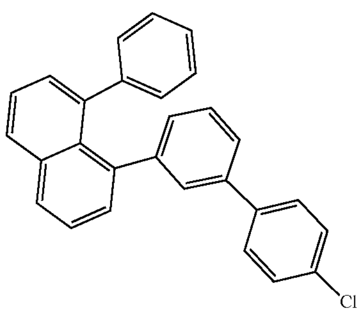
Sub 20B-11
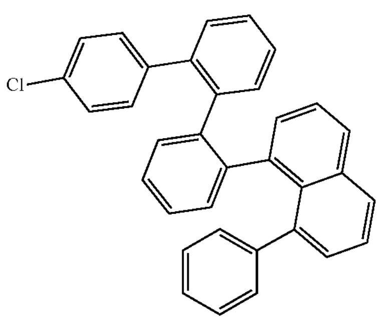
Sub 20B-12
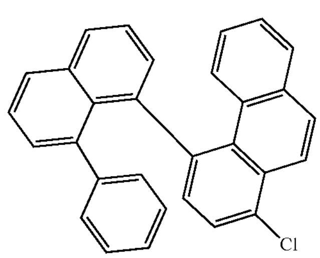
-continued
Sub 20B-13
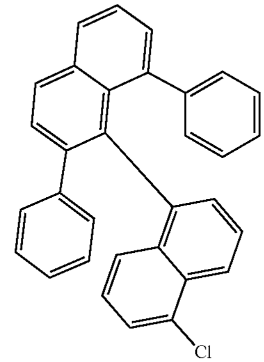
Sub 20B-14
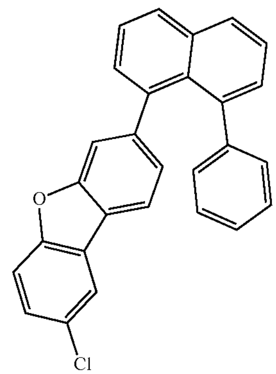
Sub 20B-15
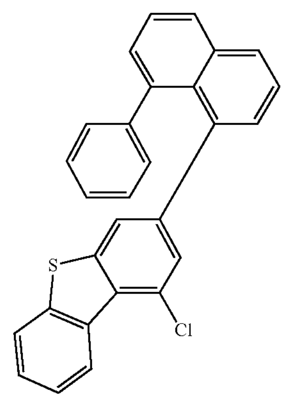
Sub 20B-16
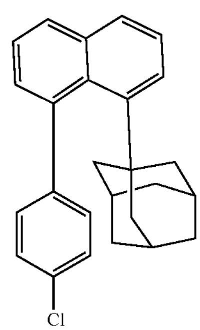

-continued
Sub 20B-17
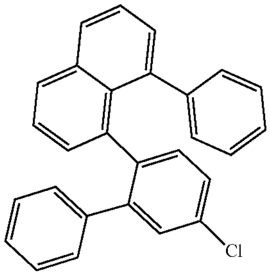
Sub 20B-18
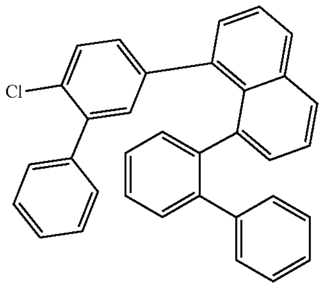
Sub 20B-19
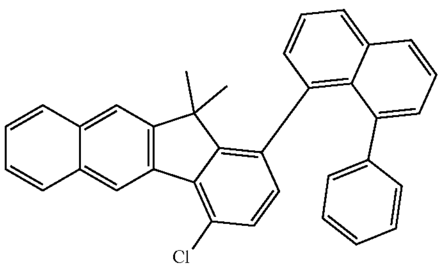
Sub 20B-20
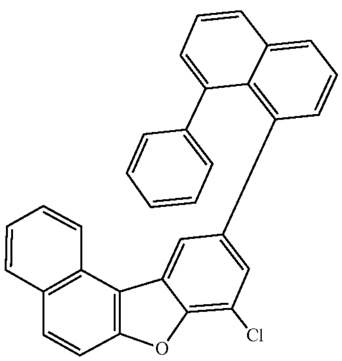
Sub 20B-21
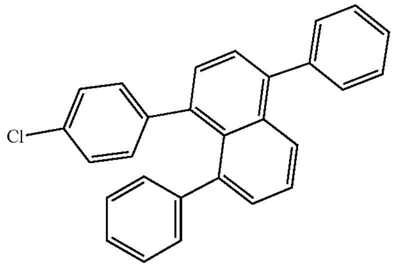
-continued
Sub 20B-22
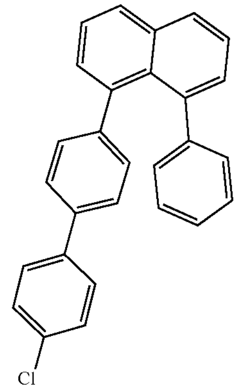
Sub 20B-23
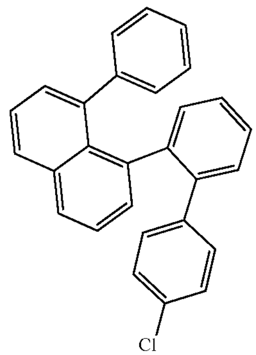
Sub 20B-24
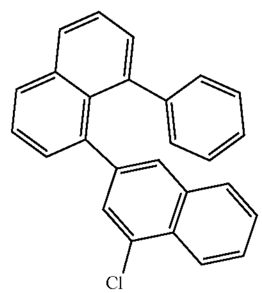
Sub 20B-25
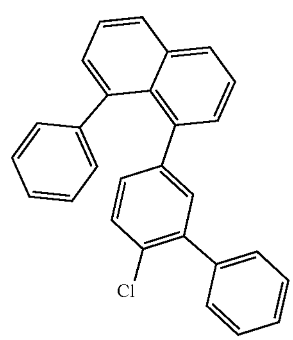

-continued
Sub 20B-26
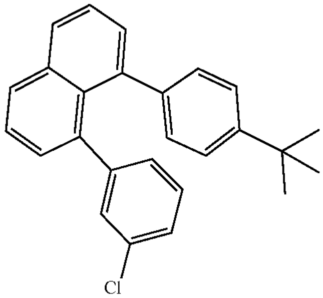
Sub 20B-27
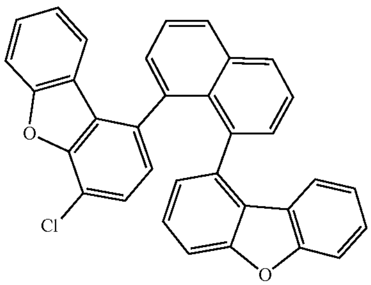
Sub 20B-28
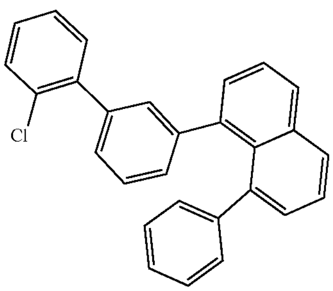
Sub 20B-29
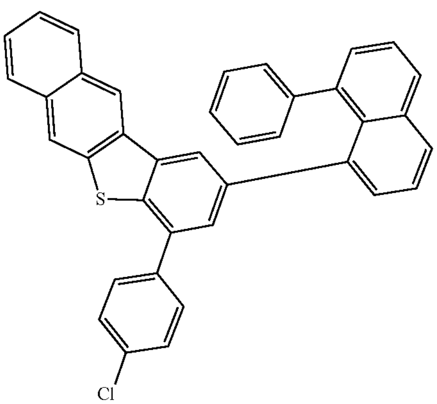
Sub 20B-30
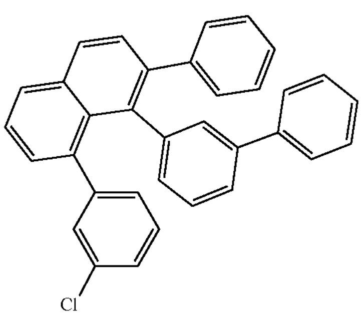
-continued
Sub 20B-31
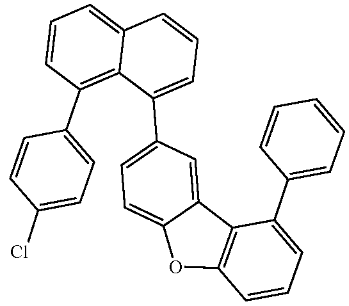
Sub 20B-32
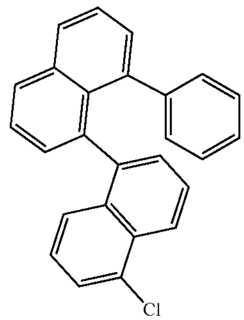
Sub 20B-33
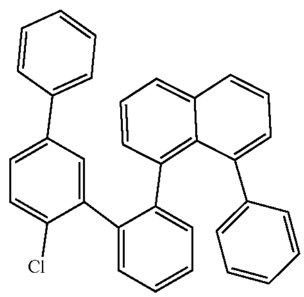
Sub 20B-34
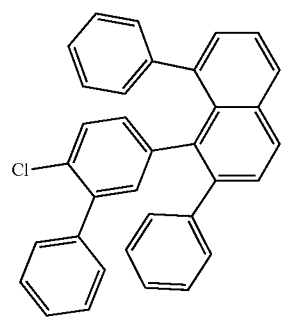
Sub 20B-35
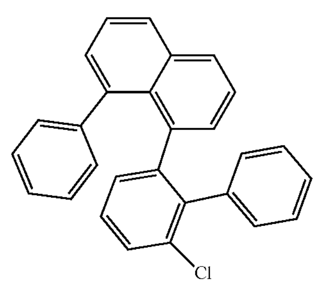

-continued
Sub 20B-36
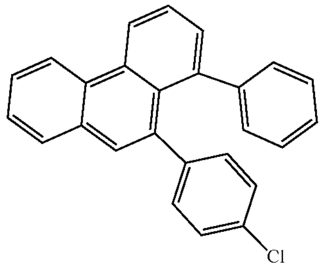
Sub 20B-37
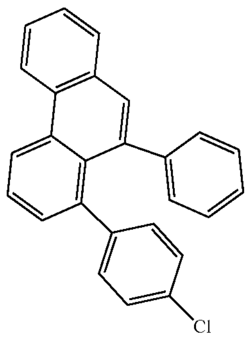
Sub 20B-38
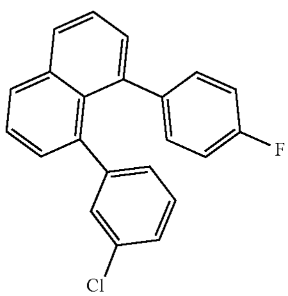
Sub 20B-39
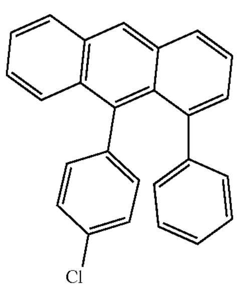
Sub 20B-40
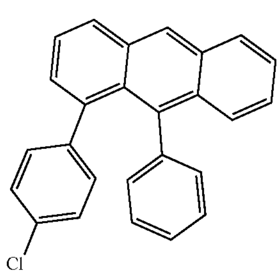
-continued
Sub 20B-41
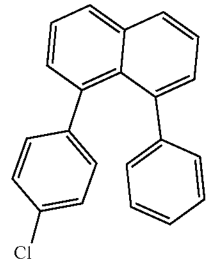
Sub 20B-42
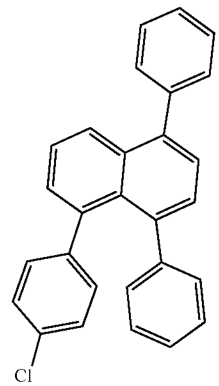
Sub 20B-43
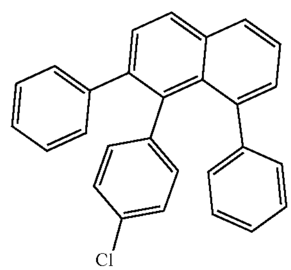
Sub 20B-44
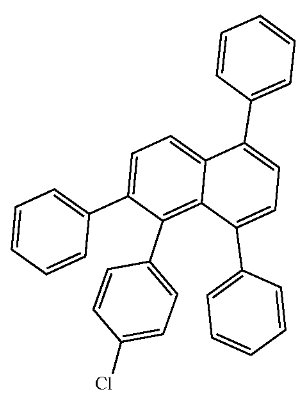

-continued
Sub 20B-45
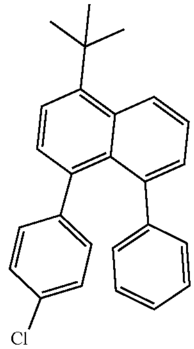
Sub 20B-46
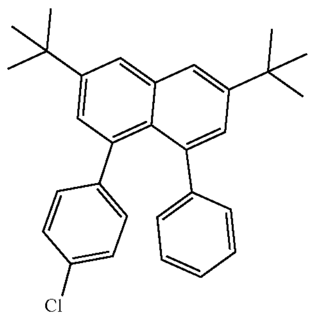
Sub 20B-47
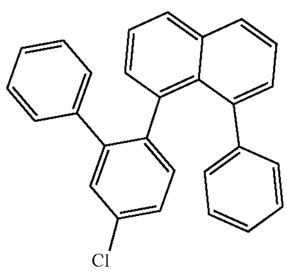
Sub 20B-48
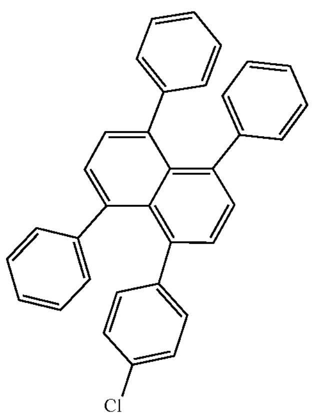
Sub 20B-49
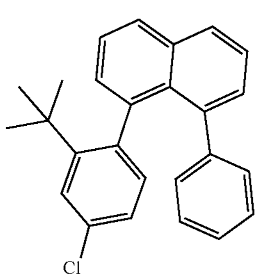
-continued
Sub 20B-50
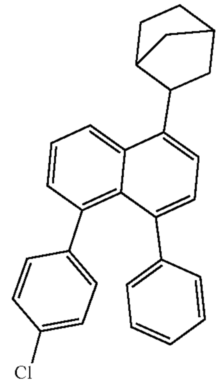
Sub 20B-51
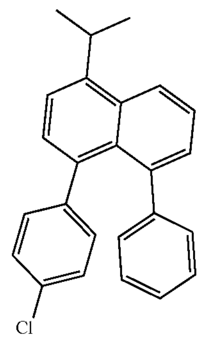
Sub 20B-52
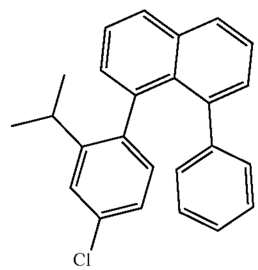
Sub 20B-53
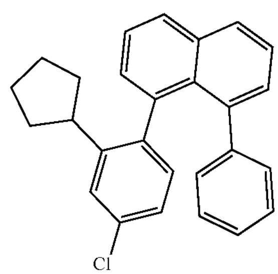
Sub 20B-54
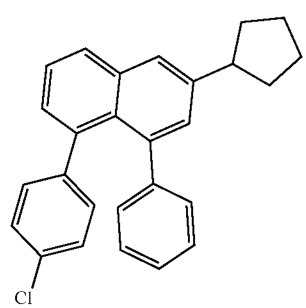

Sub 20B-55
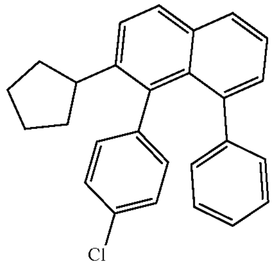
Sub 20B-56
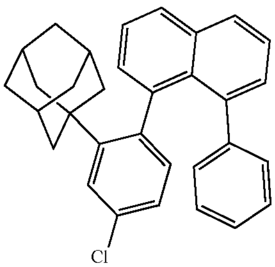
Sub 20B-57
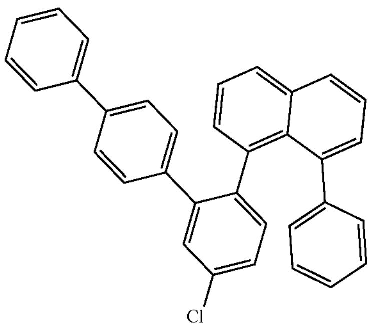
Sub 20B-58
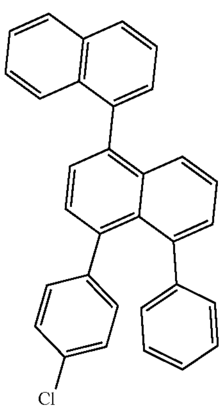
Sub 20B-59
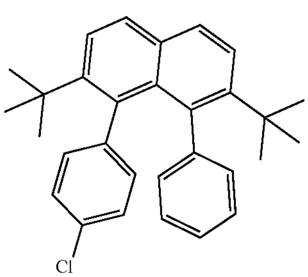
Sub 20B-60
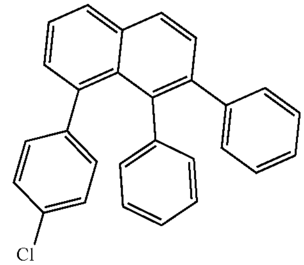
Sub 20B-61
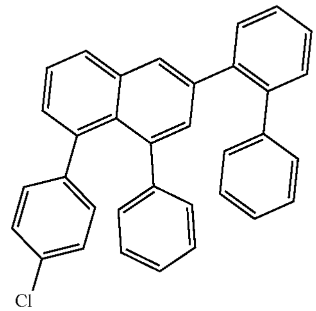
Sub 20B-62
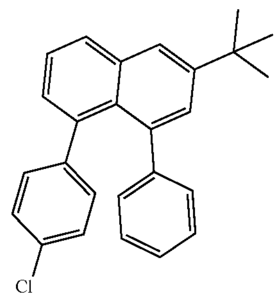
Sub 20B-63
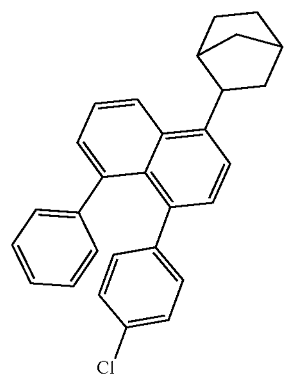
Sub 20B-64
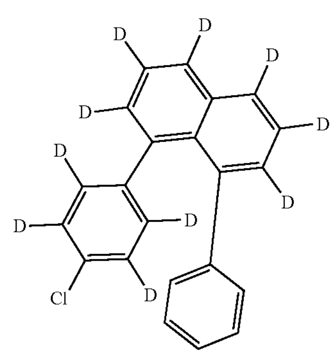

-continued
Sub 20B-65
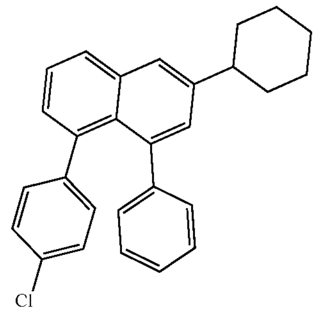
Sub 20B-66
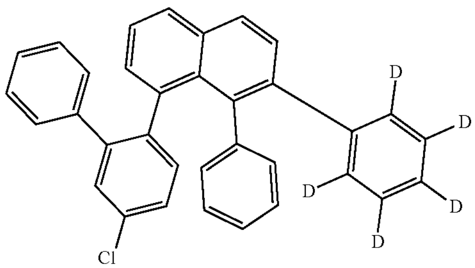
Sub 20B-67
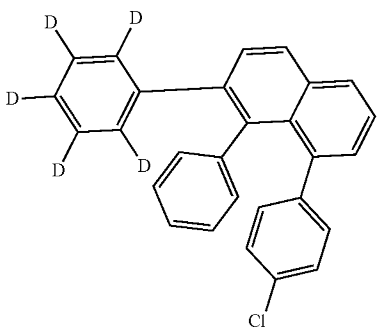
Sub 20B-68
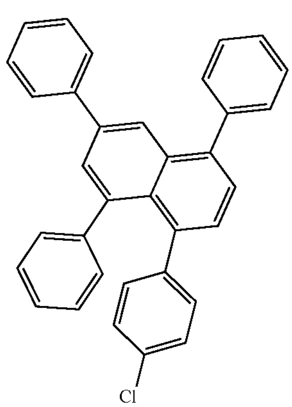
Sub 20B-69
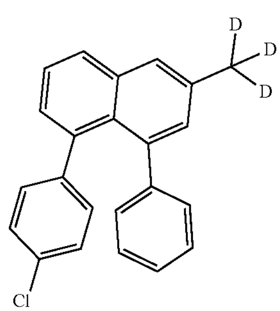
-continued
Sub 20B-70
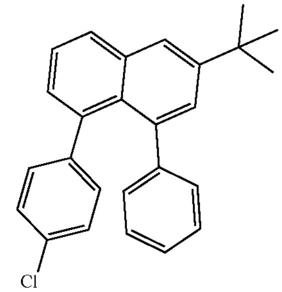
Sub 20B-71
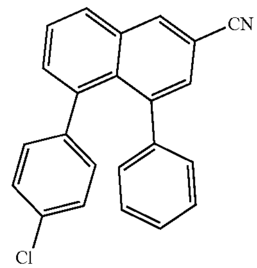
Sub 20B-72
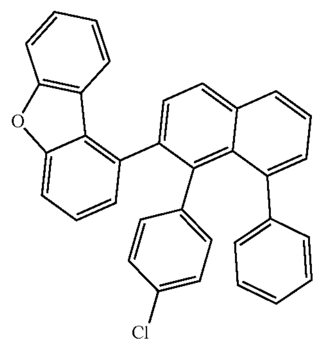
Sub 20B-73
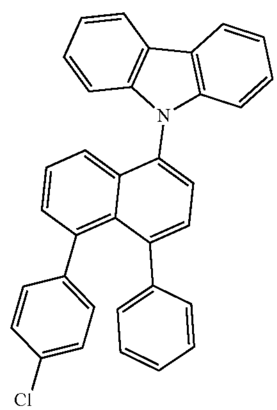
Sub 20B-74
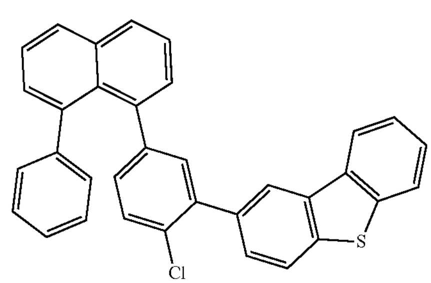

-continued
Sub 20B-75
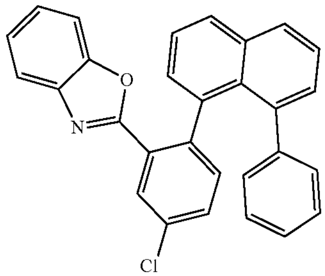
Sub 20B-76
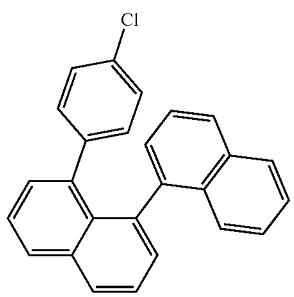
Sub 20B-77
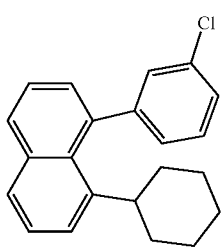
Sub 20B-78
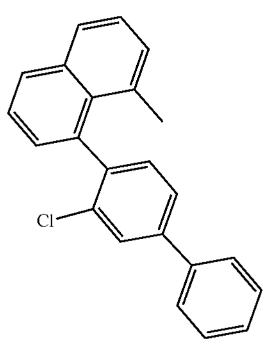
Sub 20B-79
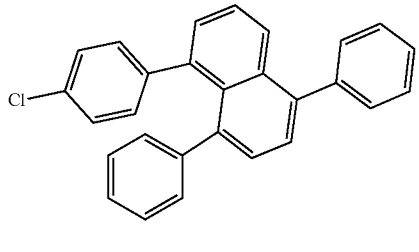
-continued
Sub 20B-80
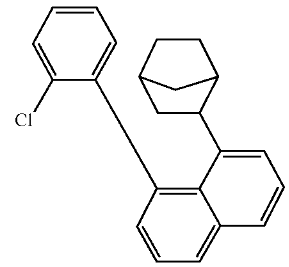
Sub 20B-81
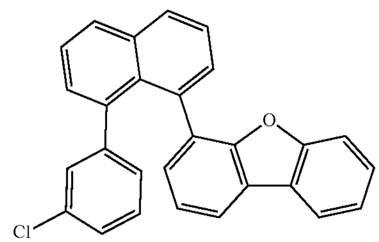
Sub 20B-82
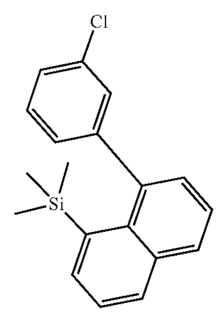
Sub 20B-83
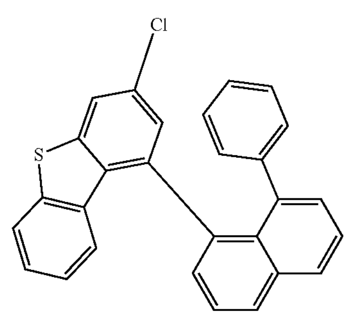
Sub 20B-84
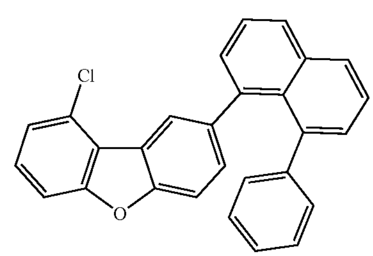

-continued
Sub 20B-85
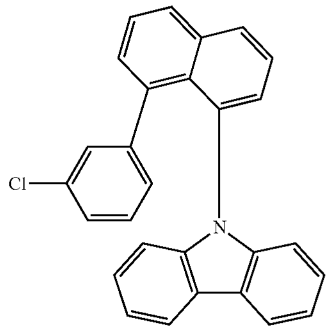
Sub 20B-86
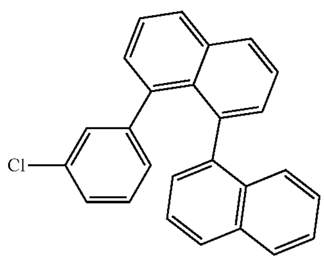
Sub 20B-87
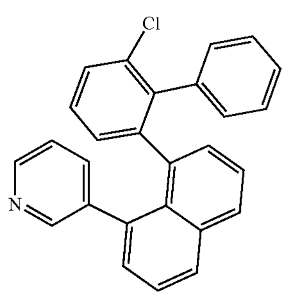
Sub 20B-88
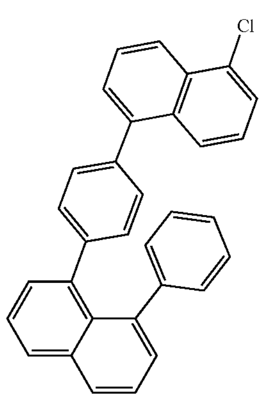
-continued
Sub 20B-89
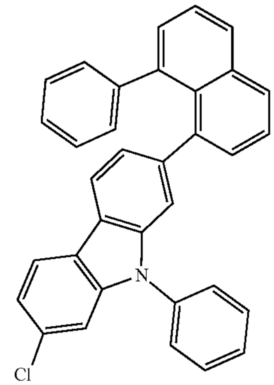
Sub 20B-90
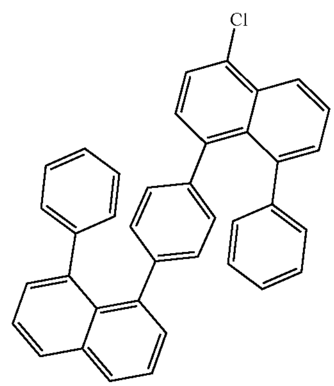
Sub 20B-91
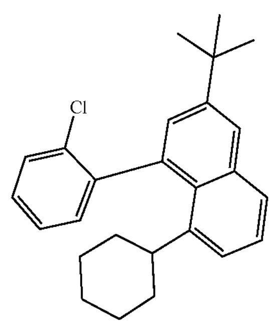
Sub 20B-92
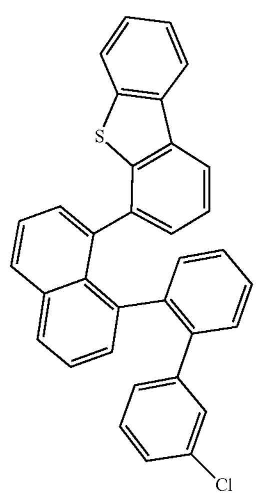

-continued
Sub 20B-93
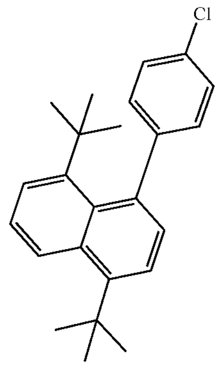
Sub 20B-94
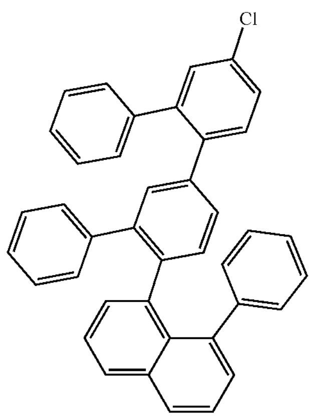
Sub 20B-95
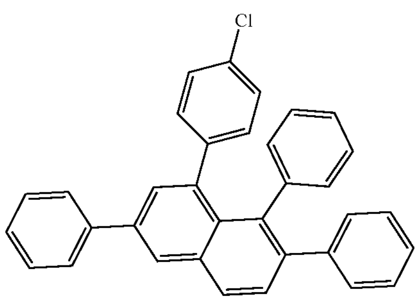
Sub 20B-96
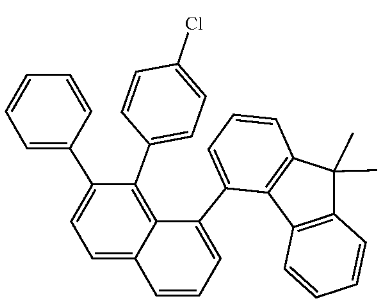
-continued
Sub 20B-97
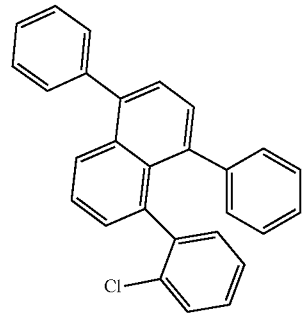
Sub 20B-98
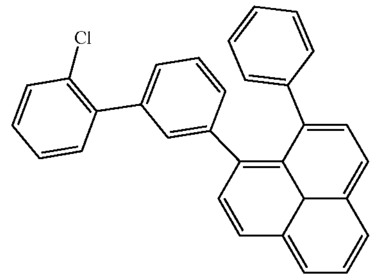
Sub 20B-99
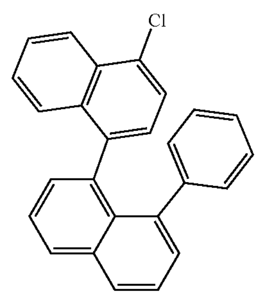
Sub 20B-100
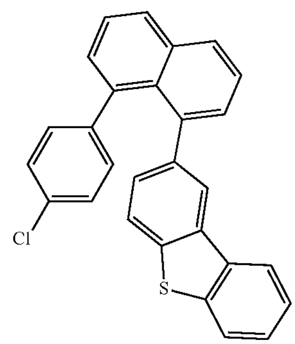
Sub 20B-101
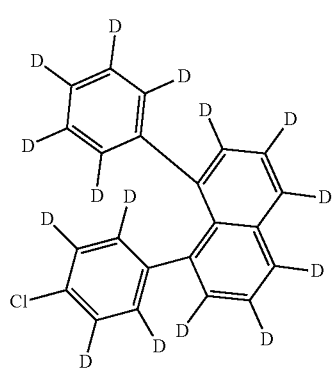

-continued
Sub 20B-102
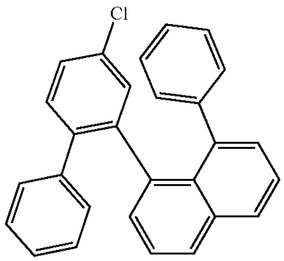
Sub 20B-103
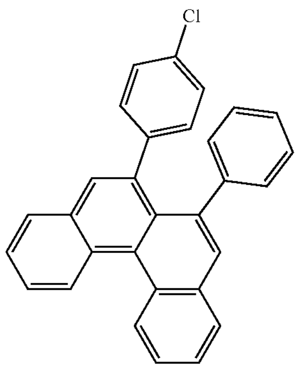
Sub 20B-104
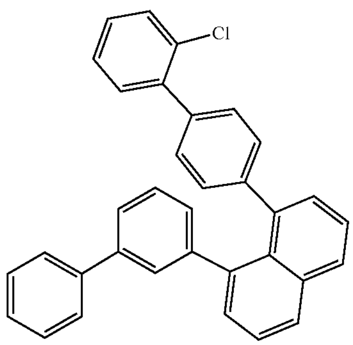
Sub 20B-105
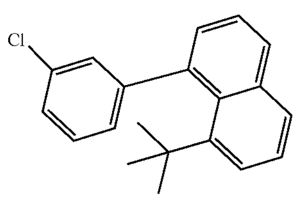
Sub 20B-106
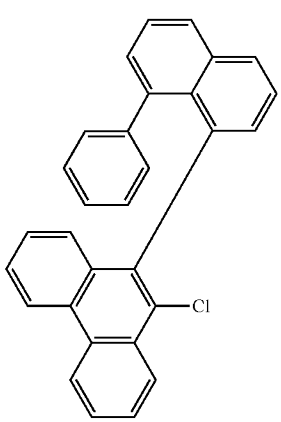
-continued
Sub 20B-107
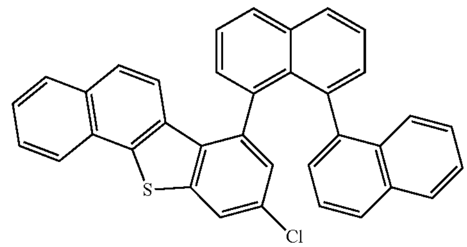
Sub 20B-108
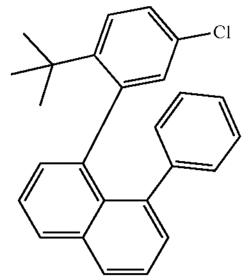
Sub 20B-109
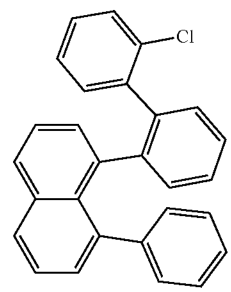
Sub 20B-110
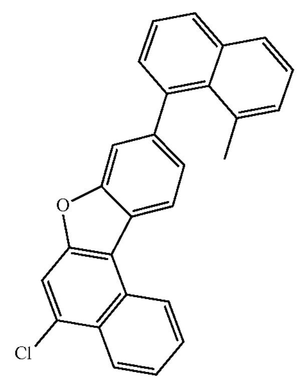
Sub 20B-111
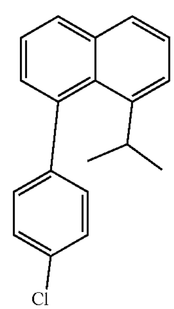

-continued
Sub 20B-112
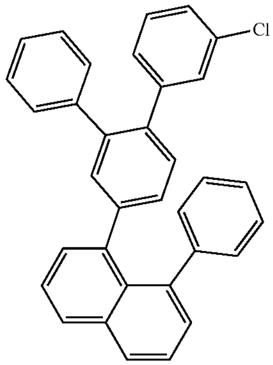
Sub 20B-113
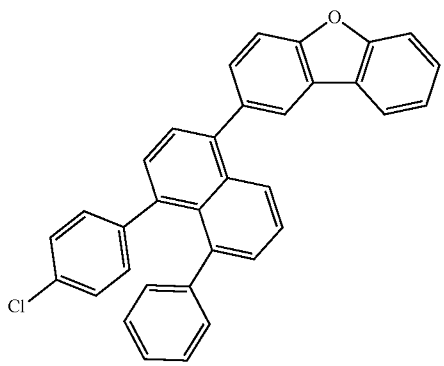
Sub 20B-114
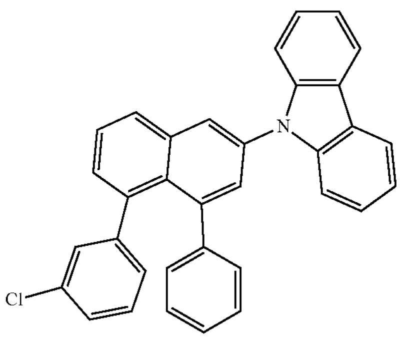
Sub 20B-115
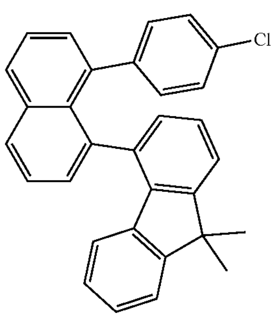
Sub 20B-116
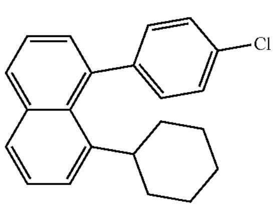
-continued
Sub 20B-117
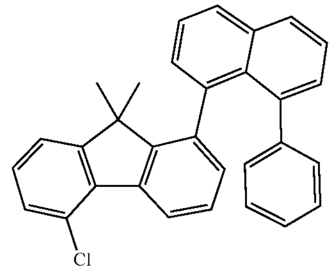
Sub 20B-118
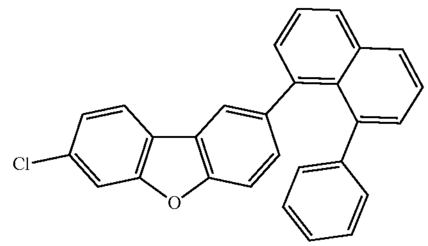
Sub 20B-119
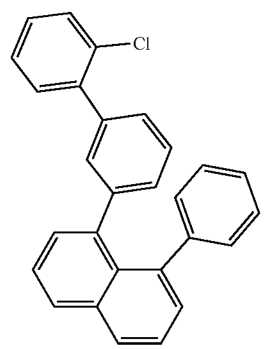
Sub 20B-120
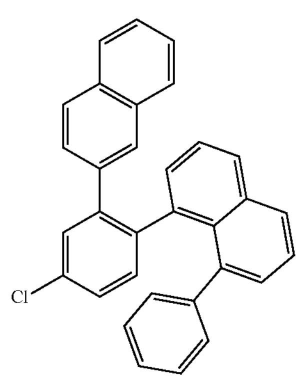

-continued

Sub 20B-121

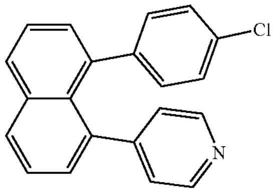

Sub 20B-122

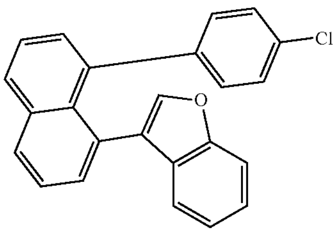

-continued

Sub 20B-123

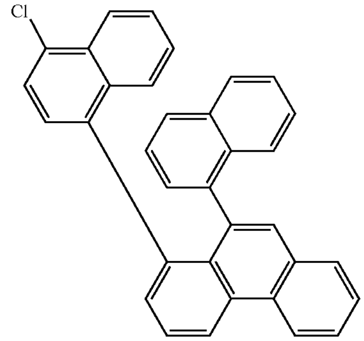

Sub 20B-124

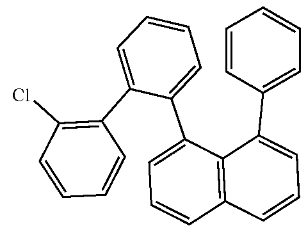

TABLE 2

| Compound | FD-MS | Compound | FD-MS |
|---|---|---|---|
| Sub 20B-1 | m/z = 314.09 ($C_{22}H_{15}Cl$ = 314.81) | Sub 20B-2 | m/z = 314.09 ($C_{22}H_{15}Cl$ = 314.81) |
| Sub 20B-3 | m/z = 404.1 ($C_{28}H_{17}ClO$ = 404.89) | Sub 20B-4 | m/z = 332.13 ($C_{23}H_{21}Cl$ = 332.87) |
| Sub 20B-5 | m/z = 294.12 ($C_{20}H_{19}Cl$ = 294.82) | Sub 20B-6 | m/z = 446.18 ($C_{32}H_{27}Cl$ = 447.02) |
| Sub 20B-7 | m/z = 390.12 ($C_{28}H_{19}Cl$ = 390.91) | Sub 20B-8 | m/z = 390.12 ($C_{28}H_{19}Cl$ = 390.91) |
| Sub 20B-9 | m/z = 391.11 ($C_{27}H_{18}ClN$ = 391.9) | Sub 20B-10 | m/z = 390.12 ($C_{28}H_{19}Cl$ = 390.91) |
| Sub 20B-11 | m/z = 466.15 ($C_{34}H_{23}Cl$ = 467.01) | Sub 20B-12 | m/z = 414.12 ($C_{30}H_{19}Cl$ = 414.93) |
| Sub 20B-13 | m/z = 440.13 ($C_{32}H_{21}Cl$ = 440.97) | Sub 20B-14 | m/z = 404.1 ($C_{28}H_{17}ClO$ = 404.89) |
| Sub 20B-15 | m/z = 420.07 ($C_{28}H_{17}ClS$ = 420.95) | Sub 20B-16 | m/z = 372.16 ($C_{26}H_{25}Cl$ = 372.94) |
| Sub 20B-17 | m/z = 390.12 ($C_{28}H_{19}Cl$ = 390.91) | Sub 20B-18 | m/z = 466.15 ($C_{34}H_{23}Cl$ = 467.01) |
| Sub 20B-19 | m/z = 480.16 ($C_{35}H_{25}Cl$ = 481.03) | Sub 20B-20 | m/z = 454.11 ($C_{32}H_{19}ClO$ = 454.95) |
| Sub 20B-21 | m/z = 390.12 ($C_{28}H_{19}Cl$ = 390.91) | Sub 20B-22 | m/z = 390.12 ($C_{28}H_{19}Cl$ = 390.91) |
| Sub 20B-23 | m/z = 390.12 ($C_{28}H_{19}Cl$ = 390.91) | Sub 20B-24 | m/z = 364.1 ($C_{26}H_{17}Cl$ = 364.87) |
| Sub 20B-25 | m/z = 390.12 ($C_{28}H_{19}Cl$ = 390.91) | Sub 20B-26 | m/z = 370.15 ($C_{26}H_{23}Cl$ = 370.92) |
| Sub 20B-27 | m/z = 494.11 ($C_{34}H_{19}ClO_2$ = 494.97) | Sub 20B-28 | m/z = 390.12 ($C_{28}H_{19}Cl$ = 390.91) |
| Sub 20B-29 | m/z = 546.12 ($C_{38}H_{23}ClS$ = 547.11) | Sub 20B-30 | m/z = 466.15 ($C_{34}H_{23}Cl$ = 467.01) |
| Sub 20B-31 | m/z = 480.13 ($C_{34}H_{21}ClO$ = 480.99) | Sub 20B-32 | m/z = 364.1 ($C_{26}H_{17}Cl$ = 364.87) |
| Sub 20B-33 | m/z = 466.15 ($C_{34}H_{23}Cl$ = 467.01) | Sub 20B-34 | m/z = 466.15 ($C_{34}H_{23}Cl$ = 467.01) |
| Sub 20B-35 | m/z = 390.12 ($C_{28}H_{19}Cl$ = 390.91) | Sub 20B-36 | m/z = 364.1 ($C_{26}H_{17}Cl$ = 364.87) |
| Sub 20B-37 | m/z = 364.1 ($C_{26}H_{17}Cl$ = 364.87) | Sub 20B-38 | m/z = 332.08 ($C_{22}H_{14}ClF$ = 332.8) |
| Sub 20B-39 | m/z = 364.1 ($C_{26}H_{17}Cl$ = 364.87) | Sub 20B-40 | m/z = 364.1 ($C_{26}H_{17}Cl$ = 364.87) |
| Sub 20B-41 | m/z = 314.09 ($C_{22}H_{15}Cl$ = 314.81) | Sub 20B-42 | m/z = 390.12 ($C_{28}H_{19}Cl$ = 390.91) |
| Sub 20B-43 | m/z = 390.12 ($C_{28}H_{19}Cl$ = 390.91) | Sub 20B-44 | m/z = 466.15 ($C_{34}H_{23}Cl$ = 467.01) |
| Sub 20B-45 | m/z = 370.15 ($C_{26}H_{23}Cl$ = 370.92) | Sub 20B-46 | m/z = 426.21 ($C_{30}H_{31}Cl$ = 427.03) |
| Sub 20B-47 | m/z = 390.12 ($C_{28}H_{19}Cl$ = 390.91) | Sub 20B-48 | m/z = 466.15 ($C_{34}H_{23}Cl$ = 467.01) |
| Sub 20B-49 | m/z = 370.15 ($C_{26}H_{23}Cl$ = 370.92) | Sub 20B-50 | m/z = 408.16 ($C_{29}H_{25}Cl$ = 408.97) |
| Sub 20B-51 | m/z = 356.13 ($C_{25}H_{21}Cl$ = 356.89) | Sub 20B-52 | m/z = 356.13 ($C_{25}H_{21}Cl$ = 356.89) |
| Sub 20B-53 | m/z = 382.15 ($C_{27}H_{23}Cl$ = 382.93) | Sub 20B-54 | m/z = 382.15 ($C_{27}H_{23}Cl$ = 382.93) |
| Sub 20B-55 | m/z = 382.15 ($C_{27}H_{23}Cl$ = 382.93) | Sub 20B-56 | m/z = 448.2 ($C_{32}H_{29}Cl$ = 449.03) |
| Sub 20B-57 | m/z = 466.15 ($C_{34}H_{23}Cl$ = 467.01) | Sub 20B-58 | m/z = 440.13 ($C_{32}H_{21}Cl$ = 440.97) |
| Sub 20B-59 | m/z = 426.21 ($C_{30}H_{31}Cl$ = 427.03) | Sub 20B-60 | m/z = 390.12 ($C_{28}H_{19}Cl$ = 390.91) |
| Sub 20B-61 | m/z = 466.15 ($C_{34}H_{23}Cl$ = 467.01) | Sub 20B-62 | m/z = 370.15 ($C_{26}H_{23}Cl$ = 370.92) |
| Sub 20B-63 | m/z = 408.16 ($C_{29}H_{25}Cl$ = 408.97) | Sub 20B-64 | m/z = 324.15 ($C_{22}H_5D_{10}Cl$ = 324.87) |
| Sub 20B-65 | m/z = 396.16 ($C_{28}H_{25}Cl$ = 396.96) | Sub 20B-66 | m/z = 471.18 ($C_{34}H_{18}D_5Cl$ = 472.04) |
| Sub 20B-67 | m/z = 395.15 ($C_{28}H_{14}D_5Cl$ = 395.94) | Sub 20B-68 | m/z = 466.15 ($C_{34}H_{23}Cl$ = 467.01) |
| Sub 20B-69 | m/z = 331.12 ($C_{23}H_{14}D_3Cl$ = 331.86) | Sub 20B-70 | m/z = 370.15 ($C_{26}H_{23}Cl$ = 370.92) |
| Sub 20B-71 | m/z = 339.08 ($C_{23}H_{14}ClN$ = 339.82) | Sub 20B-72 | m/z = 480.13 ($C_{34}H_{21}ClO$ = 480.99) |

TABLE 2-continued

| Compound | FD-MS | Compound | FD-MS |
|---|---|---|---|
| Sub 20B-73 | m/z = 479.14 ($C_{34}H_{22}ClN$ = 480.01) | Sub 20B-74 | m/z = 496.11 ($C_{34}H_{21}ClS$ = 497.05) |
| Sub 20B-75 | m/z = 431.11 ($C_{29}H_{18}ClNO$ = 431.92) | Sub 20B-76 | m/z = 364.1 ($C_{26}H_{17}Cl$ = 364.87) |
| Sub 20B-77 | m/z = 320.13 ($C_{22}H_{21}Cl$ = 320.86) | Sub 20B-78 | m/z = 328.1 ($C_{23}H_{17}Cl$ = 328.84) |
| Sub 20B-79 | m/z = 390.12 ($C_{28}H_{19}Cl$ = 390.91) | Sub 20B-80 | m/z = 332.13 ($C_{23}H_{21}Cl$ = 332.87) |
| Sub 20B-81 | m/z = 404.1 ($C_{28}H_{17}ClO$ = 404.89) | Sub 20B-82 | m/z = 310.09 ($C_{19}H_{19}ClSi$ = 310.9) |
| Sub 20B-83 | m/z = 420.07 ($C_{28}H_{17}ClS$ = 420.95) | Sub 20B-84 | m/z = 404.1 ($C_{28}H_{17}ClO$ = 404.89) |
| Sub 20B-85 | m/z = 403.11 ($C_{28}H_{18}ClN$ = 403.91) | Sub 20B-86 | m/z = 364.1 ($C_{28}H_{17}Cl$ = 364.87) |
| Sub 20B-87 | m/z = 391.11 ($C_{27}H_{18}ClN$ = 391.9) | Sub 20B-88 | m/z = 440.13 ($C_{32}H_{21}Cl$ = 440.97) |
| Sub 20B-89 | m/z = 479.14 ($C_{34}H_{22}ClN$ = 480.01) | Sub 20B-90 | m/z = 516.16 ($C_{38}H_{25}Cl$ = 517.07) |
| Sub 20B-91 | m/z = 376.2 ($C_{26}H_{29}Cl$ = 376.97) | Sub 20B-92 | m/z = 496.11 ($C_{34}H_{21}ClS$ = 497.05) |
| Sub 20B-93 | m/z = 350.18 ($C_{24}H_{27}Cl$ = 350.93) | Sub 20B-94 | m/z = 542.18 ($C_{40}H_{27}Cl$ = 543.11) |
| Sub 20B-95 | m/z = 466.15 ($C_{34}H_{23}Cl$ = 467.01) | Sub 20B-96 | m/z = 506.18 ($C_{37}H_{27}Cl$ = 507.07) |
| Sub 20B-97 | m/z = 390.12 ($C_{28}H_{19}Cl$ = 390.91) | Sub 20B-98 | m/z = 428.13 ($C_{31}H_{21}Cl$ = 428.96) |
| Sub 20B-99 | m/z = 364.1 ($C_{26}H_{17}Cl$ = 364.87) | Sub 20B-100 | m/z = 420.07 ($C_{28}H_{17}ClS$ = 420.95) |
| Sub 20B-101 | m/z = 329.18 ($C_{22}D_{15}Cl$ = 329.9) | Sub 20B-102 | m/z = 390.12 ($C_{28}H_{19}Cl$ = 390.91) |
| Sub 20B-103 | m/z = 414.12 ($C_{30}H_{19}Cl$ = 414.93) | Sub 20B-104 | m/z = 466.15 ($C_{34}H_{23}Cl$ = 467.01) |
| Sub 20B-105 | m/z = 294.12 ($C_{20}H_{19}Cl$ = 294.82) | Sub 20B-106 | m/z = 414.12 ($C_{30}H_{19}Cl$ = 414.93) |
| Sub 20B-107 | m/z = 520.11 ($C_{36}H_{21}ClS$ = 521.07) | Sub 20B-108 | m/z = 370.15 ($C_{26}H_{23}Cl$ = 370.92) |
| Sub 20B-109 | m/z = 390.12 ($C_{28}H_{19}Cl$ = 390.91) | Sub 20B-110 | m/z = 392.1 ($C_{27}H_{17}ClO$ = 392.88) |
| Sub 20B-111 | m/z = 280.1 ($C_{19}H_{17}Cl$ = 280.8) | Sub 20B-112 | m/z = 466.15 ($C_{34}H_{23}Cl$ = 467.01) |
| Sub 20B-113 | m/z = 480.13 ($C_{34}H_{21}ClO$ = 480.99) | Sub 20B-114 | m/z = 479.14 ($C_{34}H_{22}ClN$ = 480.01) |
| Sub 20B-115 | m/z = 430.15 ($C_{31}H_{23}Cl$ = 430.97) | Sub 20B-116 | m/z = 320.13 ($C_{22}H_{21}Cl$ = 320.86) |
| Sub 20B-117 | m/z = 430.15 ($C_{31}H_{23}Cl$ = 430.97) | Sub 20B-118 | m/z = 404.1 ($C_{28}H_{17}ClO$ = 404.89) |
| Sub 20B-119 | m/z = 390.12 ($C_{28}H_{19}Cl$ = 390.91) | Sub 20B-120 | m/z = 440.13 ($C_{32}H_{21}Cl$ = 440.97) |
| Sub 20B-121 | m/z = 315.08 ($C_{21}H_{14}ClN$ = 315.8) | Sub 20B-122 | m/z = 354.08 ($C_{24}H_{15}ClO$ = 354.83) |
| Sub 20B-123 | m/z = 464.13 ($C_{34}H_{21}Cl$ = 464.99) | Sub 20B-124 | m/z = 390.12 ($C_{28}H_{19}Cl$ = 390.91) |

III. Synthesis of Final Product

1. Example of Synthesis of P20-11

-continued

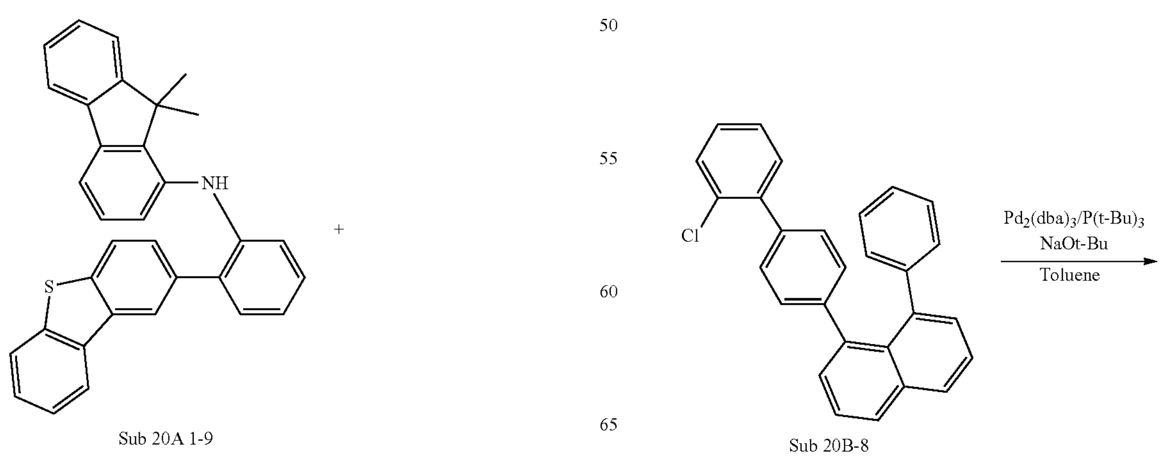

Sub 20A 1-9

Sub 20B-8

-continued

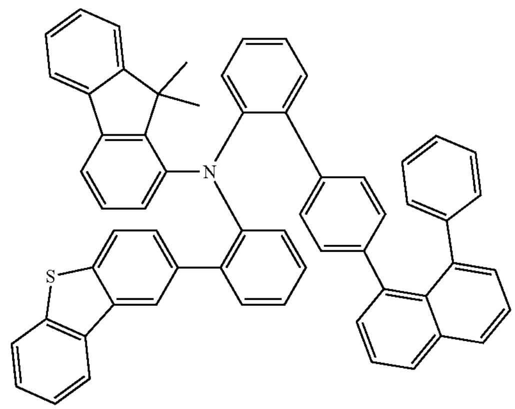

P20-11

After adding Sub 20A 1-9 (20.0 g, 42.8 mmol) and Sub 20B-8 (16.2 g, 42.8 mmol), $Pd_2(dba)_3$ (1.2 g, 1.3 mmol), $P(t\text{-}Bu)_3$ (0.5 g, 2.6 mmol), NaOt-Bu (8.2 g, 85.5 mmol), toluene (214 mL) in a round-bottom flask, the same procedure as in Sub 20A 1-5 was performed to create a product in an amount of 25.6 g. (Yield: 72.7%)

2. Example of Synthesis of P20-18

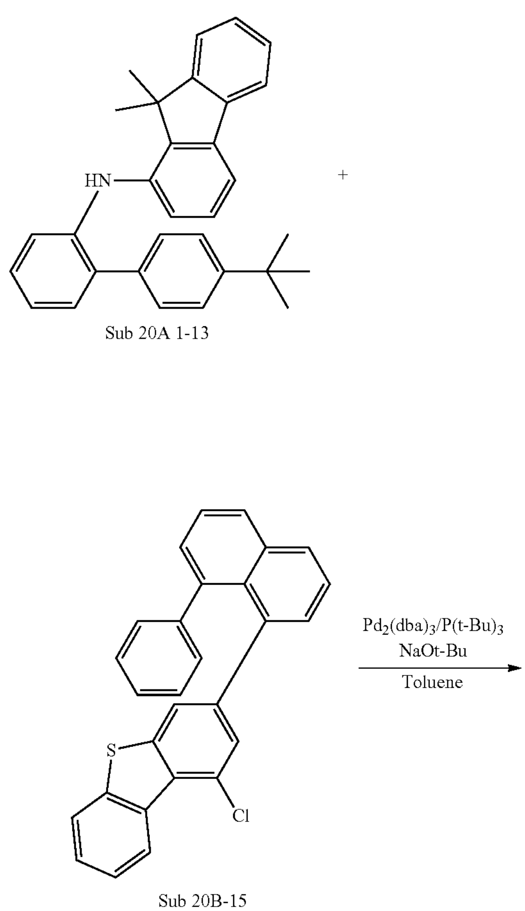

-continued

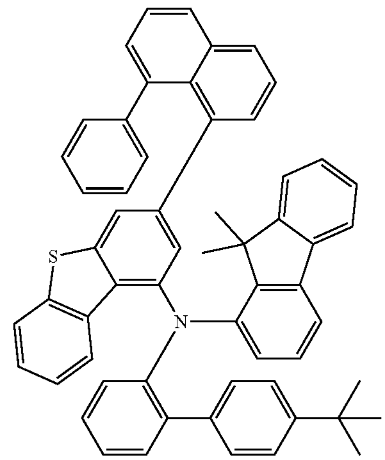

P20-18

After adding Sub 20A 1-13 (20.0 g, 47.9 mmol) and Sub 20B-15 (19.5 g, 47.9 mmol), $Pd_2(dba)_3$ (1.3 g, 1.4 mmol), $P(t\text{-}Bu)_3$ (0.6 g, 2.9 mmol), NaOt-Bu (9.2 g, 95.8 mmol), toluene (239 mL) in a round-bottom flask, the same procedure as in Sub 20A 1-5 was performed to create a product in an amount of 26.3 g. (Yield: 68.4%)

3. Example of Synthesis of P20-33

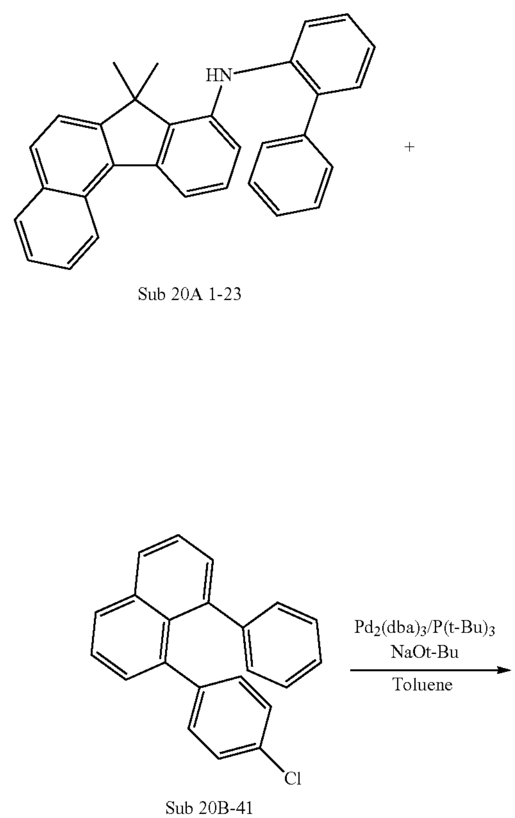

-continued

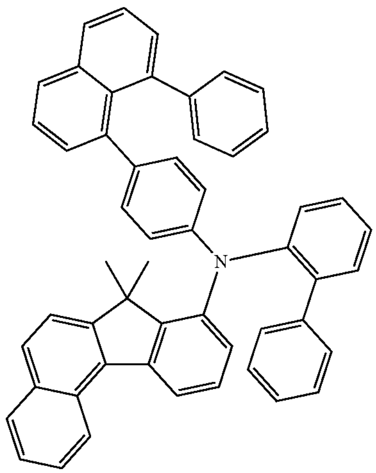

P20-33

After adding Sub 20A 1-23 (20.0 g, 48.6 mmol) and Sub 20B-41 (14.8 g, 48.6 mmol), $Pd_2(dba)_3$ (1.3 g, 1.5 mmol), $P(t-Bu)_3$ (0.6 g, 2.9 mmol), NaOt-Bu (9.3 g, 97.2 mmol), toluene (243 mL) in a round-bottom flask, the same procedure as in Sub 20A 1-5 was performed to create a product in an amount of 24.1 g. (Yield: 71.9%)

4. Example of Synthesis of P21-1

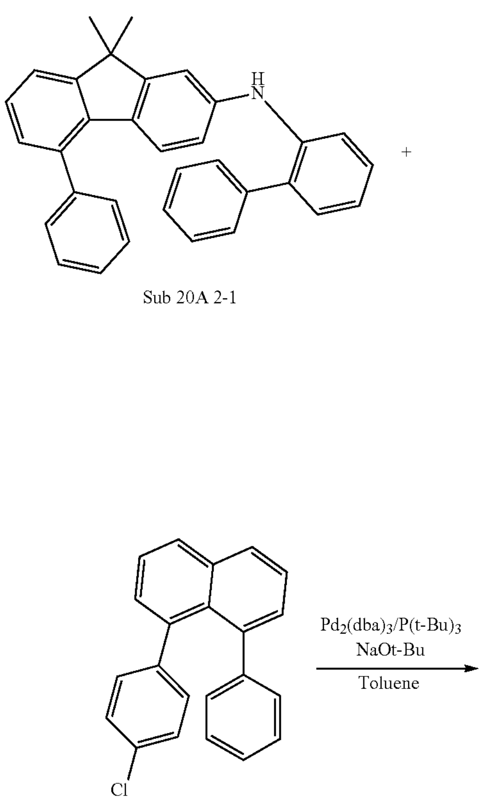

Sub 20A 2-1

Sub 20B-41

-continued

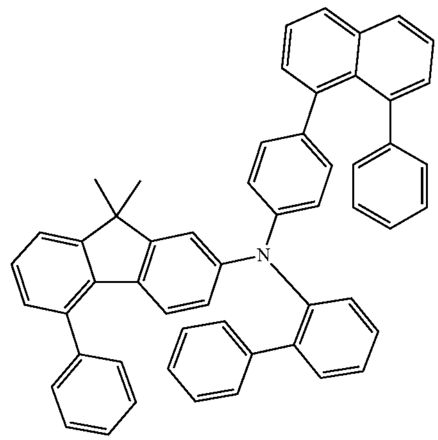

P21-1

After adding Sub 20A 2-1 (20.0 g, 45.7 mmol) and Sub 20B-41 (13.9 g, 45.7 mmol), $Pd_2(dba)_3$ (1.3 g, 1.4 mmol), $P(t-Bu)_3$ (0.6 g, 2.7 mmol), NaOt-Bu (8.8 g, 91.4 mmol), toluene (229 mL) in a round-bottom flask, the same procedure as in Sub 20A 1-5 was performed to create a product in an amount of 23.6 g. (Yield: 72.1%)

5. Example of Synthesis of P21-14

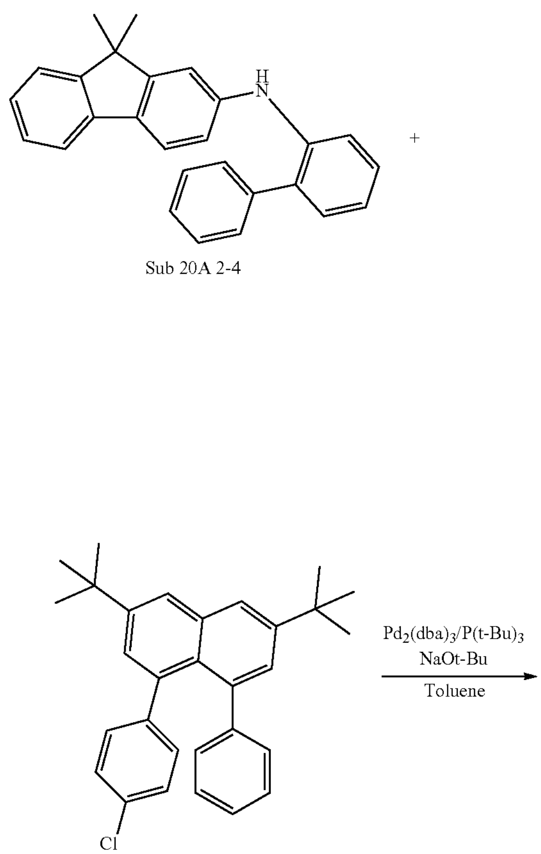

Sub 20A 2-4

Sub 20B-46

-continued

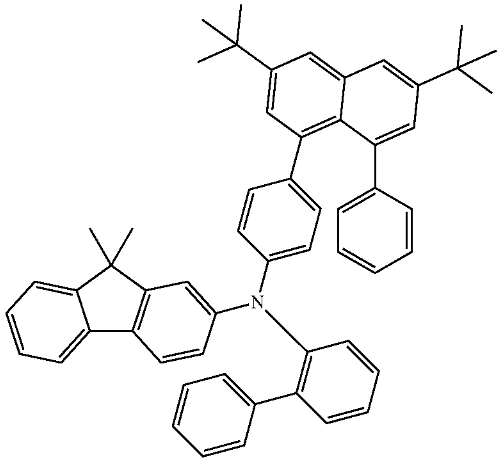

P21-14

After adding Sub 20A 2-4 (20.0 g, 55.3 mmol) and Sub 20B-46 (22.8 g, 55.3 mmol), $Pd_2(dba)_3$ (1.5 g, 1.7 mmol), $P(t\text{-}Bu)_3$ (0.7 g, 3.3 mmol), NaOt-Bu (10.6 g, 110.7 mmol), toluene (277 mL) in a round-bottom flask, the same procedure as in Sub 20A 1-5 was performed to create a product in an amount of 28.8 g. (Yield: 69.3%)

6. Example of Synthesis of P21-18

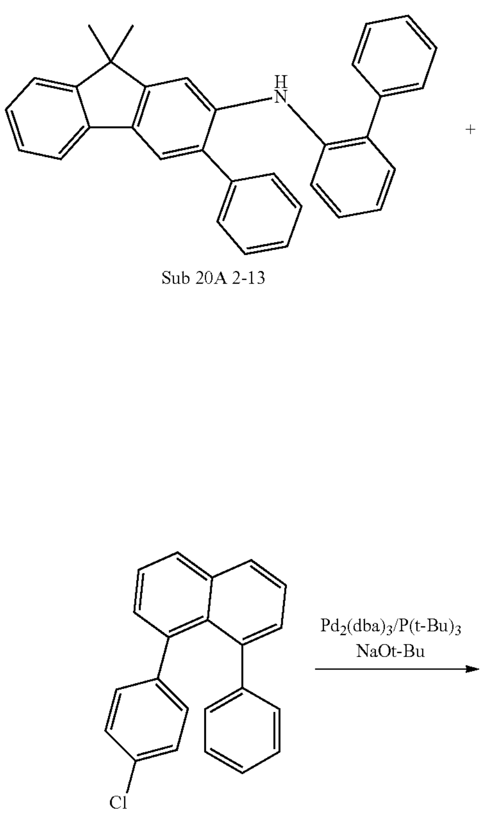

Sub 20A 2-13

Sub 20B-41

-continued

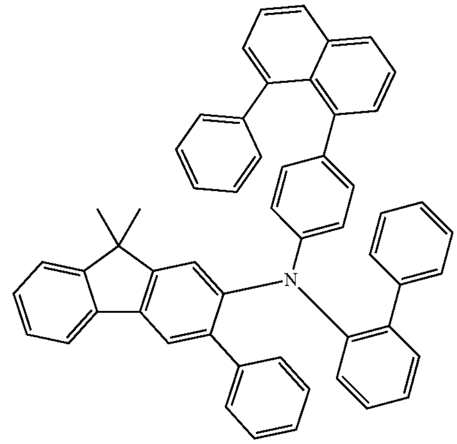

P21-18

After adding Sub 20A 2-13 (20.0 g, 45.7 mmol) and Sub 20B-41 (13.9 g, 45.7 mmol), $Pd_2(dba)_3$ (1.3 g, 1.4 mmol), $P(t\text{-}Bu)_3$ (0.6 g, 2.7 mmol), NaOt-Bu (8.8 g, 91.4 mmol), toluene (229 mL) in a round-bottom flask, the same procedure as in Sub 20A 1-5 was performed to create a product in an amount of 22.4 g. (Yield: 68.6%)

7. Example of Synthesis of P21-19

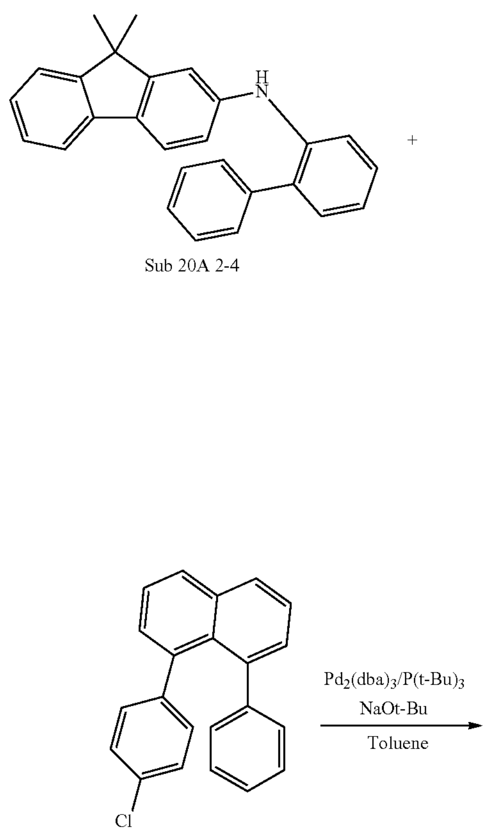

Sub 20A 2-4

Sub 20B-41

-continued

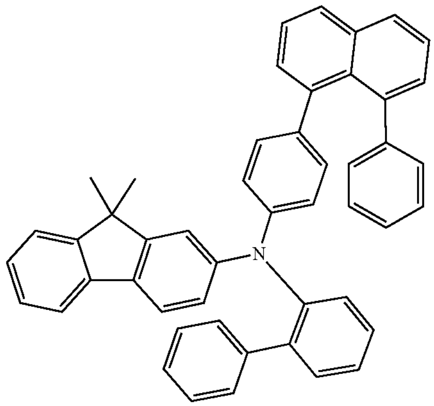

P21-19

After adding Sub 20A 2-4 (20.0 g, 55.3 mmol) and Sub 20B-41 (16.8 g, 55.3 mmol), $Pd_2(dba)_3$ (1.5 g, 1.7 mmol), $P(t\text{-}Bu)_3$ (0.7 g, 3.3 mmol), NaOt-Bu (10.6 g, 110.7 mmol), toluene (277 mL) in a round-bottom flask, the same procedure as in Sub 20A 1-5 was performed to create a product in an amount of 26.6 g. (Yield: 75.1%)

8. Example of Synthesis of P21-21

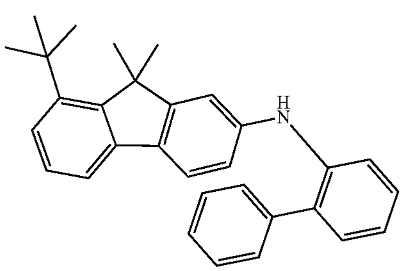

Sub 20A 2-15

+

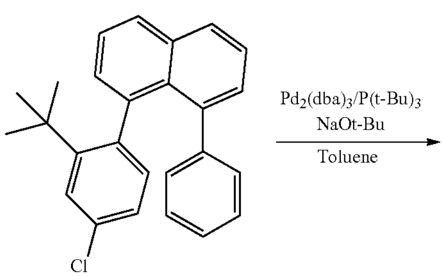

Sub 20B-49

-continued

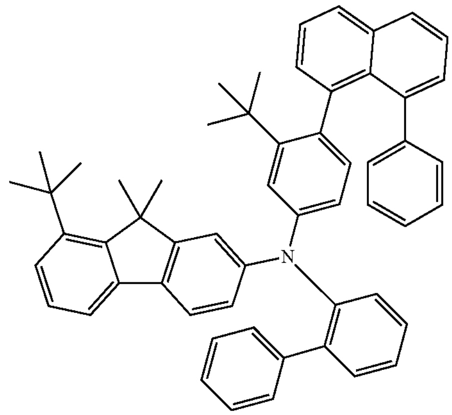

P21-21

After adding Sub 20A 2-15 (20.0 g, 47.9 mmol) and Sub 20B-49 (17.2 g, 47.9 mmol), $Pd_2(dba)_3$ (1.3 g, 1.4 mmol), $P(t\text{-}Bu)_3$ (0.5 g, 2.9 mmol), NaOt-Bu (9.2 g, 95.8 mmol), toluene (239 mL) in a round-bottom flask, the same procedure as in Sub 20A 1-5 was performed to create a product in an amount of 25.4 g. (Yield: 70.4%)

9. Example of Synthesis of P21-52

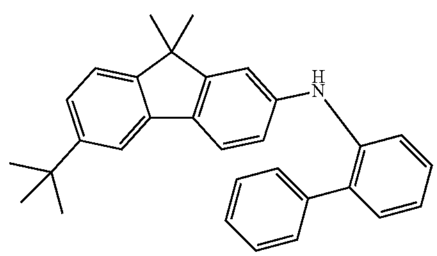

Sub 20A 2-38

+

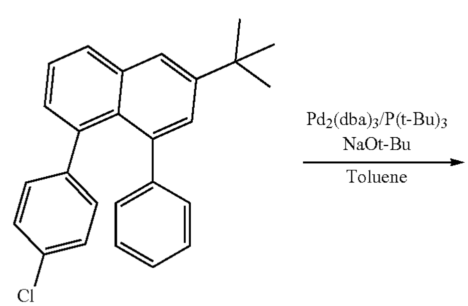

Sub 20B-70

-continued

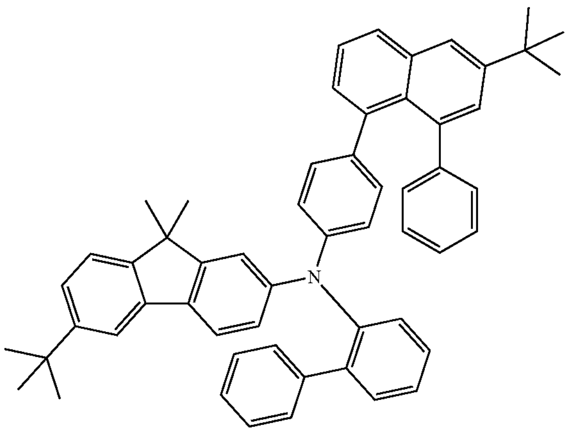

P21-52

After adding Sub 20A 2-38 (20.0 g, 47.9 mmol) and Sub 20B-70 (17.2 g, 47.9 mmol), $Pd_2(dba)_3$ (1.3 g, 1.4 mmol), $P(t\text{-}Bu)_3$ (0.6 g, 2.9 mmol), NaOt-Bu (9.2 g, 95.8 mmol), toluene (239 mL) in a round-bottom flask, the same procedure as in Sub 20A 1-5 was performed to create a product in an amount of 25.5 g. (Yield: 70.7%)

10. Example of Synthesis of P21-54

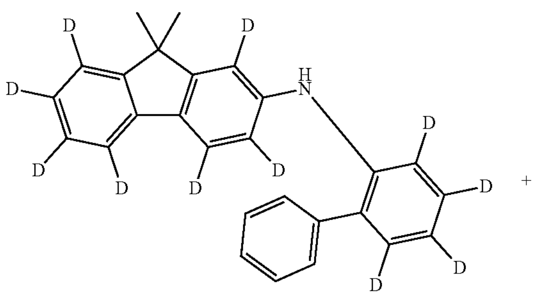

Sub 20A 2-40

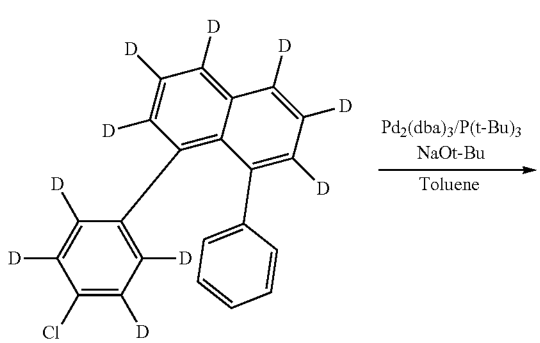

Sub 20B-64

-continued

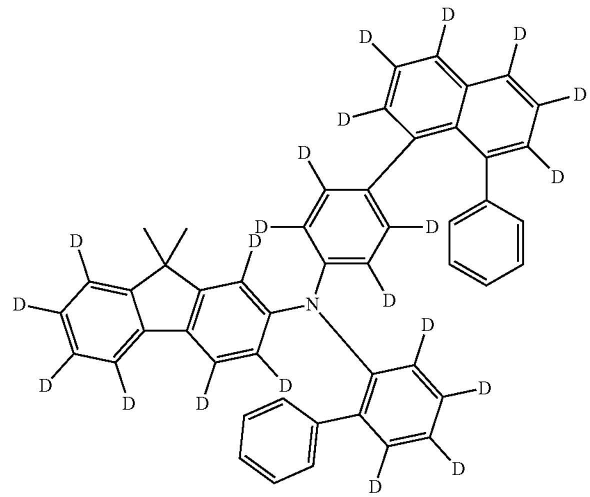

P21-54

After adding Sub 20A 2-40 (20.0 g, 53.7 mmol) and Sub 20B-64 (16.9 g, 53.7 mmol), $Pd_2(dba)_3$ (1.5 g, 1.6 mmol), $P(t\text{-}Bu)_3$ (0.7 g, 3.2 mmol), NaOt-Bu (10.3 g, 107.4 mmol), toluene (268 mL) in a round-bottom flask, the same procedure as in Sub 20A 1-5 was performed to create a product in an amount of 25.2 g. (Yield: 70.9%)

11. Example of Synthesis of P21-65

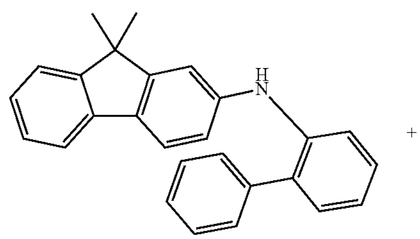

Sub 20A 2-4

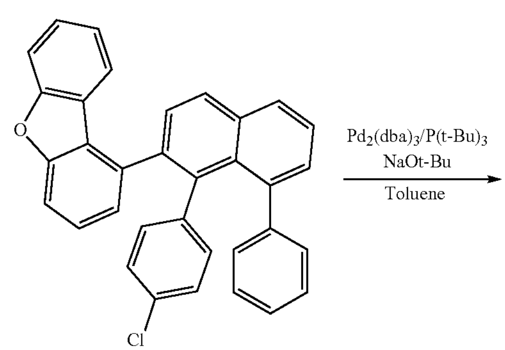

Sub 20-72

-continued

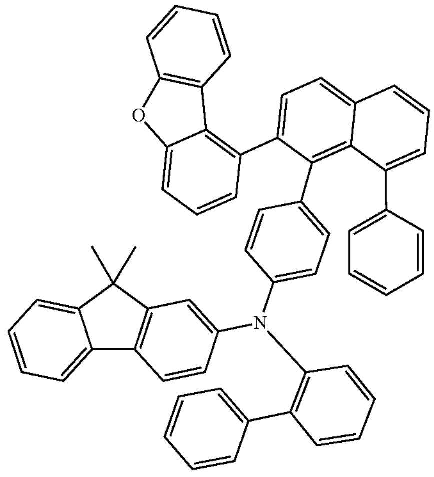

P21-65

-continued

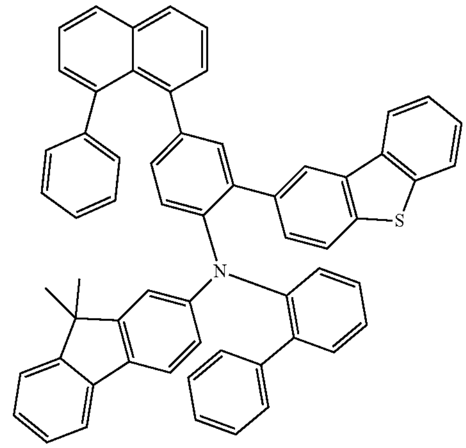

P21-68

After adding Sub 20A 2-4 (20.0 g, 55.3 mmol) and Sub 20B-72 (25.7 g, 55.3 mmol), $Pd_2(dba)_3$ (1.5 g, 1.7 mmol), $P(t\text{-}Bu)_3$ (0.7 g, 3.3 mmol), NaOt-Bu (10.6 g, 110.7 mmol), toluene (277 mL) in a round-bottom flask, the same procedure as in Sub 20A 1-5 was performed to create a product in an amount of 32.0 g. (Yield: 71.7%)

12. Example of Synthesis of P21-68

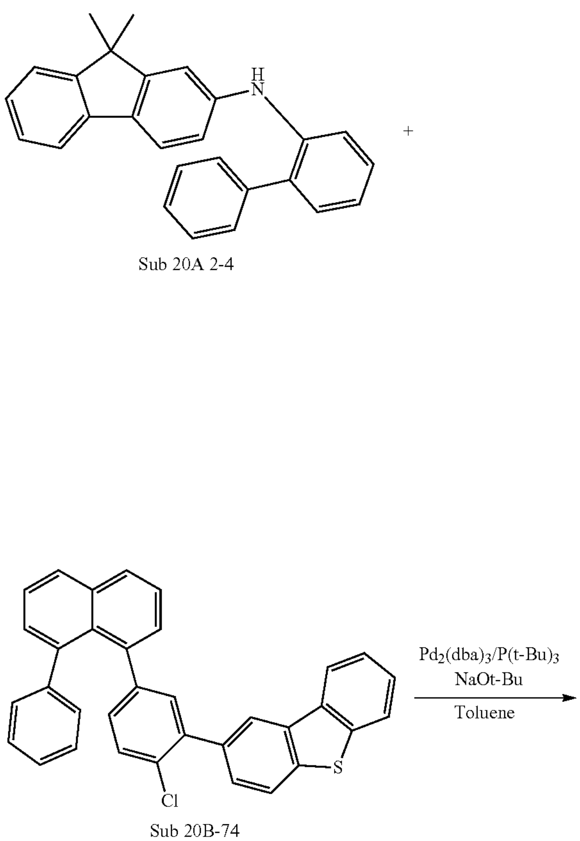

After adding Sub 20A 2-4 (20.0 g, 55.3 mmol) and Sub 20B-74 (26.6 g, 55.3 mmol), $Pd_2(dba)_3$ (1.5 g, 1.7 mmol), $P(t\text{-}Bu)_3$ (0.7 g, 3.3 mmol), NaOt-Bu (10.6 g, 110.7 mmol), toluene (277 mL) in a round-bottom flask, the same procedure as in Sub 20A 1-5 was performed to create a product in an amount of 31.9 g. (Yield: 70.2%)

13. Example of Synthesis of P21-72

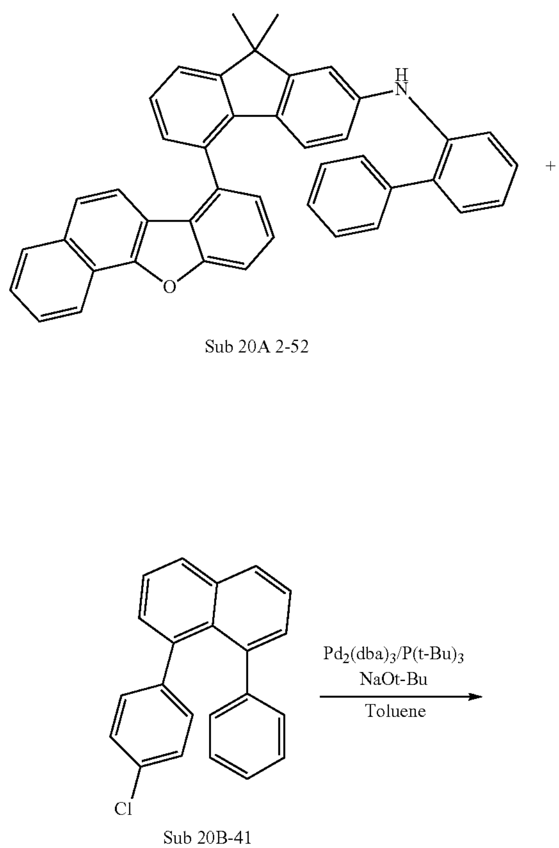

-continued

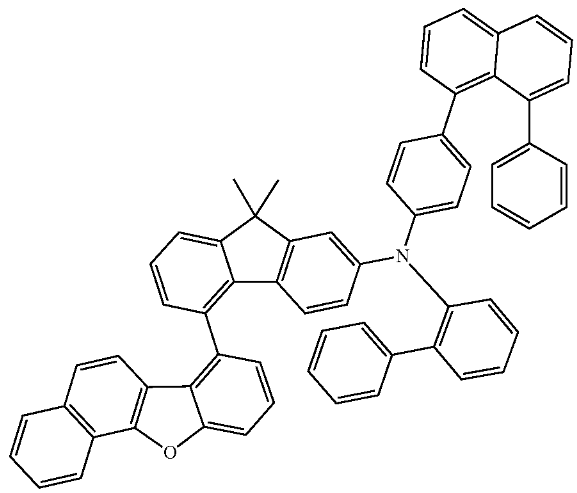

P21-72

After adding Sub 20A 2-52 (20.0 g, 34.6 mmol) and Sub 20B-41 (10.5 g, 34.6 mmol), $Pd_2(dba)_3$ (1.0 g, 1.0 mmol), $P(t\text{-}Bu)_3$ (0.4 g, 2.1 mmol), NaOt-Bu (6.7 g, 69.2 mmol), toluene (173 mL) in a round-bottom flask, the same procedure as in Sub 20A 1-5 was performed to create a product in an amount of 20.8 g. (Yield: 70.1%)

14. Example of Synthesis of P21-73

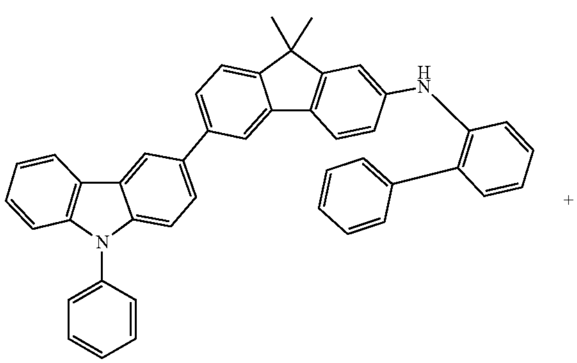

Sub 20A 2-53

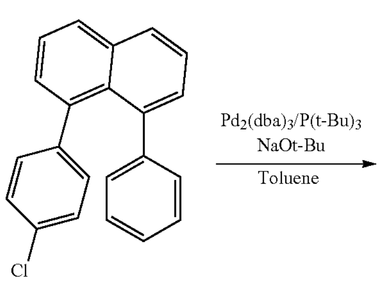

Sub 20B-41

-continued

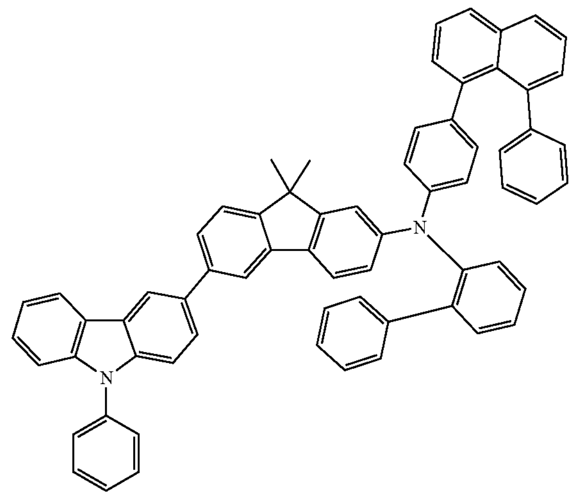

P21-73

After adding Sub 20A 2-53 (20.0 g, 33.2 mmol) and Sub 20B-41 (10.1 g, 33.2 mmol), $Pd_2(dba)_3$ (0.9 g, 1.0 mmol), $P(t\text{-}Bu)_3$ (0.4 g, 2.0 mmol), NaOt-Bu (6.4 g, 66.4 mmol), toluene (166 mL) in a round-bottom flask, the same procedure as in Sub 20A 1-5 was performed to create a product in an amount of 19.7 g. (Yield: 67.5%)

15. Example of Synthesis of P21-89

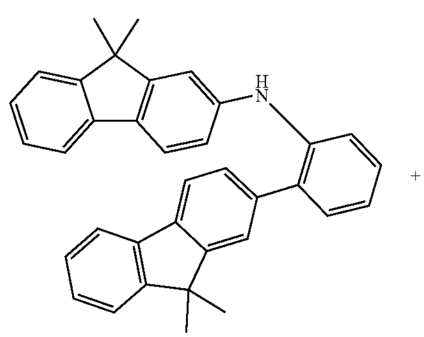

Sub 20A 2-61

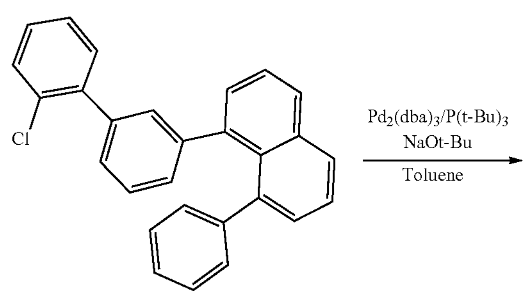

Sub 20B-28

-continued

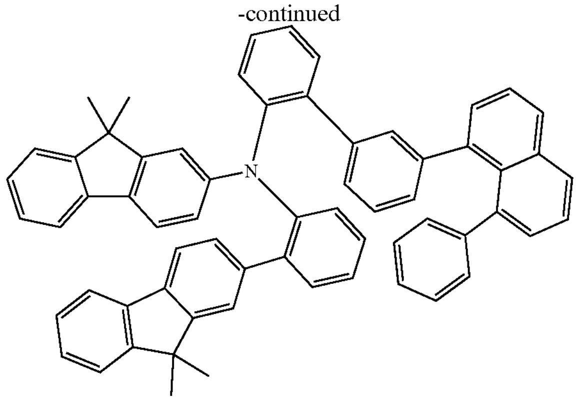

P21-89

After adding Sub 20A 2-61 (20.0 g, 41.9 mmol) and Sub 20B-28 (15.8 g, 41.9 mmol), $Pd_2(dba)_3$ (1.2 g, 1.3 mmol), $P(t\text{-}Bu)_3$ (0.5 g, 2.5 mmol), NaOt-Bu (8.0 g, 83.7 mmol), toluene (209 mL) in a round-bottom flask, the same procedure as in Sub 20A 1-5 was performed to create a product in an amount of 23.9 g. (Yield 68.7%)

16. Example of Synthesis of P22-2

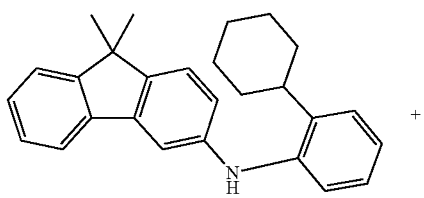

Sub 20A 3-2

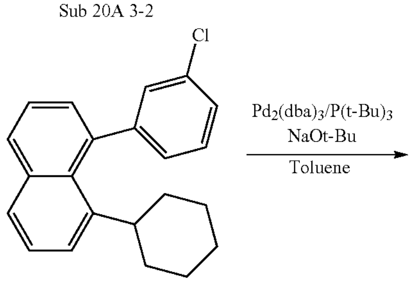

Sub 20B-77

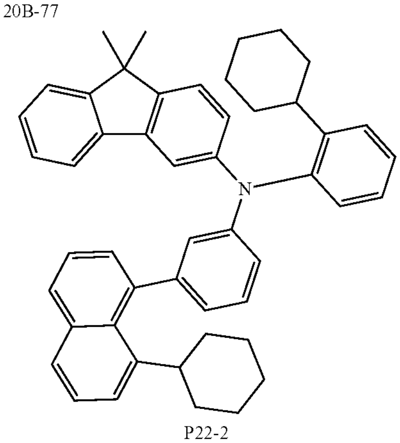

P22-2

After adding Sub 20A 3-2 (20.0 g, 54.4 mmol) and Sub 20B-77 (16.9 g, 54.4 mmol), $Pd_2(dba)_3$ (1.5 g, 1.6 mmol), $P(t\text{-}Bu)_3$ (0.7 g, 3.3 mmol), NaOt-Bu (10.5 g, 108.8 mmol), toluene (272 mL) in a round-bottom flask, the same procedure as in Sub 20A 1-5 was performed to create a product in an amount of 25.6 g. (Yield 72.2%)

17. Example of Synthesis of P22-17

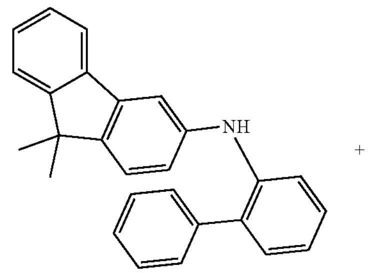

Sub 20A 3-1

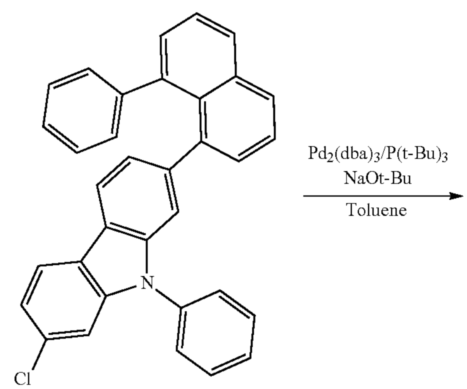

Sub 20B-89

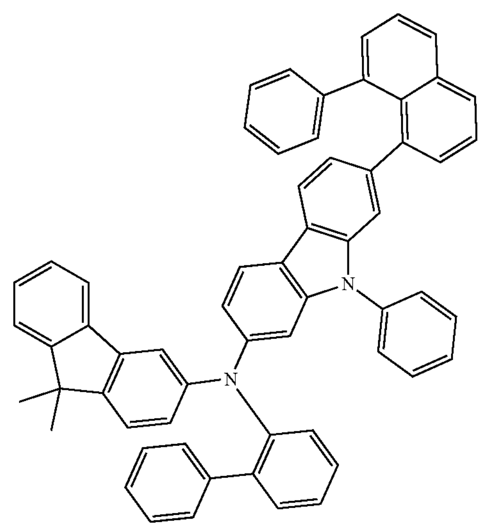

P22-17

After adding Sub 20A 3-1 (20.0 g, 55.3 mmol) and Sub 20B-89 (25.7 g, 55.3 mmol), $Pd_2(dba)_3$ (1.5 g, 1.7 mmol), $P(t\text{-}Bu)_3$ (0.7 g, 3.3 mmol), NaOt-Bu (10.6 g, 110.7 mmol), toluene (277 mL) in a round-bottom flask, the same procedure as in Sub 20A 1-5 was performed to create a product in an amount of 30.1 g. (Yield: 67.6%)

18. Example of Synthesis of P23-2

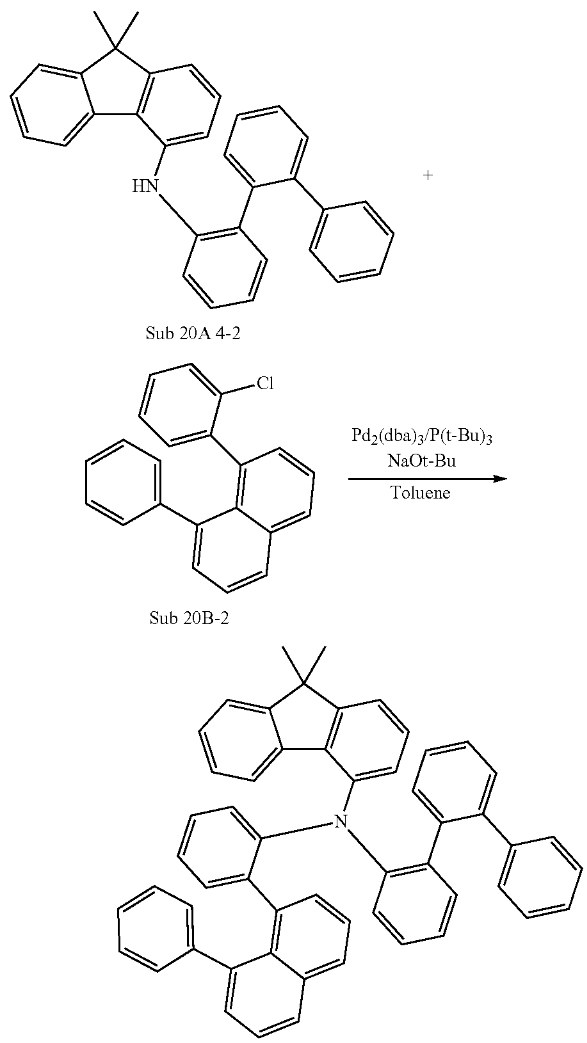

P23-2

After adding Sub 20A 4-2 (20.0 g, 45.7 mmol) and Sub 20B-2 (13.9 g, 45.7 mmol), $Pd_2(dba)_3$ (1.3 g, 1.4 mmol), $P(t-Bu)_3$ (0.6 g, 2.7 mmol), NaOt-Bu (8.8 g, 91.4 mmol), toluene (229 mL) in a round-bottom flask, the same procedure as in Sub 20A 1-5 was performed to create a product in an amount of 23.4 g. (Yield: 71.4%)

19. Example of Synthesis of P23-36

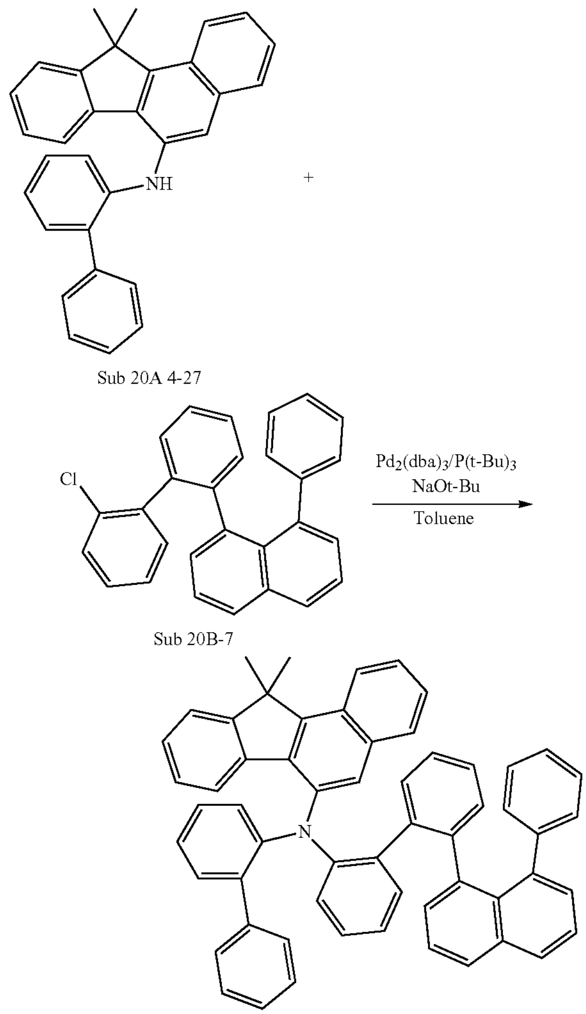

P23-36

After adding Sub 20A 4-27 (20.0 g, 48.6 mmol) and Sub 20B-7 (18.4 g, 48.6 mmol), $Pd_2(dba)_3$ (1.3 g, 1.5 mmol), $P(t-Bu)_3$ (0.6 g, 2.9 mmol), NaOt-Bu (9.3 g, 97.2 mmol), toluene (243 mL) in a round-bottom flask, the same procedure as in Sub 20A 1-5 was performed to create a product in an amount of 24.4 g. (Yield: 65.5%)

In the meantime, FD-MS values of the compounds prepared according to Synthesis Examples of the present disclosure as described above are illustrated in Table 3 below.

TABLE 3

| Compound | FD-MS | Compound | FD-MS |
|---|---|---|---|
| P20-1 | m/z = 639.29 ($C_{49}H_{37}N$ = 639.84) | P20-2 | m/z = 689.31 ($C_{53}H_{39}N$ = 689.9) |
| P20-3 | m/z = 689.31 ($C_{53}H_{39}N$ = 689.9) | P20-4 | m/z = 645.34 ($C_{49}H_{43}N$ = 645.89) |
| P20-5 | m/z = 819.31 ($C_{61}H_{41}NO_2$ = 820) | P20-6 | m/z = 639.29 ($C_{49}H_{37}N$ = 639.84) |
| P20-7 | m/z = 713.4 ($C_{54}H_{51}N$ = 714.01) | P20-8 | m/z = 675.39 ($C_{51}H_{49}N$ = 675.96) |
| P20-9 | m/z = 771.39 ($C_{59}H_{49}N$ = 772.05) | P20-10 | m/z = 804.35 ($C_{61}H_{44}N_2$ = 805.04) |
| P20-11 | m/z = 821.31 ($C_{61}H_{43}NS$ = 822.08) | P20-12 | m/z = 792.35 ($C_{60}H_{44}N_2$ = 793.03) |
| P20-13 | m/z = 791.36 ($C_{61}H_{45}N$ = 792.04) | P20-14 | m/z = 867.39 ($C_{67}H_{49}N$ = 868.14) |
| P20-15 | m/z = 739.32 ($C_{57}H_{41}N$ = 739.96) | P20-16 | m/z = 765.34 ($C_{59}H_{43}N$ = 766) |
| P20-17 | m/z = 729.3 ($C_{55}H_{39}NO$ = 729.92) | P20-18 | m/z = 801.34 ($C_{59}H_{47}NS$ = 802.09) |
| P20-19 | m/z = 715.32 ($C_{55}H_{41}N$ = 715.94) | P20-20 | m/z = 753.43 ($C_{57}H_{55}N$ = 754.07) |

TABLE 3-continued

| Compound | FD-MS | Compound | FD-MS |
|---|---|---|---|
| P20-21 | m/z = 715.32 ($C_{55}H_{41}N$ = 715.94) | P20-22 | m/z = 791.36 ($C_{61}H_{45}N$ = 792.04) |
| P20-23 | m/z = 804.35 ($C_{61}H_{44}N_2$ = 805.04) | P20-24 | m/z = 805.37 ($C_{62}H_{47}N$ = 806.06) |
| P20-25 | m/z = 729.25 ($C_{49}H_{32}F_5N$ = 729.79) | P20-26 | m/z = 805.33 ($C_{61}H_{43}NO$ = 806.02) |
| P20-27 | m/z = 720.36 ($C_{55}H_{36}D_5N$ = 720.97) | P20-28 | m/z = 791.36 ($C_{61}H_{45}N$ = 792.04) |
| P20-29 | m/z = 821.4 ($C_{63}H_{51}N$ = 822.11) | P20-30 | m/z = 956.41 ($C_{73}H_{52}N_2$ = 957.23) |
| P20-31 | m/z = 791.36 ($C_{61}H_{45}N$ = 792.04) | P20-32 | m/z = 831.39 ($C_{64}H_{49}N$ = 832.1) |
| P20-33 | m/z = 689.31 ($C_{53}H_{39}N$ = 689.9) | P20-34 | m/z = 689.31 ($C_{53}H_{39}N$ = 689.9) |
| P20-35 | m/z = 689.31 ($C_{53}H_{39}N$ = 689.9) | P20-36 | m/z = 689.31 ($C_{53}H_{39}N$ = 689.9) |
| P21-1 | m/z = 715.32 ($C_{55}H_{41}N$ = 715.94) | P21-2 | m/z = 715.32 ($C_{55}H_{41}N$ = 715.94) |
| P21-3 | m/z = 715.32 ($C_{55}H_{41}N$ = 715.94) | P21-4 | m/z = 715.32 ($C_{55}H_{41}N$ = 715.94) |
| P21-5 | m/z = 791.36 ($C_{61}H_{45}N$ = 792.04) | P21-6 | m/z = 715.32 ($C_{55}H_{41}N$ = 715.94) |
| P21-7 | m/z = 715.32 ($C_{55}H_{41}N$ = 715.94) | P21-8 | m/z = 715.32 ($C_{55}H_{41}N$ = 715.94) |
| P21-9 | m/z = 653.31 ($C_{50}H_{39}N$ = 653.87) | P21-10 | m/z = 791.36 ($C_{61}H_{45}N$ = 792.04) |
| P21-11 | m/z = 791.36 ($C_{61}H_{45}N$ = 792.04) | P21-12 | m/z = 867.39 ($C_{67}H_{49}N$ = 868.14) |
| P21-13 | m/z = 695.36 ($C_{53}H_{45}N$ = 695.95) | P21-14 | m/z = 751.42 ($C_{57}H_{53}N$ = 752.06) |
| P21-15 | m/z = 721.37 ($C_{55}H_{47}N$ = 721.99) | P21-16 | m/z = 879.48 ($C_{e7}H_{G1}N$ = 880.23) |
| P21-17 | m/z = 721.37 ($C_{55}H_{47}N$ = 721.99) | P21-18 | m/z = 715.32 ($C_{55}H_{41}N$ = 715.94) |
| P21-19 | m/z = 639.29 ($C_{49}H_{37}N$ = 639.84) | P21-20 | m/z = 943.42 ($C_{73}H_{53}N$ = 944.23) |
| P21-21 | m/z = 751.42 ($C_{57}H_{53}N$ = 752.06) | P21-22 | m/z = 721.37 ($C_{55}H_{47}N$ = 721.99) |
| P21-23 | m/z = 733.37 ($C_{56}H_{47}N$ = 734) | P21-24 | m/z = 733.37 ($C_{56}H_{47}N$ = 734) |
| P21-25 | m/z = 667.32 ($C_{51}H_{41}N$ = 667.9) | P21-26 | m/z = 667.32 ($C_{51}H_{41}N$ = 667.9) |
| P21-27 | m/z = 681.34 ($C_{52}H_{43}N$ = 681.92) | P21-28 | m/z = 723.39 ($C_{55}H_{49}N$ = 724) |
| P21-29 | m/z = 707.36 ($C_{54}H_{45}N$ = 707.96) | P21-30 | m/z = 707.36 ($C_{54}H_{45}N$ = 707.96) |
| P21-31 | m/z = 707.36 ($C_{54}H_{45}N$ = 707.96) | P21-32 | m/z = 775.42 ($C_{59}H_{53}N$ = 776.08) |
| P21-33 | m/z = 773.4 ($C_{59}H_{51}N$ = 774.06) | P21-34 | m/z = 773.4 ($C_{59}H_{51}N$ = 774.06) |
| P21-35 | m/z = 719.35 ($C_{55}H_{37}D_4N$ = 719.96) | P21-36 | m/z = 795.38 ($C_{61}H_{41}D_4N$ = 796.06) |
| P21-37 | m/z = 867.39 ($C_{67}H_{49}N$ = 868.14) | P21-38 | m/z = 796.39 ($C_{61}H_{40}D_5N$ = 797.07) |
| P21-39 | m/z = 765.34 ($C_{59}H_{43}N$ = 766) | P21-40 | m/z = 765.34 ($C_{59}H_{43}N$ = 766) |
| P21-41 | m/z = 765.34 ($C_{59}H_{43}N$ = 766) | P21-42 | m/z = 917.4 ($C_{71}H_{51}N$ = 918.2) |
| P21-43 | m/z = 841.37 ($C_{65}H_{47}N$ = 842.1) | P21-44 | m/z = 765.34 ($C_{59}H_{43}N$ = 766) |
| P21-45 | m/z = 791.36 ($C_{61}H_{45}N$ = 792.04) | P21-46 | m/z = 791.36 ($C_{61}H_{45}N$ = 792.04) |
| P21-47 | m/z = 891.39 ($C_{69}H_{49}N$ = 892.16) | P21-48 | m/z = 791.36 ($C_{61}H_{45}N$ = 792.04) |
| P21-49 | m/z = 751.42 ($C_{57}H_5N$ = 752.06) | P21-50 | m/z = 715.32 ($C_{55}H_{41}N$ = 715.94) |
| P21-51 | m/z = 791.36 ($C_{61}H_{45}N$ = 792.04) | P21-52 | m/z = 751.42 ($C_{57}H_5N$ = 752.06) |
| P21-53 | m/z = 740.41 ($C_{56}H_{40}D_7N$ = 741.04) | P21-54 | m/z = 660.42 ($C_{49}H_{18}D_{21}N$ = 660.97) |
| P21-55 | m/z = 802.43 ($C_{61}H_{46}D_5N$ = 803.12) | P21-56 | m/z = 796.39 ($C_{61}H_{40}D_5N$ = 797.07) |
| P21-57 | m/z = 719.35 ($C_{55}H_{37}D_4N$ = 719.96) | P21-58 | m/z = 796.39 ($C_{61}H_{40}D_5N$ = 797.07) |
| P21-59 | m/z = 723.39 ($C_{55}H_{49}N$ = 724) | P21-60 | m/z = 798.4 ($C_{61}H_{38}D_7N$ = 799.08) |
| P21-61 | m/z = 673.36 ($C_{51}H_{35}D_{(}N$ = 673.93) | P21-62 | m/z = 821.37 ($C_{62}H_{47}NO$ = 822.06) |
| P21-63 | m/z = 797.4 ($C_{61}H_{51}N$ = 798.09) | P21-64 | m/z = 746.37 ($C_{56}H_{46}N_2$ = 747) |
| P21-65 | m/z = 805.33 ($C_{61}H_{43}NO$ = 806.02) | P21-66 | m/z = 908.41 ($C_{67}H_{36}D_{11}NS$ = 909.25) |
| P21-67 | m/z = 804.35 ($C_{61}H_{44}N_2$ = 805.04) | P21-68 | m/z = 821.31 ($C_{61}H_{43}NS$ = 822.08) |
| P21-69 | m/z = 831.39 ($C_{64}H_{49}N$ = 832.1) | P21-70 | m/z = 815.36 ($C_{63}H_{45}N$ = 816.06) |
| P21-71 | m/z = 880.38 ($C_{67}H_{48}N_2$ = 881.13) | P21-72 | m/z = 855.35 ($C_{65}H_{45}NO$ = 856.08) |
| P21-73 | m/z = 880.38 ($C_{67}H_{48}N_2$ = 881.13) | P21-74 | m/z = 716.32 ($C_{54}H_{40}N_2$ = 716.93) |
| P21-75 | m/z = 880.38 ($C_{67}H_{48}N_2$ = 881.13) | P21-76 | m/z = 756.31 ($C_{56}H_{40}N_2O$ = 756.95) |
| P21-77 | m/z = 639.29 ($C_{49}H_{37}N$ = 639.84) | P21-78 | m/z = 639.29 ($C_{49}H_{37}N$ = 639.84) |
| P21-79 | m/z = 715.32 ($C_{55}H_{41}N$ = 715.94) | P21-80 | m/z = 715.32 ($C_{55}H_{41}N$ = 715.94) |
| P21-81 | m/z = 689.31 ($C_{53}H_{39}N$ = 689.9) | P21-82 | m/z = 715.32 ($C_{55}H_{41}N$ = 715.94) |
| P21-83 | m/z = 715.32 ($C_{55}H_{41}N$ = 715.94) | P21-84 | m/z = 689.31 ($C_{53}H_{39}N$ = 689.9) |
| P21-85 | m/z = 675.39 ($C_{51}H_{49}N$ = 675.96) | P21-86 | m/z = 819.31 ($C_{61}H_{41}NO_2$ = 820) |
| P21-87 | m/z = 804.35 ($C_{84}H_{44}N_2$ = 805.04) | P21-88 | m/z = 804.35 ($C_{84}H_{44}N_2$ = 805.04) |
| P21-89 | m/z = 831.39 ($C_{64}H_{49}N$ = 832.1) | P21-90 | m/z = 871.33 ($C_{65}H_{45}NS$ = 872.14) |
| P21-91 | m/z = 1049.41 ($C_{79}H_{55}NS$ = 1050.38) | P21-92 | m/z = 971.38 ($C_{73}H_{49}NO_2$ = 972.2) |
| P21-93 | m/z = 728.32 ($C_{55}H_{40}N_2$ = 728.94) | P21-94 | m/z = 657.28 ($C_{49}H_{36F}N$ = 657.83) |
| P21-95 | m/z = 689.31 ($C_{53}H_{39}N$ = 689.9) | P21-96 | m/z = 689.31 ($C_{53}H_{39}N$ = 689.9) |
| P21-97 | m/z = 689.31 ($C_{53}H_{39}N$ = 689.9) | P21-98 | m/z = 689.31 ($C_{53}H_{39}N$ = 689.9) |
| P21-99 | m/z = 689.31 ($C_{53}H_{39}N$ = 689.9) | P21-100 | m/z = 689.31 ($C_{53}H_{39}N$ = 689.9) |
| P22-1 | m/z = 689.31 ($C_{53}H_{39}N$ = 689.9) | P22-2 | m/z = 651.39 ($C_{49}H_4N$ = 651.94) |
| P22-3 | m/z = 653.31 ($C_{50}H_{39}N$ = 653.87) | P22-4 | m/z = 791.36 ($C_{61}H_{45}N$ = 792.04) |
| P22-5 | m/z = 763.33 ($C_{56}H_{45}NS$ = 764.04) | P22-6 | m/z = 845.37 ($C_{64}H_{47}NO$ = 846.09) |
| P22-7 | m/z = 635.3 ($C_{46}H_{41}NSi$ = 635.93) | P22-8 | m/z = 801.34 ($C_{59}H_{47}NS$ = 802.09) |
| P22-9 | m/z = 805.33 ($C_{61}H_{43}NO$ = 806.02) | P22-10 | m/z = 778.33 ($C_{59}H_{42}N_2$ = 779) |
| P22-11 | m/z = 789.34 ($C_{61}H_{43}N$ = 790.02) | P22-12 | m/z = 943.42 ($C_{73}H_{53}N$ = 944.23) |
| P22-13 | m/z = 842.37 ($C_{64}H_{46}N_2$ = 843.09) | P22-14 | m/z = 791.36 ($C_{61}H_{45}N$ = 792.04) |
| P22-15 | m/z = 715.32 ($C_{55}H_{41}N$ = 715.94) | P22-16 | m/z = 765.34 ($C_{59}H_{43}N$ = 766) |
| P22-17 | m/z = 804.35 ($C_{61}H_{44}N_2$ = 805.04) | P22-18 | m/z = 841.37 ($C_{65}H_{47}N$ = 842.1) |
| P22-19 | m/z = 783.48 ($C_{59}H_{61}N$ = 784.14) | P22-20 | m/z = 821.31 ($C_{61}H_{43}NS$ = 822.08) |
| P22-21 | m/z = 697.37 ($C_{53}H_{47}N$ = 697.97) | P22-22 | m/z = 867.39 ($C_{67}H_{49}N$ = 868.14) |
| P22-23 | m/z = 655.42 ($C_{49}H_{53}N$ = 655.97) | P22-24 | m/z = 867.39 ($C_{67}H_{49}N$ = 868.14) |
| P22-25 | m/z = 791.36 ($C_{61}H_{45}N$ = 792.04) | P22-26 | m/z = 907.42 ($C_{70}H_{53}N$ = 908.2) |
| P22-27 | m/z = 715.32 ($C_{55}H_{41}N$ = 715.94) | P22-28 | m/z = 879.39 ($C_{63}H_{49}N$ = 880.15) |
| P22-29 | m/z = 891.39 ($C_{69}H_{49}N$ = 892.16) | P22-30 | m/z = 835.29 ($C_{61}H_{41}NOS$ = 836.06) |
| P22-31 | m/z = 670.49 ($C_{49}H_6D_{31}N$ = 671.03) | P22-32 | m/z = 821.37 ($C_{62}H_{47}NO$ = 822.06) |
| P22-33 | m/z = 739.32 ($C_{57}H_{41}N$ = 739.96) | P22-34 | m/z = 689.31 ($C_{53}H_{39}N$ = 689.9) |
| P22-35 | m/z = 739.32 ($C_{57}H_{41}N$ = 739.96) | P22-36 | m/z = 739.32 ($C_{57}H_{41}N$ = 739.96) |
| P23-1 | m/z = 639.29 ($C_{49}H_{37}N$ = 639.84) | P23-2 | m/z = 715.32 ($C_{55}H_{41}N$ = 715.94) |
| P23-3 | m/z = 715.32 ($C_{55}H_{41}N$ = 715.94) | P23-4 | m/z = 791.36 ($C_{61}H_{45}N$ = 792.04) |

TABLE 3-continued

| Compound | FD-MS | Compound | FD-MS |
|---|---|---|---|
| P23-5 | m/z = 897.34 ($C_{67}H_{47}NS$ = 898.18) | P23-6 | m/z = 715.32 ($C_{55}H_{41}N$ = 715.94) |
| P23-7 | m/z = 599.36 ($C_{45}H_{45}N$ = 599.86) | P23-8 | m/z = 715.32 ($C_{55}H_{41}N$ = 715.94) |
| P23-9 | m/z = 739.32 ($C_{57}H_{41}N$ = 739.96) | P23-10 | m/z = 729.3 ($C_{55}H_{39}NO$ = 729.92) |
| P23-11 | m/z = 921.34 ($C_{69}H_{47}NS$ = 922.2) | P23-12 | m/z = 805.37 ($C_{62}H_{47}N$ = 806.06) |
| P23-13 | m/z = 751.42 ($C_{57}H_{53}N$ = 752.06) | P23-14 | m/z = 805.37 ($C_{62}H_{47}N$ = 806.06) |
| P23-15 | m/z = 717.3 ($C_{54}H_{39}NO$ = 717.91) | P23-16 | m/z = 745.33 ($C_{56}H_{43}NO$ = 745.97) |
| P23-17 | m/z = 791.36 ($C_{61}H_{45}N$ = 792.04) | P23-18 | m/z = 805.33 ($C_{61}H_{43}NO$ = 806.02) |
| P23-19 | m/z = 804.35 ($C_{61}H_{44}N_2$ = 805.04) | P23-20 | m/z = 755.36 ($C_{58}H_{45}N$ = 756) |
| P23-21 | m/z = 807.48 ($C_{61}H_{61}N$ = 808.17) | P23-22 | m/z = 753.43 ($C_{57}H_{55}N$ = 754.07) |
| P23-23 | m/z = 755.36 ($C_{58}H_{45}N$ = 756) | P23-24 | m/z = 729.3 ($C_{55}H_{39}NO$ = 729.92) |
| P23-25 | m/z = 668.47 ($C_{49}H_8D_{29}N$ = 669.02) | P23-26 | m/z = 665.31 ($C_{51}H_{39}N$ = 665.88) |
| P23-27 | m/z = 786.32 ($C_{57}H_{42}N_2O_2$ = 786.98) | P23-28 | m/z = 941.4 ($C_{73}H_{51}N$ = 942.22) |
| P23-29 | m/z = 765.34 ($C_{59}H_{43}N$ = 766) | P23-30 | m/z = 848.41 ($C_{64}H_{52}N_2$ = 849.13) |
| P23-31 | m/z = 719.28 ($C_{53}H_{37}NO_2$ = 719.88) | P23-32 | m/z = 839.34 ($C_{61}H_{46}FNSi$ = 840.13) |
| P23-33 | m/z = 739.32 ($C_{57}H_{41}N$ = 739.96) | P23-34 | m/z = 739.32 ($C_{57}H_{41}N$ = 739.96) |
| P23-35 | m/z = 889.37 ($C_{69}H_{47}N$ = 890.14) | P23-36 | m/z = 765.34 ($C_{59}H_{43}N$ = 766) |

Synthesis Example 2

The final product represented by Formula 1 according to the present disclosure may be synthesized by, but is not limited to, the following Reaction Formula 4.

Hal is I, Br, or Cl.

[Reaction Formula 4]

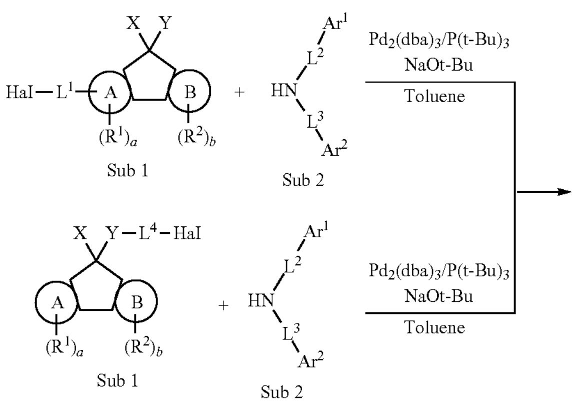

-continued

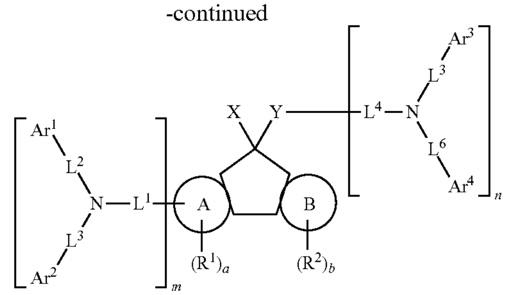

Final Product

I. Synthesis of Sub 1 of Reaction Formula 4

Sub 1 of Reaction Formula 4 is synthesized through, but not limited to, a reaction path of the following Reaction Formula 5.

$Hal^1$ is I, Br, Cl, or —$B(OH)_2$, and Hal is I, Br, or Cl.

p and q are 0 or 1, respectively.

When p and q are 0, $Hal^1$ is I, Br, or Cl, and a separate reaction is not necessary.

When p and q are 1, $Hal^1$ is —$B(OH)_2$.

[Reaction Formula 5]

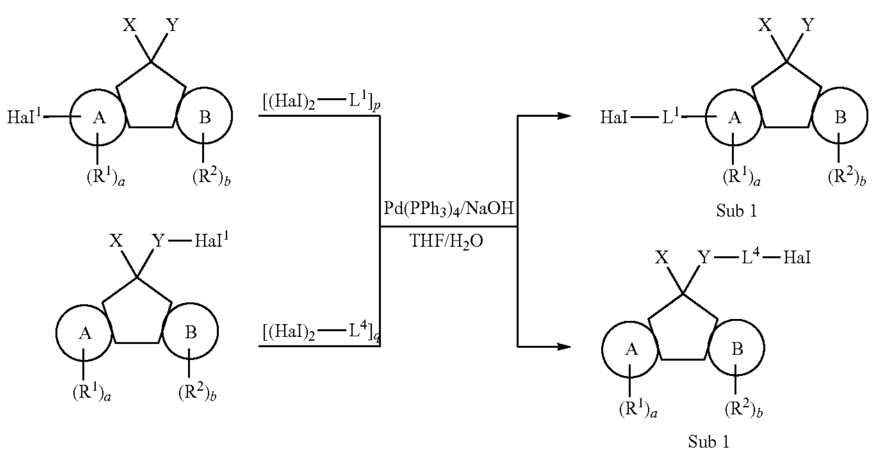

-continued

1. Example of Synthesis of Sub 1-6

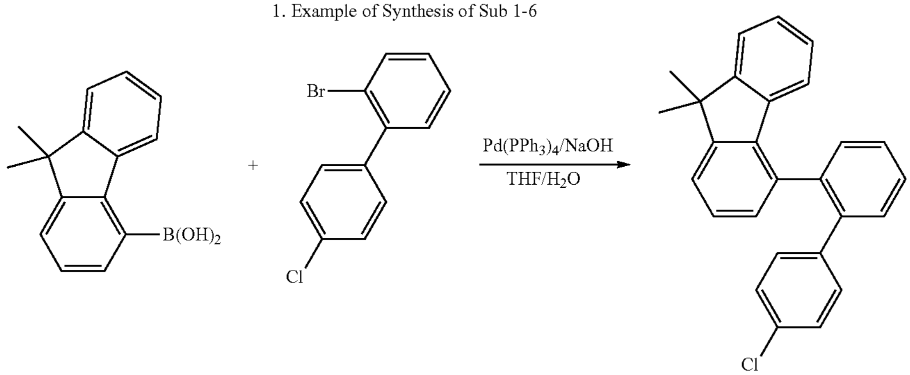

Sub 1-6

After adding (9,9-dimethyl-9H-fluoren-4-yl)boronic acid (50.0 g, 210.0 mmol; 50 g, 125.8 mmol) to a round bottom flask, 2-bromo-4'-chloro-1,1'-biphenyl (56.2 g, 210.0 mmol), $Pd(PPh_3)_4$ (14.6 g, 12.6 mmol), NaOH (25.2 g, 630.0 mmol), and water (525 ml) were added, followed by stirring and refluxing. When the reaction was completed, extraction was performed with $CH_2Cl_2$ and water, and then an organic layer was dried with $MgSO_4$ and concentrated. The resultant organic matter was subjected to silica gel column chromatography and recrystallization to create a product in an amount of 65.0 g (yield: 81.3%).

The compounds belonging to Sub 1 of Reaction Formula 4 may be, but are not limited to, the following compounds, and Table 4 illustrates field desorption-mass spectrometry (FD-MS) values of the compounds belonging to Sub 1.

Sub 1-1

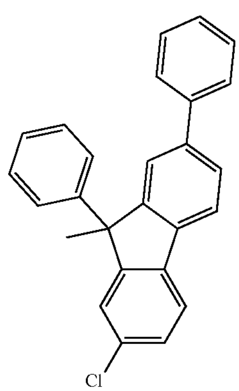

Sub 1-2

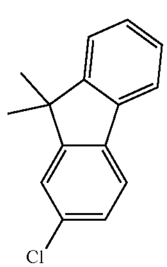

-continued

Sub 1-3

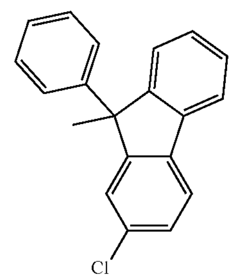

Sub 1-4

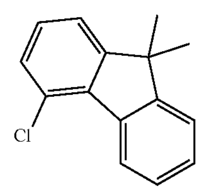

Sub 1-5

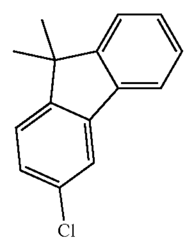

Sub 1-6

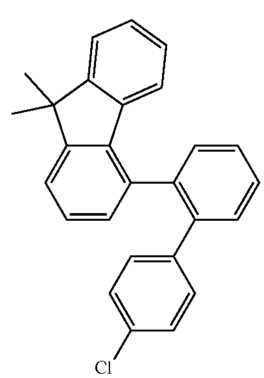

-continued
Sub 1-7
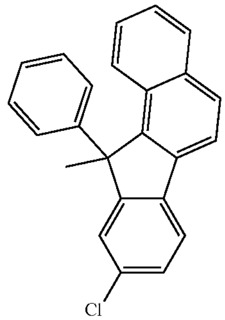
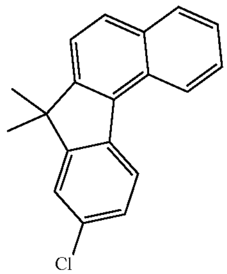
Sub 1-7
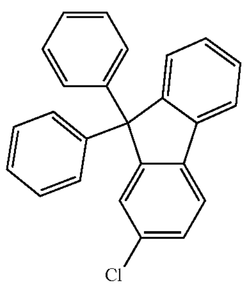
Sub 1-10
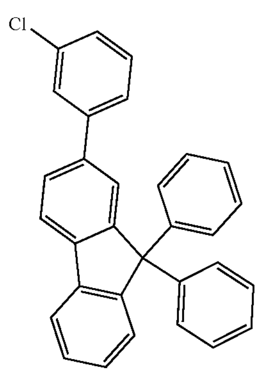
Sub 1-11
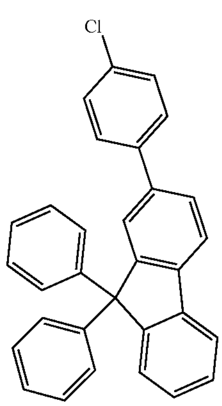
-continued
Sub 1-12
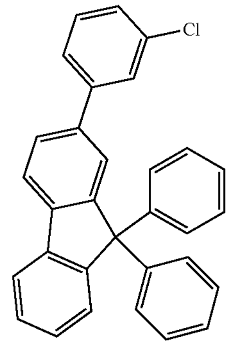
Sub 1-13
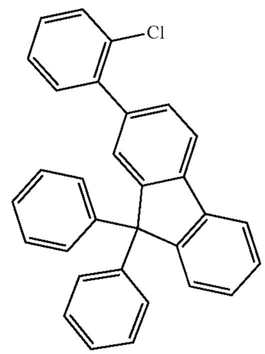
Sub 1-14
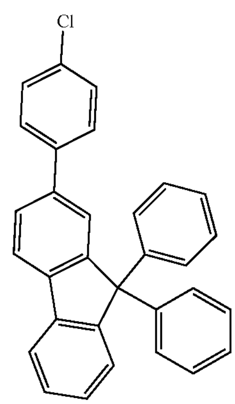
Sub 1-15
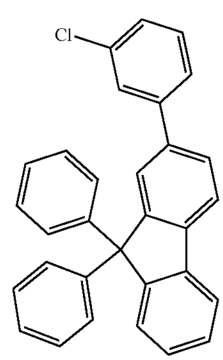

-continued
Sub 1-16
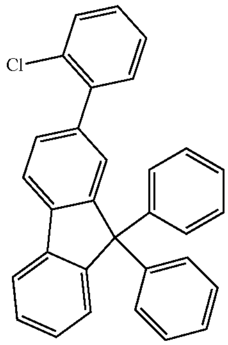
Sub 1-17
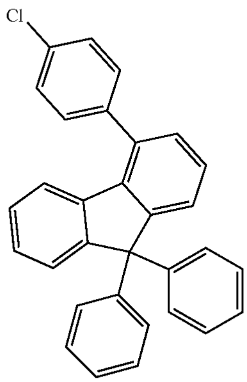
Sub 1-18
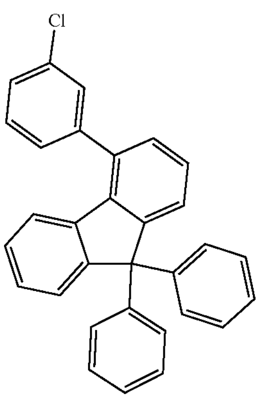
Sub 1-19
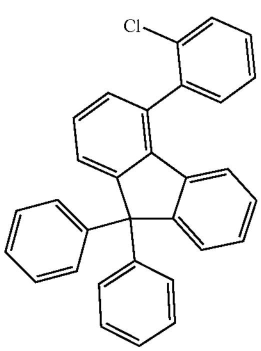
-continued
Sub 1-20
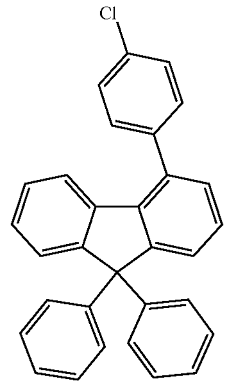
Sub 1-21
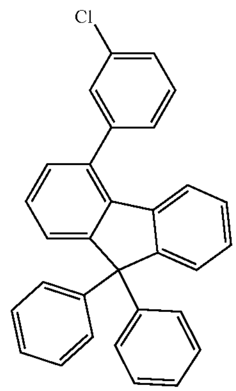
Sub 1-22
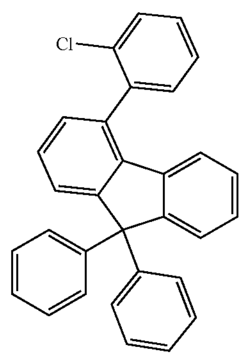
Sub 1-23
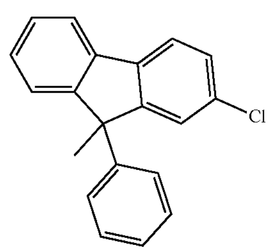

-continued
Sub 1-24
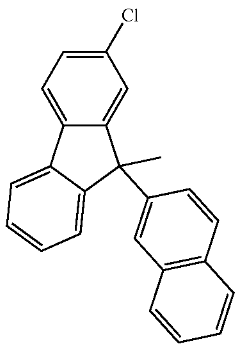
Sub 1-25
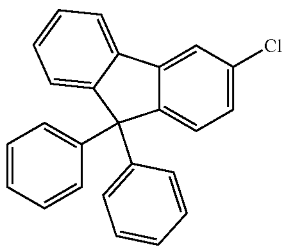
Sub 1-26
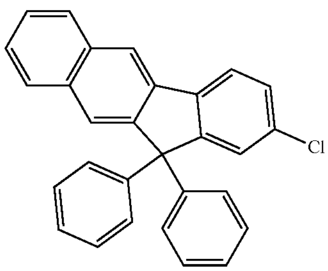
Sub 1-27
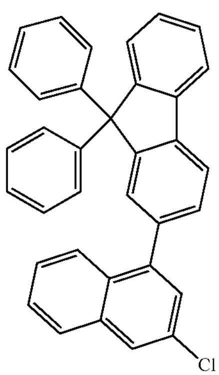
Sub 1-28
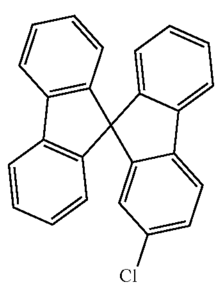
-continued
Sub 1-29
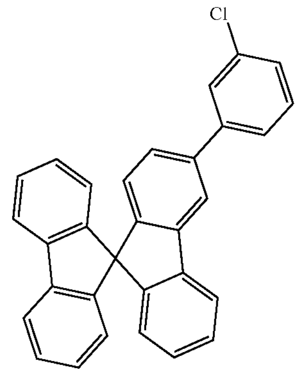
Sub 1-30
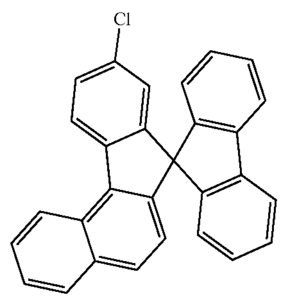
Sub 1-31
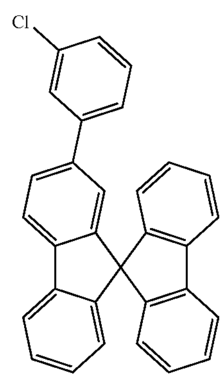
Sub 1-32
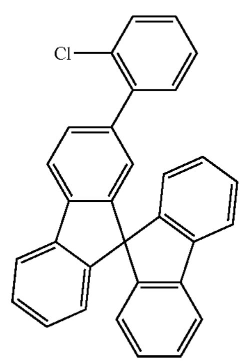

-continued
Sub 1-33
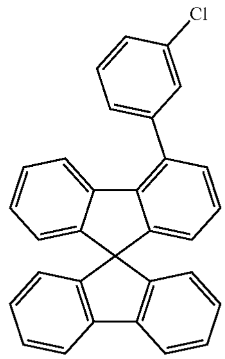
Sub 1-34
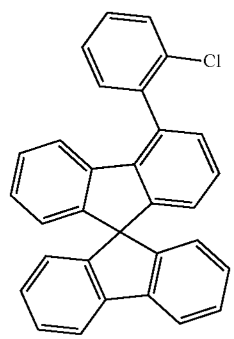
Sub 1-35
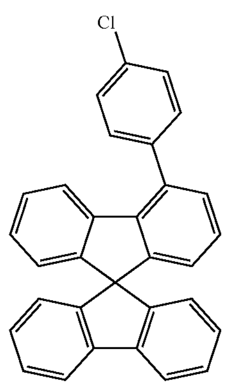
Sub 1-36
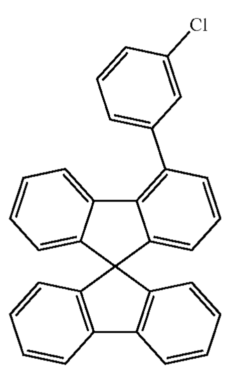
-continued
Sub 1-37
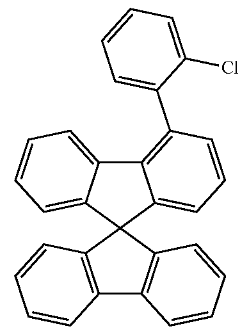
Sub 1-38
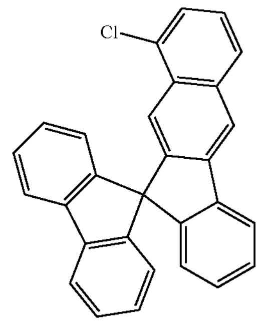
Sub 1-39
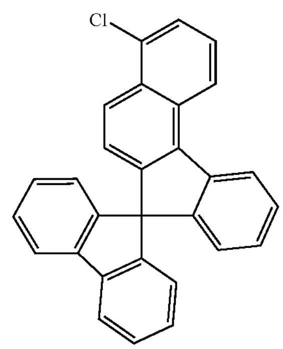
Sub 1-40
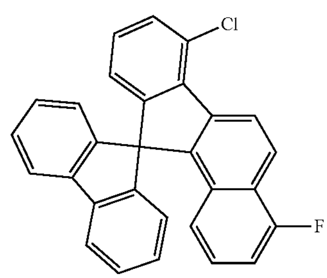
Sub 1-41
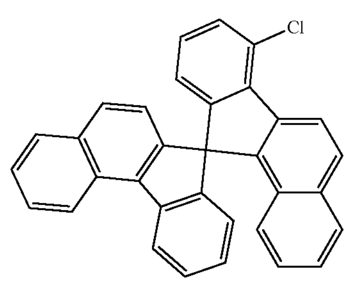

Sub 1-42
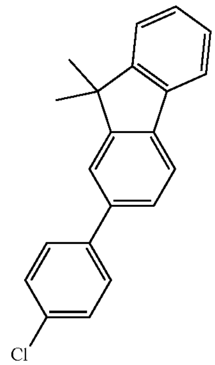
Sub 1-43
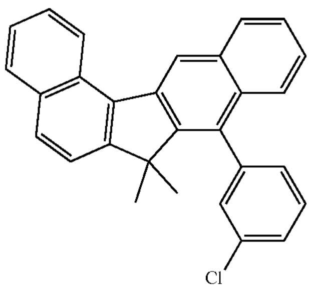
Sub 1-44
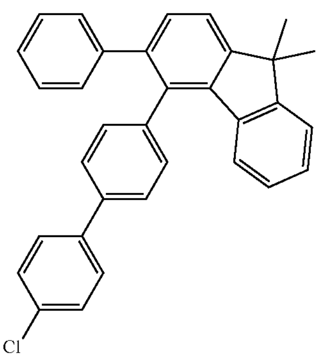
Sub 1-45
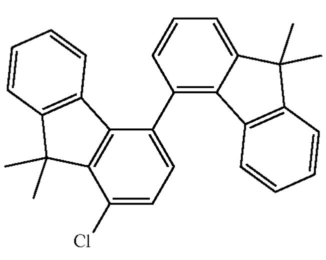
Sub 1-46
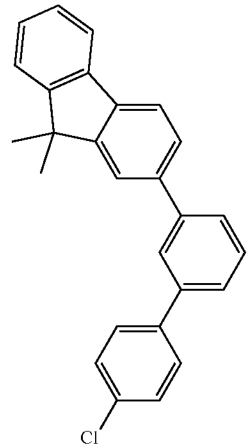
Sub 1-47
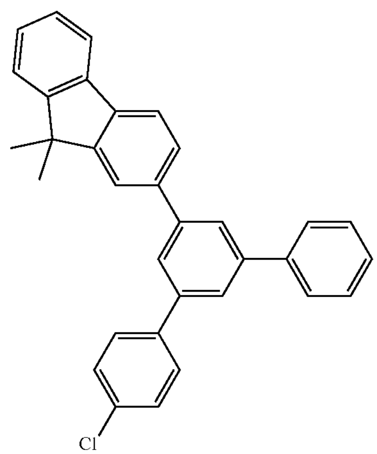
Sub 1-48
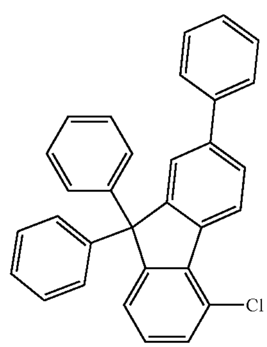
Sub 1-49
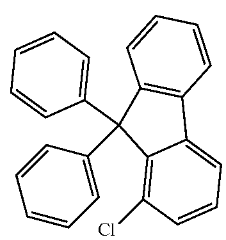

-continued
Sub 1-50
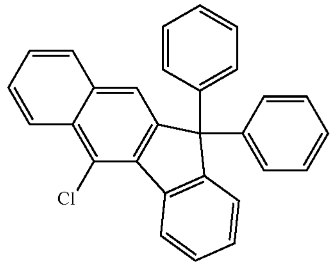
Sub 1-51
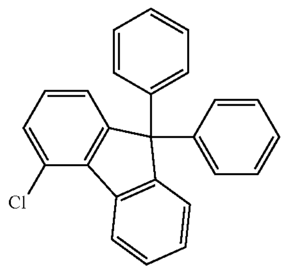
Sub 1-52
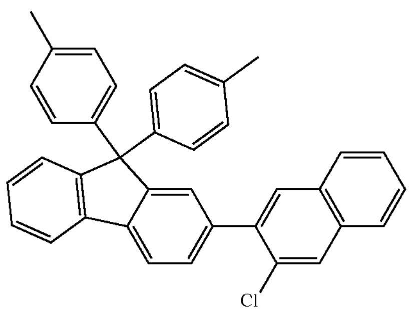
Sub 1-53
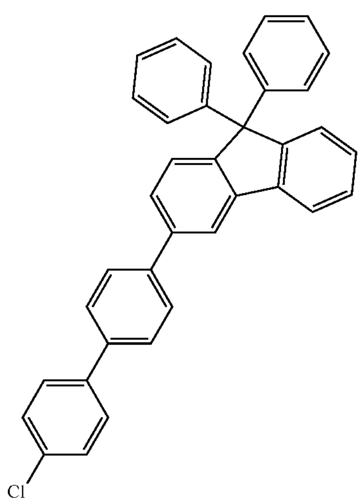
-continued
Sub 1-54
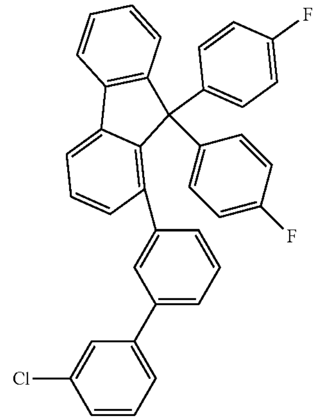
Sub 1-55
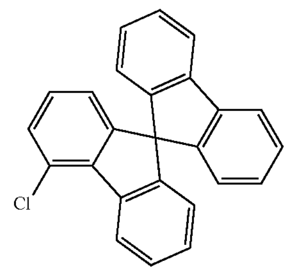
Sub 1-56
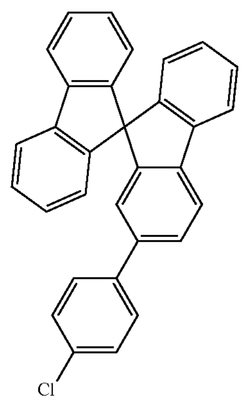
Sub 1-57
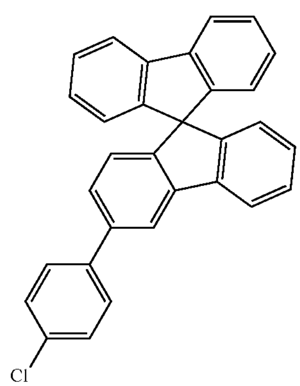

Sub 1-58
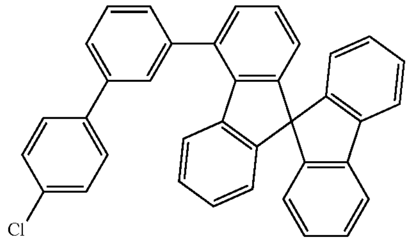
Sub 1-59
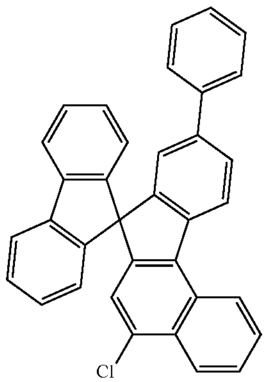
Sub 1-60
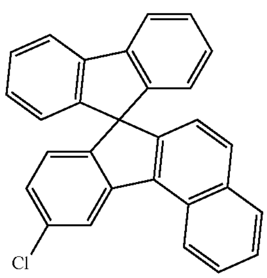
Sub 1-61
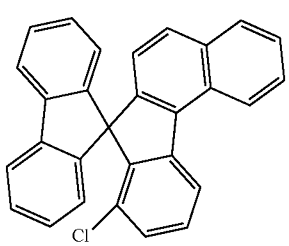
Sub 1-62
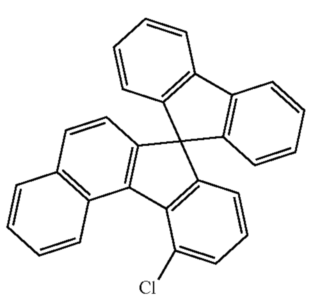
Sub 1-63
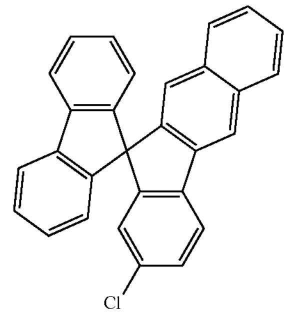
Sub 1-64
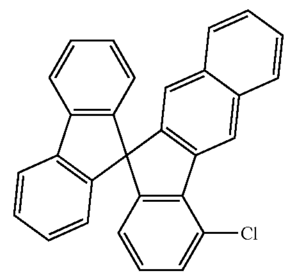
Sub 1-65
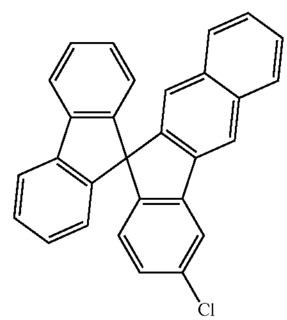
Sub 1-66
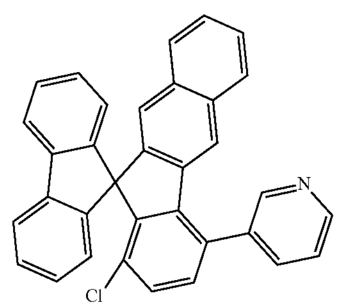
Sub 1-67
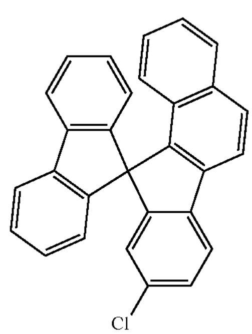

-continued
Sub 1-68
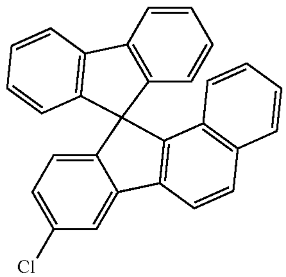
Sub 1-69
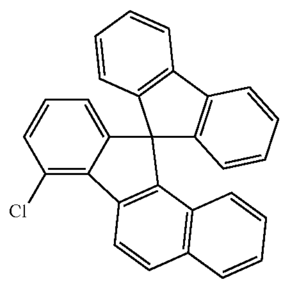
Sub 1-70
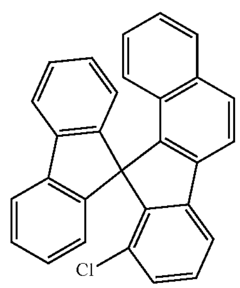
Sub 1-71
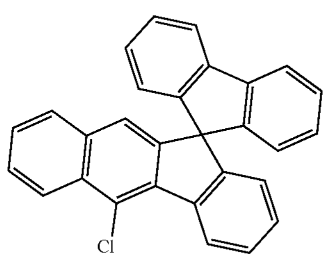
Sub 1-72
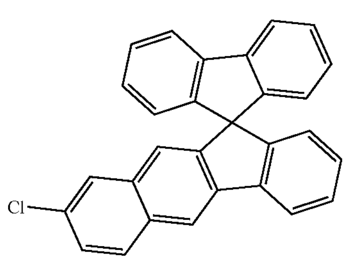
-continued
Sub 1-73
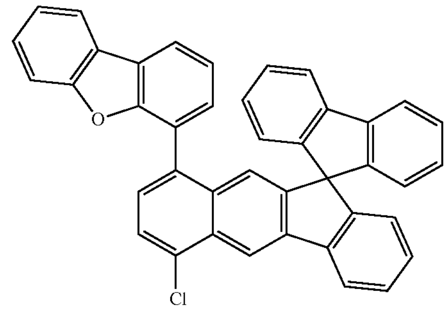
Sub 1-74
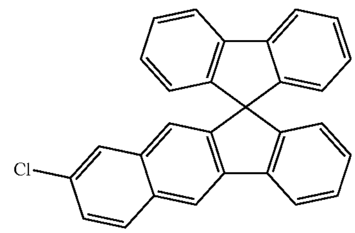
Sub 1-75
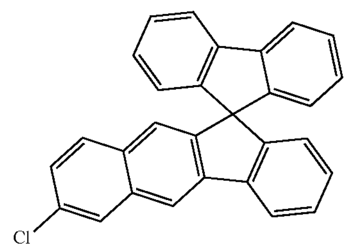
Sub 1-76
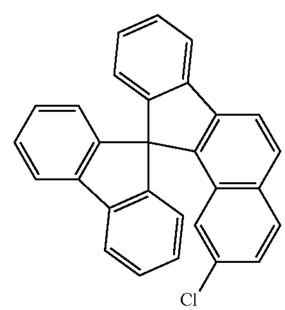
Sub 1-77
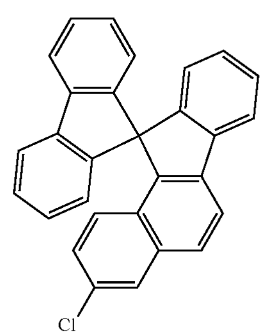

-continued
Sub 1-78
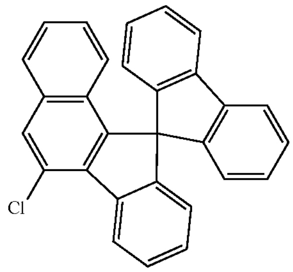
Sub 1-79
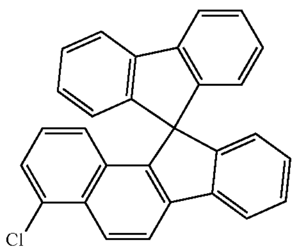
Sub 1-80
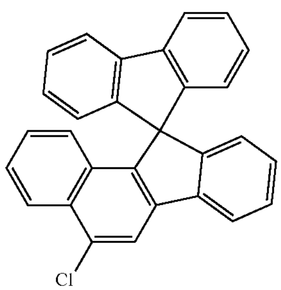
Sub 1-81
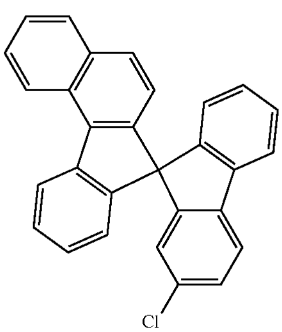
Sub 1-82
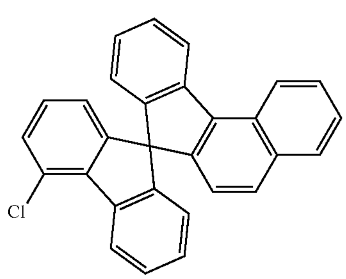
-continued
Sub 1-83
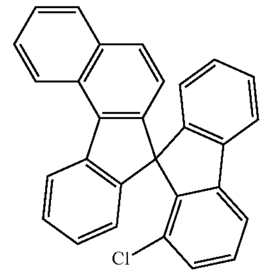
Sub 1-84
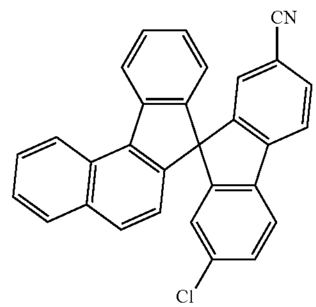
Sub 1-85
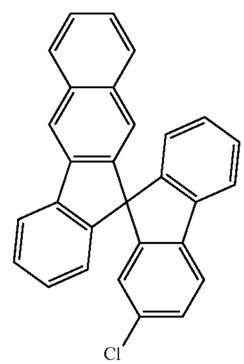
Sub 1-86
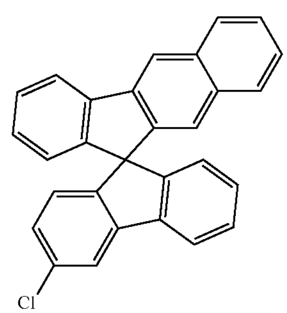
Sub 1-87
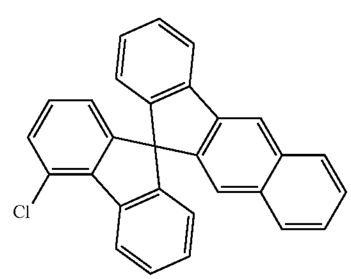

-continued
Sub 1-88
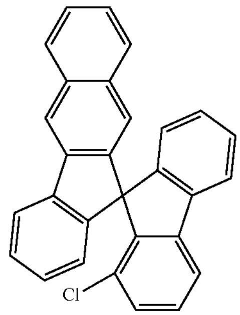
Sub 1-89
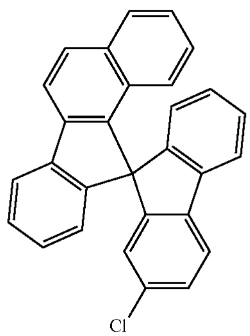
Sub 1-90
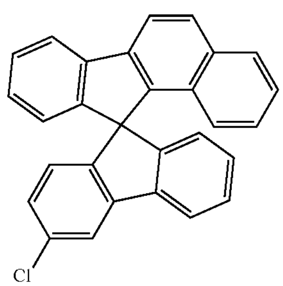
Sub 1-91
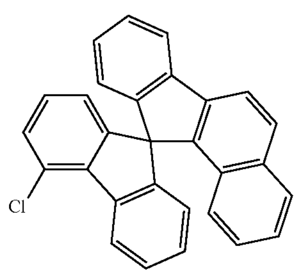
Sub 1-92
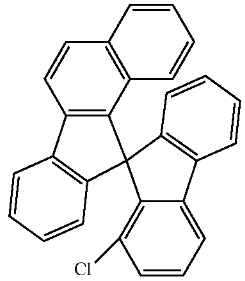
-continued
Sub 1-93
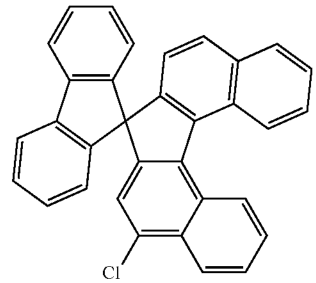
Sub 1-94
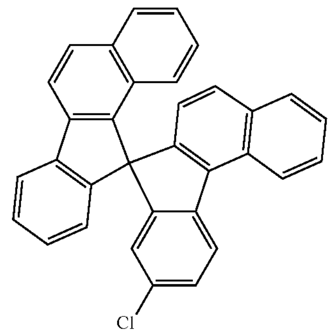
Sub 1-95
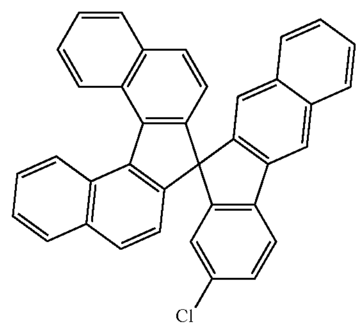
Sub 1-96
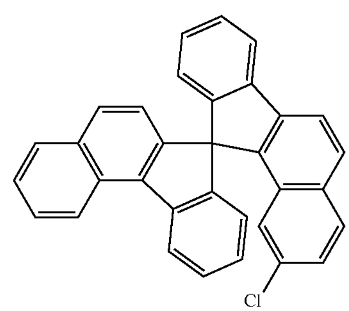
Sub 1-97
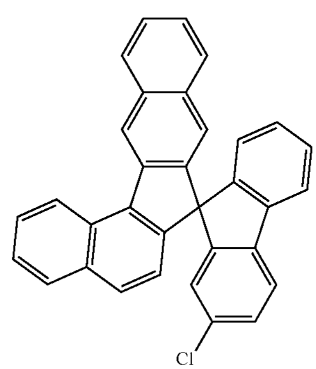

-continued
Sub 1-98
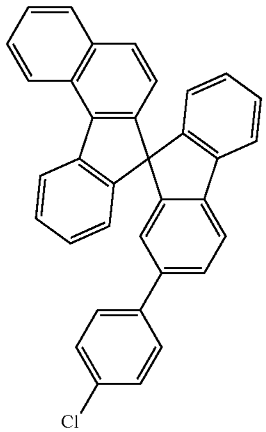
Sub 1-99
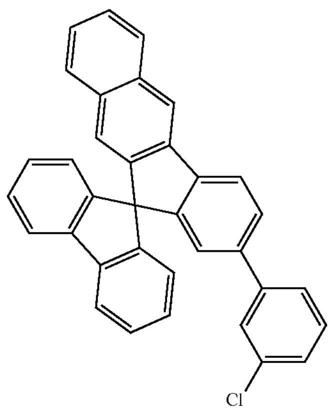
Sub 1-100
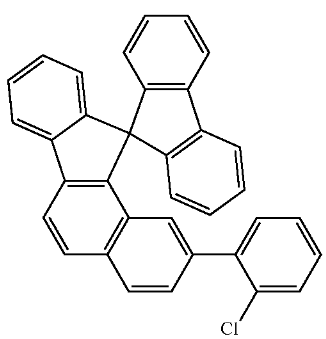
Sub 1-101
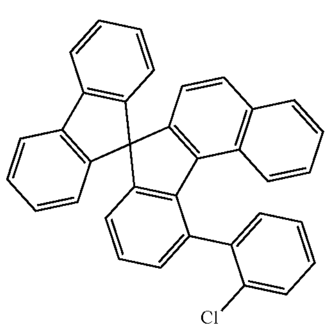
-continued
Sub 1-102
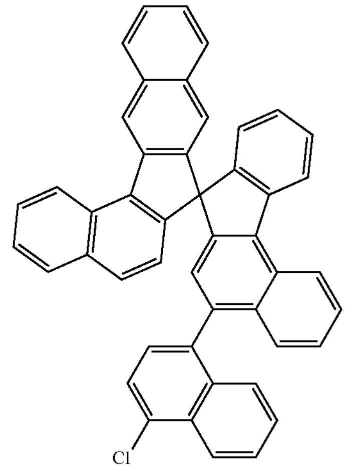
Sub 1-103
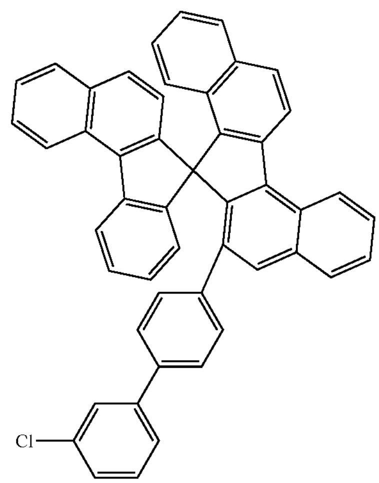
Sub 1-104
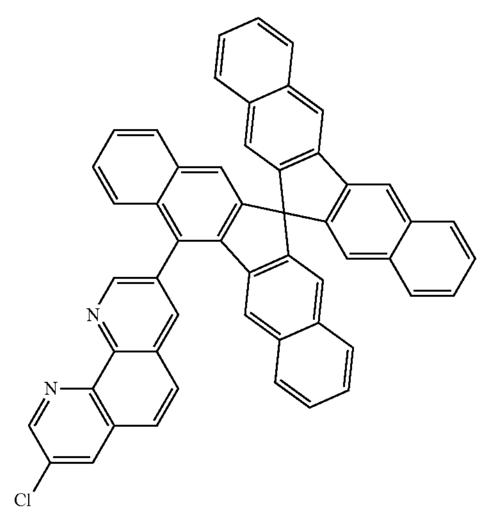

-continued
Sub 1-105
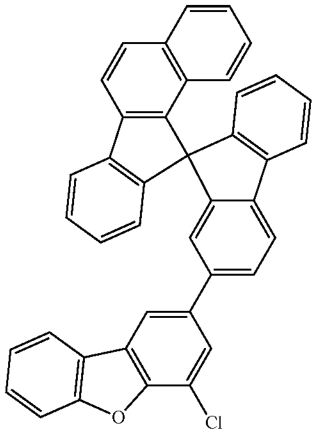
Sub 1-106
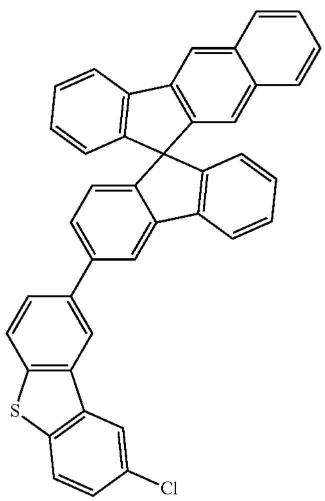
Sub 1-107
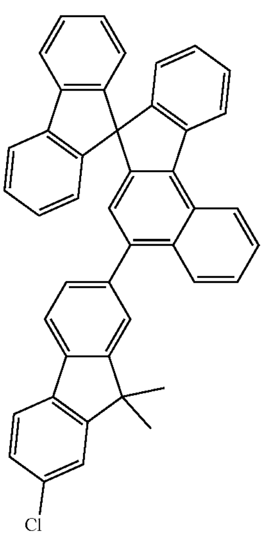
-continued
Sub 1-108
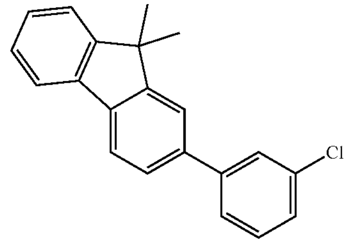
Sub 1-109
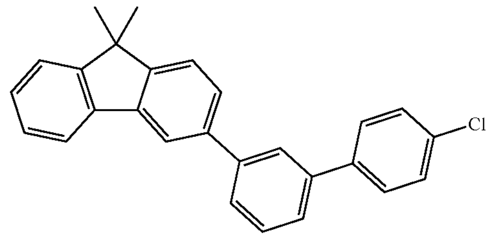
Sub 1-110
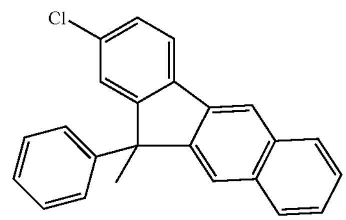
Sub 1-111
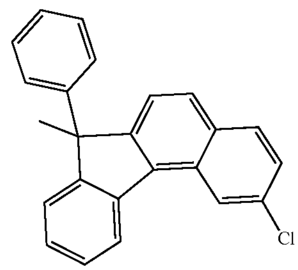
Sub 1-112
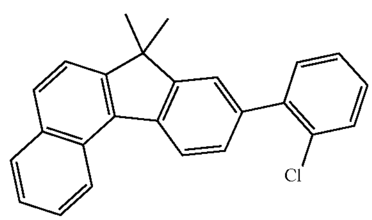
Sub 1-113
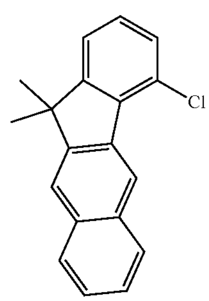

-continued

Sub 1-114

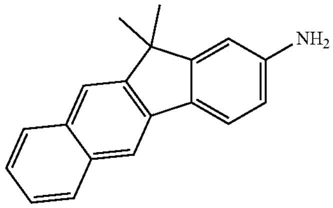

Sub 1-115

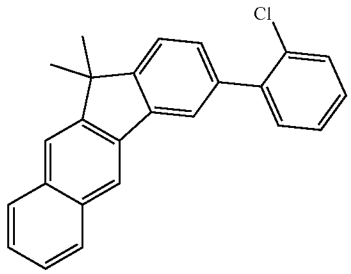

Sub 1-116

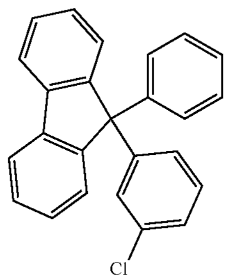

Sub 1-117

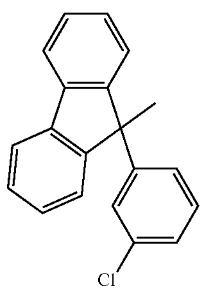

-continued

Sub 1-118

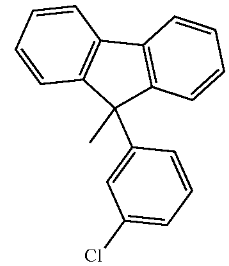

Sub 1-119

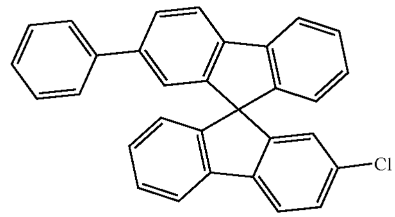

Sub 1-120

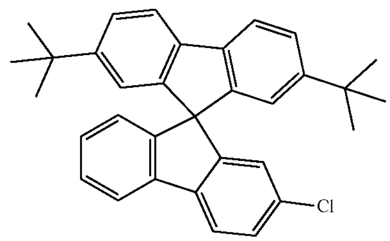

Sub 1-121

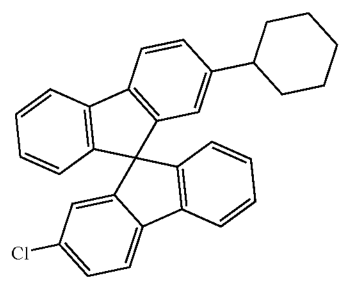

TABLE 4

| Compound | FD-MS | Compound | FD-MS |
|---|---|---|---|
| Sub 1-1 | m/z = 366.12 ($C_{26}H_{19}Cl$ = 366.89) | Sub 1-2 | m/z = 228.07 ($C_{15}H_{13}Cl$ = 228.72) |
| Sub 1-3 | m/z = 290.09 ($C_{20}H_{15}Cl$ = 290.79) | Sub 1-4 | m/z = 228.07 ($C_{15}H_{13}Cl$ = 228.72) |
| Sub 1-5 | m/z = 228.07 ($C_{15}H_{13}Cl$ = 228.72) | Sub 1-6 | m/z = 380.13 ($C_{27}H_{21}Cl$ = 380.92) |
| Sub 1-7 | m/z = 340.1 ($C_{24}H_{17}Cl$ = 340.85) | Sub 1-8 | m/z = 278.09 ($C_{19}H_{15}Cl$ = 278.78) |
| Sub 1-9 | m/z = 352.1 ($C_{25}H_{17}Cl$ = 352.86) | Sub 1-10 | m/z = 428.13 ($C_{31}H_{21}Cl$ = 428.96) |
| Sub 1-11 | m/z = 428.13 ($C_{31}H_{21}Cl$ = 428.96) | Sub 1-12 | m/z = 428.13 ($C_{31}H_{21}Cl$ = 428.96) |
| Sub 1-13 | m/z = 428.13 ($C_{31}H_{21}Cl$ = 428.96) | Sub 1-14 | m/z = 428.13 ($C_{31}H_{21}Cl$ = 428.96) |
| Sub 1-15 | m/z = 428.13 ($C_{31}H_{21}Cl$ = 428.96) | Sub 1-16 | m/z = 428.13 ($C_{31}H_{21}Cl$ = 428.96) |
| Sub 1-17 | m/z = 428.13 ($C_{31}H_{21}Cl$ = 428.96) | Sub 1-18 | m/z = 428.13 ($C_{31}H_{21}Cl$ = 428.96) |
| Sub 1-19 | m/z = 428.13 ($C_{31}H_{21}Cl$ = 428.96) | Sub 1-20 | m/z = 428.13 ($C_{31}H_{21}Cl$ = 428.96) |
| Sub 1-21 | m/z = 428.13 ($C_{31}H_{21}Cl$ = 428.96) | Sub 1-22 | m/z = 428.13 ($C_{31}H_{21}Cl$ = 428.96) |
| Sub 1-23 | m/z = 290.09 ($C_{20}H_{15}Cl$ = 290.79) | Sub 1-24 | m/z = 340.1 ($C_{24}H_{17}Cl$ = 340.85) |
| Sub 1-25 | m/z = 352.1 ($C_{25}H_{17}Cl$ = 352.86) | Sub 1-26 | m/z = 402.12 ($C_{29}H_{19}Cl$ = 402.92) |
| Sub 1-27 | m/z = 478.15 ($C_{35}H_{23}Cl$ = 479.02) | Sub 1-28 | m/z = 350.09 ($C_{25}H_{15}Cl$ = 350.85) |
| Sub 1-29 | m/z = 426.12 ($C_{31}H_{19}Cl$ = 426.94) | Sub 1-30 | m/z = 400.1 ($C_{29}H_{17}Cl$ = 400.91) |
| Sub 1-31 | m/z = 426.12 ($C_{31}H_{19}Cl$ = 426.94) | Sub 1-32 | m/z = 426.12 ($C_{31}H_{19}Cl$ = 426.94) |
| Sub 1-33 | m/z = 426.12 ($C_{31}H_{19}Cl$ = 426.94) | Sub 1-34 | m/z = 426.12 ($C_{31}H_{19}Cl$ = 426.94) |
| Sub 1-35 | m/z = 426.12 ($C_{31}H_{19}Cl$ = 426.94) | Sub 1-36 | m/z = 426.12 ($C_{31}H_{19}Cl$ = 426.94) |
| Sub 1-37 | m/z = 426.12 ($C_{31}H_{19}Cl$ = 426.94) | Sub 1-38 | m/z = 400.1 ($C_{29}H_{17}Cl$ = 400.91) |
| Sub 1-39 | m/z = 400.1 ($C_{29}H_{17}Cl$ = 400.91) | Sub 1-40 | m/z = 418.09 ($C_{29}H_{16}ClF$ = 418.9) |
| Sub 1-41 | m/z = 450.12 ($C_{33}H_{19}Cl$ = 450.97) | Sub 1-42 | m/z = 304.1 ($C_{21}H_{17}Cl$ = 304.82) |
| Sub 1-43 | m/z = 404.13 ($C_{29}H_{21}Cl$ = 404.94) | Sub 1-44 | m/z = 456.16 ($C_{3z}H_{25}Cl$ = 457.01) |

TABLE 4-continued

| Compound | FD-MS | Compound | FD-MS |
|---|---|---|---|
| Sub 1-45 | m/z = 420.16 ($C_{30}H_{25}Cl$ = 420.98) | Sub 1-46 | m/z = 380.13 ($C_{27}H_{21}Cl$ = 380.92) |
| Sub 1-47 | m/z = 456.16 ($C_{33}H_{25}Cl$ = 457.01) | Sub 1-48 | m/z = 428.13 ($C_{31}H_{21}Cl$ = 428.96) |
| Sub 1-49 | m/z = 352.1 ($C_{25}H_{17}Cl$ = 352.86) | Sub 1-50 | m/z = 402.12 ($C_{29}H_{19}Cl$ = 402.92) |
| Sub 1-51 | m/z = 352.1 ($C_{25}H_{17}Cl$ = 352.86) | Sub 1-52 | m/z = 506.18 ($C_{37}H_{27}Cl$ = 507.07) |
| Sub 1-53 | m/z = 504.16 ($C_{37}H_{25}Cl$ = 505.06) | Sub 1-54 | m/z = 540.15 ($C_{37}H_{23}ClF_2$ = 541.04) |
| Sub 1-55 | m/z = 350.09 ($C_{25}H_{15}Cl$ = 350.85) | Sub 1-56 | m/z = 426.12 ($C_{31}H_{19}Cl$ = 426.94) |
| Sub 1-57 | m/z = 426.12 ($C_{31}H_{19}Cl$ = 426.94) | Sub 1-58 | m/z = 502.15 ($C_{37}H_{23}Cl$ = 503.04) |
| Sub 1-59 | m/z = 476.13 ($C_{35}H_{21}Cl$ = 477.00) | Sub 1-60 | m/z = 476.13 ($C_{35}H_{21}Cl$ = 477.00) |
| Sub 1-61 | m/z = 400.1 ($C_{29}H_{17}Cl$ = 400.91) | Sub 1-62 | m/z = 400.1 ($C_{29}H_{17}Cl$ = 400.91) |
| Sub 1-63 | m/z = 400.1 ($C_{29}H_{17}Cl$ = 400.91) | Sub 1-64 | m/z = 400.1 ($C_{29}H_{17}Cl$ = 400.91) |
| Sub 1-65 | m/z = 400.1 ($C_{29}H_{17}Cl$ = 400.91) | Sub 1-66 | m/z = 477.13 ($C_{34}H_{20}ClN$ = 477.99) |
| Sub 1-67 | m/z = 400.1 ($C_{29}H_{17}Cl$ = 400.91) | Sub 1-68 | m/z = 400.1 ($C_{29}H_{17}Cl$ = 400.91) |
| Sub 1-69 | m/z = 400.1 ($C_{29}H_{17}Cl$ = 400.91) | Sub 1-70 | m/z = 400.1 ($C_{29}H_{17}Cl$ = 400.91) |
| Sub 1-71 | m/z = 400.1 ($C_{29}H_{17}Cl$ = 400.91) | Sub 1-72 | m/z = 400.1 ($C_{29}H_{17}Cl$ = 400.91) |
| Sub 1-73 | m/z = 566.14 ($C_{41}H_{23}ClO$ = 567.08) | Sub 1-74 | m/z = 400.1 ($C_{29}H_{17}Cl$ = 400.91) |
| Sub 1-75 | m/z = 400.1 ($C_{29}H_{17}Cl$ = 400.91) | Sub 1-76 | m/z = 400.1 ($C_{29}H_{17}Cl$ = 400.91) |
| Sub 1-77 | m/z = 400.1 ($C_{29}H_{17}Cl$ = 400.91) | Sub 1-78 | m/z = 400.1 ($C_{29}H_{17}Cl$ = 400.91) |
| Sub 1-79 | m/z = 400.1 ($C_{29}H_{17}Cl$ = 400.91) | Sub 1-80 | m/z = 400.1 ($C_{29}H_{17}Cl$ = 400.91) |
| Sub 1-81 | m/z = 400.1 ($C_{29}H_{17}Cl$ = 400.91) | Sub 1-82 | m/z = 400.1 ($C_{29}H_{17}Cl$ = 400.91) |
| Sub 1-83 | m/z = 400.1 ($C_{29}H_{17}Cl$ = 400.91) | Sub 1-84 | m/z = 425.1 ($C_{30}H_{16}ClN$ = 425.92) |
| Sub 1-85 | m/z = 400.1 ($C_{29}H_{17}Cl$ = 400.91) | Sub 1-86 | m/z = 400.1 ($C_{29}H_{17}Cl$ = 400.91) |
| Sub 1-87 | m/z = 400.1 ($C_{29}H_{17}Cl$ = 400.91) | Sub 1-88 | m/z = 400.1 ($C_{29}H_{17}Cl$ = 400.91) |
| Sub 1-89 | m/z = 400.1 ($C_{29}H_{17}Cl$ = 400.91) | Sub 1-90 | m/z = 400.1 ($C_{29}H_{17}Cl$ = 400.91) |
| Sub 1-91 | m/z = 400.1 ($C_{29}H_{17}Cl$ = 400.91) | Sub 1-92 | m/z = 400.1 ($C_{29}H_{17}Cl$ = 400.91) |
| Sub 1-93 | m/z = 450.12 ($C_{33}H_{19}Cl$ = 450.97) | Sub 1-94 | m/z = 450.12 ($C_{33}H_{19}Cl$ = 450.97) |
| Sub 1-95 | m/z = 500.13 ($C_{37}H_{21}Cl$ = 501.03) | Sub 1-96 | m/z = 450.12 ($C_{33}H_{19}Cl$ = 450.97) |
| Sub 1-97 | m/z = 450.12 ($C_{33}H_{19}Cl$ = 450.97) | Sub 1-98 | m/z = 476.13 ($C_{35}H_{21}Cl$ = 477.00) |
| Sub 1-99 | m/z = 476.13 ($C_{35}H_{21}Cl$ = 477.00) | Sub 1-100 | m/z = 476.13 ($C_{35}H_{21}Cl$ = 477.00) |
| Sub 1-101 | m/z = 476.13 ($C_{35}H_{21}Cl$ = 477.00) | Sub 1-102 | m/z = 626.18 ($C_{47}H_{27}Cl$ = 627.18) |
| Sub 1-103 | m/z = 652.2 ($C_{49}H_{29}Cl$ = 653.22) | Sub 1-104 | m/z = 728.2 ($C_{53}H_{29}ClN_2$ = 729.28) |
| Sub 1-105 | m/z = 566.14 ($C_{41}H_{23}ClO$ = 567.08) | Sub 1-106 | m/z = 582.12 ($C_{41}H_{23}ClS$ = 583.15) |
| Sub 1-107 | m/z = 592.2 ($C_{44}H_{29}Cl$ = 593.17) | Sub 1-108 | m/z = 304.1 ($C_{21}H_{17}Cl$ = 304.82) |
| Sub 1-109 | m/z = 380.13 ($C_{27}H_{21}Cl$ = 380.92) | Sub 1-110 | m/z = 340.1 ($C_{24}H_{17}Cl$ = 340.85) |
| Sub 1-111 | m/z = 340.1 ($C_{24}H_{17}Cl$ = 340.85) | Sub 1-112 | m/z = 354.12 ($C_{25}H_{19}Cl$ = 354.88) |
| Sub 1-113 | m/z = 278.09 ($C_{19}H_{15}Cl$ = 278.78) | Sub 1-114 | m/z = 259.14 ($C_{19}H_{17}N$ = 259.35) |
| Sub 1-115 | m/z = 354.12 ($C_{25}H_{19}Cl$ = 354.88) | Sub 1-116 | m/z = 352.1 ($C_{25}H_{17}Cl$ = 352.86) |
| Sub 1-117 | m/z = 290.09 ($C_{20}H_{15}Cl$ = 290.79) | Sub 1-118 | m/z = 290.09 ($C_{20}H_{15}Cl$ = 290.79) |
| Sub 1-119 | m/z = 426.12 ($C_{31}H_{19}Cl$ = 426.94) | Sub 1-120 | m/z = 462.21 ($C_{33}H_{31}Cl$ = 463.06) |
| Sub 1-121 | m/z = 432.16 ($C_{31}H_{25}Cl$ = 432.99) | | |

II. Synthesis of Sub 2

Sub 2 of Reaction Formula 4 is synthesized through, but not limited to, a reaction path of the following Reaction Formula 6.

[Reaction Formula 6]

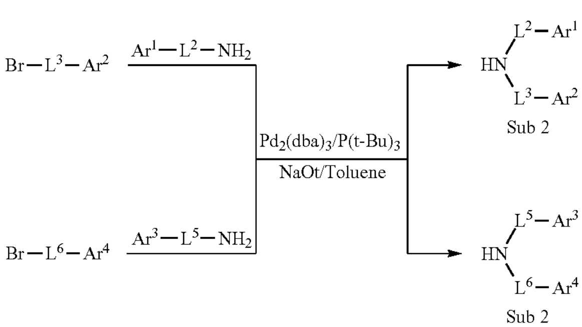

-continued

1. Synthesis of Sub 2-73

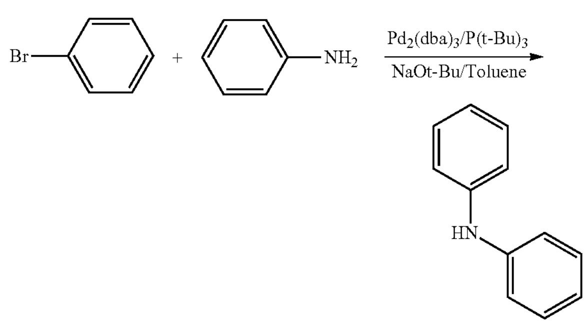

Sub 2-73

Bromobenzene (37.1 g, 236.2 mmol) was added to a round bottom flask, dissolved with toluene (2200 ml), and then aniline (20 g, 214.8 mmol), $Pd_2$ $(dba)_3$ (9.83 g, 10.7 mmol), P (t-Bu)$_3$ (4.34 g, 21.5 mmol), and NaOt-Bu (62 g, 644.3 mmol) were sequentially added, followed by stirring at 100° C. When the reaction was completed, extraction was performed with ether and water, and then an organic layer was dried with $MgSO_4$ and concentrated. The resultant organic matter was subjected to silica gel column chromatography and recrystallization to create a product in an amount of 28 g (yield: 77%)

2. Synthesis of Sub 2-111

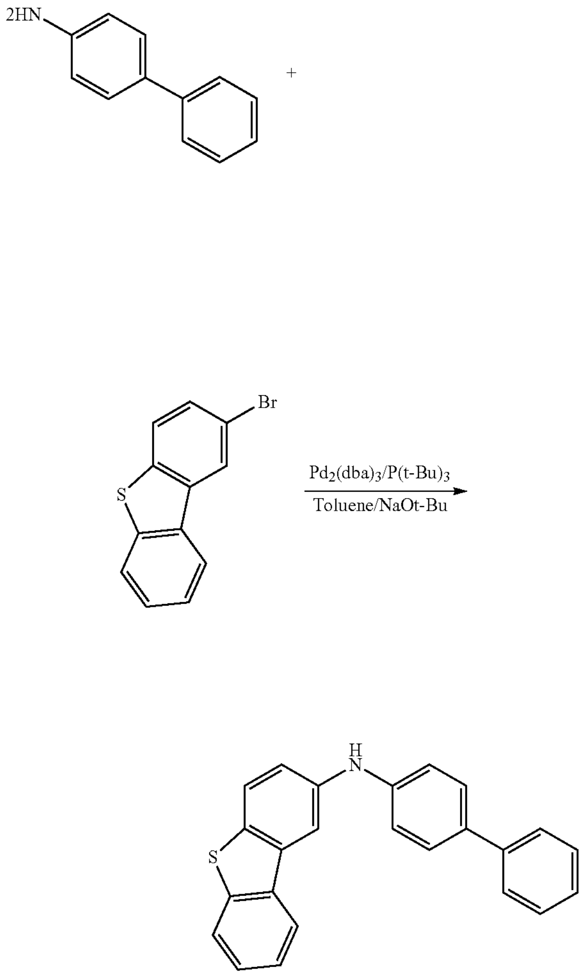

Sub 2-111

[1,1'-biphenyl]-4-amine (15 g, 88.64 mmol), 2-bromodibenzo[b,d]thiophene (23.32 g, 88.64 mmol), $Pd_2(dba)_3$ (2.43 g, 2.66 mmol), P(t-Bu)$_3$ (17.93 g, 88.64 mmol), NaOt-Bu (17.04 g, 177.27 mmol), and toluene (886 mL) were added to a round bottom flask, and then an experiment was performed in the same manner as Sub 2-73, thereby creating a product in an amount of 24.6 g (yield 79%).

The compounds belonging to Sub 2 of Reaction Formula 4 may be, but are not limited to, the following compounds, and Table 5 illustrates field desorption-mass spectrometry (FD-MS) values of the compounds belonging to Sub 2.

Sub 2-1

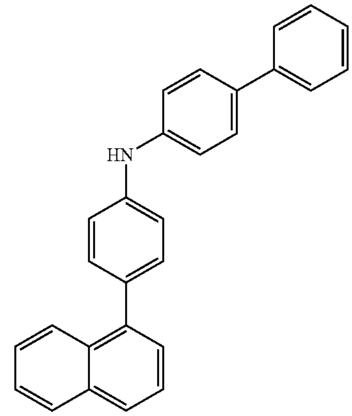

Sub 2-2

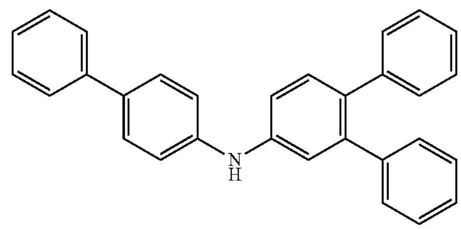

Sub 2-3

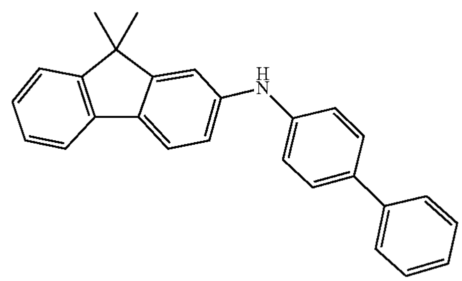

Sub 2-4

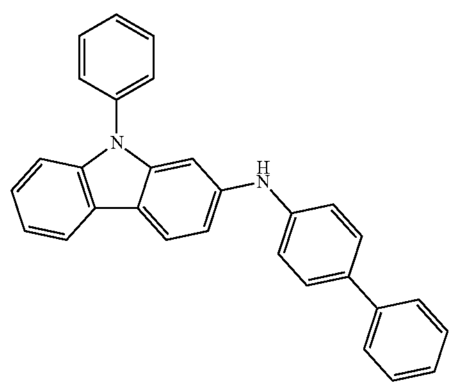

Sub 2-5

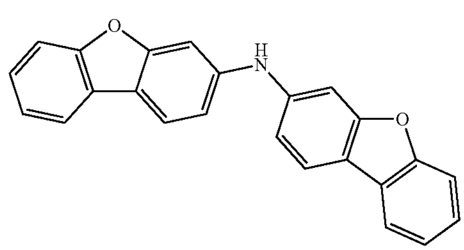

-continued
Sub 2-6
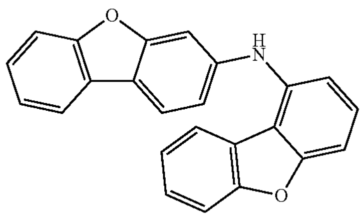
Sub 2-7
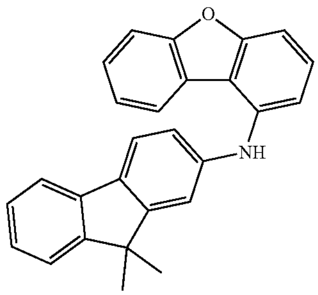
Sub 2-8
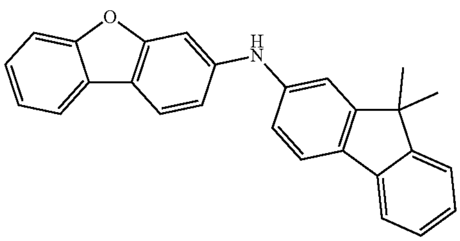
Sub 2-9
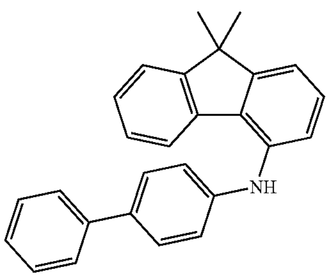
Sub 2-10
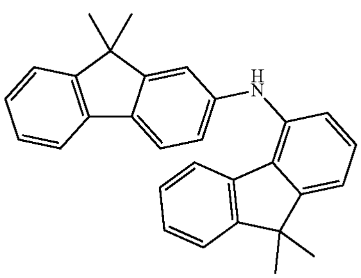
Sub 2-11
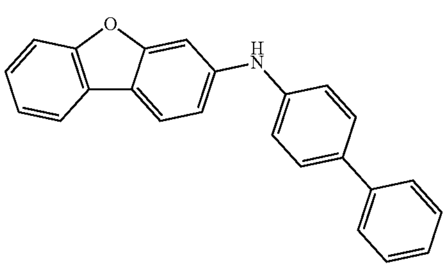
-continued
Sub 2-12
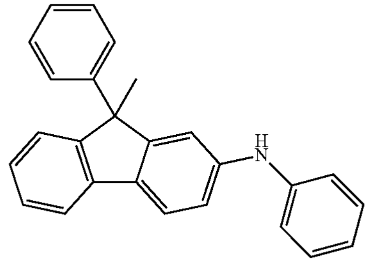
Sub 2-13
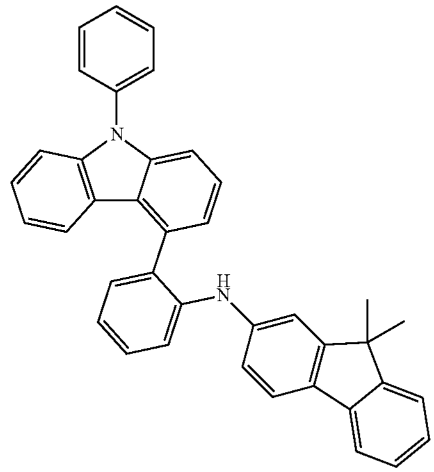
Sub 2-14
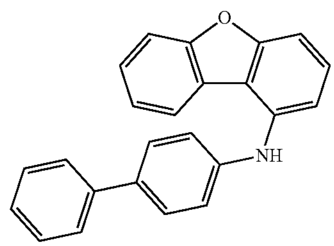
Sub 2-15
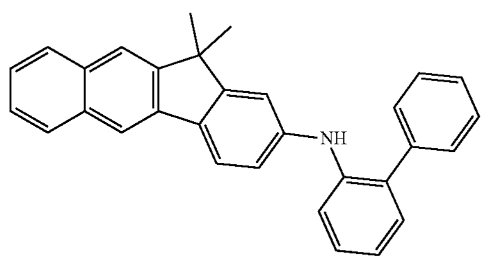
Sub 2-16
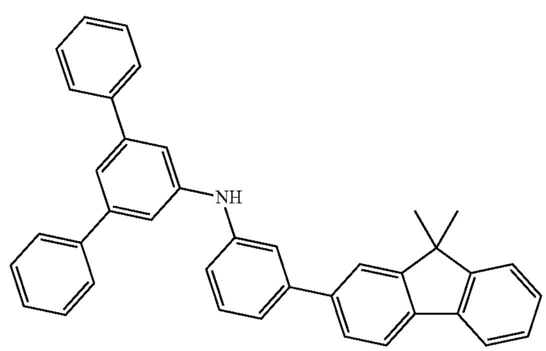

-continued
Sub 2-17
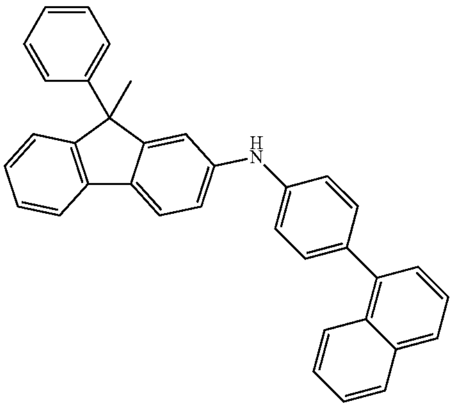
Sub 2-18
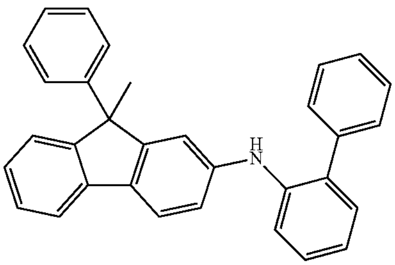
Sub 2-19
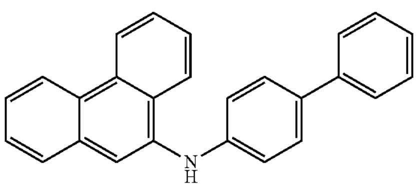
Sub 2-20
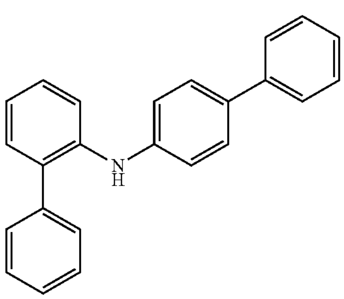
Sub 2-21
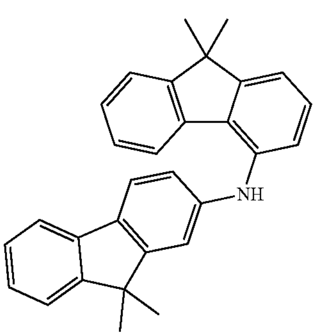
-continued
Sub 2-22
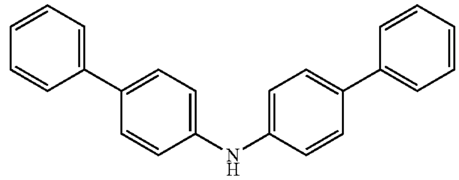
Sub 2-23
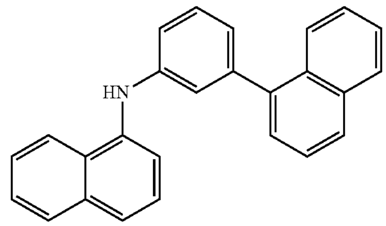
Sub 2-24
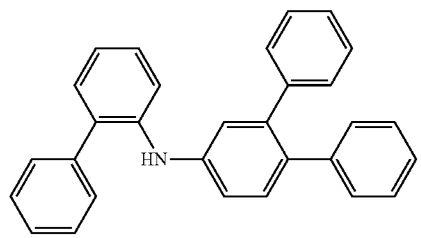
Sub 2-25
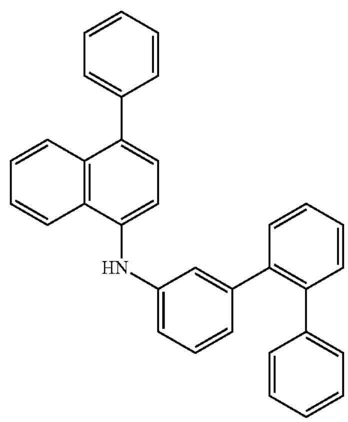
Sub 2-26
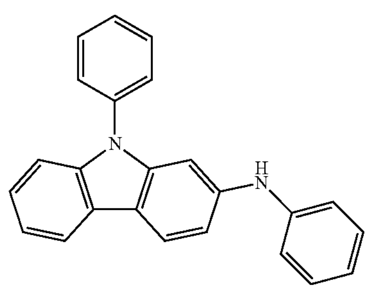
Sub 2-27
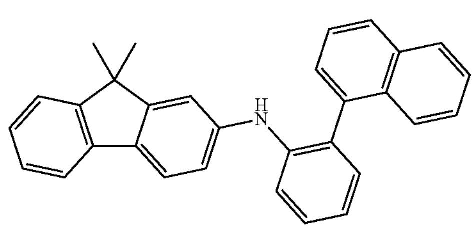

-continued
Sub 2-28
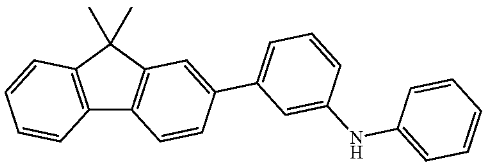
Sub 2-29
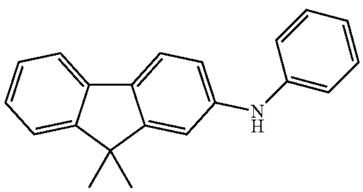
Sub 2-30
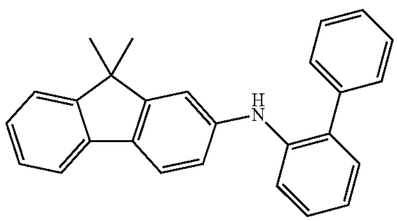
Sub 2-31
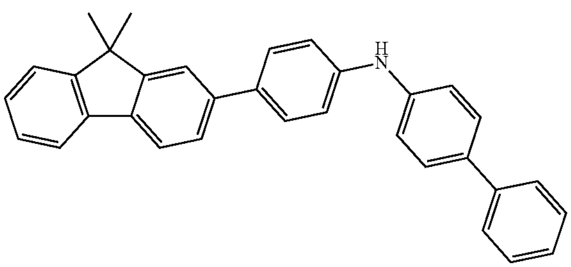
Sub 2-32
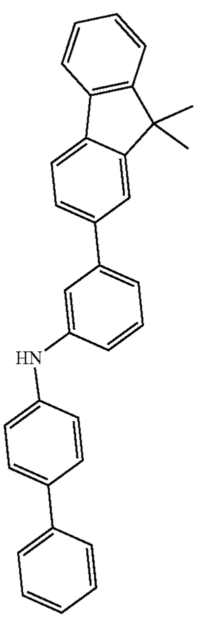
-continued
Sub 2-33
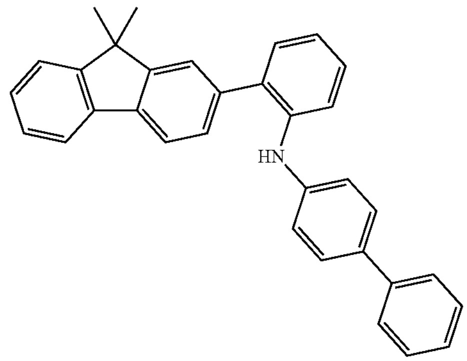
Sub 2-34
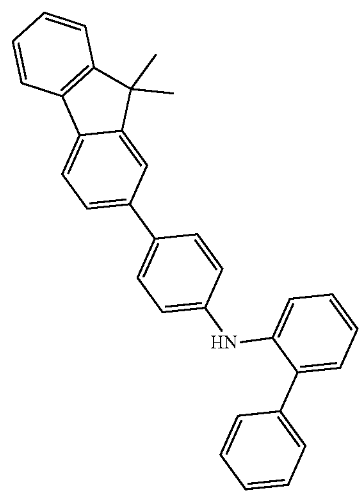
Sub 2-35
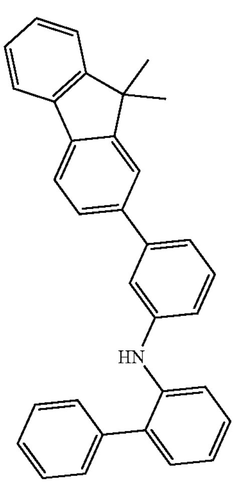

-continued
Sub 2-36
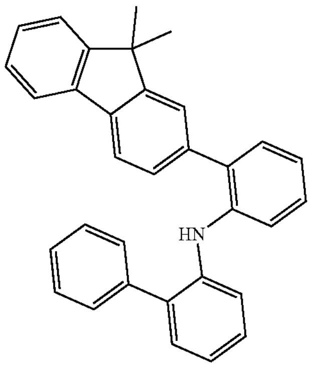
Sub 2-37
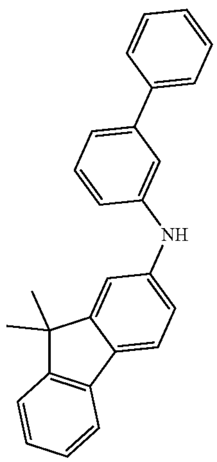
Sub 2-38
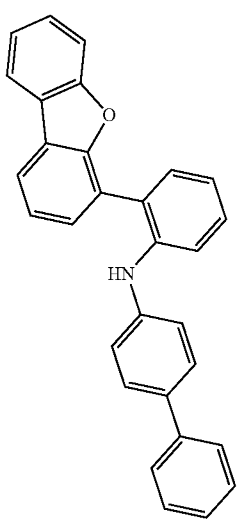
-continued
Sub 2-39
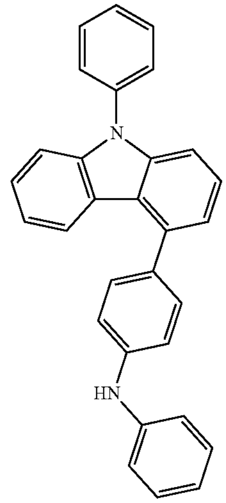
Sub 2-40
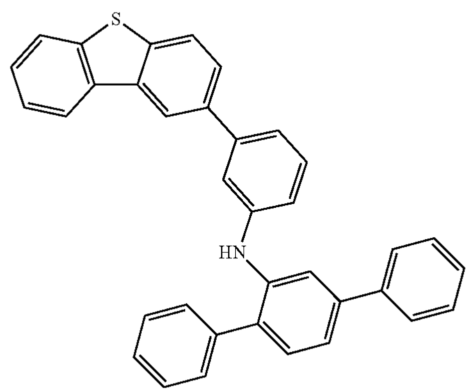
Sub 2-41
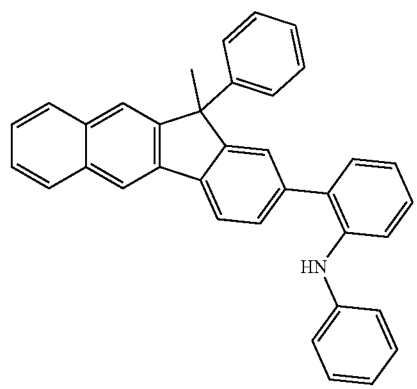
Sub 2-42
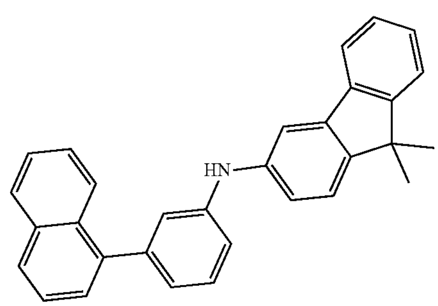

-continued
Sub 2-43
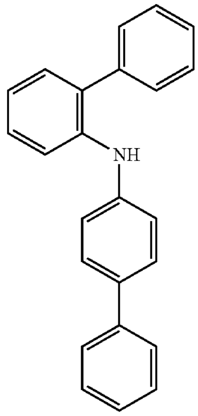
Sub 2-44
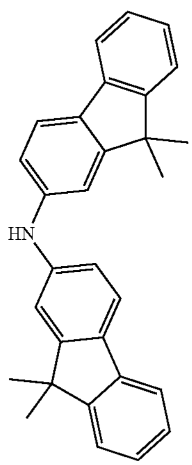
Sub 2-45
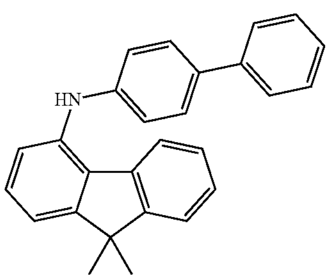
Sub 2-46
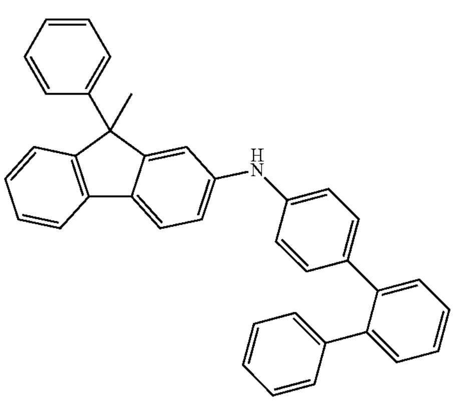
-continued
Sub 2-47
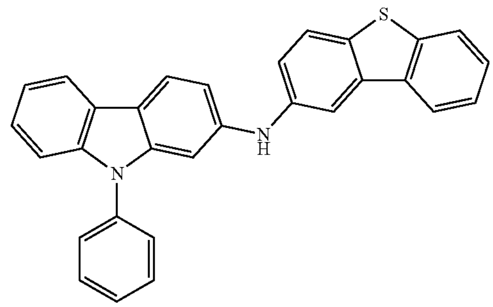
Sub 2-48
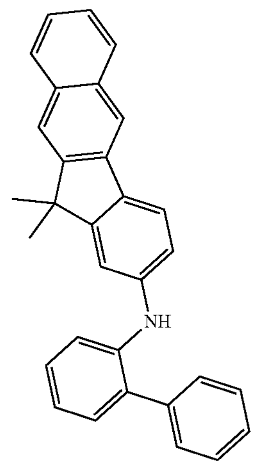
Sub 2-49
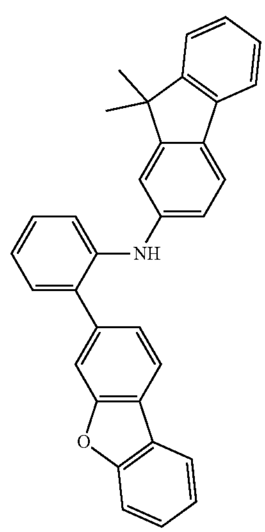

-continued
Sub 2-50
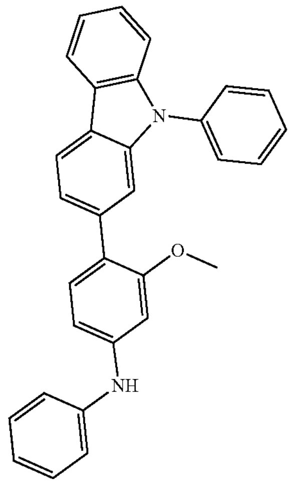
Sub 2-51
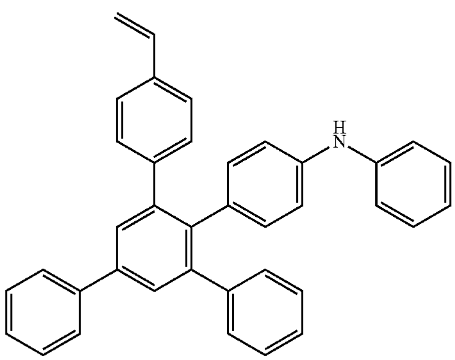
Sub 2-52
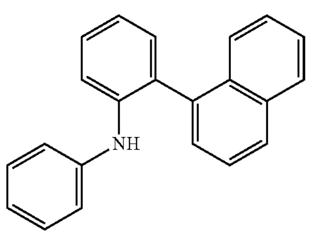
Sub 2-53
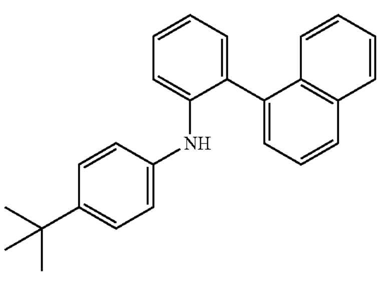
-continued
Sub 2-54
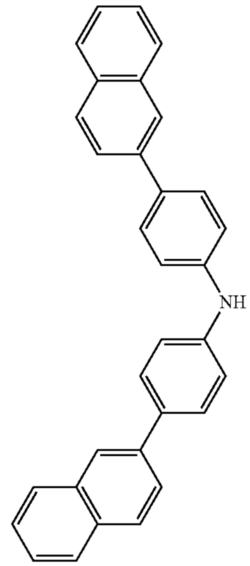
Sub 2-55
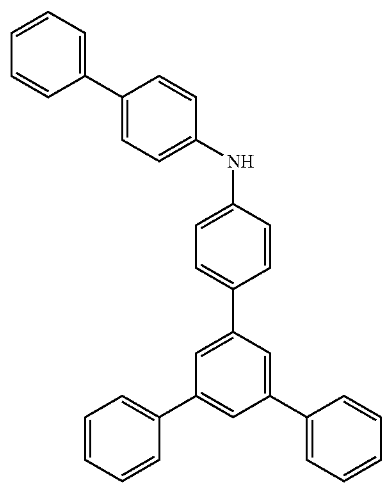
Sub 2-56
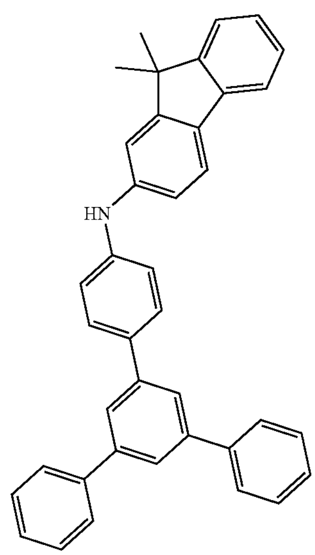

-continued
Sub 2-57
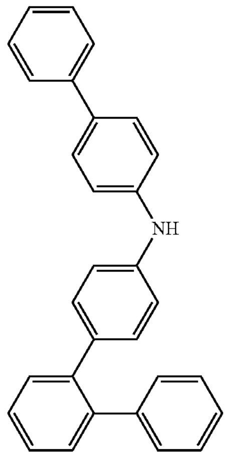
Sub 2-58
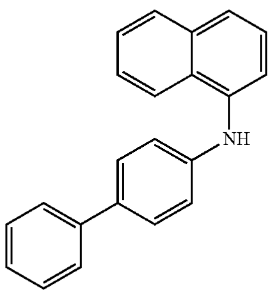
Sub 2-59
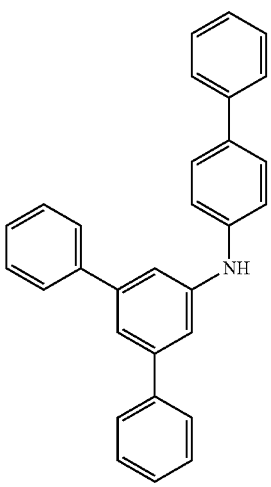
Sub 2-60
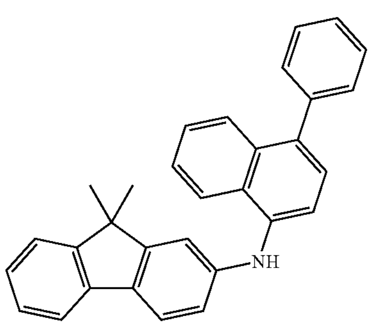
-continued
Sub 2-61
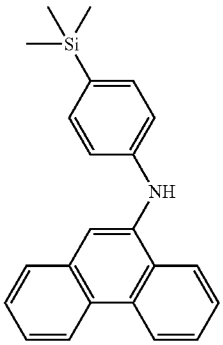
Sub 2-62
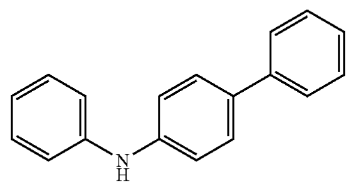
Sub 2-63
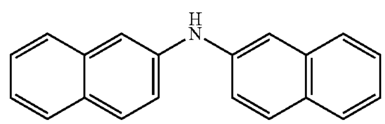
Sub 2-64
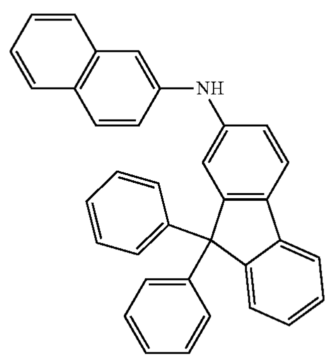
Sub 2-65
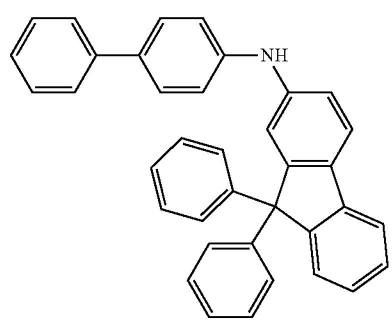

Sub 2-66
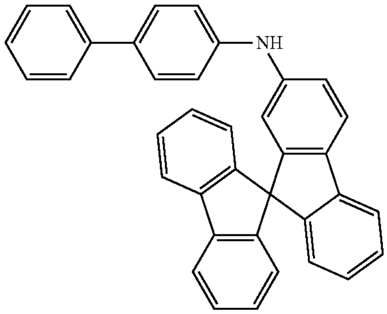
Sub 2-67
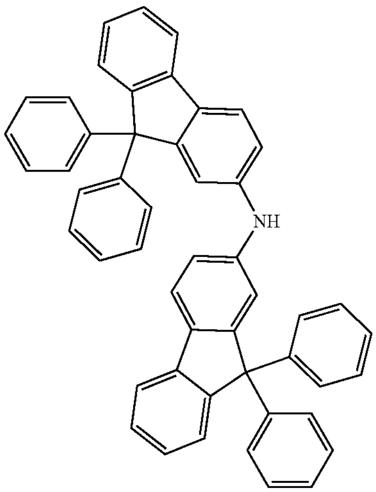
Sub 2-68
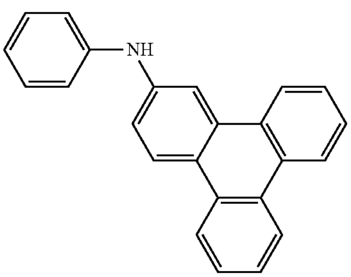
Sub 2-69
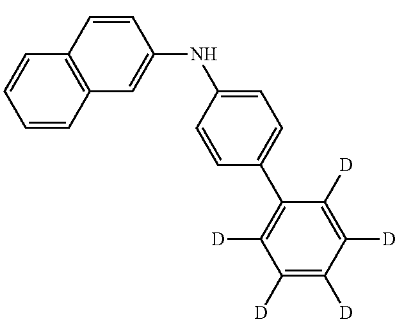
Sub 2-70
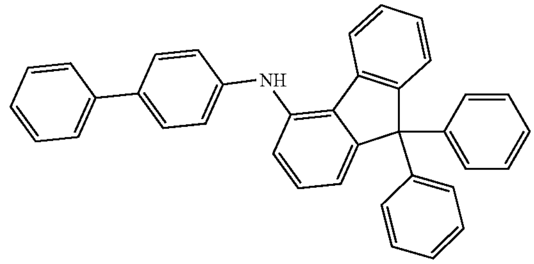
Sub 2-71
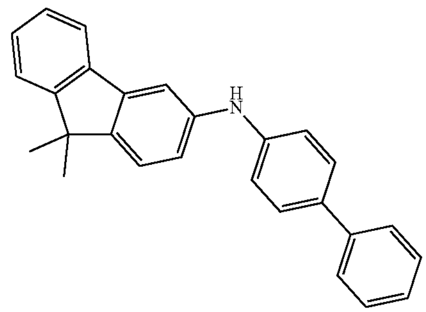
Sub 2-72
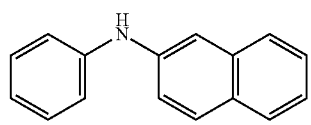
Sub 2-73
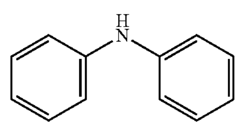
Sub 2-74
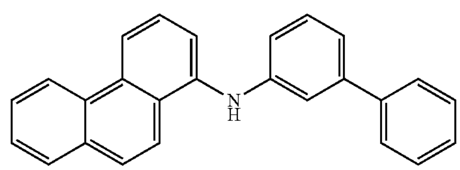
Sub 2-75
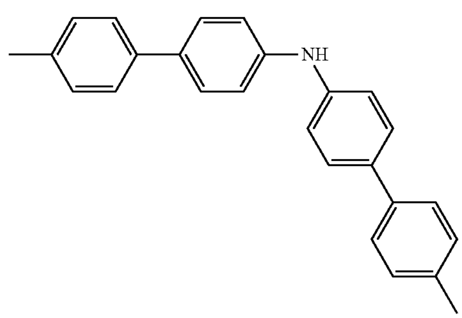

-continued
Sub 2-76
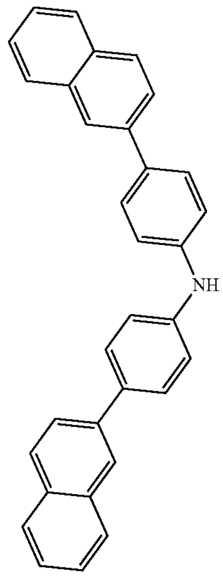
Sub 2-77
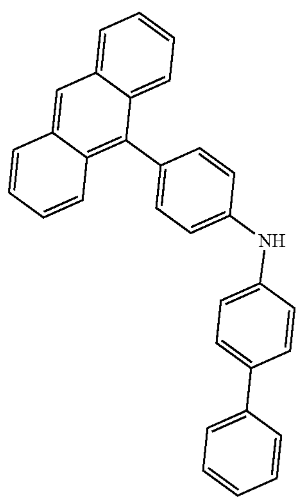
Sub 2-78
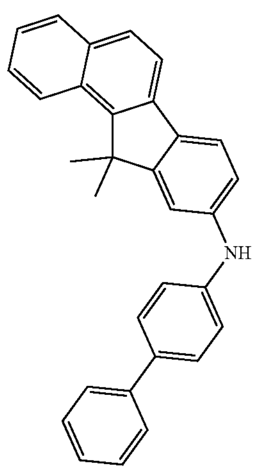
-continued
Sub 2-79
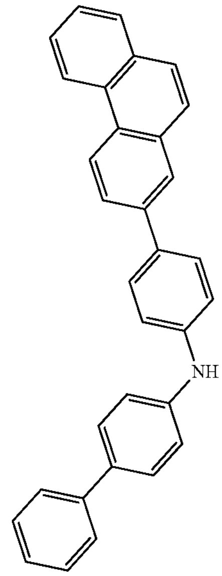
Sub 2-80
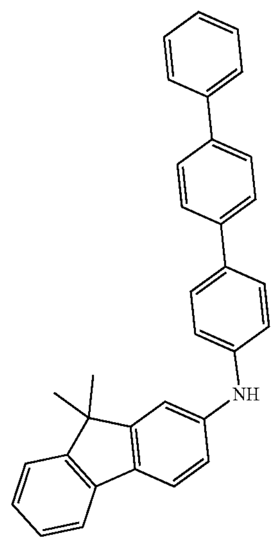
Sub 2-81
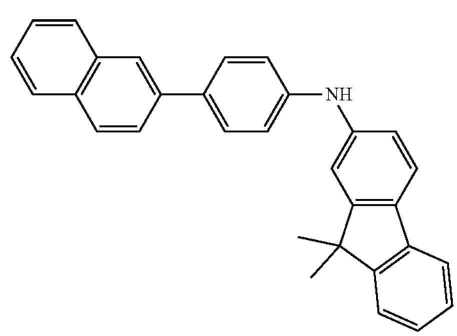

-continued
Sub 2-82
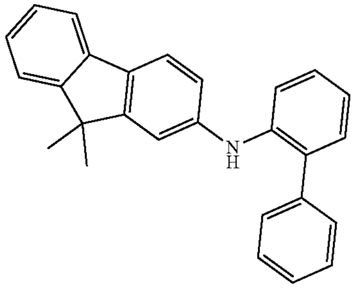
Sub 2-83
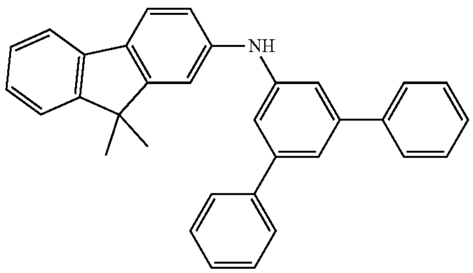
Sub 2-84
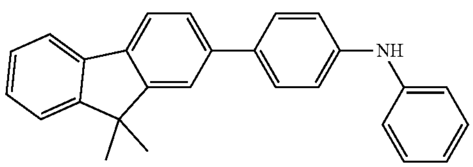
Sub 2-85
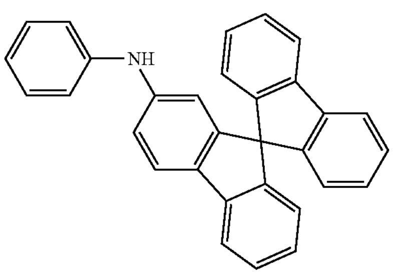
Sub 2-86
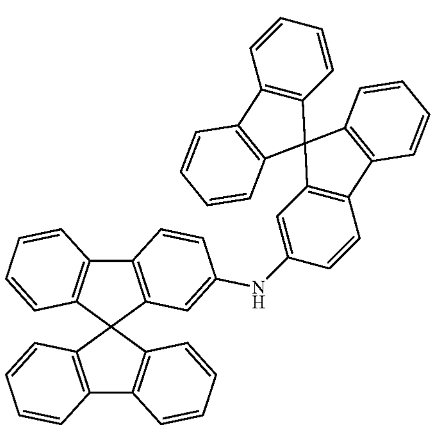
-continued
Sub 2-87
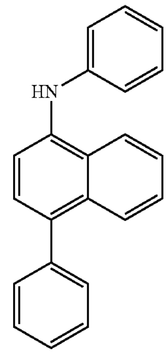
Sub 2-88
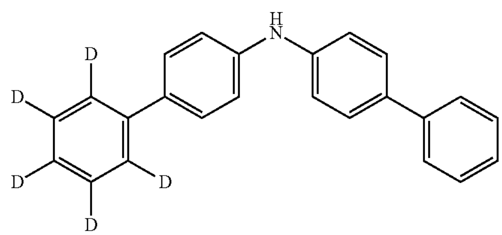
Sub 2-89
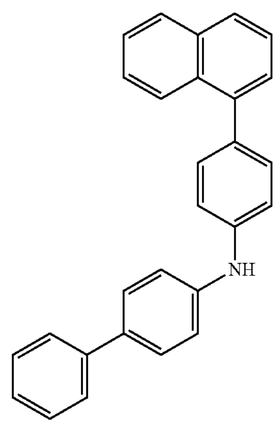
Sub 2-90
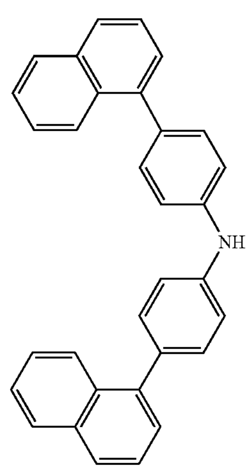

-continued
Sub 2-91
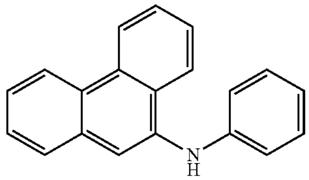
Sub 2-92
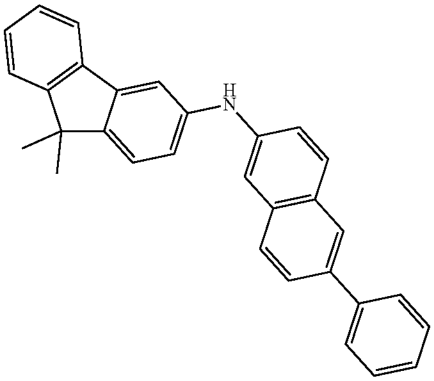
Sub 2-93
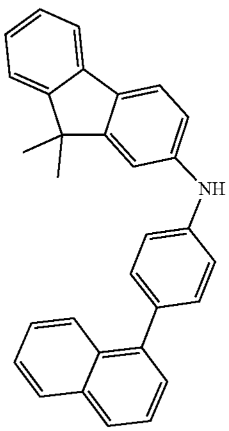
Sub 2-94
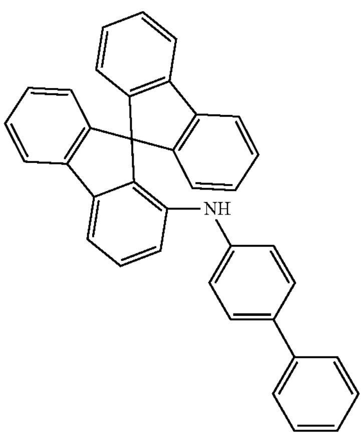
Sub 2-95
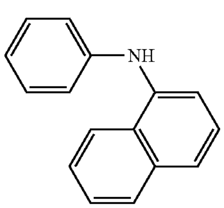
-continued
Sub 2-96
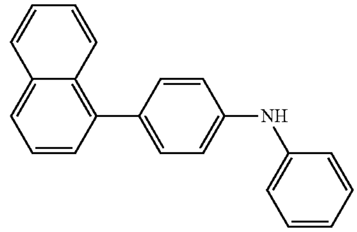
Sub 2-97
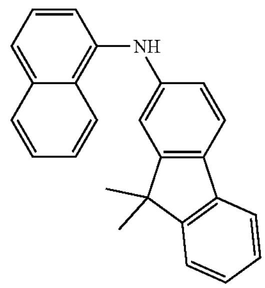
Sub 2-98
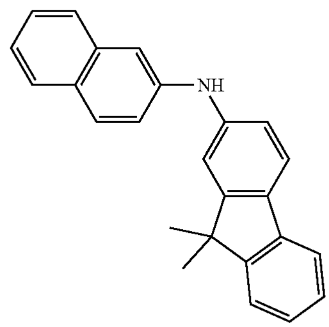
Sub 2-99
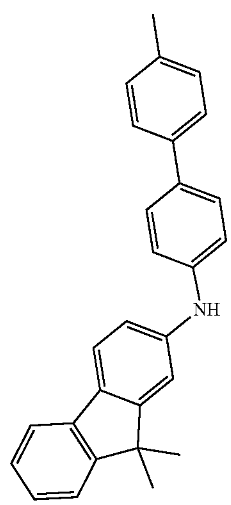

-continued
Sub 2-100
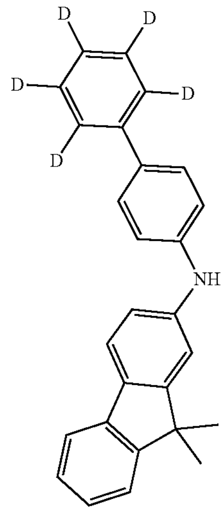
Sub 2-101
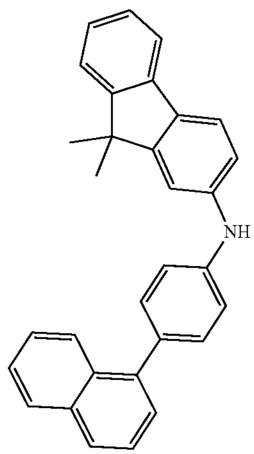
Sub 2-102
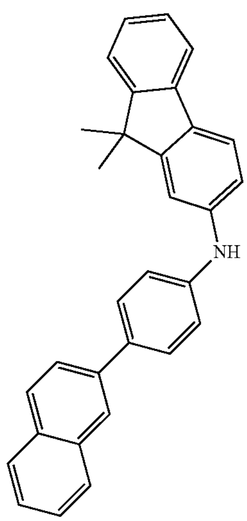
-continued
Sub 2-103
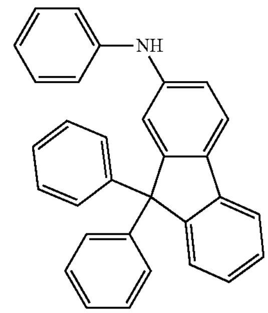
Sub 2-104
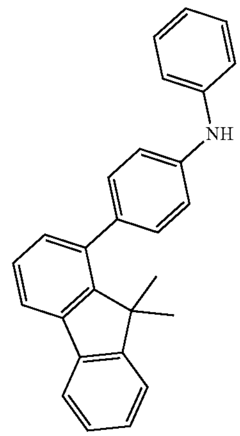
Sub 2-105
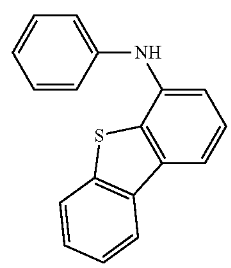
Sub 2-106
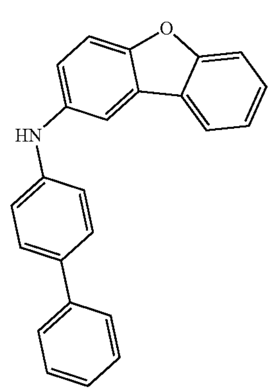

-continued
Sub 2-107
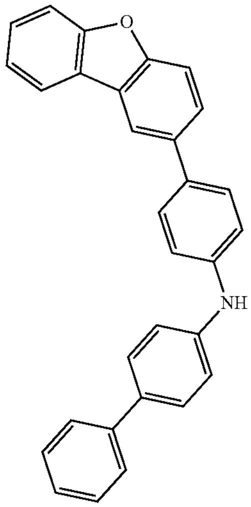
Sub 2-108
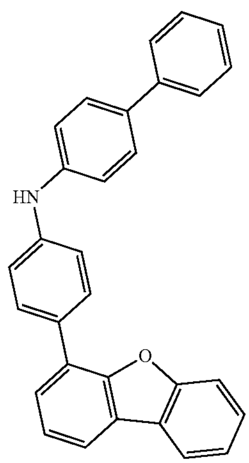
Sub 2-109
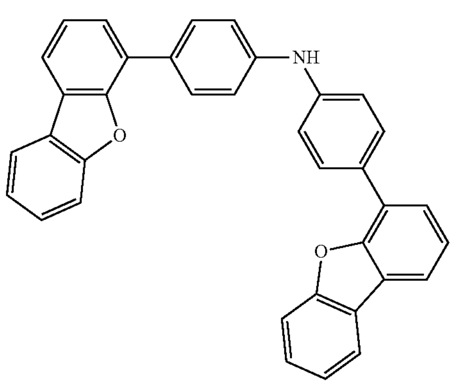
-continued
Sub 2-110
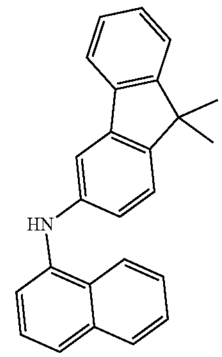
Sub 2-111
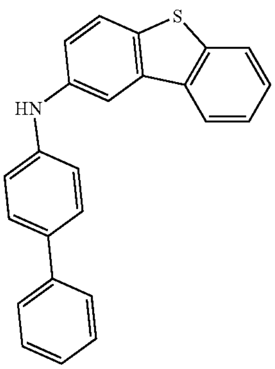
Sub 2-112
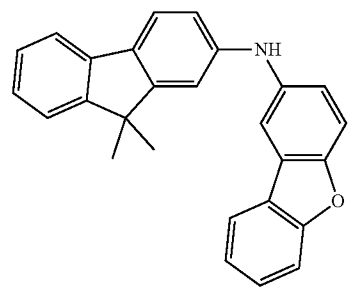
Sub 2-113
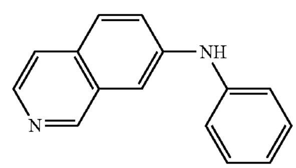
Sub 2-114
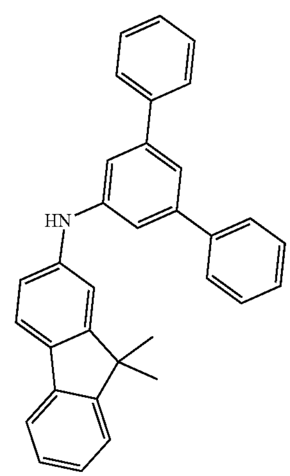

-continued
Sub 2-115
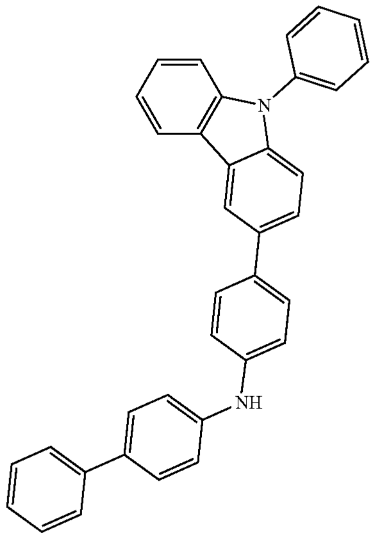
Sub 2-116
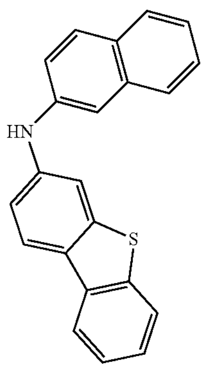
Sub 2-117
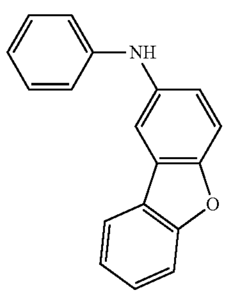
Sub 2-118
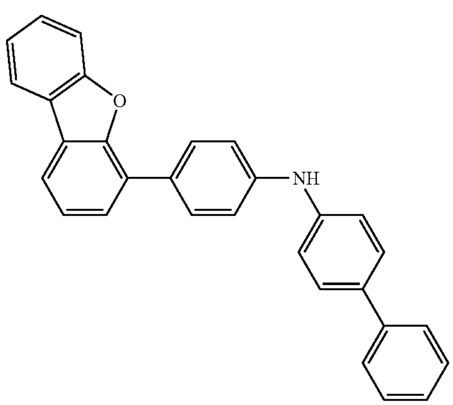
-continued
Sub 2-119
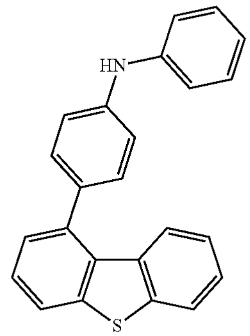
Sub 2-120
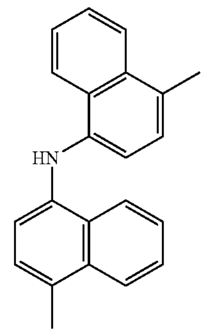
Sub 2-121
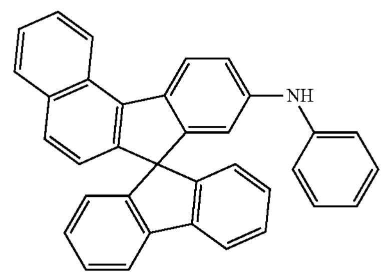
Sub 2-122
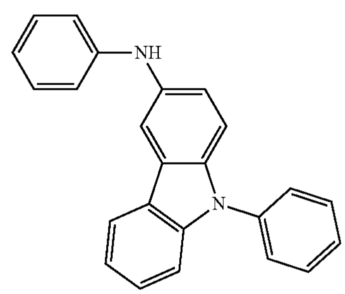
Sub 2-123
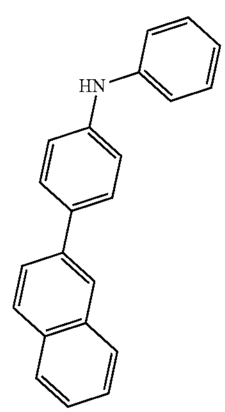

-continued
Sub 2-124
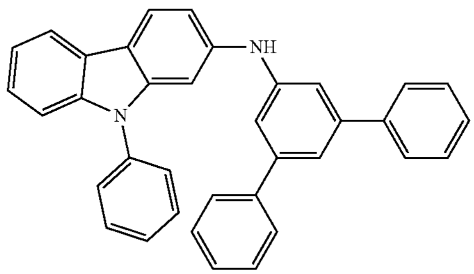
Sub 2-125
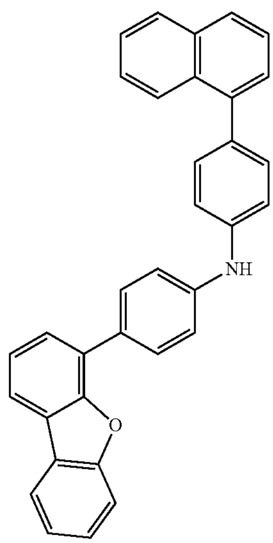
Sub 2-126
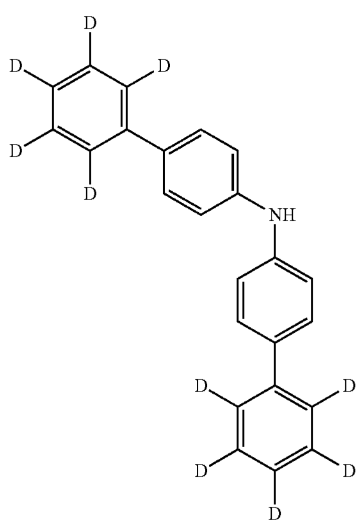
-continued
Sub 2-127
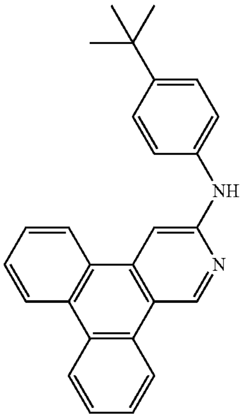
Sub 2-128
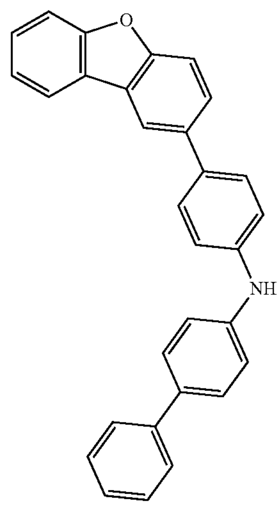
Sub 2-129
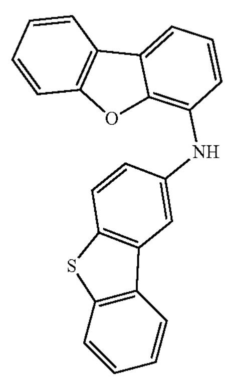

-continued
Sub 2-130
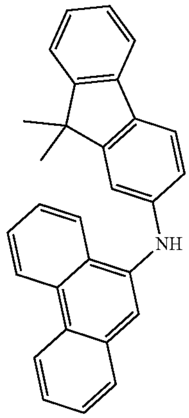
Sub 2-131
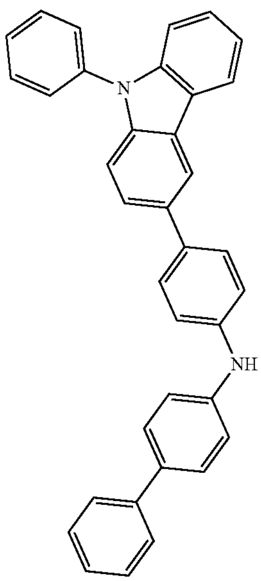
Sub 2-132
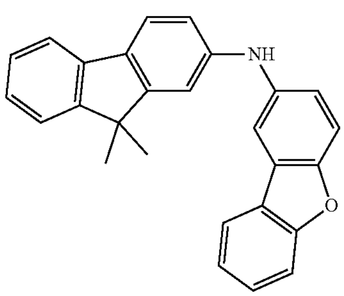
Sub 2-133
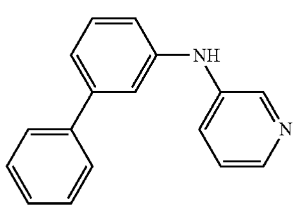
-continued
Sub 2-134
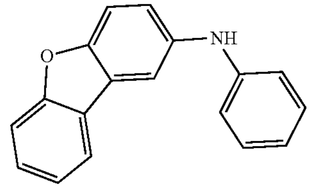
Sub 2-135
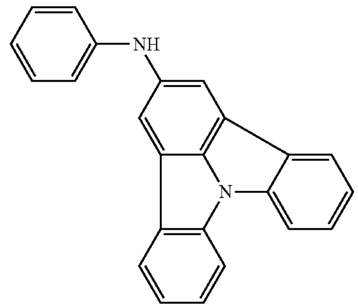
Sub 2-136
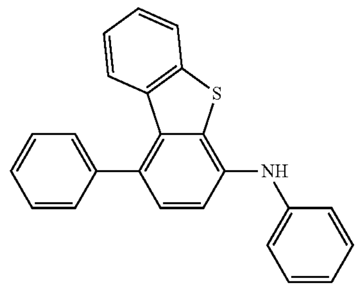
Sub 2-137
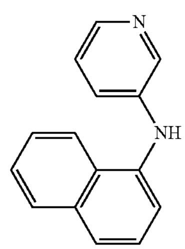
Sub 2-138
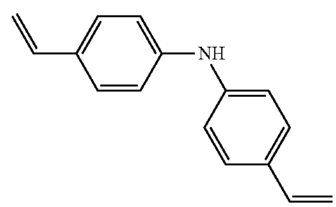
Sub 2-139
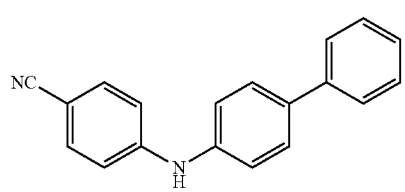
Sub 2-140
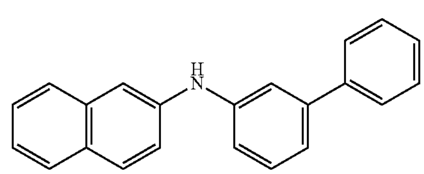

-continued
Sub 2-141
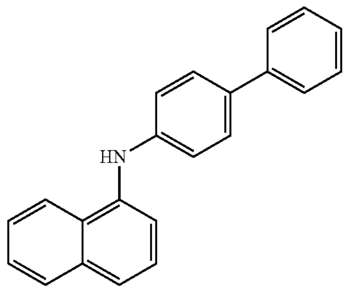
Sub 2-142
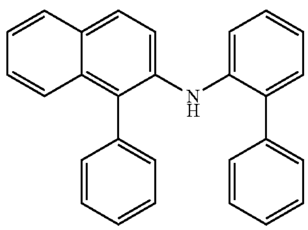
Sub 2-143
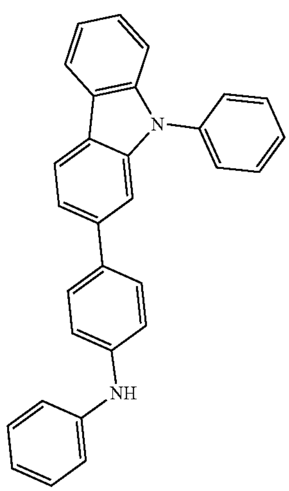
Sub 2-144
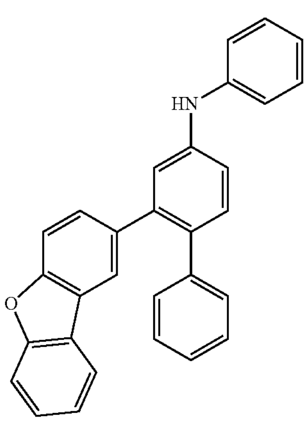
-continued
Sub 2-145
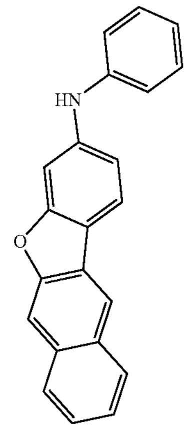
Sub 2-146
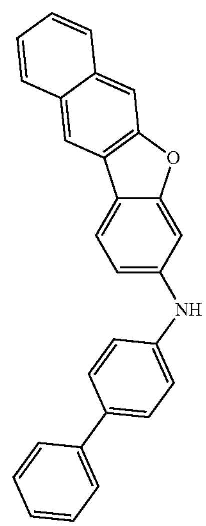
Sub 2-147
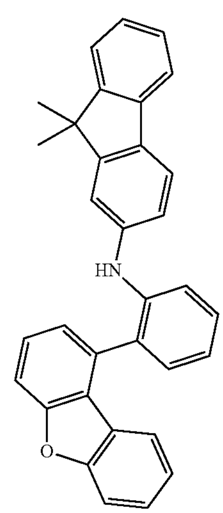

-continued
Sub 2-148
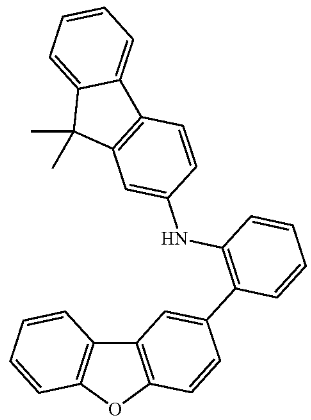
Sub 2-149
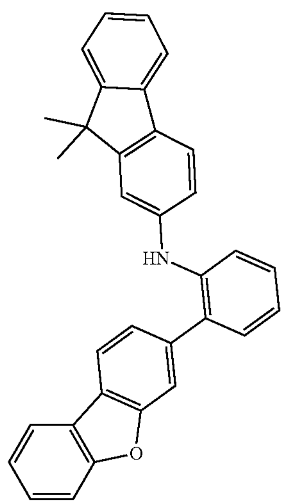
Sub 2-150
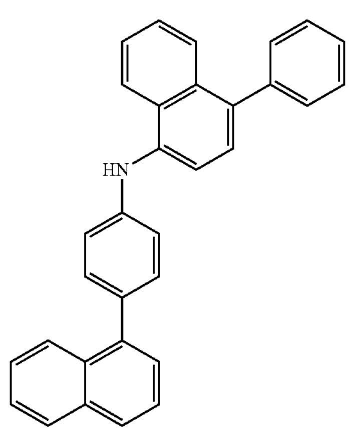
-continued
Sub 2-151
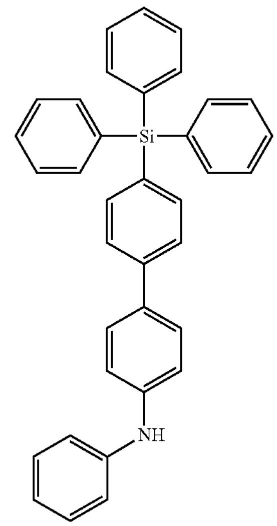
Sub 2-152
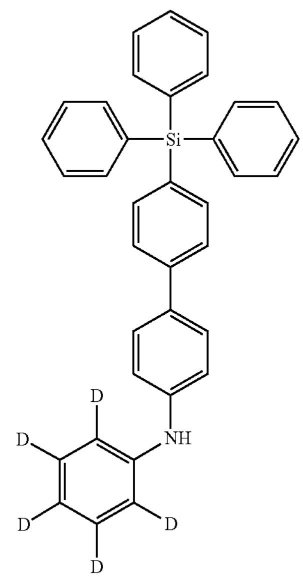
Sub 2-153
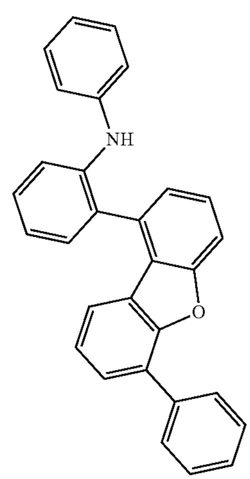

-continued
Sub 2-154
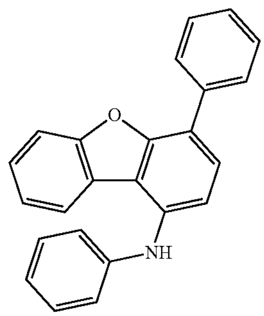
Sub 2-155
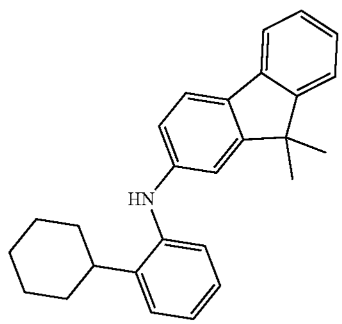
Sub 2-156
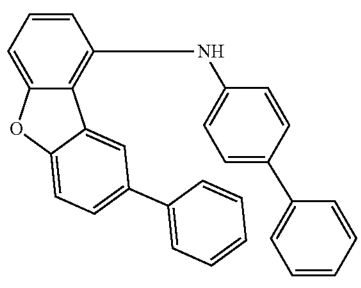
Sub 2-157
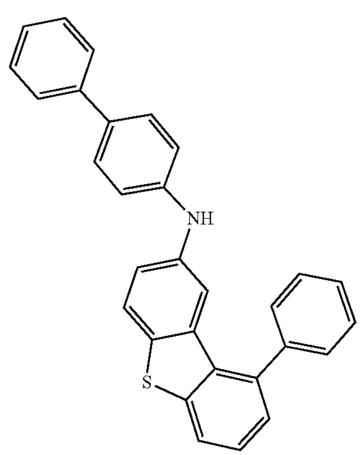
-continued
Sub 2-158
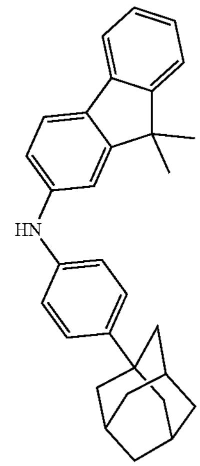
Sub 2-159
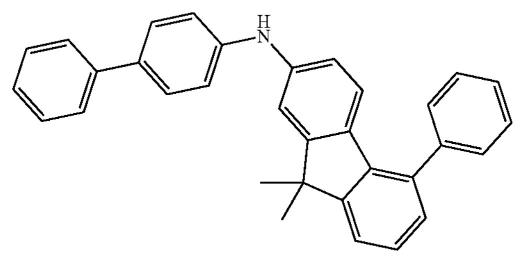
Sub 2-160
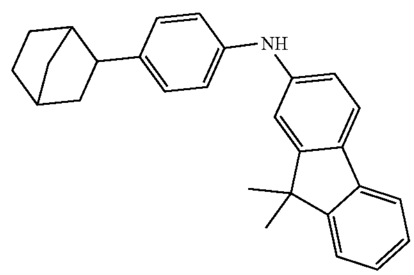
Sub 2-161
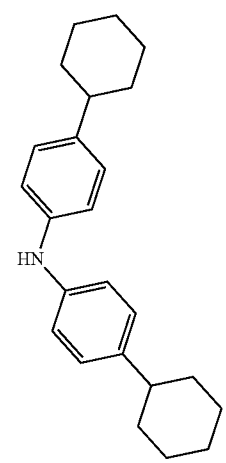

TABLE 5

| Compound | FD-MS | Compound | FD-MS |
|---|---|---|---|
| Sub 2-1 | m/z = 371.17 ($C_{28}H_{21}N$ = 371.48) | Sub 2-2 | m/z = 397.18 ($C_{30}H_{23}N$ = 397.52) |
| Sub 2-3 | m/z = 361.18 ($C_{27}H_{23}N$ = 361.49) | Sub 2-4 | m/z = 410.18 ($C_{30}H_{22}N_2$ = 410.52) |
| Sub 2-5 | m/z = 349.11 ($C_{24}H_{15}NO_2$ = 349.39) | Sub 2-6 | m/z = 349.11 ($C_{24}H_{15}NO_2$ = 349.39) |
| Sub 2-7 | m/z = 375.16 ($C_{27}H_{21}NO$ = 375.47) | Sub 2-8 | m/z = 375.16 ($C_{27}H_{21}NO$ = 375.47) |
| Sub 2-9 | m/z = 361.18 ($C_{27}H_{23}N$ = 361.49) | Sub 2-10 | m/z = 401.21 ($C_{30}H_{27}N$ = 401.55) |
| Sub 2-11 | m/z = 335.13 ($C_{24}H_{17}NO$ = 335.41) | Sub 2-12 | m/z = 347.17 ($C_{26}H_{21}N$ = 347.46) |
| Sub 2-13 | m/z = 526.24 ($C_{39}H_{30}N_2$ = 526.68) | Sub 2-14 | m/z = 335.13 ($C_{24}H_{17}NO$ = 335.41) |
| Sub 2-15 | m/z = 411.2 ($C_{31}H_{25}N$ = 411.55) | Sub 2-16 | m/z = 513.25 ($C_{39}H_{31}N$ = 513.68) |
| Sub 2-17 | m/z = 473.21 ($C_{36}H_{27}N$ = 473.62) | Sub 2-18 | m/z = 423.2 ($C_{32}H_{25}N$ = 423.56) |
| Sub 2-19 | m/z = 345.15 ($C_{26}H_{19}N$ = 345.45) | Sub 2-20 | m/z = 321.15 ($C_{24}H_{19}N$ = 321.42) |
| Sub 2-21 | m/z = 401.21 ($C_{30}H_{27}N$ = 401.55) | Sub 2-22 | m/z = 321.15 ($C_{24}H_{19}N$ = 321.42) |
| Sub 2-23 | m/z = 345.15 ($C_{26}H_{19}N$ = 345.45) | Sub 2-24 | m/z = 397.18 ($C_{30}H_{23}N$ = 397.52) |
| Sub 2-25 | m/z = 447.2 ($C_{34}H_{25}N$ = 447.58) | Sub 2-26 | m/z = 334.15 ($C_{24}H_{18}N2$ = 334.42) |
| Sub 2-27 | m/z = 411.2 ($C_{31}H_{25}N$ = 411.55) | Sub 2-28 | m/z = 361.18 ($C_{27}H_{23}N$ = 361.49) |
| Sub 2-29 | m/z = 285.15 ($C_{21}H_{19}N$ = 285.39) | Sub 2-30 | m/z = 361.18 ($C_{27}H_{23}N$ = 361.49) |
| Sub 2-31 | m/z = 437.21 ($C_{33}H_{27}N$ = 437.59) | Sub 2-32 | m/z = 437.21 ($C_{33}H_{27}N$ = 437.59) |
| Sub 2-33 | m/z = 437.21 ($C_{33}H_{27}N$ = 437.59) | Sub 2-34 | m/z = 437.21 ($C_{33}H_{27}N$ = 437.59) |
| Sub 2-35 | m/z = 437.21 ($C_{33}H_{27}N$ = 437.59) | Sub 2-36 | m/z = 437.21 ($C_{33}H_{27}N$ = 437.59) |
| Sub 2-37 | m/z = 361.18 ($C_{27}H_{23}N$ = 361.49) | Sub 2-38 | m/z = 411.16 ($C_{30}H_{21}NO$ = 411.50) |
| Sub 2-39 | m/z = 410.18 ($C_{30}H_{22}N2$ = 410.52) | Sub 2-40 | m/z = 503.17 ($C_{36}H_{25}NS$ = 503.66) |
| Sub 2-41 | m/z = 473.21 ($C_{36}H_{27}N$ = 473.62) | Sub 2-42 | m/z = 411.2 ($C_{31}H_{25}N$ = 411.55) |
| Sub 2-43 | m/z = 321.15 ($C_{24}H_{19}N$ = 321.42) | Sub 2-44 | m/z = 401.21 ($C_{30}H_{27}N$ = 401.55) |
| Sub 2-45 | m/z = 361.18 ($C_{27}H_{23}N$ = 361.49) | Sub 2-46 | m/z = 499.23 ($C_{38}H_{29}N$ = 499.66) |
| Sub 2-47 | m/z = 440.13 ($C_{30}H_{20}N2S$ = 440.56) | Sub 2-48 | m/z = 411.2 ($C_{31}H_{25}N$ = 411.55) |
| Sub 2-49 | m/z = 451.19 ($C_{33}H_{25}NO$ = 451.57) | Sub 2-50 | m/z = 440.19 ($C_{31}H_{24}N_2O$ = 440.55) |
| Sub 2-51 | m/z = 499.23 ($C_{38}H_{29}N$ = 499.66) | Sub 2-52 | m/z = 295.14 ($C_{22}H_{17}N$ = 295.39) |
| Sub 2-53 | m/z = 351.2 ($C_{26}H_{25}N$ = 351.49) | Sub 2-54 | m/z = 421.18 ($C_{32}H_{23}N$ = 421.54) |
| Sub 2-55 | m/z = 473.21 ($C_{36}H_{27}N$ = 473.62) | Sub 2-56 | m/z = 513.25 ($C_{39}H_{32}N$ = 513.68) |
| Sub 2-57 | m/z = 397.18 ($C_{30}H_{23}N$ = 397.52) | Sub 2-58 | m/z = 295.14 ($C_{22}H_{17}N$ = 295.39) |
| Sub 2-59 | m/z = 397.18 ($C_{30}H_{23}N$ = 397.52) | Sub 2-60 | m/z = 411.2 ($C_{31}H_{25}N$ = 411.55) |
| Sub 2-61 | m/z = 341.16 ($C_{23}H_{23}NSi$ = 341.53) | Sub 2-62 | m/z = 245.12 ($C_{18}H_{15}N$ = 245.33) |
| Sub 2-63 | m/z = 269.12 ($C_{20}H_{15}N$ = 269.35) | Sub 2-64 | m/z = 459.2 ($C_{35}H_{25}N$ = 459.59) |
| Sub 2-65 | m/z = 485.21 ($C_{37}H_{27}N$ = 485.63) | Sub 2-66 | m/z = 483.2 ($C_{37}H_{25}N$ = 483.61) |
| Sub 2-67 | m/z = 649.28 ($C_{50}H_{35}N$ = 649.84) | Sub 2-68 | m/z = 319.14 ($C_{24}H_{17}N$ = 319.41) |
| Sub 2-69 | m/z = 300.17 ($C_{22}H_{12}D_5N$ = 300.42) | Sub 2-70 | m/z = 485.21 ($C_{37}H_{27}N$ = 485.63) |
| Sub 2-71 | m/z = 361.18 ($C_{27}H_{23}N$ = 361.49) | Sub 2-72 | m/z = 219.1 ($C_{16}H_{13}N$ = 219.29) |
| Sub 2-73 | m/z = 169.09 ($C_{12}H_{11}N$ = 169.23) | Sub 2-74 | m/z = 345.15 ($C_{26}H_{19}N$ = 345.45) |
| Sub 2-75 | m/z = 349.18 ($C_{26}H_{23}N$ = 349.48) | Sub 2-76 | m/z = 421.18 ($C_{32}H_{23}N$ = 421.54) |
| Sub 2-77 | m/z = 421.18 ($C_{32}H_{23}N$ = 421.54) | Sub 2-78 | m/z = 411.2 ($C_{31}H_{25}N$ = 411.55) |
| Sub 2-79 | m/z = 421.18 ($C_{32}H_{23}N$ = 421.54) | Sub 2-80 | m/z = 437.21 ($C_{33}H_{27}N$ = 437.59) |
| Sub 2-81 | m/z = 411.2 ($C_{31}H_{25}N$ = 411.55) | Sub 2-82 | m/z = 361.18 ($C_{27}H_{23}N$ = 361.49) |
| Sub 2-83 | m/z = 437.21 ($C_{33}H_{27}N$ = 437.59) | Sub 2-84 | m/z = 361.18 ($C_{27}H_{23}N$ = 361.49) |
| Sub 2-85 | m/z = 407.17 ($C_{31}H_{21}N$ = 407.52) | Sub 2-86 | m/z = 645.25 ($C_{50}H_{31}N$ = 645.81) |
| Sub 2-87 | m/z = 295.14 ($C_{22}H_{17}N$ = 295.39) | Sub 2-88 | m/z = 326.18 ($C_{24}H_{14}D_5N$ = 326.45) |
| Sub 2-89 | m/z = 371.17 ($C_{28}H_{21}N$ = 371.48) | Sub 2-90 | m/z = 421.18 ($C_{32}H_{23}N$ = 421.54) |
| Sub 2-91 | m/z = 269.12 ($C_{20}H_{15}N$ = 269.35) | Sub 2-92 | m/z = 411.2 ($C_{31}H_{25}N$ = 411.55) |
| Sub 2-93 | m/z = 411.2 ($C_{31}H_{25}N$ = 411.55) | Sub 2-94 | m/z = 483.2 ($C_{37}H_{25}N$ = 483.61) |
| Sub 2-95 | m/z = 219.1 ($C_{16}H_{13}N$ = 219.29) | Sub 2-96 | m/z = 295.14 ($C_{22}H_{17}N$ = 295.39) |
| Sub 2-97 | m/z = 335.17 ($C_{25}H_{21}N$ = 335.45) | Sub 2-98 | m/z = 335.17 ($C_{25}H_{21}N$ = 335.45) |
| Sub 2-99 | m/z = 375.2 ($C_{28}H_{25}N$ = 375.52) | Sub 2-100 | m/z = 366.21 ($C_{27}H_{18}D_5N$ = 366.52) |
| Sub 2-101 | m/z = 411.2 ($C_{31}H_{25}N$ = 411.55) | Sub 2-102 | m/z = 411.2 ($C_{31}H_{25}N$ = 411.55) |
| Sub 2-103 | m/z = 409.18 ($C_{31}H_{23}N$ = 409.53) | Sub 2-104 | m/z = 361.18 ($C_{27}H_{23}N$ = 361.49) |
| Sub 2-105 | m/z = 275.08 ($C_{18}H_{13}NS$ = 275.37) | Sub 2-106 | m/z = 335.13 ($C_{24}H_{17}NO$ = 335.41) |
| Sub 2-107 | m/z = 411.16 ($C_{30}H_{21}NO$ = 411.50) | Sub 2-108 | m/z = 411.16 ($C_{30}H_{21}NO$ = 411.50) |
| Sub 2-109 | m/z = 501.17 ($C_{36}H_{23}NO_2$ = 501.59) | Sub 2-110 | m/z = 335.17 ($C_{25}H_{21}N$ = 335.45) |
| Sub 2-111 | m/z = 351.11 ($C_{24}H_{17}NS$ = 351.47) | Sub 2-112 | m/z = 375.16 ($C_{27}H_{21}NO$ = 375.47) |
| Sub 2-113 | m/z = 220.1 ($C_{15}H_{12}N_2$ = 220.28) | Sub 2-114 | m/z = 437.21 ($C_{33}H_{27}N$ = 437.59) |
| Sub 2-115 | m/z = 486.21 ($C_{36}H_{26}N_2$ = 486.62) | Sub 2-116 | m/z = 325.09 ($C_{22}H_{15}NS$ = 325.43) |

TABLE 5-continued

| Compound | FD-MS | Compound | FD-MS |
|---|---|---|---|
| Sub 2-117 | m/z = 259.1 ($C_{18}H_{13}NO$ = 259.31) | Sub 2-118 | m/z = 411.16 ($C_{30}H_{21}NO$ = 411.50) |
| Sub 2-119 | m/z = 351.11 ($C_{24}H_{17}NS$ = 351.47) | Sub 2-120 | m/z = 297.15 ($C_{22}H_{19}N$ = 297.40) |
| Sub 2-121 | m/z = 457.18 ($C_{35}H_{23}N$ = 457.58) | Sub 2-122 | m/z = 334.15 ($C_{24}H_{18}N_2$ = 334.42) |
| Sub 2-123 | m/z = 295.14 ($C_{22}H_{17}N$ = 295.39) | Sub 2-124 | m/z = 486.21 ($C_{36}H_{26}N_2$ = 486.62) |
| Sub 2-125 | m/z = 461.18 ($C_{34}H_{23}NO$ = 461.56) | Sub 2-126 | m/z = 331.21 ($C_{24}H_9D_{10}N$ = 331.48) |
| Sub 2-127 | m/z = 376.19 ($C_{27}H_{24}N2$ = 376.50) | Sub 2-128 | m/z = 411.16 ($C_{30}H_{21}NO$ = 411.50) |
| Sub 2-129 | m/z = 365.09 ($C_{24}H_{15}NOS$ = 365.45) | Sub 2-130 | m/z = 385.18 ($C_{29}H_{23}N$ = 385.51) |
| Sub 2-131 | m/z = 486.21 ($C_{36}H_{26}N_2$ = 486.62) | Sub 2-132 | m/z = 375.16 ($C_{27}H_{21}NO$ = 375.47) |
| Sub 2-133 | m/z = 246.12 ($C_{17}H_{14}N_2$ = 246.31) | Sub 2-134 | m/z = 259.1 ($C_{18}H_{13}NO$ = 259.31) |
| Sub 2-135 | m/z = 332.13 ($C_{24}H_{16}N_2$ = 332.41) | Sub 2-136 | m/z = 351.11 ($C_{24}H_{17}NS$ = 351.47) |
| Sub 2-137 | m/z = 220.1 ($C_{15}H_{12}N_2$ = 220.28) | Sub 2-138 | m/z = 221.12 ($C_{16}H_{15}N$ = 221.30) |
| Sub 2-139 | m/z = 270.12 ($C_{19}H_{14}N_2$ = 270.34) | Sub 2-140 | m/z = 295.14 ($C_{22}H_{17}N$ = 295.39) |
| Sub 2-141 | m/z = 295.14 ($C_{22}H_{17}N$ = 295.39) | Sub 2-142 | m/z = 371.17 ($C_{28}H_{21}N$ = 371.48) |
| Sub 2-143 | m/z = 410.18 ($C_{30}H_{22}N_2$ = 410.52) | Sub 2-144 | m/z = 411.16 ($C_{30}H_{21}NO$ = 411.5) |
| Sub 2-145 | m/z = 309.12 ($C_{22}H_{15}NO$ = 309.37) | Sub 2-146 | m/z = 385.15 ($C_{28}H_{19}NO$ = 385.47) |
| Sub 2-147 | m/z = 451.19 ($C_{33}H_{25}NO$ = 451.57) | Sub 2-148 | m/z = 451.19 ($C_{33}H_{25}NO$ = 451.57) |
| Sub 2-149 | m/z = 451.19 ($C_{33}H_{25}NO$ = 451.57) | Sub 2-150 | m/z = 421.18 ($C_{32}H_{23}N$ = 421.54) |
| Sub 2-151 | m/z = 503.21 ($C_{36}H_{29}NSi$ = 503.72) | Sub 2-152 | m/z = 508.24 ($C_{36}H_{24}D_5NSi$ = 508.75) |
| Sub 2-153 | m/z = 411.16 ($C_{30}H_{21}NO$ = 411.5) | Sub 2-154 | m/z = 335.13 ($C_{24}H_{17}NO$ = 335.41) |
| Sub 2-155 | m/z = 367.23 ($C_{27}H_{29}N$ = 367.54) | Sub 2-156 | m/z = 411.16 ($C_{30}H_{21}NO$ = 411.50) |
| Sub 2-157 | m/z = 427.14 ($C_{30}H_{21}NS$ = 427.56) | Sub 2-158 | m/z = 419.26 ($C_{31}H_{33}N$ = 419.61) |
| Sub 2-159 | m/z = 437.21 ($C_{33}H_{27}N$ = 437.59) | Sub 2-160 | m/z = 379.23 ($C_{28}H_{29}N$ = 379.55) |
| Sub 2-161 | m/z = 333.25 ($C_{24}H_{31}N$ = 333.52) | | |

III. Synthesis of Final Product

1. Example of Synthesis of P1-4

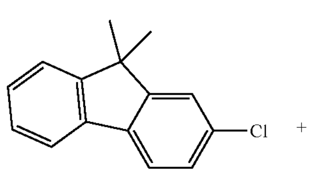

Sub 1-2

-continued

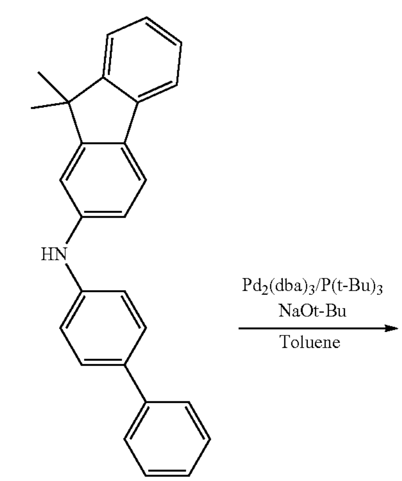

Sub 2-3

-continued

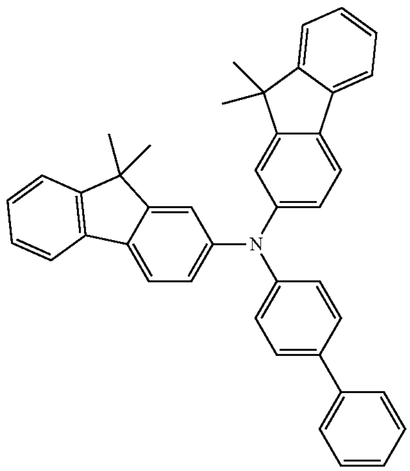

P1-4

Sub 1-2 (10.0 g, 43.7 mmol), Sub 2-3 (15.8 g, 43.7 mmol), $Pd_2(dba)_3$ (1.2 g, 1.3 mmol), $P(t\text{-}Bu)_3$ (0.5 g, 2.6 mmol), NaOt-Bu (8.4 g, 87.4 mmol), and toluene (219 ml) were added to a round bottom flask, and then an experiment was performed in the same manner as Sub 2-73, thereby creating a product in an amount of 17.4 g (yield: 72%).

2. Example of Synthesis of P2-13

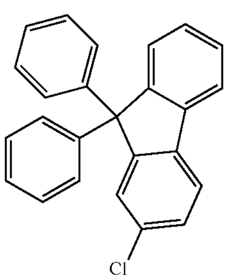

Sub 1-9

+

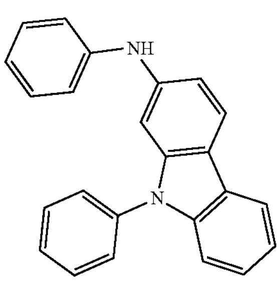

Sub 2-26

$Pd_2(dba)_3/P(t\text{-}Bu)_3$
NaOt-Bu
Toluene

-continued

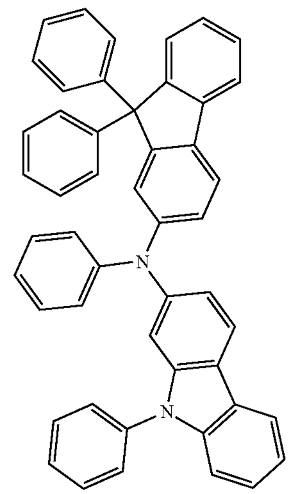

P2-13

Sub 1-9 (10.0 g, 28.3 mmol), Sub 2-26 (9.5 g, 28.3 mmol), $Pd_2(dba)_3$ (0.8 g, 0.9 mmol), $P(t\text{-}Bu)_3$ (0.3 g, 1.7 mmol), NaOt-Bu (5.4 g, 56.7 mmol), and toluene (142 ml) were added to a round bottom flask, and then an experiment was performed in the same manner as Sub 2-73, thereby creating a product in an amount of 13.9 g (yield: 75).

3. Example of Synthesis of P3-15

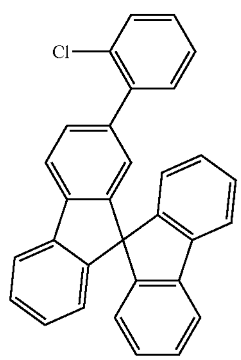

Sub 1-31

+

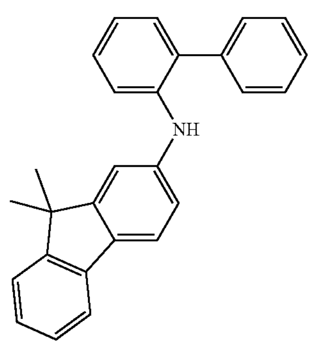

Sub 2-82

$Pd_2(dba)_3/P(t\text{-}Bu)_3$
NaOt-Bu
Toluene

-continued

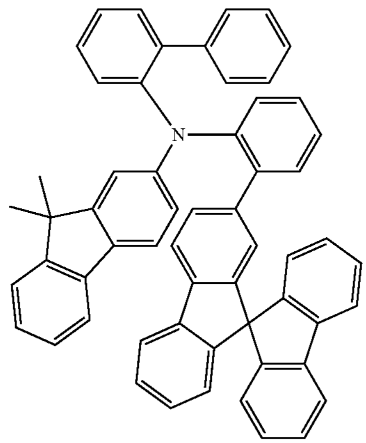

P3-15

Sub 1-31 (10.0 g, 23.4 mmol), Sub 2-82 (8.5 g, 23.4 mmol), $Pd_2(dba)_3$ (0.6 g, 0.7 mmol), $P(t-Bu)_3$ (0.3 g, 1.4 mmol), NaOt-Bu (4.5 g, 46.8 mmol), and toluene (117 ml) were added to a round bottom flask, and then an experiment was performed in the same manner as Sub 2-73, thereby creating a product in an amount of 12.2 g (yield: 69%).

4. Example of Synthesis of P4-21

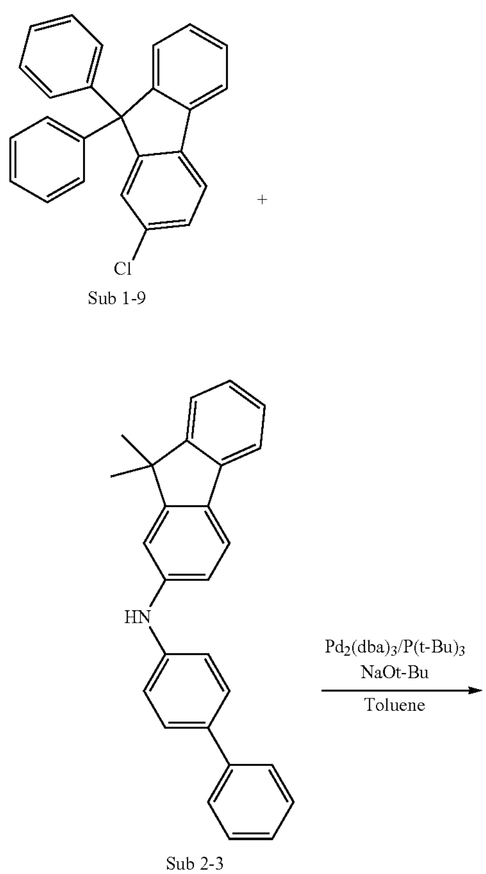

-continued

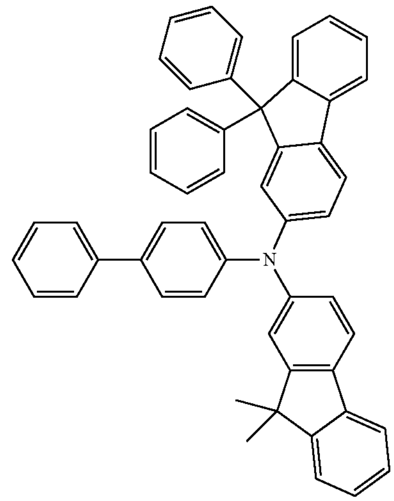

P4-21

Sub 1-9 (10.0 g, 28.3 mmol), Sub 2-3 (10.2 g, 28.3 mmol), $Pd_2(dba)_3$ (0.8 g, 0.9 mmol), $P(t-Bu)_3$ (0.3 g, 1.7 mmol), NaOt-Bu (5.4 g, 56.7 mmol), and toluene (142 ml) were added to a round bottom flask, and then an experiment was performed in the same manner as Sub 2-73, thereby creating a product in an amount of 13.7 g (yield: 72%).

5. Example of Synthesis of P5-38

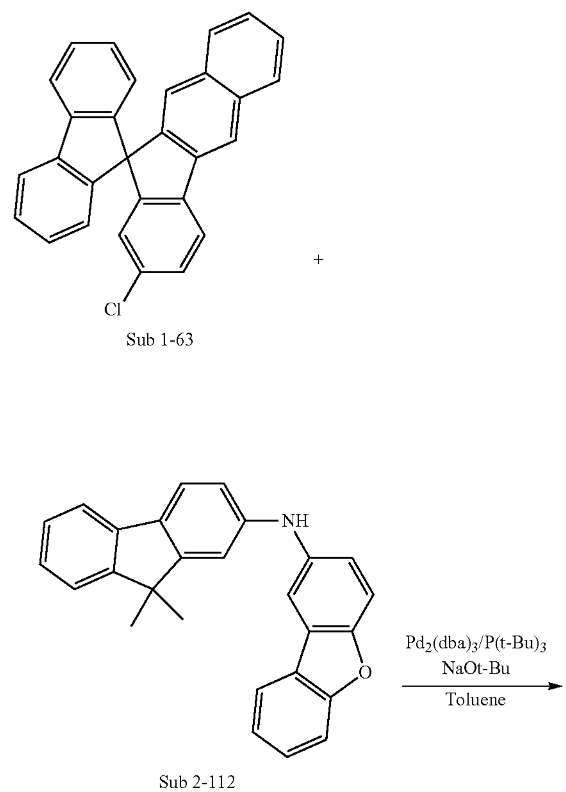

-continued

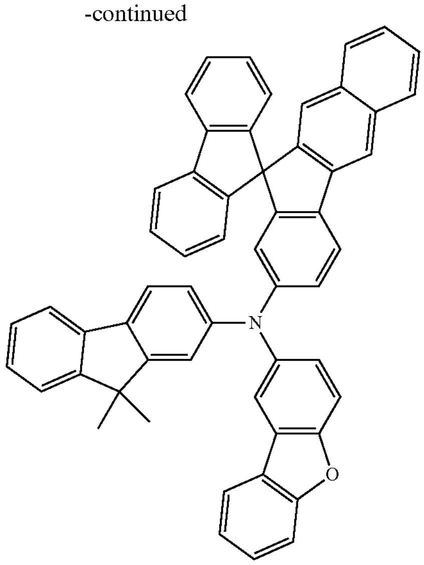

P5-38

Sub 1-63 (10.0 g, 24.9 mmol), Sub 2-112 (9.4 g, 24.9 mmol), $Pd_2(dba)_3$ (0.7 g, 0.8 mmol), $P(t\text{-}Bu)_3$ (0.3 g, 1.5 mmol), NaOt-Bu (4.8 g, 49.9 mmol), and toluene (125 ml) were added to a round bottom flask, and then an experiment was performed in the same manner as Sub 2-73, thereby creating a product in an amount of 13.1 g (yield: 70%).

6. Example of Synthesis of P6-9

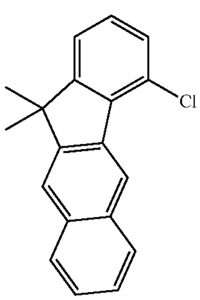

Sub 1-113

+

-continued

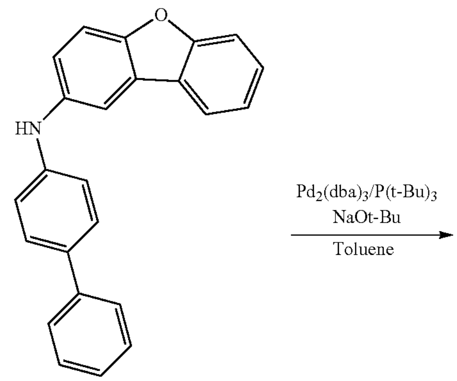

Sub 2-106

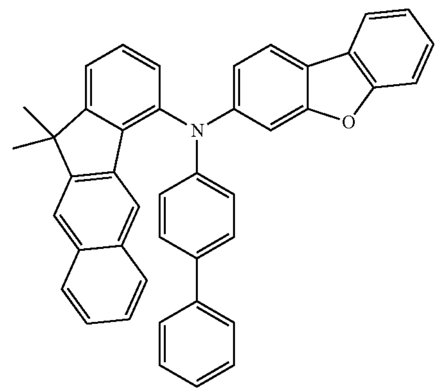

P6-9

Sub 1-113 (10.0 g, 35.9 mmol), Sub 2-106 (12.0 g, 35.9 mmol), $Pd_2(dba)_3$ (1.0 g, 1.1 mmol), $P(t\text{-}Bu)_3$ (0.4 g, 2.2 mmol), NaOt-Bu (6.9 g, 71.7 mmol), and toluene (179 ml) were added to a round bottom flask, and then an experiment was performed in the same manner as Sub 2-73, thereby creating a product in an amount of 15.7 g (yield: 76%).

The FD-MS values of the compounds prepared by the above-described synthesis examples of according to the present disclosure are illustrated in Table 6.

TABLE 6

| Compound | FD-MS | Compound | FD-MS |
|---|---|---|---|
| P1-1 | m/z = 701.31 ($C_{54}H_{39}N$ = 701.91) | P1-2 | m/z = 563.26 ($C_{43}H_{33}N$ = 563.74) |
| P1-3 | m/z = 651.29 ($C_{50}H_{37}N$ = 651.85) | P1-4 | m/z = 553.28 ($C_{42}H_{35}N$ = 553.75) |
| P1-5 | m/z = 553.28 ($C_{42}H_{35}N$ = 553.75) | P1-6 | m/z = 602.27 ($C_{45}H_{34}N_2$ = 602.78) |
| P1-7 | m/z = 541.2 ($C_{39}H_{27}NO_2$ = 541.65) | P1-8 | m/z = 541.2 ($C_{39}H_{27}NO_2$ = 541.65) |
| P1-9 | m/z = 567.26 ($C_{42}H_{33}NO$ = 567.73) | P1-10 | m/z = 567.26 ($C_{42}H_{33}NO$ = 567.73) |
| P1-11 | m/z = 553.28 ($C_{42}H_{35}N$ = 553.75) | P1-12 | m/z = 593.31 ($C_{45}H_{39}N$ = 593.81) |
| P1-13 | m/z = 527.22 ($C_{39}H_{29}NO$ = 527.67) | P1-14 | m/z = 601.28 ($C_{46}H_{35}N$ = 601.79) |
| P1-15 | m/z = 718.33 ($C_{54}H_{42}N_2$ = 718.94) | P1-16 | m/z = 679.29 ($C_{51}H_{37}NO$ = 679.86) |
| P1-17 | m/z = 603.29 ($C_{46}H_{37}N$ = 603.81) | P1-18 | m/z = 705.34 ($C_{54}H_{43}N$ = 705.95) |
| P1-19 | m/z = 727.32 ($C_{56}H_{41}N$ = 727.95) | P1-20 | m/z = 615.29 ($C_{47}H_{37}N$ = 615.82) |
| P2-1 | m/z = 661.28 ($C_{51}H_{35}N$ = 661.85) | P2-2 | m/z = 637.28 ($C_{49}H_{35}N$ = 637.83) |
| P2-2 | m/z = 677.31 ($C_{52}H_{39}N$ = 677.89) | P2-4 | m/z = 717.34 ($C_{55}H_4N$ = 717.96) |
| P2-3 | m/z = 717.34 ($C_{55}H_{43}N$ = 717.96) | P2-6 | m/z = 637.28 ($C_{49}H_{35}N$ = 637.83) |
| P2-4 | m/z = 637.28 ($C_{49}H_{35}N$ = 637.83) | P2-8 | m/z = 599.26 ($C_{46}H_{33}N$ = 599.78) |
| P2-5 | m/z = 651.29 ($C_{50}H_{37}N$ = 651.85) | P2-10 | m/z = 701.31 ($C_{54}H_{39}N$ = 701.91) |
| P2-6 | m/z = 651.26 ($C_{49}H_{33}NO$ = 651.81) | P2-12 | m/z = 665.24 ($C_{49}H_{31}NO_2$ = 665.79) |
| P2-7 | m/z = 650.27 ($C_{49}H_{34}N_2$ = 650.83) | P2-14 | m/z = 727.32 ($C_{56}H_{41}N$ = 727.95) |
| P2-8 | m/z = 677.31 ($C_{52}H_{39}N$ = 677.89) | P2-16 | m/z = 677.31 ($C_{52}H_{39}N$ = 677.89) |

TABLE 6-continued

| Compound | FD-MS | Compound | FD-MS |
|---|---|---|---|
| P2-9 | m/z = 753.34 ($C_{58}H_{43}N$ = 753.99) | P2-18 | m/z = 753.34 ($C_{58}H_{43}N$ = 753.99) |
| P2-10 | m/z = 753.34 ($C_{58}H_{43}N$ = 753.99) | P2-20 | m/z = 753.34 ($C_{58}H_{43}N$ = 753.99) |
| P2-11 | m/z = 753.34 ($C_{58}H_{43}N$ = 753.99) | P2-22 | m/z = 753.34 ($C_{58}H_{43}N$ = 753.99) |
| P2-12 | m/z = 753.34 ($C_{58}H_{43}N$ = 753.99) | P2-24 | m/z = 753.34 ($C_{58}H_{43}N$ = 753.99) |
| P2-13 | m/z = 753.34 ($C_{58}H_{43}N$ = 753.99) | P2-26 | m/z = 753.34 ($C_{58}H_{43}N$ = 753.99) |
| P2-14 | m/z = 753.34 ($C_{58}H_{43}N$ = 753.99) | P2-28 | m/z = 753.34 ($C_{58}H_{43}N$ = 753.99) |
| P2-15 | m/z = 753.34 ($C_{58}H_{43}N$ = 753.99) | P2-30 | m/z = 753.34 ($C_{58}H_{43}N$ = 753.99) |
| P2-16 | m/z = 753.34 ($C_{58}H_{43}N$ = 753.99) | P2-32 | m/z = 753.34 ($C_{58}H_{43}N$ = 753.99) |
| P2-17 | m/z = 753.34 ($C_{58}H_{43}N$ = 753.99) | P2-34 | m/z = 753.34 ($C_{58}H_{43}N$ = 753.99) |
| P2-18 | m/z = 753.34 ($C_{58}H_{43}N$ = 753.99) | P2-36 | m/z = 665.27 ($C_{50}H_{35}NO$ = 665.84) |
| P2-19 | m/z = 714.3 ($C_{54}H_{38}N2$ = 714.91) | P2-38 | m/z = 819.3 ($C_{61}H_{41}NS$ = 820.07) |
| P2-20 | m/z = 839.36 ($C_{65}H_{45}N$ = 840.08) | P2-40 | m/z = 853.37 ($C_{66}H_{47}N$ = 854.11) |
| P3-1 | m/z = 635.26 ($C_{49}H_{33}N$ = 635.81) | P3-2 | m/z = 675.29 ($C_{52}H_{37}N$ = 675.88) |
| P3-3 | m/z = 715.32 ($C_{55}H_{41}N$ = 715.94) | P3-4 | m/z = 715.32 ($C_{55}H_{41}N$ = 715.94) |
| P3-5 | m/z = 689.27 ($C_{52}H_{35}NO$ = 689.86) | P3-6 | m/z = 663.22 ($C_{49}H_{29}NO_2$ = 663.78) |
| P3-7 | m/z = 649.24 ($C_{49}H_{31}NO$ = 649.79) | P3-8 | m/z = 675.29 ($C_{52}H_{37}N$ = 675.88) |
| P3-9 | m/z = 813.34 ($C_{63}H_{43}N$ = 814.04) | P3-10 | m/z = 830.28 ($C_{61}H_3N_2S$ = 831.05) |
| P3-11 | m/z = 725.31 ($C_{56}H_{39}N$ = 725.94) | P3-12 | m/z = 725.31 ($C_{56}H_{39}N$ = 725.94) |
| P3-13 | m/z = 765.3 ($C_{58}H_{39}NO$ = 765.96) | P3-14 | m/z = 751.32 ($C_{58}H_{41}N$ = 751.97) |
| P3-15 | m/z = 751.32 ($C_{58}H_{41}N$ = 751.97) | P3-16 | m/z = 751.32 ($C_{58}H_{41}N$ = 751.97) |
| P3-17 | m/z = 751.32 ($C_{58}H_{41}N$ = 751.97) | P3-18 | m/z = 751.32 ($C_{58}H_{41}N$ = 751.97) |
| P3-19 | m/z = 751.32 ($C_{58}H_{41}N$ = 751.97) | P3-20 | m/z = 751.32 ($C_{58}H_{41}N$ = 751.97) |
| P3-21 | m/z = 751.32 ($C_{58}H_{41}N$ = 751.97) | P3-22 | m/z = 751.32 ($C_{58}H_{41}N$ = 751.97) |
| P3-23 | m/z = 751.32 ($C_{58}H_{41}N$ = 751.97) | P3-24 | m/z = 751.32 ($C_{58}H_{41}N$ = 751.97) |
| P3-25 | m/z = 675.29 ($C_{52}H_{37}N$ = 675.88) | P3-26 | m/z = 751.32 ($C_{58}H_{41}N$ = 751.97) |
| P3-27 | m/z = 804.31 ($C_{60}H_{40}N_2O$ = 804.99) | P3-28 | m/z = 863.36 ($C_{67}H_{45}N$ = 864.10) |
| P3-29 | m/z = 677.25 ($C_{51}H_{32}FN$ = 677.82) | P3-30 | m/z = 765.34 ($C_{59}H_{43}N$ = 766.00) |
| P4-1 | m/z = 513.25 ($C_{39}H_{31}N$ = 513.68) | P4-2 | m/z = 613.28 ($C_{47}H_{35}N$ = 613.80) |
| P4-3 | m/z = 665.31 ($C_{51}H_{39}N$ = 665.88) | P4-4 | m/z = 705.34 ($C_{54}H_{43}N$ = 705.95) |
| P4-5 | m/z = 593.31 ($C_{45}H_{39}N$ = 593.81) | P4-6 | m/z = 589.28 ($C_{45}H_{35}N$ = 589.78) |
| P4-7 | m/z = 513.25 ($C_{39}H_{31}N$ = 513.68) | P4-8 | m/z = 639.29 ($C_{49}H_{37}N$ = 639.84) |
| P4-9 | m/z = 589.28 ($C_{45}H_{35}N$ = 589.78) | P4-10 | m/z = 665.31 ($C_{51}H_{39}N$ = 665.88) |
| P4-11 | m/z = 553.28 ($C_{42}H_{35}N$ = 553.75) | P4-12 | m/z = 669.34 ($C_{51}H_{43}N$ = 669.91) |
| P4-13 | m/z = 779.36 ($C_{60}H_{45}N$ = 780.03) | P4-14 | m/z = 761.35 ($C_{56}H_{47}NSi$ = 762.08) |
| P4-15 | m/z = 705.34 ($C_{54}H_{43}N$ = 705.95) | P4-16 | m/z = 589.28 ($C_{45}H_{35}N$ = 589.78) |
| P4-17 | m/z = 665.31 ($C_{51}H_{39}N$ = 665.88) | P4-18 | m/z = 661.28 ($C_{51}H_{35}N$ = 661.85) |
| P4-19 | m/z = 637.28 ($C_{49}H_{35}N$ = 637.83) | P4-20 | m/z = 789.34 ($C_{61}H_{43}N$ = 790.02) |
| P4-21 | m/z = 677.31 ($C_{52}H_{39}N$ = 677.89) | P4-22 | m/z = 775.32 ($C_{60}H_{41}N$ = 776.00) |
| P4-23 | m/z = 801.34 ($C_{62}H_{43}N$ = 802.03) | P4-24 | m/z = 799.32 ($C_{62}H_{41}N$ = 800.02) |
| P4-25 | m/z = 965.4 ($C_{75}H_{51}N$ = 966.24) | P4-26 | m/z = 637.28 ($C_{49}H_{35}N$ = 637.83) |
| P4-27 | m/z = 635.26 ($C_{49}H_{33}N$ = 635.81) | P4-28 | m/z = 616.29 ($C_{47}H_{28}D_5N$ = 616.82) |
| P4-29 | m/z = 727.32 ($C_{56}H_{41}N$ = 727.95) | P4-30 | m/z = 687.29 ($C_{53}H_{37}N$ = 687.89) |
| P4-31 | m/z = 877.37 ($C_{68}H_{47}N$ = 878.13) | P4-32 | m/z = 753.34 ($C_{58}H_{43}N$ = 753.99) |
| P4-33 | m/z = 689.31 ($C_{53}H_{39}N$ = 689.90) | P4-34 | m/z = 637.28 ($C_{49}H_{35}N$ = 637.83) |
| P4-35 | m/z = 849.32 ($C_{63}H_{41}F_2N$ = 850.02) | P4-36 | m/z = 559.23 ($C_{43}H_{29}N$ = 559.71) |
| P4-37 | m/z = 635.26 ($C_{49}H_{33}N$ = 635.81) | P4-38 | m/z = 663.29 ($C_{51}H_{37}N$ = 663.86) |
| P4-39 | m/z = 735.29 ($C_{57}H_{37}N$ = 735.93) | P4-40 | m/z = 735.29 ($C_{57}H_{37}N$ = 735.93) |
| P4-41 | m/z = 725.31 ($C_{56}H_{39}N$ = 725.94) | P4-42 | m/z = 735.29 ($C_{57}H_{37}N$ = 735.93) |
| P4-43 | m/z = 751.32 ($C_{58}H_{41}N$ = 751.97) | P4-44 | m/z = 725.31 ($C_{56}H_{39}N$ = 725.94) |
| P4-45 | m/z = 675.29 ($C_{52}H_{37}N$ = 675.88) | P4-46 | m/z = 675.29 ($C_{52}H_{37}N$ = 675.88) |
| P4-47 | m/z = 751.32 ($C_{58}H_{41}N$ = 751.97) | P4-48 | m/z = 675.29 ($C_{52}H_{37}N$ = 675.88) |
| P4-49 | m/z = 721.28 ($C_{56}H_{35}N$ = 721.9) | P4-50 | m/z = 797.31 ($C_{62}H_{39}N$ = 798.00) |
| P4-51 | m/z = 959.36 ($C_{75}H_{45}N$ = 960.19) | P4-52 | m/z = 609.25 ($C_{47}H_{31}N$ = 609.77) |
| P4-53 | m/z = 675.29 ($C_{52}H_{37}N$ = 675.88) | P4-54 | m/z = 635.26 ($C_{49}H_{33}N$ = 635.81) |
| P4-55 | m/z = 640.29 ($C_{49}H_{28}D_5N$ = 640.84) | P4-56 | m/z = 685.28 ($C_{53}H_{35}N$ = 685.87) |
| P4-57 | m/z = 735.29 ($C_{57}H_{37}N$ = 735.93) | P4-58 | m/z = 583.23 ($C_{45}H_{29}N$ = 583.73) |
| P4-59 | m/z = 725.31 ($C_{56}H_{39}N$ = 725.94) | P4-60 | m/z = 725.31 ($C_{56}H_{39}N$ = 725.94) |
| P4-61 | m/z = 635.26 ($C_{49}H_{33}N$ = 635.81) | P4-62 | m/z = 751.32 ($C_{58}H_{41}N$ = 751.97) |
| P4-63 | m/z = 751.32 ($C_{58}H_{41}N$ = 751.97) | P4-64 | m/z = 751.32 ($C_{58}H_{41}N$ = 751.97) |
| P4-65 | m/z = 751.32 ($C_{58}H_{41}N$ = 751.97) | P4-66 | m/z = 751.32 ($C_{58}H_{41}N$ = 751.97) |
| P4-67 | m/z = 873.34 ($C_{68}H_{43}N$ = 874.10) | P4-68 | m/z = 711.29 ($C_{55}H_{37}N$ = 711.91) |
| P4-69 | m/z = 751.32 ($C_{58}H_{41}N$ = 751.97) | P4-70 | m/z = 787.32 ($C_{61}H_{41}N$ = 788.01) |
| P4-71 | m/z = 751.32 ($C_{58}H_{41}N$ = 751.97) | P4-72 | m/z = 793.46 ($C_{60}H_{59}N$ = 794.14) |
| P4-73 | m/z = 725.27 ($C_{55}H_{35}NO$ = 725.89) | P4-74 | m/z = 823.33 ($C_{61}H_{45}NS$ = 824.10) |
| P4-75 | m/z = 734.00 ($C_{56}H_{47}N$ = 733.37) | P4-76 | m/z = 751.32 ($C_{58}H_{41}N$ = 751.97) |
| P4-77 | m/z = 693.34 ($C_{53}H_{43}N$ = 693.93) | P4-78 | m/z = 647.36 ($C_{49}H_{45}N$ = 647.91) |
| P5-1 | m/z = 583.23 ($C_{45}H_{29}N$ = 583.73) | P5-2 | m/z = 609.25 ($C_{47}H_{31}N$ = 609.77) |
| P5-3 | m/z = 685.28 ($C_{53}H_{35}N$ = 685.87) | P5-4 | m/z = 659.26 ($C_{51}H_{33}N$ = 659.83) |
| P5-5 | m/z = 609.25 ($C_{47}H_{31}N$ = 609.77) | P5-6 | m/z = 685.28 ($C_{53}H_{35}N$ = 685.87) |
| P5-7 | m/z = 664.29 ($C_{51}H_{28}D_5N$ = 664.86) | P5-8 | m/z = 649.28 ($C_{50}H_{35}N$ = 649.84) |
| P5-9 | m/z = 649.28 ($C_{50}H_{35}N$ = 649.84) | P5-10 | m/z = 699.29 ($C_{54}H_{37}N$ = 699.90) |
| P5-11 | m/z = 725.31 ($C_{56}H_{39}N$ = 725.94) | P5-12 | m/z = 739.32 ($C_{57}H_{41}N$ = 739.96) |
| P5-13 | m/z = 730.34 ($C_{56}H_{34}D_5N$ = 730.97) | P5-14 | m/z = 775.32 ($C_{6O}H_{41}N$ = 776.00) |
| P5-15 | m/z = 775.32 ($C_{60}H_{41}N$ = 776.00) | P5-16 | m/z = 775.32 ($C_{6O}H_{41}N$ = 776.00) |
| P5-17 | m/z = 725.31 ($C_{56}H_{39}N$ = 725.94) | P5-18 | m/z = 773.31 ($C_{6O}H_{39}N$ = 773.98) |
| P5-19 | m/z = 725.31 ($C_{56}H_{39}N$ = 725.94) | P5-20 | m/z = 774.3 ($C_{59}H_{38}N_2$ = 774.97) |
| P5-21 | m/z = 639.2 ($C_{47}H_{29}NS$ = 639.82) | P5-22 | m/z = 699.26 ($C_{53}H_{33}NO$ = 699.85) |
| P5-23 | m/z = 775.29 ($C_{59}H_{37}NO$ = 775.95) | P5-24 | m/z = 775.29 ($C_{59}H_{37}NO$ = 775.95) |

TABLE 6-continued

| Compound | FD-MS | Compound | FD-MS |
|---|---|---|---|
| P5-25 | m/z = 865.3 ($C_{65}H_{39}NO_2$ = 866.03) | P5-26 | m/z = 583.23 ($C_{45}H_{29}N$ = 583.73) |
| P5-27 | m/z = 685.28 ($C_{53}H_{35}N$ = 685.87) | P5-28 | m/z = 649.28 ($C_{50}H_{35}N$ = 649.84) |
| P5-29 | m/z = 699.29 ($C_{54}H_{37}N$ = 699.90) | P5-30 | m/z = 725.31 ($C_{56}H_{39}N$ = 725.94) |
| P5-31 | m/z = 725.31 ($C_{56}H_{39}N$ = 725.94) | P5-32 | m/z = 775.32 ($C_{60}H_{41}N$ = 776.00) |
| P5-33 | m/z = 775.32 ($C_{60}H_{41}N$ = 776.00) | P5-34 | m/z = 775.32 ($C_{60}H_{41}N$ = 776.00) |
| P5-35 | m/z = 699.29 ($C_{54}H_{37}N$ = 699.90) | P5-36 | m/z = 773.31 ($C_{60}H_{39}N$ = 773.98) |
| P5-37 | m/z = 715.23 ($C_{53}H_{33}NS$ = 715.91) | P5-38 | m/z = 739.29 ($C_{56}H_{37}NO$ = 739.92) |
| P5-39 | m/z = 699.26 ($C_{53}H_{33}NO$ = 699.85) | P5-40 | m/z = 661.25 ($C_{49}H_{31}N_3$ = 661.81) |
| P5-41 | m/z = 685.28 ($C_{53}H_{35}N$ = 685.87) | P5-42 | m/z = 685.28 ($C_{53}H_{35}N$ = 685.87) |
| P5-43 | m/z = 633.25 ($C_{49}H_{31}N$ = 633.79) | P5-44 | m/z = 649.28 ($C_{50}H_{35}N$ = 649.84) |
| P5-45 | m/z = 725.31 ($C_{56}H_{39}N$ = 725.94) | P5-46 | m/z = 725.31 ($C_{56}H_{39}N$ = 725.94) |
| P5-47 | m/z = 801.34 ($C_{62}H_{43}N$ = 802.03) | P5-48 | m/z = 725.31 ($C_{56}H_{39}N$ = 725.94) |
| P5-49 | m/z = 849.34 ($C_{66}H_{43}N$ = 850.08) | P5-50 | m/z = 850.33 ($C_{65}H_{42}N_2$ = 851.07) |
| P5-51 | m/z = 689.22 ($C_{51}H_{31}NS$ = 689.88) | P5-52 | m/z = 623.22 ($C_{47}H_{29}NO$ = 623.76) |
| P5-53 | m/z = 775.29 ($C_{59}H_{37}NO$ = 775.95) | P5-54 | m/z = 699.26 ($C_{53}H_{33}NO$ = 699.85) |
| P5-55 | m/z = 715.23 ($C_{53}H_{33}NS$ = 715.91) | P5-56 | m/z = 690.31 ($C_{53}H_{30}D_5N$ = 690.90) |
| P5-57 | m/z = 787.32 ($C_{61}H_{41}N$ = 788.01) | P5-58 | m/z = 699.29 ($C_{54}H_{37}N$ = 699.90) |
| P5-59 | m/z = 725.31 ($C_{56}H_{39}N$ = 725.94) | P5-60 | m/z = 715.23 ($C_{53}H_{33}NS$ = 715.91) |
| P5-61 | m/z = 633.25 ($C_{49}H_{31}N$ = 633.79) | P5-62 | m/z = 583.23 ($C_{45}H_{29}N$ = 583.73) |
| P5-63 | m/z = 865.33 ($C_{66}H_{43}NO$ = 866.08) | P5-64 | m/z = 821.31 ($C_{64}H_{39}N$ = 822.02) |
| P5-65 | m/z = 698.27 ($C_{53}H_{34}N_2$ = 698.87) | P5-66 | m/z = 659.26 ($C_{51}H_{33}N$ = 659.83) |
| P5-67 | m/z = 649.28 ($C_{50}H_{35}N$ = 649.84) | P5-68 | m/z = 849.34 ($C_{66}H_{43}N$ = 850.08) |
| P5-69 | m/z = 850.33 ($C_{65}H_{42}N_2$ = 851.07) | P5-70 | m/z = 825.3 ($C_{63}H_{39}NO$ = 826.01) |
| P5-71 | m/z = 583.23 ($C_{45}H_{29}N$ = 583.73) | P5-72 | m/z = 685.28 ($C_{53}H_{35}N$ = 685.87) |
| P5-73 | m/z = 695.34 ($C_{53}H_{25}D_{10}N$ = 695.93) | P5-74 | m/z = 699.29 ($C_{54}H_{37}N$ = 699.90) |
| P5-75 | m/z = 725.31 ($C_{56}H_{39}N$ = 725.94) | P5-76 | m/z = 775.32 ($C_{60}H_{41}N$ = 776.00) |
| P5-77 | m/z = 725.31 ($C_{56}H_{39}N$ = 725.94) | P5-78 | m/z = 849.34 ($C_{66}H_{43}N$ = 850.08) |
| P5-79 | m/z = 765.31 ($C_{57}H_{39}N_3$ = 765.96) | P5-80 | m/z = 775.29 ($C_{59}H_{37}NO$ = 775.95) |
| P5-81 | m/z = 685.28 ($C_{53}H_{35}N$ = 685.87) | P5-82 | m/z = 609.25 ($C_{47}H_{31}N$ = 609.77) |
| P5-83 | m/z = 785.31 ($C_{61}H_{39}N$ = 785.99) | P5-84 | m/z = 725.31 ($C_{56}H_{39}N$ = 725.94) |
| P5-85 | m/z = 729.21 ($C_{53}H_{31}NOS$ = 729.90) | P5-86 | m/z = 583.23 ($C_{45}H_{29}N$ = 583.73) |
| P5-87 | m/z = 685.28 ($C_{53}H_{35}N$ = 685.87) | P5-88 | m/z = 735.29 ($C_{57}H_{37}N$ = 735.93) |
| P5-89 | m/z = 685.28 ($C_{53}H_{35}N$ = 685.87) | P5-90 | m/z = 685.28 ($C_{53}H_{35}N$ = 685.87) |
| P5-91 | m/z = 725.31 ($C_{56}H_{39}N$ = 725.94) | P5-92 | m/z = 749.31 ($C_{58}H_{39}N$ = 749.96) |
| P5-93 | m/z = 725.31 ($C_{56}H_{39}N$ = 725.94) | P5-94 | m/z = 725.31 ($C_{56}H_{39}N$ = 725.94) |
| P5-95 | m/z = 725.31 ($C_{56}H_{39}N$ = 725.94) | P5-96 | m/z = 773.31 ($C_{60}H_{39}N$ = 773.98) |
| P5-97 | m/z = 850.33 ($C_{65}H_{42}N_2$ = 851.07) | P5-98 | m/z = 699.26 ($C_{53}H_{33}NO$ = 699.85) |
| P5-99 | m/z = 715.23 ($C_{53}H_{33}NS$ = 715.91) | P5-100 | m/z = 739.29 ($C_{56}H_{37}NO$ = 739.92) |
| P5-101 | m/z = 709.28 ($C_{55}H_{35}N$ = 709.89) | P5-102 | m/z = 749.31 ($C_{58}H_{39}N$ = 749.96) |
| P5-103 | m/z = 901.37 ($C_{70}H_{47}N$ = 902.15) | P5-104 | m/z = 660.26 ($C_{50}H_{32}N_2$ = 660.82) |
| P5-105 | m/z = 673.24 ($C_{51}H_{31}NO$ = 673.82) | P5-106 | m/z = 685.28 ($C_{53}H_{35}N$ = 685.87) |
| P5-107 | m/z = 775.32 ($C_{60}H_{41}N$ = 776.00) | P5-108 | m/z = 772.29 ($C_{59}H_{36}N_2$-772.95) |
| P5-109 | m/z = 685.28 ($C_{53}H_{35}N$ = 685.87) | P5-110 | m/z = 941.31 ($C_{71}H_{43}NS$ = 942.19) |
| P5-111 | m/z = 836.32 ($C_{64}H_{40}N_2$ = 837.04) | P5-112 | m/z = 913.35 ($C_{69}H_{43}N_3$ = 914.12) |
| P5-113 | m/z = 800.28 ($C_{60}H_{36}N_2O$ = 800.96) | P5-114 | m/z = 841.28 ($C_{63}H_{39}NS$ = 842.07) |
| P5-115 | m/z = 877.37 ($C_{68}H_{47}N$ = 878.13) | | |
| P6-1 | m/z = 713.31 ($C_{55}H_{39}N$ = 713.92) | P6-2 | m/z = 589.28 ($C_{45}H_{35}N$ = 589.78) |
| P6-3 | m/z = 639.29 ($C_{49}H_{37}N$ = 639.84) | P6-4 | m/z = 613.28 ($C_{47}H_{35}N$ = 613.80) |
| P6-5 | m/z = 625.28 ($C_{48}H_{35}N$ = 625.82) | P6-6 | m/z = 714.3 ($C_{54}H_{38}N_2$ = 714.91) |
| P6-7 | m/z = 715.29 ($C_{54}H_{37}NO$ = 715.9) | P6-8 | m/z = 627.26 ($C_{47}H_{33}NO$ = 627.79) |
| P6-9 | m/z = 577.24 ($C_{43}H_{31}NO$ = 577.73) | P6-10 | m/z = 593.22 ($C_{43}H_{31}NS$ = 593.79) |
| P6-11 | m/z = 577.24 ($C_{43}H_{31}NO$ = 577.73) | P6-12 | m/z = 627.26 ($C_{47}H_{33}NO$ = 627.79) |
| P6-13 | m/z = 679.32 ($C_{52}H_{41}N$ = 679.91) | P6-14 | m/z = 651.29 ($C_{50}H_{37}N$ = 651.85) |
| P6-15 | m/z = 725.31 ($C_{56}H_{39}N$ = 725.94) | P6-16 | m/z = 725.31 ($C_{56}H_{39}N$ = 725.94) |
| P6-17 | m/z = 677.31 ($C_{52}H_{39}N$ = 677.89) | P6-18 | m/z = 601.28 ($C_{46}H_{35}N$ = 601.79) |
| P6-19 | m/z = 691.29 ($C_{52}H_{37}NO$ = 691.87) | P6-20 | m/z = 691.29 ($C_{52}H_{37}NO$ = 691.87) |
| P6-21 | m/z = 691.29 ($C_{52}H_{37}NO$ = 691.87) | P6-22 | m/z = 689.27 ($C_{52}H_{35}NO$ = 689.86) |
| P6-23 | m/z = 767.32 ($C_{58}H_{41}NO$ = 767.97) | P6-24 | m/z = 767.32 ($C_{58}H_{41}NO$ = 767.97) |
| P6-25 | m/z = 767.32 ($C_{58}H_{41}NO$ = 767.97) | P6-26 | m/z = 765.3 ($C_{58}H_{39}NO$ = 765.96) |
| P6-27 | m/z = 737.31 ($C_{57}H_{39}N$ = 737.95) | P6-28 | m/z = 713.31 ($C_{55}H_{39}N$ = 713.92) |
| P6-29 | m/z = 637.28 ($C_{49}H_{35}N$ = 637.83) | P6-30 | m/z = 819.33 ($C_{61}H_{45}NSi$ = 820.12) |
| P6-31 | m/z = 824.36 ($C_{61}H_{40}D_5NSi$ = 825.15) | P6-32 | m/z = 725.31 ($C_{56}H_{39}N$ = 725.94) |
| P6-33 | m/z = 727.32 ($C_{56}H_{41}N$ = 727.95) | P6-34 | m/z = 751.32 ($C_{58}H_{41}N$ = 751.97) |
| P6-35 | m/z = 751.32 ($C_{58}H_{41}N$ = 751.97) | P6-36 | m/z = 603.26 ($C_{45}H_{33}NO$ = 603.77) |
| P6-37 | m/z = 767.32 ($C_{58}H_{41}NO$ = 767.97) | P6-38 | m/z = 726.3 ($C_{55}H_{38}N_2$ = 726.92) |
| P6-39 | m/z = 651.26 ($C_{49}H_{33}NO$ = 651.81) | | |

Evaluation of Fabrication of Organic Electronic Device

When the organic electronic device according to the present disclosure is a top-emission device and the anode is formed on the substrate before the organic material layer and the cathode are formed, the anode material may be implemented as not only a transparent material but also an opaque material having superior light reflectivity.

When the organic electronic device according to the present disclosure is a bottom-emission device and the anode is formed on the substrate before the organic material layer and the cathode are formed, the anode material should be implemented as a transparent material or, when formed of an opaque material, provided as a thin film as thin as possible so as to be transparent.

Hereinafter, the following Examples will be proposed by fabricating a top-emission tandem organic electronic device, but embodiments of the present disclosure are not limited thereto. The tandem organic electronic device according to an embodiment of the present disclosure is fabricated such that a plurality of stacks are connected through one or more charge generation layers. Although the same compound has been used for the hole transport layers of each of the three stacks in the tandem organic electronic device according to an embodiment of the present disclosure, the present disclosure is not limited thereto.

[Example 180] Tandem Organic Electronic Device with Three Stacks Connected

A tandem organic electronic device including three stacks connected were fabricated with a structure of first electrode (anode)/first hole transport region/first emission layer/first electron transport region/charge generation layer/second hole transport region/second emission layer/second electron transport region/charge generation layer/third hole transport region/third emission layer/third electron transport region/electron injection layer/second electrode (cathode).

Specifically, a hole injection layer was formed by vacuum-depositing 4,4',4"-Tris [2-naphthyl(phenyl)amino] triphenylamine (hereinafter, abbreviated as TNATA) at a thickness of 60 nm an anode formed on a glass substrate, a first hole transport layer of a first stack was formed at a thickness of 11 nm (35% of a total thickness 30 nm) by doping compound P20-1 represented by Formula 20 of the present disclosure (hereinafter, referred to as first doping material-doped layer) with HATCN serving as a doping material, and then P20-1 represented by Formula 20 of the present disclosure was formed at a thickness of 19 nm on the first hole transport layer. Subsequently, a first emission layer having a thickness of 20 nm was deposited on the first hole transport layer using DPVBi as a host and 5% by weight of BCzVBi as a dopant. An electron transport layer was formed at a thickness of 30 nm using Alq3.

Afterwards, a charge generation layer was formed by doping Bphen with 2% of Li for connection to a second stack. In addition, a second hole transport layer of the second stack was formed at a thickness of 14 nm (25% of a total thickness of 55 nm) by doping compound P20-1 represented by Formula 20 of the present disclosure (hereinafter, referred to as second doping material-doped layer) with 10% of HATCN serving as a doping material, and then P20-1 represented by Formula 20 of the present disclosure was formed at a thickness of 41 nm on the second hole transport layer. Afterwards, as described above, a second emission layer, a second electron transport region, and a charge generation layer were formed sequentially.

Finally, a third hole transport layer of a third stack was formed at a thickness of 10 nm (20% of a total thickness of 50 nm) by doping compound P20-1 represented by Formula 20 of the present disclosure (hereinafter, referred to as third doping material-doped layer) with 10% of HATCN serving as a doping material, and then P20-1 represented by Formula 20 of the present disclosure (hereinafter, referred to as third doping material-doped layer) was formed at a thickness of 40 nm on the third hole transport layer. After a third emission layer and a third electron transport region are sequentially deposited as described above, an electron injection layer of Liq was formed at a thickness of 1.5 nm, and then a cathode was formed by depositing Ag:Mg at a thickness of 150 nm. In this manner, the tandem organic electronic device was fabricated.

[Example 181] to [Example 225]

Organic electronic emission devices were fabricated in the same method as Example 180, except that compounds illustrated in the following Tables 6-1 and 6-2 were used as hole transport materials of the first to third stacks.

Comparative Example 20

Organic electronic emission devices were fabricated in the same method as Example, except that only the single stack was formed and the following ref 1 was used as the first hole transport material (the first doping-material doping layer and the first doping-material non-doping layer).

ref 1

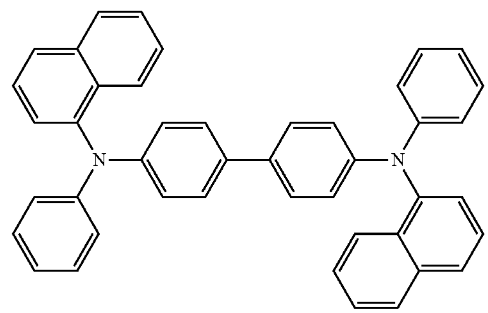 [SMILES: c1ccc(N(c2ccc(-c3ccc(N(c4ccccc4)c4cccc5ccccc45)cc3)cc2)c2cccc3ccccc23)cc1]

Comparative Examples 21 to 24

Tandem organic light-emitting devices were fabricated in the same method as Example 180, except that the compounds were used as each of the hole transport layer materials (the first doping-material doping layer and the first doping-material non-doping layer) of the first to third stacks as illustrated in the following tables 7-1 and 7-2.

ref 3

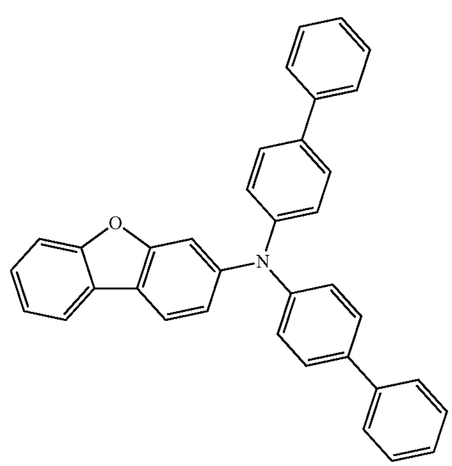 [SMILES: c1ccc(-c2ccc(N(c3ccc(-c4ccccc4)cc3)c3ccc4c(c3)oc3ccccc34)cc2)cc1]

Example and Comparative Examples fabricated as above were measured using PR-650 available from Photo Research, Inc. by applying a forward bias DC voltage to the devices, and as a result of the measurement, T95 lifespans of the devices were tested using lifetime test equipment available from Mcscience Inc. The following tables 7-1 and 7-2 illustrates the results of the fabrication and test of the devices.

TABLE 7-1

| | 1st HTM | | 2nd HTM | | 3rd HTM | | Driving | | | | |
|---|---|---|---|---|---|---|---|---|---|---|---|
| | 1st DL | 1st UDL | 2nd DL | 2nd UDL | 3rd DL | 3rd UDL | (V) voltage | Current (mA/cm$^2$) | Luminance (csd/m$^2$) | Efficiency (cd/A) | T (95) |
| Comp Ex. (20) | ref 1 | | — | — | — | — | 14.9 | 19.2 | 1500.0 | 7.8 | 86.7 |
| Comp Ex. (21) | ref 1 | | ref 1 | | ref 1 | | 12.6 | 15.6 | 1500.0 | 9.6 | 102.1 |
| Comp Ex. (22) | ref 1 | | P20-4 | | P20-4 | | 11.1 | 13.4 | 1500.0 | 11.2 | 108.8 |
| Comp Ex. (23) | ref 3 | P20-4 | P20-4 | | P20-4 | | 12.0 | 14.7 | 1500.0 | 10.2 | 107.5 |
| Comp Ex. (24) | P20-4 | ref 3 | P20-4 | | P20-4 | | 10.8 | 12.8 | 1500.0 | 11.7 | 110.0 |
| Ex. (180) | P20-1 | | P20-1 | | P20-1 | | 8.6 | 8.7 | 1500.0 | 17.2 | 142.0 |
| Ex. (181) | P20-4 | | P20-4 | | P20-4 | | 8.6 | 8.7 | 1500.0 | 17.3 | 141.7 |
| Ex. (182) | P20-23 | | P20-23 | | P20-23 | | 8.7 | 8.8 | 1500.0 | 17.1 | 143.2 |
| Ex. (183) | P21-1 | | P21-1 | | P21-1 | | 6.5 | 6.1 | 1500.0 | 24.6 | 169.3 |
| Ex. (184) | P21-19 | | P21-19 | | P21-19 | | 6.1 | 6.0 | 1500.0 | 24.8 | 169.8 |
| Ex. (185) | P21-45 | | P21-45 | | P21-45 | | 6.6 | 6.2 | 1500.0 | 24.3 | 161.4 |
| Ex. (186) | P21-54 | | P21-54 | | P21-54 | | 6.3 | 6.8 | 1500.0 | 21.9 | 169.5 |
| Ex. (187) | P21-67 | | P21-67 | | P21-67 | | 6.5 | 6.3 | 1500.0 | 23.8 | 165.9 |
| Ex. (188) | P21-85 | | P21-85 | | P21-85 | | 6.5 | 6.7 | 1500.0 | 22.4 | 164.7 |
| Ex. (189) | P21-86 | | P21-86 | | P21-86 | | 6.3 | 6.1 | 1500.0 | 24.6 | 164.1 |
| Ex. (190) | P21-87 | | P21-87 | | P21-87 | | 6.5 | 6.7 | 1500.0 | 22.4 | 167.1 |
| Ex. (191) | P21-89 | | P21-89 | | P21-89 | | 6.1 | 6.8 | 1500.0 | 21.9 | 167.6 |
| Ex. (192) | P21-93 | | P21-93 | | P21-93 | | 6.1 | 6.2 | 1500.0 | 24.2 | 165.0 |
| Ex. (193) | P21-96 | | P21-96 | | P21-96 | | 6.3 | 6.5 | 1500.0 | 23.2 | 163.3 |
| Ex. (194) | P21-99 | | P21-99 | | P21-99 | | 6.4 | 6.1 | 1500.0 | 24.6 | 163.2 |
| Ex. (195) | P22-2 | | P22-2 | | P22-2 | | 7.9 | 7.0 | 1500.0 | 21.5 | 139.2 |
| Ex. (196) | P22-21 | | P22-21 | | P22-21 | | 7.2 | 7.2 | 1500.0 | 20.8 | 137.8 |
| Ex. (197) | P22-30 | | P22-30 | | P22-30 | | 7.6 | 7.2 | 1500.0 | 20.9 | 135.8 |
| Ex. (198) | P23-17 | | P23-17 | | P23-17 | | 6.8 | 8.2 | 1500.0 | 18.2 | 156.9 |
| Ex. (199) | P23-24 | | P23-24 | | P23-24 | | 6.9 | 8.1 | 1500.0 | 18.6 | 154.8 |
| Ex. (200) | P23-36 | | P23-36 | | P23-36 | | 7.0 | 8.1 | 1500.0 | 18.6 | 150.5 |
| Ex. (201) | P20-4 | | P21-1 | | P22-2 | | 8.5 | 8.4 | 1500.0 | 18.0 | 144.5 |
| Ex. (202) | P21-1 | | P21-19 | | P21-19 | | 6.1 | 6.8 | 1500.0 | 21.9 | 169.1 |
| Ex. (203) | P21-19 | | P22-2 | | P21-1 | | 6.6 | 6.4 | 1500.0 | 23.6 | 169.0 |
| Ex. (204) | P22-2 | | P23-17 | | P23-17 | | 7.7 | 7.0 | 1500.0 | 21.6 | 138.8 |
| Ex. (205) | P23-17 | | P20-4 | | P20-4 | | 6.9 | 7.9 | 1500.0 | 19.0 | 146.3 |
| Ex. (206) | P1-2 | P20-4 | P20-4 | | P20-4 | | 7.0 | 7.9 | 1500.0 | 19.1 | 148.5 |
| Ex. (207) | P1-13 | P20-11 | P20-11 | | P20-11 | | 8.5 | 7.7 | 1500.0 | 19.5 | 165.7 |
| Ex. (208) | P2-6 | P20-34 | P20-34 | | P20-34 | | 8.0 | 6.5 | 1500.0 | 23.1 | 133.2 |
| Ex. (209) | P2-34 | P21-13 | P21-13 | | P21-13 | | 7.0 | 7.4 | 1500.0 | 20.3 | 139.9 |

TABLE 7-1-continued

| | 1st HTM | | 2nd HTM | | 3rd HTM | | Driving | | | | |
|---|---|---|---|---|---|---|---|---|---|---|---|
| | 1st DL | 1st UDL | 2nd DL | 2nd UDL | 3rd DL | 3rd UDL | (V) voltage | Current (mA/cm$^2$) | Luminance (csd/m$^2$) | Efficiency (cd/A) | T (95) |
| Ex. (210) | P4-71 | P21-19 | P21-19 | | P21-19 | | 7.0 | 8.3 | 1500.0 | 18.1 | 142.5 |
| Ex. (211) | P4-75 | P21-79 | P21-79 | | P21-79 | | 7.6 | 6.8 | 1500.0 | 21.9 | 148.7 |
| Ex. (212) | P5-20 | P22-14 | P22-14 | | P22-14 | | 8.4 | 6.7 | 1500.0 | 22.4 | 136.5 |
| Ex. (213) | P5-55 | P22-34 | P22-34 | | P22-34 | | 8.2 | 8.1 | 1500.0 | 18.6 | 138.7 |
| Ex. 214) | P6-9 | P23-22 | P23-22 | | P23-22 | | 7.3 | 7.0 | 1500.0 | 21.6 | 140.2 |
| Ex. (215) | P6-17 | P22-25 | P22-25 | | P22-25 | | 6.9 | 8.1 | 1500.0 | 18.5 | 159.5 |
| Ex. (216) | P20-4 | P1-2 | P20-4 | | P20-4 | | 8.6 | 8.5 | 1500.0 | 17.7 | 145.3 |
| Ex. (217) | P20-11 | P1-13 | P20-11 | | P20-11 | | 8.7 | 8.6 | 1500.0 | 17.5 | 144.2 |
| Ex. (218) | P20-34 | P2-6 | P20-34 | | P20-34 | | 8.2 | 8.7 | 1500.0 | 17.2 | 145.3 |
| Ex. (219) | P21-13 | P2-34 | P21-13 | | P21-13 | | 6.3 | 6.4 | 1500.0 | 23.5 | 166.2 |
| Ex. (220) | P21-19 | P4-71 | P21-19 | | P21-19 | | 6.3 | 6.4 | 1500.0 | 23.4 | 161.5 |
| Ex. (221) | P21-79 | P4-75 | P21-79 | | P21-79 | | 6.1 | 6.6 | 1500.0 | 22.9 | 161.1 |
| Ex. (222) | P22-14 | P5-20 | P22-14 | | P22-14 | | 7.4 | 7.1 | 1500.0 | 21.2 | 136.9 |
| Ex. (223) | P22-34 | P5-55 | P22-34 | | P22-34 | | 7.7 | 7.2 | 1500.0 | 21.0 | 133.8 |
| Ex. (224) | P23-22 | P6-9 | P23-22 | | P23-22 | | 7.1 | 8.0 | 1500.0 | 18.8 | 153.0 |
| Ex. (225) | P22-25 | P6-17 | P22-25 | | P22-25 | | 7.1 | 8.1 | 1500.0 | 18.5 | 158.2 |

TABLE 7-2

| | 1st DL | | 1st UDL | | 2nd DL | | | |
|---|---|---|---|---|---|---|---|---|
| | 1st | 1st | 2nd | 2nd | 3rd | 3rd | 2nd UDL | |
| | DL | UDL | DL | UDL | DL | UDL | x | y |
| Comp Ex. (20) | ref 1 | | — | — | — | — | 0.137 | 0.100 |
| Comp Ex. (21) | ref 1 | | ref 1 | | ref 1 | | 0.125 | 0.100 |
| Comp Ex. (22) | ref 1 | | P20-4 | | P20-4 | | 0.127 | 0.100 |
| Comp Ex. (23) | ref 3 | P20-4 | P20-4 | | P20-4 | | 0.125 | 0.100 |
| Comp Ex. (24) | P20-4 | ref 3 | P20-4 | | P20-4 | | 0.126 | 0.100 |
| Ex. (180) | P20-1 | | P20-1 | | P20-1 | | 0.127 | 0.100 |
| Ex. (181) | P20-4 | | P20-4 | | P20-4 | | 0.125 | 0.100 |
| Ex. (182) | P20-23 | | P20-23 | | P20-23 | | 0.126 | 0.100 |
| Ex. (183) | P21-1 | | P21-1 | | P21-1 | | 0.126 | 0.100 |
| Ex. (184) | P21-19 | | P21-19 | | P21-19 | | 0.127 | 0.100 |
| Ex. (185) | P21-45 | | P21-45 | | P21-45 | | 0.126 | 0.100 |
| Ex. (186) | P21-54 | | P21-54 | | P21-54 | | 0.126 | 0.100 |
| Ex. (187) | P21-67 | | P21-67 | | P21-67 | | 0.126 | 0.100 |

TABLE 7-2-continued

| | $1^{st}$ DL | | $1^{st}$ UDL | | $2^{nd}$ DL | | $2^{nd}$ UDL | |
|---|---|---|---|---|---|---|---|---|
| | $1^{st}$ DL | $1^{st}$ UDL | $2^{nd}$ DL | $2^{nd}$ UDL | $3^{rd}$ DL | $3^{rd}$ UDL | x | y |
| Ex. (188) | P21-85 | | P21-85 | | P21-85 | | 0.127 | 0.100 |
| Ex. (189) | P21-86 | | P21-86 | | P21-86 | | 0.127 | 0.100 |
| Ex. (190) | P21-87 | | P21-87 | | P21-87 | | 0.127 | 0.100 |
| Ex. (191) | P21-89 | | P21-89 | | P21-89 | | 0.127 | 0.100 |
| Ex. (192) | P21-93 | | P21-93 | | P21-93 | | 0.127 | 0.100 |
| Ex. (193) | P21-96 | | P21-96 | | P21-96 | | 0.126 | 0.100 |
| Ex. (194) | P21-99 | | P21-99 | | P21-99 | | 0.125 | 0.100 |
| Ex. (195) | P22-2 | | P22-2 | | P22-2 | | 0.126 | 0.100 |
| Ex. (196) | P22-21 | | P22-21 | | P22-21 | | 0.127 | 0.100 |
| Ex. (197) | P22-30 | | P22-30 | | P22-30 | | 0.125 | 0.100 |
| Ex. (198) | P23-17 | | P23-17 | | P23-17 | | 0.126 | 0.100 |
| Ex. (199) | P23-24 | | P23-24 | | P23-24 | | 0.126 | 0.100 |
| Ex. (200) | P23-36 | | P23-36 | | P23-36 | | 0.126 | 0.100 |
| Ex. (201) | P20-4 | | P21-1 | | P22-2 | | 0.126 | 0.100 |
| Ex. (202) | P21-1 | | P21-19 | | P21-19 | | 0.126 | 0.100 |
| Ex. (203) | P21-19 | | P22-2 | | P21-1 | | 0.125 | 0.100 |
| Ex. (204) | P22-2 | | P23-17 | | P23-17 | | 0.126 | 0.100 |
| Ex. (205) | P23-17 | | P20-4 | | P20-4 | | 0.127 | 0.100 |
| Ex. (206) | P1-2 | P20-4 | P20-4 | | P20-4 | | 0.127 | 0.100 |
| Ex. (207) | P1-13 | P20-11 | P20-11 | | P20-11 | | 0.127 | 0.100 |
| Ex. (208) | P2-6 | P20-34 | P20-34 | | P20-34 | | 0.125 | 0.100 |
| Ex. (209) | P2-34 | P21-13 | P21-13 | | P21-13 | | 0.126 | 0.100 |
| Ex. (210) | P4-71 | P21-19 | P21-19 | | P21-19 | | 0.126 | 0.100 |
| Ex. (211) | P4-75 | P21-79 | P21-79 | | P21-79 | | 0.127 | 0.100 |
| Ex. (212) | P5-20 | P22-14 | P22-14 | | P22-14 | | 0.126 | 0.100 |
| Ex. (213) | P5-55 | P22-34 | P22-34 | | P22-34 | | 0.125 | 0.100 |
| Ex. (214) | P6-9 | P23-22 | P23-22 | | P23-22 | | 0.125 | 0.100 |
| Ex. (215) | P6-17 | P22-25 | P22-25 | | P22-25 | | 0.126 | 0.100 |
| Ex. (216) | P20-4 | P1-2 | P20-4 | | P20-4 | | 0.127 | 0.100 |
| Ex. (217) | P20-11 | P1-13 | P20-11 | | P20-11 | | 0.125 | 0.100 |
| Ex. (218) | P20-34 | P2-6 | P20-34 | | P20-34 | | 0.127 | 0.100 |
| Ex. (219) | P21-13 | P2-34 | P21-13 | | P21-13 | | 0.126 | 0.100 |
| Ex. (220) | P21-19 | P4-71 | P21-19 | | P21-19 | | 0.126 | 0.100 |
| Ex. (221) | P21-79 | P4-75 | P21-79 | | P21-79 | | 0.127 | 0.100 |
| Ex. (222) | P22-14 | P5-20 | P22-14 | | P22-14 | | 0.125 | 0.100 |
| Ex. (223) | P22-34 | P5-55 | P22-34 | | P22-34 | | 0.127 | 0.100 |

TABLE 7-2-continued

| | 1st DL | | 1st UDL | | 2nd DL | | | |
|---|---|---|---|---|---|---|---|---|
| | 1st | 1st | 2nd | 2nd | 3rd | 3rd | 2nd UDL | |
| | DL | UDL | DL | UDL | DL | UDL | x | y |
| Ex. (224) | P23-22 | P6-9 | P23-22 | | P23-22 | | 0.126 | 0.100 |
| Ex. (225) | P22-25 | P6-17 | P22-25 | | P22-25 | | 0.126 | 0.100 |

In table 7-1 and 7-2, HTM, DL and UDL means the hole transper layer, the dopping layer and the undopping layer, respectively.

As seen from the result of Table 7-1, it can be appreciated that, when the tandem organic light-emitting devices each including three stacks were fabricated using the compound represented by Formula 20 and Formula 1 of the present disclosure as the hole transport material (Examples 180 to 225), the electrical characteristics of the devices were improved than when organic light-emitting devices each including a single stack using the ref 1 compound as the hole transport materials (Comparative Example 20), a three stack using the ref 1 compound and the ref 3 compound as the hole transport materials (Comparative Example 21) and a three stack using the ref 1 compound and the compound of the present disclosure as the hole transport materials (Comparative Examples 22 to 24).

Describing in detail, in Examples 180 to 225 and Comparative Example 1, the materials of the hole transport layers were doped with the doping materials at the same in the thickness, whereas different numbers of stacks were connected. As in Examples 180 to 225, it can be appreciated that the efficiency and lifespan among the device characteristics were significantly improved with increases in the number of the stacks connected. It is considered that the efficiency and lifespan were improved proportionally to increases in the number of the stacks, due to the multiphoton emission structure in which excitons are generated to emit light energy in each of the stacks.

As seen from the result of Table 7-2, it can also be seen that the values of the color coordinates (CIE x) gradually decrease, due to the device structure including three stacks as in Examples of the present disclosure. It is considered that the color purity was improved as the full width at half maximum (FWHM) of an emission wavelength was reduced with increases in the number of the stacks In the meantime, it can be seen that, when the compound represented by Formula 20 of the present disclosure was used as the first hole transport layer material, the device characteristics were more improved than when the ref1 material were used as first hole transport layer. When the compound of the present disclosure was used as the hole transport layer material, an appropriate number of holes can be efficiently moved in the emission layer to balance holes and electrons in the emission layer and prevent degradations in the interface of the emission layer, thereby increasing the efficiency and lifespan.

Furthermore, the compounds of the present invention can create a state of steric hindrance due to the compound structure, which can lead to an amorphouse state that lowers the crystallization of the thin film when applied to the device. Therefore, when the compound of the present invention is applied to the device, the hole mobility is also excellent to improve the charge balance of the entire device, and the planarity of the molecule is reduced. However, the TG value decreases to produce elements with the relatively low temperature on depositing so that its electric characteristics can be significant.

On the other hand, in the case of Examples 206 to Examples 225 and Comparative Example 23, and Comparative Example 24, the substances formed in the first doping material doping layer and the first doping material non-doping layer in the first hole transport layer are different from each other.

However, a compound comprising at least one fluorene moiety in the molecule was applied to the first hole transport layer in Examples 206 to 225, but in comparative example 23 and comparative 24 there is a difference in the application of Ref 3, which does not comprise one fluorene moiety in the molecule, and due to the difference, the Examples 206 to 225 have a better device than the comparative example 23 and comparative example 24.

It can be seen that there improve the device results by improving the hole injection and hole transport capacity due to the charge generation with the fluoren moiety.

[Example 226] Tandem Organic Electronic Device with Three Stacks Connected

Tandem organic light-emitting devices were fabricated in the same method as Example 180, except that the compounds P21-19 was used as the hole transport materials of the first to third stacks as illustrated in the following Table 10 and the portions corresponding to 15% of the thickness of the hole transport layers were doped with HATCN, each of the hole transport layers being 50 nm thick.

[Examples 227 to 233] and [Comparative Examples 25 to 28]

Tandem organic light-emitting devices were fabricated in the same method as Example 226, except the thickness ratio of the hole transport layer material and HATCN of each of the first to third stacks was applied as shown in the following Table 10.

Example and Comparative Examples fabricated as above were measured using PR-650 available from Photo Research, Inc. by applying a forward bias DC voltage to the devices, and as a result of the measurement, T95 lifespans of the devices were tested at 1,500 cd/$m^2$ standard luminance using lifetime test equipment available from Mcscience Inc. The following tables 8 illustrates the results of the fabrication and test of the devices.

TABLE 8

| | hole transport layer | | | | | | |
| --- | --- | --- | --- | --- | --- | --- | --- |
| | Doping layer | thickness ratio (% of thickness of HTLr) | Driving voltage (V) | Current ($mA/cm^2$) | Luminance ($csd/m^2$) | Efficiency (cd/A) | T (95) |
| Comp Ex. (25) | P21-19 | 5% | 6.8 | 10.8 | 1500.0 | 13.9 | 120.6 |
| Comp Ex. (26) | P21-19 | 55% | 7.0 | 9.6 | 1500.0 | 15.7 | 125.8 |
| Comp Ex. (27) | P22-30 | 5% | 8.8 | 11.7 | 1500.0 | 12.8 | 111.4 |
| Comp Ex. (28) | P22-30 | 55% | 9.1 | 12.3 | 1500.0 | 12.2 | 110.7 |
| Ex. (226) | P21-19 | 15% | 6.4 | 6.1 | 1500.0 | 24.6 | 166.5 |
| Ex. (227) | P21-19 | 20% | 6.5 | 6.0 | 1500.0 | 25.1 | 163.6 |
| Ex. (228) | P21-19 | 25% | 6.3 | 6.4 | 1500.0 | 23.4 | 167.2 |
| Ex. (229) | P21-19 | 30% | 6.3 | 6.3 | 1500.0 | 23.7 | 164.3 |
| Ex. (230) | P22-30 | 15% | 7.3 | 7.3 | 1500.0 | 20.5 | 135.9 |
| Ex. (231) | P22-30 | 20% | 7.5 | 7.4 | 1500.0 | 20.3 | 136.1 |
| Ex. (232) | P22-30 | 25% | 7.3 | 7.2 | 1500.0 | 20.7 | 135.3 |
| Ex. (233) | P22-30 | 30% | 7.7 | 7.4 | 1500.0 | 20.4 | 136.0 |

As shown in Table 8, tandem devices were manufactured and measured for each thickness ratio in which the doping material was doped based on the thickness of each hole transport layer constituting the first to third stacks of the present invention. P21-19 and P22-39 have been described as examples of the compound of this embodiment, and as can be seen from the results of Table 8 above, the results of driving voltage efficiency and lifespan when the thickness ratio at which the doping material is doped based on the total thickness of the hole transport layer is doped less than 10% or in excess of 50% are gradually lower than their results of Examples 226 to 233 in which the doping material is doped at a rate of 15%, 20%, 25%, and 30%, respectively.

This depends on the thickness of the doping material doped in the hole transport layer, that is, this is proportional to the weight ratio of the doping material doped in the hole transport layer. When the thickness of the doping material doped into the hole transport layer is too thin, the generation of holes and charges is insufficient, and hole injection into the light emitting layer is not smooth, resulting in a problem in that the characteristics of the device are deteriorated. On the other hand, when the thickness of the doping material doped into the hole transport layer is too thick, a device short problem occurs or a problem of an increase in the total cost of device fabrication itself occurs.

In addition, in the evaluation result of the device fabrication described above, the organic electric device composed of three stacks has been described, but it can also be applied to devices with three or more stacks, and if necessary, there may be included a light emitting auxiliary layer between the hole transport layer and the light emitting layer or a light emitting layer, or additional layers such as an electron transport auxiliary layer between the light emitting layer and the electron transport layer.

The above description is only intended to illustrate the present disclosure, and those having ordinary knowledge in the art to which the present disclosure pertains could make various modifications without departing from the essential features of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. An organic electronic device comprising:

a first electrode;

a second electrode; and an organic material layer positioned between the first electrode and the second electrode and comprising a first stack, a second stack, and a third stack, wherein the first stack comprises a first hole transport region, a first emission layer, and a first electron transport region, the first hole transport region comprises a first hole transport layer, the first hole transport layer comprises a first compound represented by following Formula 20,

[Formula 20]

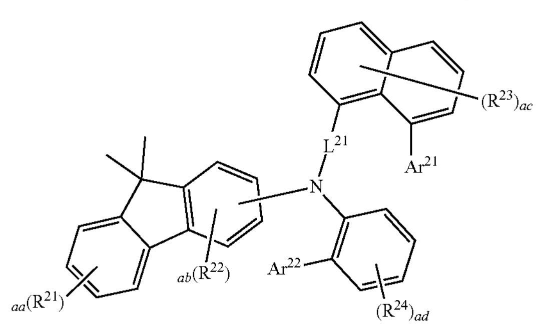

wherein, in the formula 20, $R^{21}$ to $R^{24}$ are independently selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, each of $Ar^{21}$ and $Ar^{22}$ is selected from the group consisting of a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, $L^{21}$ is independently selected from the group consisting of a single bond; a $C_6$-$C_{60}$ arylene group; and $C_2$-$C_{60}$ heterocyclic group including at least one hetero atom of O, N, S, Si, or P, aa, ad may be 0~4; ab may be 0~3; ac may be 0~6, each of an aryl group, a fluorenyl group, a heterocyclic group, a fused ring group, an alkyl group, an alkenyl group, an alkynyl group, an alkoxyl group, an aryloxy group, and an arylene group in the Formula 20 is further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and each of the further substituted substituents is further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and these substituents are bonded to form a ring.

2. The device of claim 1, wherein $L^{21}$ of the Formula 20 is represented by any one of Formulas L-1 to L-9 below:

[Formula L-1]

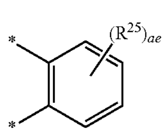

Formula [L-2]

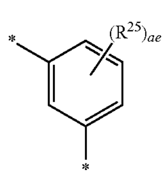

Formula [L-3]

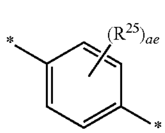

-continued

[Formula L-4]

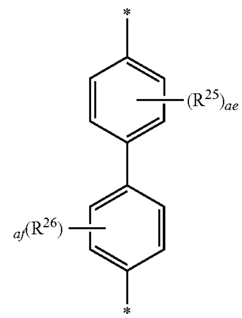

[Formula L-5]

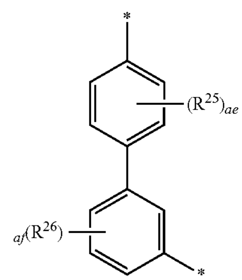

[Formula L-6]

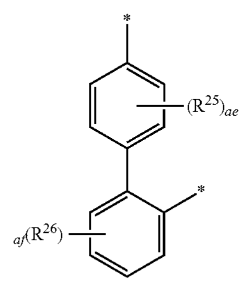

[Formula L-7]

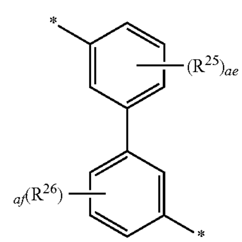

[Formula L-8]

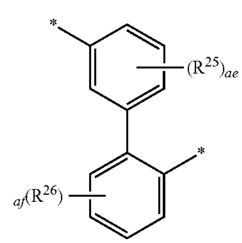

[Formula L-9]

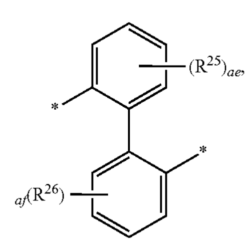

wherein, in the Formulas L-1 to L-9, $R^{25}$ and $R^{26}$ are independently selected from the group consisting of hydrogen; deuterium; a $C_1$-$C_{30}$ alkyl group; a $C_6$-$C_{30}$ aryl group; a $C_2$-$C_{30}$ heterocyclic group including at least one hetero atom of O, N, S, Si, or P, and $R^{25}$ and $R^{26}$ are bonded to form a ring, and ae and af is 0~4.

3. The device of claim 1, wherein $Ar^{12}$ and $Ar^{22}$ in the Formula 20 is represented by one of the following Formula Ar-1 to Formula Ar-4:

[Formula Ar-1]

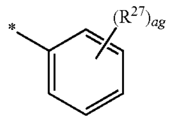

[Formula Ar-2]

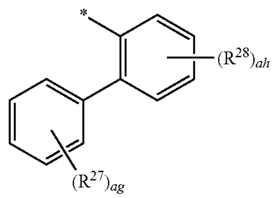

[Formula Ar-3]

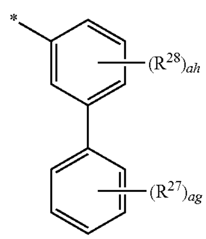

[Formula Ar-4]

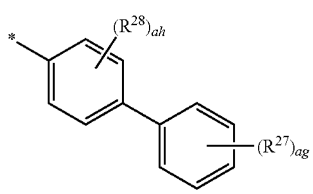

wherein in the Formula Ar-1 to Formula Ar-4, $R^{27}$ and $R^{28}$ are independently selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and $R^{27}$ and $R^{28}$ are bonded to form a ring, and ag is 0~5; and ah is 0~4.

4. The device of claim 1, wherein The first compound represented by the Formula 20 may be represented by one of the following Formula 20-1 to Formula 20-4:

[Formula 20-1]

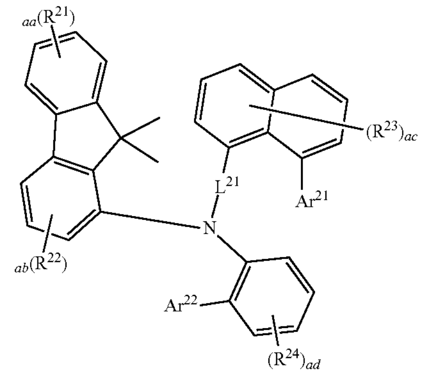

[Formula 20-2]

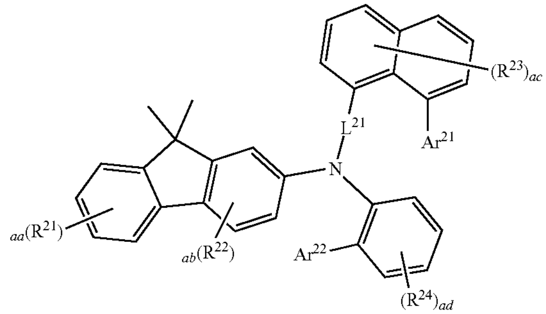

[Formula 20-3]

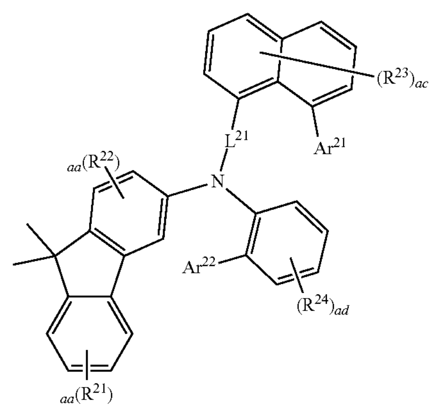

[Formula 20-4]

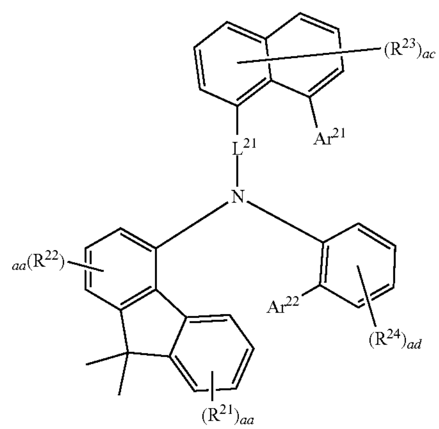

wherein $R^{21}$ to $R^{24}$, $L^{21}$, $Ar^{21}$, $Ar^{22}$, aa to ad in the Formula 20-1 to Formula 20-4 are the same as $R^{21}$ to $R^{24}$, $L^{21}$, $Ar^{21}$, $Ar^{22}$, aa to ad defined above in the description of Formula 20.
5. The device of claim 1, wherein the first compound may be one or more of the following compounds
P20-1
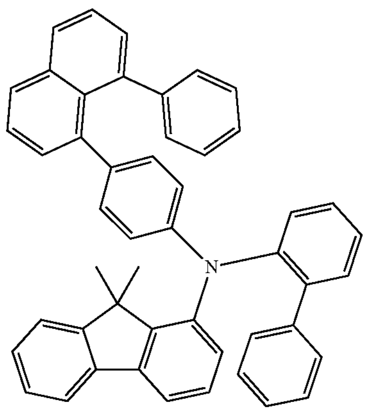
P20-2
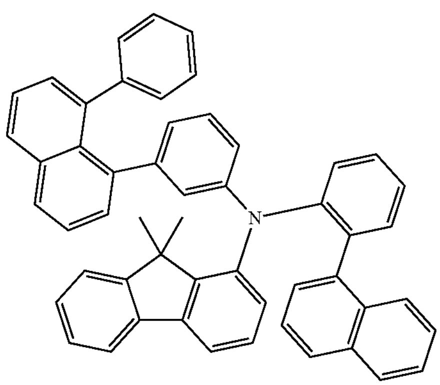
P20-3
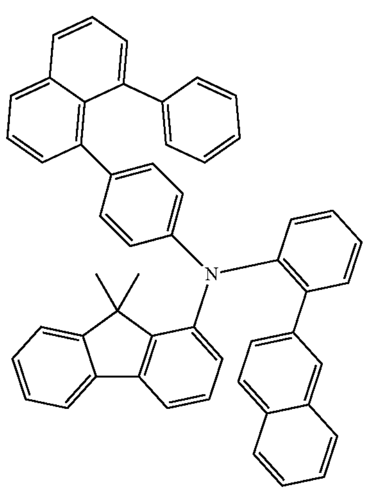
-continued
P20-4
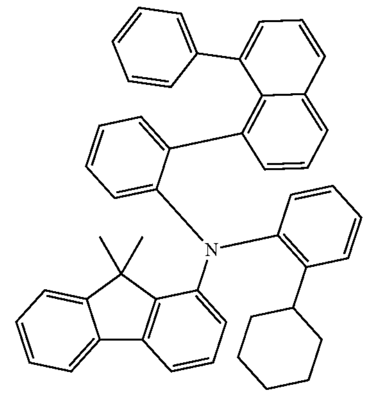
P20-5
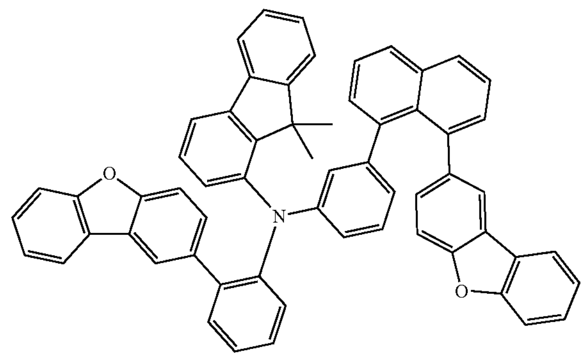
P20-6
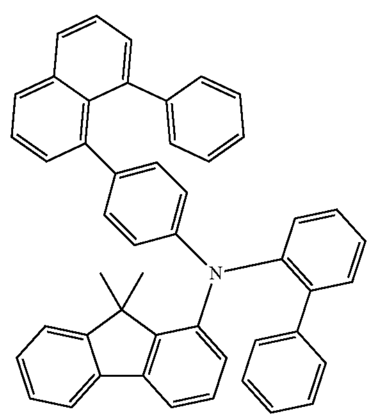
P20-7
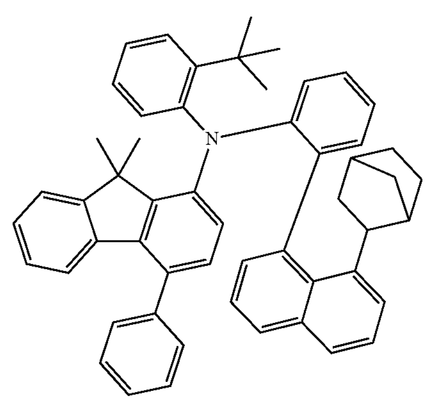

-continued
P20-8
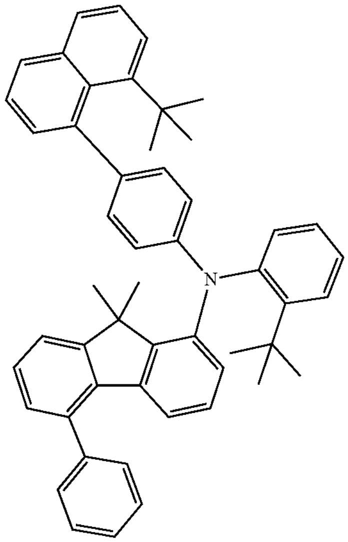
P20-9
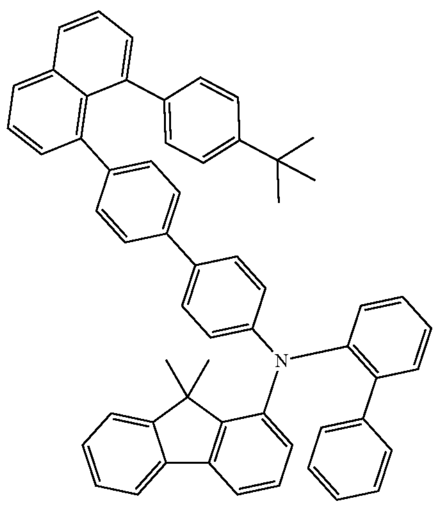
P20-10
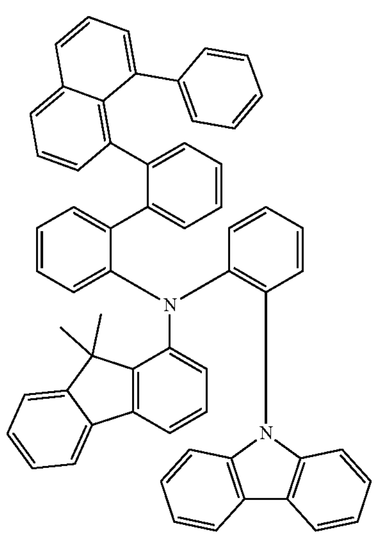
-continued
P20-11
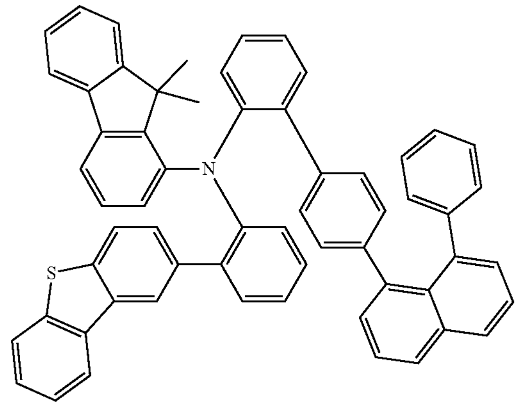
P20-12
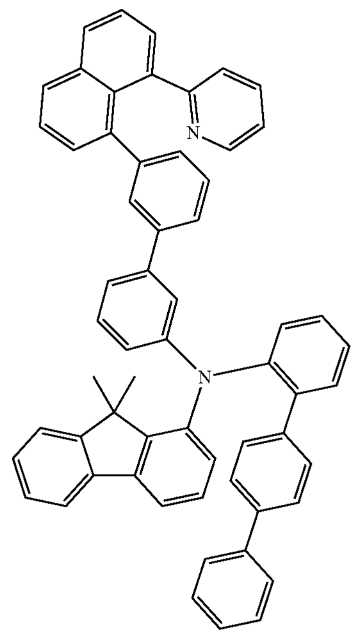
P20-13
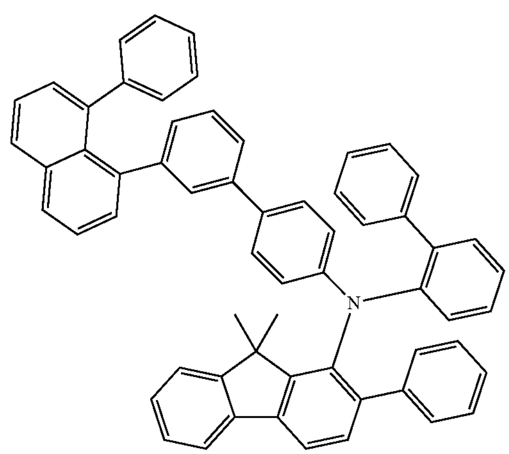

-continued
P20-14
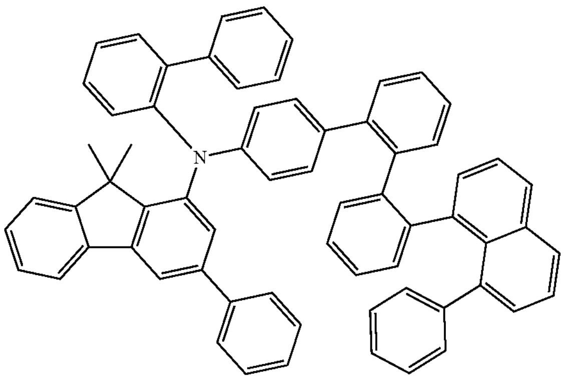
P20-15
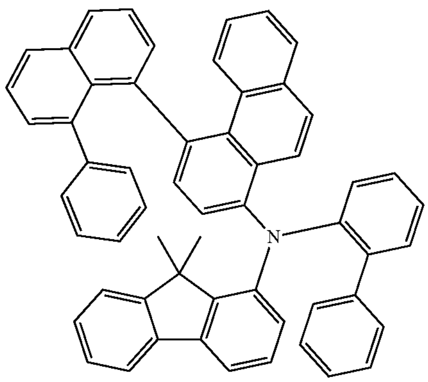
P20-16
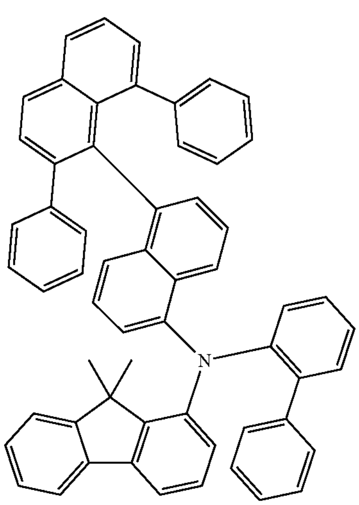
-continued
P20-17
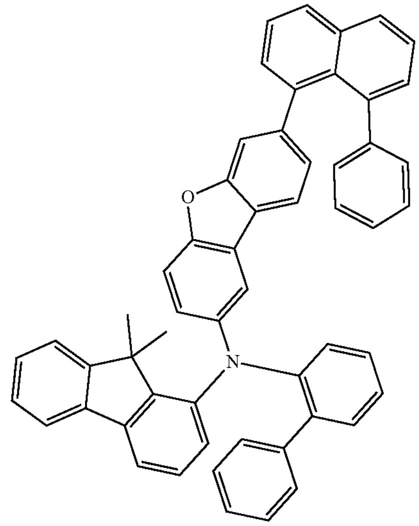
P20-18
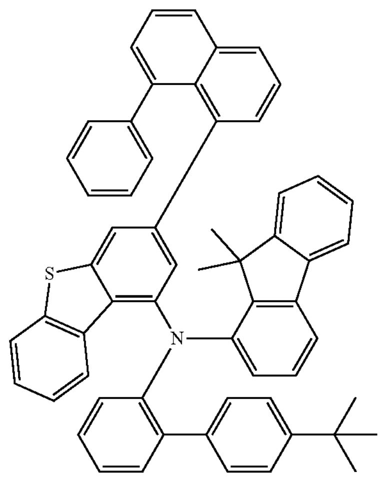
P20-19
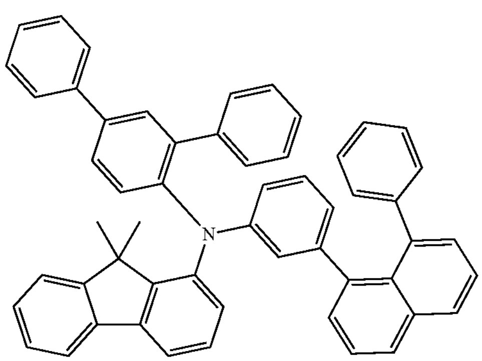

-continued
P20-20
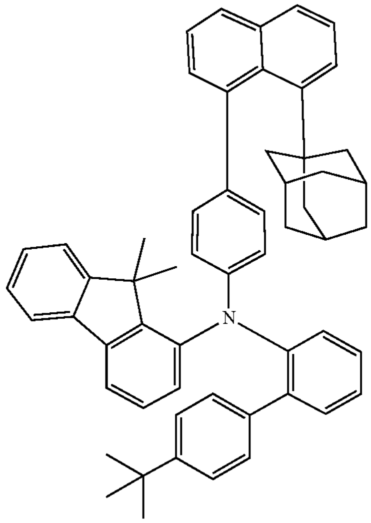
P20-21
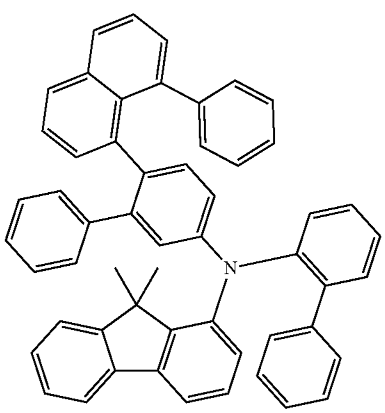
P20-22
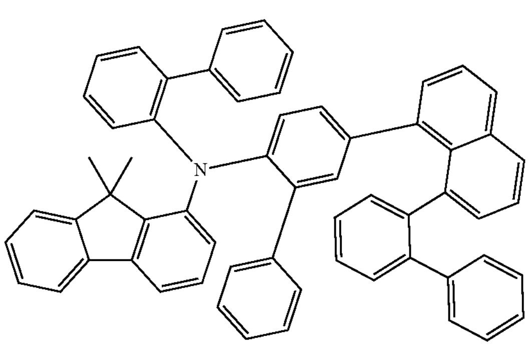
-continued
P20-23
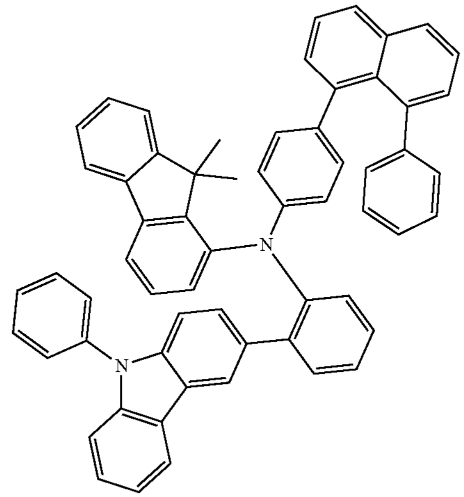
P20-24
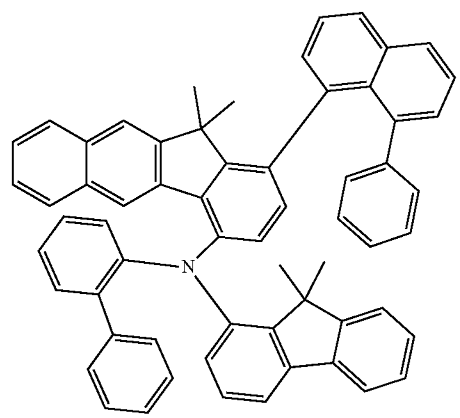
P20-25
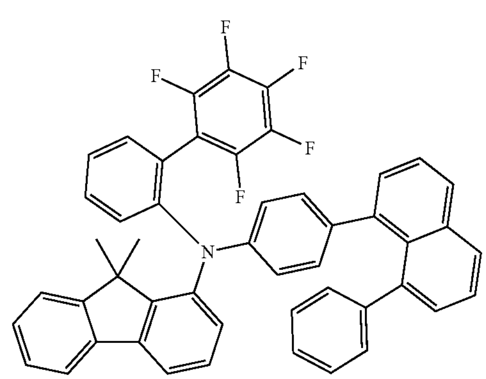

-continued
P20-26
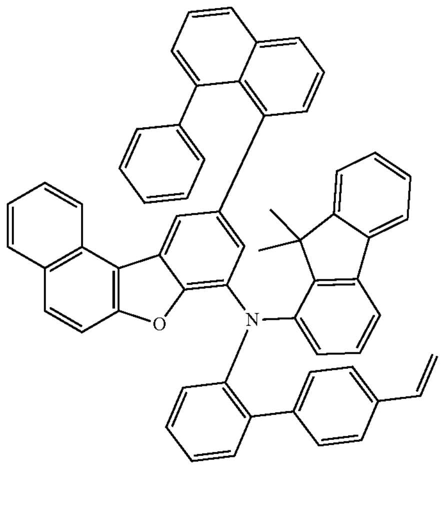
P20-27
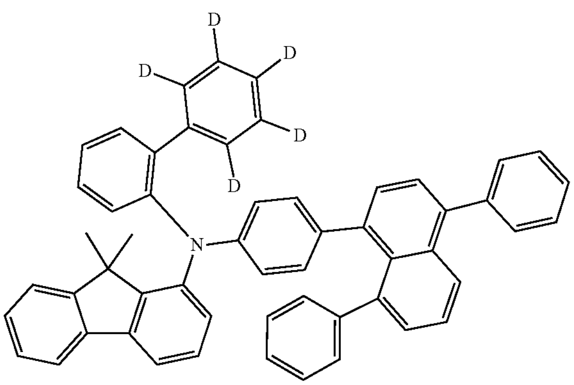
P20-28
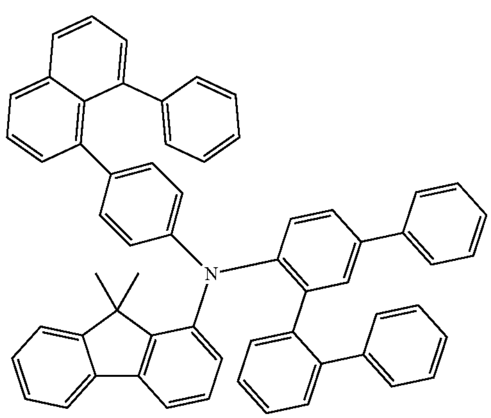
-continued
P20-29
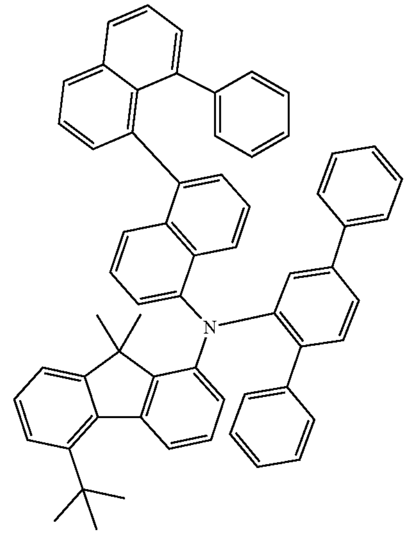
P20-30
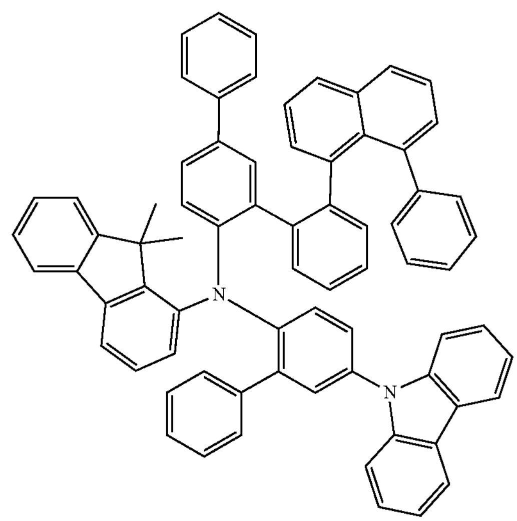
P20-31
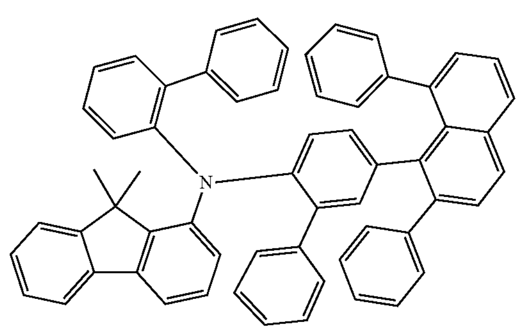

-continued
P20-32
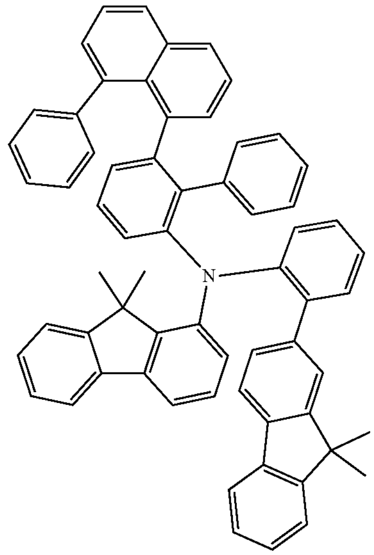
P20-33
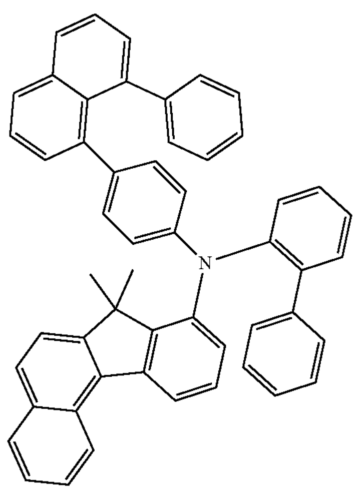
P20-34
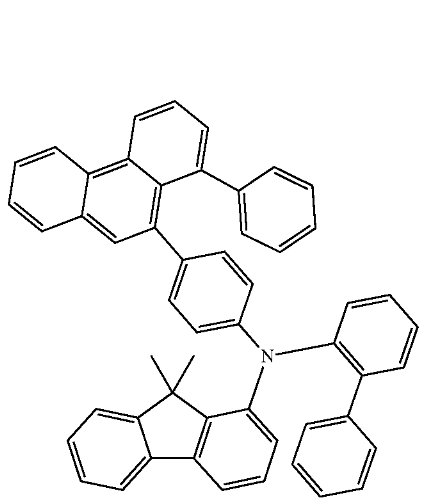
-continued
P20-35
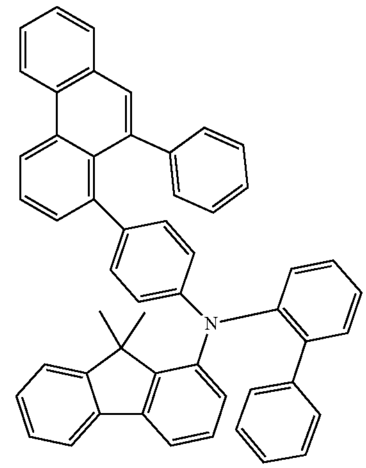
P20-36
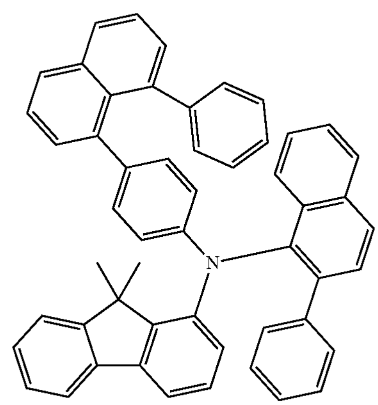
P21-1
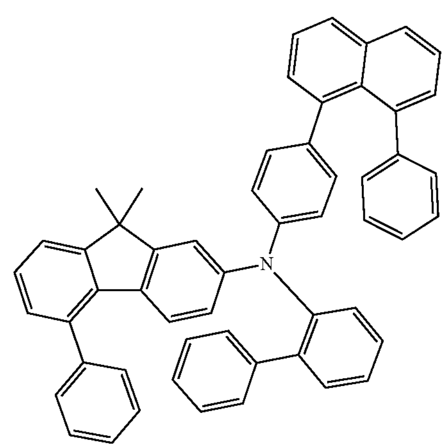

-continued
P21-2
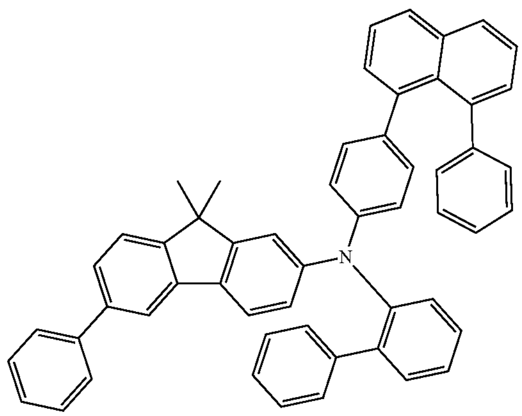
321-3
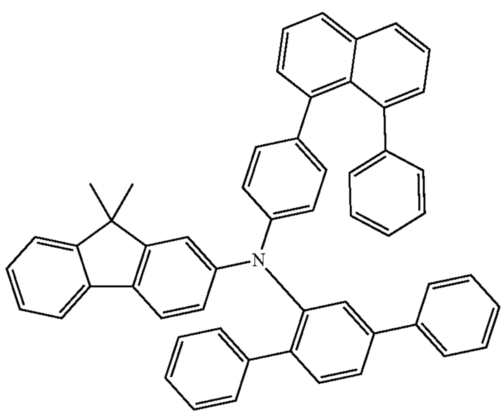
P21-4
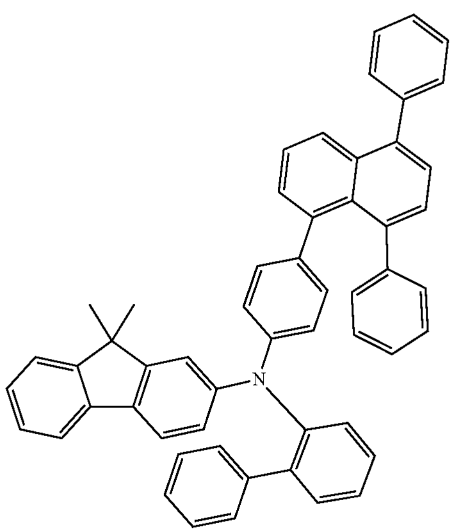
-continued
P21-5
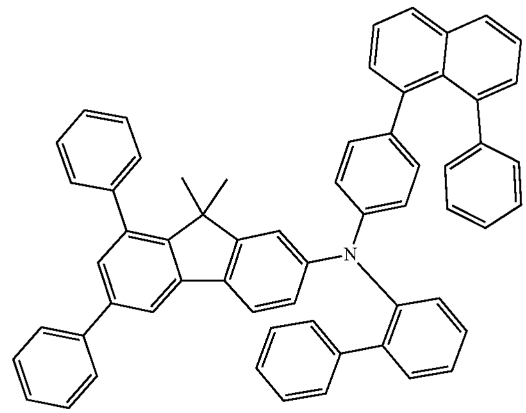
P21-6
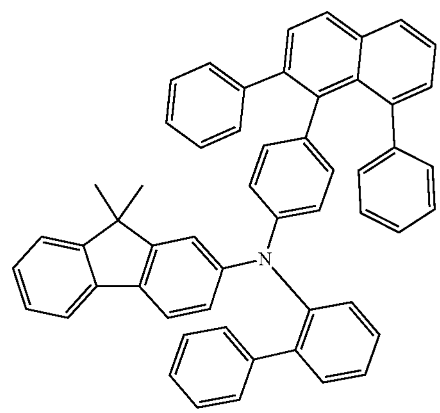
P21-7
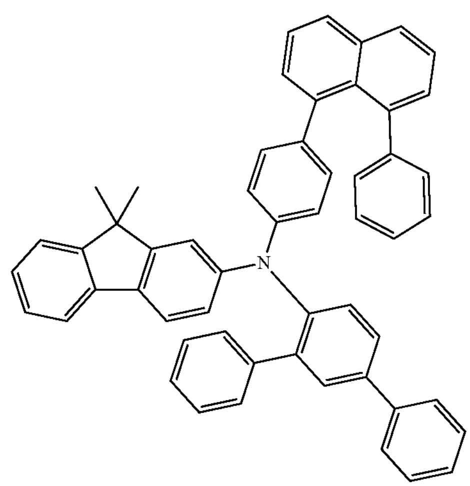

-continued
P21-8
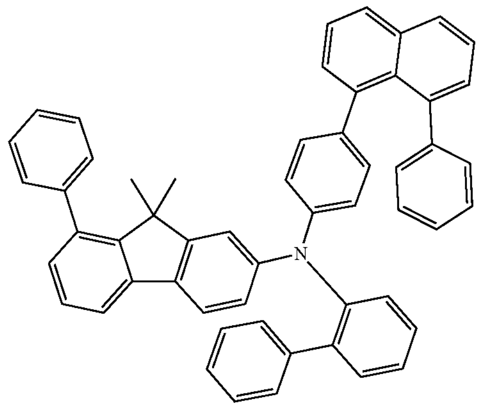
P21-9
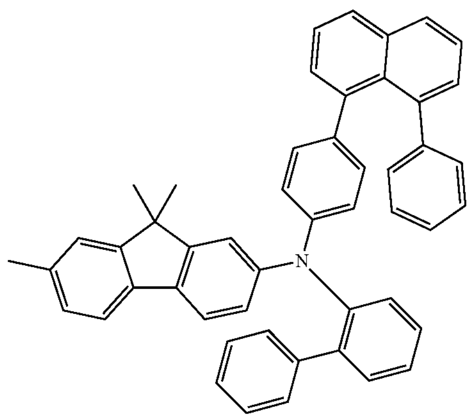
P21-10
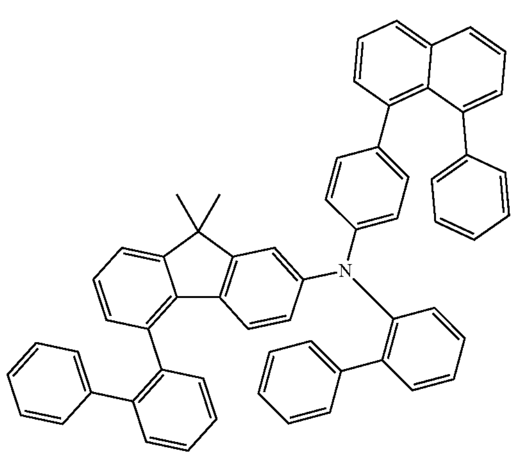
-continued
P21-11
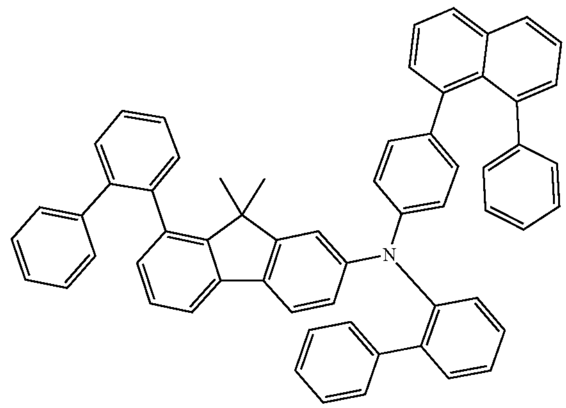
P21-12
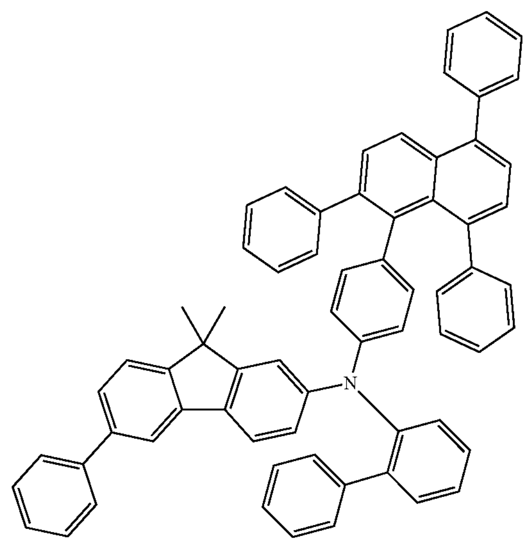
P21-13
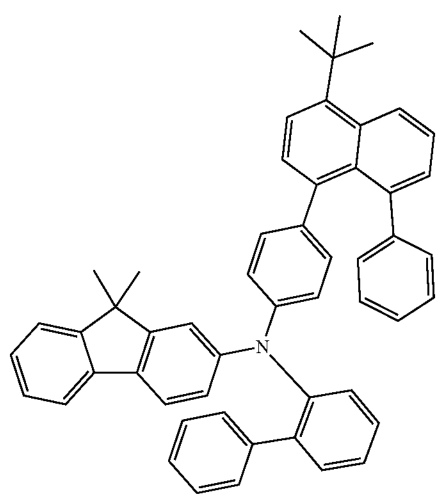

-continued
P21-14
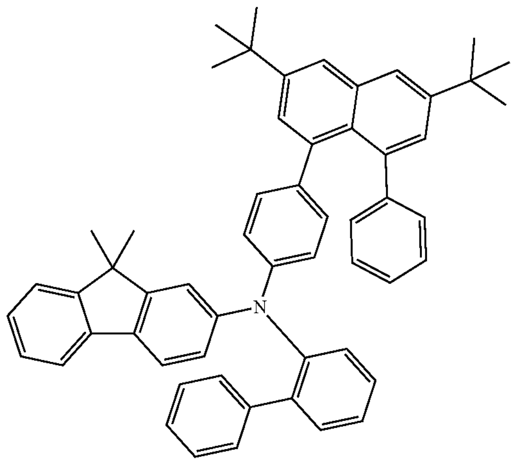
P21-15
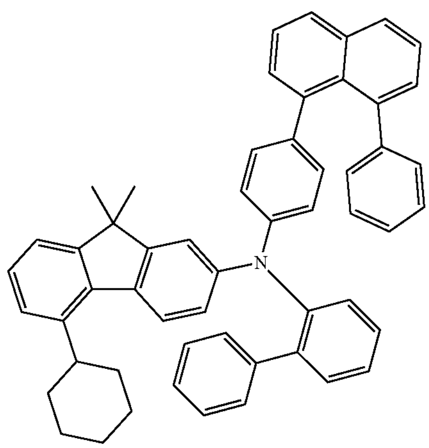
P21-16
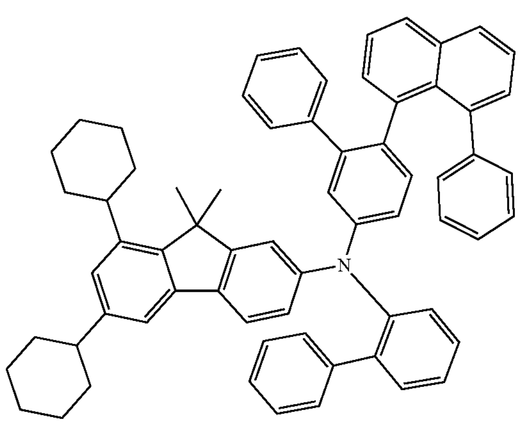
-continued
P21-17
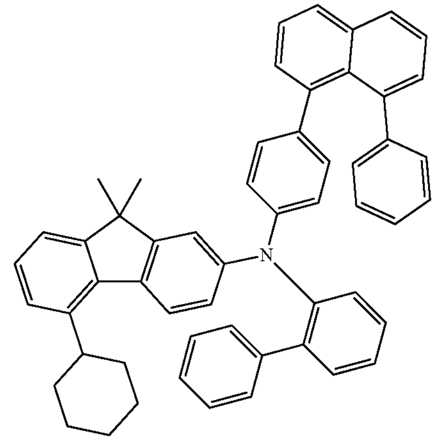
P21-18
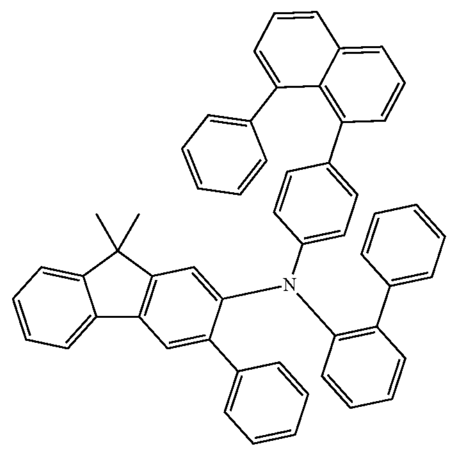
P21-19
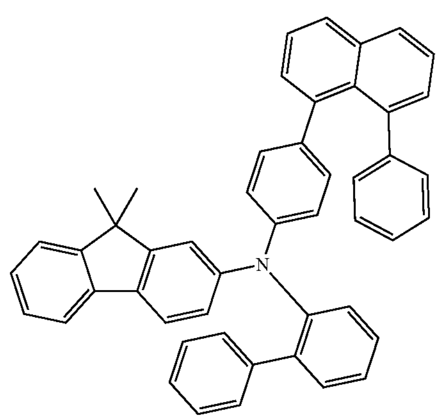

-continued
P21-20
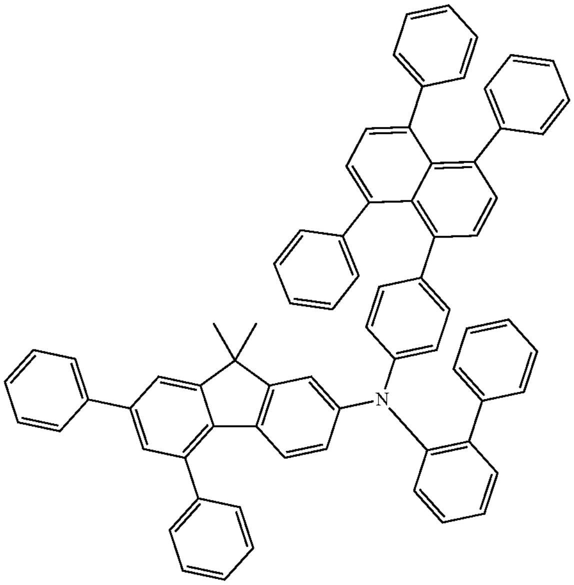
P21-21
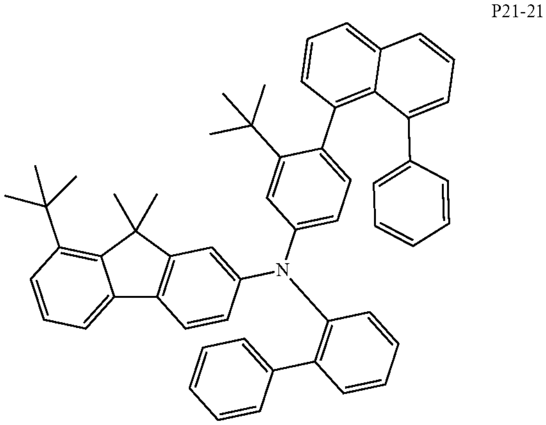
P21-22
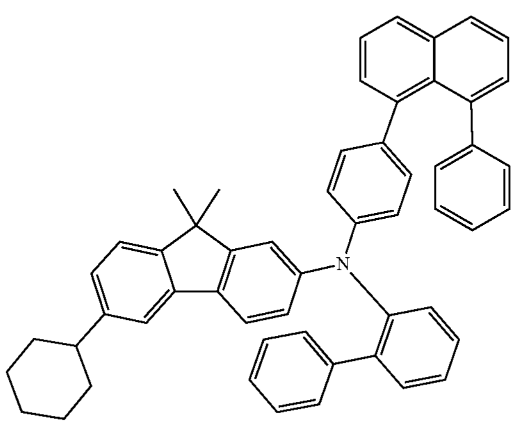
-continued
P21-23
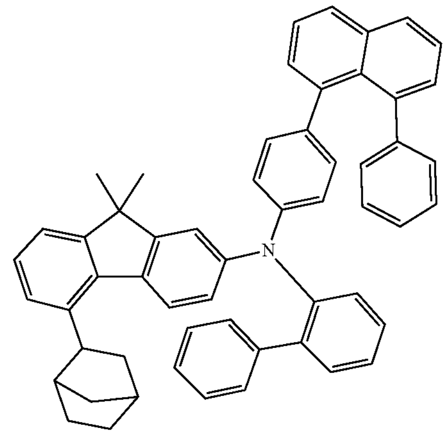
P21-24
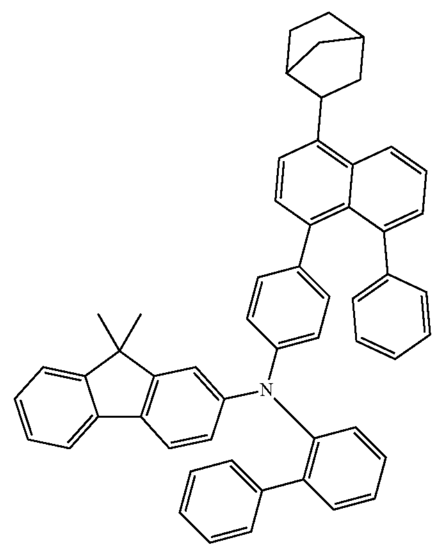
P21-25
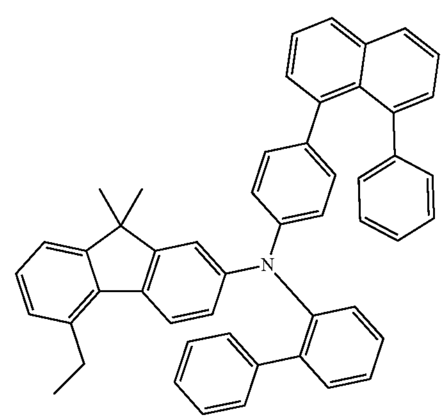

-continued
P21-26
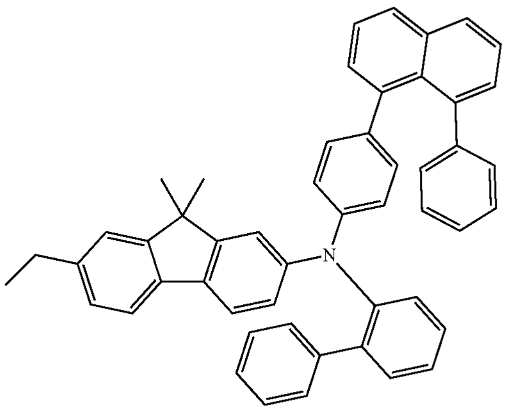
P21-27
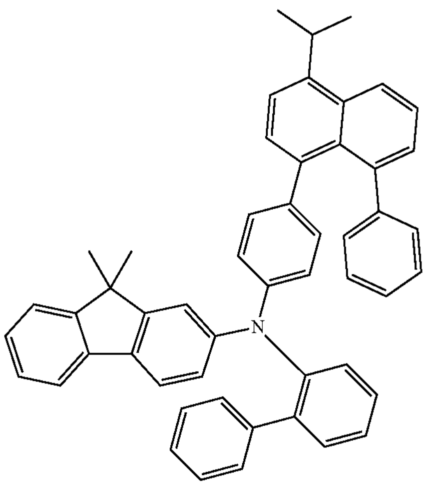
P21-28
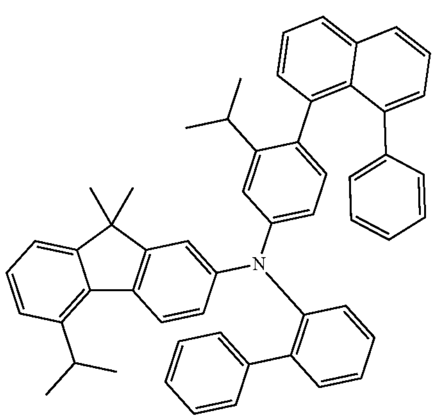
-continued
P21-29
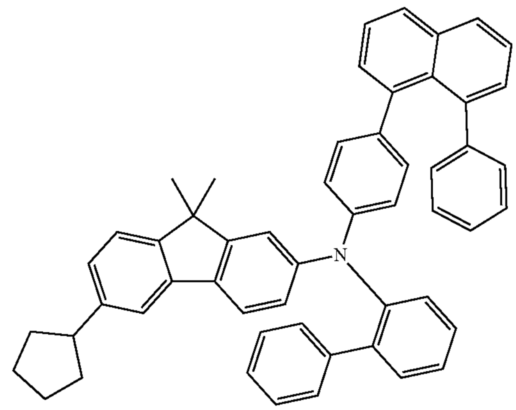
P21-30
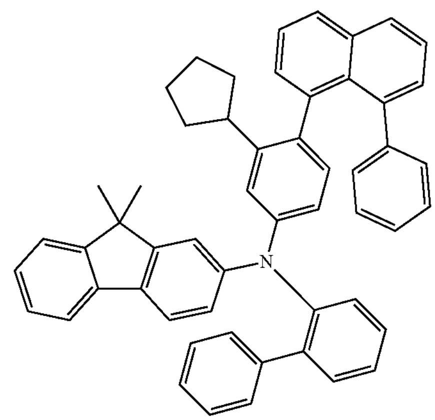
P21-31
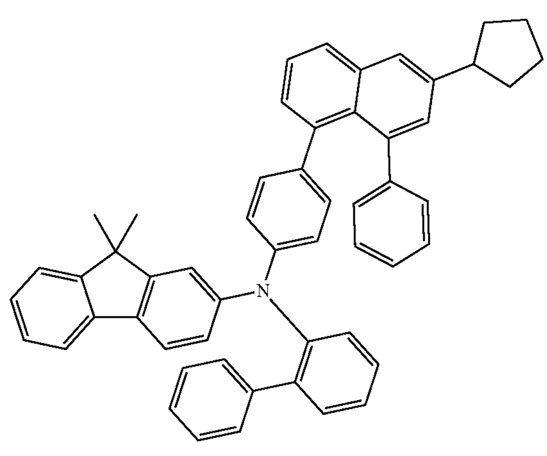

-continued
P21-32
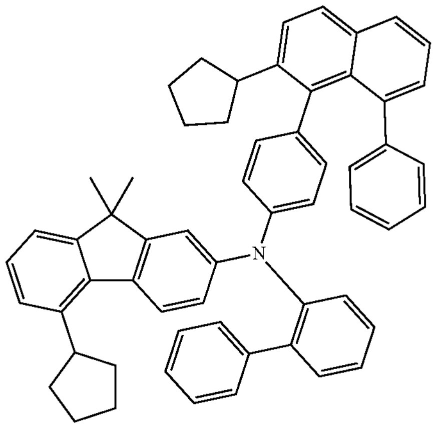
P21-33
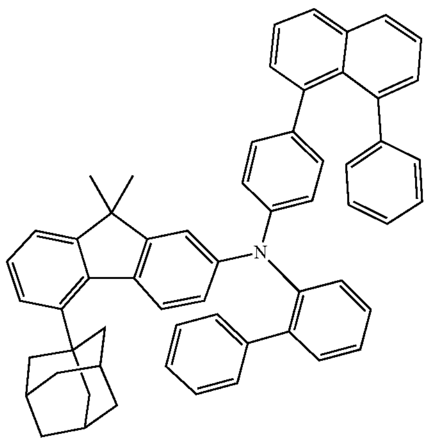
P21-34
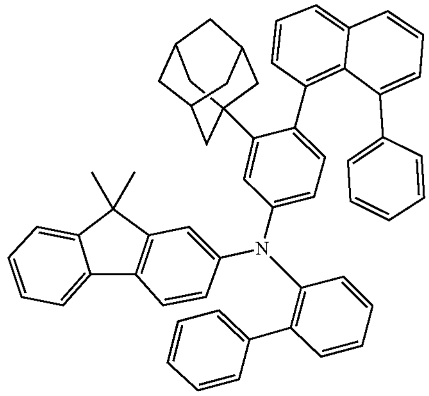
-continued
P21-35
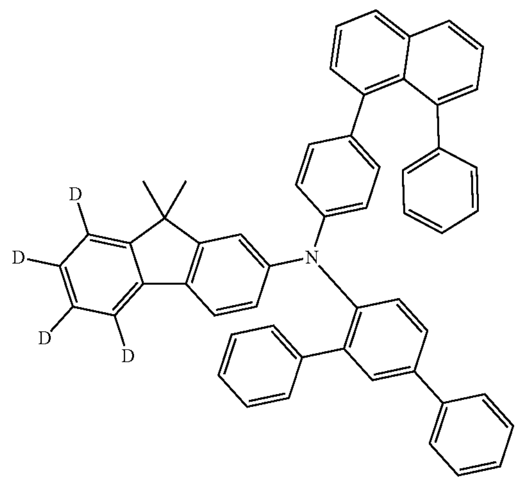
P21-36
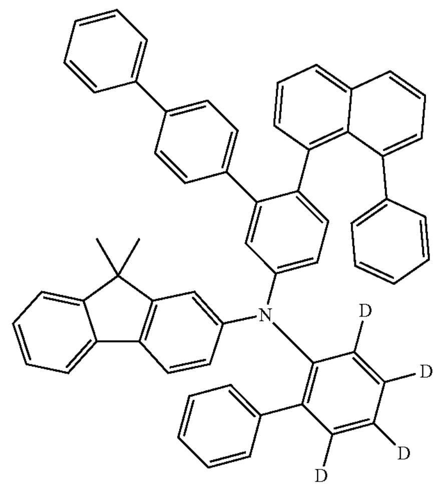
P21-37
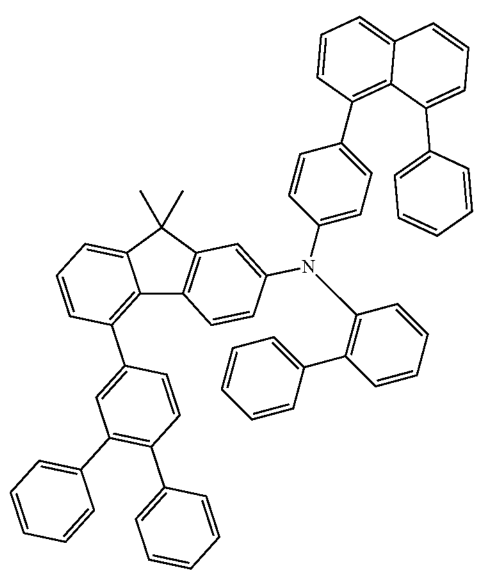

-continued
P21-38
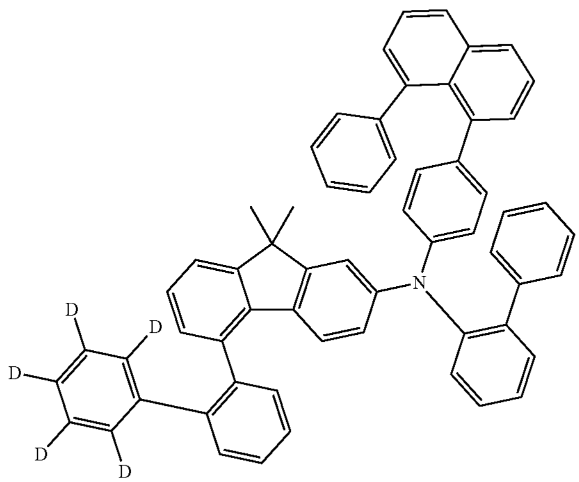
P21-39
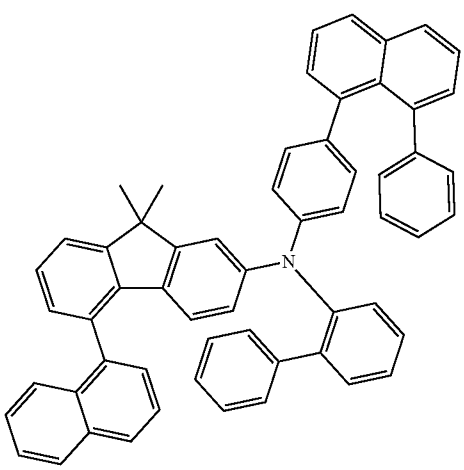
P21-40
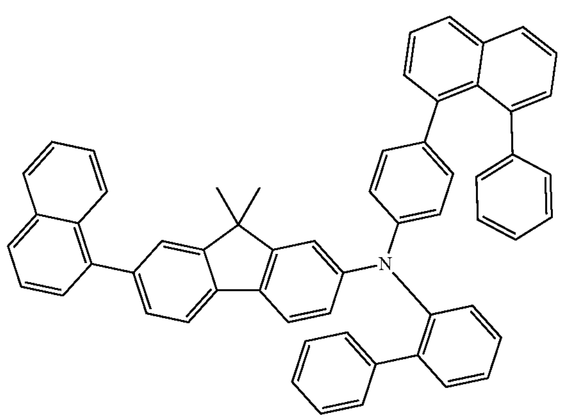
-continued
P21-41
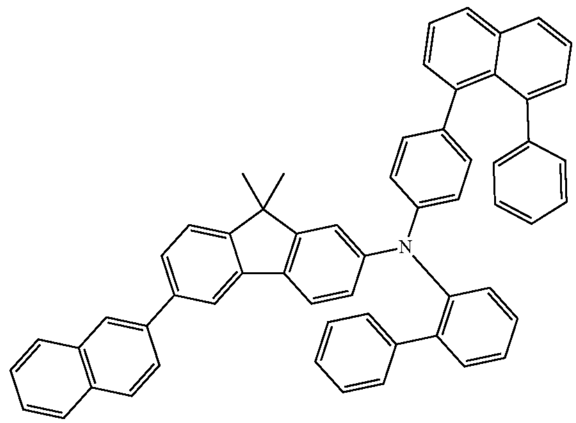
P21-42
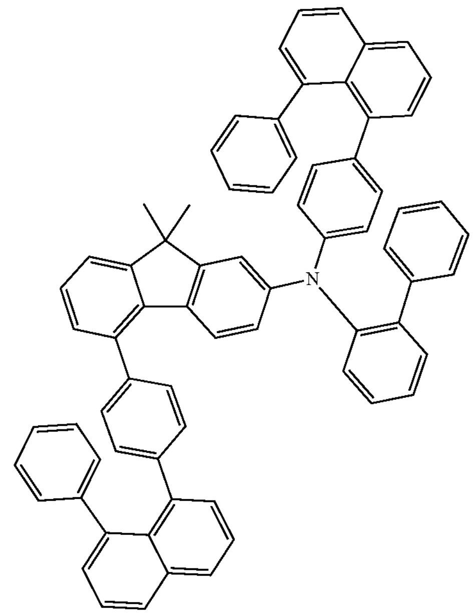
P21-43
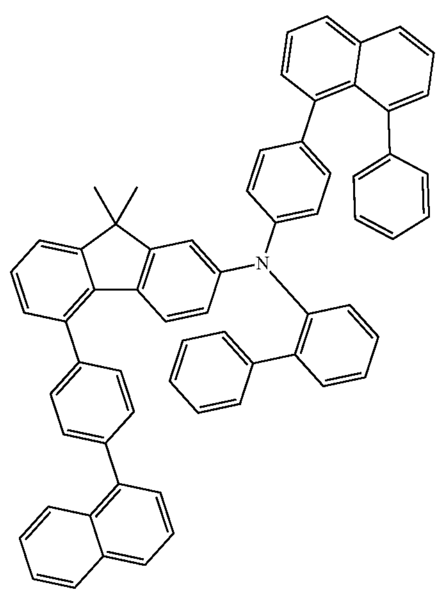

-continued
P21-44
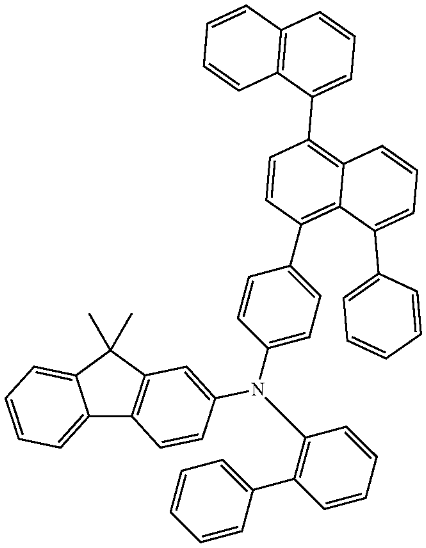
P21-45
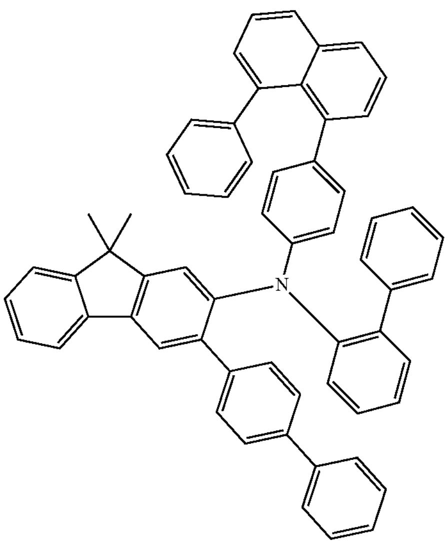
P21-46
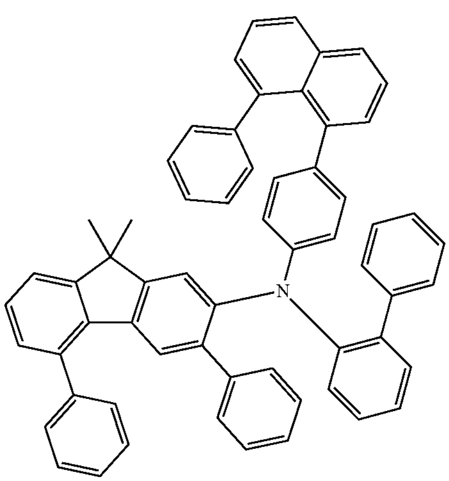
-continued
P21-47
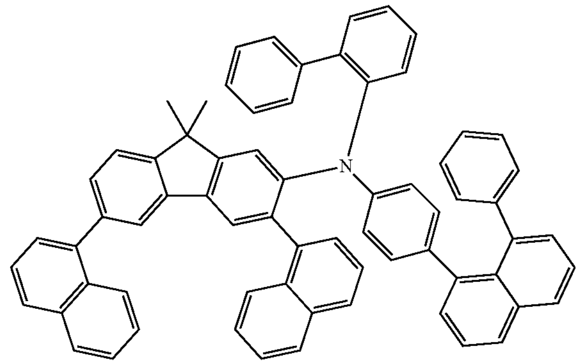
P21-48
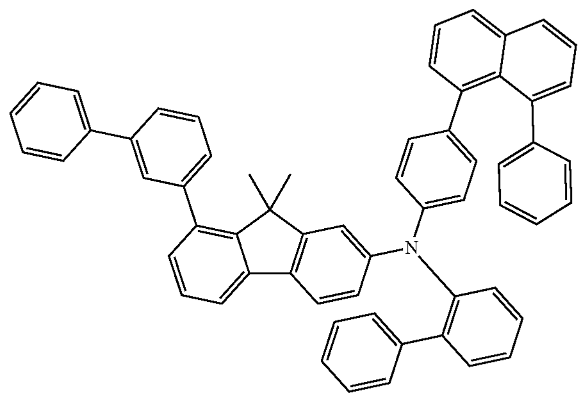
P21-49
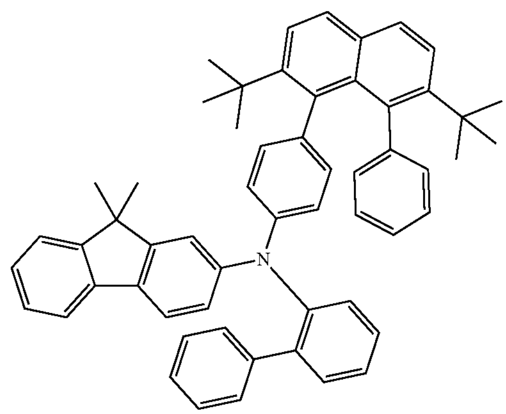
P21-50
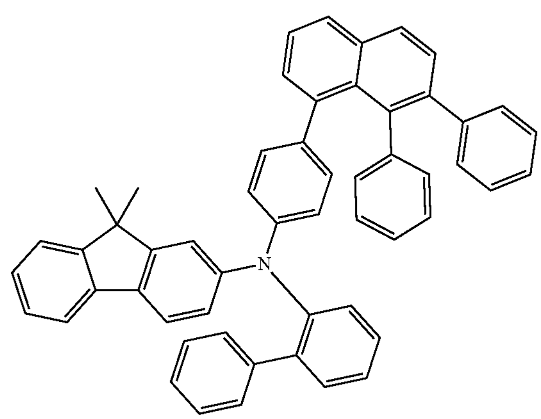

-continued
P21-51
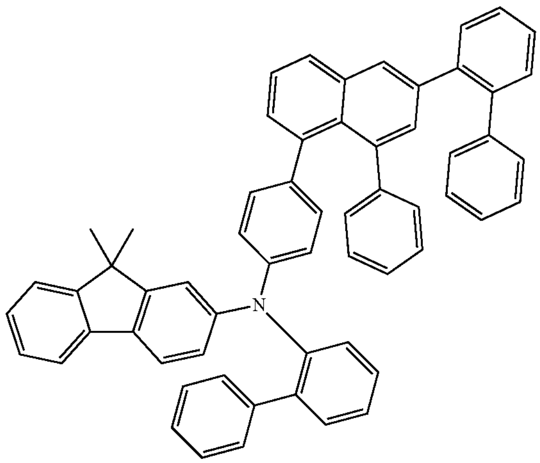
P21-52
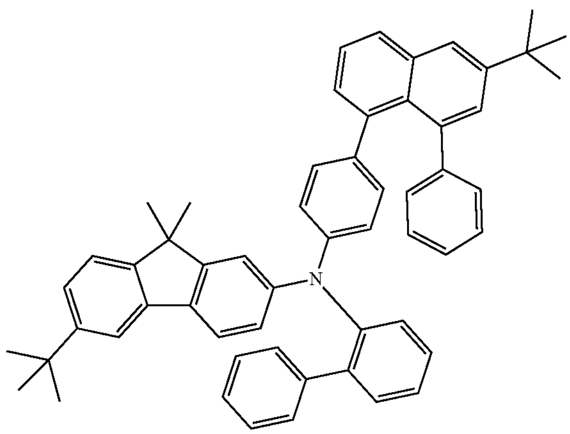
P21-53
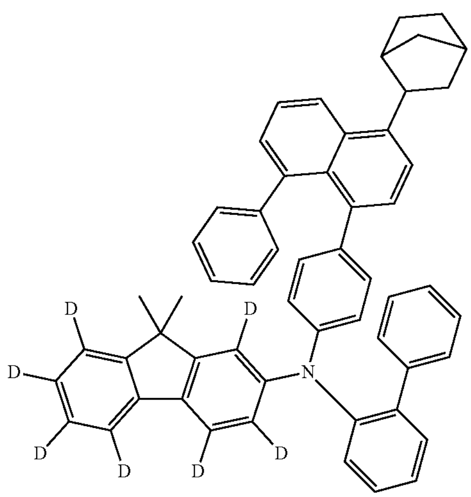
-continued
P21-54
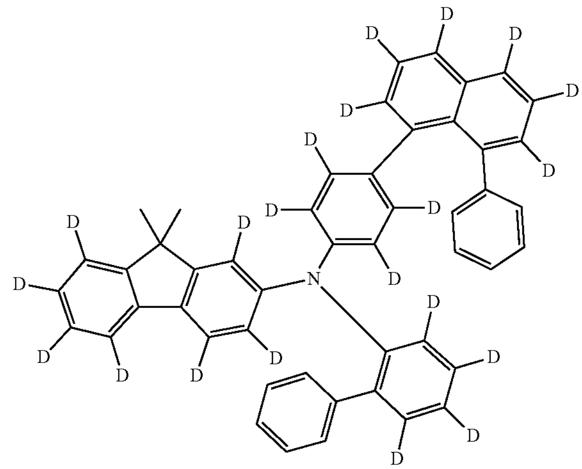
P21-55
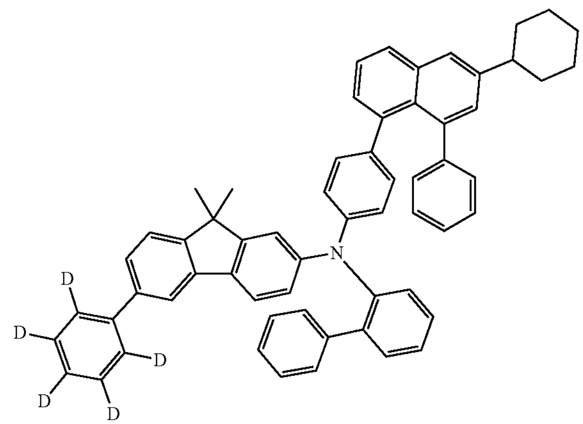
P21-56
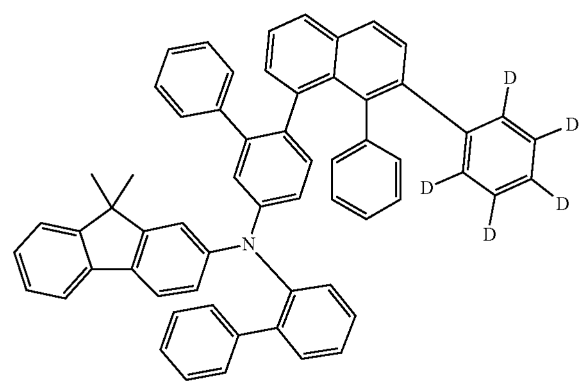

-continued
P21-57
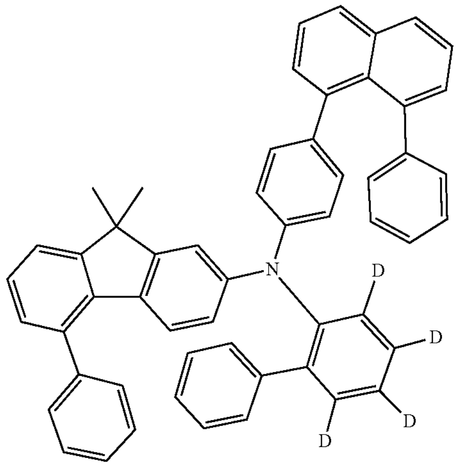
P21-58
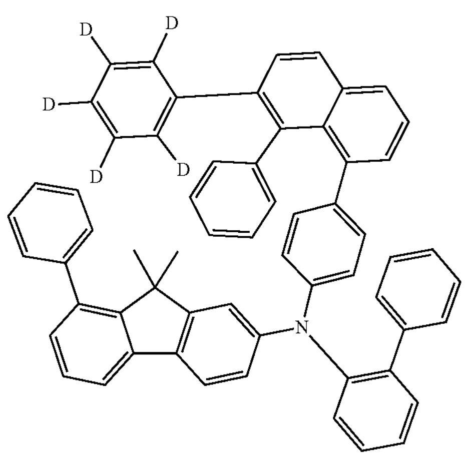
P21-59
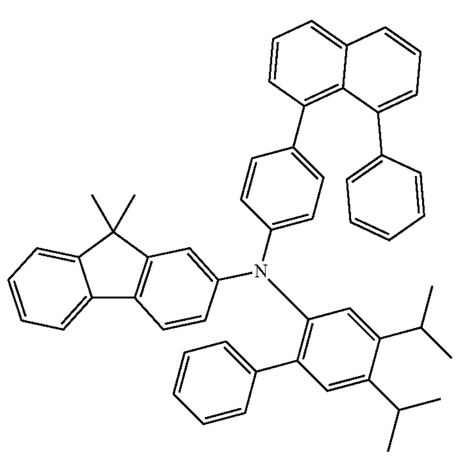
-continued
P21-60
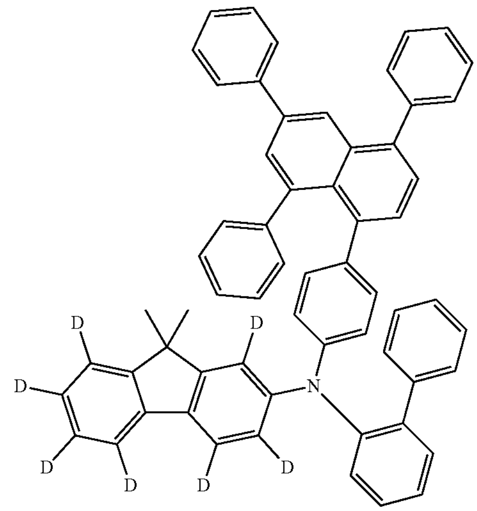
P21-61
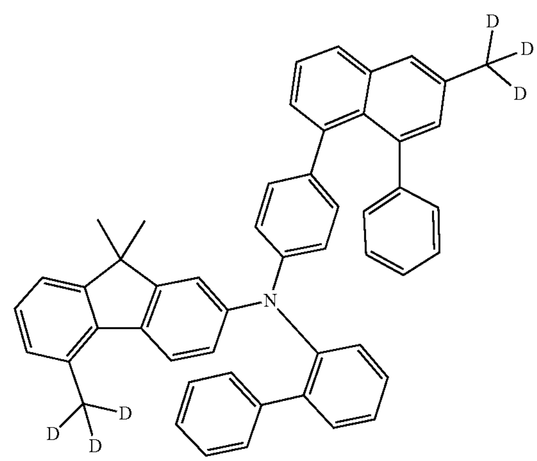
P21-62
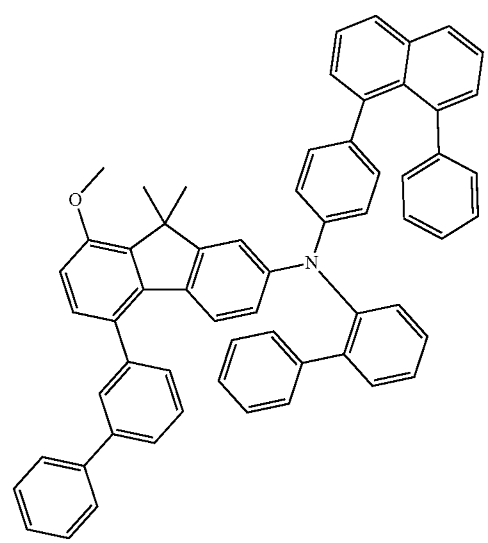

-continued
P21-63
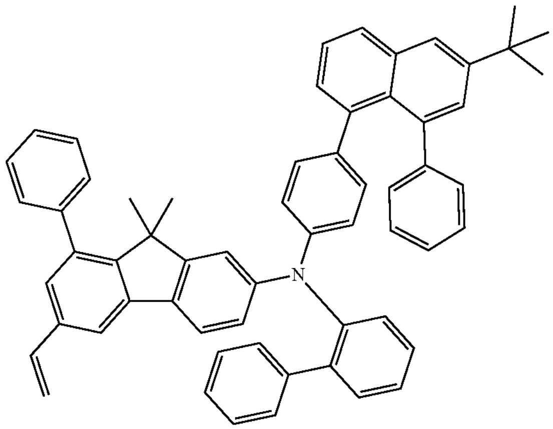
P21-64
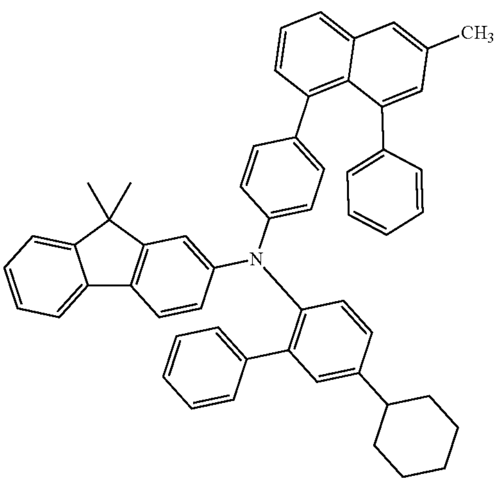
P21-65
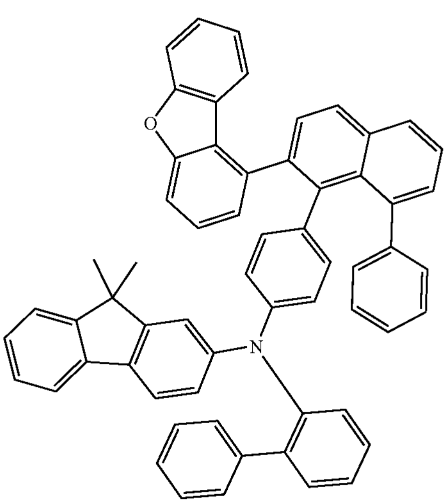
-continued
P21-66
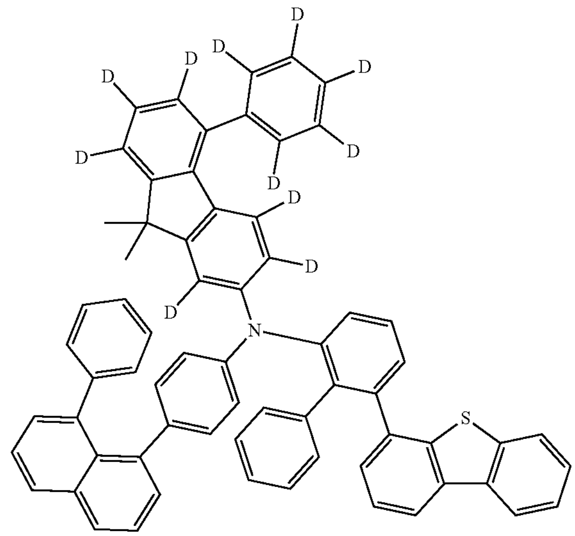
P21-67
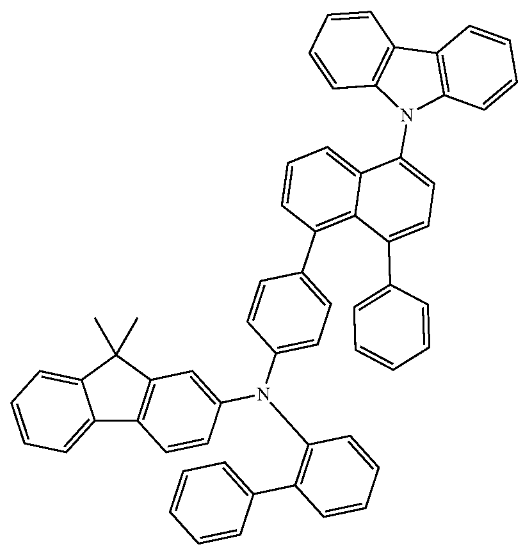
P21-68
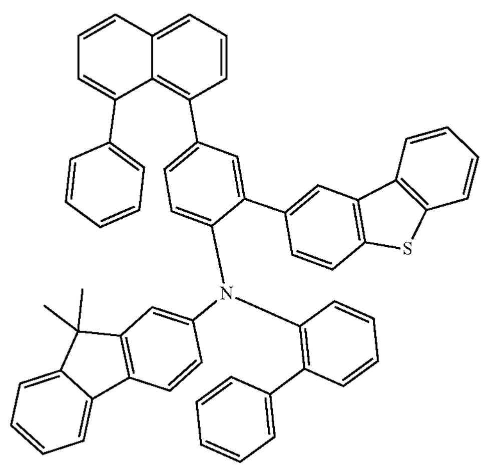

-continued
P21-69
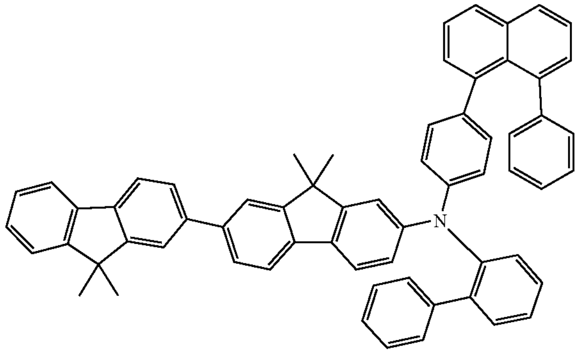
P21-70
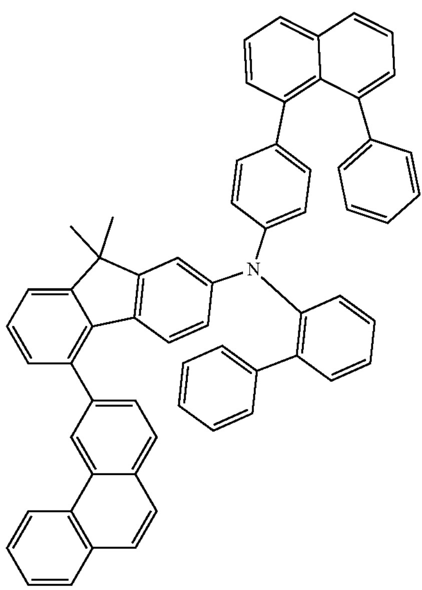
P21-71
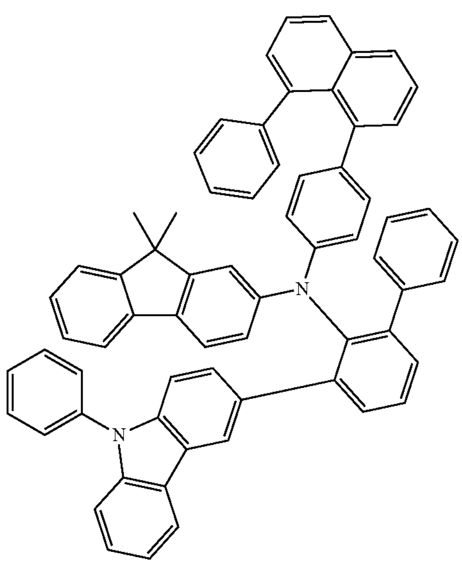
-continued
P21-72
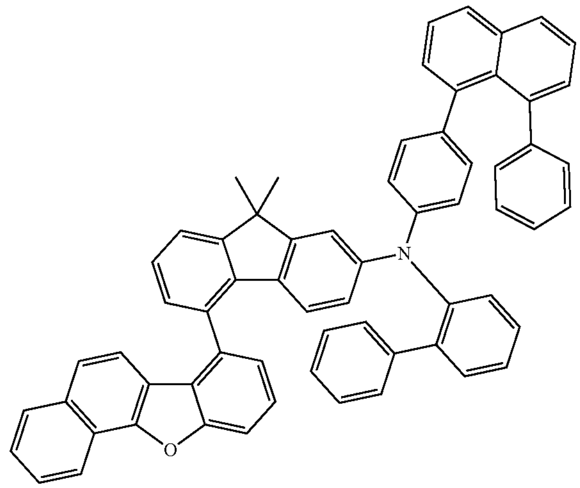
P21-73
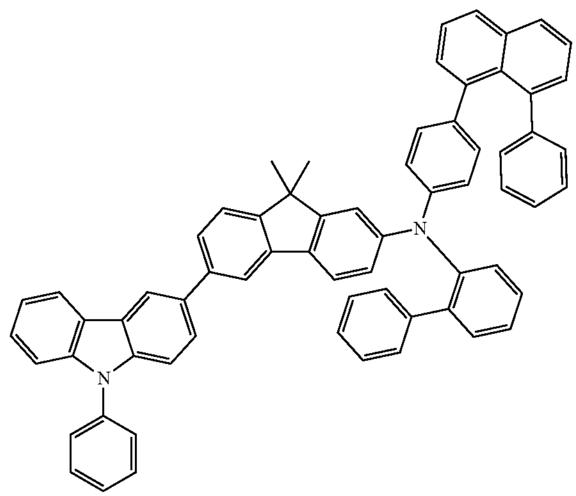
P21-74
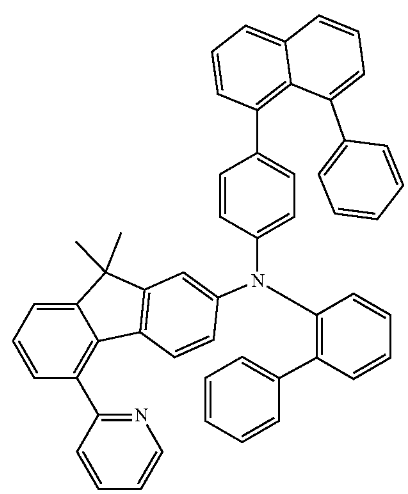

-continued
P21-75
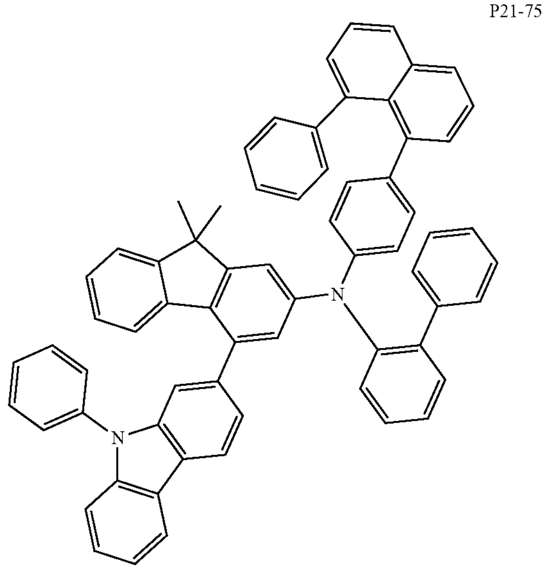
P21-76
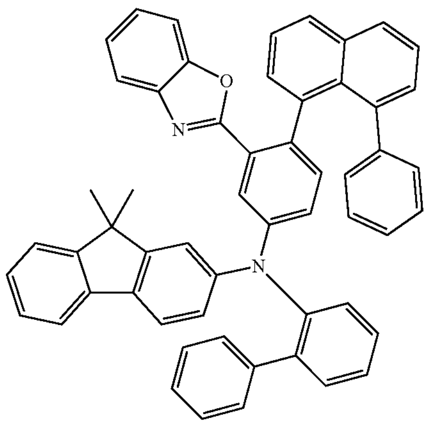
P21-77
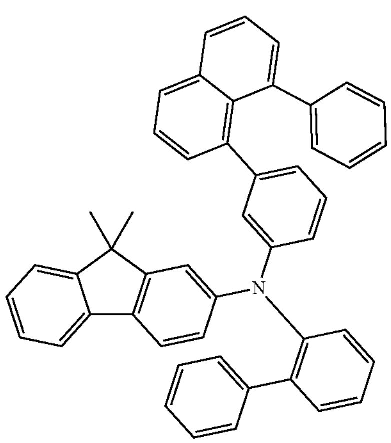
-continued
P21-78
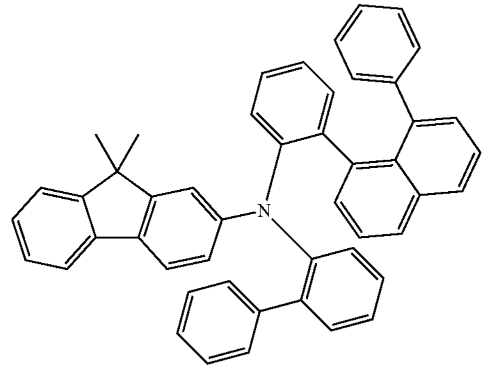
P21-79
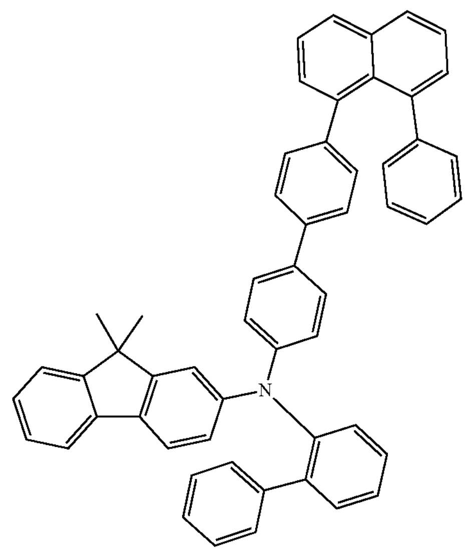
P21-80
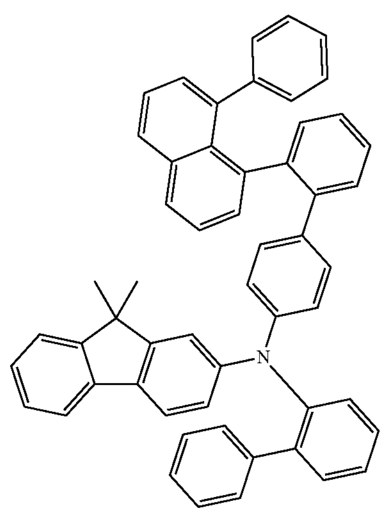

-continued
P21-81
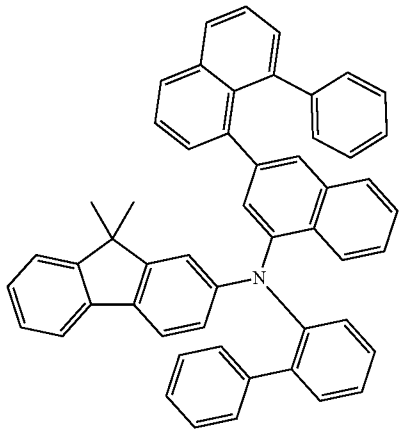
P21-82
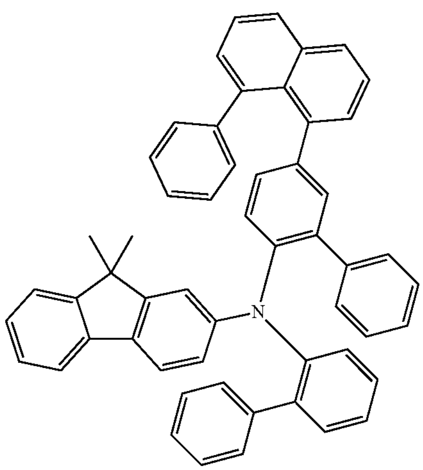
P21-83
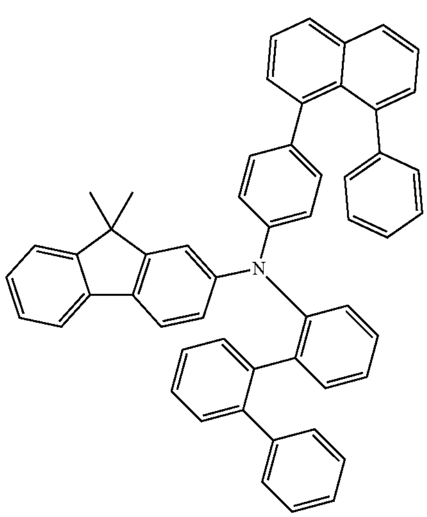
-continued
P21-84
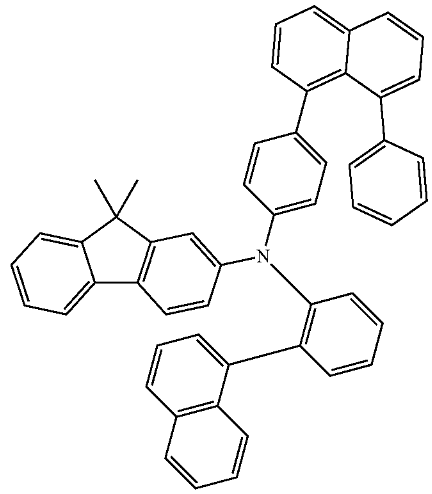
P21-85
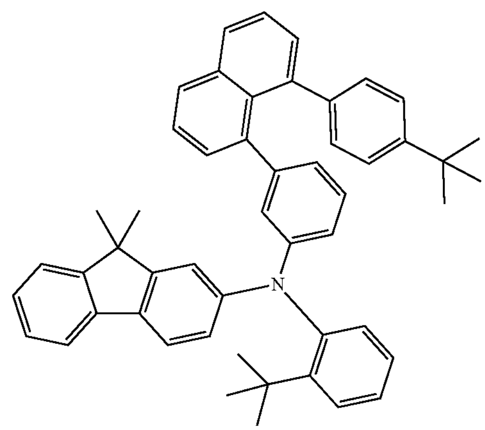
P21-86
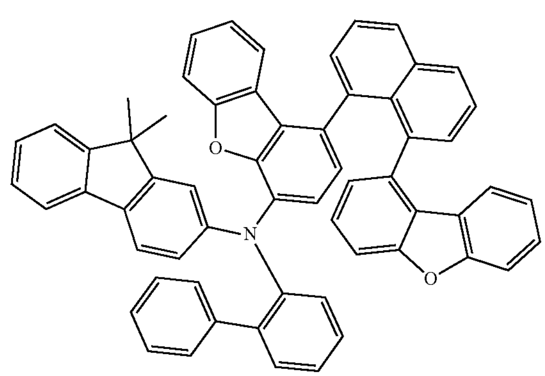

-continued
P21-87
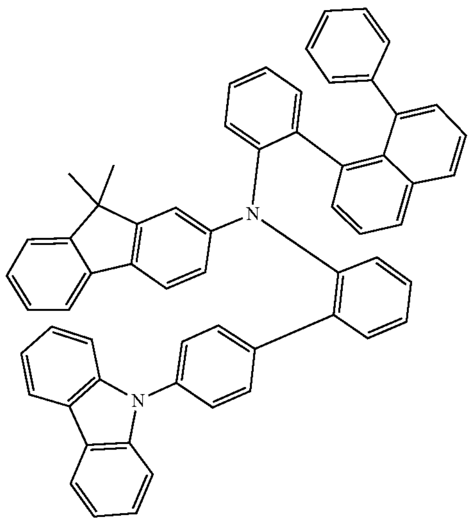
P21-88
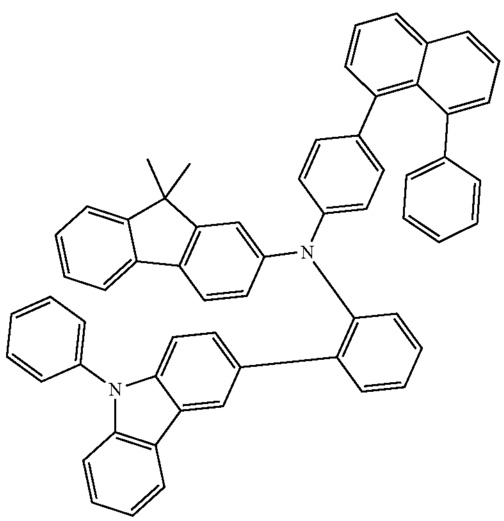
P21-89
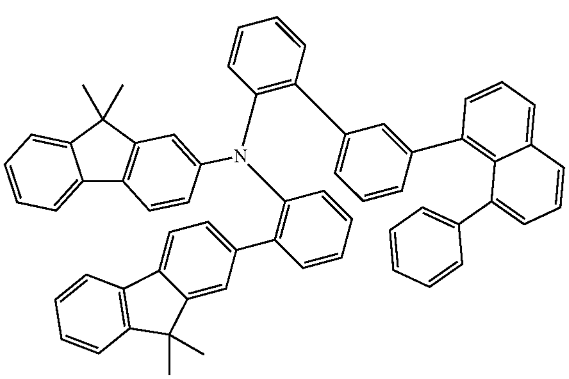
-continued
P21-90
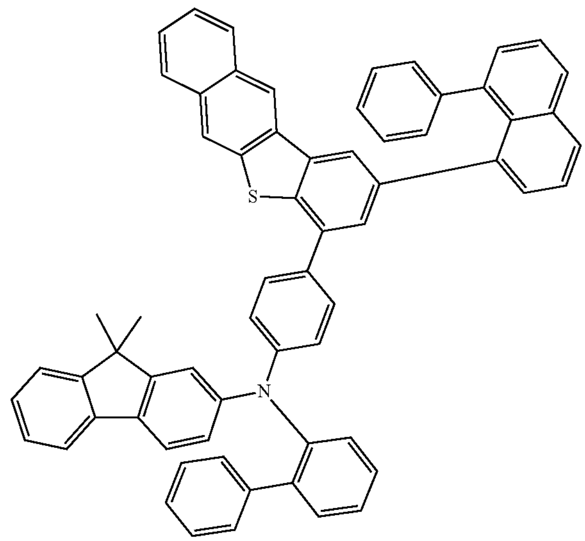
P21-91
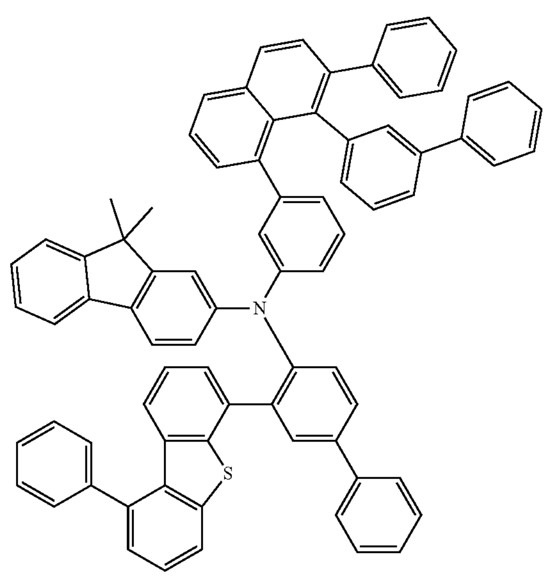

-continued
P21-92
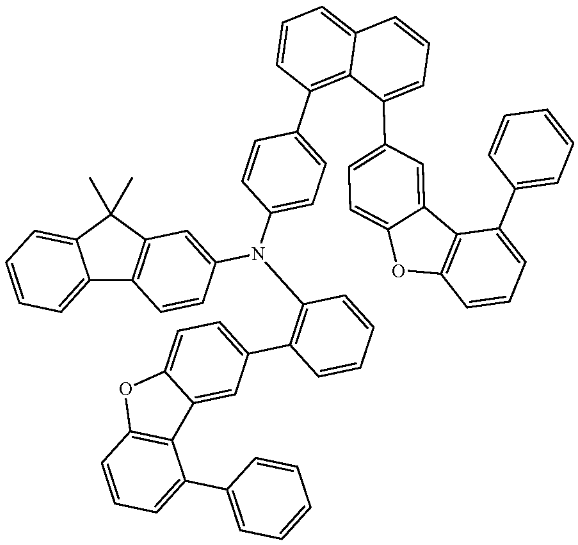
P21-93
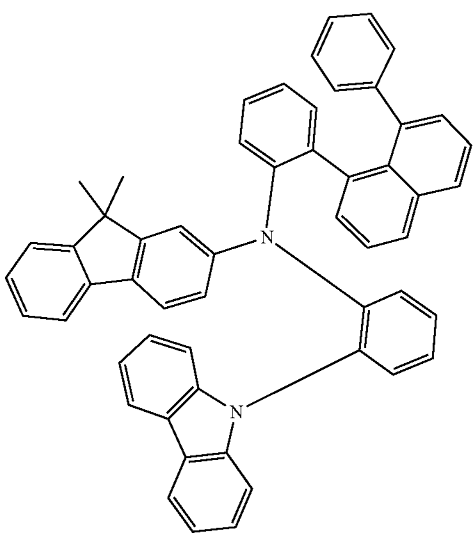
P21-94
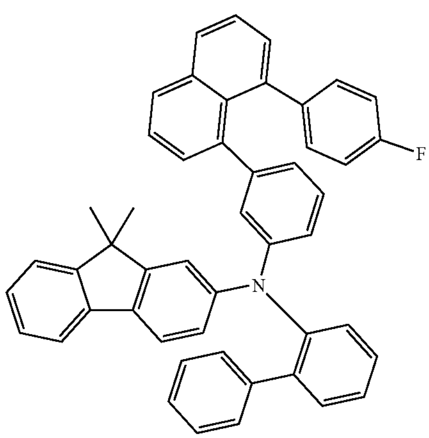
-continued
P21-95
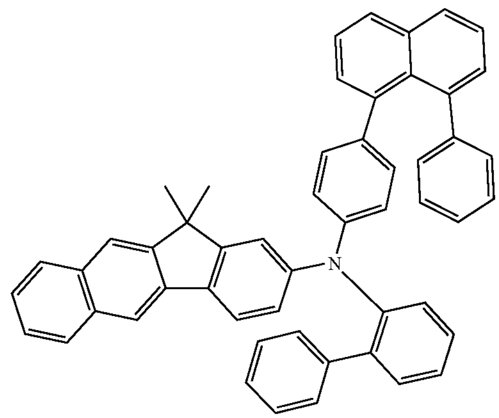
P21-96
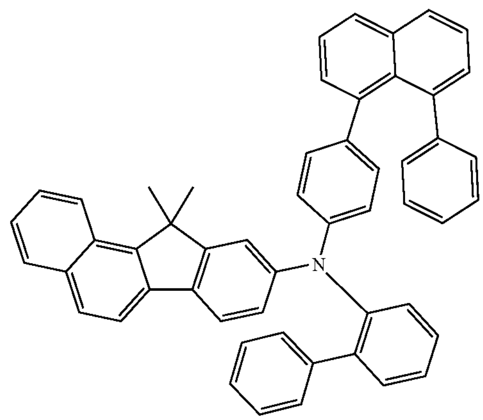
P21-97
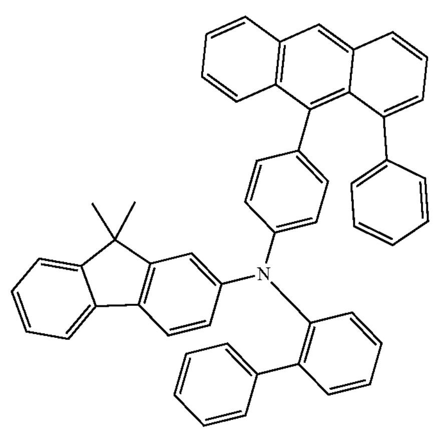

-continued
P21-98
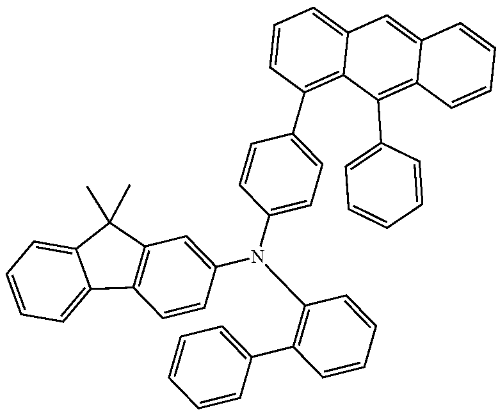
P21-99
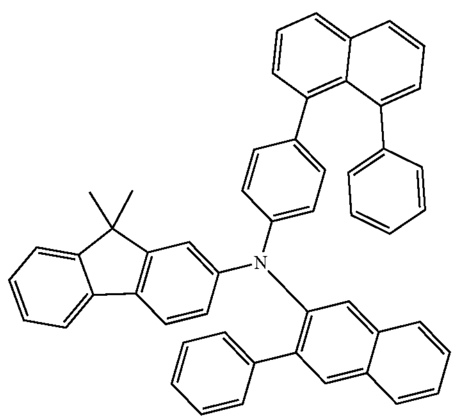
P21-100
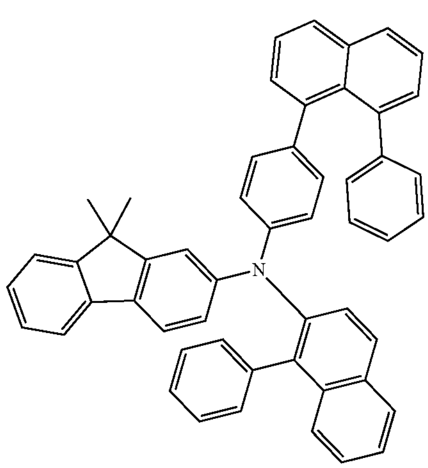
-continued
P22-1
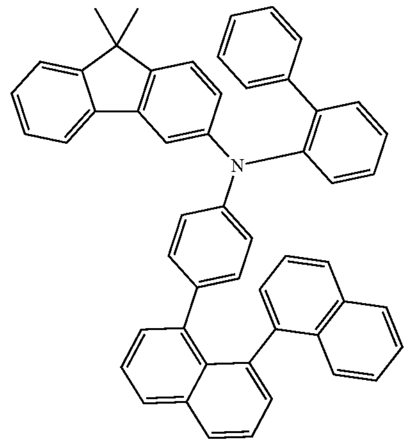
P22-2
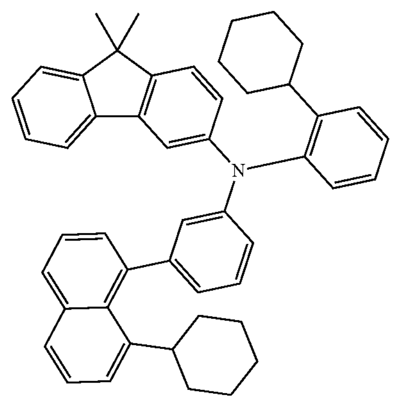
P22-3
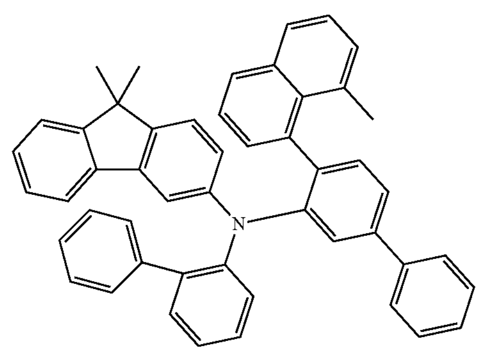
P22-4
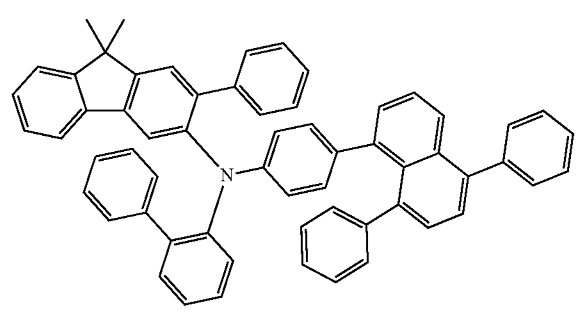

-continued
P22-5
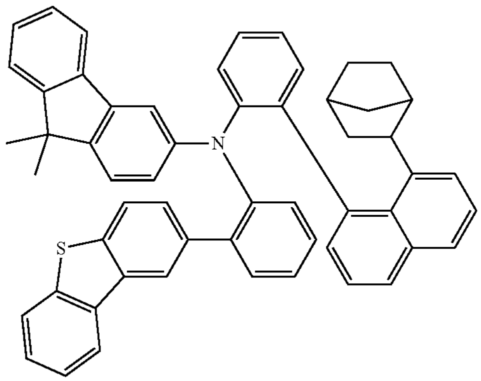
P22-6
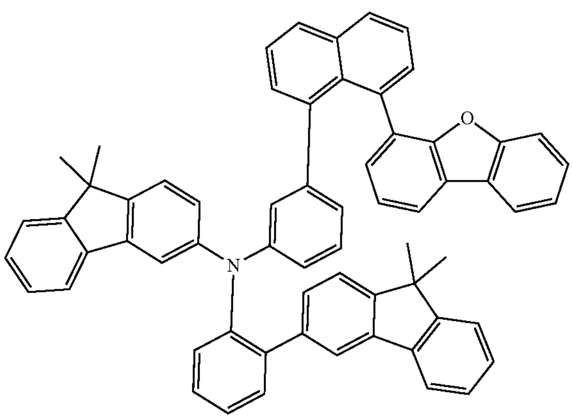
P22-7
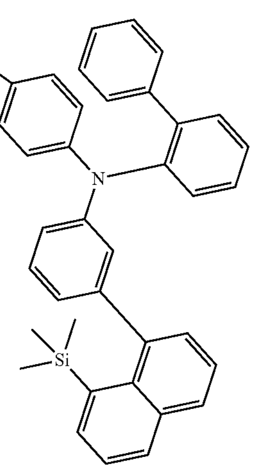
-continued
P22-8
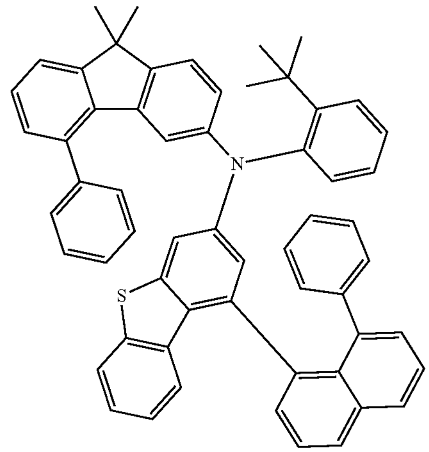
P22-9
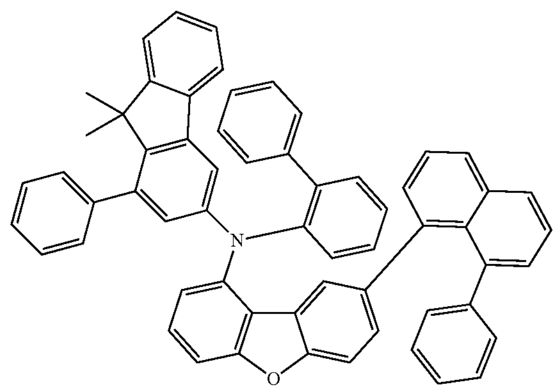
P22-10
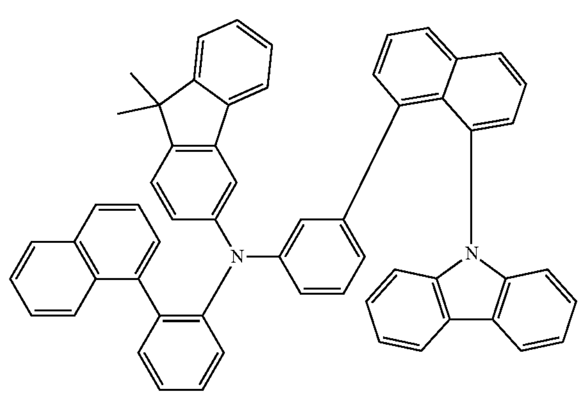

-continued
P22-11
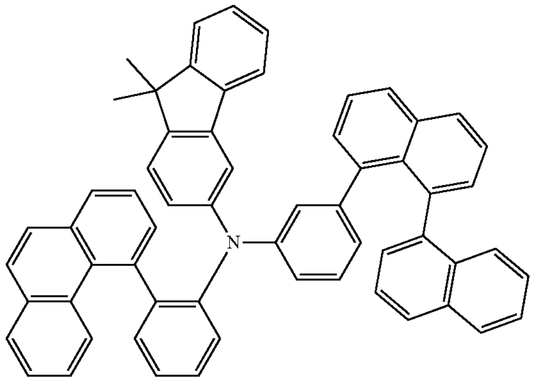
P22-12
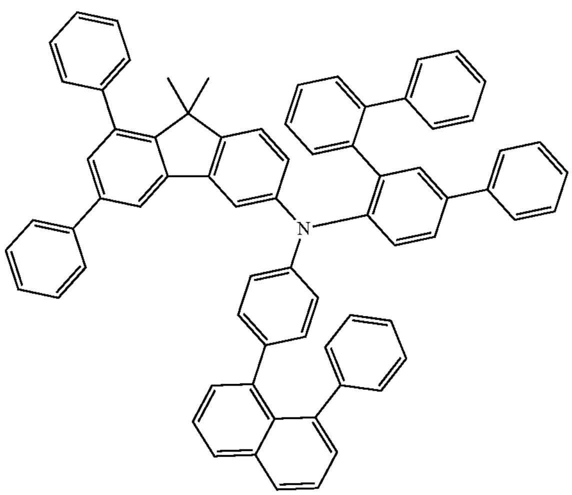
P22-13
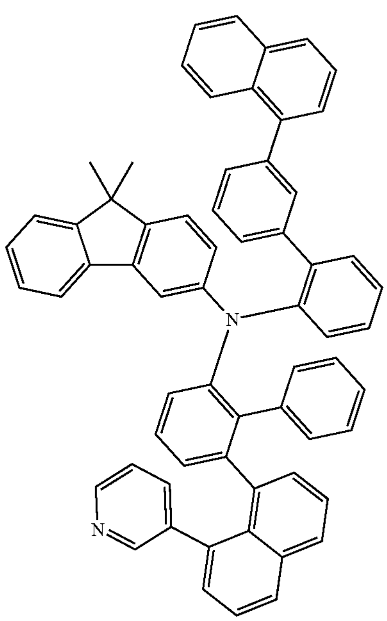
-continued
P22-14
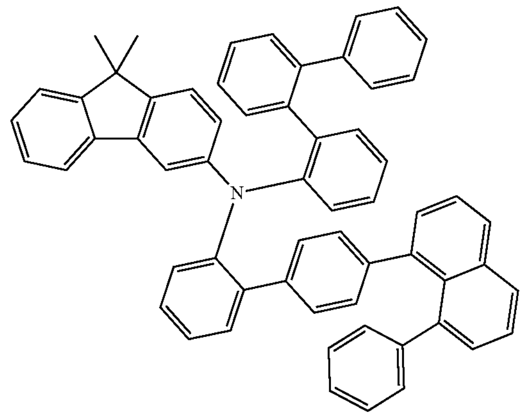
P22-15
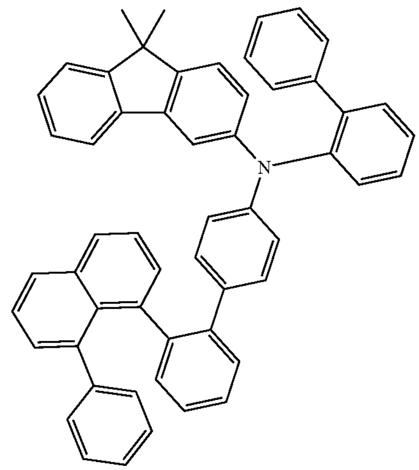
P22-16
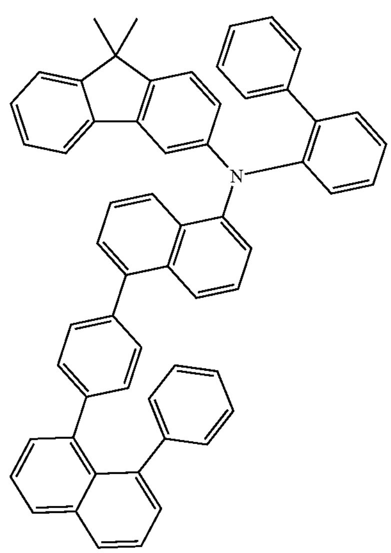

-continued
P22-17
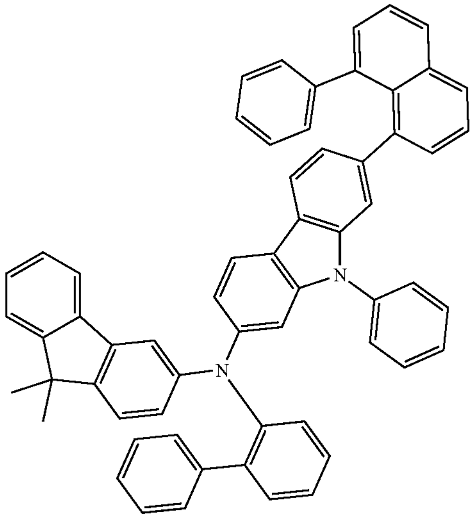
P22-18
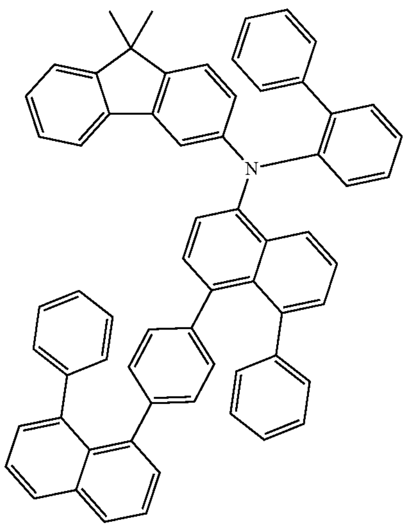
P22-19
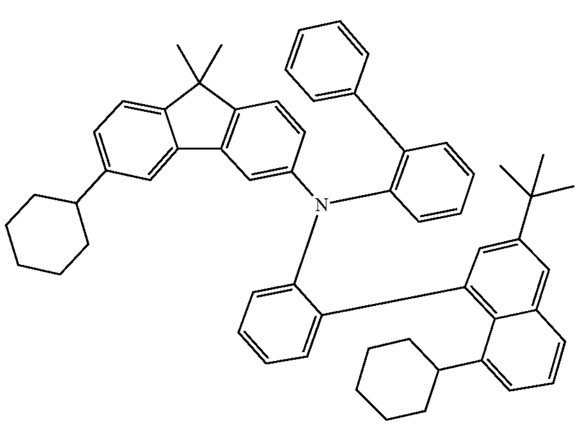
-continued
P22-20
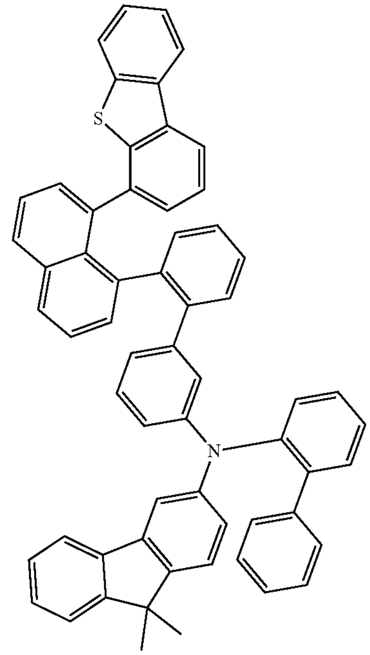
P22-21
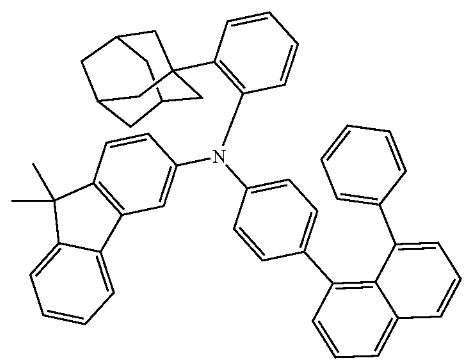
P22-22
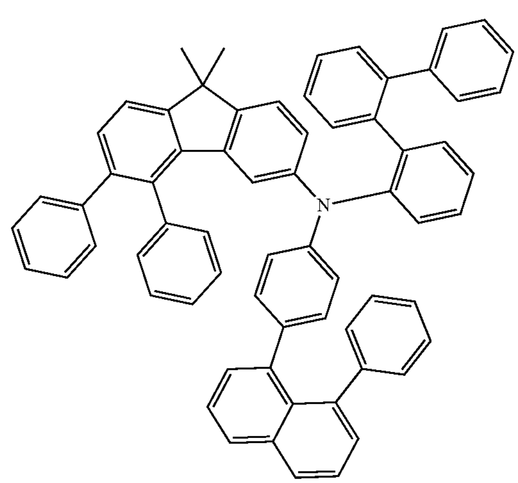

-continued
P22-23
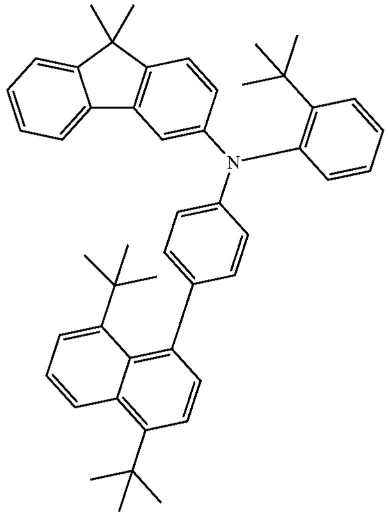
P22-24
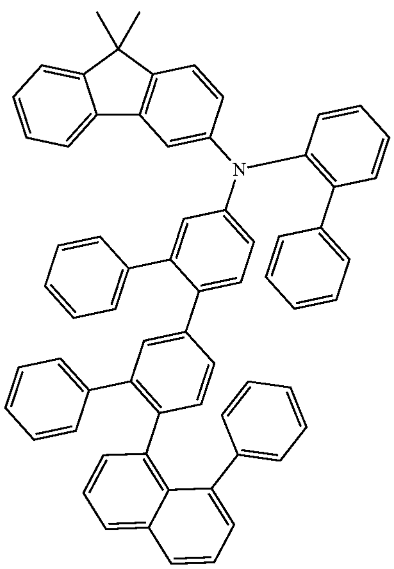
P22-25
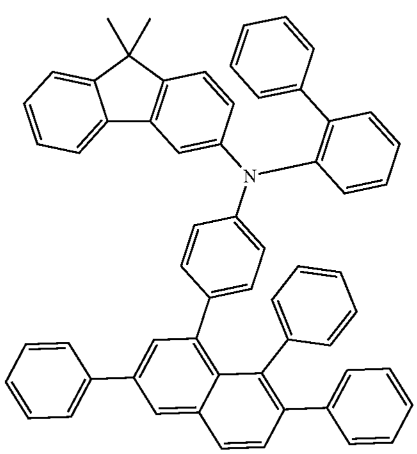
-continued
P22-26
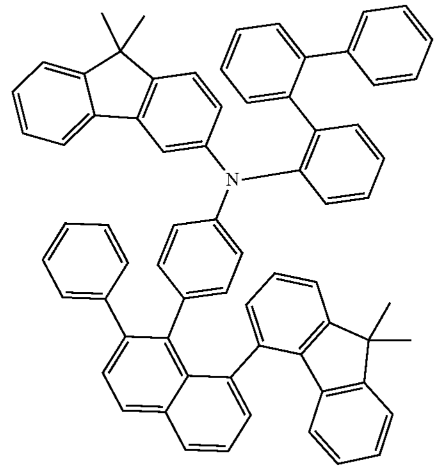
P22-27
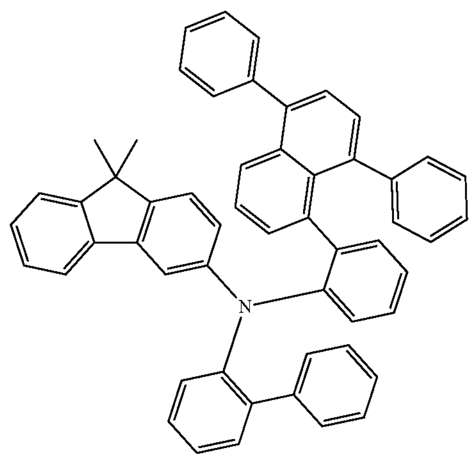
P22-28
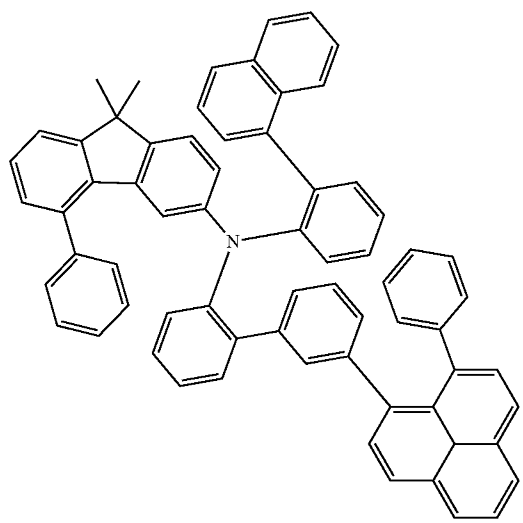

-continued
P22-29
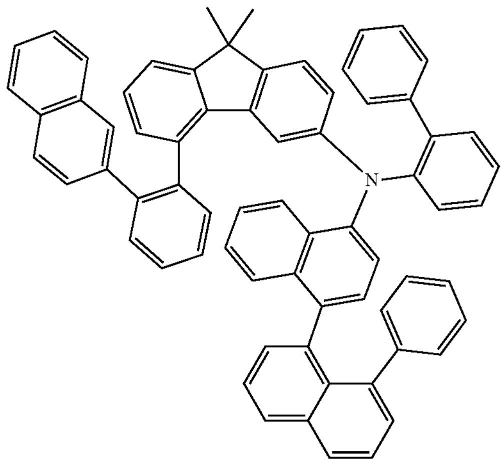
P22-30
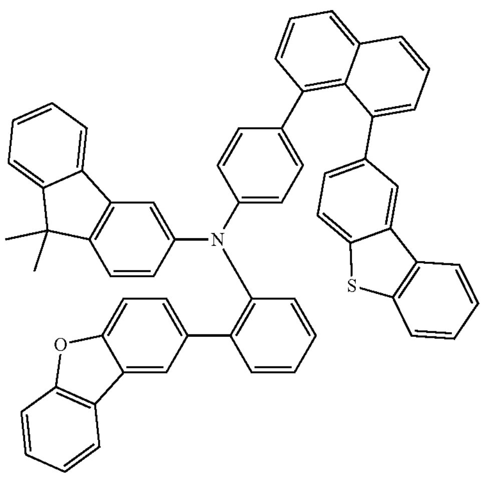
P22-31
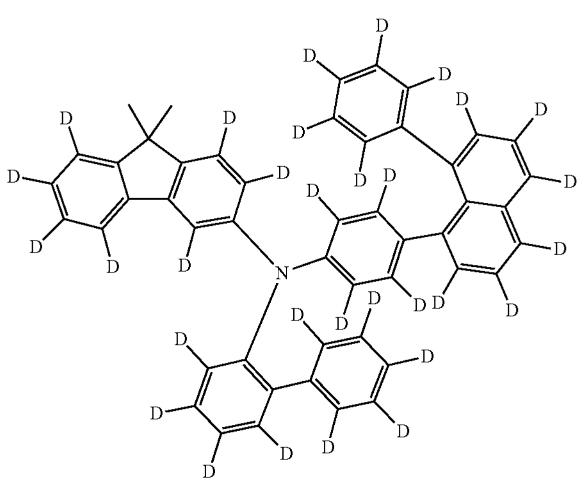
-continued
P22-32
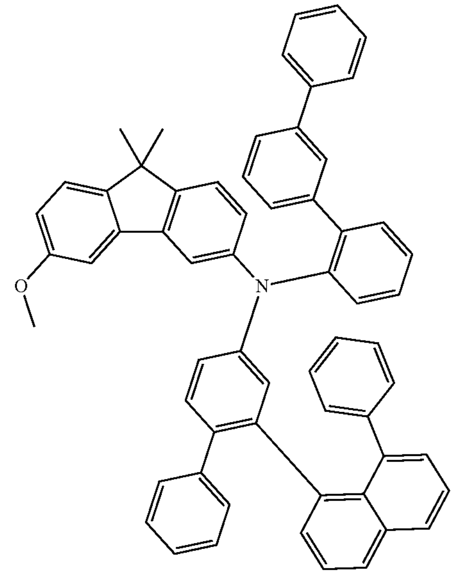
P22-33
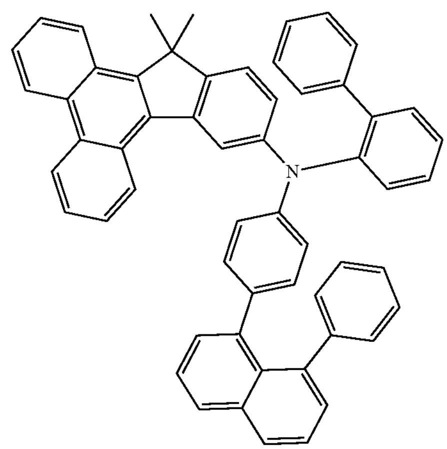
P22-34
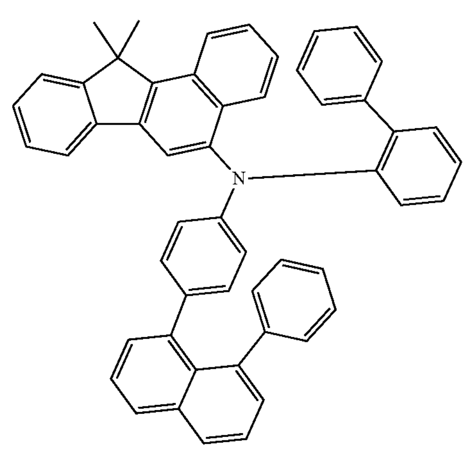

-continued
P22-35
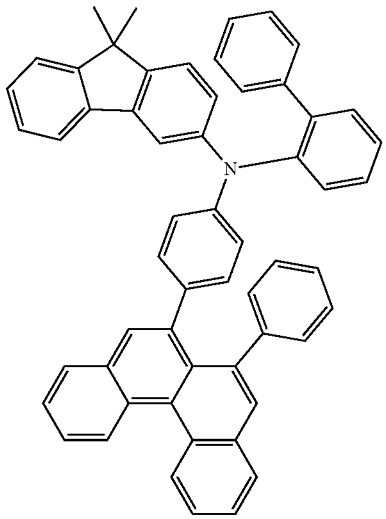
P22-36
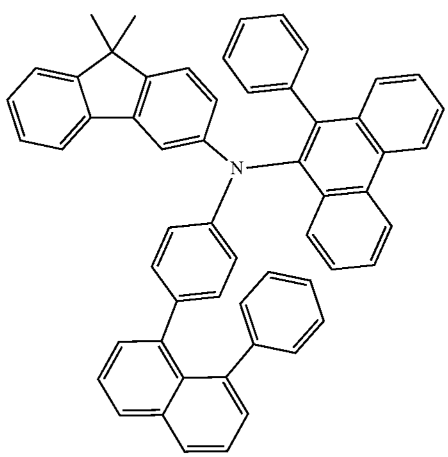
P23-1
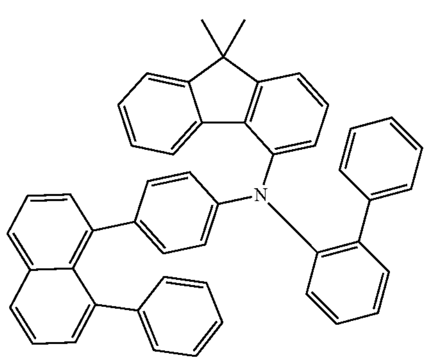
-continued
P23-2
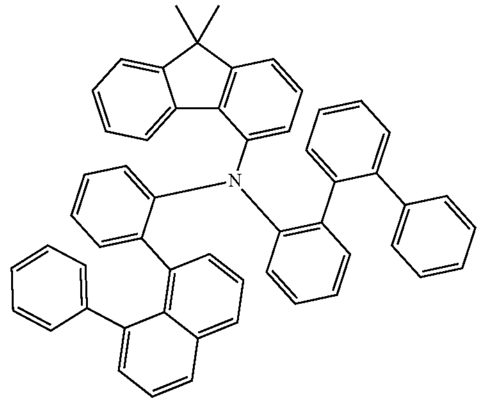
P23-3
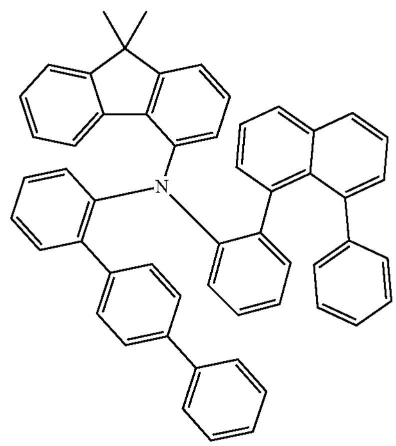
P23-4
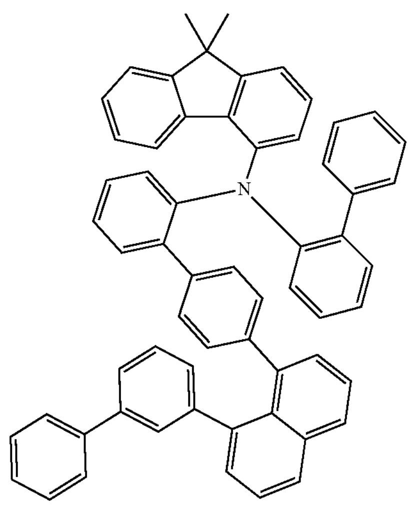

-continued
P23-5
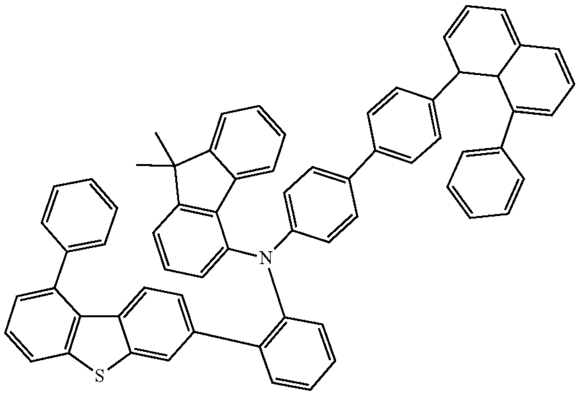
P23-6
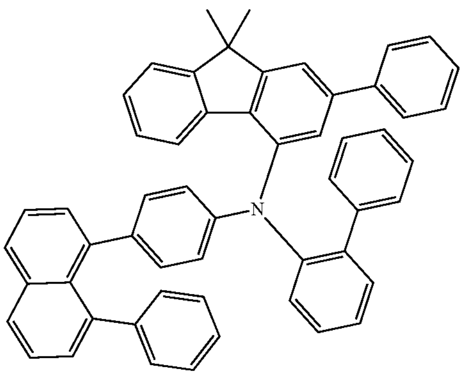
P23-7
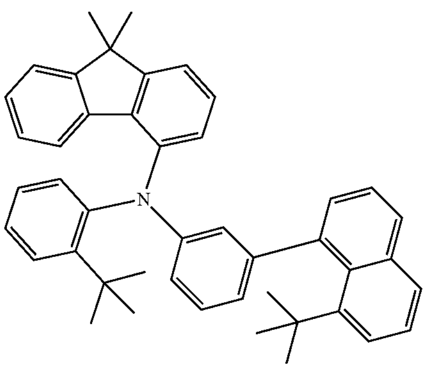
P23-8
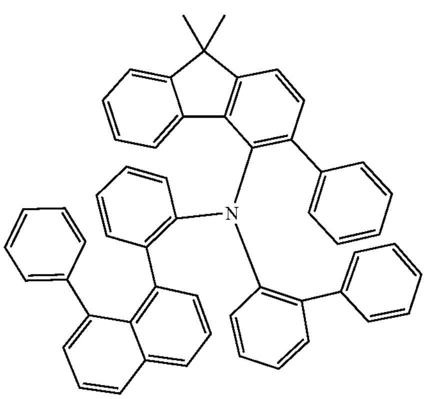
-continued
P23-9
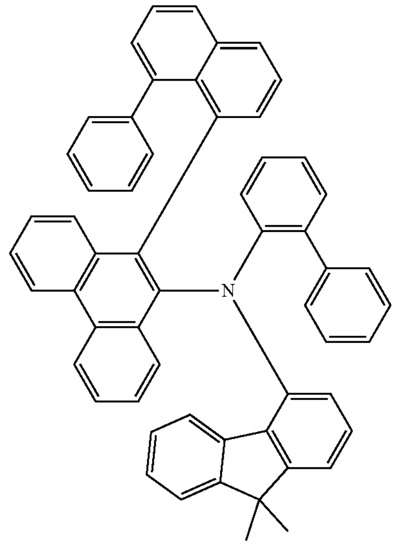
P23-10
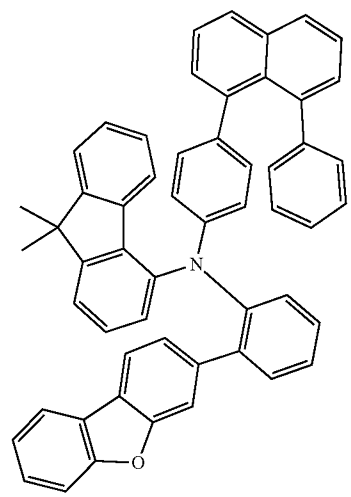
P23-11
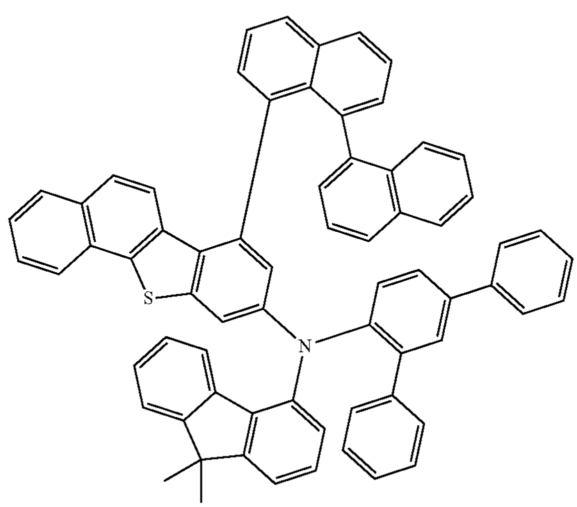

-continued
P23-12
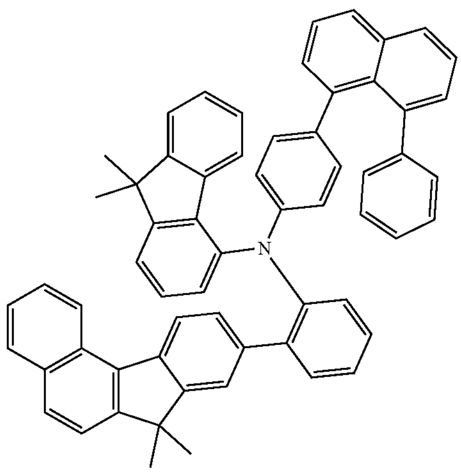
P23-13
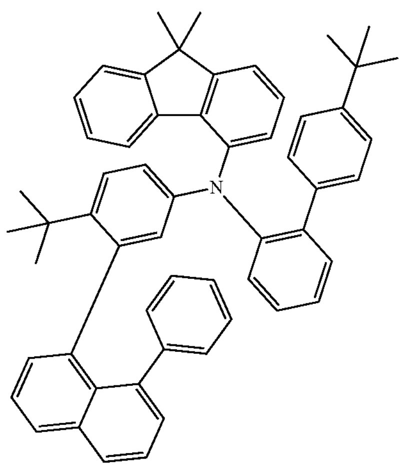
P23-14
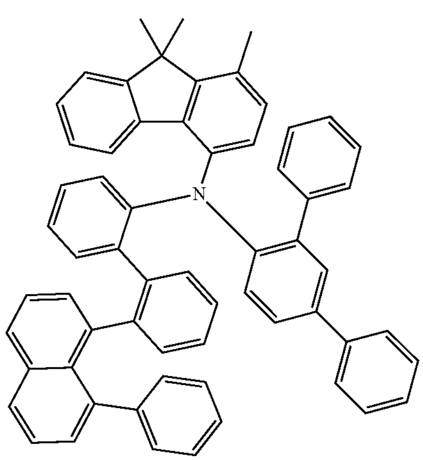
-continued
P23-15
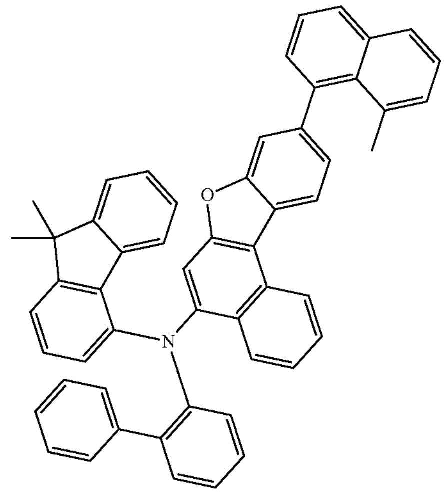
P23-16
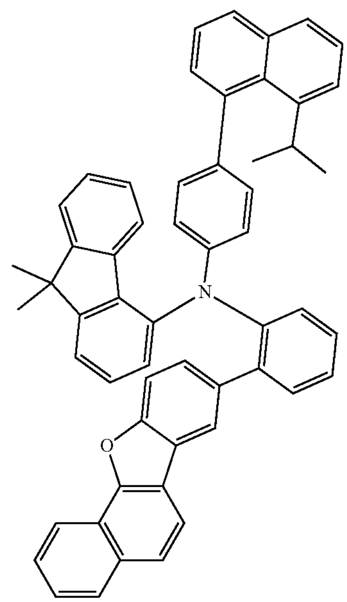
P23-17
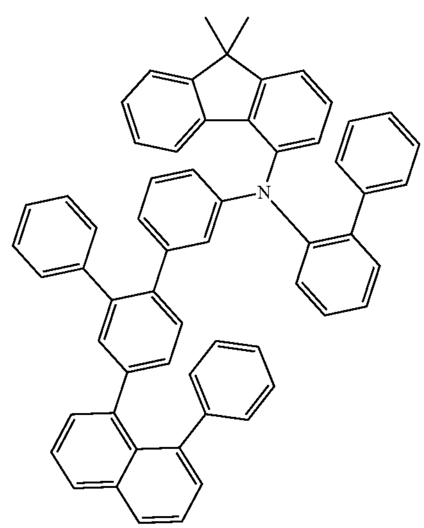

-continued
P23-18
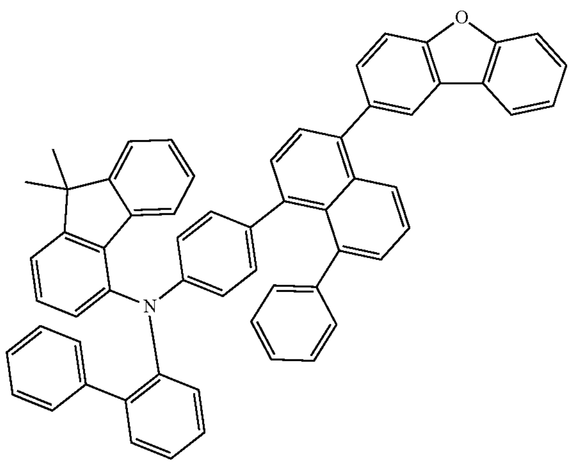
P23-19
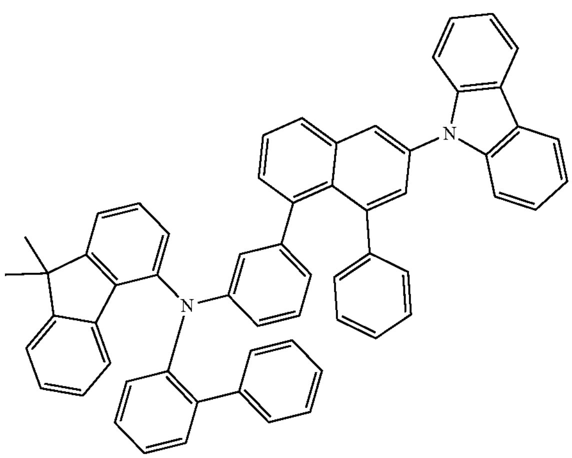
P23-20
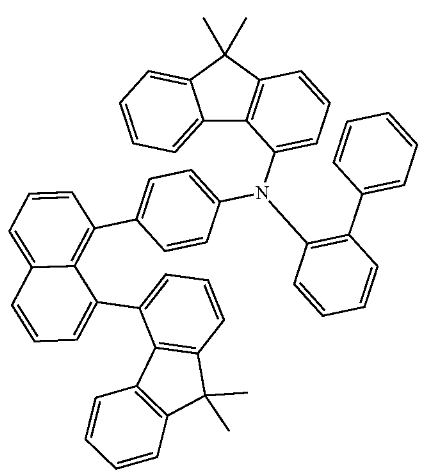
-continued
P23-21
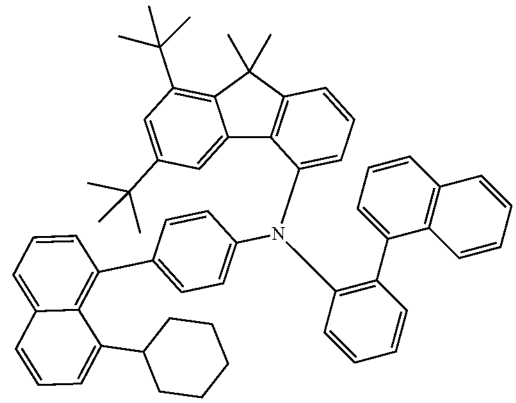
P23-22
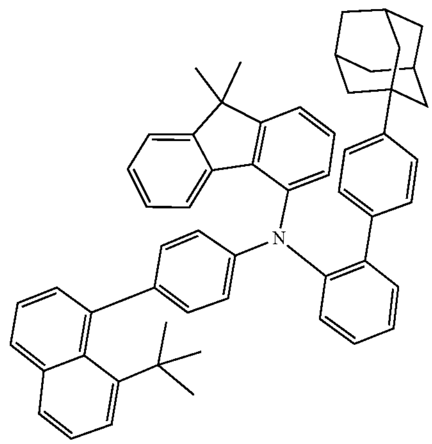
P23-23
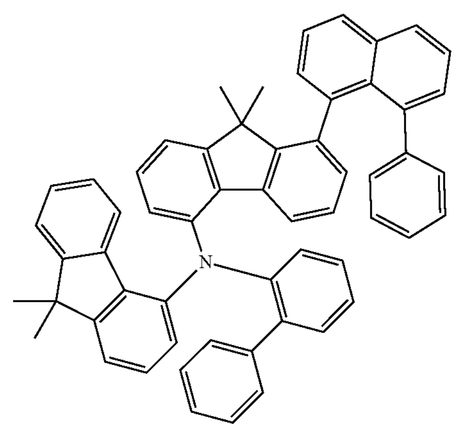
P23-24
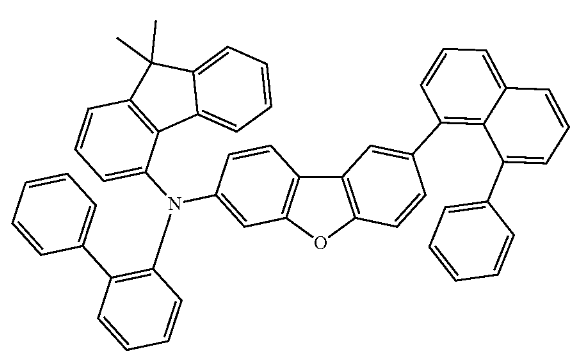

-continued
P23-25
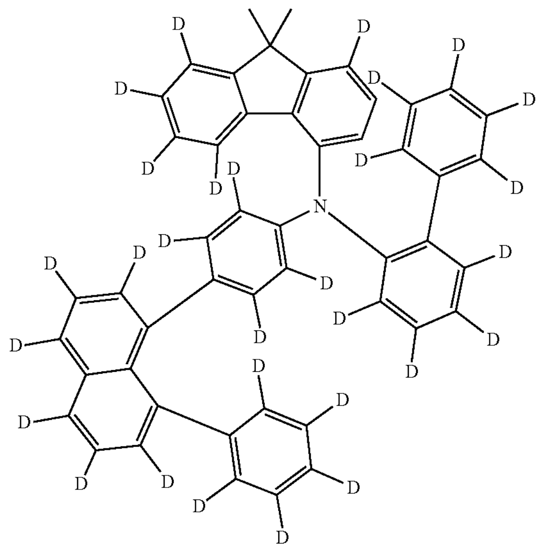
P23-26
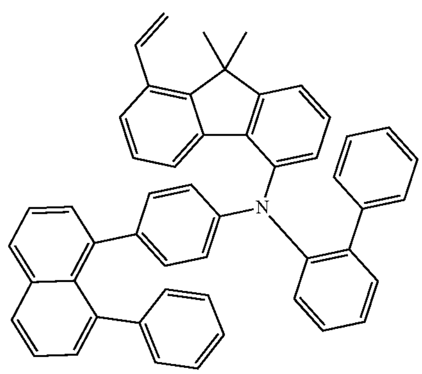
P23-27
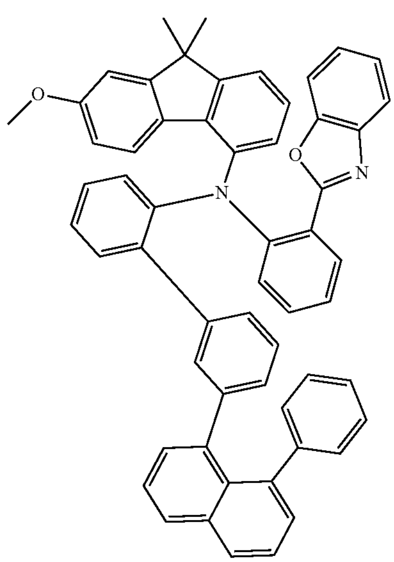
-continued
P23-28
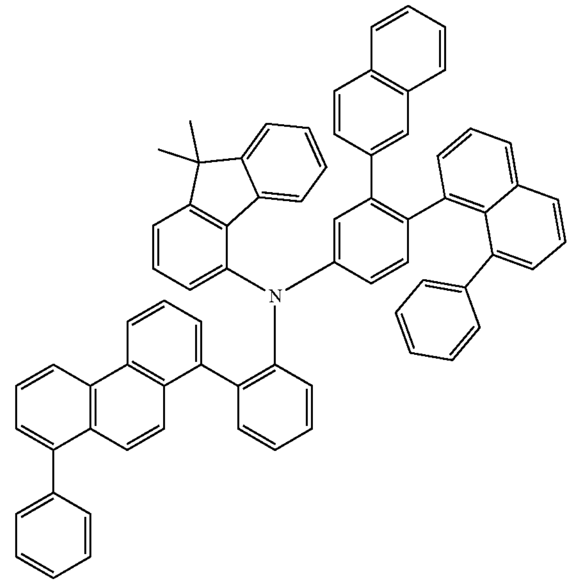
P23-29
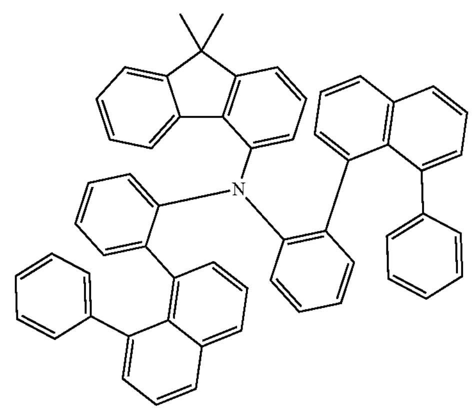
P23-30
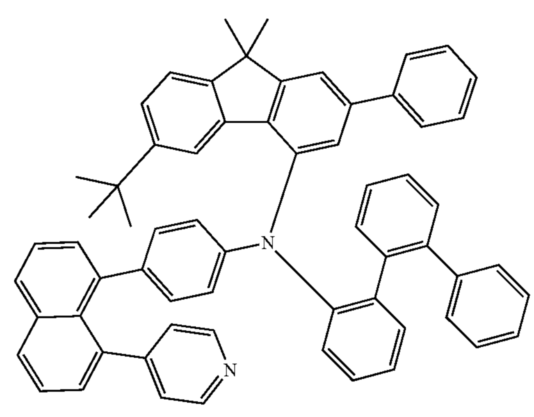

-continued

P23-31

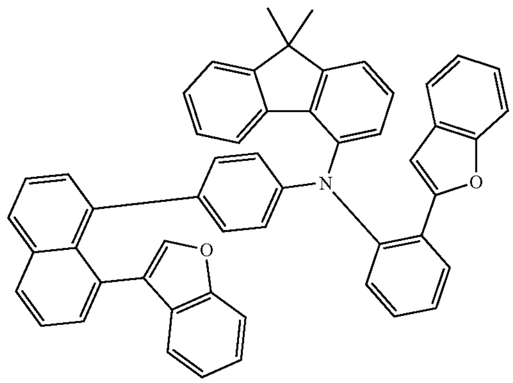

P23-32

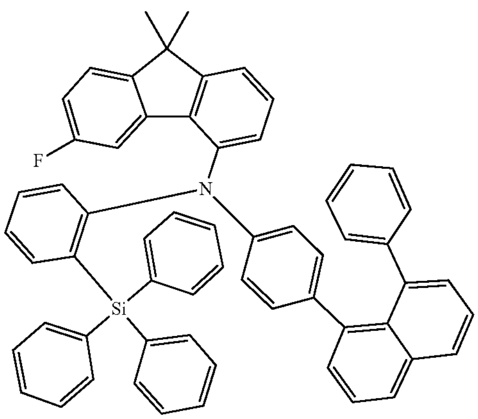

P23-33

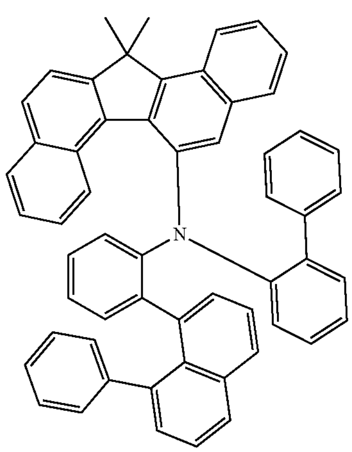

-continued

P23-34

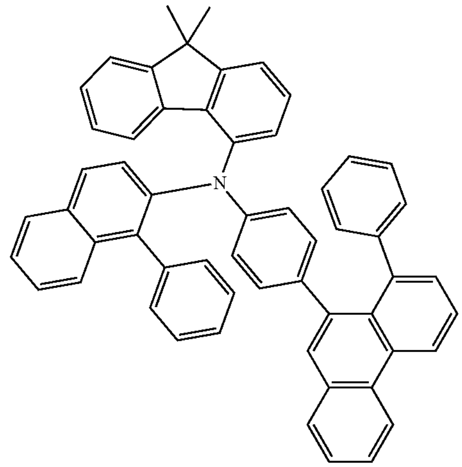

P23-35

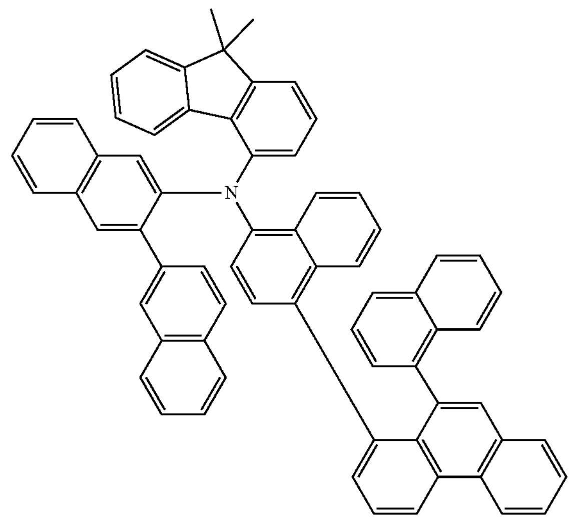

P23-36

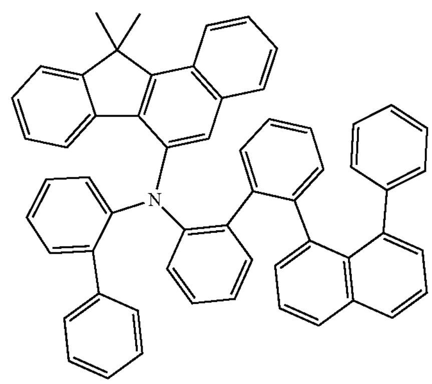

6. The device of claim 1, wherein the thickness of the first hole transport layer ranges from 250 Å to 700 Å.

7. The device of claim 1, wherein 10% to 50% of the thickness of the first hole transport layer is doped with a first doping material.

8. The device of claim 1, wherein the first hole transport layer comprises a first doping material-doped layer doped with the first doping material and a first doping material undoped layer not doped with the first doping material, and one layer of the first doping material-doped layer and the first doping material undoped layer comprises the first compound represented by the Formula 20 and 5 to 15 parts by weight of the first doping material with respect to 100 parts by weight of the first compound.

9. The device of claim 8, wherein at least one layer of the first doping material-doped layer and the first doping material undoped layer comprises the fourth compound represented by a following Formula 1

[Formula 1]

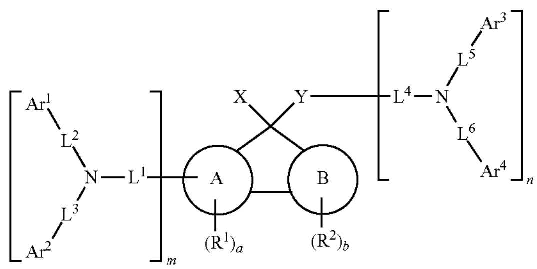

wherein each of m and n is independently 0 or 1, where m+n is 1, each of $Ar^1$ and $Ar^2$ is selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, each of $Ar^3$ and $Ar^4$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, each of $L^1$ to $L^6$ is independently selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, X is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; or a $C_2$-$C_{20}$ alkynyl group, i) when n is 0, Y is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; or a $C_2$-$C_{20}$ alkynyl group, and ii) when n is 1, Y is selected from the group consisting of a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, X and Y are bonded to form a spiro compound, each of ring A and ring B is independently a $C_6$-$C_{10}$ aryl group, each of $R^1$ and $R^2$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, a is an integer from 0 to 7, and b is an integer from 0 to 8, each of the aryl group, the fluorenyl group, the heterocyclic group, the fused ring group, the alkyl group, the alkenyl group, the alkynyl group, the alkoxyl group, the aryloxy group, the arylene group, and the fluorenylene group is further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and each of the further substituted substituents is capable of being further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and the substituents are bonded to each other to form a ring.

10. The device of claim 9, wherein the first doping material-doped layer comprises the first compound represented by the Formula 20, the first doping material undoped layer comprises the fourth compound represented by the Formula 1, and there is 5 to 15 parts by weight of the first doping material with respect to 100 parts by weight of the first compound.

11. The device of claim 9, wherein the first doping material-doped layer comprises the fourth compound represented by the Formula 1, the first doping material undoped layer comprises the fourth compound represented by the Formula 1, and there is 5 to 15 parts by weight of the first doping material with respect to 100 parts by weight of the fourth compound.

12. The device of claim 1, wherein the second stack comprises a second hole transport, region, a second emission layer, and a second electron transport region, the second hole transport region comprises a second hole transport layer and a second auxiliary emission layer, the second hole transport layer comprises a second compound represented by the Formula 20, the third stack comprises a third hole transport region, a third emission layer, and a third electron transport region, the third hole transport region comprises a third hole transport layer, and the third hole transport layer or the third auxiliary emission layer comprises a third compound represented by the Formula 20.

13. The device of claim 12, wherein the first hole transport layer comprises a first doping material-doped layer doped with the first doping material and a first doping material undoped layer not doped with the first doping material, the first doping material-doped layer comprises the first compound and 5 to 15 parts by weight of the first doping material with respect to 100 parts by weight of the first compound, the second hole transport layer comprises a second doping material-doped layer doped with the second doping material and a second doping material undoped layer not doped with the second doping material, the second doping material-doped layer comprises the second compound and 5 to 15 parts by weight of the second doping material with respect to 100 parts by weight of the second compound, the third e hole transport layer comprises a third doping material-doped layer doped with a third doping material and a third doping material undoped layer not doped with the third doping material, and the third doping material-doped layer comprises the third compound and 5 to 15 parts by weight of the third doping material with respect to 100 parts by weight of the third compound.

14. The device of claim 12, wherein the first hole transport region further comprises a first auxiliary emission laver.

15. The device of claim 1, wherein the second stack comprises at least one of the second emission layer, the third stack comprises at least one of the third emission layer, and at least one of the first emission laver, the second emission layer, and the third emission layer is a blue light emission layer.

16. The device of claim 1, wherein the second stack comprises at least one of the second emission layer, the third stack comprises at least one of the third emission layer, and the first emission layer, the second emission layer, and the third emission layer are a blue light emission layer.

17. The device of claim 1, wherein the second stack comprises at least one of the second emission layer, the third stack comprises at least one of the third emission layer, and one or wo of the first emission layer, the second emission layer, and the third emission layer are blue light emission layers and one or two of them are green light emission layers.

18. The device of claim 1, wherein the second stack comprises at least one of the second emission layer, the third stack comprises at least one of the third emission layer, and two emission layers of the first emission layer, the second emission layer, and the third emission layer are blue light emission layers, and the remaining one emission layer is a green light emission layer.

19. The device of claim 18, wherein the green light emission layer is positioned between the two blue light emission layers.

20. The device of claim 1, wherein the second stack comprises at least one of the second emission layer, the third stack comprises at least one of the third emission laver, and at least one of the first emission layer, the second emission layer, or the third emission layer is a multi-emission layer emitting green light and blue light.

* * * * *